US012108522B2

(12) United States Patent
Miyamoto et al.

(10) Patent No.: US 12,108,522 B2
(45) Date of Patent: Oct. 1, 2024

(54) CIRCUIT BOARD, SEMICONDUCTOR DEVICE, AND ELECTRONIC DEVICE

(71) Applicant: SONY SEMICONDUCTOR SOLUTIONS CORPORATION, Kanagawa (JP)

(72) Inventors: Takashi Miyamoto, Kanagawa (JP); Makoto Hayafuchi, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 719 days.

(21) Appl. No.: 17/250,765

(22) PCT Filed: Aug. 28, 2019

(86) PCT No.: PCT/JP2019/033637

§ 371 (c)(1),
(2) Date: Mar. 2, 2021

(87) PCT Pub. No.: WO2020/054414

PCT Pub. Date: Mar. 19, 2020

(65) Prior Publication Data

US 2021/0352801 A1 Nov. 11, 2021

(30) Foreign Application Priority Data

Sep. 11, 2018 (JP) ................................ 2018-169405

(51) Int. Cl.
*H05K 1/02* (2006.01)
*H01L 23/552* (2006.01)
*H01L 27/146* (2006.01)

(52) U.S. Cl.
CPC ......... *H05K 1/0219* (2013.01); *H01L 23/552* (2013.01); *H01L 27/14636* (2013.01);
(Continued)

(58) Field of Classification Search
None
See application file for complete search history.

(56) References Cited

U.S. PATENT DOCUMENTS 5,446,243 A 8/1995 Crowder et al.
5,929,375 A 7/1999 Glovatsky et al.
(Continued)

FOREIGN PATENT DOCUMENTS

CN 101188245 A 5/2008
CN 104810346 A 7/2015
(Continued)

OTHER PUBLICATIONS

International Search Report and Written Opinion of PCT Application No. PCT/JP2019/033637, issued on Dec. 3, 2019, 10 pages of ISRWO.

*Primary Examiner* — Feifei Yeung Lopez
(74) *Attorney, Agent, or Firm* — CHIP LAW GROUP

(57) ABSTRACT

The present technology relates to a circuit board, a semiconductor device, and an electronic device for enabling effective suppression of generation of noise in a signal. The circuit board includes a reticulated conductor including a first conductor group configured by two or more conductors having a first conductor width and arranged with a first periodic width in a first direction, a second conductor group configured by two or more conductors having a second conductor width and arranged with a second periodic width in a second direction orthogonal to the first direction, and a first moving conductor group arranged at a position to which at least a part of the second conductor group is moved by a factor of 1 of the first periodic width in the first direction and is moved by a factor of 1 of a third periodic width in the second direction, the third periodic width and the second periodic width being different. The present technology can
(Continued)

be applied to, for example, a circuit board of a semiconductor device.

20 Claims, 216 Drawing Sheets

(52) U.S. Cl.
CPC ..... *H01L 27/14643* (2013.01); *H05K 1/0216* (2013.01); *H05K 1/0224* (2013.01)

(56) References Cited

U.S. PATENT DOCUMENTS

| | | | | |
|---|---|---|---|---|
| 6,353,189 | B1 * | 3/2002 | Shimada | H01L 23/49827 257/E23.105 |
| 2002/0185664 | A1 * | 12/2002 | Dixit | H01L 21/76838 257/E21.582 |
| 2004/0145033 | A1 * | 7/2004 | McElvain | G06F 30/394 257/659 |
| 2007/0257339 | A1 * | 11/2007 | Chen | H05K 1/0219 257/665 |
| 2008/0088724 | A1 | 4/2008 | Kudoh | |
| 2015/0214142 | A1 | 7/2015 | Kariyazaki et al. | |

FOREIGN PATENT DOCUMENTS

| | | | |
|---|---|---|---|
| EP | 570709 | A2 | 11/1993 |
| JP | 5-110214 | A | 4/1993 |
| JP | 6-53351 | A | 2/1994 |
| JP | 6-326476 | A | 11/1994 |
| JP | 2001-308540 | A | 11/2001 |
| JP | 2003-51543 | A | 2/2003 |
| JP | 2008-124237 | A | 5/2008 |
| JP | 2012-94646 | A | 5/2012 |
| JP | 2014-57426 | A | 3/2014 |
| JP | 2015-142149 | A | 8/2015 |
| KR | 10-2008-0033881 | A | 4/2008 |
| TW | 200824110 | A | 6/2008 |
| WO | 2013/115075 | A1 | 8/2013 |

* cited by examiner

FIRST COMPARATIVE EXAMPLE

FIRST CONFIGURATION EXAMPLE

SECOND CONFIGURATION EXAMPLE

FYA
=FXA
=FYB × 5
=FXB × 5

FYA
=FXA
=FYB
=FXB

THIRD CONFIGURATION EXAMPLE

FOURTH CONFIGURATION EXAMPLE

FIFTH CONFIGURATION EXAMPLE

SIXTH CONFIGURATION EXAMPLE

SEVENTH CONFIGURATION EXAMPLE

EIGHTH CONFIGURATION EXAMPLE

NINTH CONFIGURATION EXAMPLE

TENTH CONFIGURATION EXAMPLE

ELEVENTH CONFIGURATION EXAMPLE

TWELFTH CONFIGURATION EXAMPLE

THIRTEENTH CONFIGURATION EXAMPLE

ELEVENTH CONFIGURATION EXAMPLE

FOURTEENTH CONFIGURATION EXAMPLE

FOURTEENTH CONFIGURATION EXAMPLE

FOURTEENTH CONFIGURATION EXAMPLE

FOURTEENTH CONFIGURATION EXAMPLE

FIFTEENTH CONFIGURATION EXAMPLE

FIFTEENTH CONFIGURATION EXAMPLE

FIFTEENTH CONFIGURATION EXAMPLE

SIXTEENTH CONFIGURATION EXAMPLE

SIXTEENTH CONFIGURATION EXAMPLE

SIXTEENTH CONFIGURATION EXAMPLE

SEVENTEENTH CONFIGURATION EXAMPLE

SEVENTEENTH CONFIGURATION EXAMPLE

SEVENTEENTH CONFIGURATION EXAMPLE

EIGHTEENTH CONFIGURATION EXAMPLE

NINETEENTH CONFIGURATION EXAMPLE

NINETEENTH CONFIGURATION EXAMPLE

TWENTIETH CONFIGURATION EXAMPLE

TWENTY-FIRST CONFIGURATION EXAMPLE

TWENTY-SECOND CONFIGURATION EXAMPLE

TWENTY-THIRD CONFIGURATION EXAMPLE

TWENTY-FOURTH CONFIGURATION EXAMPLE

TWENTY-FIFTH CONFIGURATION EXAMPLE

TWENTY-SIXTH CONFIGURATION EXAMPLE

TWENTY-SEVENTH CONFIGURATION EXAMPLE

TWENTY-EIGHTH CONFIGURATION EXAMPLE 1101
1102A
1102B
1121
1122
1123

CONDUCTOR LAYER C
WYCA
GYC
WYCB
FYC
1211A
1211B
165C

CONDUCTOR LAYER A
WYA
FYA
GYA
FXA
WXA
GXA
1201
165A

CONDUCTOR LAYER B
WYB
FYB
GYB
FXB
WXB
GXB
1202
165B

CONDUCTOR LAYER A + CONDUCTOR LAYER C

CONDUCTOR LAYER B + CONDUCTOR LAYER C

CONDUCTOR LAYER A + CONDUCTOR LAYER B
Y
X
Z
: Vdd WIRING
: Vss WIRING

CONDUCTOR LAYER C
WYCA
GYC
WYCB
FYC
1222A
1222B
165C

CONDUCTOR LAYER A + CONDUCTOR LAYER C

CONDUCTOR LAYER A
WYA
FYA
GYA
FXA
WXA
GXA
1201
165A

CONDUCTOR LAYER B + CONDUCTOR LAYER C

CONDUCTOR LAYER B
WYB
FYB
GYB
FXB
WXB
GXB
1202
165B

CONDUCTOR LAYER A + CONDUCTOR LAYER B
Y
X
Z
: Vdd WIRING
: Vss WIRING
SECOND CONFIGURATION EXAMPLE

CONDUCTOR LAYER C
WYCA2
WYCA1
GYC
WYCB2
WYCB1

CONDUCTOR LAYER A
WYA
FYA
GYA
FXA
WXA
GXA

CONDUCTOR LAYER B
WYB
FYB
GYB
FXB
WXB
GXB

FYC
1222A
1222B
165C
CONDUCTOR LAYER A + CONDUCTOR LAYER C 1201
165A
CONDUCTOR LAYER B + CONDUCTOR LAYER C 1202
165B
CONDUCTOR LAYER A + CONDUCTOR LAYER B
Y
X
Z
: Vdd WIRING
: Vss WIRING
SECOND CONFIGURATION EXAMPLE

CONDUCTOR LAYER C
WYCA2
WYCA1
GYC
WYCB
WYCB
FYC
1223B
1223A
1223B
1223A
165C

CONDUCTOR LAYER A + CONDUCTOR LAYER C

CONDUCTOR LAYER A
WYA
FYA
GYA
FXA
WXA
GXA
1201
165A

CONDUCTOR LAYER B + CONDUCTOR LAYER C

CONDUCTOR LAYER B
WYB
FYB
GYB
FXB
WXB
GXB
1202
165B

CONDUCTOR LAYER A + CONDUCTOR LAYER B
Y
X
Z
: Vdd WIRING
: Vss WIRING
THIRD CONFIGURATION EXAMPLE

CONDUCTOR LAYER C
WYCA
WYCA
GYC
WYCB2
WYCB1

CONDUCTOR LAYER A
WYA
FYA
GYA
GXA
WXA
FXA
1201
165A

CONDUCTOR LAYER B
WYB
FYB
GYB
GXB
WXB
FXB
1202
165B

CONDUCTOR LAYER A + CONDUCTOR LAYER C
FYC
1223B
1223A
1223B
1223A
165C

CONDUCTOR LAYER B + CONDUCTOR LAYER C

CONDUCTOR LAYER A + CONDUCTOR LAYER B
Y
X
Z
: Vdd WIRING
: Vss WIRING
THIRD CONFIGURATION EXAMPLE

CONDUCTOR LAYER C
WYCA
GYC
WYCB

CONDUCTOR LAYER A + CONDUCTOR LAYER C
FYC
1221A
1221B
165C

CONDUCTOR LAYER A
WYA
FYA
GYA
GXA
WXA
FXA

CONDUCTOR LAYER B + CONDUCTOR LAYER C
1241
1201
165A

CONDUCTOR LAYER B
WYB
FYB
GYB
GXB
WXB
FXB

CONDUCTOR LAYER A + CONDUCTOR LAYER B
1242
1202
165B
Y
X
Z
: Vdd WIRING
: Vss WIRING
FOURTH CONFIGURATION EXAMPLE

CONDUCTOR LAYER C
1251A
1251B
165C
FXC
GXC
WXCA
WXCB

CONDUCTOR LAYER A
1241
1201
165A
GXA
WXA
FXA
WYA
FYA
GYA

CONDUCTOR LAYER B
1242
1202
165B
GXB
WXB
FXB
WYB
FYB
GYB

CONDUCTOR LAYER A + CONDUCTOR LAYER C

CONDUCTOR LAYER B + CONDUCTOR LAYER C

CONDUCTOR LAYER A + CONDUCTOR LAYER B
Y
X
Z
: Vdd WIRING
: Vss WIRING
FOURTH CONFIGURATION EXAMPLE

FOURTH CONFIGURATION EXAMPLE

CONDUCTOR LAYER C
WYCA
GYC
WYCB
FYC
1221A
1221B
165C

CONDUCTOR LAYER A + CONDUCTOR LAYER C

CONDUCTOR LAYER A
WYA
FYA
GYA
FXA
WXA
GXA
1261
1241
165A

CONDUCTOR LAYER B + CONDUCTOR LAYER C

CONDUCTOR LAYER B
WYB
FYB
GYB
FXB
WXB
GXB
1242
1262
165B

CONDUCTOR LAYER A + CONDUCTOR LAYER B
Y
X
Z
: Vdd WIRING
: Vss WIRING
FIFTH CONFIGURATION EXAMPLE

CONDUCTOR LAYER C
WYCA
GYC
WYCB
FYC
1221A
1221B
165C

CONDUCTOR LAYER A + CONDUCTOR LAYER C

CONDUCTOR LAYER A
WYA
FYA
GYA
FXA
WXA
GXA
1241
1201
165A

CONDUCTOR LAYER B + CONDUCTOR LAYER C

CONDUCTOR LAYER B
WYB
FYB
GYB
FXB
WXB
GXB
1242
1202
165B

CONDUCTOR LAYER A + CONDUCTOR LAYER B
Y
X
Z
: Vdd WIRING
: Vss WIRING
SIXTH CONFIGURATION EXAMPLE

CONDUCTOR LAYER C
WYCA
GYC
WYCB
FYC
1221A
1221B
165C

CONDUCTOR LAYER A + CONDUCTOR LAYER C

CONDUCTOR LAYER A
WYA
FYA
GYA
FXA
WXA
GXA
1271
165A

CONDUCTOR LAYER B + CONDUCTOR LAYER C

CONDUCTOR LAYER B
WYB
FYB
GYB
FXB
WXB
GXB
1242
1262
165B

CONDUCTOR LAYER A + CONDUCTOR LAYER B
Y
X
Z
: Vdd WIRING
: Vss WIRING
SEVENTH CONFIGURATION EXAMPLE

CONDUCTOR LAYER C
WYCA
GYC
WYCB

CONDUCTOR LAYER A
WYA
FYA
GYA
GXA
WXA
FXA

CONDUCTOR LAYER B
WYB
FYB
GYB
GXB
WXB
FXB

FYC
1221A
1221B
165C
CONDUCTOR LAYER A + CONDUCTOR LAYER C 1241
1201
165A
CONDUCTOR LAYER B + CONDUCTOR LAYER C 1242
1202
165B
CONDUCTOR LAYER A + CONDUCTOR LAYER B
Y
X
Z
: Vdd WIRING
: Vss WIRING
EIGHTH CONFIGURATION EXAMPLE

CONDUCTOR LAYER C
1251A
1251B
165C
FXC
GXC
WXCA
WXCB

CONDUCTOR LAYER A
1241
1201
165A
GXA
WXA
FXA
WYA
FYA
GYA

CONDUCTOR LAYER B
1242
1202
165B
GXB
WXB
FXB
WYB
FYB
GYB

CONDUCTOR LAYER A + CONDUCTOR LAYER C

CONDUCTOR LAYER B + CONDUCTOR LAYER C

CONDUCTOR LAYER A + CONDUCTOR LAYER B
Y
X
Z
: Vdd WIRING
: Vss WIRING
EIGHTH CONFIGURATION EXAMPLE

CONDUCTOR LAYER C
WYCA
GYC
WYCB
FYC
1221A
1221B
165C

CONDUCTOR LAYER A + CONDUCTOR LAYER C

CONDUCTOR LAYER A
WYA
FYA
GYA
FXA
WXA
GXA
1281
WYAd1
1241
1201
165A

CONDUCTOR LAYER B + CONDUCTOR LAYER C

CONDUCTOR LAYER B
WYB
FYB
GYB
FXB
WXB
GXB
1282
WYBd1
1242
1202
165B

CONDUCTOR LAYER A + CONDUCTOR LAYER B
Y
X
Z
: Vdd WIRING
: Vss WIRING
EIGHTH CONFIGURATION EXAMPLE

CONDUCTOR LAYER C
WYCA
GYC
WYCB
FYC
1221A
1221B
165C

CONDUCTOR LAYER A
WYA
FYA
GYA
GYAd1
1241
1201
165A
GXA
WXA
FXA

CONDUCTOR LAYER B
WYB
FYB
GYB
GYBd1
1242
1202
165B
GXB
WXB
FXB

CONDUCTOR LAYER A + CONDUCTOR LAYER C

CONDUCTOR LAYER B + CONDUCTOR LAYER C

CONDUCTOR LAYER A + CONDUCTOR LAYER B
Y
X
Z
: Vdd WIRING
: Vss WIRING
EIGHTH CONFIGURATION EXAMPLE

EIGHTH CONFIGURATION EXAMPLE

CONDUCTOR LAYER C
1251A
1251B
165C
FXC
GXC
WXGA
WXCB

CONDUCTOR LAYER A
1241
1201
165A
GXA
WXA
FXA
WYA
FYA
GYA

CONDUCTOR LAYER B
1242
1202
165B
GXB
WXB
FXB
WYB
FYB
GYB

CONDUCTOR LAYER A+CONDUCTOR LAYER C

CONDUCTOR LAYER B +CONDUCTOR LAYER C

CONDUCTOR LAYER A+CONDUCTOR LAYER B
Y
X
Z
: Vdd WIRING
: Vss WIRING
EIGHTH CONFIGURATION EXAMPLE

CONDUCTOR LAYER C
WYCA
GYC
WYCB
FYC
1221A
1221B
165C

CONDUCTOR LAYER A + CONDUCTOR LAYER C

CONDUCTOR LAYER A
WYA
FYA
GYA
FXA
WXA
GXA
1201
1241
1243
165A

CONDUCTOR LAYER B + CONDUCTOR LAYER C

CONDUCTOR LAYER B
WYB
FYB
GYB
FXB
WXB
GXB
1242
1202
165B

CONDUCTOR LAYER A + CONDUCTOR LAYER B
Y
X
Z
: Vdd WIRING
: Vss WIRING
NINTH CONFIGURATION EXAMPLE

CONDUCTOR LAYER C
1251A
1251B
165C
FXC
GXC
WXCA
WXCB

CONDUCTOR LAYER A + CONDUCTOR LAYER C

CONDUCTOR LAYER A
1243
1241
1201
165A
GXA
WXA
FXA
WYA
FYA
GYA

CONDUCTOR LAYER B + CONDUCTOR LAYER C

CONDUCTOR LAYER B
1242
1202
165B
GXB
WXB
FXB
WYB
FYB
GYB

CONDUCTOR LAYER A + CONDUCTOR LAYER B
Y
X
Z
: Vdd WIRING
: Vss WIRING
NINTH CONFIGURATION EXAMPLE

NINTH CONFIGURATION EXAMPLE

CONDUCTOR LAYER C
1251A
1251B
165C
FXC
GXC
WXCA
WXCB

CONDUCTOR LAYER A
1243
1241
1201
165A
GXA
WXA
FXA
WYA
FYA
GYA

CONDUCTOR LAYER B
1242
1244
1202
165B
GXB
WXB
FXB
WYB
FYB
GYB

CONDUCTOR LAYER A + CONDUCTOR LAYER C

CONDUCTOR LAYER B + CONDUCTOR LAYER C

CONDUCTOR LAYER A + CONDUCTOR LAYER B
Y
X
Z
: Vdd WIRING
: Vss WIRING
NINTH CONFIGURATION EXAMPLE

CONDUCTOR LAYER C
WYCA
GYC
WYCB
FYC
1291A
1291B
165C

CONDUCTOR LAYER A
WYA
FYA
GYA
FXA
WXA
GXA
1241
1201
165A

CONDUCTOR LAYER B
WYB
FYB
GYB
FXB
WXB
GXB
1242
1202
165B

CONDUCTOR LAYER A + CONDUCTOR LAYER C

CONDUCTOR LAYER B + CONDUCTOR LAYER C

CONDUCTOR LAYER A + CONDUCTOR LAYER B
Y
X
Z
: Vdd WIRING
: Vss WIRING
TENTH CONFIGURATION EXAMPLE

CONDUCTOR LAYER C
WYCA
GYC1
GYC2
WYCB
FYC
1301A
1301B
165C

CONDUCTOR LAYER A + CONDUCTOR LAYER C

CONDUCTOR LAYER A
WYA
FYA
GYA
FXA
WXA
GXA
1241
1201
165A

CONDUCTOR LAYER B + CONDUCTOR LAYER C

CONDUCTOR LAYER B
WYB
FYB
GYB
FXB
WXB
GXB
1242
1202
165B

CONDUCTOR LAYER A + CONDUCTOR LAYER B
Y
X
Z
: Vdd WIRING
: Vss WIRING
TENTH CONFIGURATION EXAMPLE

CONDUCTOR LAYER C
WYCA
GYC
WYCB

FYC
1221A
1221B
165C
CONDUCTOR LAYER A + CONDUCTOR LAYER C

CONDUCTOR LAYER A
WYA
FYA
GYA 1241
1311
165A
GXA
WXA
FXA
CONDUCTOR LAYER B + CONDUCTOR LAYER C

CONDUCTOR LAYER B
WYB
FYB
GYB 1242
1312
165B
GXB
WXB
FXB
CONDUCTOR LAYER A + CONDUCTOR LAYER B
Y
X
Z
: Vdd WIRING
: Vss WIRING
ELEVENTH CONFIGURATION EXAMPLE

TWELFTH CONFIGURATION EXAMPLE

CONDUCTOR LAYER C
WYCA
GYC
WYCB
FYC
1221A
1221B
165C

CONDUCTOR LAYER A + CONDUCTOR LAYER C

CONDUCTOR LAYER A
WYA
FYA
GYA
FXA
WXA
GXA
1331
165A

CONDUCTOR LAYER B + CONDUCTOR LAYER C

CONDUCTOR LAYER B
WYB
FYB
GYB
FXB
WXB
GXB
1242
1312
165B

CONDUCTOR LAYER A + CONDUCTOR LAYER B
Y
X
Z
: Vdd WIRING
: Vss WIRING
THIRTEENTH CONFIGURATION EXAMPLE

CONDUCTOR LAYER C
WYCA
GYC
WYCB
FXC
WXCA, WXCB
GXC
FYC
1341B
1341A
165C

CONDUCTOR LAYER A + CONDUCTOR LAYER C

CONDUCTOR LAYER A
WYA
FYA
GYA
FXA
WXA
GXA
1241
1311
165A

CONDUCTOR LAYER B + CONDUCTOR LAYER C

CONDUCTOR LAYER B
WYB
FYB
GYB
FXB
WXB
GXB
1242
1312
165B

CONDUCTOR LAYER A + CONDUCTOR LAYER B
Y
X
Z
: Vdd WIRING
: Vss WIRING
FOURTEENTH CONFIGURATION EXAMPLE

CONDUCTOR LAYER C
WYCA
GYC
WYCB
FXC
WXCA, WXCB
GXC
FYC
1341B
1341A
165C

CONDUCTOR LAYER A
WYA
FYA
GYA
FXA
WXA
GXA
1241
1311
165A

CONDUCTOR LAYER B
WYB
FYB
GYB
FXB
WXB
GXB
1242
1312
165B

CONDUCTOR LAYER A + CONDUCTOR LAYER C

CONDUCTOR LAYER B + CONDUCTOR LAYER C

CONDUCTOR LAYER A + CONDUCTOR LAYER B
Y
X
Z
: Vdd WIRING
: Vss WIRING
FOURTEENTH CONFIGURATION EXAMPLE

FOURTEENTH CONFIGURATION EXAMPLE

FOURTEENTH CONFIGURATION EXAMPLE

FOURTEENTH CONFIGURATION EXAMPLE

FOURTEENTH CONFIGURATION EXAMPLE

FOURTEENTH CONFIGURATION EXAMPLE

FOURTEENTH CONFIGURATION EXAMPLE

FOURTEENTH CONFIGURATION EXAMPLE

FOURTEENTH CONFIGURATION EXAMPLE

0÷12 PERIODIC SHIFT (NO PERIODIC SHIFT)

1÷12 PERIODIC SHIFT (PERIODIC SHIFT = 1A)

2÷12 PERIODIC SHIFT (PERIODIC SHIFT = 2A)

3÷12 PERIODIC SHIFT (PERIODIC SHIFT = 3A)

6:12 PERIODIC SHIFT
(PERIODIC SHIFT = 6A)

5:12 PERIODIC SHIFT
(PERIODIC SHIFT = 5A)

4:12 PERIODIC SHIFT
(PERIODIC SHIFT = 4A)

: Vdd WIRING

: Vss WIRING

FIG. 187B
4÷9 PERIODIC SHIFT
(PERIODIC SHIFT = 4A)
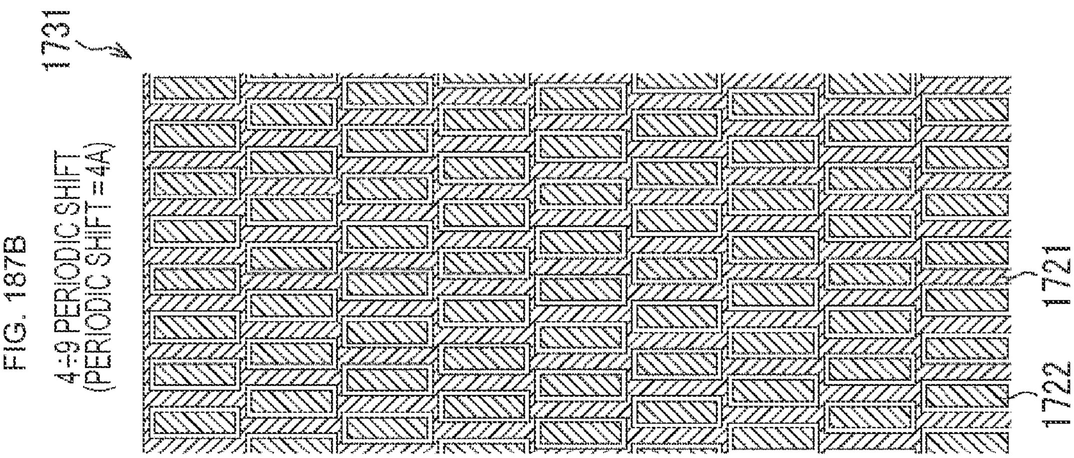
FIG. 187A
3÷9 PERIODIC SHIFT
(PERIODIC SHIFT = 3A)
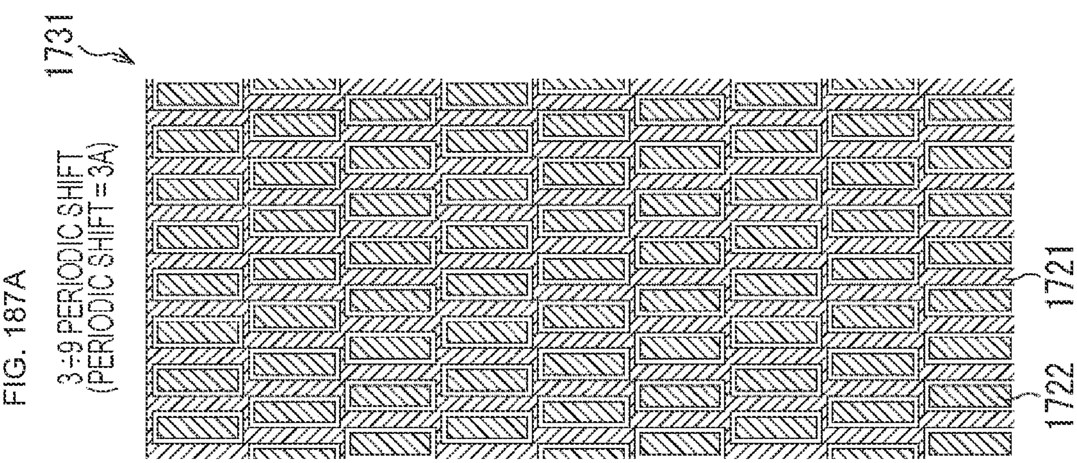

0÷14 PERIODIC SHIFT (NO PERIODIC SHIFT)

1÷14 PERIODIC SHIFT (PERIODIC SHIFT = 1A)

2÷14 PERIODIC SHIFT (PERIODIC SHIFT = 2A)

3÷14 PERIODIC SHIFT (PERIODIC SHIFT = 3A)

0÷16 PERIODIC SHIFT
(NO PERIODIC SHIFT)

1÷16 PERIODIC SHIFT
(PERIODIC SHIFT = 1A)

2÷16 PERIODIC SHIFT
(PERIODIC SHIFT = 2A)

FIG. 197A
3÷16 PERIODIC SHIFT
(PERIODIC SHIFT = 3A)
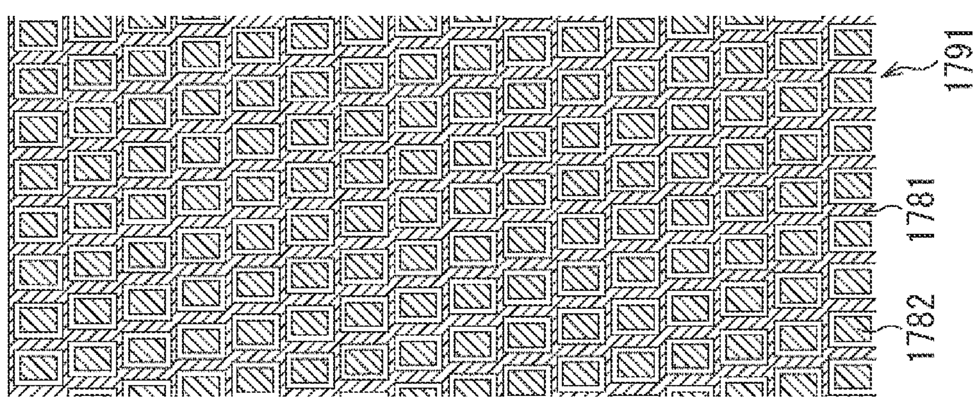
FIG. 197B
4÷16 PERIODIC SHIFT
(PERIODIC SHIFT = 4A)
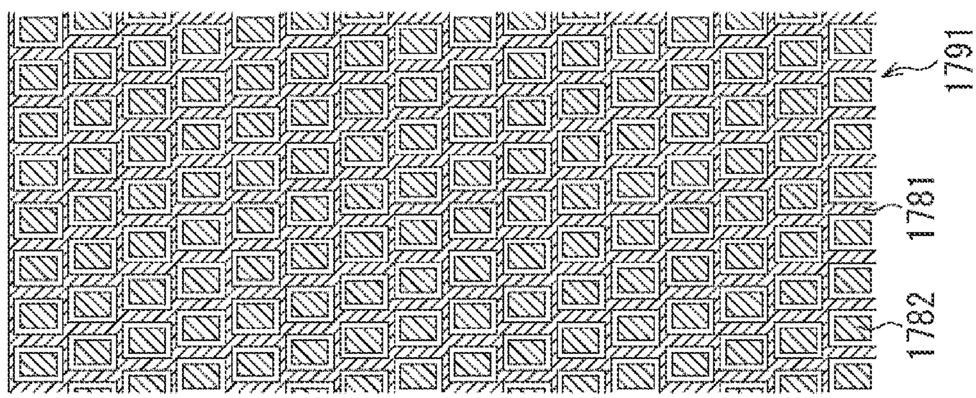
FIG. 197C
5÷16 PERIODIC SHIFT
(PERIODIC SHIFT = 5A)
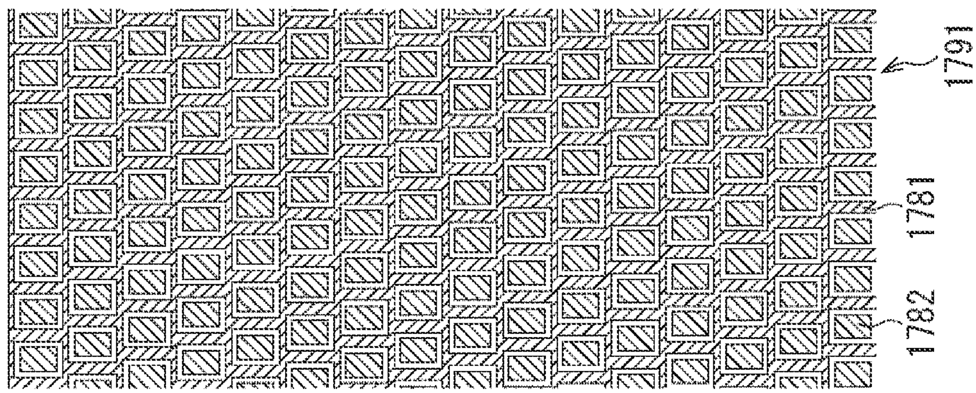

6÷16 PERIODIC SHIFT
(PERIODIC SHIFT = 6A)

7÷16 PERIODIC SHIFT
(PERIODIC SHIFT = 7A)

8÷16 PERIODIC SHIFT
(PERIODIC SHIFT = 8A)

3÷10 PERIODIC SHIFT
(PERIODIC SHIFT = 3A)

4÷10 PERIODIC SHIFT
(PERIODIC SHIFT = 4A)

5÷10 PERIODIC SHIFT
(PERIODIC SHIFT = 5A)

0:12 PERIODIC SHIFT
(NO PERIODIC SHIFT)

1:12 PERIODIC SHIFT
(PERIODIC SHIFT = 1A)

2:12 PERIODIC SHIFT
(PERIODIC SHIFT = 2A)

3:12 PERIODIC SHIFT
(PERIODIC SHIFT = 3A)
1822
1821
1831
: Vss WIRING
: Vdd WIRING
Y
X
Z

4÷12 PERIODIC SHIFT
(PERIODIC SHIFT =4A)

5÷12 PERIODIC SHIFT
(PERIODIC SHIFT = 5A)

6÷12 PERIODIC SHIFT
(PERIODIC SHIFT =6A)

CIRCUIT BOARD, SEMICONDUCTOR DEVICE, AND ELECTRONIC DEVICE

CROSS REFERENCE TO RELATED APPLICATIONS

This application is a U.S. National Phase of International Patent Application No. PCT/JP2019/033637 filed on Aug. 28, 2019, which claims priority benefit of Japanese Patent Application No. JP 2018-169405 filed in the Japan Patent Office on Sep. 11, 2018. Each of the above-referenced applications is hereby incorporated herein by reference in its entirety.

TECHNICAL FIELD

The present technology relates to a circuit board, a semiconductor device, and an electronic device, and more particularly to a circuit board, a semiconductor device, and an electronic device for enabling effective suppression of generation of noise in a signal.

BACKGROUND ART

In a solid-state imaging device represented by a complementary metal oxide semiconductor (CMOS) image sensor, noise may occur in a pixel signal generated by each pixel due to an internal configuration of the solid-state imaging device.

For example, some active elements such as transistors and diodes existing inside a solid-state imaging device generate fine hot carrier light emission. In a case where the hot carrier light emission leaks into a photoelectric conversion unit formed in a pixel, noise occurs in the pixel signal.

As a method of suppressing the noise caused by hot carrier light emission generated from an active element, a technique of providing a light-shielding structure to wiring formed between the active element and a photoelectric conversion unit is known (for example, see Patent Document 1).

Furthermore, for example, noise (inductive noise) may be generated in the pixel signal due to induced electromotive force caused by a magnetic field generated due to the internal configuration of the solid-state imaging device. Specifically, a conductor loop is formed on a pixel array, the conductor loop being formed using a control line for transmitting a control signal for selecting a pixel to read the pixel signal, and a signal line for transmitting the pixel signal read from the selected pixel, when reading the pixel signal from a certain pixel.

In addition, when wiring exists near the conductor loop formed using the control line and the signal line, a magnetic flux passing through the conductor loop may be generated due to a change in current flowing through the wiring, the induced electromotive force may be generated in the conductor loop, accordingly, and the inductive noise may be generated in the pixel signal. Hereinafter, the conductor loop in which a magnetic flux is generated due to a change in current flowing through nearby wiring and the induced electromotive force is generated by the magnetic flux is referred to as Victim conductor loop.

As a method of suppressing inductive noise inside an electronic device, there is a method of canceling a generated magnetic flux by arranging wiring that generates the magnetic flux inside the electronic device as two-layer reticulated wiring (for example, see Patent Document 2).

CITATION LIST

Patent Document

Patent Document 1: WO2013/115075

Patent Document 2: Japanese Patent Application Laid-Open No. 2014-57426

SUMMARY OF THE INVENTION

Problems to be Solved by the Invention

However, the invention described in Patent Document 2 can suppress the inductive noise but having not considered shielding the hot carrier light emission.

The present technology has been made in view of the foregoing, and enables effective suppression of generation of noise in a signal.

Solutions to Problems

A circuit board according to the first aspect of the present technology includes a reticulated conductor including: a first conductor group configured by two or more conductors having a first conductor width and arranged with a first periodic width in a first direction; a second conductor group configured by two or more conductors having a second conductor width and arranged with a second periodic width in a second direction orthogonal to the first direction; and a first moving conductor group arranged at a position to which at least a part of the second conductor group is moved by a factor of 1 of the first periodic width in the first direction and is moved by a factor of 1 of a third periodic width in the second direction, in which the third periodic width and the second periodic width are different.

A semiconductor device according to the second aspect of the present technology includes a circuit board including a reticulated conductor including: a first conductor group configured by two or more conductors having a first conductor width and arranged with a first periodic width in a first direction; a second conductor group configured by two or more conductors having a second conductor width and arranged with a second periodic width in a second direction orthogonal to the first direction; and a first moving conductor group arranged at a position to which at least a part of the second conductor group is moved by a factor of 1 of the first periodic width in the first direction and is moved by a factor of 1 of a third periodic width in the second direction, the third periodic width and the second periodic width being different.

An electronic device according to a third aspect of the present technology includes a semiconductor device including a circuit board including a reticulated conductor including: a first conductor group configured by two or more conductors having a first conductor width and arranged with a first periodic width in a first direction; a second conductor group configured by two or more conductors having a second conductor width and arranged with a second periodic width in a second direction orthogonal to the first direction; and a first moving conductor group arranged at a position to which at least a part of the second conductor group is moved by a factor of 1 of the first periodic width in the first direction and is moved by a factor of 1 of a third periodic width in the second direction, the third periodic width and the second periodic width being different.

In the first to third aspects of the present technology, a reticulated conductor is provided, which includes a first conductor group configured by two or more conductors having a first conductor width and arranged with a first periodic width in a first direction, a second conductor group configured by two or more conductors having a second conductor width and arranged with a second periodic width in a second direction orthogonal to the first direction, and a first moving conductor group arranged at a position to which at least a part of the second conductor group is moved by a factor of 1 of the first periodic width in the first direction and is moved by a factor of 1 of a third periodic width in the second direction, and the third periodic width and the second periodic width are different.

The circuit board, the semiconductor device, and the electronic device may be independent devices or may be modules incorporated in other devices.

Effect of the Invention

According to the first to third aspects of the present technology, generation of noise in a signal can be suppressed.

Note that the effects described here are not necessarily limited, and any of effects described in the present disclosure may be exhibited.

BRIEF DESCRIPTION OF DRAWINGS

FIGS. 58A, 58B, 58C, 580, 58E, and 58F are diagrams illustrating modifications of reticulated conductors forming configuration examples of the conductor layers A and B.

FIGS. 110A, 1108, 110C, 1100, 110E, 110F, 110G, 110H, and 110I are cross-sectional views illustrating substrate arrangement examples of a Victim conductor loop and an Aggressor conductor loop.

Figure 120A:
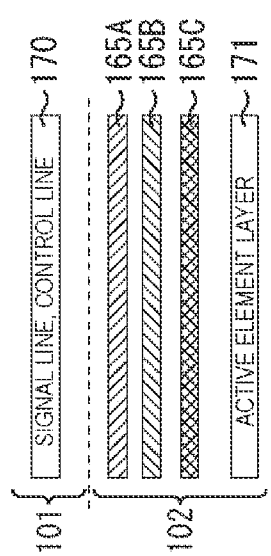
Figure 120B:
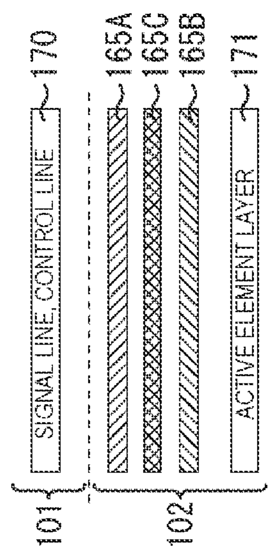
Figure 120C:
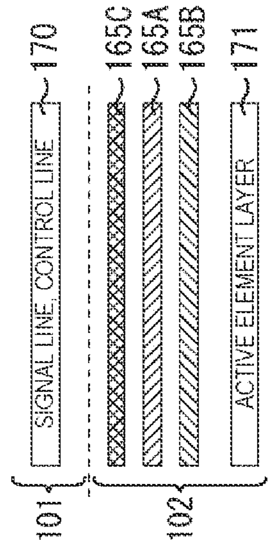

FIGS. 120A, 1208, and 120C diagrams illustrating arrangement examples in a case where there are three conductor layers.

FIGS. 121A, 121B, 121C, 121D, 121E, and 121F are diagrams illustrating a problem in the case where there are three conductor layers.

FIGS. 122A, 122B, 122C, 1220, 122E, and 122F are diagrams illustrating a first configuration example of a three-layer conductor layer.

FIGS. 123A, 123B, 123C, 1230, 123E, and 123F are diagrams illustrating a second configuration example of the three-layer conductor layer.

FIGS. 124A, 124B, 124C, 124D, 124E, and 124F are diagrams illustrating a first modification of the second configuration example of the three-layer conductor layer.

FIGS. 125A, 125B, 125C, 125D, 125E, and 125F are diagrams illustrating a second modification of the second configuration example of the three-layer conductor layer.

FIGS. 126A, 126B, 126C, 1260, 126E, and 126F are diagrams illustrating a third configuration example of the three-layer conductor layer.

FIGS. 127A, 127B, 127C, 127D, 127E, and 127F are diagrams illustrating a modification of the third configuration example of the three-layer conductor layer.

FIGS. 128A, 128B, 128C, 1280, 128E, and 128F are diagrams illustrating a fourth configuration example of the three-layer conductor layer.

FIGS. 129A, 129B, 129C, 1290, 129E, and 129F are diagrams illustrating a first modification of the fourth configuration example of the three-layer conductor layer.

FIGS. 130A, 130B, 130C, 130D, 130E, and 130F are diagrams illustrating a second modification of the fourth configuration example of the three-layer conductor layer.

FIGS. 131A, 131B, 131C, 131D, 131E, and 131F are diagrams illustrating a fifth configuration example of the three-layer conductor layer.

FIGS. 132A, 132B, 132C, 132D, 132E, and 132F are diagrams illustrating a sixth configuration example of the three-layer conductor layer.

FIGS. 133A, 133B, 133C, 1330, 133E, and 133F are diagrams illustrating a modification of the sixth configuration example of the three-layer conductor layer.

FIGS. 134A, 134B, 134C, 134D, 134E, and 134F are diagrams illustrating a seventh configuration example of the three-layer conductor layer.

FIGS. 135A, 135B, 135C, 135D, 135E, and 135F are diagrams illustrating an eighth configuration example of the three-layer conductor layer.

FIGS. 136A, 136B, 136C, 136D, 136E, and 136F are diagrams illustrating a first modification of the eighth configuration example of the three-layer conductor layer.

FIGS. 137A, 137B, 137C, 137D, 137E, and 137F are diagrams illustrating a second modification of the eighth configuration example of the three-layer conductor layer.

FIGS. 138A, 138B, 138C, 138D, 138E, and 138F are diagrams illustrating a third modification of the eighth configuration example of the three-layer conductor layer.

FIGS. 139A, 139B, 139C, 1390, 139E, and 139F are diagrams illustrating a fourth modification of the eighth configuration example of the three-layer conductor layer.

FIGS. 140A, 140B, 140C, 140D, 140E, and 140F are diagrams illustrating a fifth modification of the eighth configuration example of the three-layer conductor layer.

FIGS. 141A, 141B, 141C, 141D, 141E, and 141F are diagrams illustrating a ninth configuration example of the three-layer conductor layer.

FIGS. 142A, 142B, 142C, 142D, 142E, and 142F are diagrams illustrating a first modification of the ninth configuration example of the three-layer conductor layer.

FIGS. 143A, 143B, 143C, 143D, 143E, and 143F are diagrams illustrating a second modification of the ninth configuration example of the three-layer conductor layer.

FIGS. 144A, 144B, 144C, 144D, 144E, and 144F are diagrams illustrating a third modification of the ninth configuration example of the three-layer conductor layer.

FIGS. 145A, 145B, 145C, 145D, 145E, and 145F are diagrams illustrating a fourth modification of the ninth configuration example of the three-layer conductor layer.

FIGS. 146A, 146B, 146C, 146D, 146E, and 146F are diagrams illustrating a tenth configuration example of the three-layer conductor layer.

FIGS. 147A, 147B, 147C, 147D, 147E, and 147F are diagrams illustrating a modification of the tenth configuration example of the three-layer conductor layer.

FIGS. 148A, 148B, 148C, 148D, 148E, and 148F are diagrams illustrating an eleventh configuration example of the three-layer conductor layer.

FIGS. 149A, 149B, 149C, 149D, 149E, and 149F are diagrams illustrating a twelfth configuration example of the three-layer conductor layer.

FIGS. 150A, 150B, 150C, 1500, 150E, and 150F are diagrams illustrating a first modification of the twelfth configuration example of the three-layer conductor layer.

FIGS. 151A, 151B, 151C, 151D, 151E, and 151F are diagrams illustrating a second modification of the twelfth configuration example of the three-layer conductor layer.

FIGS. 152A, 152B, 152C, 152D, 152E, and 152F are diagrams illustrating a thirteenth configuration example of the three-layer conductor layer.

FIGS. 153A, 153B, 153C, 1530, 153E, and 153F are diagrams illustrating a fourteenth configuration example of the three-layer conductor layer.

FIGS. 154A, 154B, 154C, 154D, 154E, and 154F are diagrams illustrating a first modification of the fourteenth configuration example of the three-layer conductor layer.

FIGS. 155A, 155B, 155C, 155D, 155E, and 155F are diagrams illustrating a second modification of the fourteenth configuration example of the three-layer conductor layer.

Figure 156A:
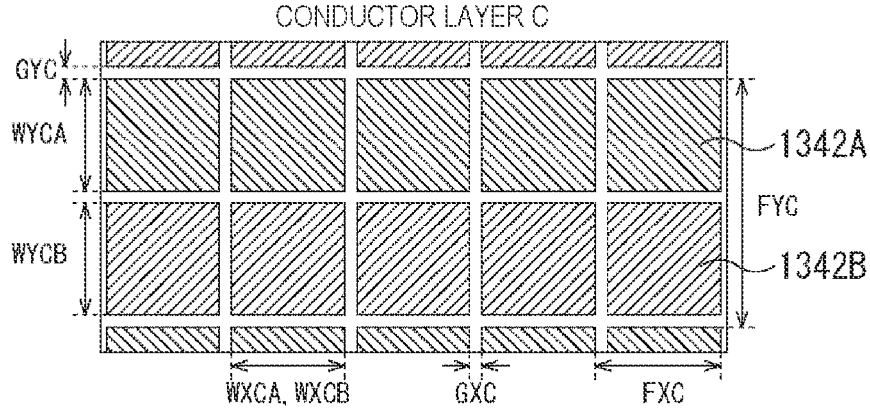
Figure 156B:
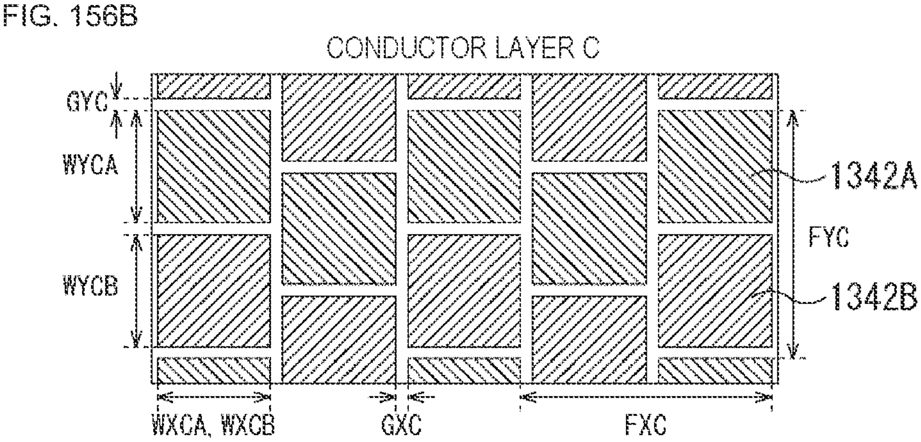
Figure 156C:
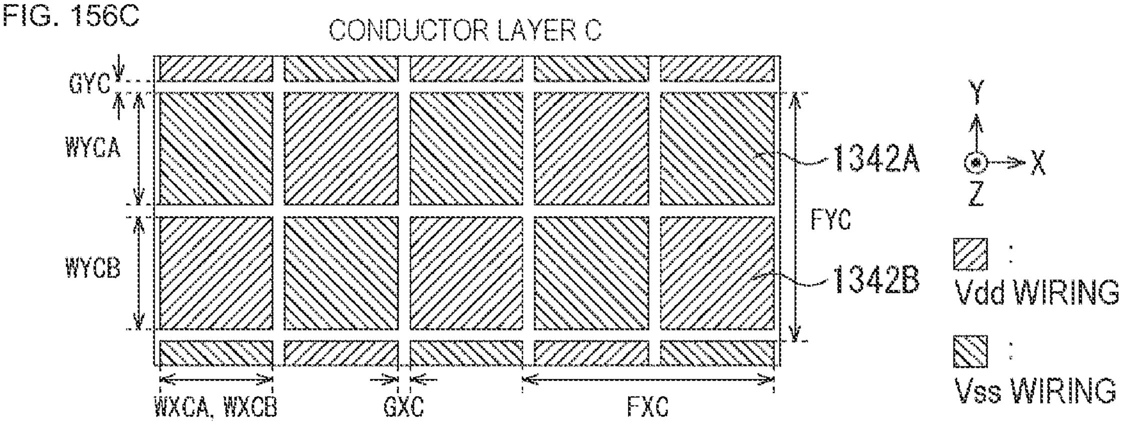

FIGS. 156A, 156B, and 156C are diagrams illustrating a third modification to a fifth modification of the fourteenth configuration example of the three-layer conductor layer.

Figure 157A:
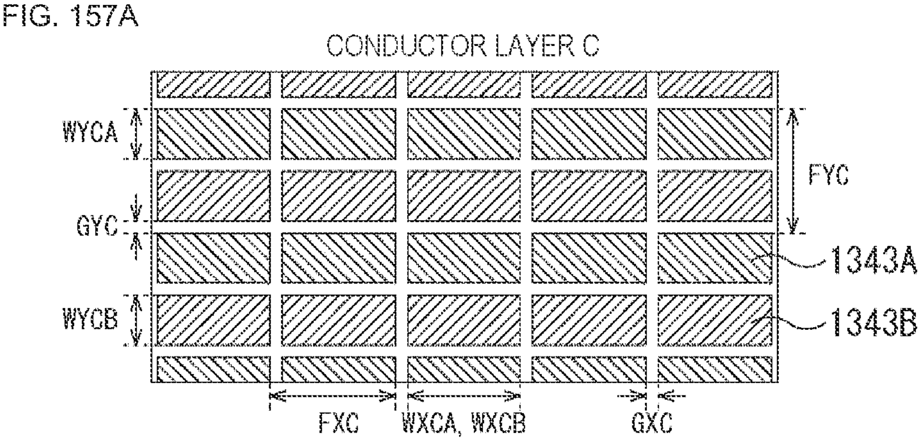
Figure 157B:
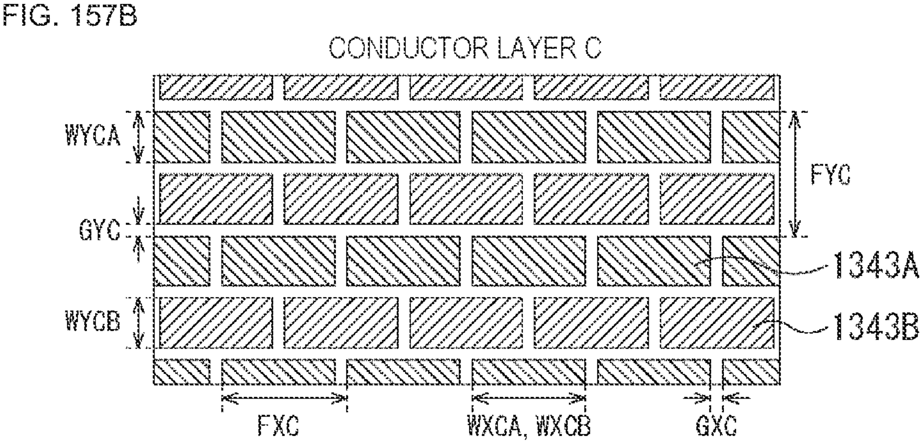
Figure 157C:
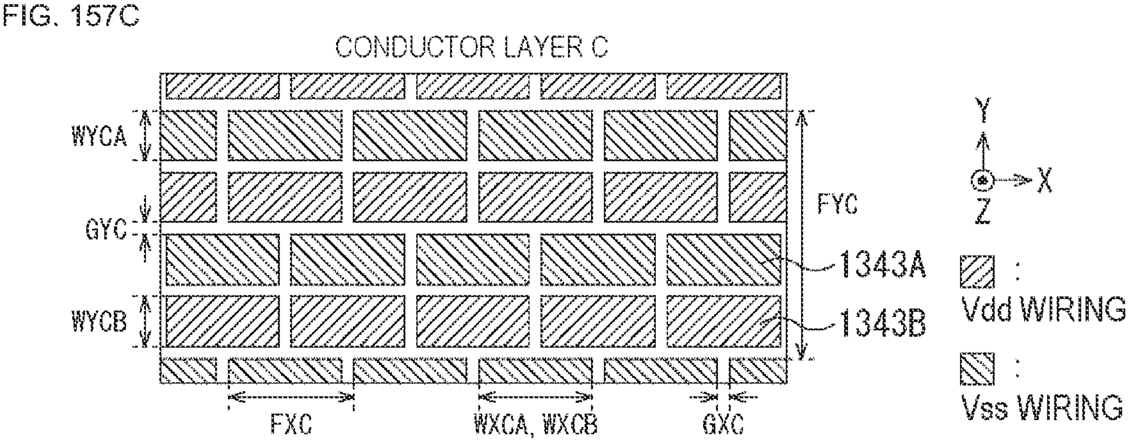

FIGS. 157A, 157B, and 157C diagrams illustrating a sixth modification to an eighth modification of the fourteenth configuration example of the three-layer conductor layer.

Figure 158A:
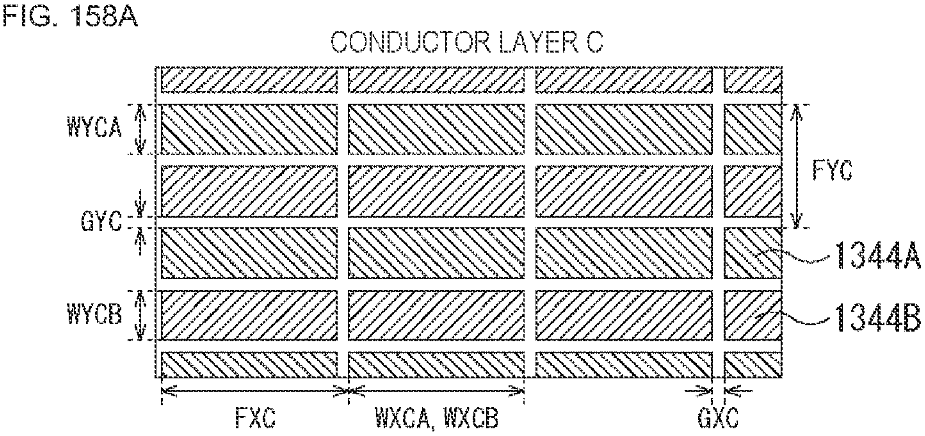
Figure 158B:
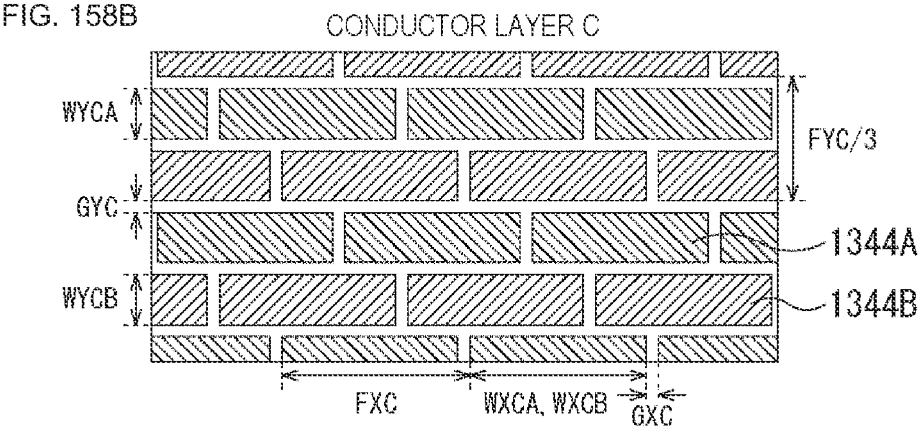
Figure 158C:
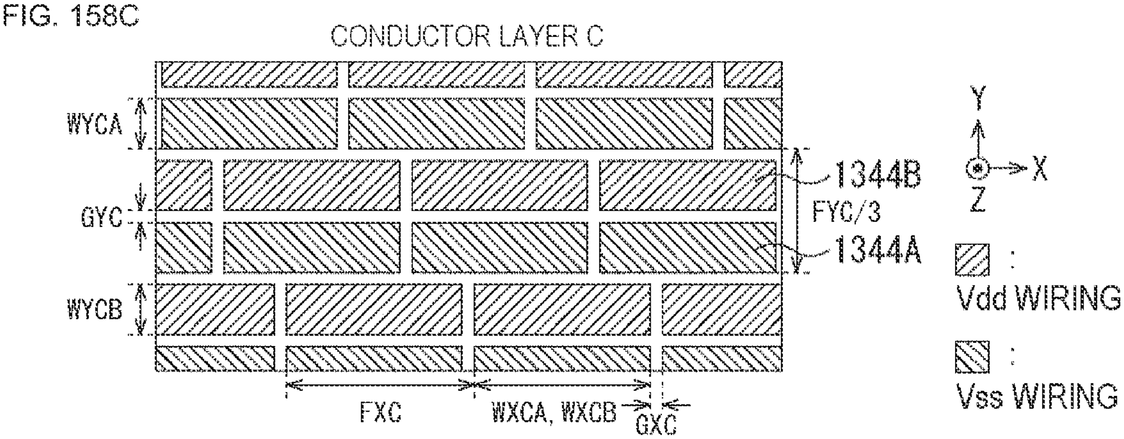

FIGS. 158A, 158B, and 158C are diagrams illustrating a ninth modification to an eleventh modification of the fourteenth configuration example of the three-layer conductor layer.

Figure 159A:
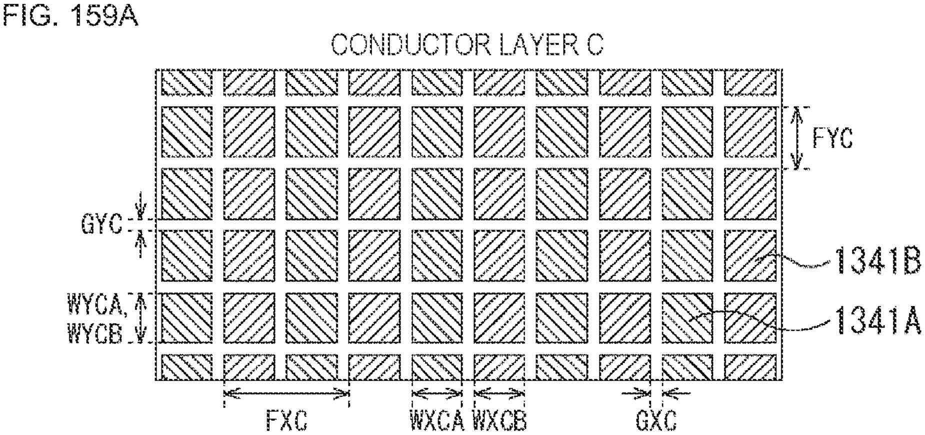
Figure 159B:
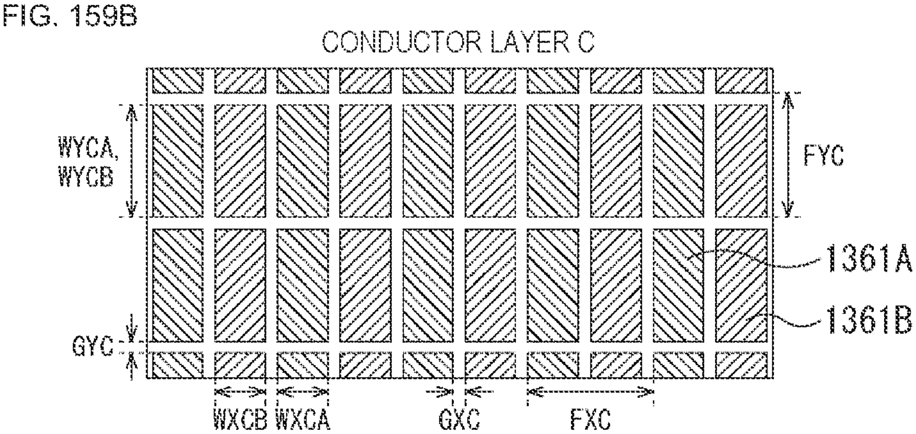
Figure 159C:
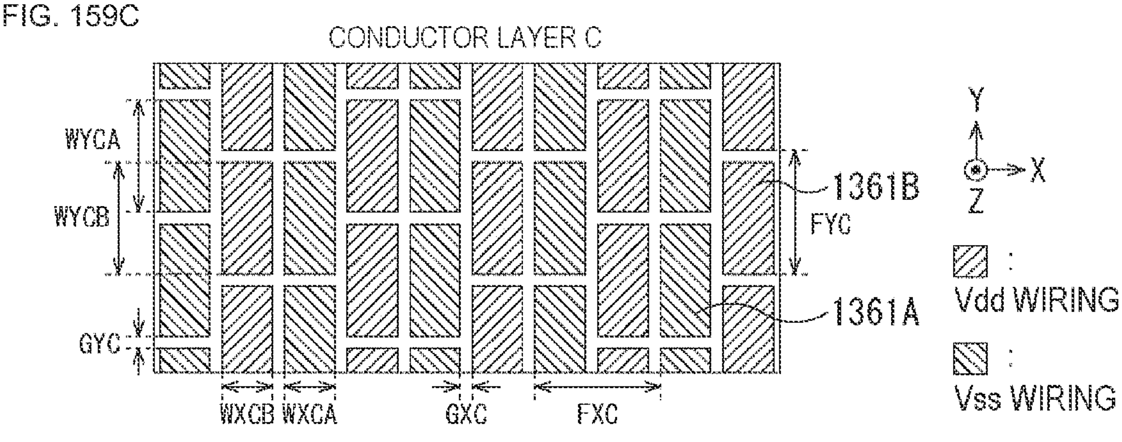

FIGS. 159A, 159B, and 159C are diagrams illustrating a twelfth modification to a fourteenth modification of the fourteenth configuration example of the three-layer conductor layer.

Figure 160A:
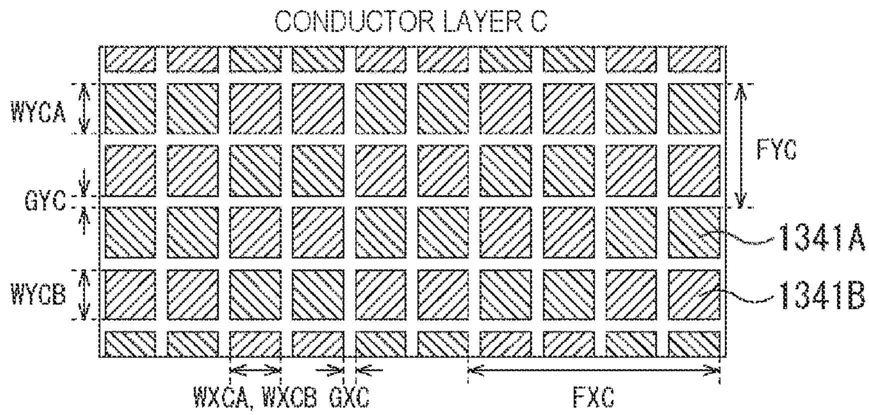
Figure 160B:
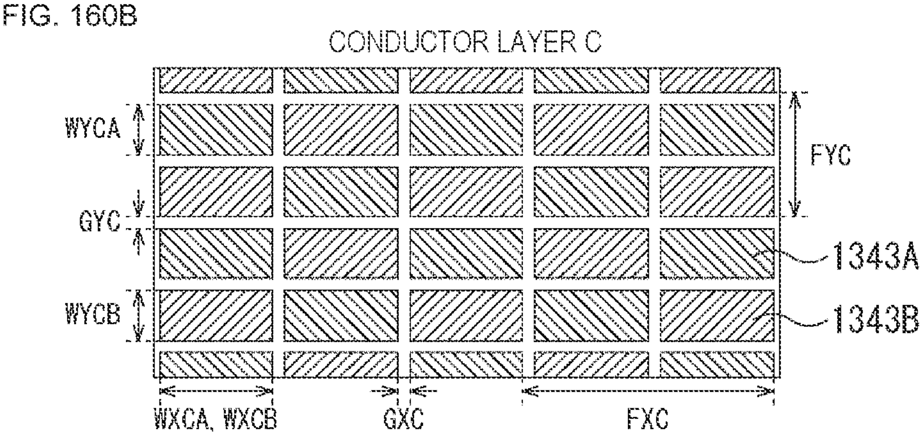
Figure 160C:
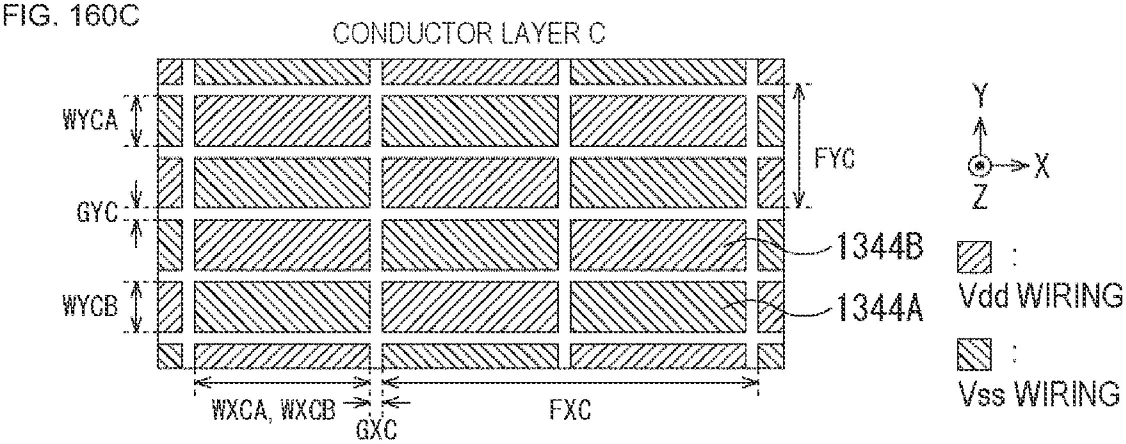

FIGS. 160A, 160B, and 160C diagrams illustrating a fifteenth modification to a seventeenth modification of the fourteenth configuration example of the three-layer conductor layer.

Figure 161A:
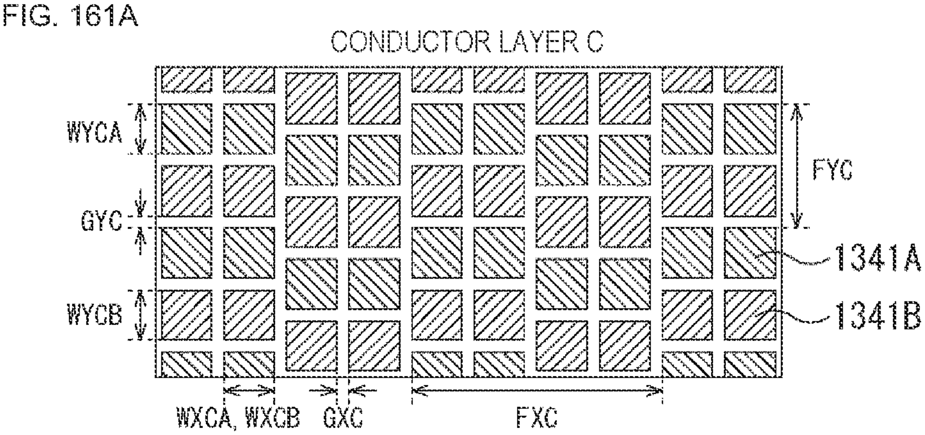
Figure 161B:
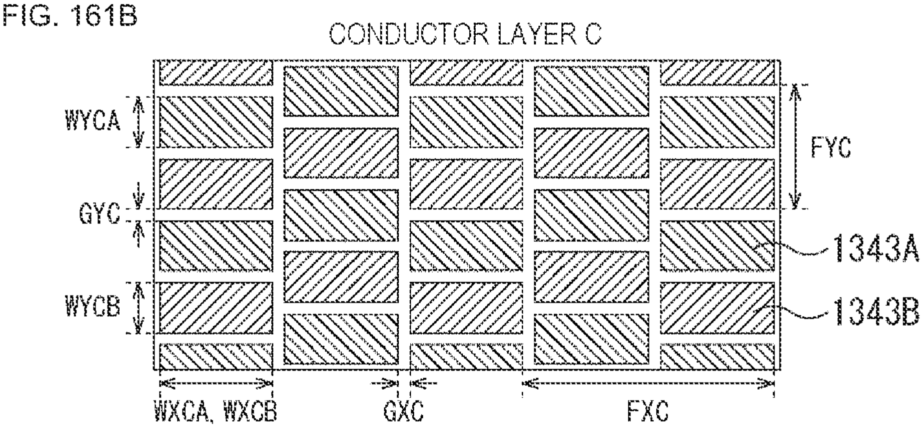
Figure 161C:
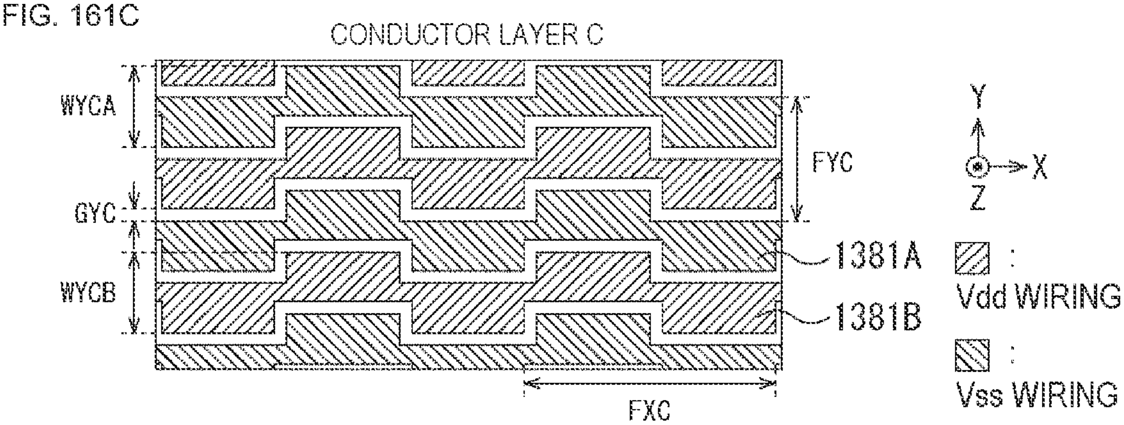

FIGS. 161A, 161B, and 161C are diagrams illustrating an eighteenth modification to a twentieth modification of the fourteenth configuration example of the three-layer conductor layer.

Figure 162A:
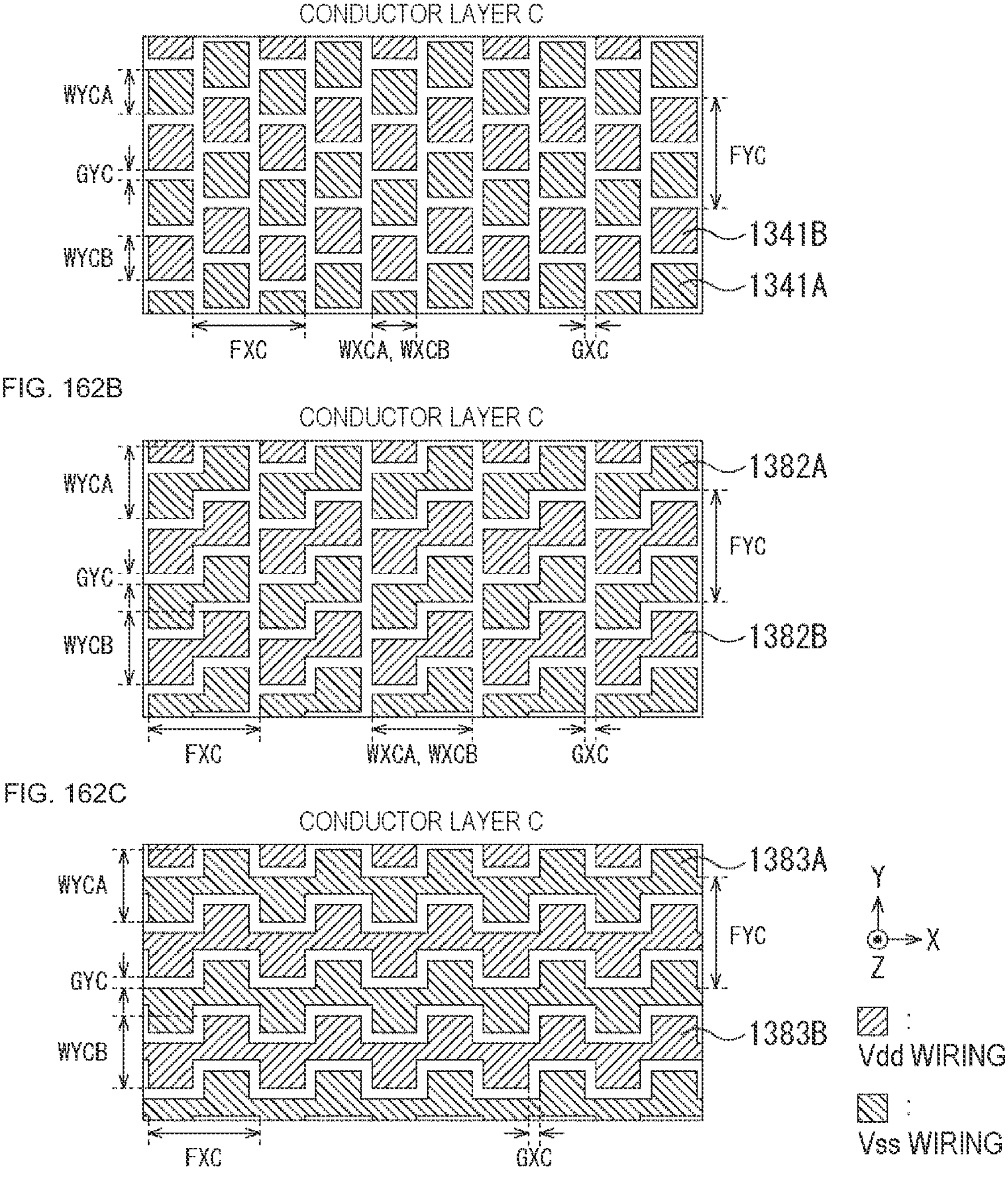

FIGS. 162A, 162B, and 162C diagrams illustrating a twenty-first modification to a twenty-third modification of the fourteenth configuration example of the three-layer conductor layer.

Figure 163A:
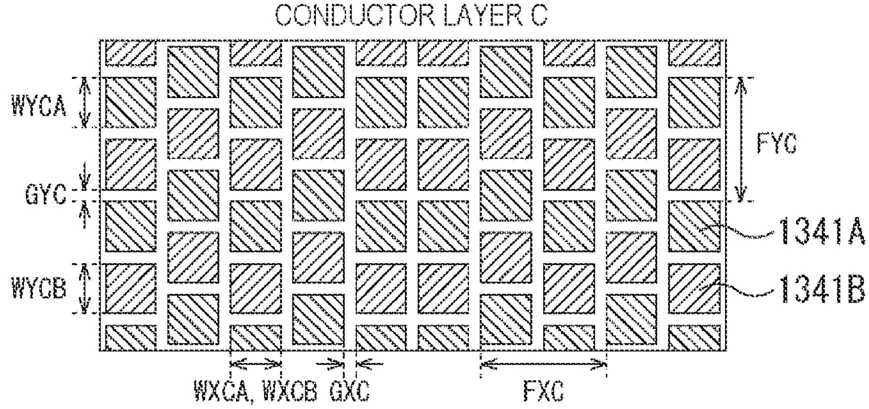
Figure 163B:
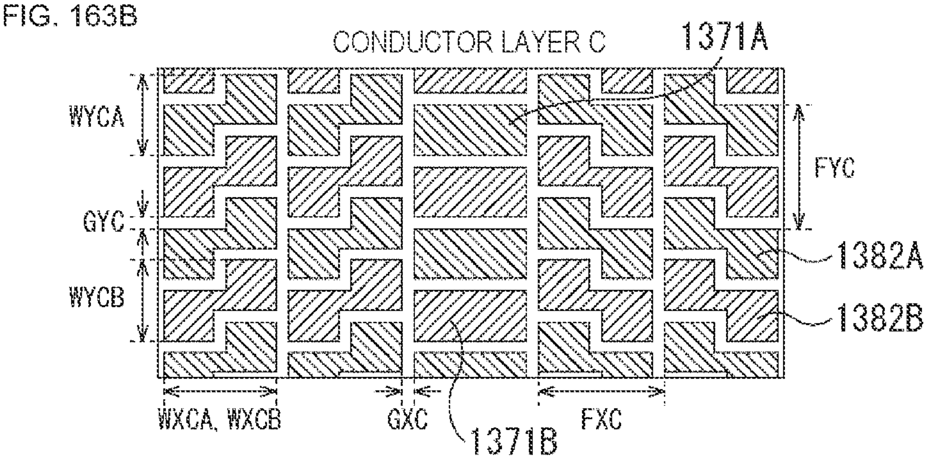
Figure 163C:
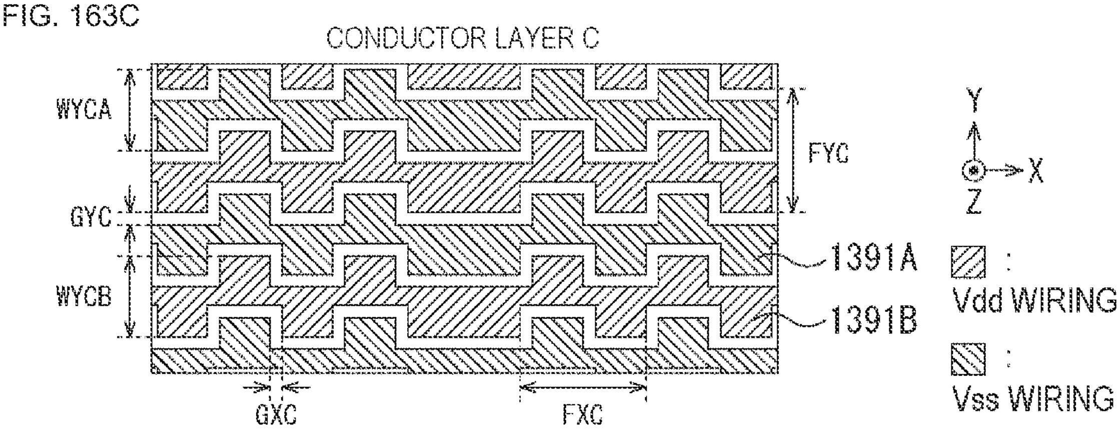

FIGS. 163A, 163B, and 163C are diagrams illustrating a twenty-fourth modification to a twenty-sixth modification of the fourteenth configuration example of the three-layer conductor layer.

Figure 164:
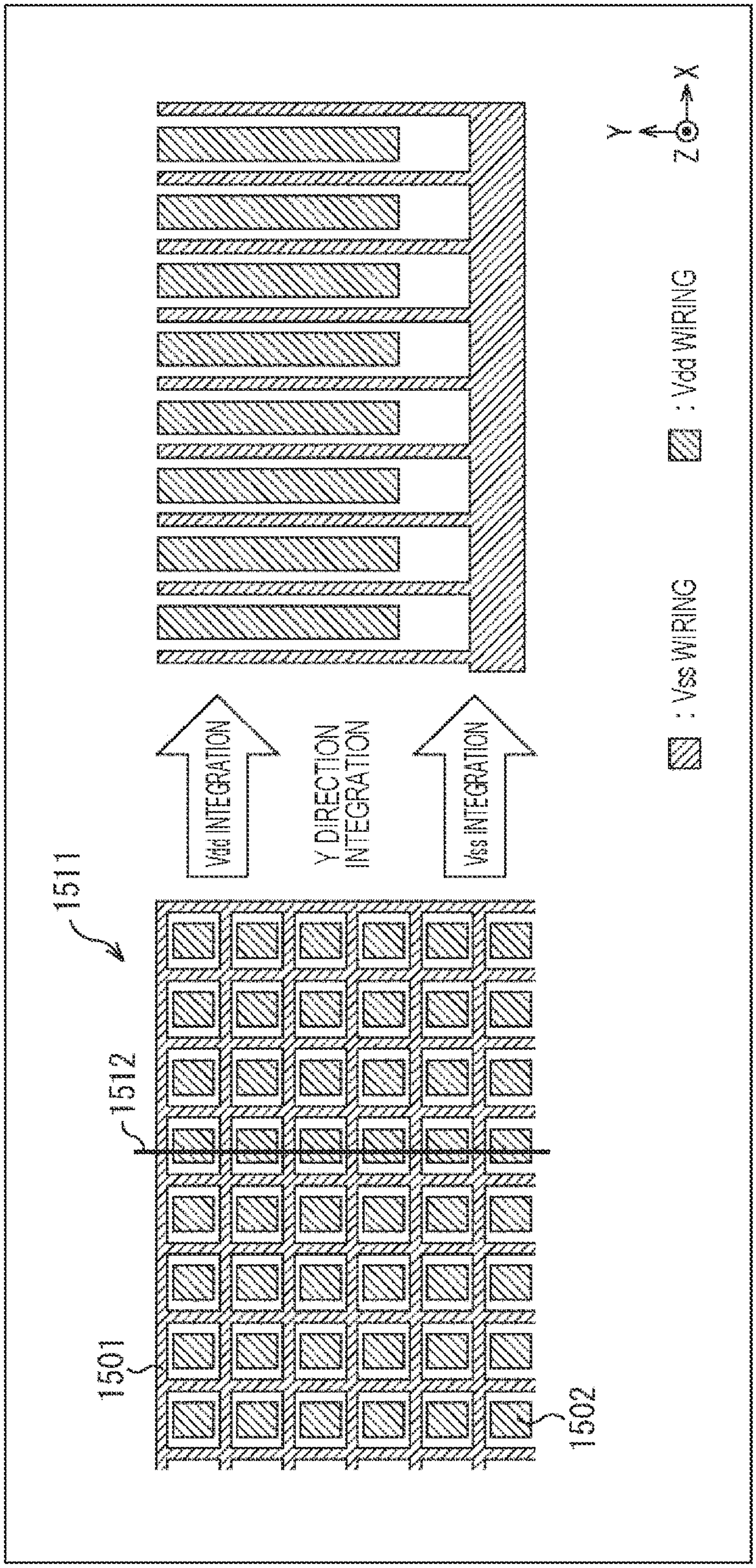

FIG. 164 is a diagram for describing capacitive noise of a reticulated conductor.

Figure 165:
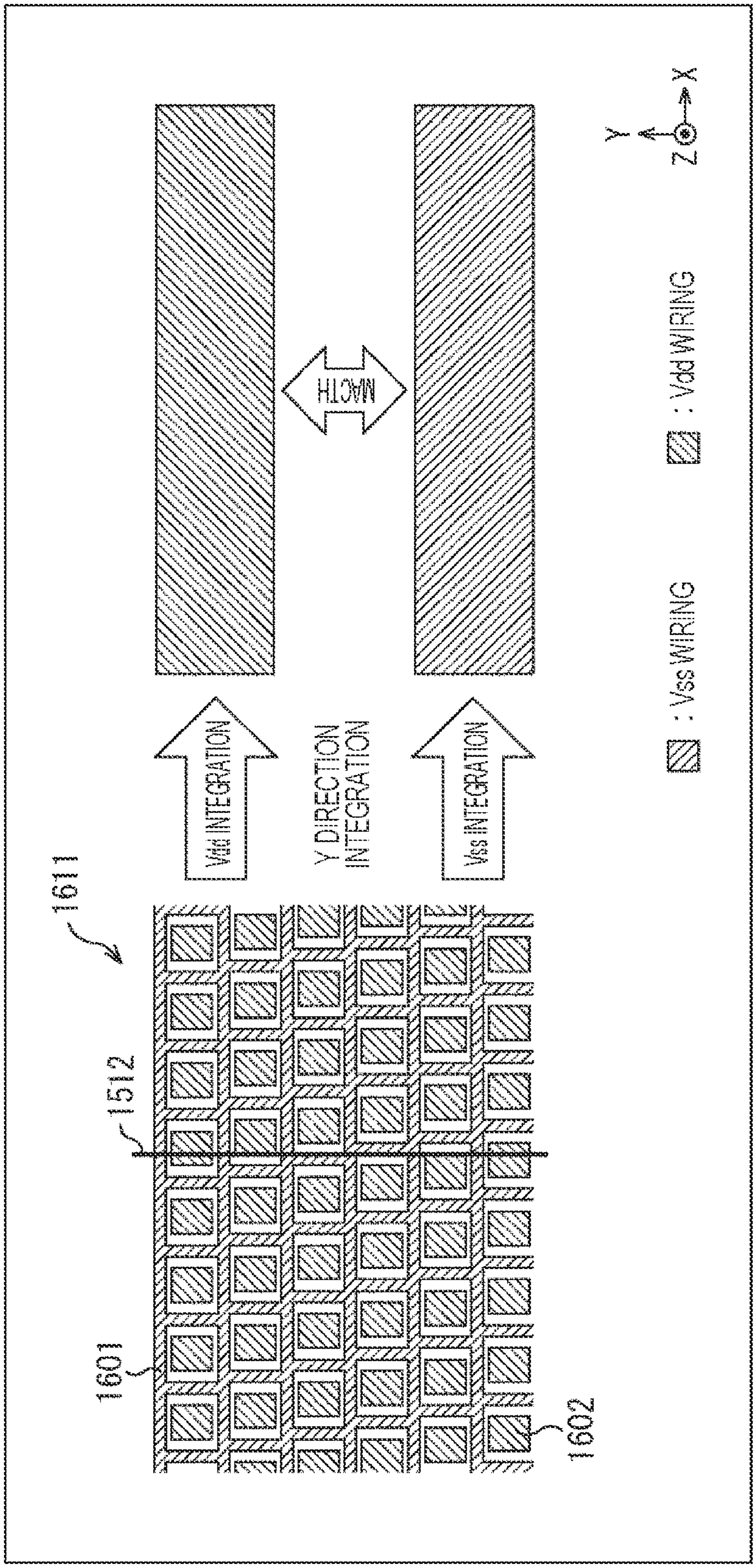

FIG. 165 is a diagram for describing capacitive noise of a reticulated conductor in which a predetermined amount of shift is set.

Figure 166:
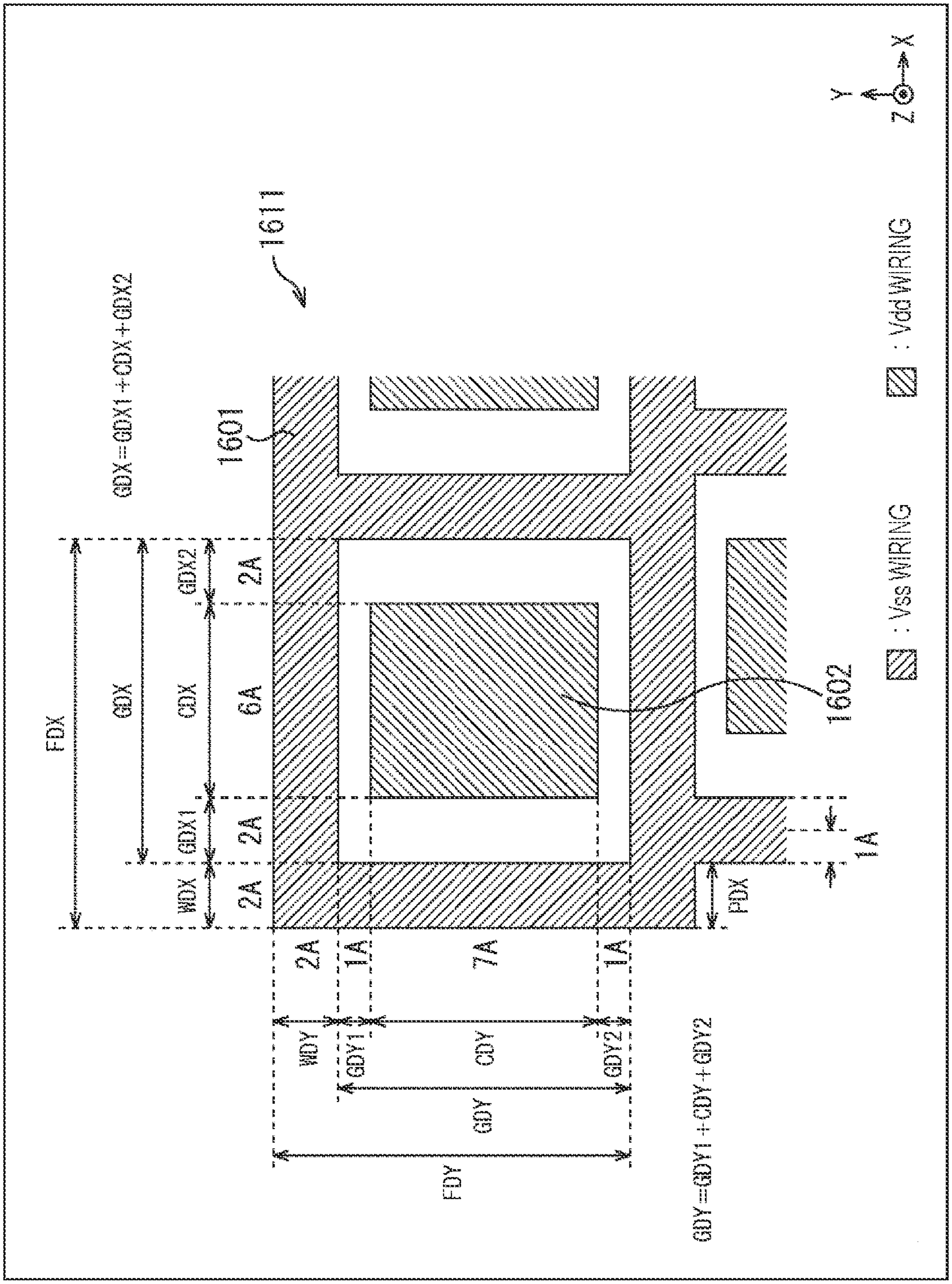

FIG. 166 is a view for describing a conductor width and a gap width of a first shift configuration example of the reticulated conductor.

FIGS. 167A, 167B, 167C, and 167D plan views of the first shift configuration example of the reticulated conductor.

Figure 168C:
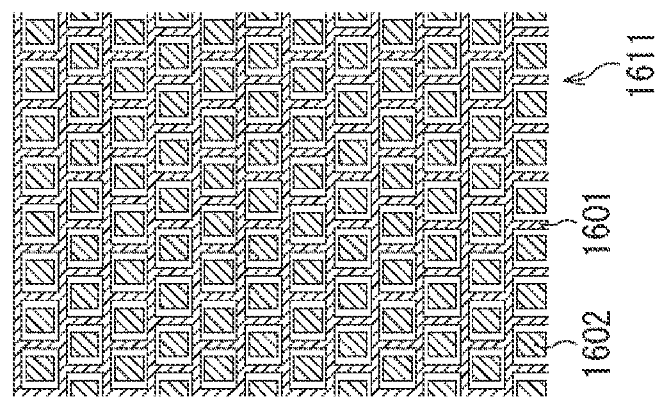
Figure 168C:
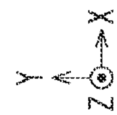
Figure 168B:
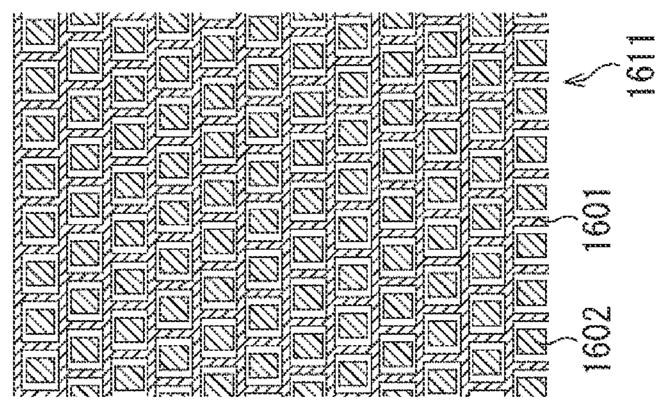
Figure 168A:
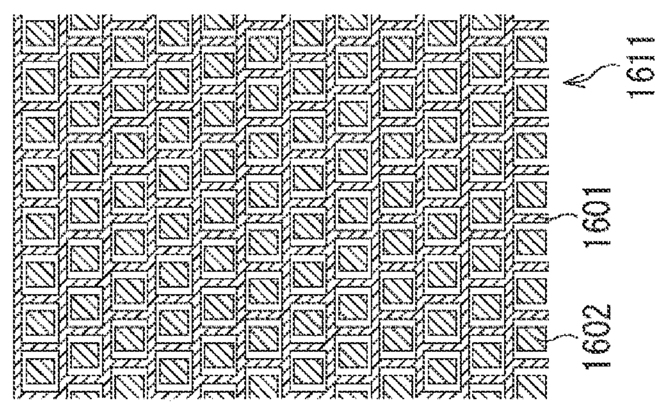

FIGS. 168A, 168B, and 168C are plan views of the first shift configuration example of the reticulated conductor.

Figure 169:
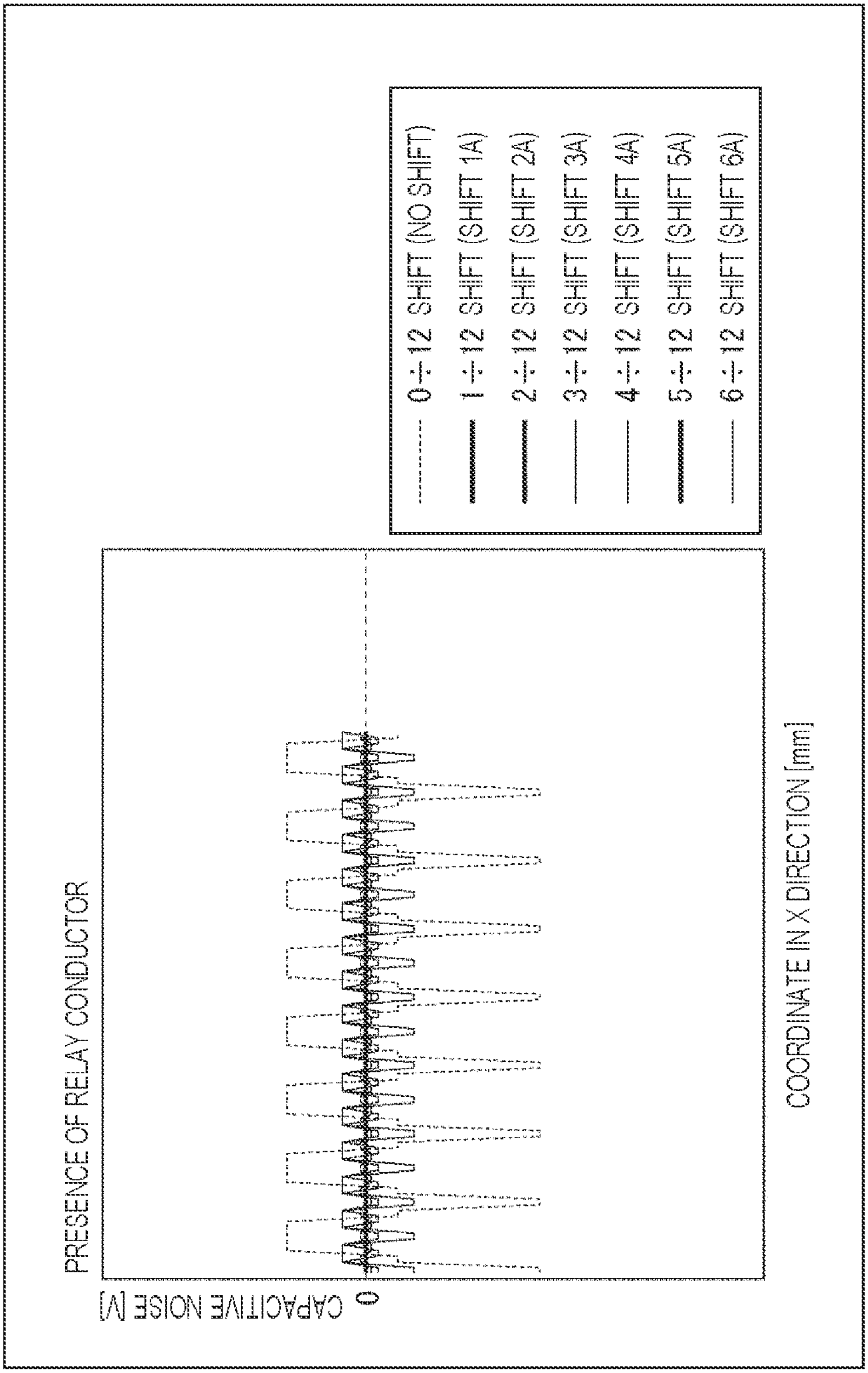

FIG. 169 is a diagram illustrating theoretical values of the capacitive noise in the first shift configuration example.

Figure 170:
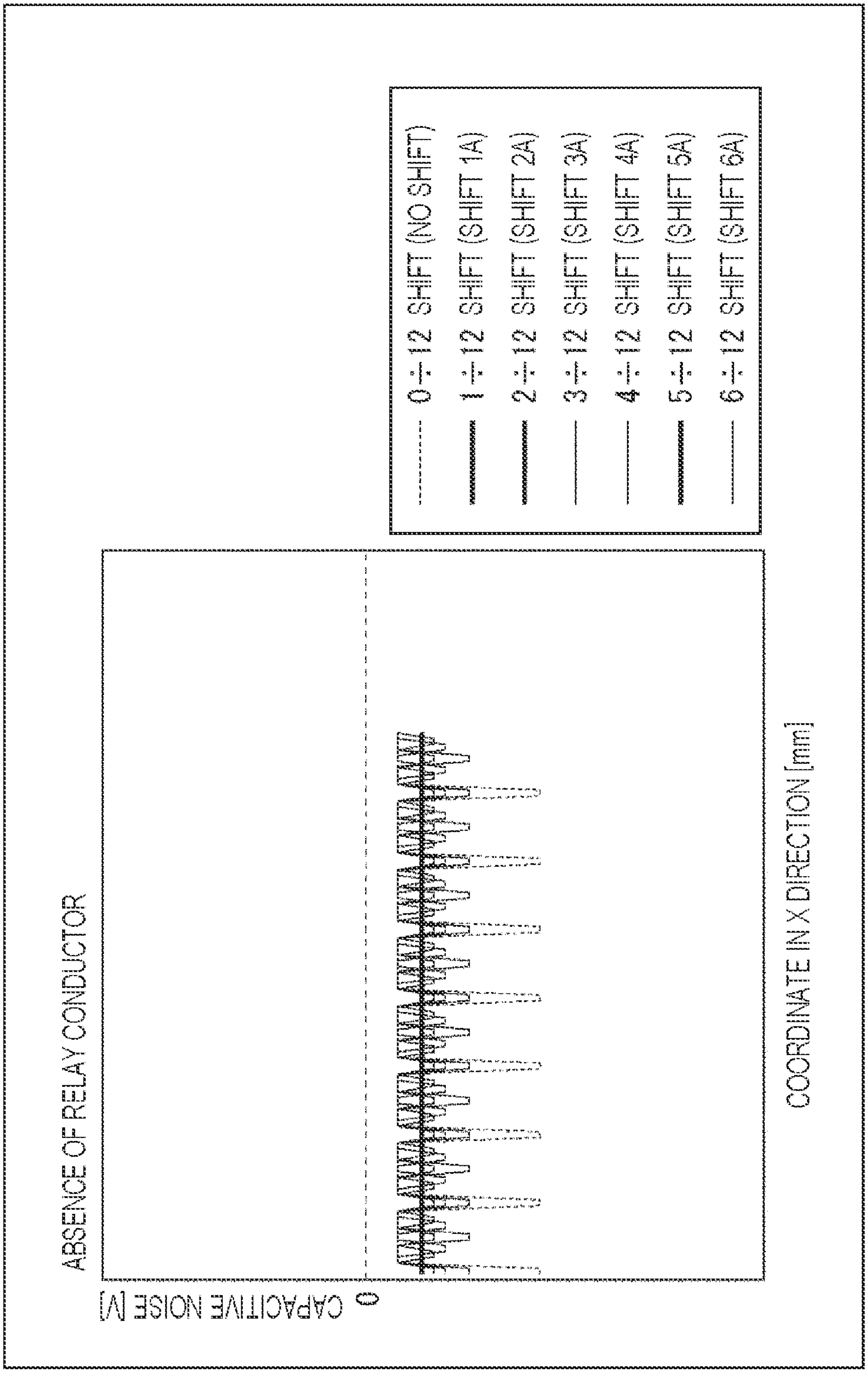

FIG. 170 is a diagram illustrating theoretical values of the capacitive noise in the first shift configuration example.

Figure 171:
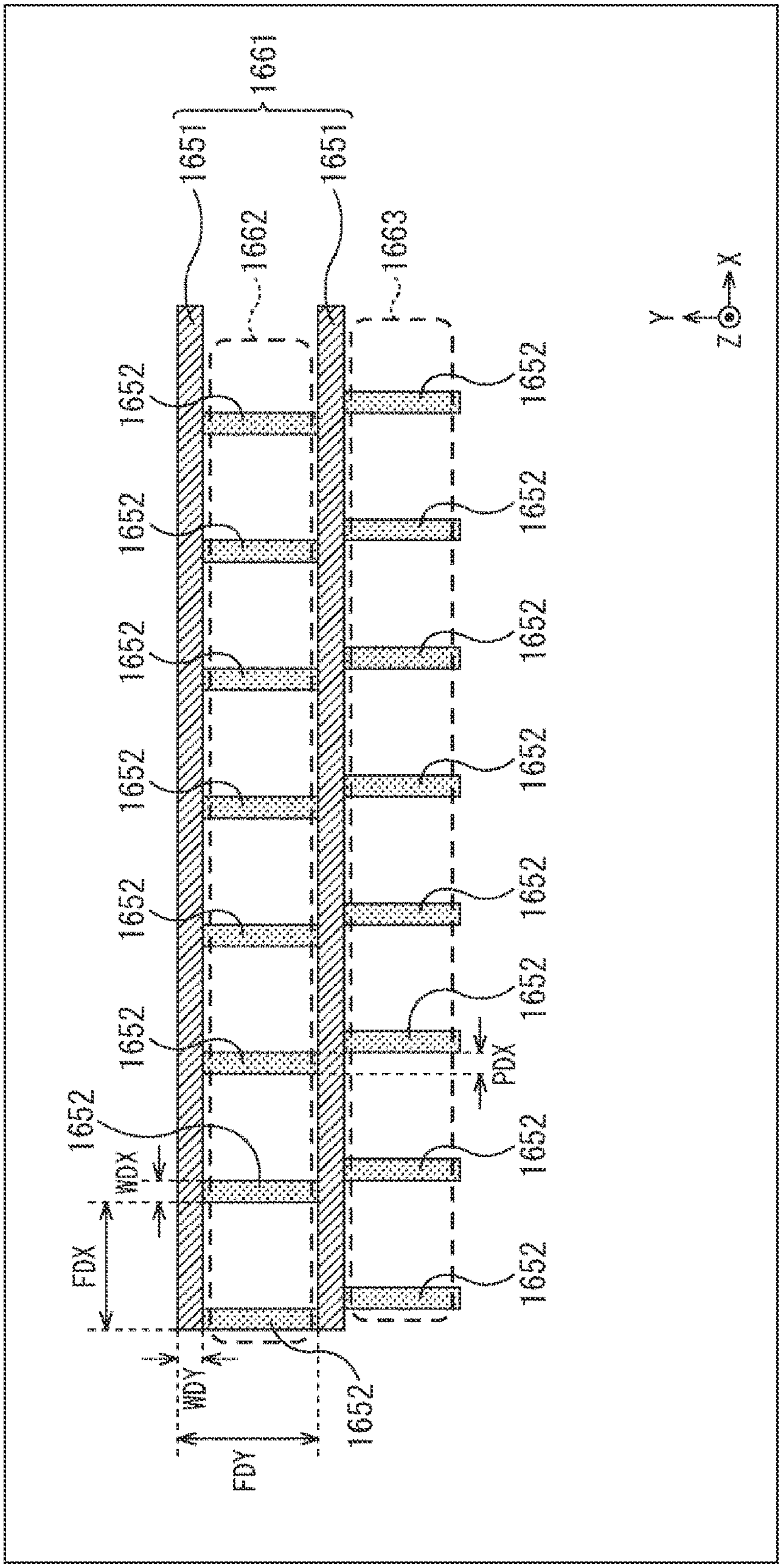

FIG. 171 is a diagram for describing definition of a reticulated conductor.

Figure 172:
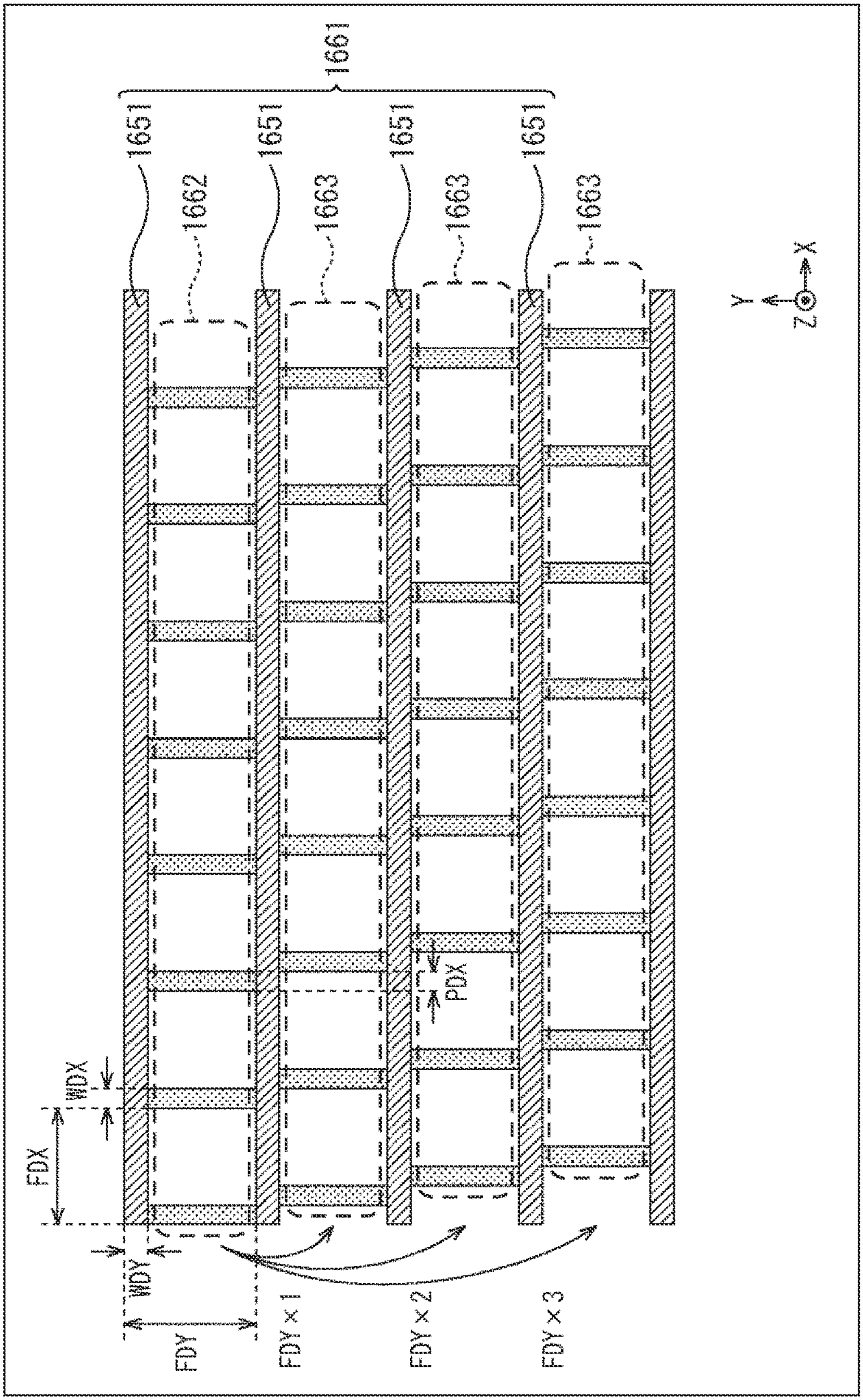

FIG. 172 is a diagram for describing definition of a reticulated conductor.

Figure 173A:
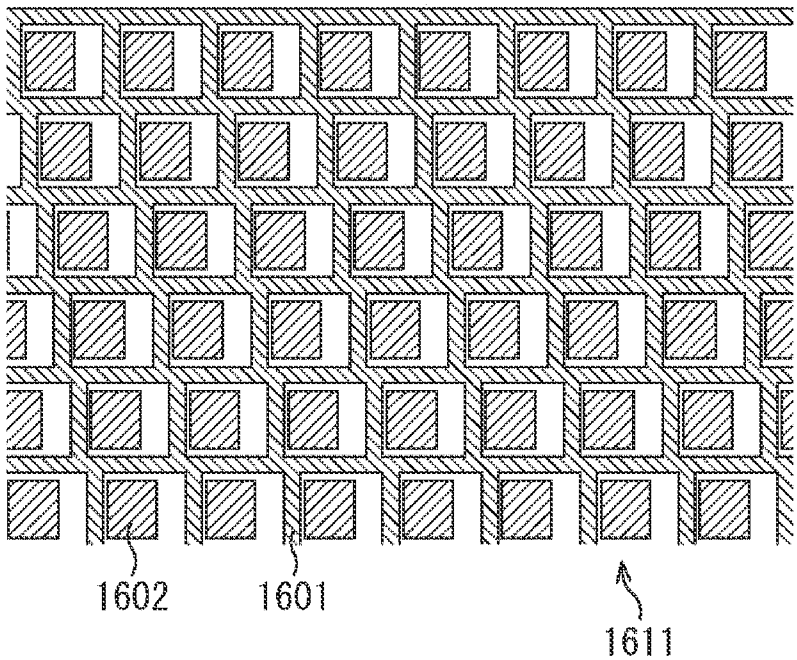
Figure 173B:
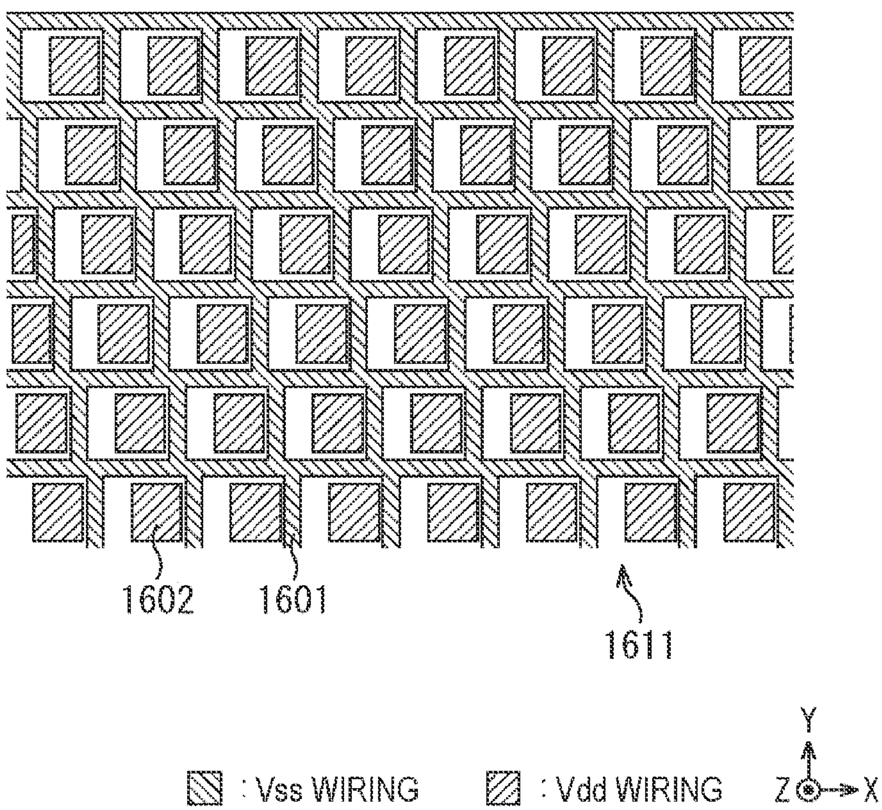

FIGS. 173A and 173B plan views illustrating first and second modifications of the first shift configuration example.

Figure 174A:
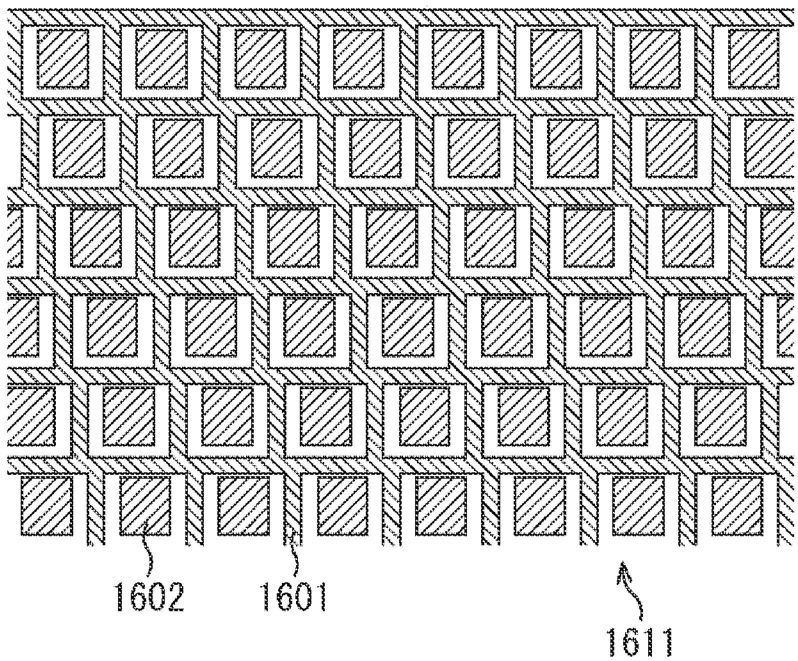
Figure 174B:
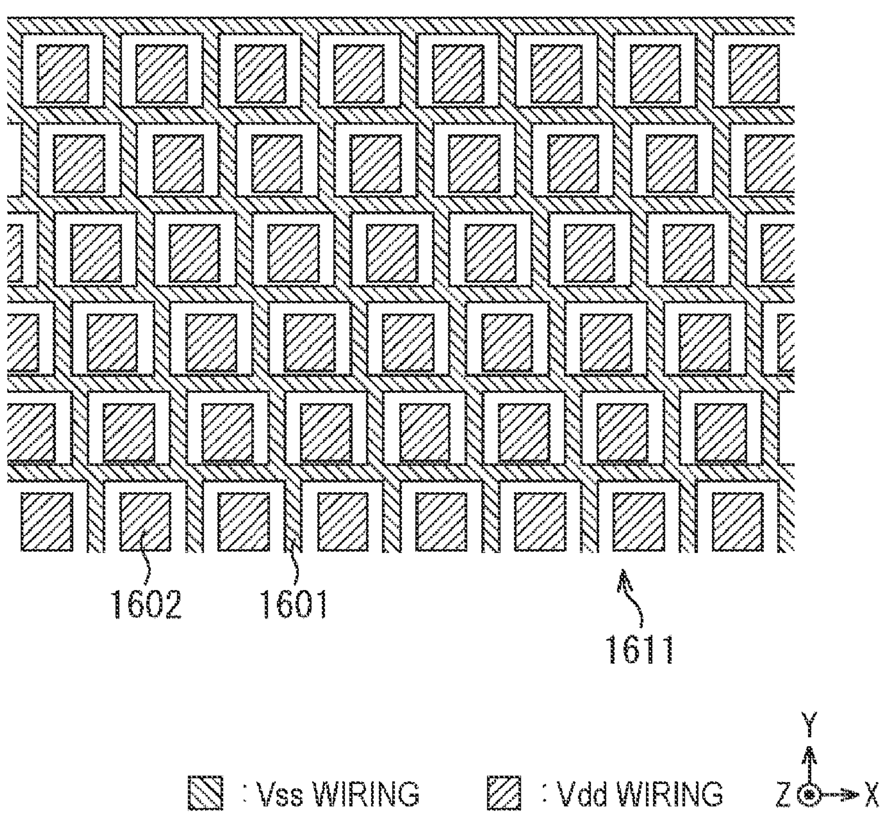

FIGS. 174A and 174B are plan views illustrating third and fourth modifications of the first shift configuration example.

Figure 175A:
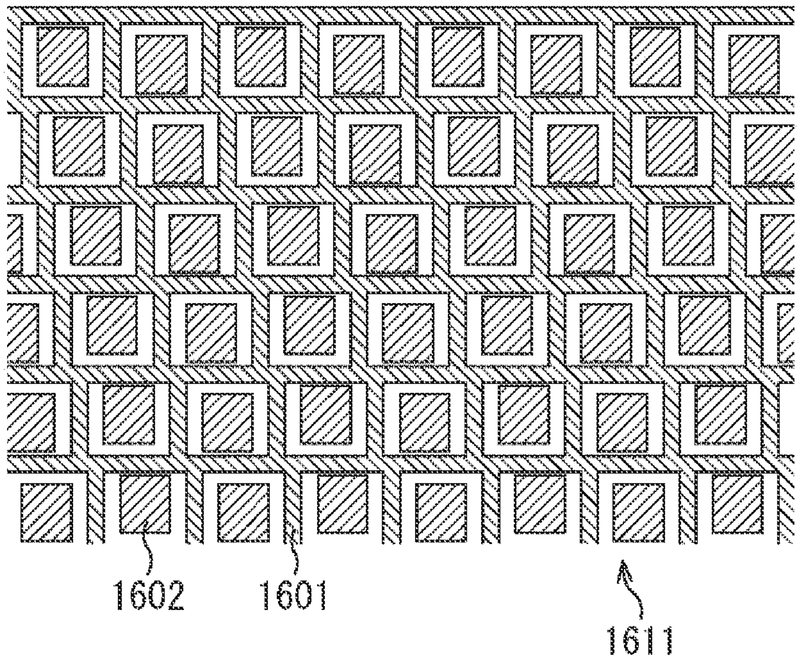
Figure 175B:
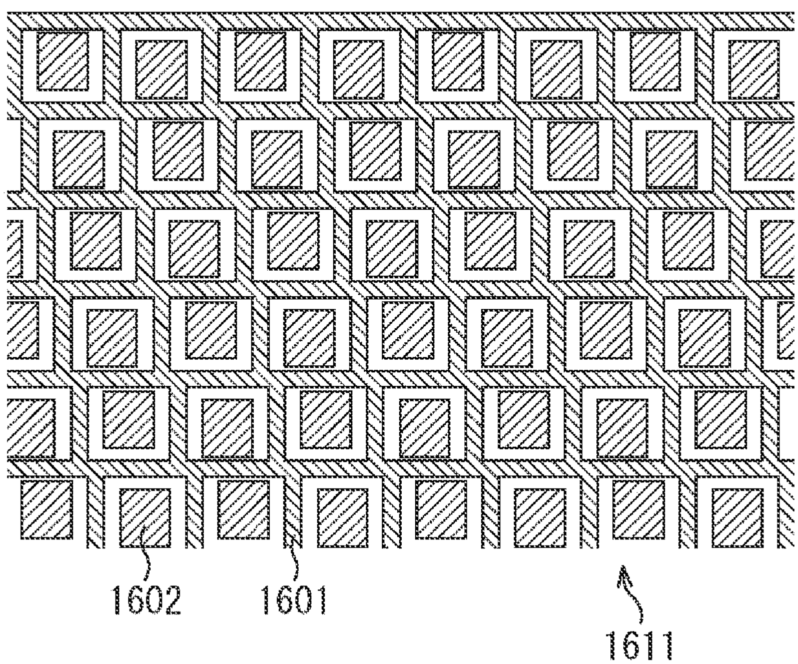

FIGS. 175A and 175B are plan views illustrating fifth and sixth modifications of the first shift configuration example.

Figure 176A:
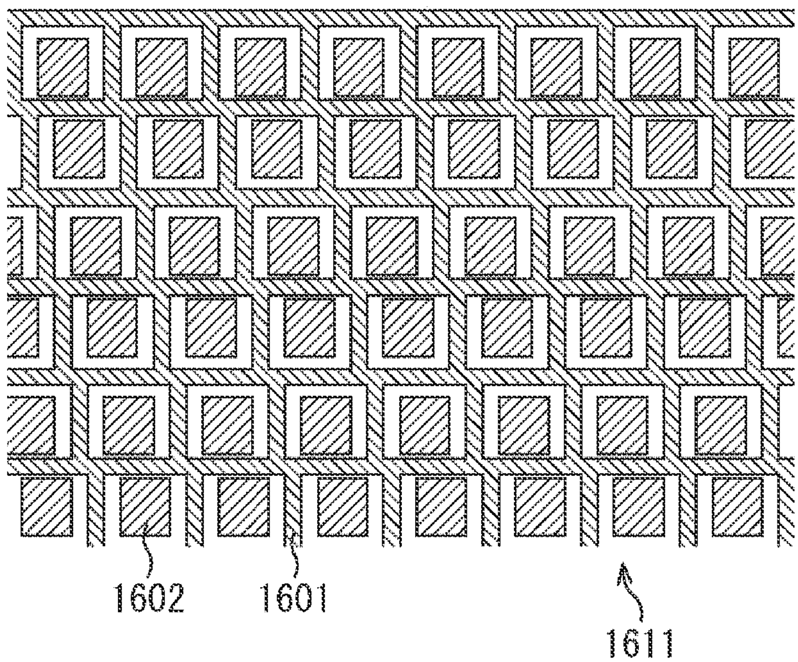
Figure 176B:
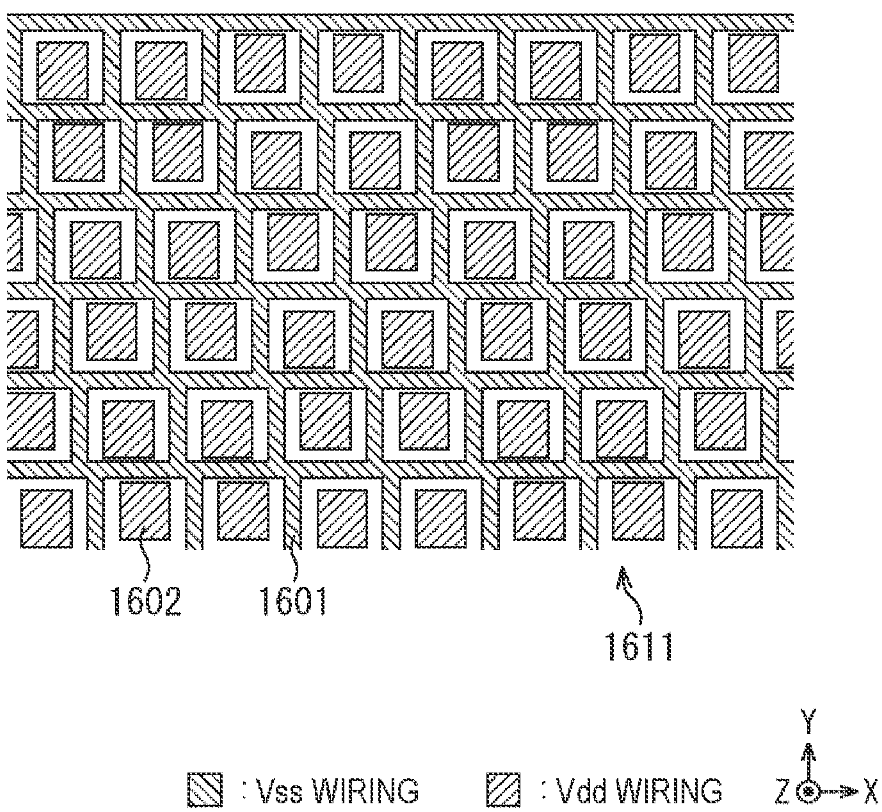

FIGS. 176A and 176B are plan views illustrating seventh and eighth modifications of the first shift configuration example.

Figure 177A:
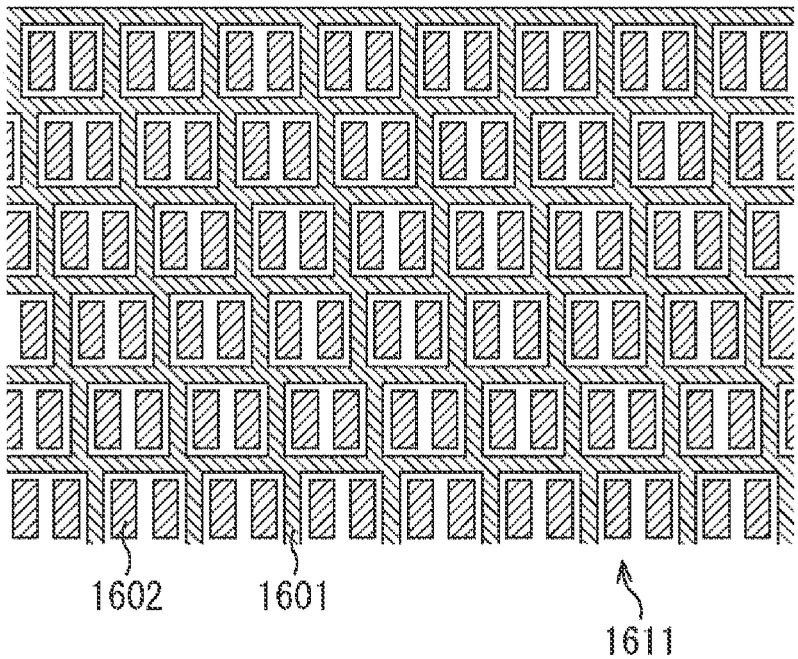
Figure 177B:
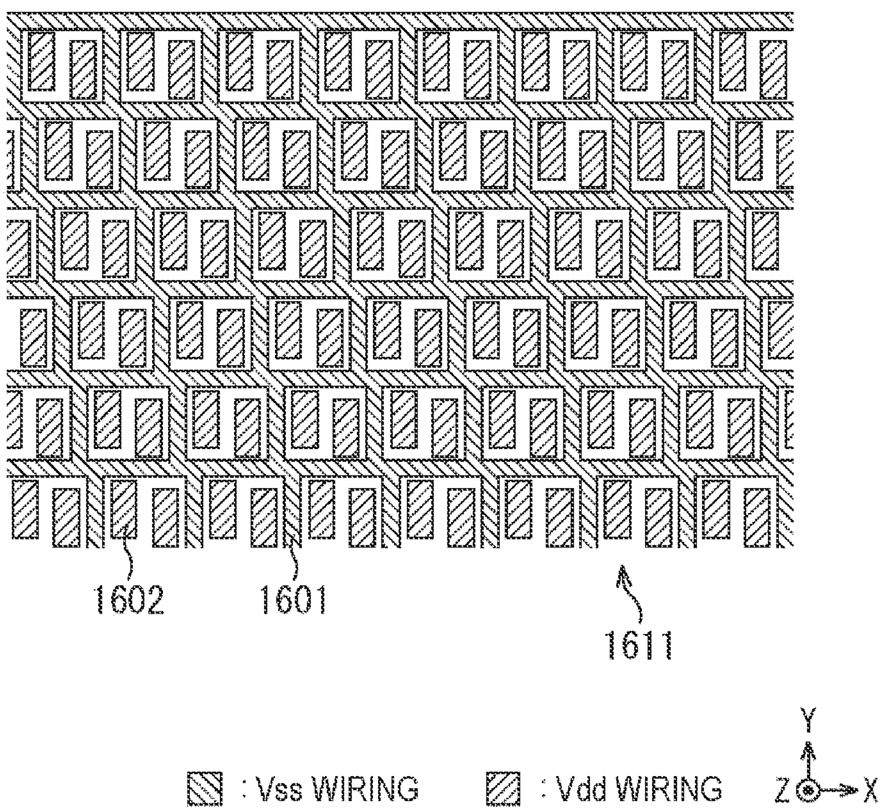

FIGS. 177A and 177B are plan views illustrating ninth and tenth modifications of the first shift configuration example.

Figure 178A:
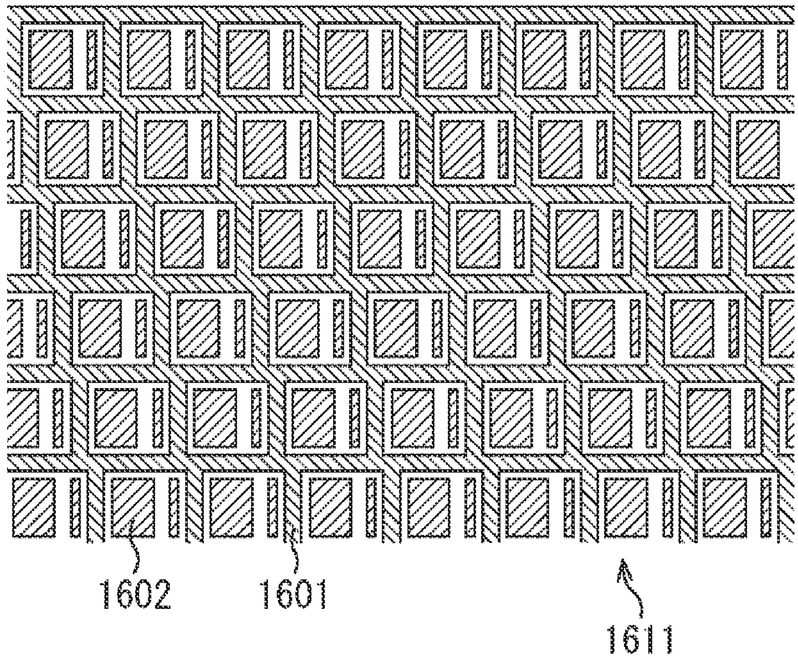
Figure 178B:
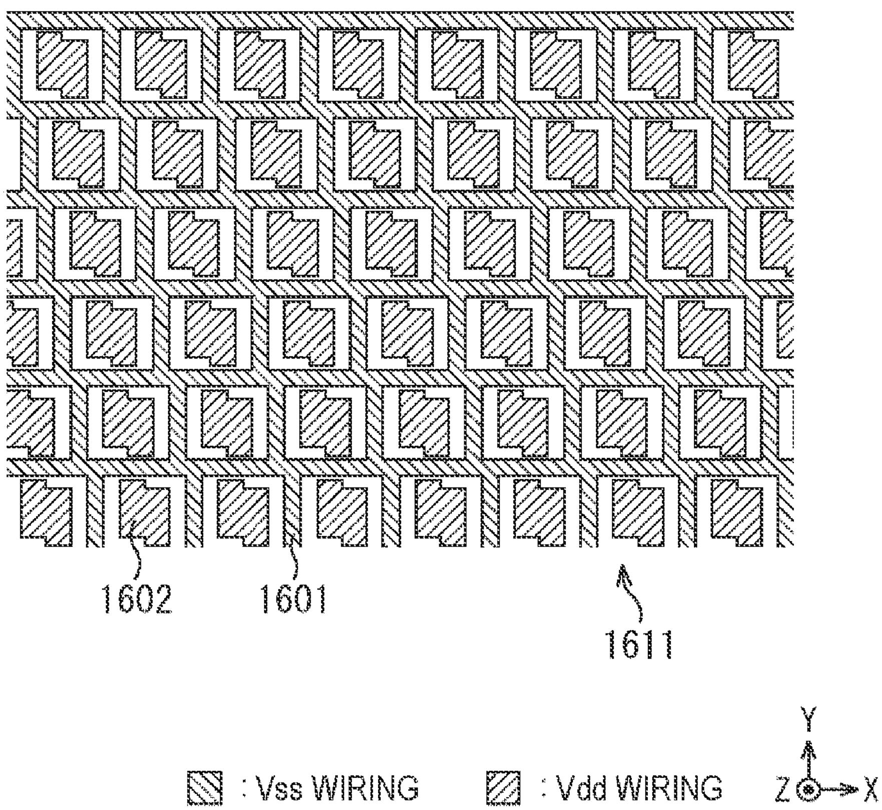

FIGS. 178A and 178B are plan views illustrating eleventh and twelfth modifications of the first shift configuration example.

Figure 179A:
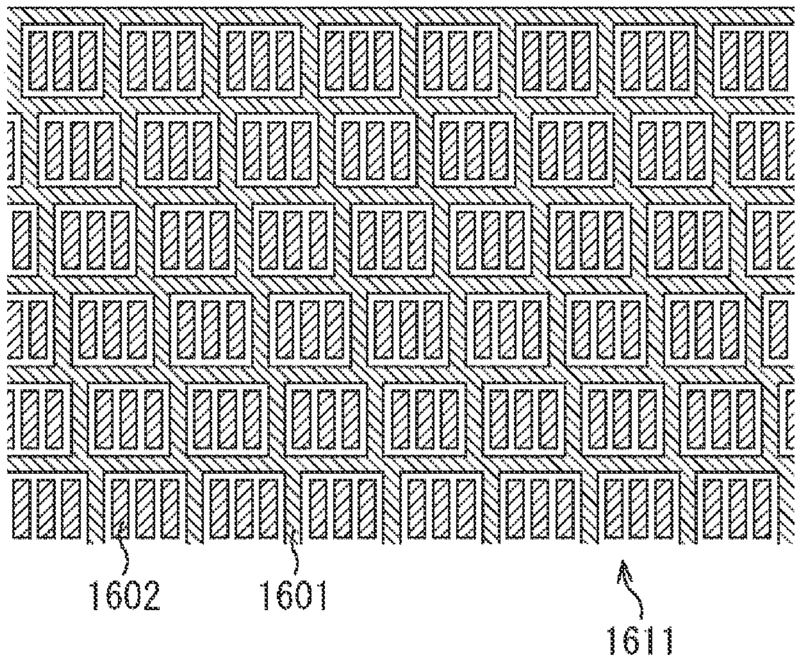
Figure 179B:
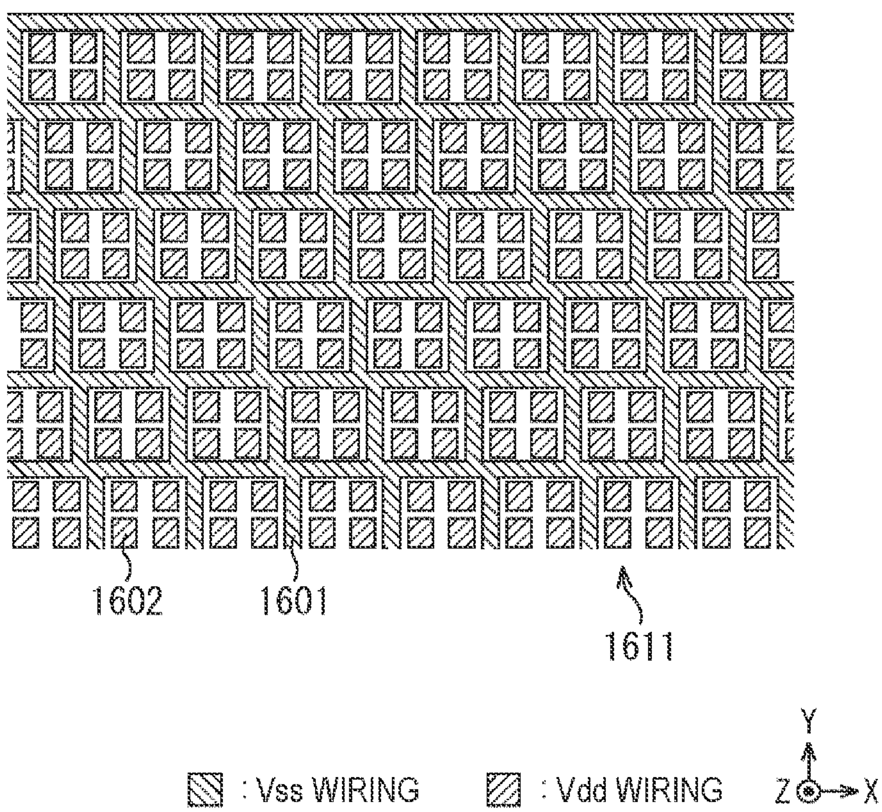

FIGS. 179A and 179B are plan views illustrating thirteenth and fourteenth modifications of the first shift configuration example.

Figure 180A:
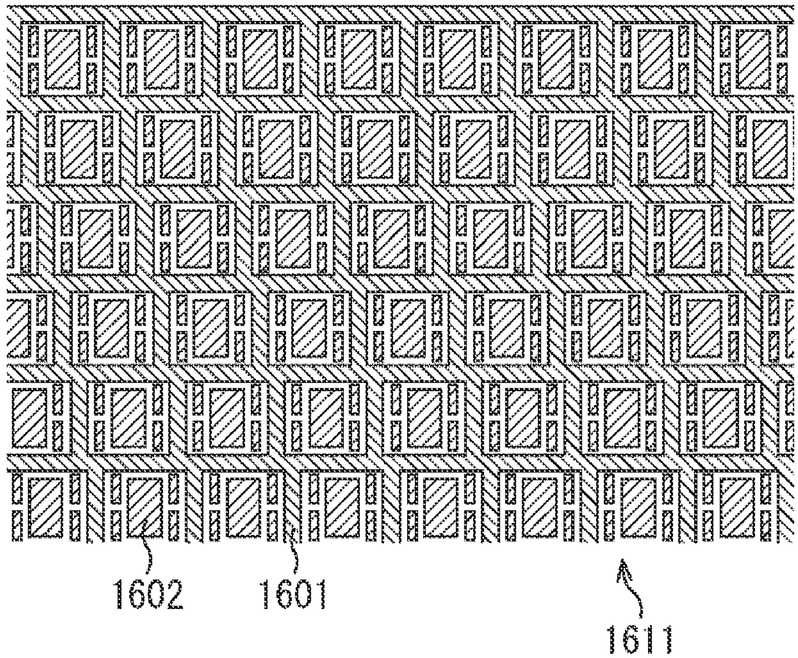
Figure 180B:
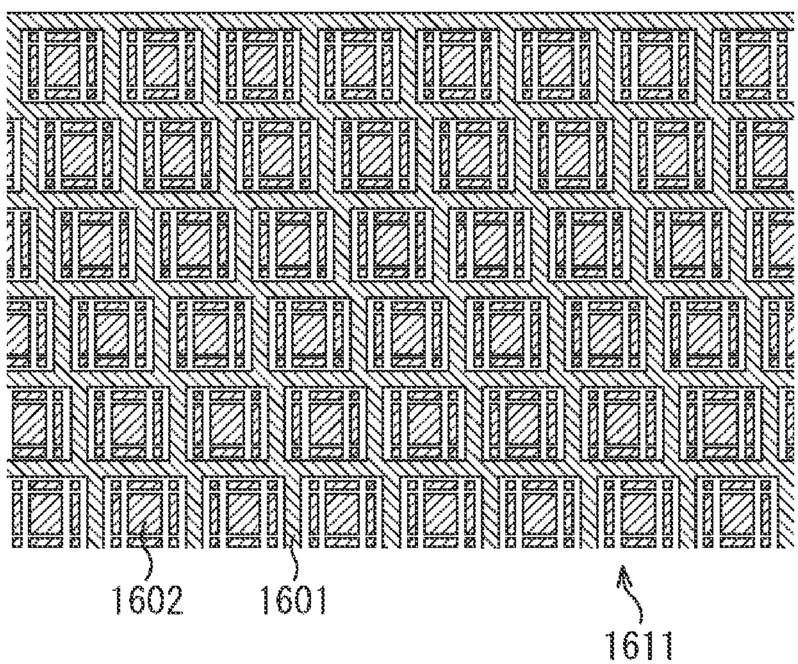

FIGS. 180A and 180B are plan views illustrating fifteenth and sixteenth modifications of the first shift configuration example.

Figure 181A:
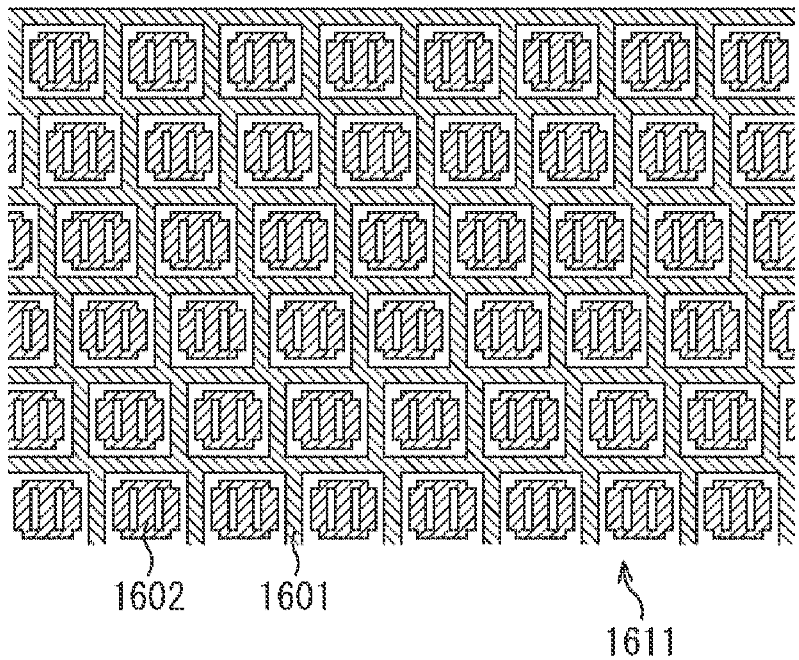
Figure 181B:
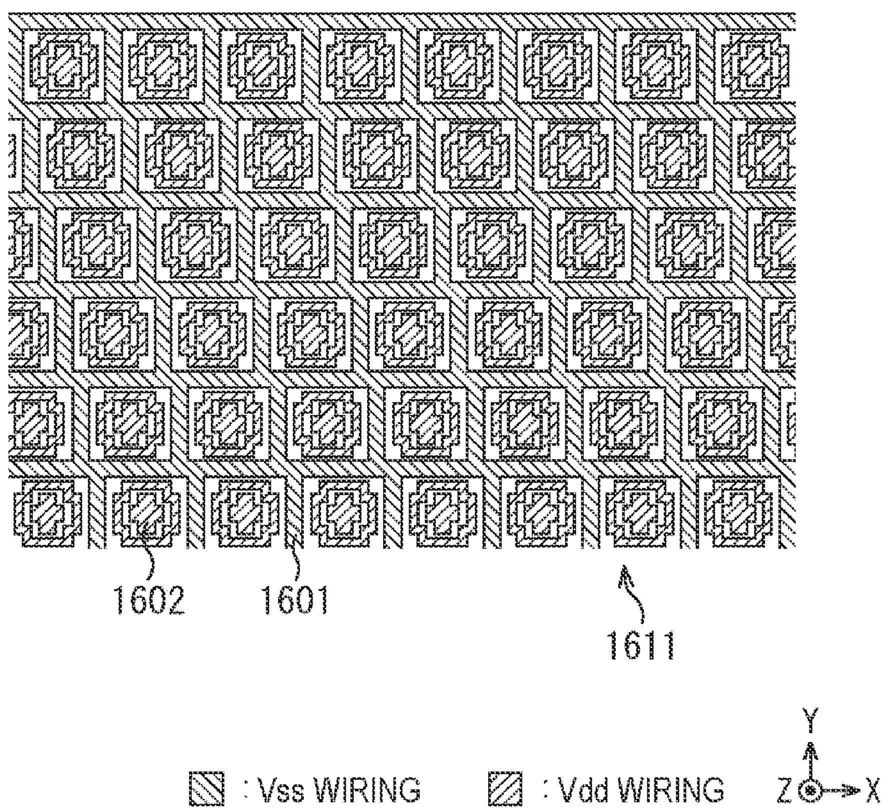

FIGS. 181A and 181B are plan views illustrating seventeenth and eighteenth modifications of the first shift configuration example.

Figure 182:
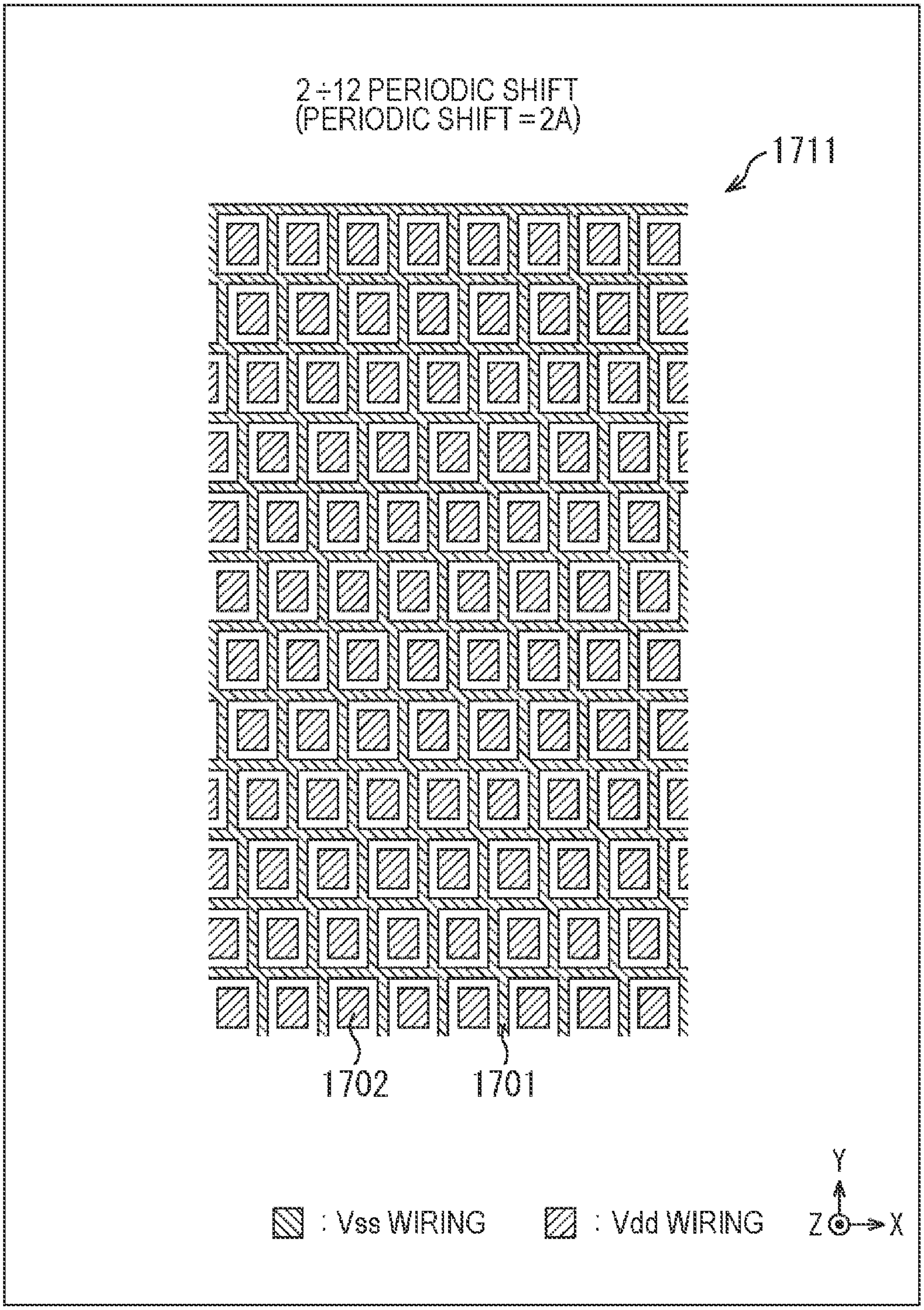

FIG. 182 is a plan view of a second shift configuration example of the reticulated conductor.

Figure 183:
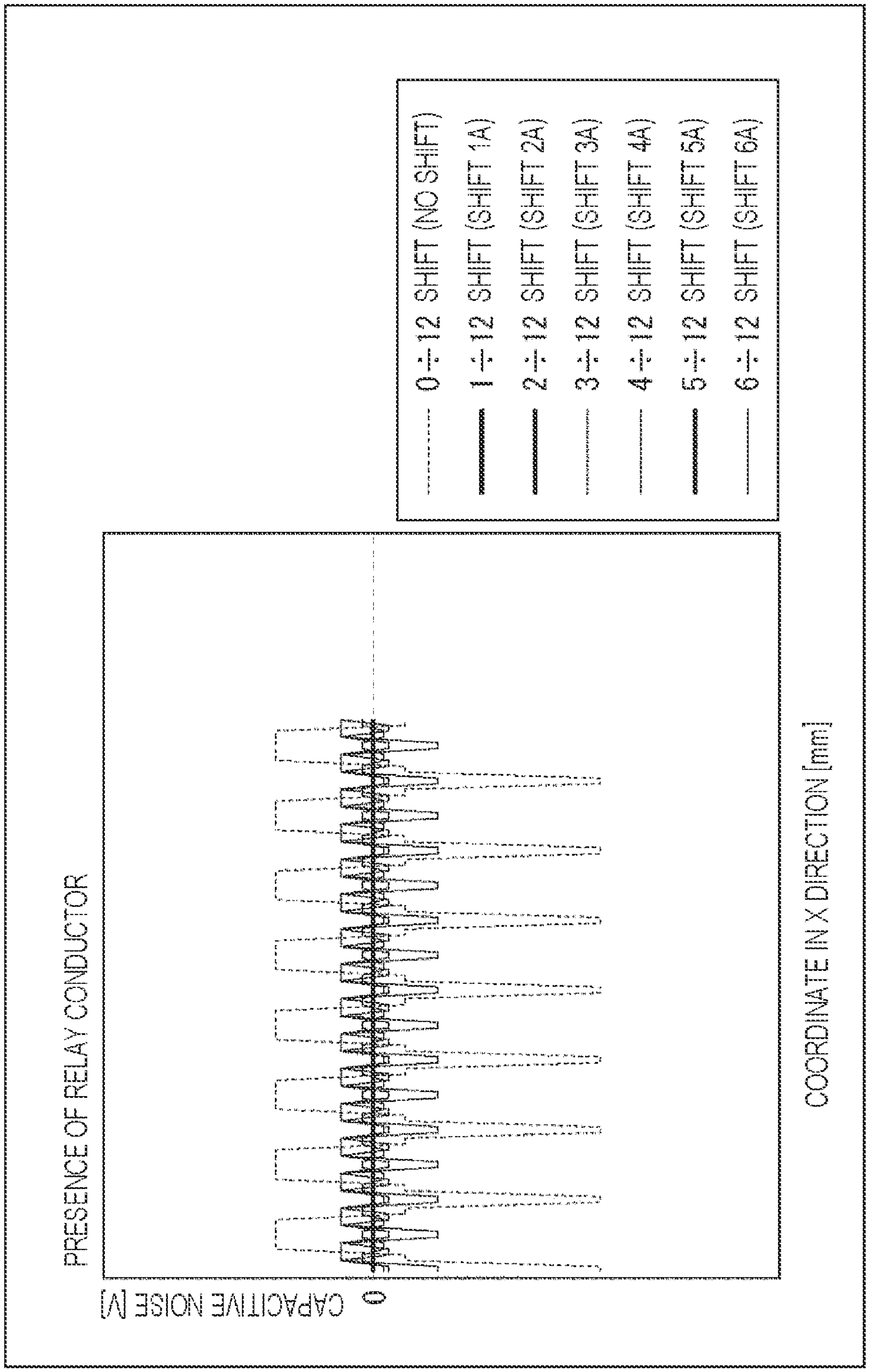

FIG. 183 is a diagram illustrating theoretical values of the capacitive noise in the second shift configuration example.

Figure 184:
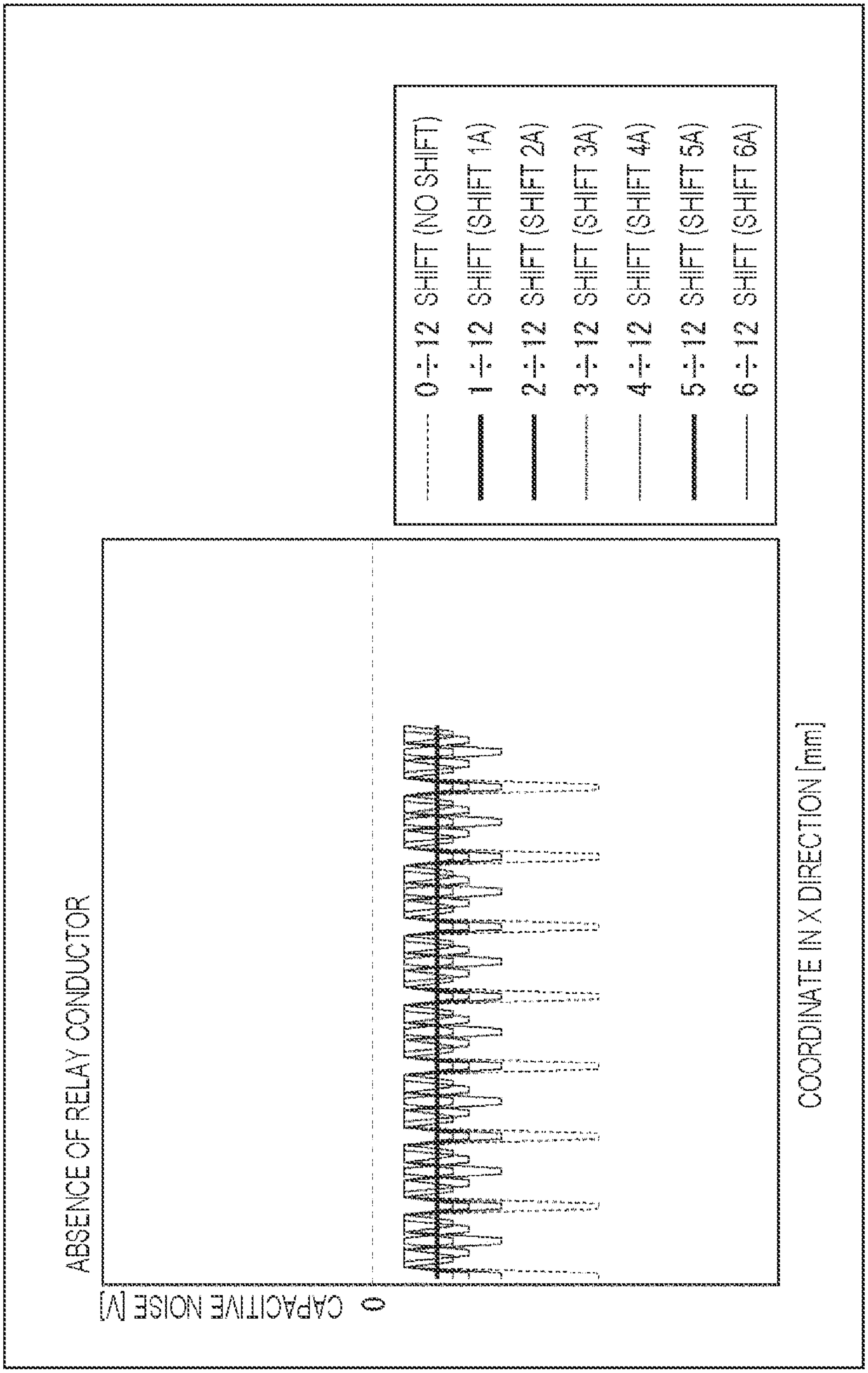

FIG. 184 is a diagram illustrating theoretical values of the capacitive noise in the second shift configuration example.

Figure 185:
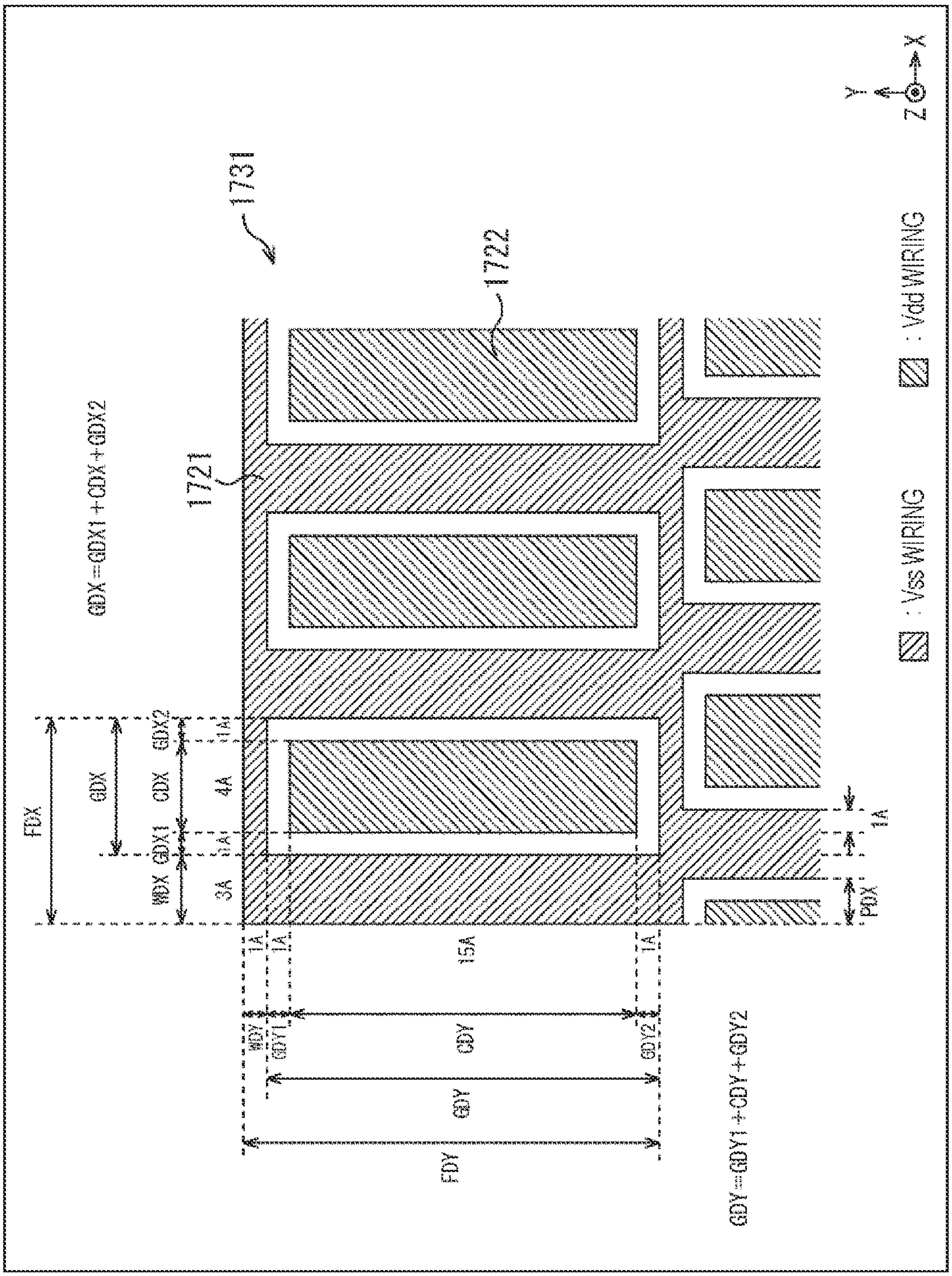

FIG. 185 is a view for describing a conductor width and a gap width of a third shift configuration example of the reticulated conductor.

Figures 186A, 186B, 186C:
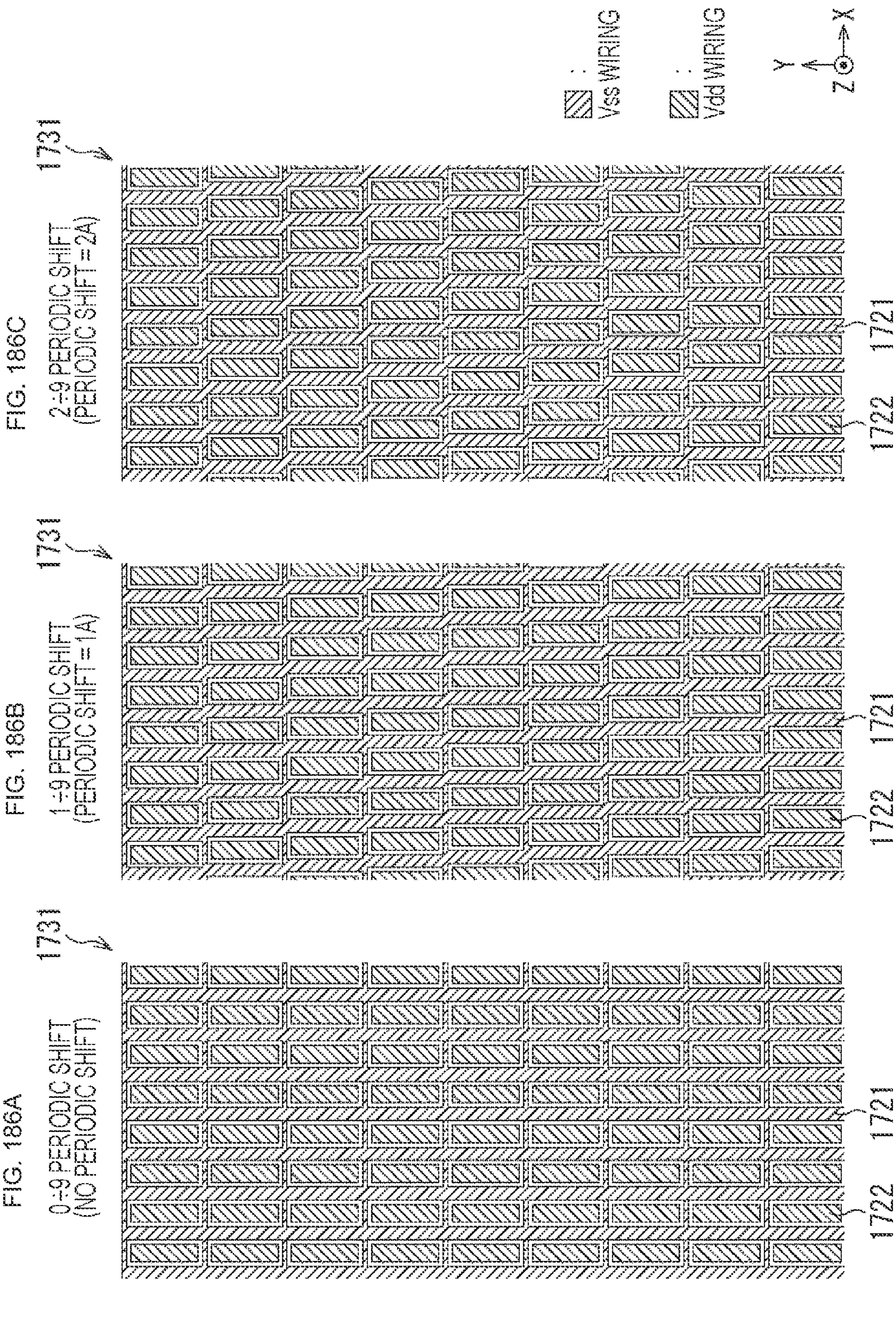

FIGS. 186A, 186B, and 186C plan views of the third shift configuration example of the reticulated conductor.

FIGS. 187A and 187B are plan views of the third shift configuration example of the reticulated conductor.

Figure 188:
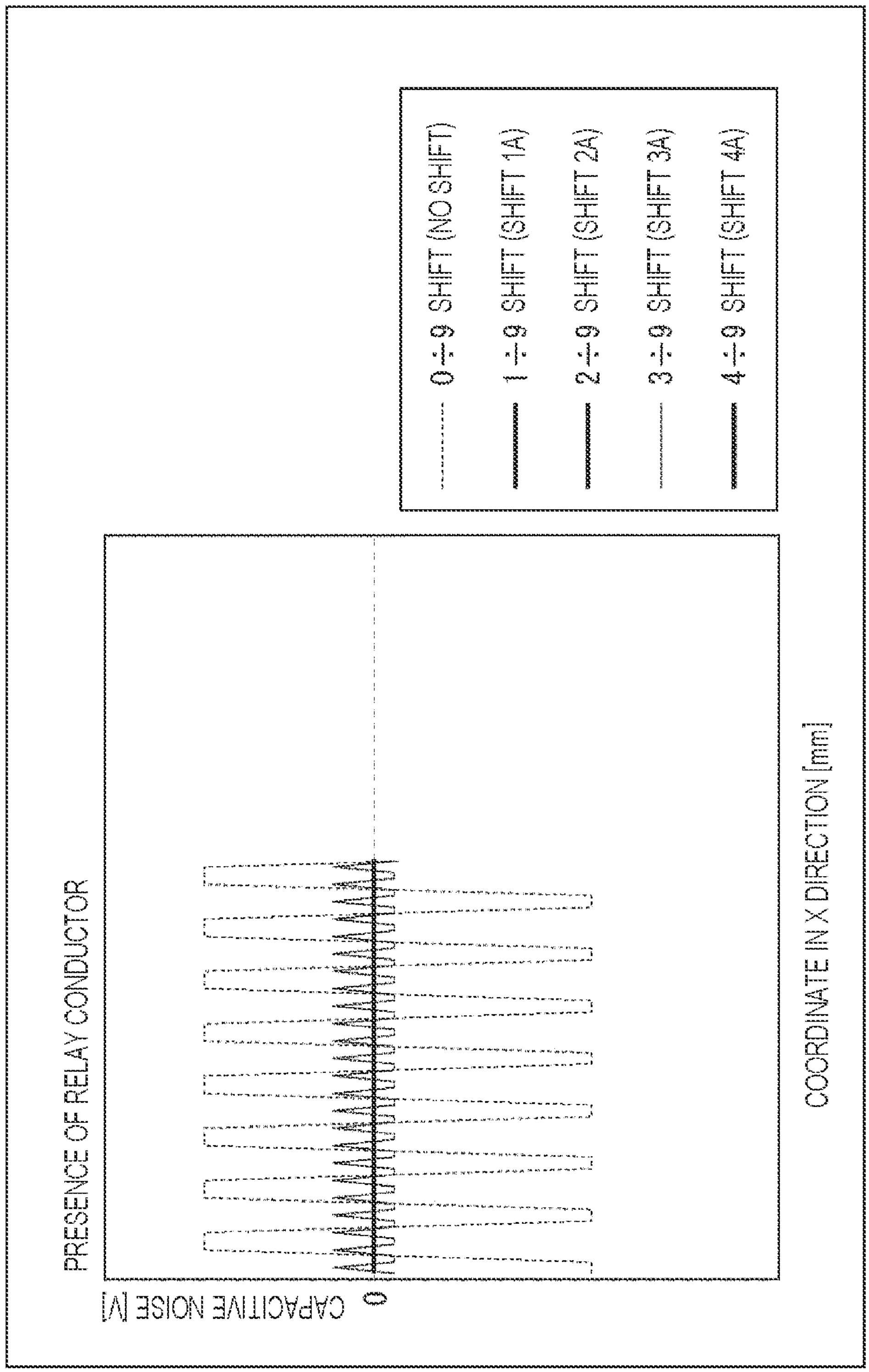

FIG. 188 is a diagram illustrating theoretical values of the capacitive noise in the third shift configuration example.

Figure 189:
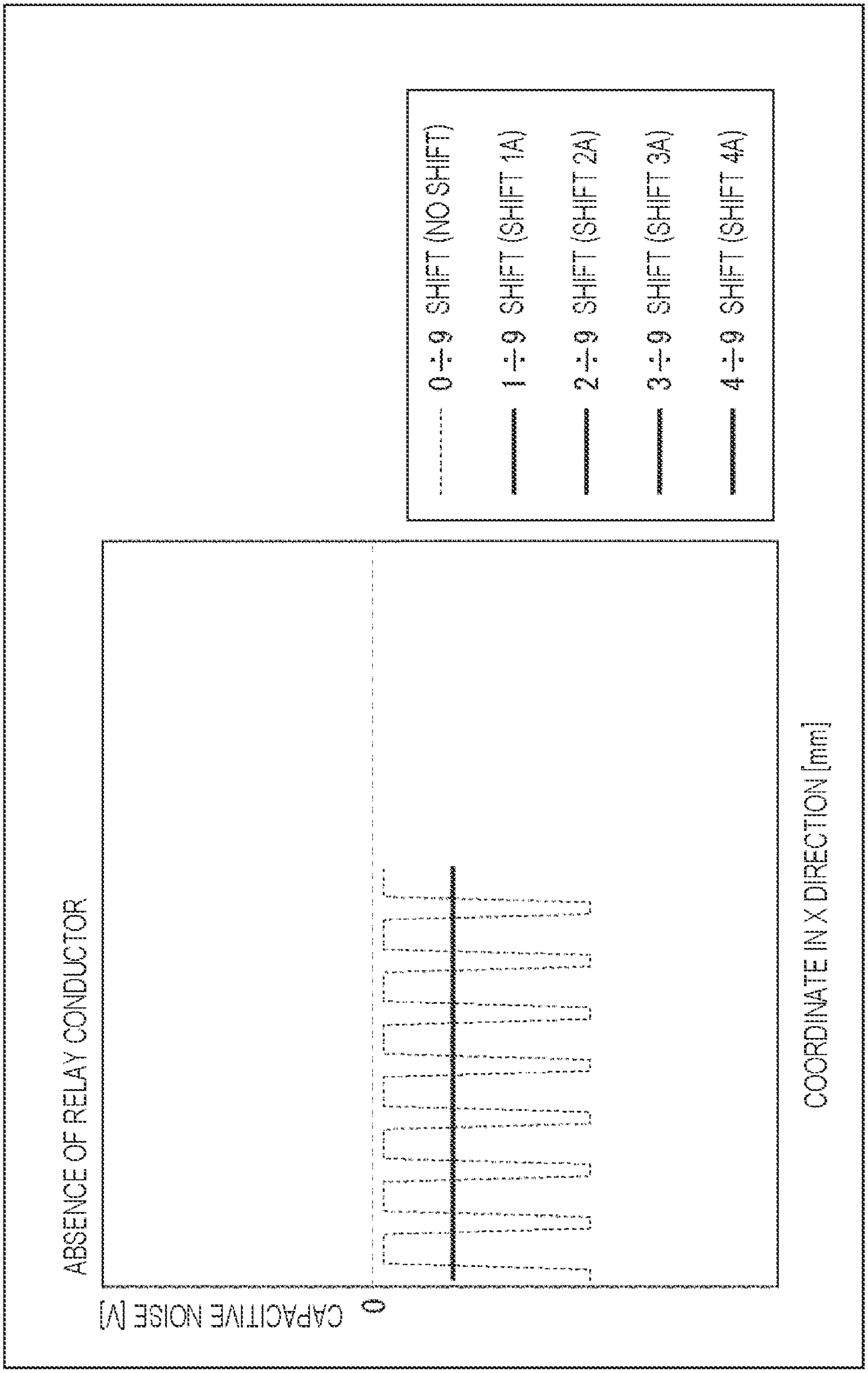

FIG. 189 is a diagram illustrating theoretical values of the capacitive noise in the third shift configuration example.

Figure 190:
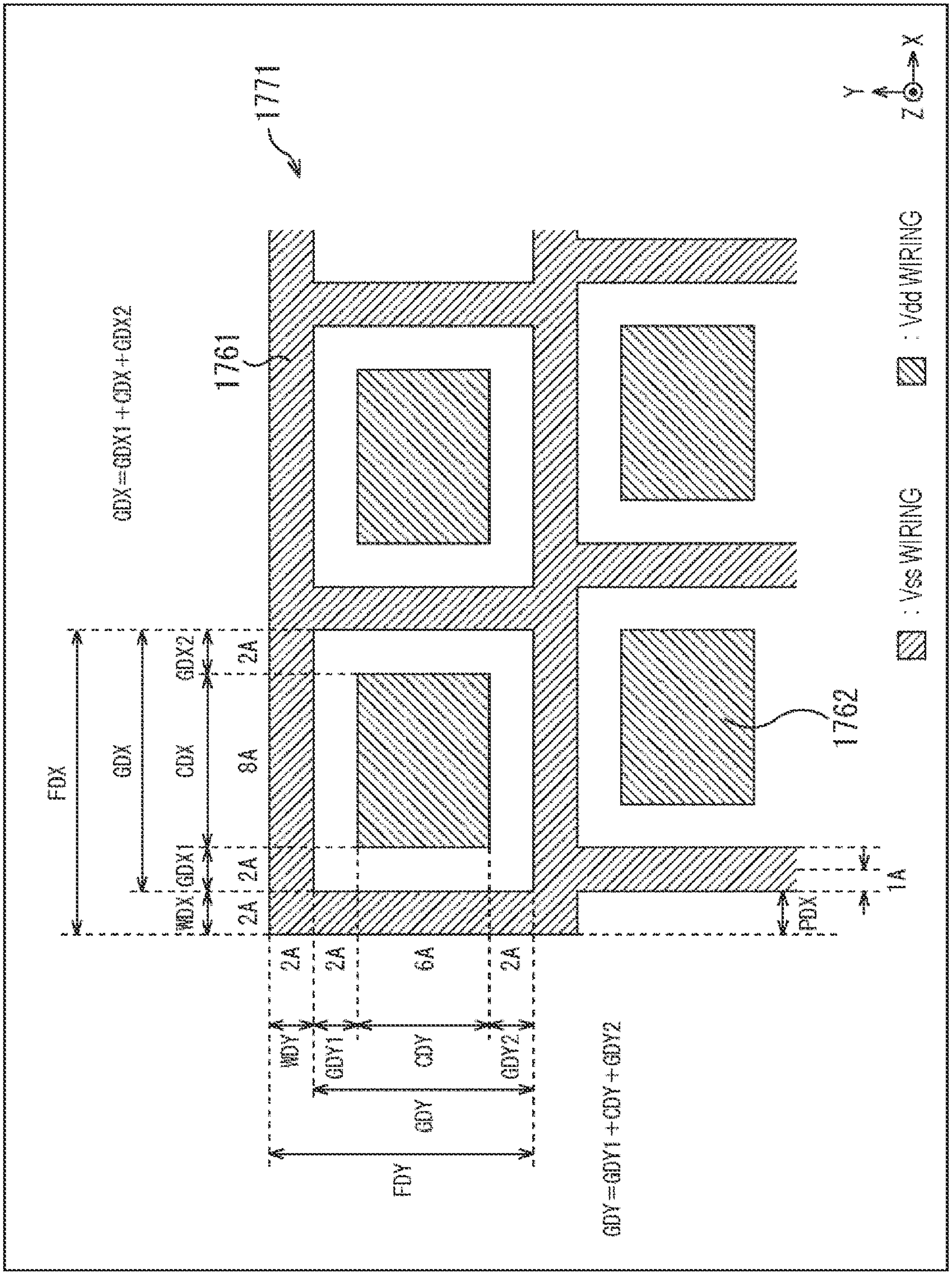

FIG. 190 is a view for describing a conductor width and a gap width of a fourth shift configuration example of the reticulated conductor.

FIGS. 191A, 191B, 191C, and 191D plan views of the fourth shift configuration example of the reticulated conductor.

FIGS. 192A, 192B, 193C, and 193D plan views of the fourth shift configuration example of the reticulated conductor.

Figure 193:
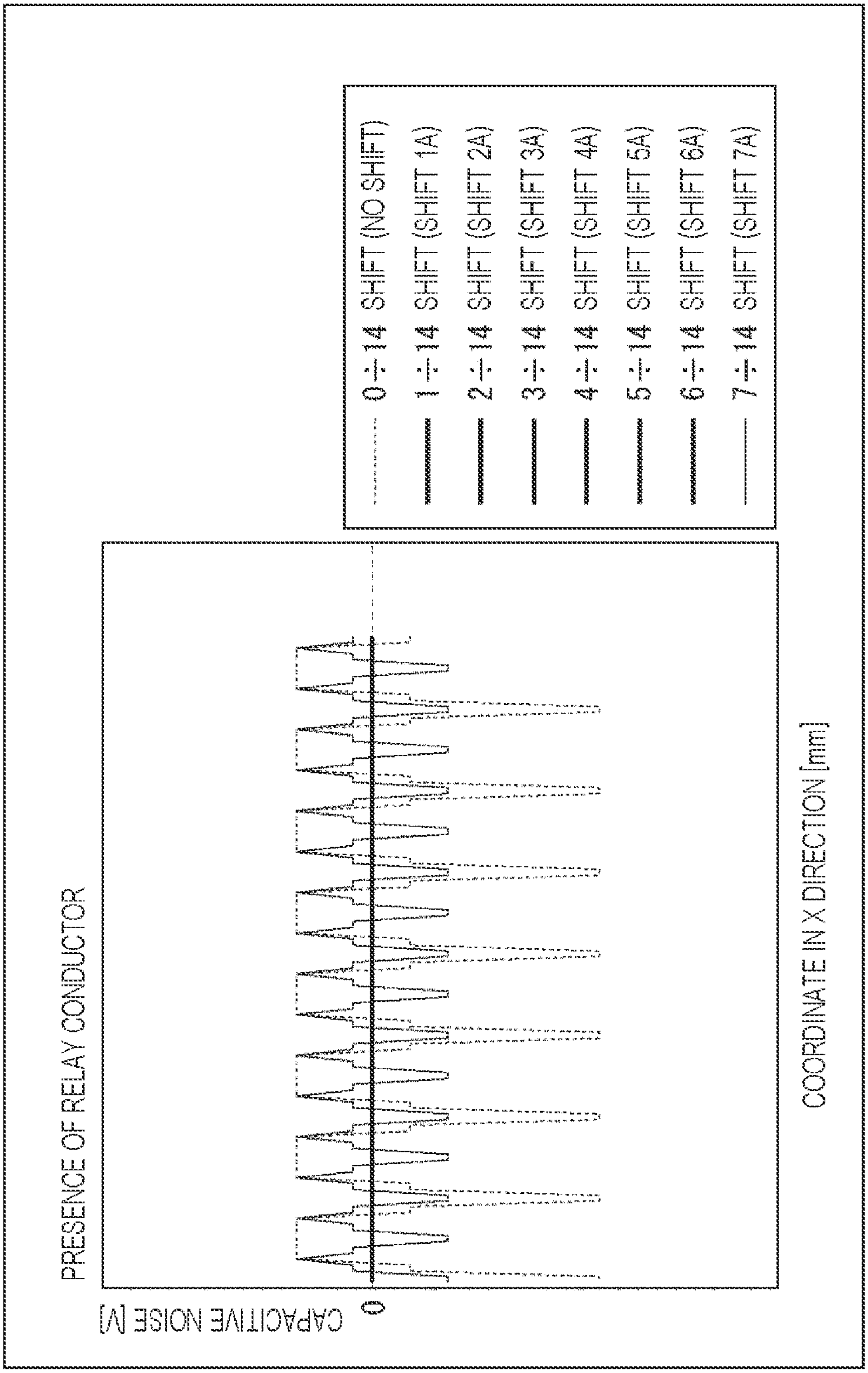

FIG. 193 is a diagram illustrating theoretical values of the capacitive noise in the fourth shift configuration example.

Figure 194:
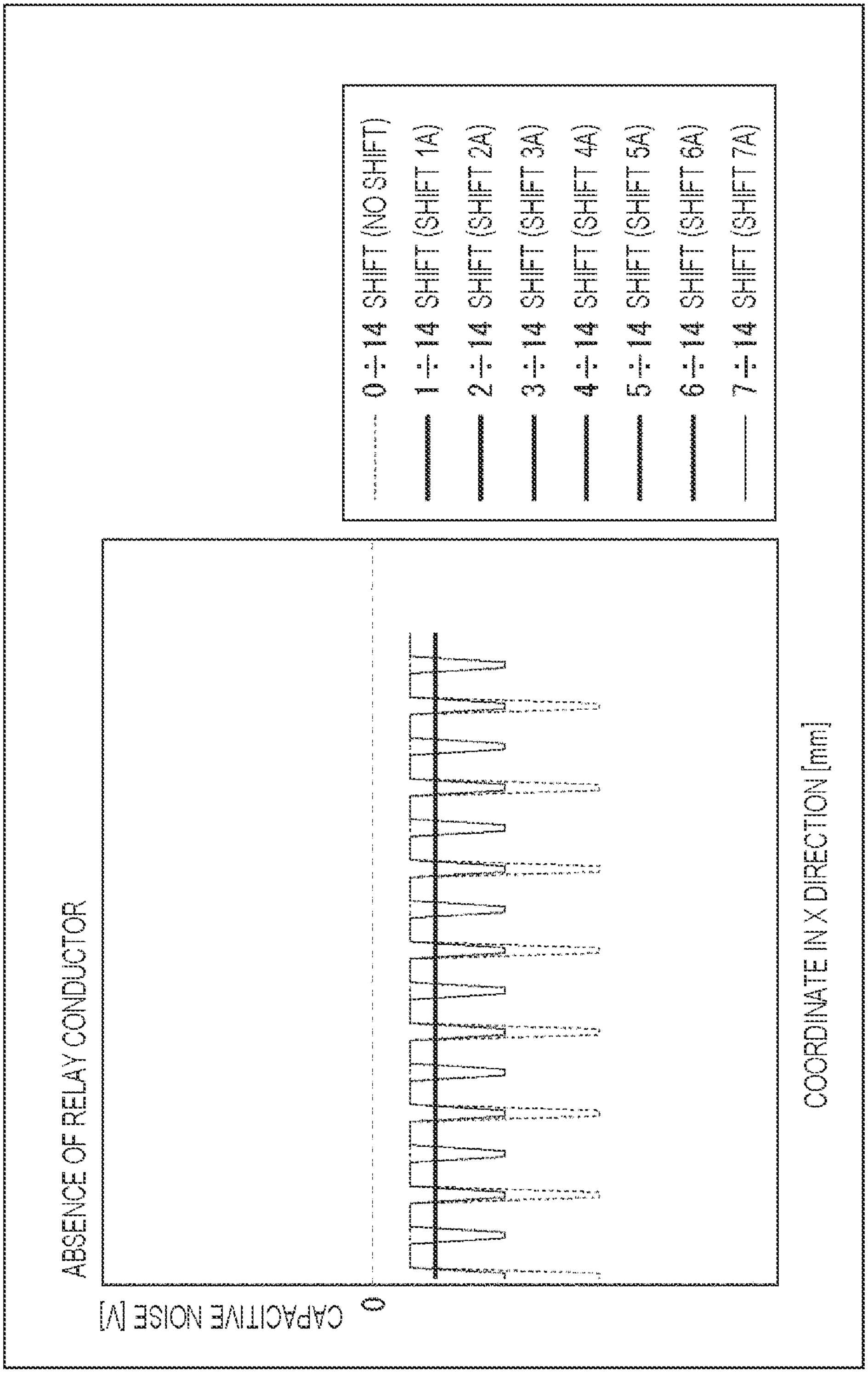

FIG. 194 is a diagram illustrating theoretical values of the capacitive noise in the fourth shift configuration example.

Figure 195:
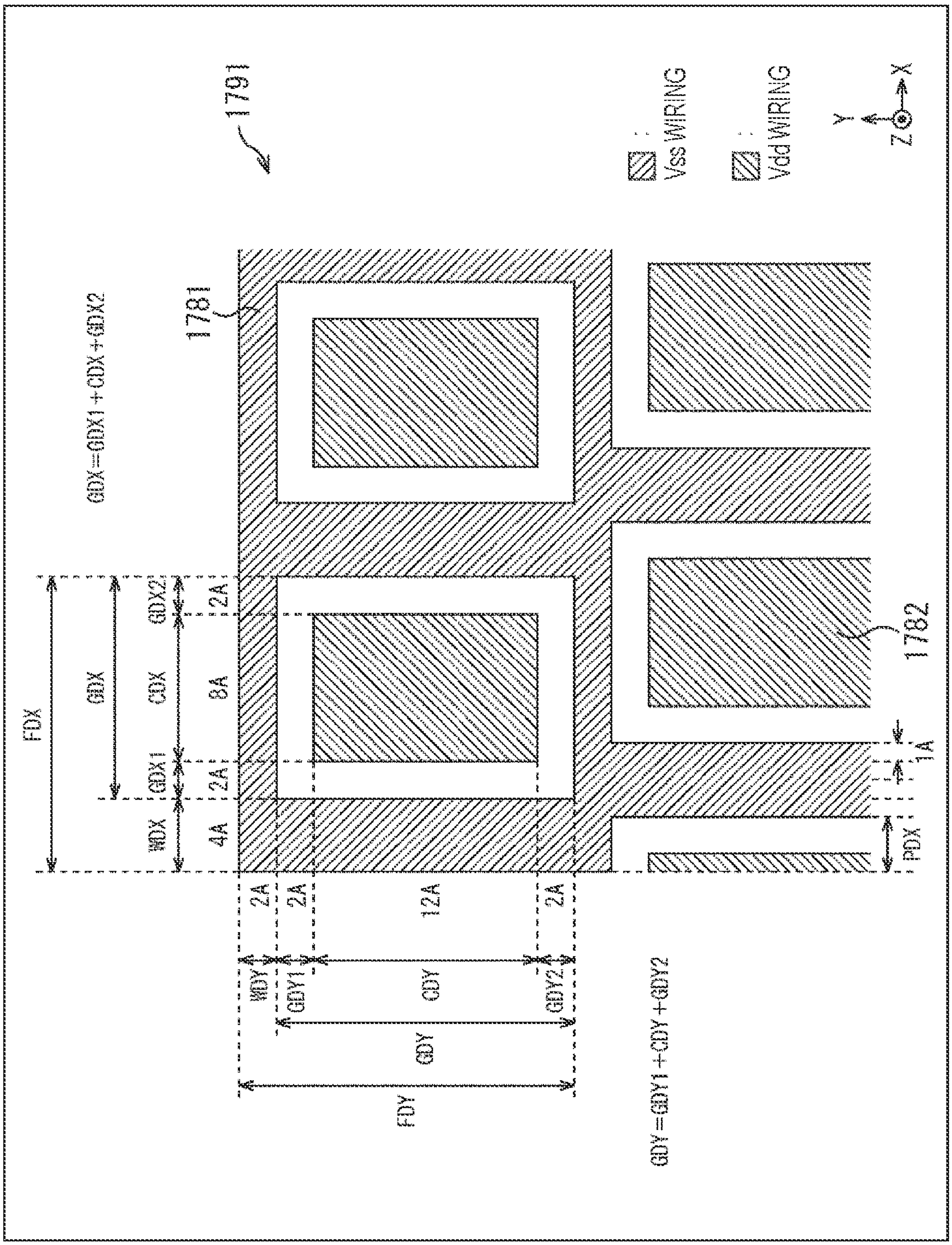

FIG. 195 is a view for describing a conductor width and a gap width of a fifth shift configuration example of the reticulated conductor.

Figures 196A, 196B, 196C:
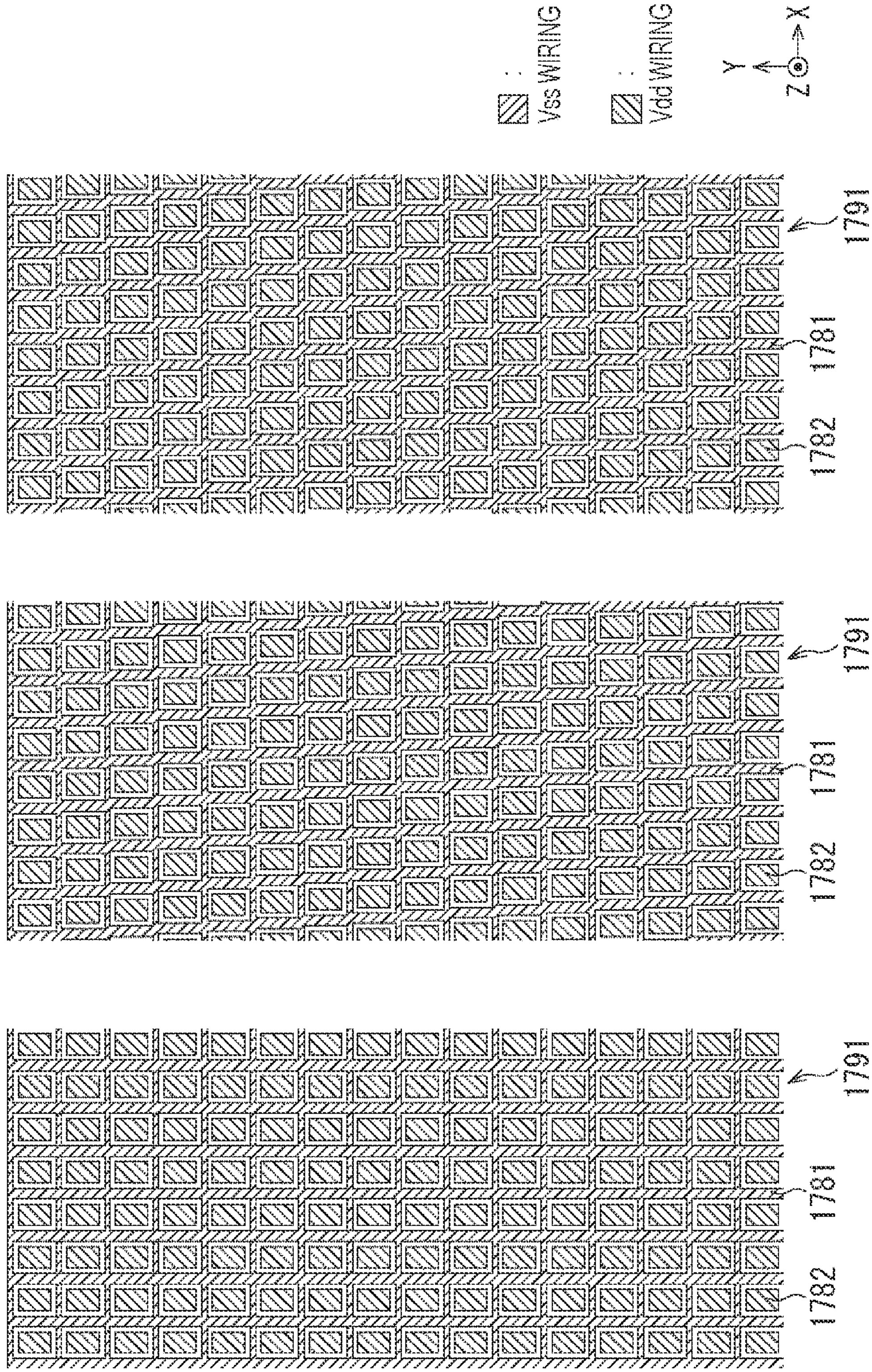

FIGS. 196A, 196B, and 196C are plan views of the fifth shift configuration example of the reticulated conductor.

FIGS. 197A, 197B, and 197C are plan views of the fifth shift configuration example of the reticulated conductor.

Figure 198A:
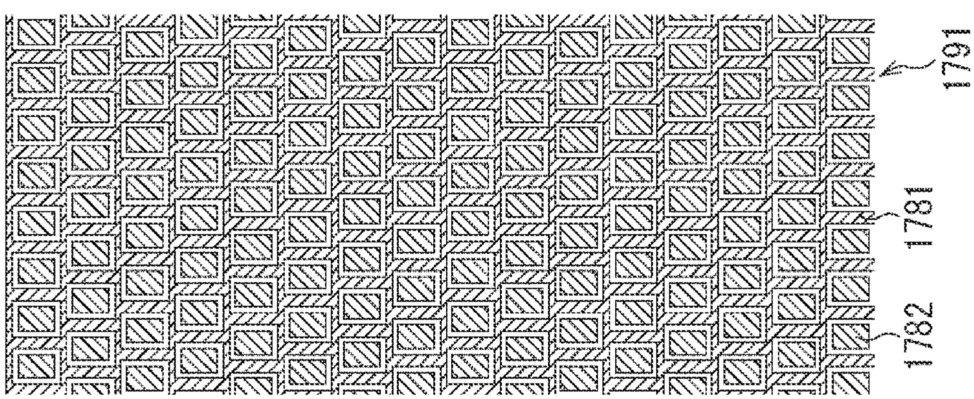
Figure 198B:
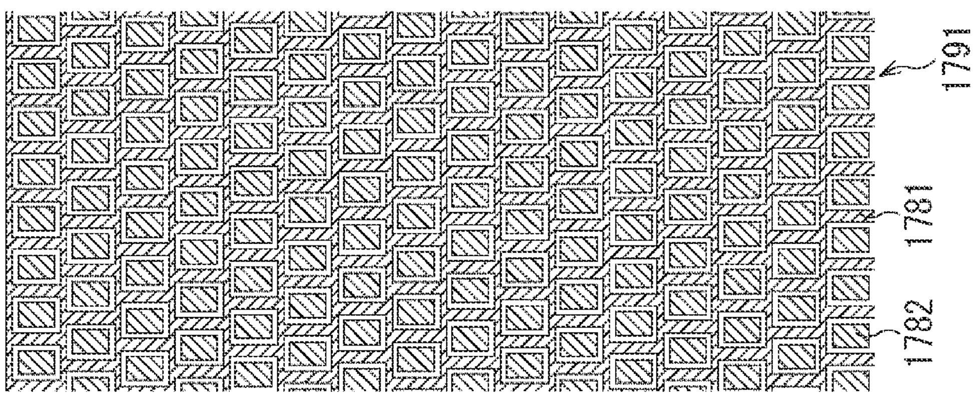
Figure 198C:
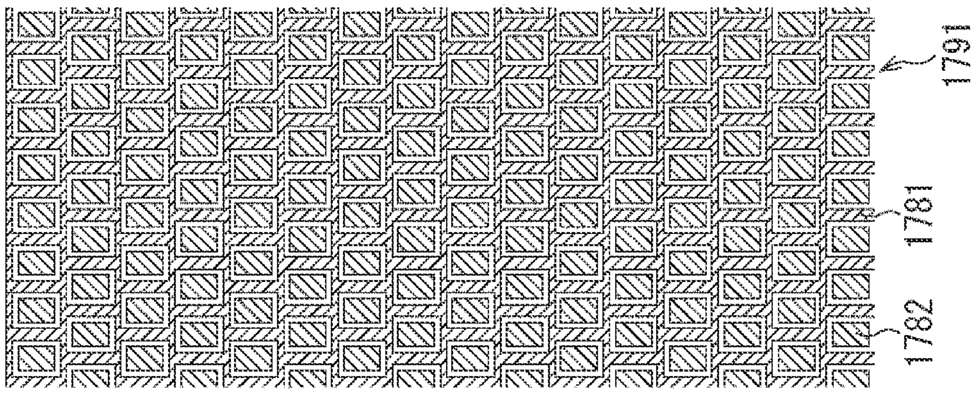
Figure 198C:

FIGS. 198A, 198B, and 198C are plan views of the fifth shift configuration example of the reticulated conductor.

Figure 199:
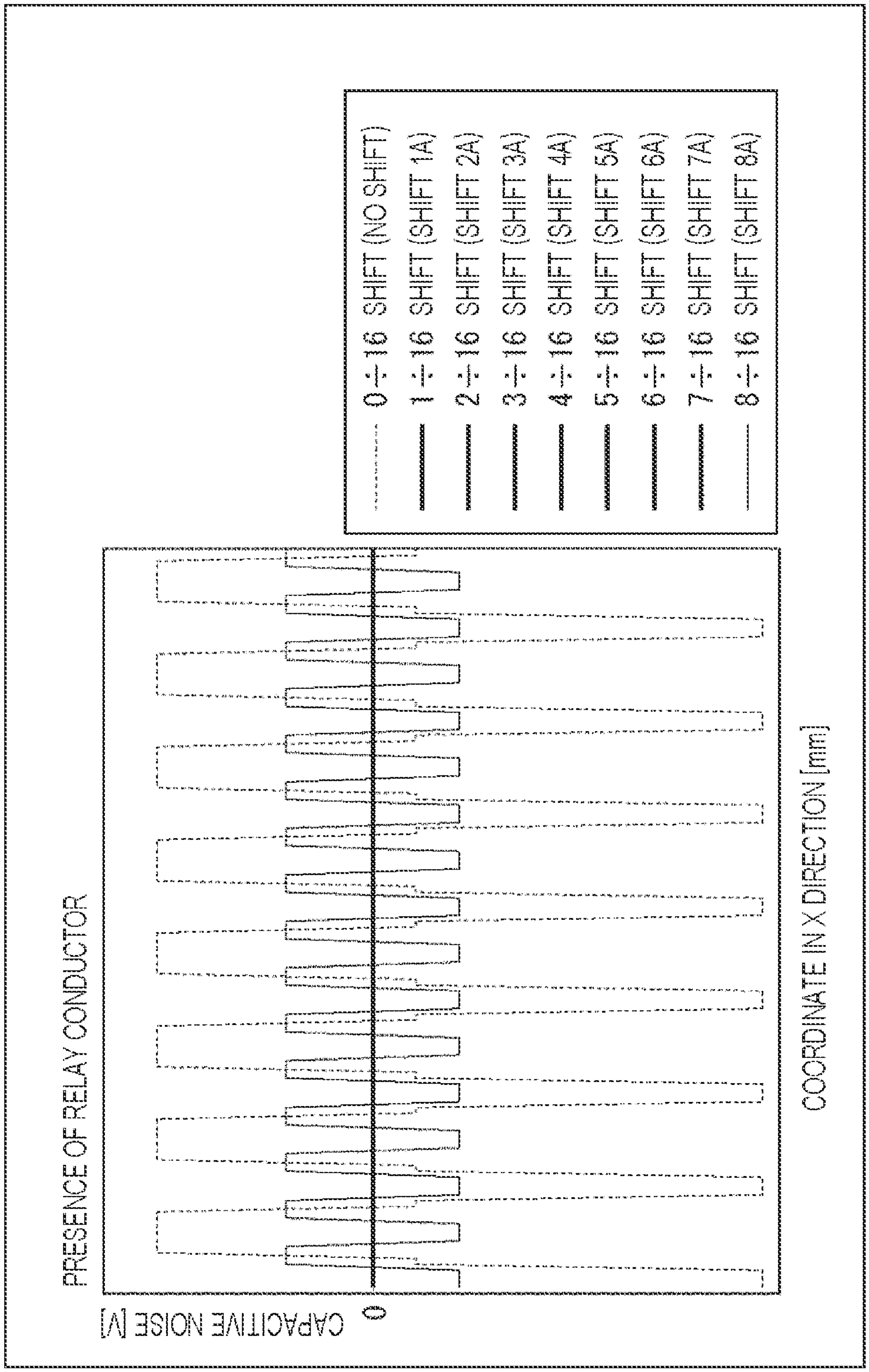

FIG. 199 is a diagram illustrating theoretical values of the capacitive noise in the fifth shift configuration example.

Figure 200:
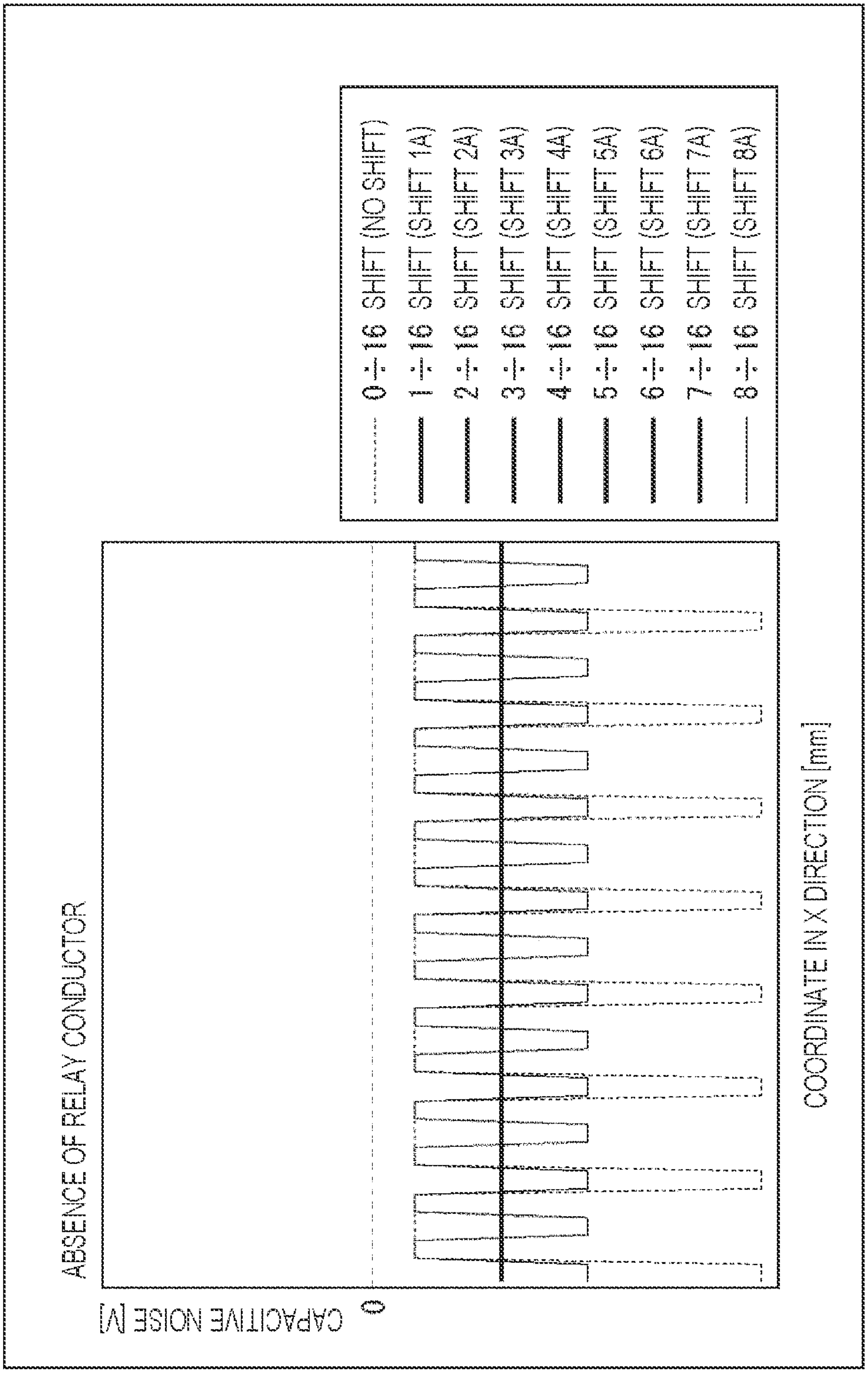

FIG. 200 is a diagram illustrating theoretical values of the capacitive noise in the fifth shift configuration example.

Figure 201:
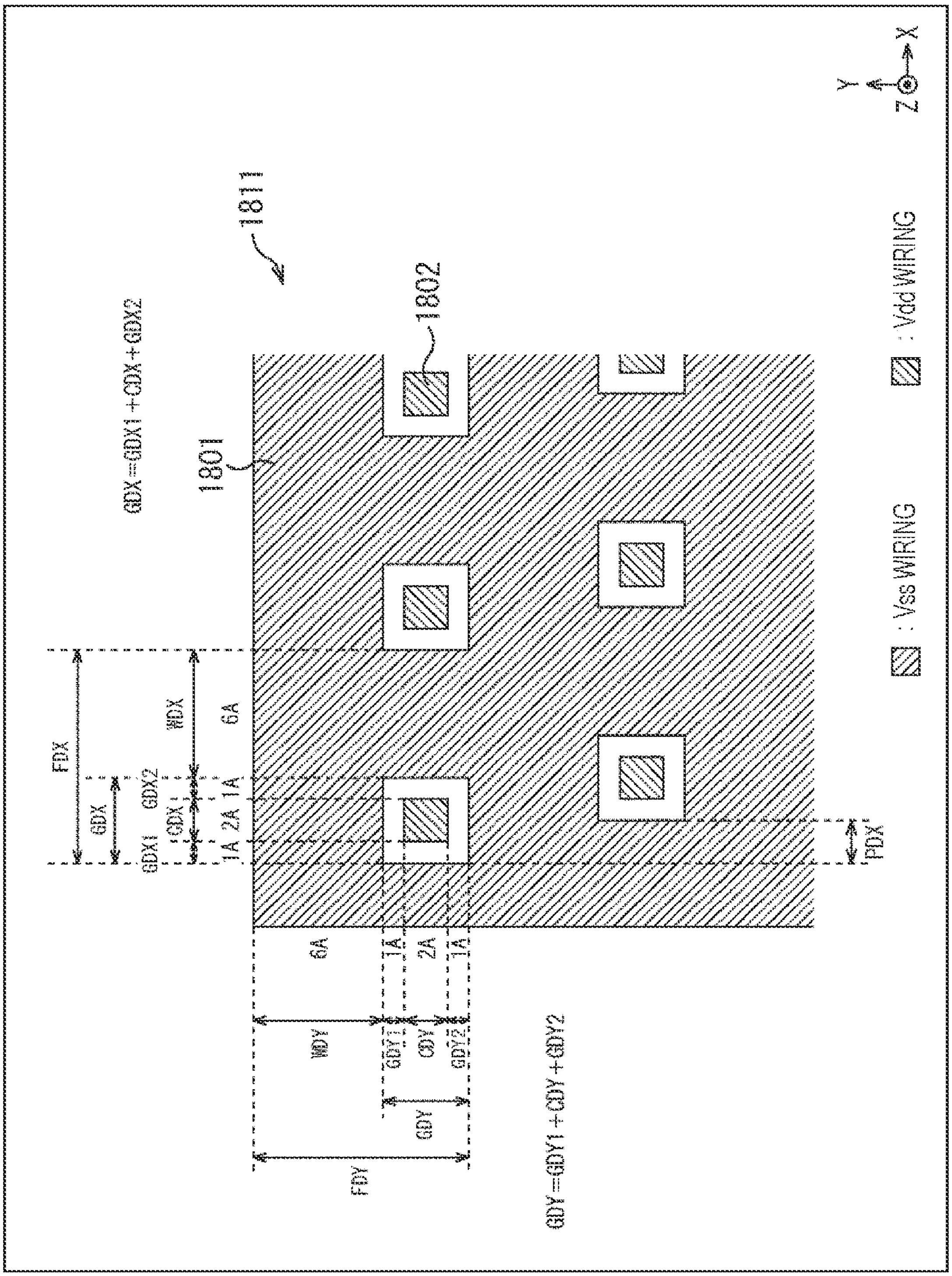

FIG. 201 is a view for describing a conductor width and a gap width of a sixth shift configuration example of the reticulated conductor.

Figures 202A, 202B, 202C:
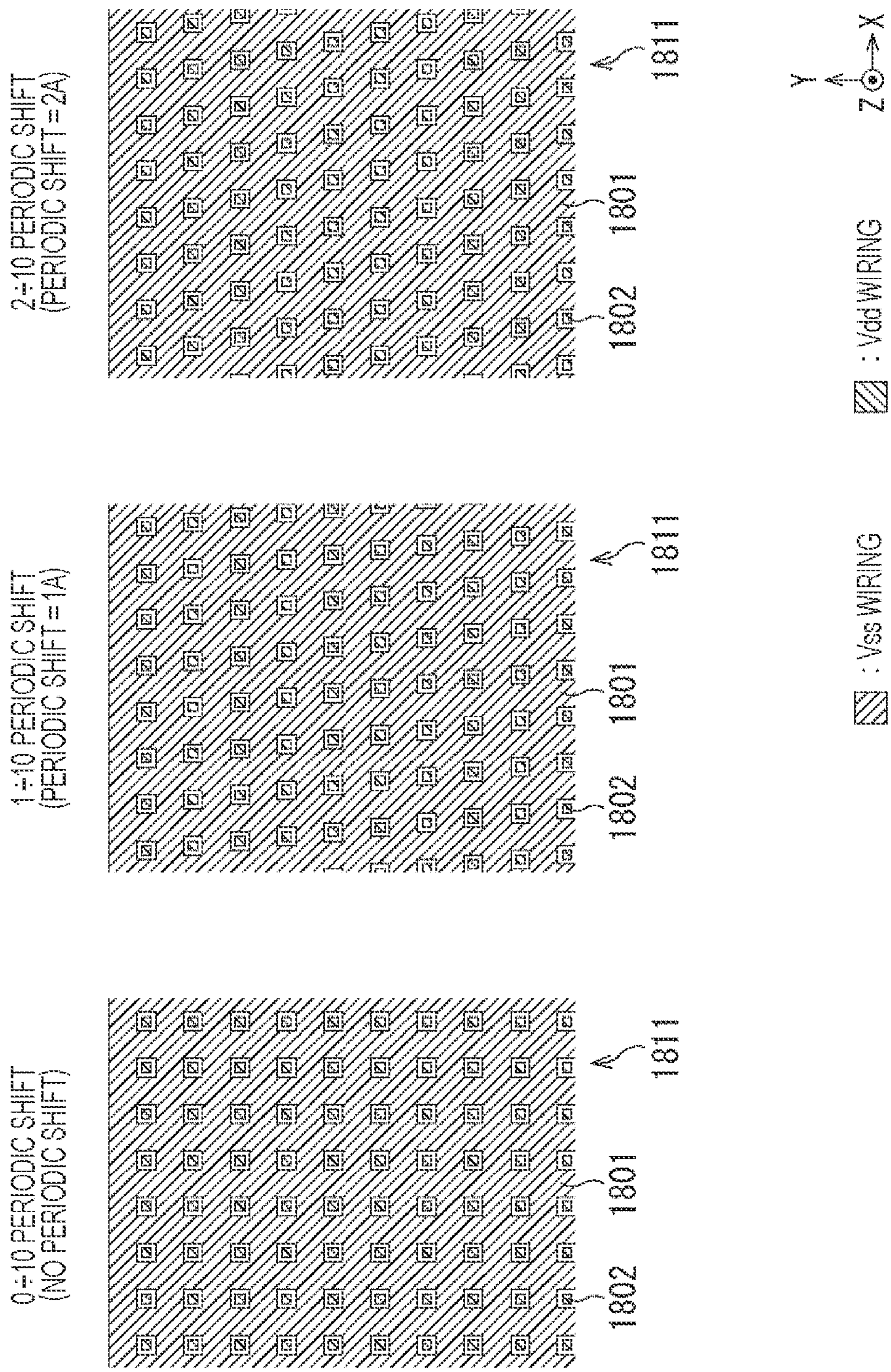

FIGS. 202A, 202B, and 202C are plan views of the sixth shift configuration example of the reticulated conductor.

Figures 203A, 203B, 203C:
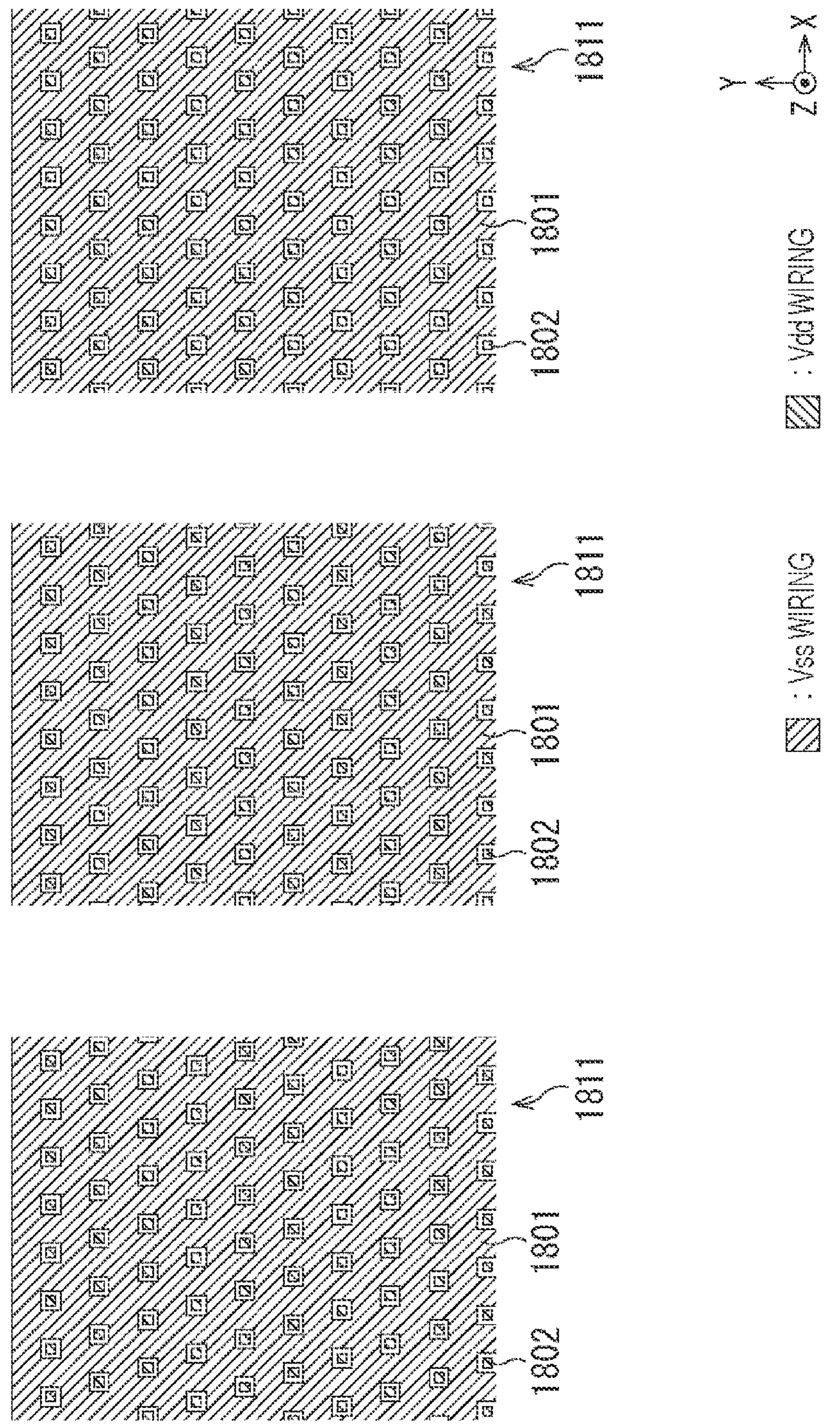

FIGS. 203A, 203B, and 203C are plan views of the sixth shift configuration example of the reticulated conductor.

Figure 204:
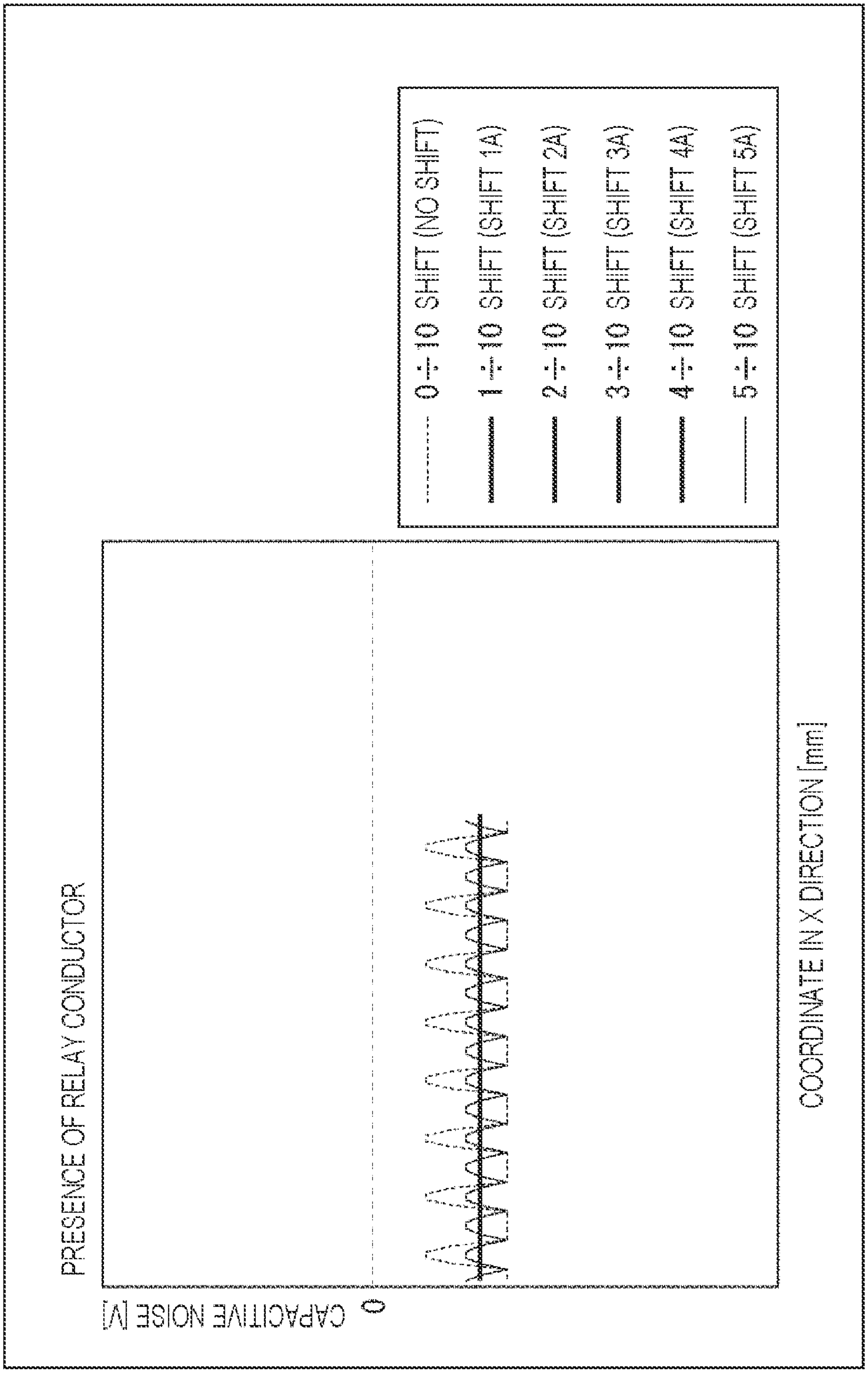

FIG. 204 is a diagram illustrating theoretical values of the capacitive noise in the sixth shift configuration example.

Figure 205:
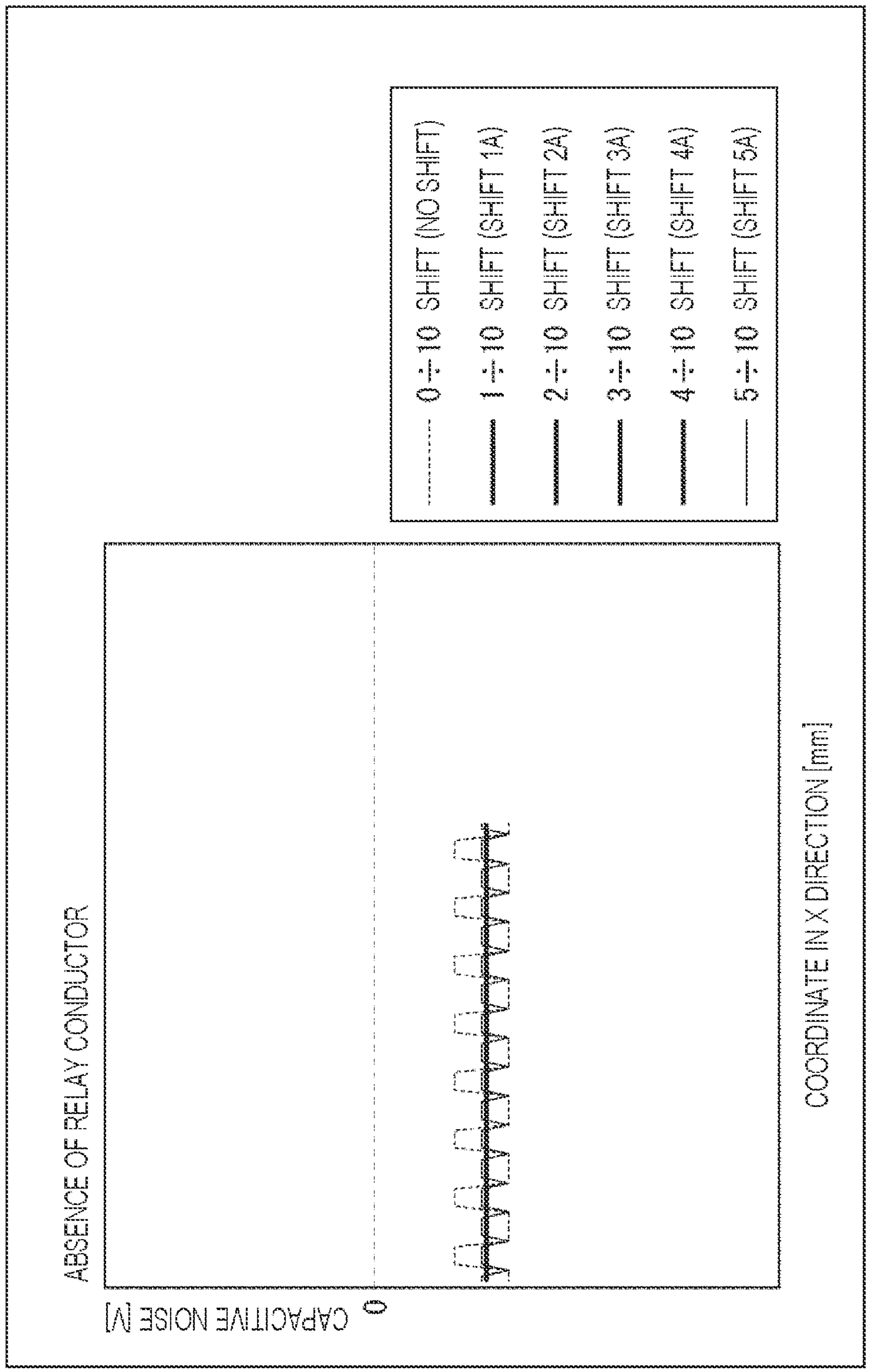

FIG. 205 is a diagram illustrating theoretical values of the capacitive noise in the sixth shift configuration example.

Figure 206:
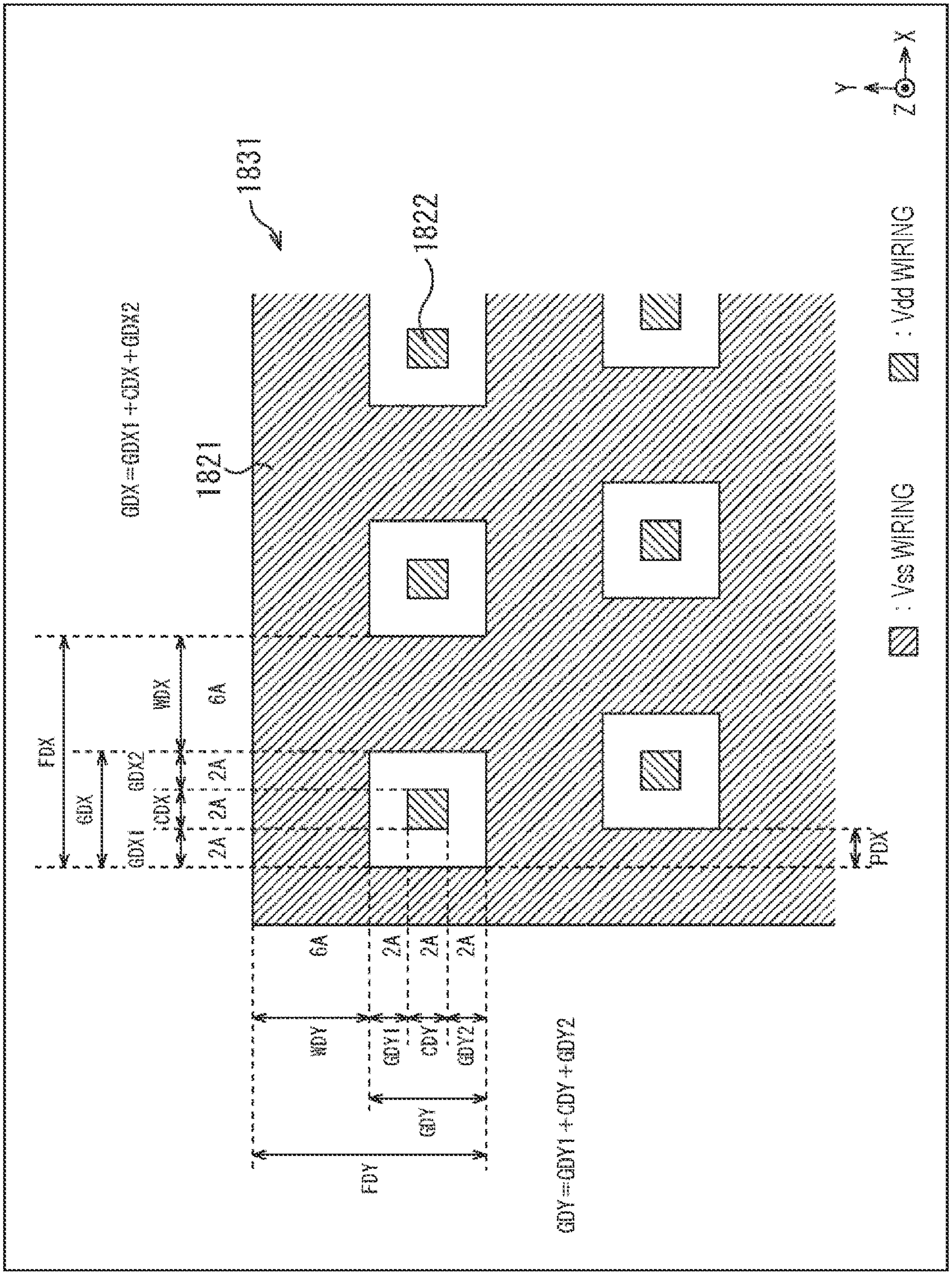

FIG. 206 is a view for describing a conductor width and a gap width of a seventh shift configuration example of the reticulated conductor.

FIGS. 207A, 207B, 207C, and 207D are plan views of the seventh shift configuration example of the reticulated conductor.

Figure 208A:
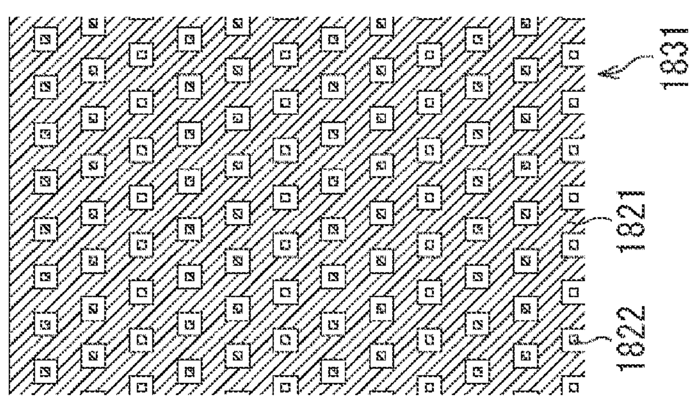
Figure 208B:
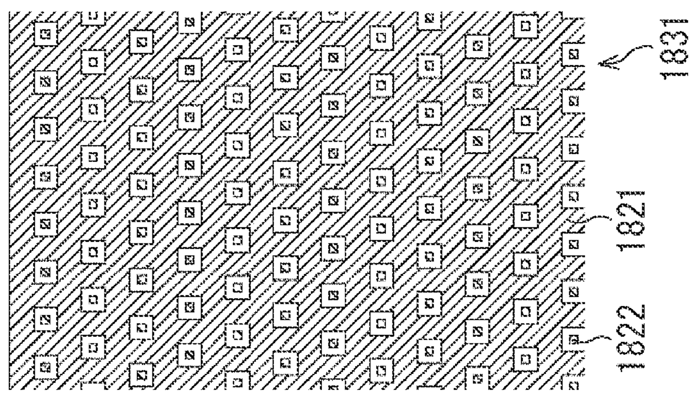
Figure 208C:
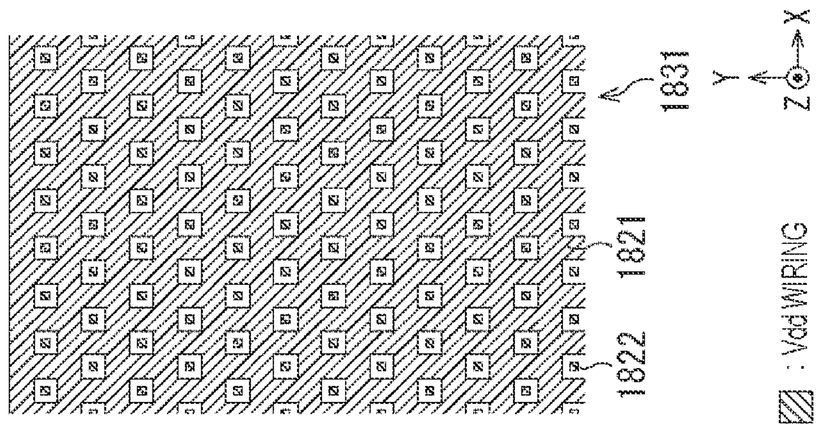

FIGS. 208A, 208B, and 208C are plan views of the seventh shift configuration example of the reticulated conductor.

MODE FOR CARRYING OUT THE INVENTION

Hereinafter, best modes for implementing the present technology (hereinafter referred to as embodiments) will be described in detail with reference to the drawings. Note that the description will be given in the following order.

1. Victim Conductor Loop and Magnetic Flux
2. Configuration Example of Solid-State Imaging Device as Embodiment of Present Technology
3. Light-shielding Structure for Hot Carrier Light Emission
4. Configuration Example of Conductor Layers A and B
5. Arrangement Example of Electrodes in Semiconductor Substrate in which Conductor Layers A and B are Formed
6. Modification of Configuration Example of Conductor Layers A and B
7. Modification of Reticulated Conductor
8. Various Effects
9. Configuration Example with Different Drawing Portion
10. Connection Configuration Example with Pads
11. Arrangement Example of Conductive Shield
12. Configuration Example of Case Having Three Conductor Layers
13. Application
14. Shift Configuration Example of Reticulated Conductor
15. Configuration Example of Imaging Device
16. Application to In-vivo Information Acquisition System
17. Application to Endoscopic Surgical System
18. Application to Moving Bodies

1. Victim Conductor Loop and Magnetic Flux

For example, in a case where a circuit in which a Victim conductor loop is formed is present near power wiring in a solid-state imaging device (semiconductor device) such as a CMOS image sensor, when a magnetic flux passing through a loop plane of the Victim conductor loop changes, induced electromotive force generated in the Victim conductor loop changes, and noise is sometimes generated in a pixel signal. Note that it is sufficient that the Victim conductor loop includes a conductor at least in part. Furthermore, the Victim conductor loop may be entirely formed using a conductor.

Here, the Victim conductor loop (first conductor loop) refers to a conductor loop on a side affected by a change in magnetic field intensity generated nearby. Meanwhile, a conductor loop on a side that is present near the Victim conductor loop, causes a change in the magnetic field intensity by a change in a flowing current, and affects the Victim conductor loop is referred to as Aggressor conductor loop (second conductor loop).

Figure 1:
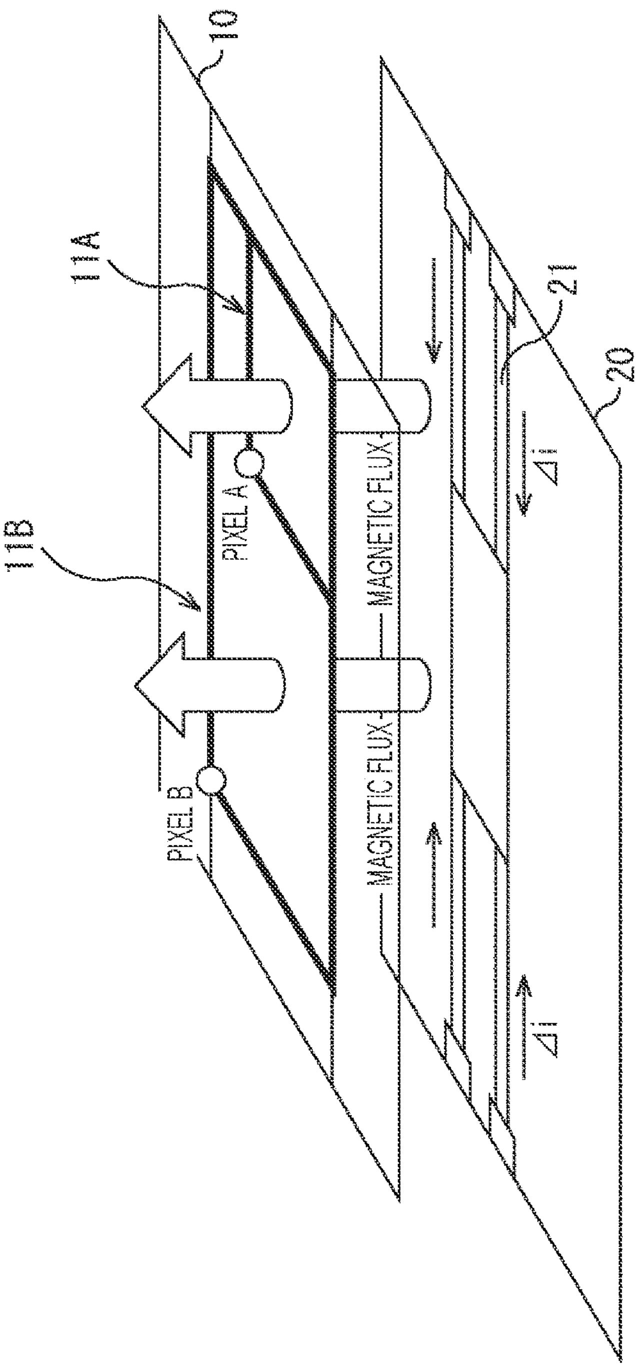
FIG. 1 is a diagram for describing a change in induced electromotive force due to a change in a conductor loop.

FIG. 1 is a diagram for describing a change in induced electromotive force due to a change in the Victim conductor loop. For example, a solid-state imaging device such as a CMOS image sensor illustrated in FIG. 1 is configured by stacking a pixel board 10 and a logic board 20 in that order from the top. In the solid-state imaging device in FIG. 1, at least a part of a Victim conductor loop 11 (11A or 11B) is formed in a pixel region of the pixel board 10, and power wiring 21 for supplying a (digital) power supply is formed in a region of the logic board 20 stacked with the pixel board 10, the region being near the Victim conductor loop 11.

Then, a magnetic flux due to the power wiring 21 passes through a loop plane of the Victim conductor loop 11 on the pixel board 10, thereby induced electromotive force is generated in the Victim conductor loop 11.

Note that induced electromotive force Vemf generated in the Victim conductor loop 11 can be calculated by the following equations (1) and (2). Note that Φ represents the magnetic flux, H represents the magnetic field intensity, μ represents magnetic permeability, and S represents the area of the Victim conductor loop 11.

[Math. 1]

$$\phi = \int_S \mu H \cdot dS \tag{1}$$

[Math. 2]

$$V_{emf} = -\frac{d\phi}{dt} \tag{2}$$

A loop path of the Victim conductor loop 11 formed in the pixel region of the pixel board 10 changes depending on a position of a pixel selected as a pixel to be read from which a pixel signal is read. In the case of the example in FIG. 1, the loop path of the Victim conductor loop 11A formed when a pixel A is selected is different from the loop path of the Victim conductor loop 11B formed when a pixel B at a different position from the pixel A is selected. In other words, the effective shape of the conductor loop changes depending on the position of the selected pixel.

When the loop path of the Victim conductor loop 11 changes in this way, the magnetic flux passing through the loop plane of the Victim conductor loop changes, thereby the induced electromotive force generated in the Victim conductor loop sometimes significantly changes. Furthermore, noise (inductive noise) sometimes occurs in the pixel signal read from the pixel due to the change in the induced electromotive force. Then, striped image noise is sometimes generated in a captured image due to the inductive noise. That is, the image quality of the captured image is sometimes reduced.

Therefore, the present disclosure proposes a technique of suppressing generation of the inductive noise in the induced electromotive force in the Victim conductor loop.

2. Configuration Example of Solid-State Imaging Device (Semiconductor Device) as Embodiment of Present Technology FIG. 2 is a block diagram illustrating a main configuration example of a solid-state imaging device that is an embodiment of the present technology.

Figure 2:
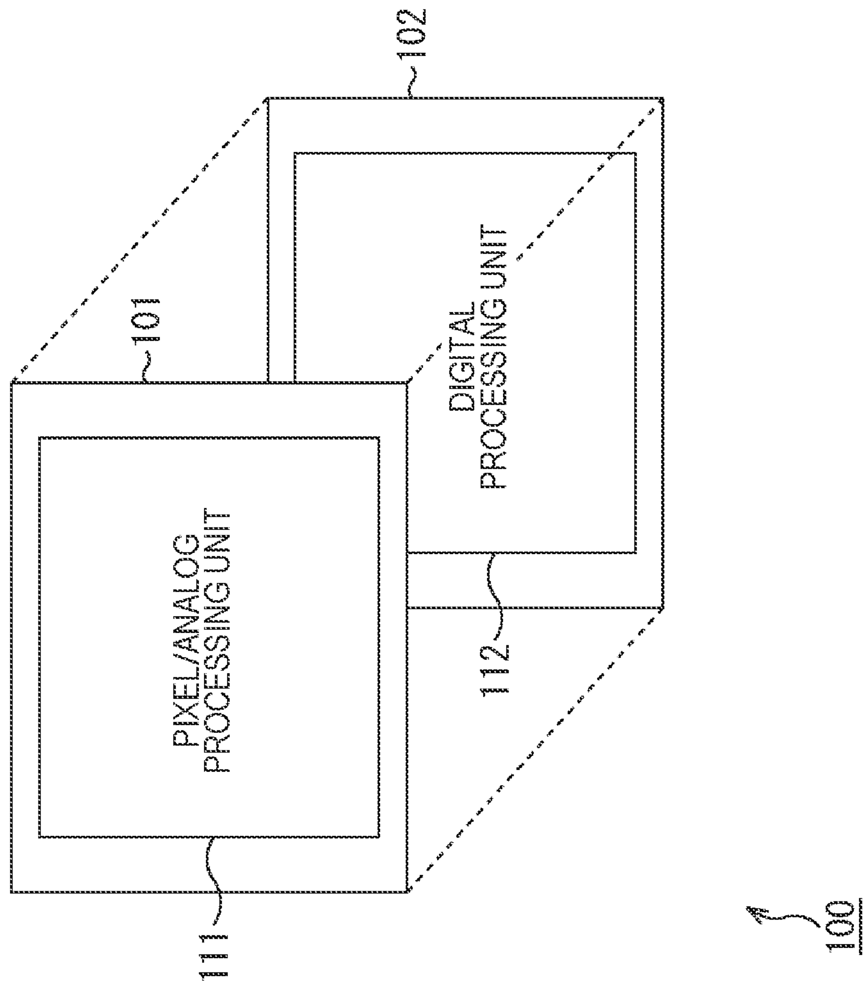
FIG. 2 is a block diagram illustrating a configuration example of a solid-state imaging device to which the present technology is applied.

A solid-state imaging device 100 illustrated in FIG. 2 is a device that photoelectrically converts light from an object and outputs the photoelectrically converted light as image data. For example, the solid-state imaging device 100 is configured as a back-illuminated CMOS image sensor using a CMOS, or the like.

As illustrated in FIG. 2, the solid-state imaging device 100 is configured by stacking a first semiconductor substrate 101 and a second semiconductor substrate 102.

A pixel/analog processing unit 111 including pixels, an analog circuit, and the like is formed on the first semiconductor substrate 101. A digital processing unit 112 including a digital circuit and the like is formed on the second semiconductor substrate 102.

The first semiconductor substrate 101 and the second semiconductor substrate 102 are superposed in an insulated state from each other. That is, the configuration of the pixel/analog processing unit 111 and the configuration of the second semiconductor substrate 102 are basically insulated from each other. Note that although not illustrated, the configuration formed in the pixel/analog processing unit 111 and the configuration formed in the digital processing unit 112 are electrically connected with each other as needed (in necessary parts) via, for example, a conductor via (VIA), a through silicon via (TSV), similar metal bonding such as Cu—Cu bonding, Au—Au bonding, or Al—Al bonding, dissimilar metal bonding such as Cu—Au bonding, Cu—Al bonding, or Au—Al bonding, a bonding wire, or the like.

Note that, in FIG. 2, the solid-state imaging device 100 including stacked two-layer substrates has been described as an example. However, the number of stacked substrates constituting the solid-state imaging device 100 is arbitrary. For example, the solid-state imaging device 100 may have a single substrate or three or more layers of substrates. Hereinafter, the case where the solid-state imaging device 100 is configured using two layers of substrates as in the example in FIG. 2 will be described.

Figure 3:
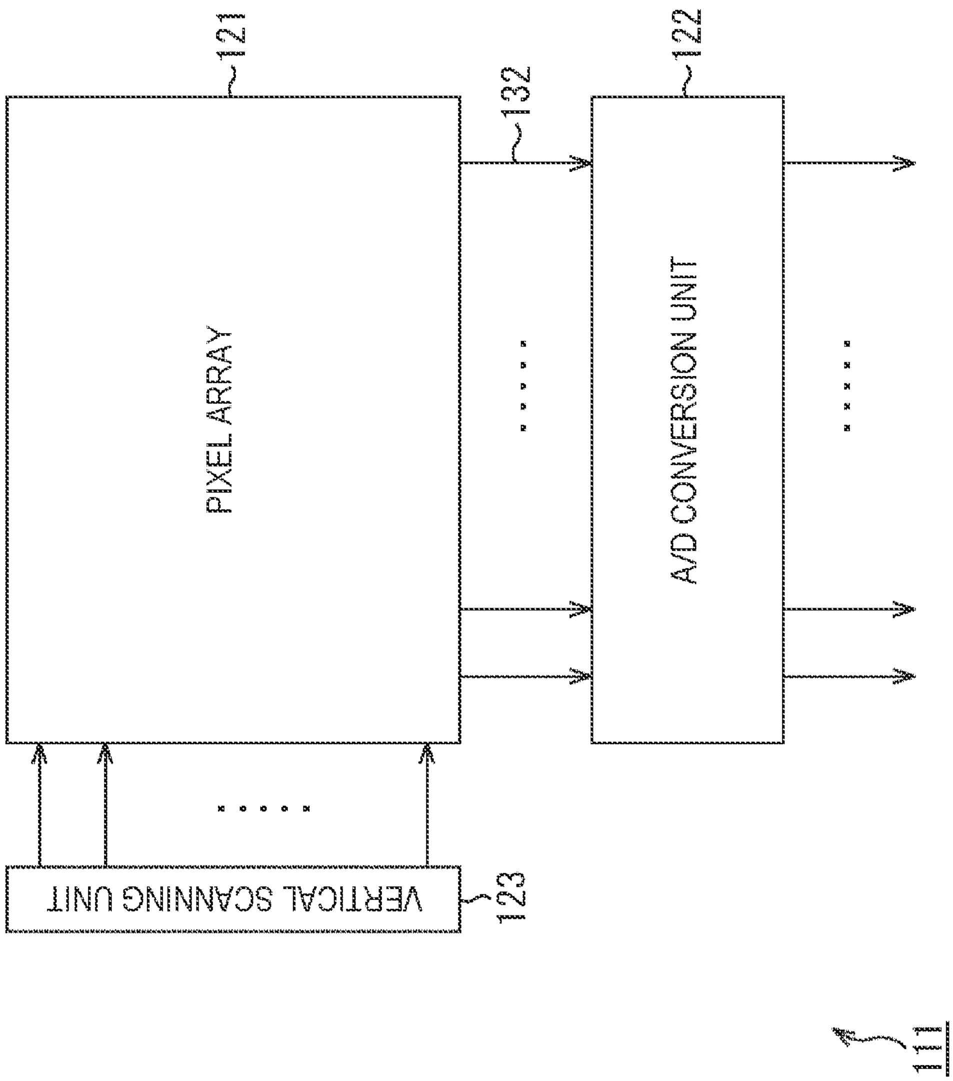
FIG. 3 is a block diagram illustrating an example of main configuration elements of a pixel/analog processing unit.

FIG. 3 is a block diagram illustrating an example of main configuration elements of a pixel/analog processing unit 111.

As illustrated in FIG. 3, a pixel array 121, an A/D conversion unit 122, a vertical scanning unit 123, and the like are formed in the pixel/analog processing unit 111.

In the pixel array 121, a plurality of pixels 131 (FIG. 4) each having a photoelectric conversion element such as a photodiode is vertically and horizontally arranged.

The A/D conversion unit 122 performs A/D conversion for an analog signal or the like read from each pixel 131 of the pixel array 121, and outputs a resultant digital pixel signal.

The vertical scanning unit 123 controls operation of a transistor (a transfer transistor 142 or the like in FIG. 5) of each pixel 131 of the pixel array 121. That is, a charge accumulated in each pixel 131 of the pixel array 121 is controlled and read by the vertical scanning unit 123, is supplied as a pixel signal to the A/D conversion unit 122 via a signal line 132 (FIG. 4) for each column of a unit pixel, and is A/D converted.

The A/D conversion unit 122 supplies an A/D conversion result (digital pixel signal) to a logic circuit (not illustrated) formed in the digital processing unit 112 for each column of the pixel 131.

Figure 4:
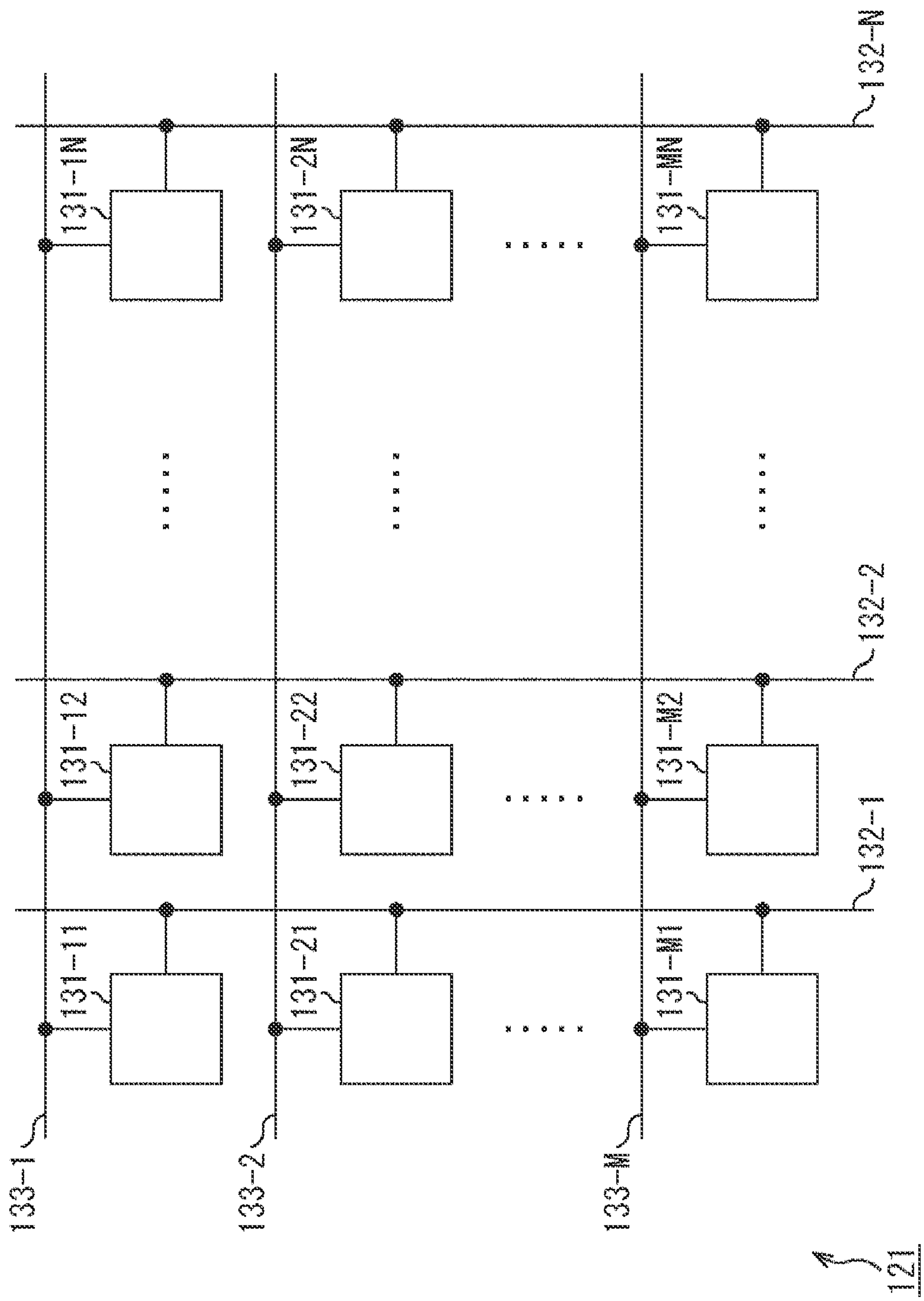
FIG. 4 is a diagram illustrating a detailed configuration example of a pixel array.

FIG. 4 is a diagram illustrating a detailed configuration example of the pixel array 121. Pixels 131-11 to 131-MN are formed in the pixel array 121 (M and N are arbitrary natural numbers). That is, in the pixel array 121, the pixels 131 of M rows and N columns are arranged in a matrix (array).

Hereinafter, the pixels 131-11 to 131-MN are simply referred to as pixel(s) 131 in a case where there is no need to individually distinguish the pixels 131-11 to 131-MN.

Signal lines 132-1 to 132-N and control lines 133-1 to 133-M are formed on the pixel array 121. Hereinafter, the signal lines 132-1 to 132-N are simply referred to as signal line(s) 132 in a case where there is no need to individually distinguish the signal lines 132-1 to 132-N, and the control lines 133-1 to 133-M are simply referred to as control line(s) 133 in a case where there is no need to individually distinguish the control lines 133-1 to 133-M.

For each column, the signal line 132 corresponding to the column is connected to the pixels 131. Furthermore, for each row, the control line 133 corresponding to the row is connected to the pixels 131. A control signal from the vertical scanning unit 123 is transmitted to the pixel 131 via the control line 133.

The analog pixel signal is output from the pixel 131 to the A/D conversion unit 122 via the signal line 132.

Figure 5:
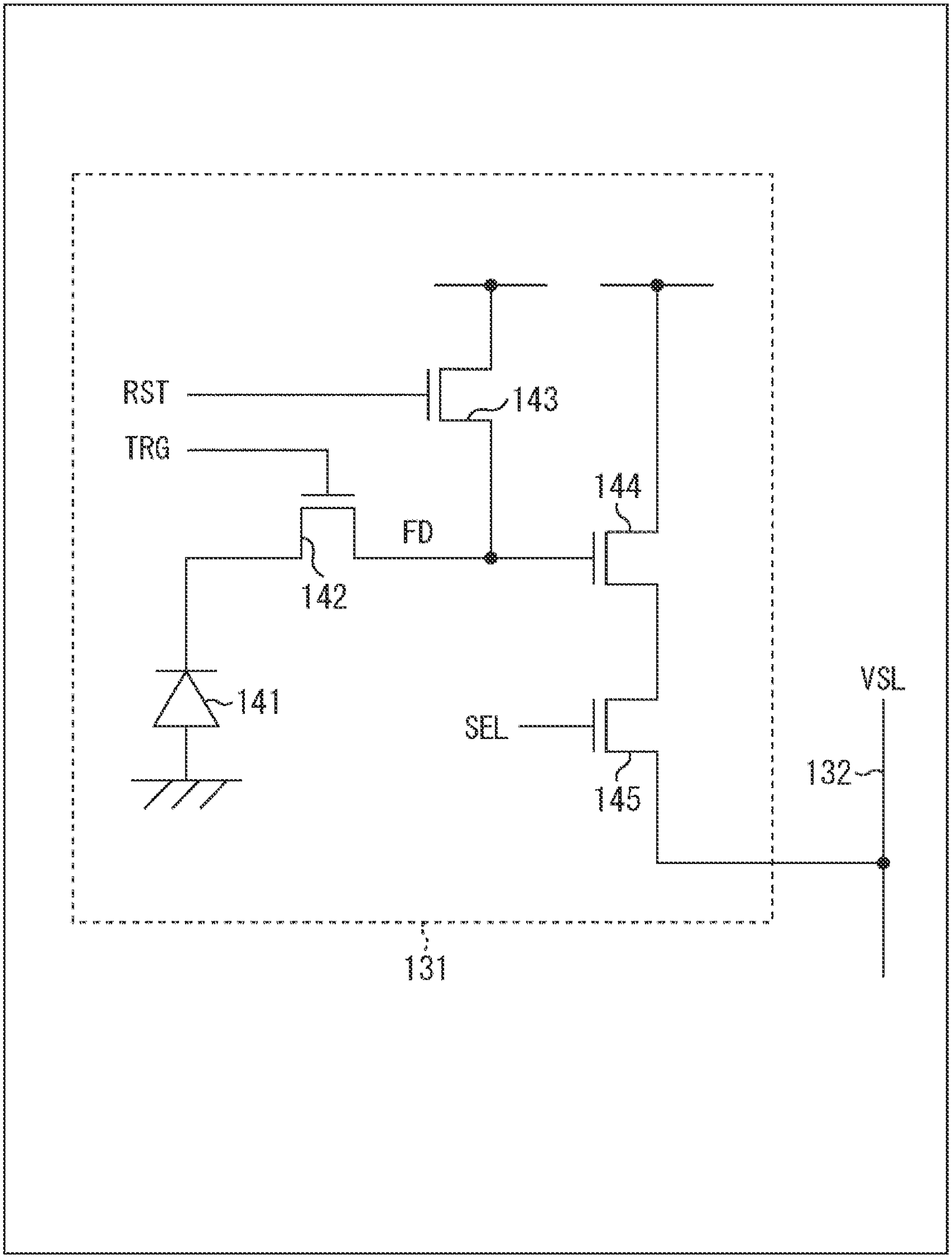
FIG. 5 is a circuit diagram illustrating a configuration example of a pixel.

Next, FIG. 5 is a circuit diagram illustrating a configuration example of the pixel 131. The pixel 131 includes a photodiode 141 as a photoelectric conversion element, a transfer transistor 142, a reset transistor 143, an amplification transistor 144, and a select transistor 145.

The photodiode 141 photoelectrically converts received light into a photocharge (photoelectrons here) having a charge amount corresponding to a light amount of the received light and accumulates the photocharge. An anode electrode of the photodiode 141 is connected to GND, and a cathode electrode is connected to floating diffusion (FD) via the transfer transistor 142. Of course, the cathode electrode of the photodiode 141 may be connected to a power supply, the anode electrode may be connected to the floating diffusion via the transfer transistor 142, and the photocharge may be read as an optical hole.

The transfer transistor 142 controls readout of the photocharge from the photodiode 141. A drain electrode of the transfer transistor 142 is connected to the floating diffusion, and a source electrode of the transfer transistor 142 is connected to the cathode electrode of the photodiode 141. Furthermore, a transfer control line for transmitting a transfer control signal TRG supplied from the vertical scanning unit 123 (FIG. 3) is connected to a gate electrode of the transfer transistor 142. When the transfer control signal TRG (that is, a gate potential of the transfer transistor 142) is in an OFF state, the photocharge is not transferred from the photodiode 141 (the photocharge is accumulated in the photodiode 141). When the transfer control signal TRG (that is, the gate potential of the transfer transistor 142) is in an ON state, the photocharge accumulated in the photodiode 141 is transferred to the floating diffusion.

The reset transistor 143 resets the potential of the floating diffusion. A drain electrode of the reset transistor 143 is connected to a power supply potential, and a source electrode of the reset transistor 143 is connected to the floating diffusion. Furthermore, a reset control line for transmitting a reset control signal RST supplied from the vertical scanning unit 123 is connected to a gate electrode of the reset transistor 143. When the reset control signal RST (that is, a gate potential of the reset transistor 143) is in the OFF state, the floating diffusion is disconnected from the power supply potential. When the reset control signal RST (that is, the gate potential of the reset transistor 143) is in the ON state, the charge of the floating diffusion is discharged to the power supply potential, and the floating diffusion is reset.

The amplification transistor 144 outputs an electrical signal (analog signal) corresponding to a voltage of the floating diffusion (causes a current to flow). A gate electrode of the amplification transistor 144 is connected to the floating diffusion, a drain electrode of the amplification transistor 144 is connected to a (source-follower) power supply voltage, and a source electrode of the amplification transistor 144 is connected to a drain electrode of the select transistor 145. For example, the amplification transistor 144 outputs a reset signal (reset level) as an electrical signal according to the voltage of the floating diffusion reset by the reset transistor 143 to the select transistor 145 as a pixel signal. Furthermore, the amplification transistor 144 outputs an optical storage signal (signal level) as an electrical signal according to the voltage of the floating diffusion to which the photocharge has been transferred by the transfer transistor 142 to the select transistor 145 as a pixel signal.

The select transistor 145 controls output of the electrical signal supplied from the amplification transistor 144 to the signal line (VSL) 132 (that is, the A/D conversion unit 122). The drain electrode of the select transistor 145 is connected to the source electrode of the amplification transistor 144 and a source electrode of the select transistor 145 is connected to the signal line 132 Furthermore, a select control line for transmitting a select control signal SEL supplied from the vertical scanning unit 123 is connected to the gate electrode of the select transistor 145. When the select control signal SEL (that is, a gate potential of the select transistor 145) is in the OFF state, the amplification transistor 144 and the signal line 132 are electrically disconnected. Therefore, in this state, the reset signal or the optical storage signal as the pixel signal is not output from the pixel 131. When the select control signal SEL (that is, the gate potential of the select transistor 145) is in the ON state, the pixel 131 becomes selected. That is, the amplification transistor 144 and the signal line 132 are electrically connected, and the reset signal or the optical storage signal as the pixel signal output from the amplification transistor 144 is supplied to the A/D conversion unit 122 via the signal line 132. That is, the reset signal or the optical storage signal as the pixel signal is read from the pixel 131.

Note that the configuration of the pixel 131 is arbitrary and is not limited to the example in FIG. 5.

In the pixel/analog processing unit 111 configured as described above, when the pixel 131 is selected as the target for reading the analog signal as the pixel signal, the control line 133 for controlling the above-described various transistors, the signal line 132, the power wiring (analog power wiring and digital power wiring), and the like form various Victim conductor loops (conductors having a loop shape (annular shape). When the magnetic flux generated from nearby wiring or the like passes through the loop plane of the Victim conductor loop, induced electromotive force is generated.

It is sufficient that the Victim conductor loop includes at least one of the control line 133 or the signal line 132. Furthermore, the Victim conductor loop including a part of the control lines 133 and the Victim conductor loop including a part of the signal lines 132 may be present as Victim conductor loops independent of each other. Moreover, a part or the whole of the Victim conductor loop may be included in the second semiconductor substrate 102. Moreover, the loop path of the Victim conductor loop may be variable or fixed.

Wiring directions of the control lines 133 and the signal lines 132 forming the Victim conductor loop are desirably substantially orthogonal to each other, but may be substantially parallel to each other.

Note that a conductor loop existing near another conductor loop can be the Victim conductor loop. For example, a conductor loop that is not affected even when a change in magnetic field intensity occurs due to a change in a current flowing through a nearby aggressor loop can be the Victim conductor loop.

In the Victim conductor loop, when a high-frequency signal flows through the wiring (Aggressor conductor loop) existing nearby and the magnetic field intensity around the Aggressor conductor loop changes, the induced electromotive force is generated in the Victim conductor loop due to the influence of the change, and noise is sometimes generated in the Victim conductor loop. In particular, in a case where wirings in which the currents flow in the same direction are concentrated near the Victim conductor loop, the change in magnetic field intensity becomes large, and the induced electromotive force (that is, noise) generated in the Victim conductor loop also becomes large.

Therefore, in the present disclosure, the direction of the magnetic flux generated from the loop plane of the Aggressor conductor loop is adjusted so that the magnetic field does not pass through the Aggressor conductor loop.

3. Light-Shielding Structure for Hot Carrier Light Emission

Figure 6:
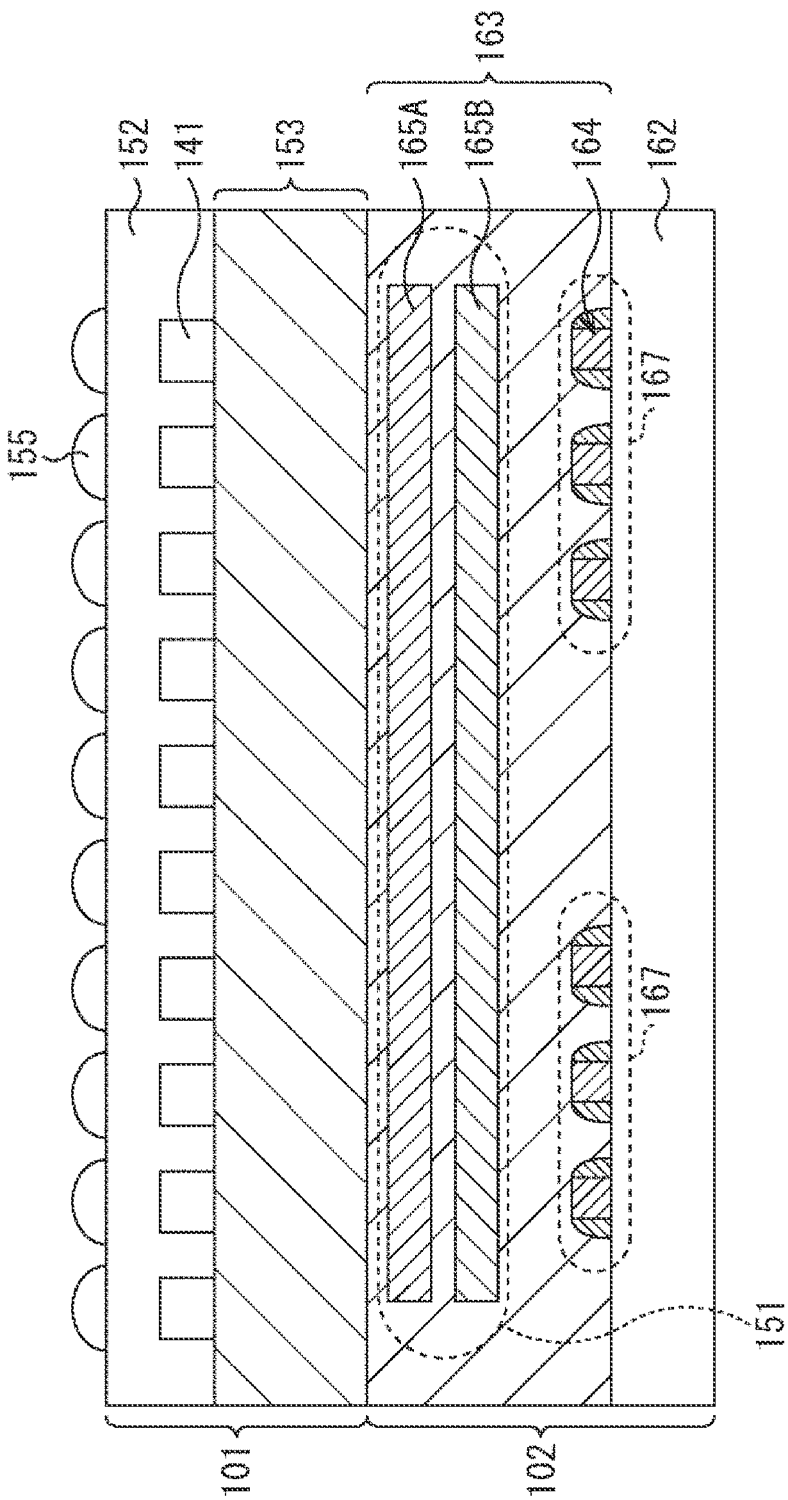
FIG. 6 is a block diagram illustrating an example of a cross-sectional structure of a solid-state imaging device.

FIG. 6 is a diagram illustrating an example of a cross-sectional structure of the solid-state imaging device 100.

As described above, the solid-state imaging device 100 is configured by stacking the first semiconductor substrate 101 and the second semiconductor substrate 102.

In the first semiconductor substrate 101, for example, a pixel array in which a plurality of pixel units is two-dimensionally arrayed, is formed, each pixel units including the photodiode 141 serving as a photoelectric conversion unit, and the plurality of pixel transistors (the transfer transistor 142 to the select transistor 145 in FIG. 5).

The photodiode 141 has, for example, an n-type semiconductor region and a p-type semiconductor region on a front surface side (lower side in the figure) of the substrate in a well region formed in a semiconductor substrate 152. The plurality of pixel transistors (the transfer transistor 142 to the select transistor 145 in FIG. 5) is formed on the semiconductor substrate 152.

A multilayer wiring layer 153 in which wiring of a plurality of layers is arranged via an interlayer insulating film is formed on the front surface side of the semiconductor substrate 152. The wiring is formed using, for example, copper wiring. Wirings in different wiring layers of the pixel transistors, the vertical scanning unit 123, and the like are connected to one another at required points by a connecting conductor penetrating the wiring layers. For example, an anti-reflection film, a light-shielding film that blocks a predetermined region, and an optical member 155 such as a color filter and a microlens provided at positions corresponding to each photodiode 141 are formed on a back surface (upper side in the figure) of the semiconductor substrate 152.

Meanwhile, a logic circuit as the digital processing unit 112 (FIG. 2) is formed in the second semiconductor substrate 102. The logic circuit includes, for example, a plurality of MOS transistors 164 formed in a p-type semiconductor well region of a semiconductor substrate 162.

Moreover, a multilayer wiring layer 163 including a plurality of wiring layers in each of which wiring is arranged via an interlayer insulating film is formed on the semiconductor substrate 162. FIG. 6 illustrates two wiring layers (wiring layers 165A and 165B) of the plurality of wiring layers forming the multilayer wiring layer 163.

In the solid-state imaging device 100, a light-shielding structure 151 is formed by the wiring layer 165A and the wiring layer 165B.

Here, in the second semiconductor substrate 102, a region in which active elements such as the MOS transistors 164 are formed is referred to as an active element group 167. In the second semiconductor substrate 102, a circuit for implementing one function by combining active elements such as a plurality of nMOS transistors and pMOS transistors is configured, for example. Then, the region where the active element group 167 is formed is defined as a circuit block (corresponding to circuit blocks 202 to 204 in FIGS. 7A and 7B). Note that, as the active element formed on the second semiconductor substrate 102, a diode or the like may be present in addition to the MOS transistors 164.

Then, in the multilayer wiring layer 163 of the second semiconductor substrate 102, the light-shielding structure 151 including the wiring layer 165A and the wiring layer 165B is present between the active element group 167 and the photodiode 141, so that the light-shielding structure 151 suppresses leakage of hot carrier light emission generated from the active element group 167 into the photodiode 141 (details will be described below).

Hereinafter, the wiring layer 165A closer to the first semiconductor substrate 101 on which the photodiode 141 and the like are formed, between the wiring layer 165A and the wiring layer 165B forming the light-shielding structure 151, will be referred to as a conductor layer A (first conductor layer). Furthermore, the wiring layer 165B closer to the active element group 167 will be referred to as a conductor layer B (second conductor layer).

However, the wiring layer 165A closer to the first semiconductor substrate 101 on which the photodiode 141 and the like are formed may be referred to as the conductor layer B, and the wiring layer 165B closer to the active element group 167 may be referred to as the conductor layer A. Moreover, any one of an insulating layer, a semiconductor layer, another conductor layer, or the like may be provided between the conductor layers A and B. Furthermore, any one of an insulating layer, a semiconductor layer, another conductor layer, or the like may be provided between layers other than the conductor layers A and B.

The conductor layer A and the conductor layer B are desirably, but are not limited to, the conductor layers in which the current most easily flows among circuit boards, semiconductor substrates, and electronic devices.

One of the conductor layer A or the conductor layer B is desirably, but is not limited to, the conductor layer in which the current most easily flows among circuit boards, semiconductor substrates, and electronic devices, and the other is desirably, but are not limited to, the conductor layer in which the current second-most easily flows among circuit boards, semiconductor substrates, and electronic devices.

One of the conductor layer A or the conductor layer B is desirably, but is not limited to, not a conductor layer in which the current most uneasily flows among circuit boards, semiconductor substrates, and electronic devices. Both of the conductor layer A and the conductor layer B are desirably, but are not limited to, not the conductor layers in which the current most uneasily flows among circuit boards, semiconductor substrates, and electronic devices.

For example, one of the conductor layer A or the conductor layer B may be the conductor layer in which the current most easily flows in the first semiconductor substrate 101 and the other may be the conductor layer in which the current second-most easily flows in the first semiconductor substrate 101.

For example, one of the conductor layer A or the conductor layer B may be the conductor layer in which the current most easily flows in the second semiconductor substrate 102 and the other may be the conductor layer in which the current second-most easily flows in the second semiconductor substrate 102.

For example, one of the conductor layer A or the conductor layer B may be the conductor layer in which the current most easily flows in the first semiconductor substrate 101 and the other may be the conductor layer in which the current most easily flows in the second semiconductor substrate 102.

For example, one of the conductor layer A or the conductor layer B may be the conductor layer in which the current most easily flows in the first semiconductor substrate 101 and the other may be the conductor layer in which the current second-most easily flows in the second semiconductor substrate 102.

For example, one of the conductor layer A or the conductor layer B may be the conductor layer in which the current second-most easily flows in the first semiconductor substrate 101 and the other may be the conductor layer in which the current most easily flows in the second semiconductor substrate 102.

For example, one of the conductor layer A or the conductor layer B may be the conductor layer in which the current second-most easily flows in the first semiconductor substrate 101 and the other may be the conductor layer in which the current second-most easily flows in the second semiconductor substrate 102.

For example, one of the conductor layer A or the conductor layer B may not be the conductor layer in which the current most uneasily flows in the first semiconductor substrate 101 or the second semiconductor substrate 102.

For example, both of the conductor layer A and the conductor layer B may not be the conductor layers in which the current most uneasily flows in the first semiconductor substrate 101 or the second semiconductor substrate 102.

Note that the above-described first can be replaced as third, fourth, or Nth (N is a positive number), and the above-described second can also be replaced as third, fourth, or Nth (N is a positive number).

Note that the above-described conductor layer in which the current easily flows among circuit boards, semiconductor substrates, and electronic devices may be considered to be any of a conductor layer in which the current easily flows among the circuit boards, a conductor layer in which the current easily flows among the semiconductor substrates, or a conductor layer in which the current easily flows among the electronic devices. Note that the above-described conductor layer in which the current less easily flows among circuit boards, semiconductor substrates, and electronic devices may be considered to be any of a conductor layer in which the current less easily flows among the circuit boards, a conductor layer in which the current less easily flows among the semiconductor substrates, or a conductor layer in which the current less easily flows among the electronic devices. Furthermore, even if the conductor layer in which the current easily flows is a conductor layer having a low sheet resistance, and the conductor layer in which the current less easily flows is a conductor layer having a high sheet resistance, thereby can be replaced with each other.

Note that, as the conductor material used for the conductor layers A and B, a metal such as copper, aluminum, tungsten, chromium, nickel, tantalum, molybdenum, titanium, gold, silver, or iron, or a mixture, a compound, or an alloy containing at least one of the aforementioned metals, is mainly used. Furthermore, a semiconductor such as silicon, germanium, a compound semiconductor, or an organic semiconductor may be included. Moreover, an insulator such as cotton, paper, polyethylene, polyvinyl chloride, natural rubber, polyester, epoxy resin, melamine resin, phenol resin, polyurethane, synthetic resin, mica, asbestos, glass fiber, or porcelain may be included.

The conductor layers A and B forming the light-shielding structure 151 can form an Aggressor conductor loop by a current flowing through the conductor layers A and B.

Next, a region shielded by the light-shielding structure 151 (light-shielding target region) will be described.

Figure 7A:
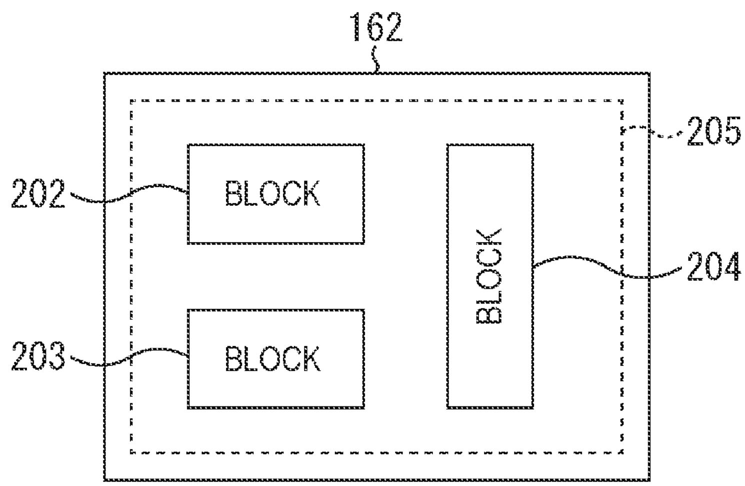
FIGS. 7A and 7B are schematic configuration diagrams illustrating plan arrangement examples of circuit blocks including regions in which active element groups are formed.
Figure 7B:
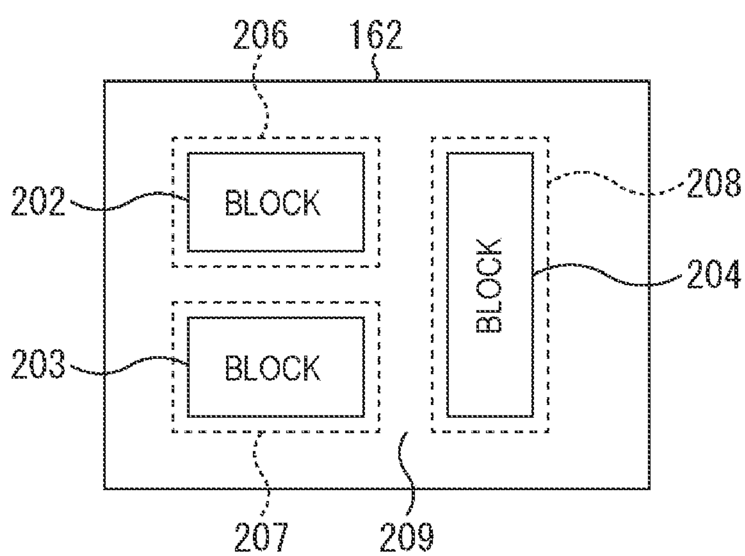

FIGS. 7A and 7B are schematic configuration diagrams illustrating plan arrangement examples of circuit blocks including the regions in which the active element groups 167 are formed in the semiconductor substrate 162.

FIG. 7A illustrates an example of a case in which the plurality of circuit blocks 202 to 204 is collectively the light-shielding target region by the light-shielding structure 151, and a region 205 including all the circuit blocks 202, 203, and 204 serves as the light-shielding target region.

FIG. 7B illustrates an example of a case in which the plurality of circuit blocks 202 to 204 is individually the light-shielding target region by the light-shielding structure 151. Regions 206, 207, and 208 respectively including the circuit blocks 202, 203, and 204 individually serve as the light-shielding target regions, and a region 209 other than the regions 206 to 208 serves as a non-light-shielding target region.

In the case of the example illustrated in FIG. 7B restriction on the degree of freedom in layout of the conductor layers A and B forming the light-shielding structure 151 can be avoided. However, since the layout of the conductor layers A and B becomes complicated, a great deal of labor is required to design the layout of the conductor layers A and B.

To easily design the layout of the conductor layers A and B forming the light-shielding structure 151, it is desirable to adopt the example illustrated in FIG. 7A and collectively set the plurality of circuit blocks as the light-shielding target region.

Therefore, the present disclosure proposes structures of the conductor layers A and B for which the layout can be easily designed while avoiding the restriction on the degree of freedom in layout of the conductor layers A and B.

Note that the light-shielding target region in the present embodiment is provided with a buffer region to serve as a light-shielding target region around the circuit block, in addition to the circuit block representing the region of the active element group 167 that is a light-emission source of the hot carrier light emission. By providing a buffer region around the circuit block, the hot carrier light emission obliquely emitted from the circuit block can be prevented from leaking into the photodiode 141.

Figure 8:
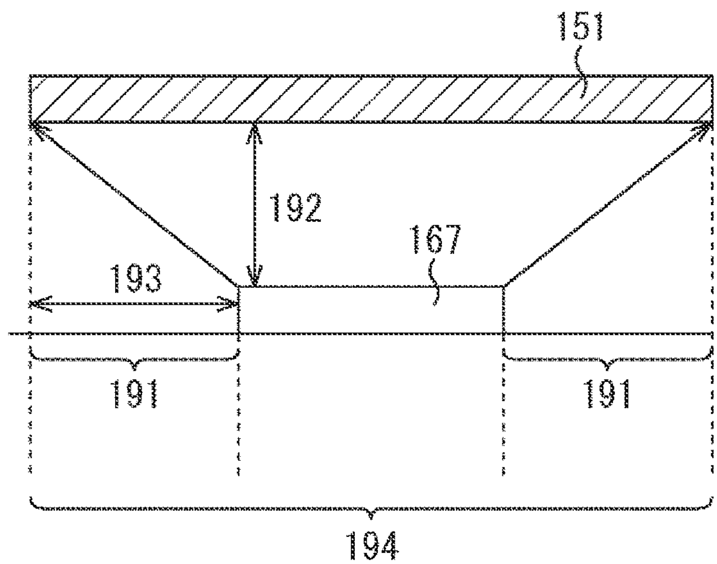
FIG. 8 is a diagram illustrating an example of a positional relationship between a light-shielding target region by a light-shielding structure, and a region of an active element group and a buffer region.

FIG. 8 is a diagram illustrating an example of a positional relationship between the light-shielding target region by the light-shielding structure 151, and the region of the active element group and the buffer region.

In the example illustrated in FIG. 8, the region in which the active element group 167 is formed and a buffer region 191 around the active element group 167 are a light-shielding target region 194, and the light-shielding structure 151 is formed to face the light-shielding target region 194.

Here, the length from the active element group 167 to the light-shielding structure 151 is defined as an interlayer distance 192. Furthermore, the length from an end of the active element group 167 to an end of the light-shielding structure 151 by wiring is defined as a buffer region width 193.

The light-shielding structure 151 is formed so that the buffer region width 193 is larger than the interlayer distance 192. Thereby, oblique components of the hot carrier light emission generated as a point light source can be shielded.

Note that an appropriate value of the buffer region width 193 changes depending on the interlayer distance 192 between the light-shielding structure 151 and the active element group 167. For example, in a case where the interlayer distance 192 is long, the buffer region 191 needs to be provided in a large manner in order to sufficiently shield the oblique components of the hot carrier light emission from the active element group 167. Meanwhile, in a case where the interlayer distance 192 is short, the hot carrier light emission from the active element group 167 can be sufficiently shielded even if the buffer region 191 is not largely provided. Therefore, by forming the light-shielding structure 151 using the wiring layer close to the active element group 167 among the plurality of wiring layers constituting the multilayer wiring layer 163, the degree of freedom in layout of the conductor layers A and B can be improved. However, it is often difficult to form the light-shielding structure 151 using the wiring layer close to the active element group 167 due to layout restrictions of the wiring layer close to the active element group 167, for example. In the present technology, a high degree of freedom in layout can be obtained even in a case where the light-shielding structure 151 is formed using a wiring layer far from the active element group 167.

4. Configuration Example of Conductor Layers A and B

Hereinafter, configuration examples of the conductor layer A (wiring layer 165A) and the conductor layer B (wiring layer 165B) forming the light-shielding structure 151, which can be the Aggressor conductor loop in the solid-state imaging device 100 to which the present technology is applied, will be described. First, a comparative example to be compared with the configuration examples will be described.

First Comparative Example

Figure 9A:
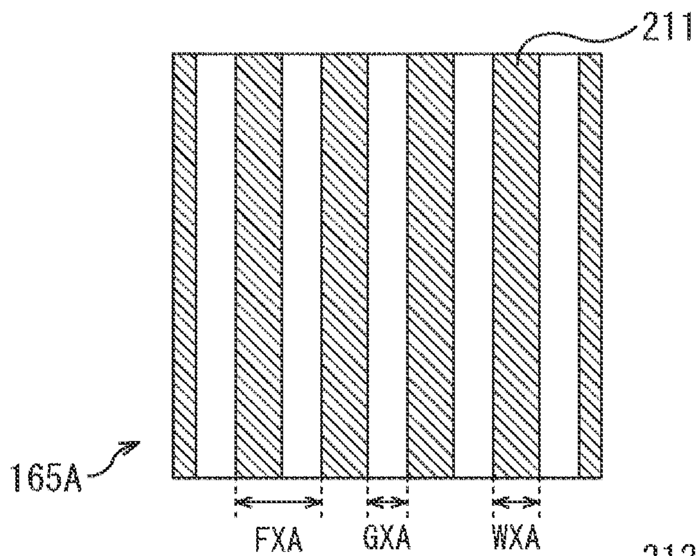
FIGS. 9A, 9B, and 9C diagrams illustrating a first comparative example of conductor layers A and B.
Figure 9B:
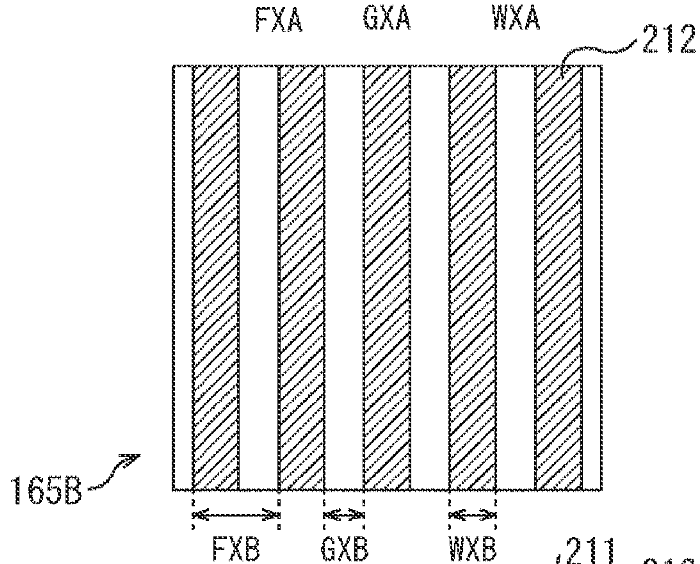
Figure 9C:
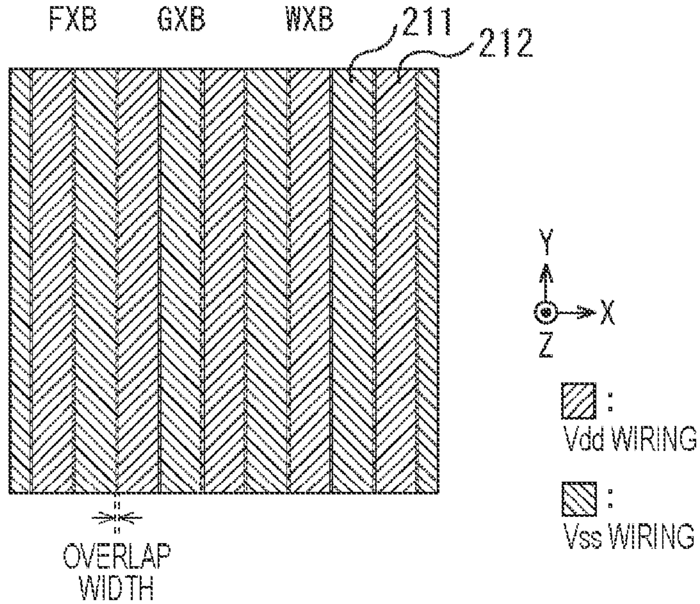

FIGS. 9A, 9B, and 9C are plan views illustrating a first comparative example of the conductor layers A and B forming the light-shielding structure 151, for comparison with a plurality of configuration examples to be described below. Note that FIG. 9A illustrates the conductor layer A, and FIG. 9B illustrates the conductor layer B. In a coordinate system in FIGS. 9A, 9B, and 9C, a horizontal direction is an X axis, a vertical direction is a Y axis, and a direction perpendicular to an XY plane is a Z axis.

In the conductor layer A in the first comparative example, a linear conductor 211 long in a Y direction is periodically arranged in an X direction with a conductor period FXA. Note that the conductor period FXA=a conductor width WXA in the X direction+a gap width GXA in the X direction. Each linear conductor 211 is, for example, wiring (Vss wiring) connected to GND or a negative power supply.

In the conductor layer B in the first comparative example, a linear conductor 212 long in the Y direction is periodically arranged in the X direction with a conductor period FXB. Note that the conductor period FXB=a conductor width WXB in the X direction+a gap width GXB in the X direction. Each linear conductor 212 is, for example, wiring (Vdd wiring) connected to a positive power supply. Here, the conductor period FXB=the conductor period FXA.

Note that connection destinations of the conductor layers A and B may be exchanged so that each linear conductor 211 serves as the Vdd wiring and each linear conductor 212 serves as the Vss wiring.

FIG. 9C illustrates a state of the conductor layers A and B respectively illustrated in FIGS. 9A and 9B, which are viewed from the photodiode 141 side (back surface side). In the case of the first comparative example, in a case where the linear conductors 211 constituting the conductor layer A and the linear conductors 212 constituting the conductor layer B are arranged in an overlapping manner as illustrated in FIG. 9C, the linear conductors 211 and 212 are formed to cause overlapping portions where the conductor portions overlap with each other. Therefore, the hot carrier light emission from the active element group 167 can be sufficiently shielded. Note that the width of the overlapping portion is also referred to as an overlap width.

Figure 10:
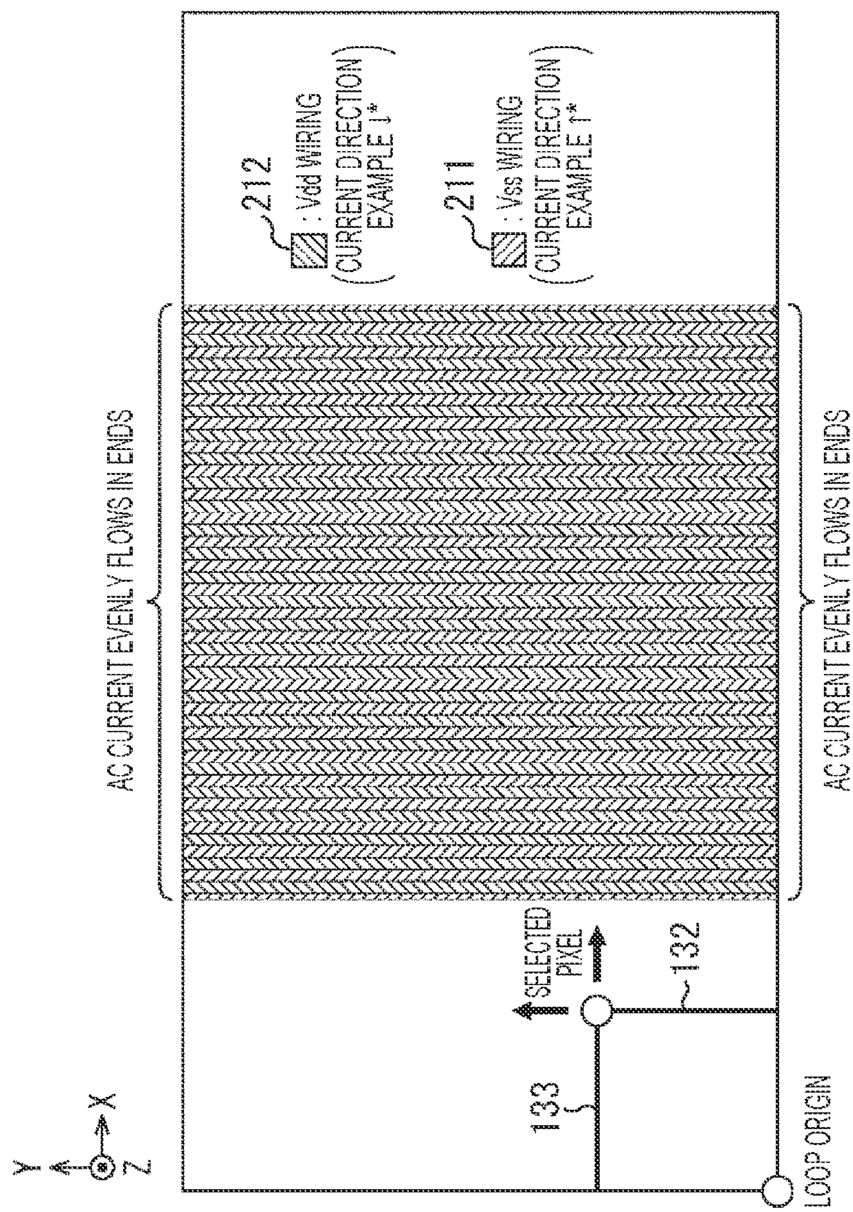
FIG. 10 is a diagram illustrating a current condition of a current flowing in the first comparative example.

FIG. 10 is a diagram illustrating a current condition of a current flowing in the first comparative example (FIGS. 9A, 9B, and 9C).

It is assumed that an AC current evenly flows in ends of the linear conductor 211 constituting the conductor layer A and the linear conductor 212 constituting the conductor layer B. However, a current direction changes with time. For example, when the current flows through the linear conductor 212 that is the Vdd wiring from the upper side to the lower side of the drawing, the current flows through the linear conductor 211 that is the Vss wiring from the lower side to the upper side of the drawing.

In the first comparative example, in the case where the current flows as illustrated in FIG. 10, a magnetic flux in a substantially Z direction is likely to be generated between the linear conductor 211 as the Vss wiring and the linear conductor 212 as the Vdd wiring by a conductor loop having a loop plane substantially parallel to an XY plane, the conductor loop being generated including the adjacent linear conductors 211 and 212 in the plan view in FIG. 10.

Meanwhile, the Victim conductor loop formed using the signal line 132 and the control line 133 is formed in the XY plane, as illustrated in FIG. 10, in the pixel array 121 of the first semiconductor substrate 101 stacked on the second semiconductor substrate 102 in which the light-shielding structure 151 formed using the conductor layers A and B is formed. In the Victim conductor loop formed on the XY plane, the induced electromotive force is likely to be generated by the magnetic flux in the Z direction, and an image output from the solid-state imaging device 100 further deteriorates (the inductive noise increases) as a change in the induced electromotive force is larger.

Moreover, since the induced electromotive force is proportional to dimensions of the Victim conductor loop depending on the configuration of the Aggressor conductor loop, when the effective dimensions of the Victim conductor loop formed using the signal line 132 and the control line 133 are changed due to movement of selected pixels in the pixel array 121, the change in the induced electromotive force becomes remarkable.

In the case of the first comparative example, since the direction (substantially Z direction) of the magnetic flux generated from the loop plane of the Aggressor conductor loop of the light-shielding structure 151 formed using the conductor layers A and B and the direction (Z direction) of the magnetic flux that is likely to generate the induced electromotive force in the Victim conductor loop substantially match, deterioration (generation of inductive noise) of an image output from the solid-state imaging device 100 is expected.

Figures 11A, 11B, 11C:
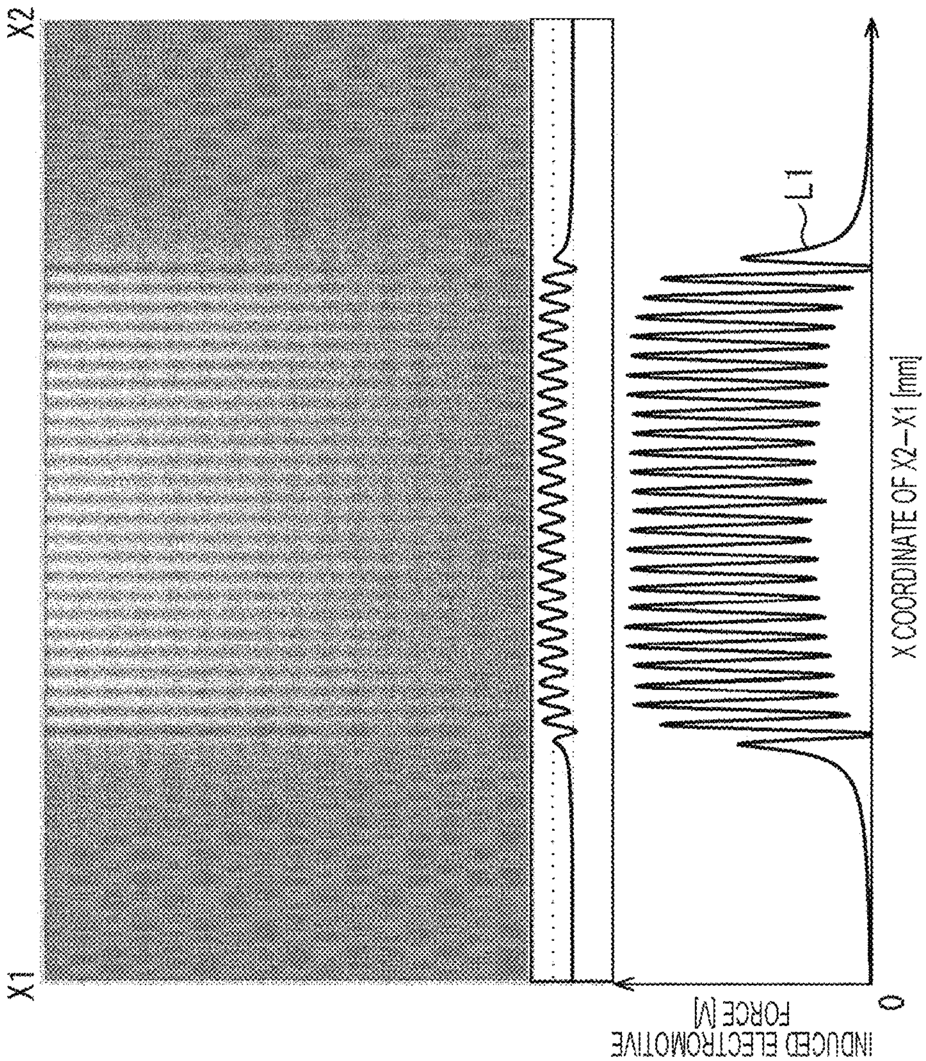
FIGS. 11A, 11B, and 11C are diagrams illustrating a simulation result of inductive noise corresponding to the first comparative example.

FIGS. 11A, 11B, and 11C illustrate a simulation result of the inductive noise generated in the case where the first comparative example is applied to the solid-state imaging device 100.

FIG. 11A illustrates an image in which the inductive noise is generated, the image being output from the solid-state imaging device 100. FIG. 11B illustrates a change in a pixel signal in the line segment X1-X2 of the image illustrated in FIG. 11A. FIG. 11C illustrates the solid line L1 representing the induced electromotive force that generates the inductive noise in the image. The horizontal axis in in FIG. 11C represents X-axis coordinates of the image, and the vertical axis represents the magnitude of the induced electromotive force.

Hereinafter, the solid line L1 illustrated in FIG. 11C will be used for comparison with the simulation result of the inductive noise generated in a case where the configuration examples of the conductor layers A and B forming the light-shielding structure 151 are applied to the solid-state imaging device 100.

First Configuration Example

Figure 12A:
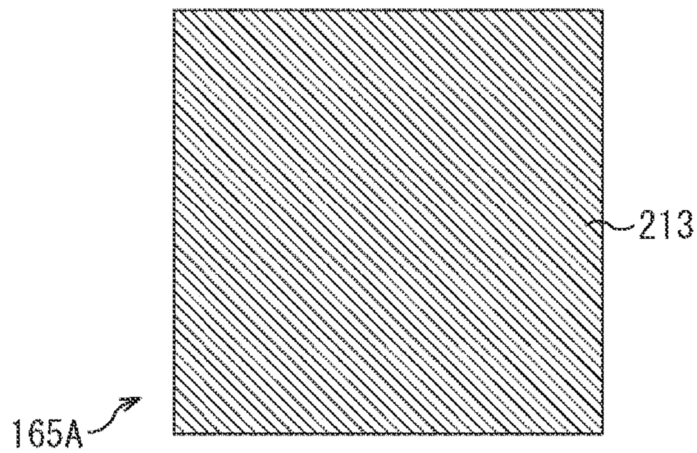
FIGS. 12A, 12B, and 12C are diagrams illustrating a first configuration example of the conductor layers A and B.
Figure 12B:
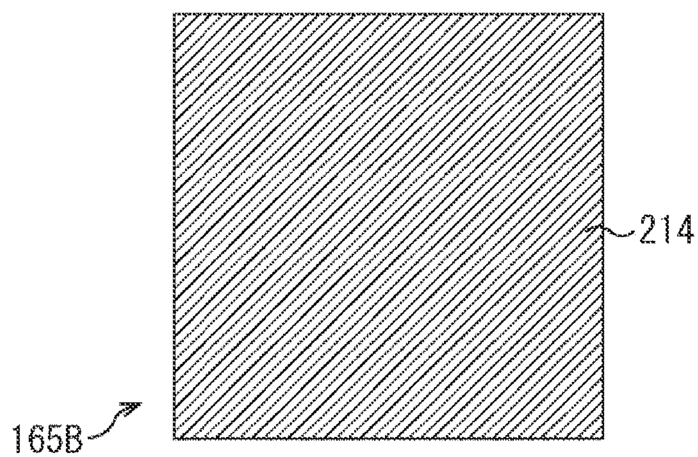
Figure 12C:
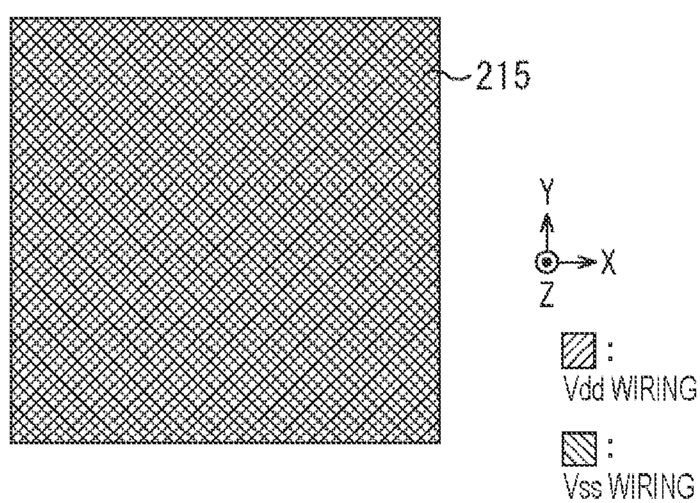

FIGS. 12A, 12B, and 12C illustrate a first configuration example of the conductor layers A and B. Note that FIG. 12A illustrates the conductor layer A, and FIG. 12B illustrates the conductor layer B. In the coordinate system in FIGS. 12A 12B, and 12C, the horizontal direction is the X axis, the vertical direction is the Y axis, and the direction perpendicular to the XY plane is the Z axis.

The conductor layer A in the first configuration example is configured by a planar conductor 213. The planar conductor 213 is, for example, wiring (Vss wiring) connected to the GND or the negative power supply.

The conductor layer B in the first comparative example is configured by a planar conductor 214. The planar conductor 214 is, for example, wiring (Vdd wiring) connected to the positive power supply.

Note that the connection destinations of the conductor layers A and B may be exchanged so that the planar conductor 213 serves as the Vdd wiring and the planar conductor 214 serves as the Vss wiring. The same applies to each configuration example to be described below.

FIG. 12C illustrates a state of the conductor layers A and B respectively illustrated in FIGS. 12A and 12B, which are viewed from the photodiode 141 side (back surface side). Note that a hatched region 215 in FIG. 12C where diagonal lines intersect represents a region where the planar conductor 213 of the conductor layer A and the planar conductor 214 of the conductor layer B overlap. Therefore, the case of FIG. 12C illustrates that the entire planar conductor 213 of the conductor layer A and the entire planar conductor 214 of the conductor layer B overlap. In the case of the first configuration example, the entire planar conductor 213 of the conductor layer A and the entire planar conductor 214 of the conductor layer B overlap. Therefore, the hot carrier light emission from the active element group 167 can be reliably shielded.

Figure 13:
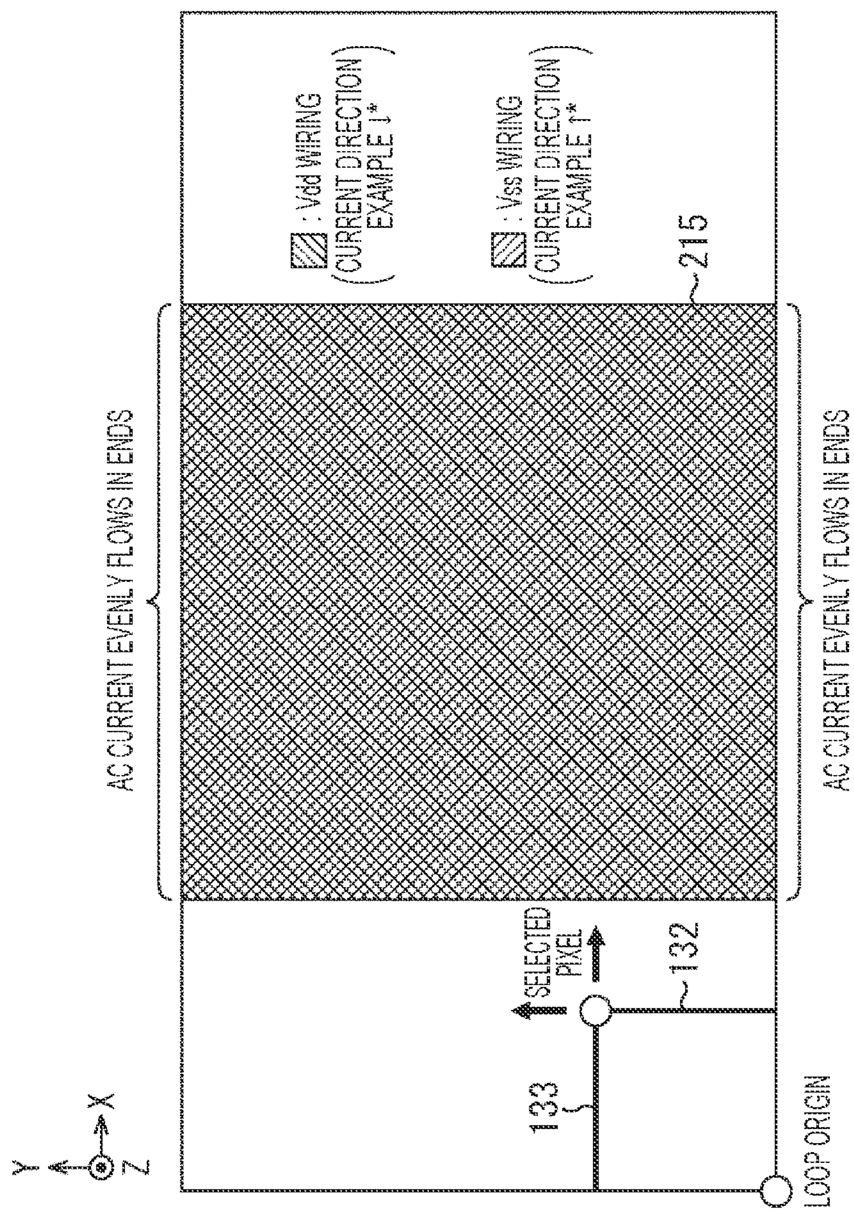
FIG. 13 is a diagram illustrating a current condition of a current flowing in the first configuration example.

FIG. 13 is a diagram illustrating the current condition of the current flowing in the first configuration example (FIGS. 12A, 12B, and 12C).

It is assumed that AC current evenly flows in ends of the planar conductor 213 constituting the conductor layer A and the planar conductor 214 constituting the conductor layer B. However, the current direction changes with time. For example, when the current flows through the planar conductor 214 that is the Vdd wiring from the upper side to the lower side of the drawing, the current flows through the planar conductor 213 that is the Vss wiring from the lower side to the upper side of the drawing.

In the first configuration example, in a case where the current flows as illustrated in FIG. 13, magnetic fluxes in a substantially X direction and a substantially Y direction are likely to be generated between the planar conductor 213 that is the Vss wiring and the planar conductor 214 that is the Vdd wiring by a conductor loop with a loop plane approximately perpendicular to the X axis and a conductor loop with a loop plane approximately perpendicular to the Y axis, the conductor loops being generated including (cross sections of) the planar conductors 213 and 214 in a cross section where the planar conductors 213 and 214 are arranged.

Meanwhile, the Victim conductor loop formed using the signal line 132 and the control line 133 is formed in the XY plane, as illustrated in FIG. 13, in the pixel array 121 of the first semiconductor substrate 101 stacked on the second semiconductor substrate 102 in which the light-shielding structure 151 formed using the conductor layers A and B is formed. In the Victim conductor loop formed on the XY plane, the induced electromotive force is likely to be generated by the magnetic flux in the Z-axis direction, and an image output from the solid-state imaging device 100 further deteriorates (the inductive noise increases) as a change in the induced electromotive force is larger.

Moreover, when the effective dimensions of the Victim conductor loop formed using the signal line 132 and the control line 133 are changed due to movement of selected pixels in the pixel array 121, the change in the induced electromotive force becomes remarkable.

In the case of the first configuration example, the direction (approximately X direction or approximately Y direction) of the magnetic flux generated from the loop plane of the Aggressor conductor loop of the light-shielding structure 151 formed using the conductor layers A and B and the direction (Z direction) of the magnetic flux to generate the induced electromotive force in the Victim conductor loop are substantially orthogonal and differ by approximately 90 degrees. In other words, the direction of the loop plane where the magnetic flux is generated from the Aggressor conductor loop and the direction of the loop plane where the induced electromotive force is generated in the Victim conductor loop differ by approximately 90 degrees. Therefore, it is expected that the deterioration (generation of inductive noise) of the image output from the solid-state imaging device 100 is less than that in the case of the first comparative example.

Figures 14A, 14B, 14C:
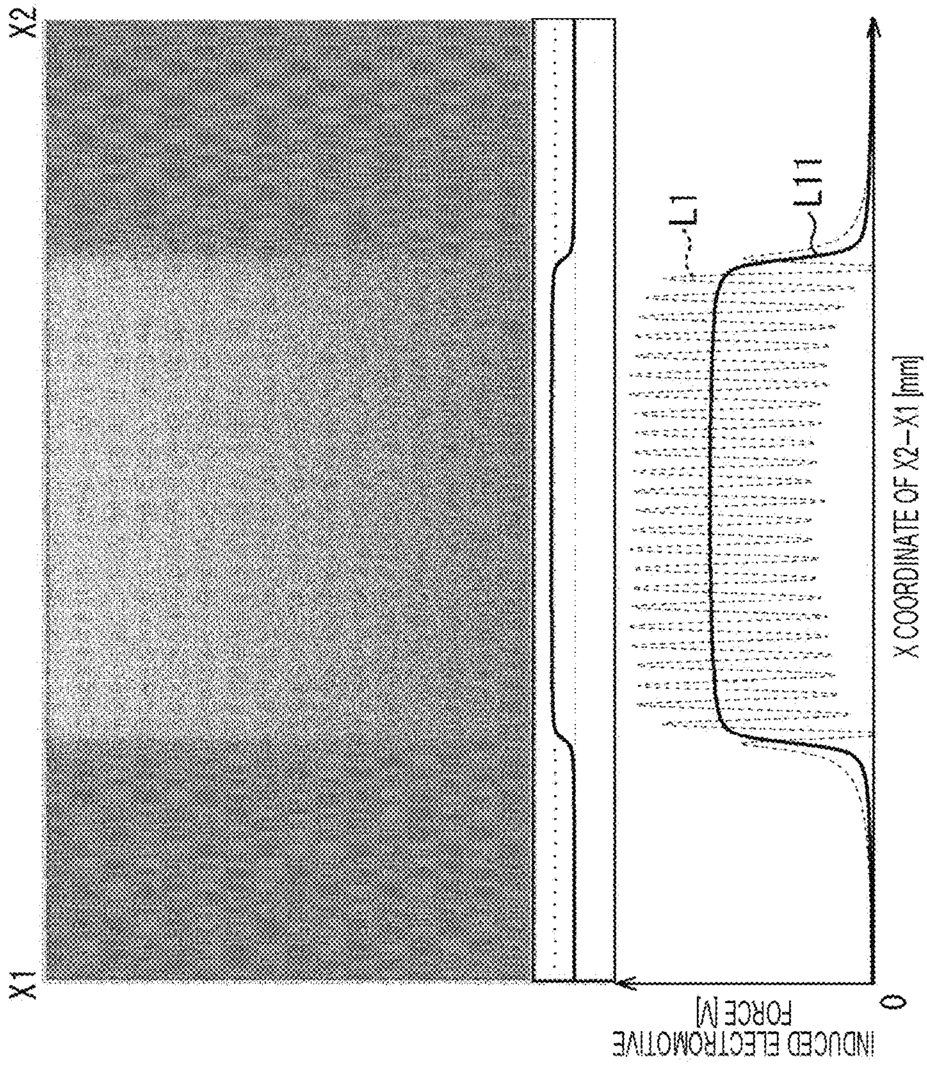
FIGS. 14A, 14B, and 14C are diagrams illustrating a simulation result of inductive noise corresponding to the first configuration example.

FIGS. 14A, 14B, and 14C illustrate a simulation result of the inductive noise generated in the case where the first configuration example (FIGS. 12A, 12B, and 12C) is applied to the solid-state imaging device 100.

FIG. 14A illustrates an image in which the inductive noise can be generated, the image being output from the solid-state imaging device 100. FIG. 14B illustrates a change in a pixel signal in the line segment X1-X2 of the image illustrated in FIG. 14C. FIG. 14C illustrates the solid line L11 representing induced electromotive force that generates the inductive noise in the image. The horizontal axis of FIG. 14C represents X-axis coordinates of the image, and the vertical axis represents the magnitude of the induced electromotive force. Note that the dotted line L1 in FIG. 14C corresponds to the first comparative example (FIGS. 9A 9B, and 9C).

As is clear from the comparison between the solid line L11 and the dotted line L1 illustrated in FIG. 14C, the first configuration example can suppress a change in the induced electromotive force to be generated in the Victim conductor loop as compared with the first comparative example. Therefore, generation of the inductive noise in the image output from the solid-state imaging device 100 can be suppressed.

Second Configuration Example

Figure 15A:
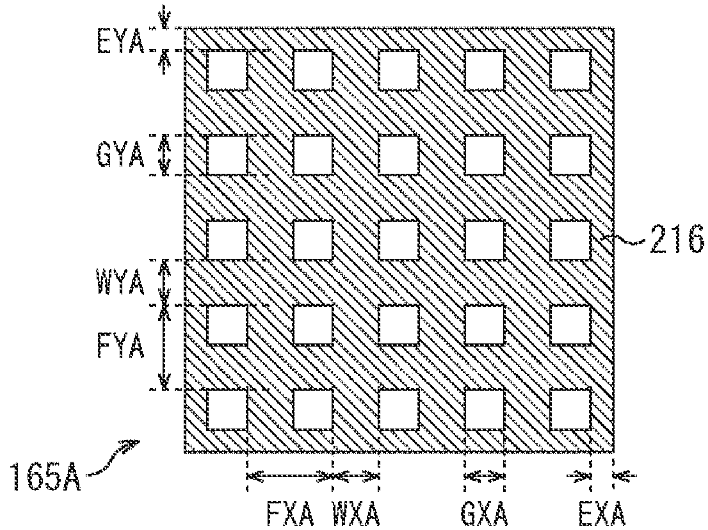
FIGS. 15A, 15B, and 15C are diagrams illustrating a second configuration example of the conductor layers A and B.
Figure 15B:
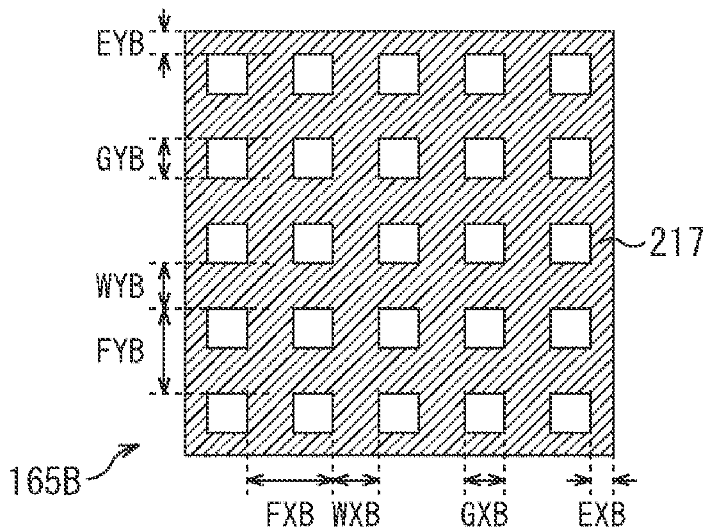
Figure 15C:
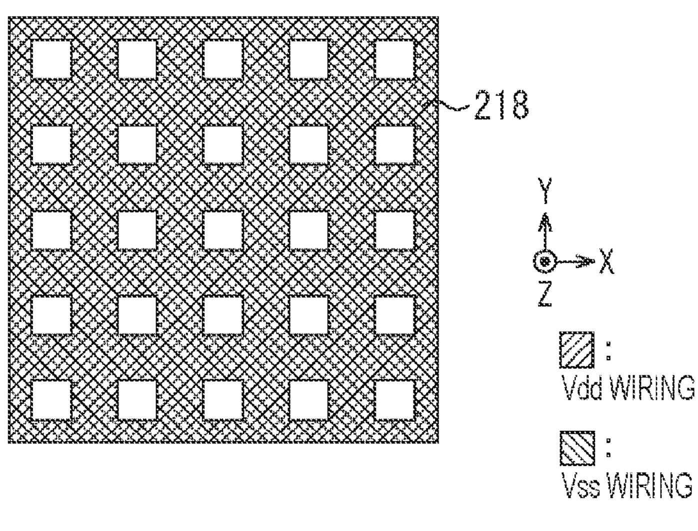

FIGS. 15A, 15B, and 15C illustrate a second configuration example of the conductor layers A and B. Note that FIG. 15A illustrates the conductor layer A, and FIG. 15B illustrates the conductor layer B. In the coordinate system in FIGS. 15A 15B, and 15C, the horizontal direction is the X axis, the vertical direction is the Y axis, and the direction perpendicular to the XY plane is the Z axis.

The conductor layer A in the second configuration example is configured by a reticulated conductor 216. The conductor width in the X direction of the reticulated conductor 216 is WXA, the gap width is GXA, the conductor period is FXA (=the conductor width WXA+the gap width GXA), and an end width is EXA (=the conductor width WXA/2). Furthermore, the conductor width in the Y direction of the reticulated conductor 216 is WYA, the gap width is GYA, the conductor period is FYA (=the conductor width WYA+the gap width GYA), and the end width is EYA (=the conductor width WYA/2). The reticulated conductor 216 is, for example, wiring (Vss wiring) connected to the GND or the negative power supply.

The conductor layer B in the second configuration example is configured by a reticulated conductor 217. The conductor width in the X direction of the reticulated conductor 217 is WXB, the gap width is GXB, the conductor period is FXB (=the conductor width WXB+the gap width GXB), and the end width is EXB (=the conductor width WXB/2). Furthermore, the conductor width in the Y direction of the reticulated conductor 217 is WYB, the gap width is GYB, the conductor period is FYB (=the conductor width WYB+the gap width GYB), and the end width is EYB (=the conductor width WYB/2). The reticulated conductor 217 is, for example, wiring (Vdd wiring) connected to the positive power supply.

Note that the reticulated conductor 216 and the reticulated conductor 217 desirably satisfy the following relationship.

The conductor width WXA=the conductor width WYA=the conductor width WXB=the conductor width WYB The gap width GXA=the gap width GYA=the gap width GXB=the gap width GYB The end width EXA=the end width EYA=the end width EXB=the end width EYB The conductor period FXA=the conductor period FYA=the conductor period FXB=the conductor period FYB FIG. 15C illustrates a state of the conductor layers A and B respectively illustrated in FIGS. 15A and 15B, which are viewed from the photodiode 141 side (back surface side). Note that a hatched region 218 in FIG. 15C where diagonal lines intersect represents a region where the reticulated conductor 216 of the conductor layer A and the reticulated conductor 217 of the conductor layer B overlap. In the case of the second configuration example, since the gaps of the reticulated conductor 216 forming the conductor layer A and the gaps of the reticulated conductor 217 forming the conductor layer B match, the hot carrier light emission from the active element group 167 cannot be sufficiently shielded. However, as will be described below, generation of the inductive noise can be suppressed.

Figure 16:
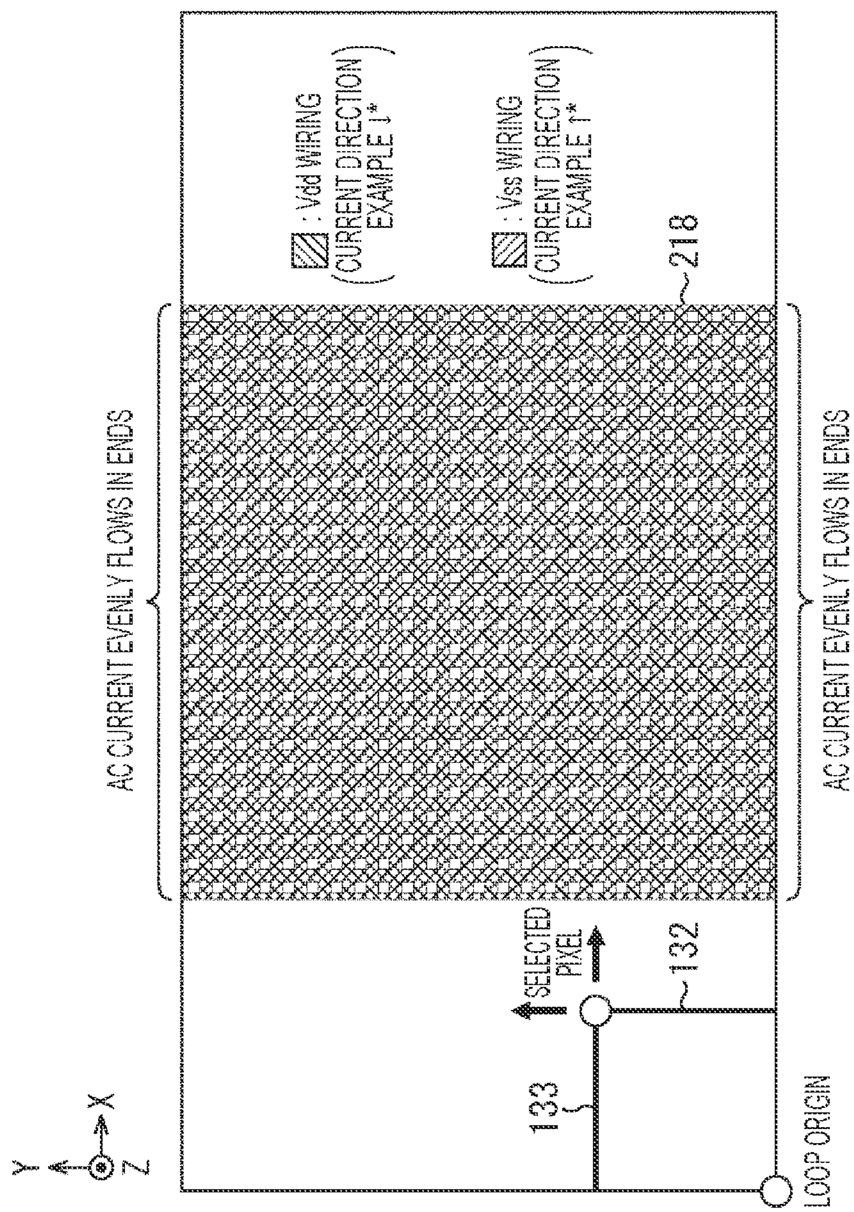
FIG. 16 is a diagram illustrating a current condition of a current flowing in the second configuration example.

FIG. 16 is a diagram illustrating the current condition of the current flowing in the second configuration example (FIGS. 15A, 15B, and 15C).

It is assumed that AC current evenly flows in ends of the reticulated conductor 216 constituting the conductor layer A and the reticulated conductor 217 constituting the conductor layer B. However, the current direction changes with time. For example, when the current flows through the reticulated conductor 217 that is the Vdd wiring from the upper side to the lower side of the drawing, the current flows through the reticulated conductor 216 that is the Vss wiring from the lower side to the upper side of the drawing.

In the second configuration example, in a case where the current flows as illustrated in FIG. 16, the magnetic fluxes in the substantially X direction and the substantially Y direction are likely to be generated between the reticulated conductor 216 that is the Vss wiring and the reticulated conductor 217 that is the Vdd wiring by the conductor loop with the loop plane approximately perpendicular to the X axis and the conductor loop with the loop plane approximately perpendicular to the Y axis, the conductor loops being generated including (cross sections of) the reticulated conductors 216 and 217 in a cross section where the reticulated conductors 216 and 217 are arranged.

Meanwhile, the Victim conductor loop formed using the signal line 132 and the control line 133 is formed in the XY plane, as illustrated in FIG. 16, in the pixel array 121 of the first semiconductor substrate 101 stacked on the second semiconductor substrate 102 in which the light-shielding structure 151 formed using the conductor layers A and B is formed. In the Victim conductor loop formed on the XY plane, the induced electromotive force is likely to be generated by the magnetic flux in the Z direction, and an image output from the solid-state imaging device 100 further deteriorates (the inductive noise increases) as a change in the induced electromotive force is larger.

Moreover, when the effective dimensions of the Victim conductor loop formed using the signal line 132 and the control line 133 are changed due to movement of selected pixels in the pixel array 121, the change in the induced electromotive force becomes remarkable.

In the case of the second configuration example, the direction (approximately X direction or approximately Y direction) of the magnetic flux generated from the loop plane of the Aggressor conductor loop of the light-shielding structure 151 formed using the conductor layers A and B and the direction (Z direction) of the magnetic flux to generate the induced electromotive force in the Victim conductor loop are substantially orthogonal and differ by approximately 90 degrees. In other words, the direction of the loop plane where the magnetic flux is generated from the Aggressor conductor loop and the direction of the loop plane where the induced electromotive force is generated in the Victim conductor loop differ by approximately 90 degrees. Therefore, it is expected that the deterioration (generation of inductive noise) of the image output from the solid-state imaging device 100 is less than that in the first comparative example.

Figures 17A, 17B, 17C:
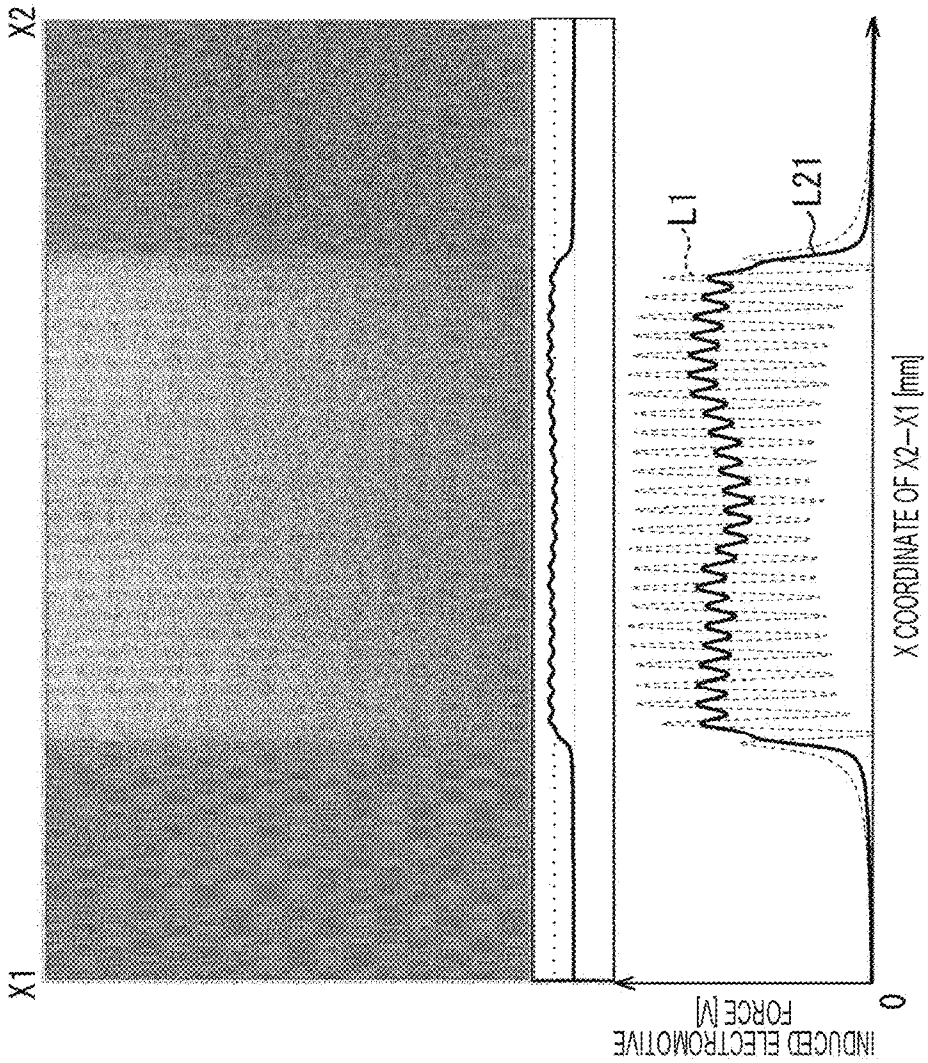
FIGS. 17A, 17B, and 17C are diagrams illustrating a simulation result of inductive noise corresponding to the second configuration example.

FIGS. 17A, 17B, and 17C illustrate a simulation result of the inductive noise generated in the case where the second configuration example (FIGS. 15A, 15B, and 15C) is applied to the solid-state imaging device 100.

FIG. 17A illustrates an image in which the inductive noise can be generated, the image being output from the solid-state imaging device 100. FIG. 17B illustrates a change in a pixel signal in the line segment X1-X2 of the image illustrated in FIG. 17A. FIG. 17C illustrates the solid line L21 representing induced electromotive force that generates the inductive noise in the image. The horizontal axis of FIG. 17C represents X-axis coordinates of the image, and the vertical axis represents the magnitude of the induced electromotive force. Note that the dotted line L1 in FIG. 17C corresponds to the first comparative example (FIGS. 9A, 9B, and 9C).

As is clear from the comparison between the solid line L21 and the dotted line L1 illustrated in FIG. 17C, the second configuration example can suppress a change in the induced electromotive force to be generated in the Victim conductor loop as compared with the first comparative example. Therefore, generation of the inductive noise in the image output from the solid-state imaging device 100 can be suppressed.

Second Comparative Example

In the second configuration example (FIGS. 15A, 15B, and 15C), as the relationship between the reticulated conductor 216 forming the conductor layer A and the reticulated conductor 217 forming the conductor layer B, the conductor period FXA=the conductor period FYA=the conductor period FXB=the conductor period FYB is satisfied.

In this way, when the conductor period FXA in the X direction of the conductor layer A, the conductor period FYA in the Y direction of the conductor layer A, the conductor period FXB in the X direction of the conductor layer B, and the conductor period FYB in the X direction of the conductor layer B are caused to match, generation of the inductive noise can be suppressed.

Figure 18A:
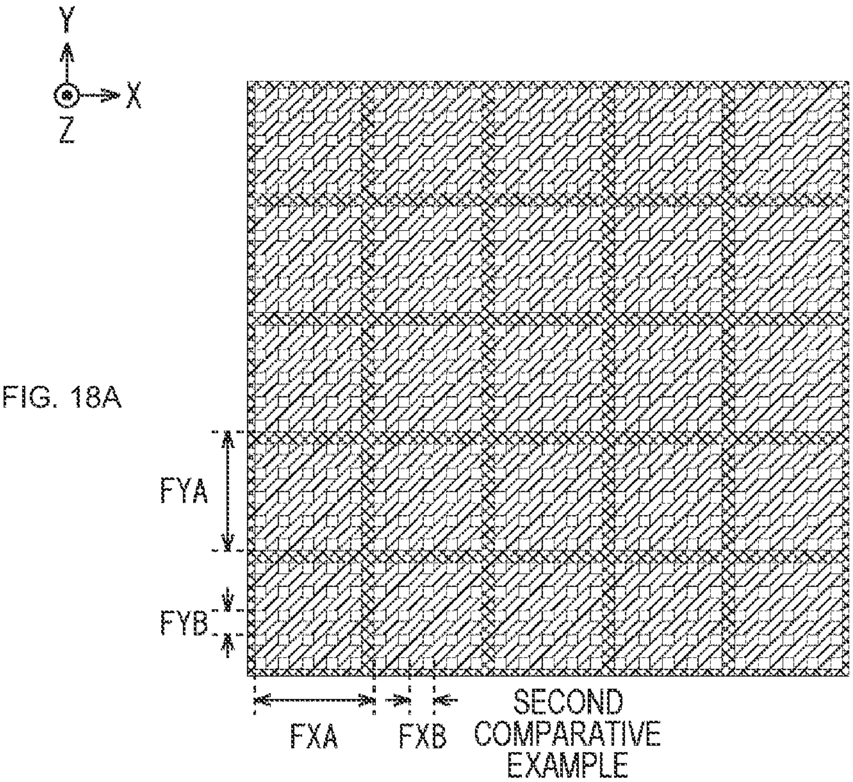
FIGS. 18A and 18B are diagrams illustrating a second comparative example of the conductor layers A and B.
Figure 18B:
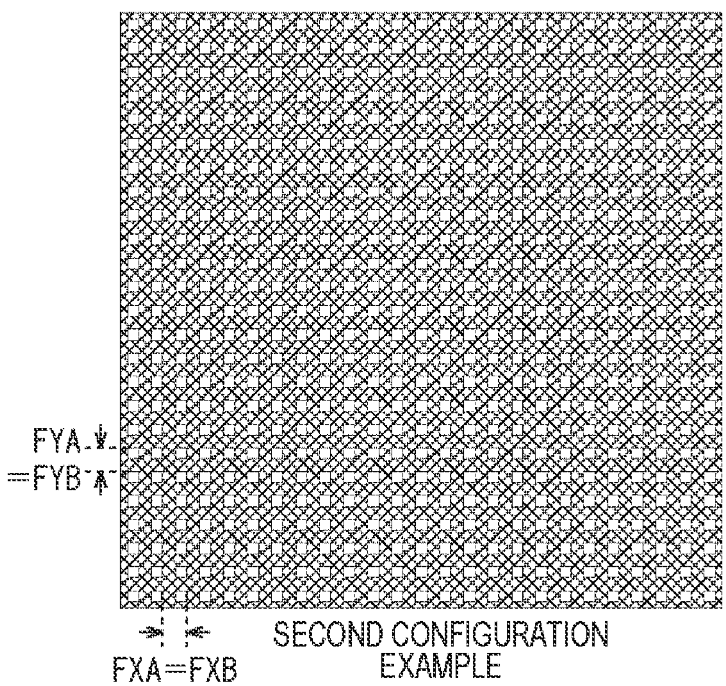
Figure 19:
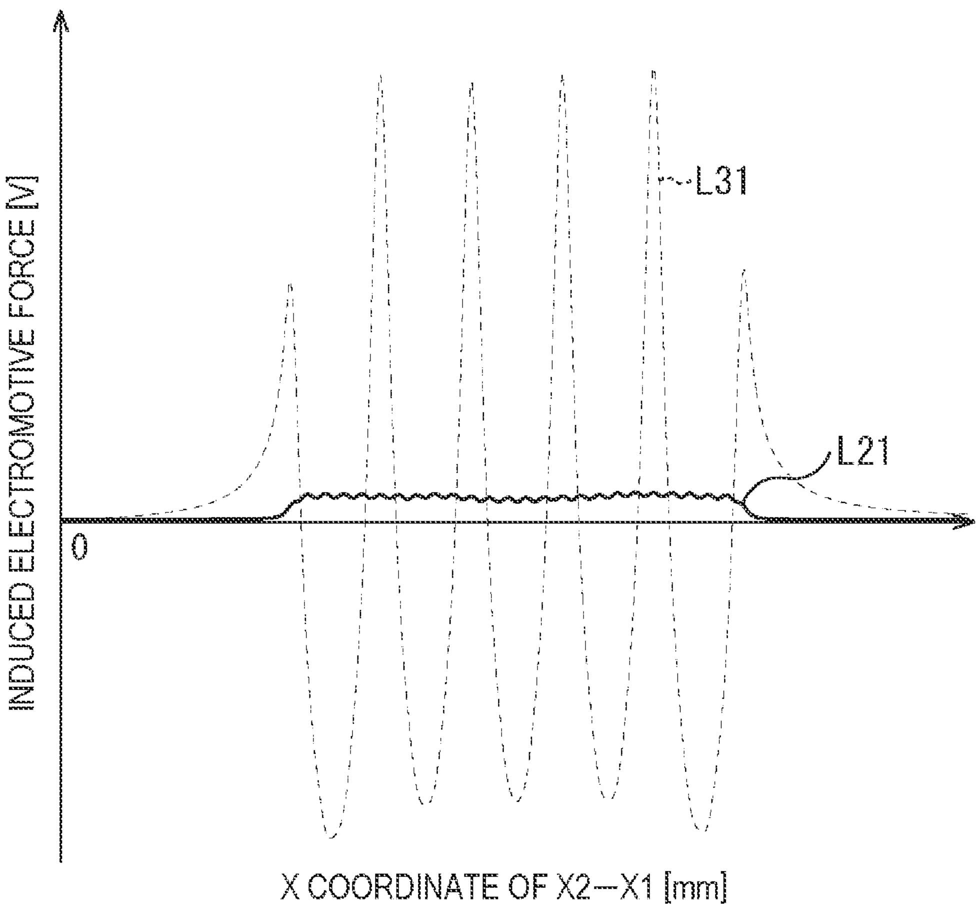
FIG. 19 is a diagram illustrating a simulation result of inductive noise corresponding to the second comparative example.

FIGS. 18A, 18B, and 19 are diagrams for describing that generation of the inductive noise can be suppressed by matching all the conductor periods of the conductor layer A and the conductor layer B.

FIG. 18A illustrates a second comparative example that is a modified second configuration example for comparison with the second configuration example illustrated in FIGS. 15A, 15B, and 15C. In the second comparative example, the gap width GXA in the X direction and the gap width GYA in the Y direction of the reticulated conductor 216 forming the conductor layer A in the second configuration example are widened, and the conductor period FXA in the X direction and the conductor period FYA in the Y direction are changed by a factor of 5 of the second configuration example. Note that the reticulated conductor 217 forming the conductor layer B in the second comparative example is the same as that in the second configuration example.

FIG. 18B illustrates the second configuration example illustrated in-C in FIG. 15C by the same magnification as FIG. 18A.

Figure 180B:
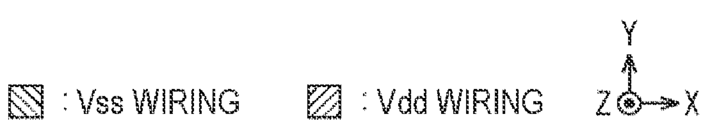

FIG. 19 illustrates a change in the induced electromotive force that causes the inductive noise in an image, as a simulation result of a case where the second comparative example (FIG. 18A) and the second configuration example (B in FIG. 180) are applied to the solid-state imaging device 100. Note that the current condition of the current flowing in the second comparative example is similar to that in the case illustrated in FIG. 16. The horizontal axis in FIG. 19 represents X-axis coordinates of the image, and the vertical axis represents the magnitude of the induced electromotive force.

The solid line L21 in FIG. 19 corresponds to the second configuration example, and the dotted line L31 corresponds to the second comparative example.

As is clear from the comparison of the solid line L21 and the dotted line L31, it can be seen that the second configuration example can suppress the change in the induced electromotive force to be generated in the Victim conductor loop as compared with the second comparative example, and can suppress the inductive noise.

Third Comparative Example

By the way, generation of the inductive noise can also be suppressed even in a case where the conductor width of the reticulated conductor forming the conductor layer A in the second comparative example is expanded.

Figure 20A:
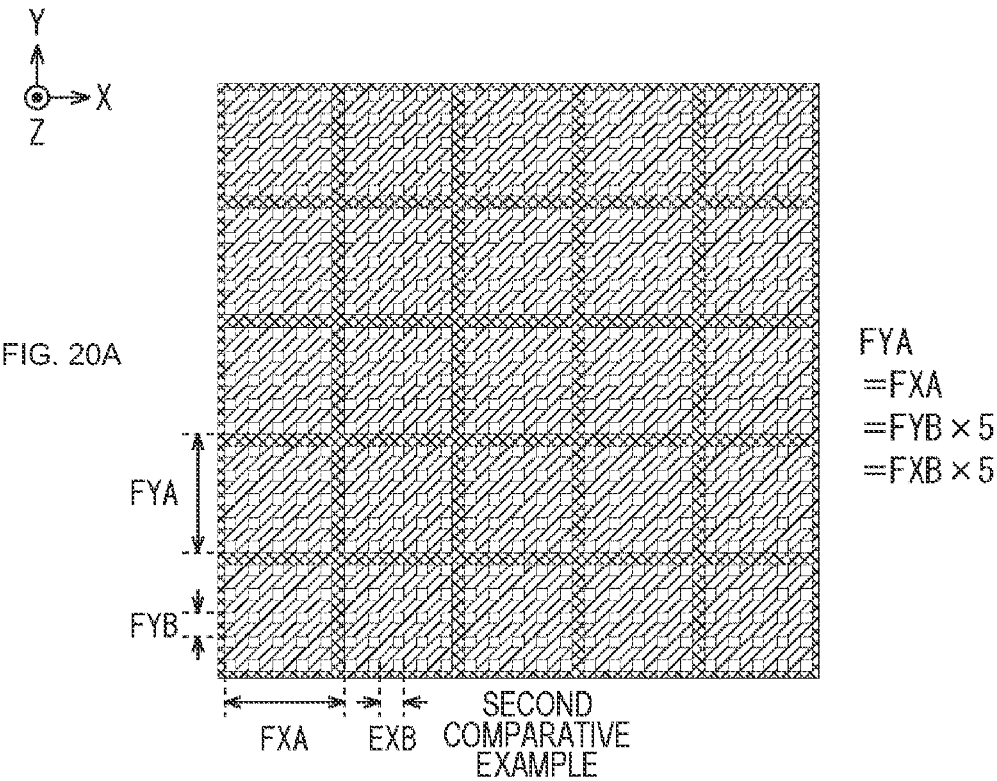
FIGS. 20A and 20B are diagrams illustrating a third comparative example of the conductor layers A and B.
Figure 20B:
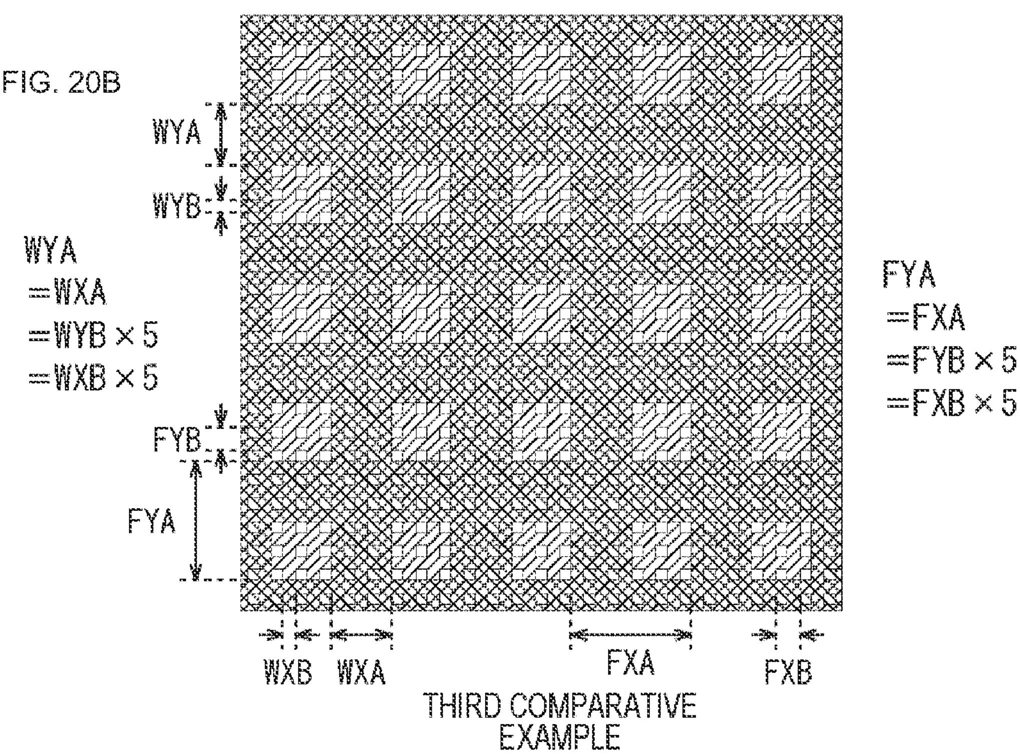
Figure 21:
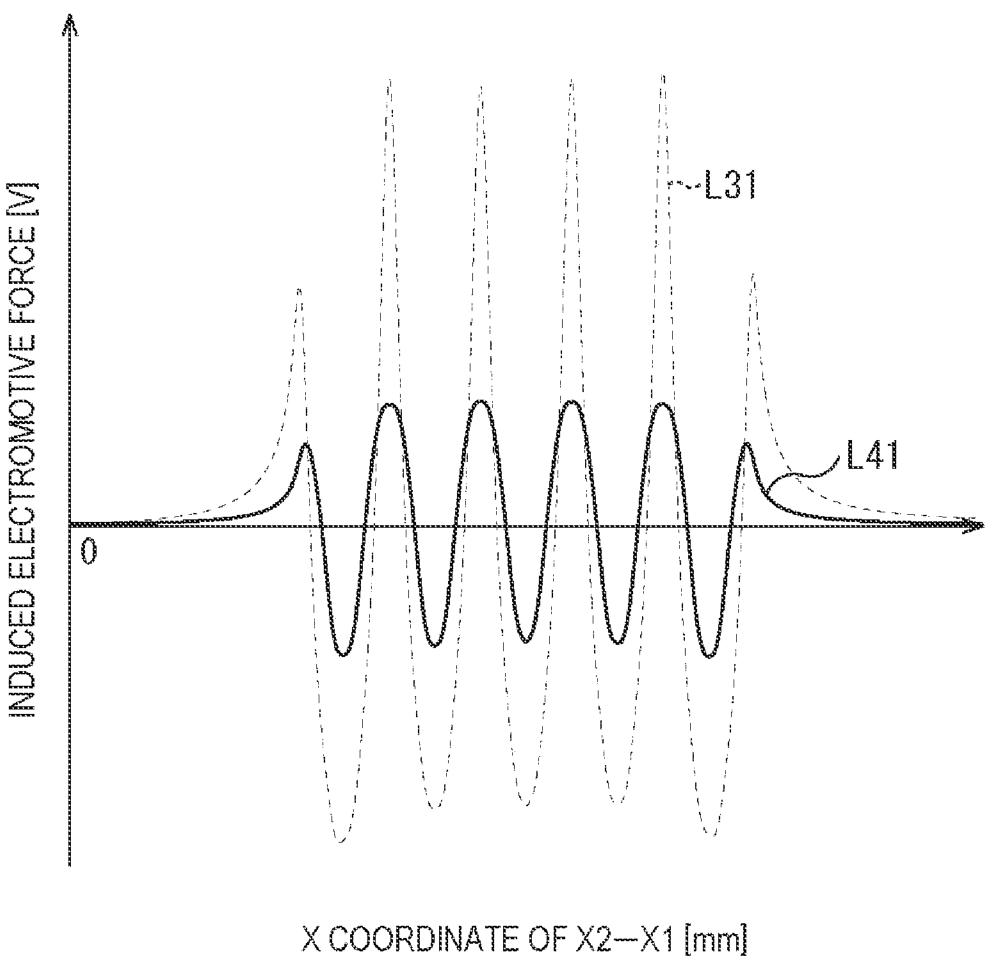
FIG. 21 is a diagram illustrating a simulation result of inductive noise corresponding to the third comparative example.

FIGS. 20A, 20B, and 21 are diagrams for describing that generation of the inductive noise can be suppressed by expanding the conductor width of the reticulated conductor forming the conductor layer A.

FIG. 20A is a re-illustration of the second comparative example illustrated in FIG. 18A.

FIG. 20B illustrates a third comparative example that is a modified second configuration example for comparison with the second comparative example. In the third comparative example, the conductor widths WXA and WYA in the X direction and the Y direction of the reticulated conductor 216 forming the conductor layer A in the second configuration example are expanded by a factor of 5 of the second configuration example. Note that the reticulated conductor 217 forming the conductor layer B in the third comparative example is the same as that in the second configuration example.

FIG. 21 illustrates a change in the induced electromotive force that causes the inductive noise in an image, as a simulation result of a case where the third comparative example and the second comparative example are applied to the solid-state imaging device 100. Note that the current condition of the current flowing in the third comparative example is similar to that in the case illustrated in FIG. 16. The horizontal axis in FIG. 21 represents X-axis coordinates of the image, and the vertical axis represents the magnitude of the induced electromotive force.

The solid line L41 in FIG. 21 corresponds to the third comparative example, and the dotted line L31 corresponds to the second comparative example.

As is clear from the comparison of the solid line L41 and the dotted line L31, it can be seen that the third comparative example can suppress the change in the induced electromotive force to be generated in the Victim conductor loop as compared with the second comparative example, and can suppress the inductive noise.

Third Configuration Example

Figure 22A:
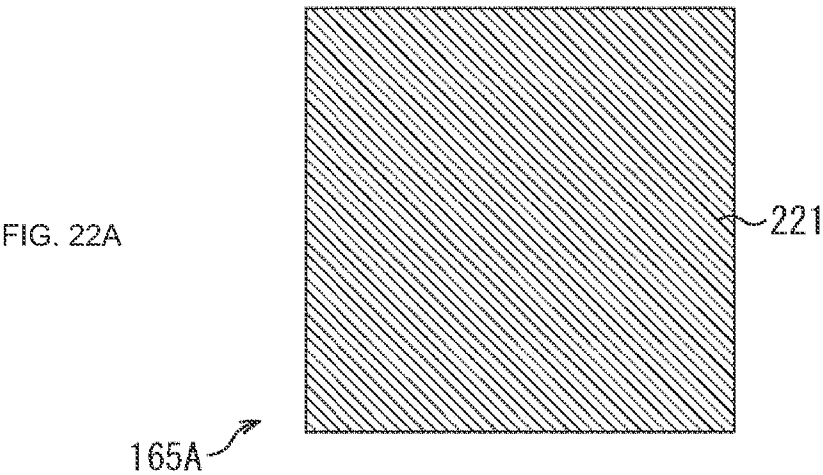
FIGS. 22A, 22B, and 22C diagrams illustrating a third configuration example of the conductor layers A and B.
Figure 22B:
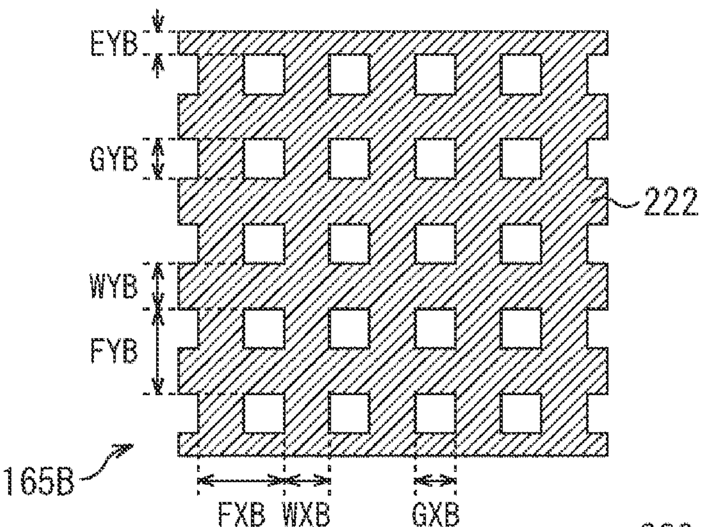
Figure 22C:
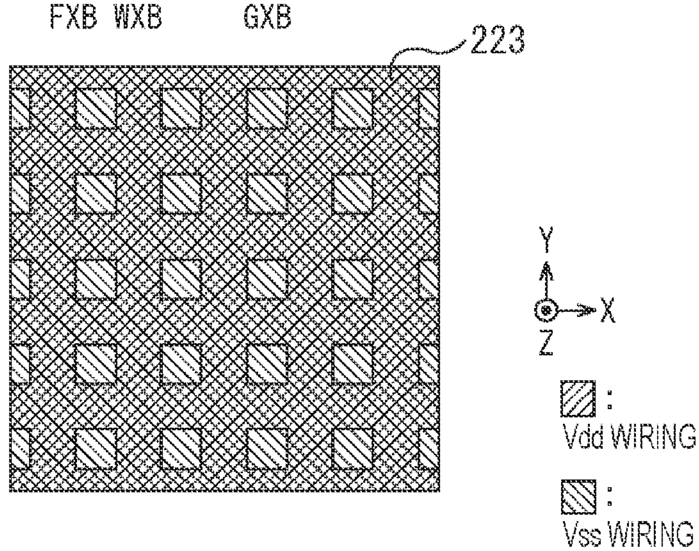

Next, FIGS. 22A, 22B, and 22C illustrate a third configuration example of the conductor layers A and B. Note that FIG. 22A illustrates the conductor layer A, and FIG. 22B illustrates the conductor layer B. In the coordinate system in FIGS. 22A, 22B, and 22C, the horizontal direction is the X axis, the vertical direction is the Y axis, and the direction perpendicular to the XY plane is the Z axis.

The conductor layer A in the third configuration example is configured by a planar conductor 221. The planar conductor 221 is, for example, wiring (Vss wiring) connected to the GND or the negative power supply.

The conductor layer B in the third configuration example is configured by a reticulated conductor 222. The conductor width in the X direction of the reticulated conductor 222 is WXB, the gap width is GXB, and the conductor period is FXB (=the conductor width WXB+the gap width GXB). Furthermore, the conductor width in the Y direction of the reticulated conductor 222 is WYB, the gap width is GYB, the conductor period is FYB (=the conductor width WYB+ the gap width GYB), and the end width is EYB. The reticulated conductor 222 is, for example, wiring (Vdd wiring) connected to the positive power supply.

Note that the reticulated conductor 222 desirably satisfies the following relationship.

The conductor width WXB=the conductor width WYB

The gap width GXB=the gap width GYB

The end width EYB=the conductor width WYB/2

The conductor period FXB=the conductor period FYB

By adjusting the conductor widths, conductor periods, and gap widths in the X direction and the Y direction as described above, wiring resistance and wiring impedance of the reticulated conductor 222 become uniform in the X direction and the Y direction. Therefore, magnetic field resistance and voltage drop can be made uniform in the X direction and the Y direction.

Furthermore, by setting the end width EYB to ½ of the conductor width WYB, the induced electromotive force generated in the Victim conductor loop by the magnetic field generated around the end of the reticulated conductor 222 can be suppressed.

FIG. 22C illustrates a state of the conductor layers A and B respectively illustrated in FIGS. 22A and 22B, which are viewed from the photodiode 141 side (back surface side). Note that a hatched region 223 where diagonal lines intersect in FIG. 22C represents a region where the planar conductor of the conductor layer A and the reticulated conductor 222 of the conductor layer B overlap. In the case of the third configuration example, since the active element group is covered with at least one of the conductor layer A or the conductor layer B, the hot carrier light emission from the active element group 167 can be shielded.

Figure 23:
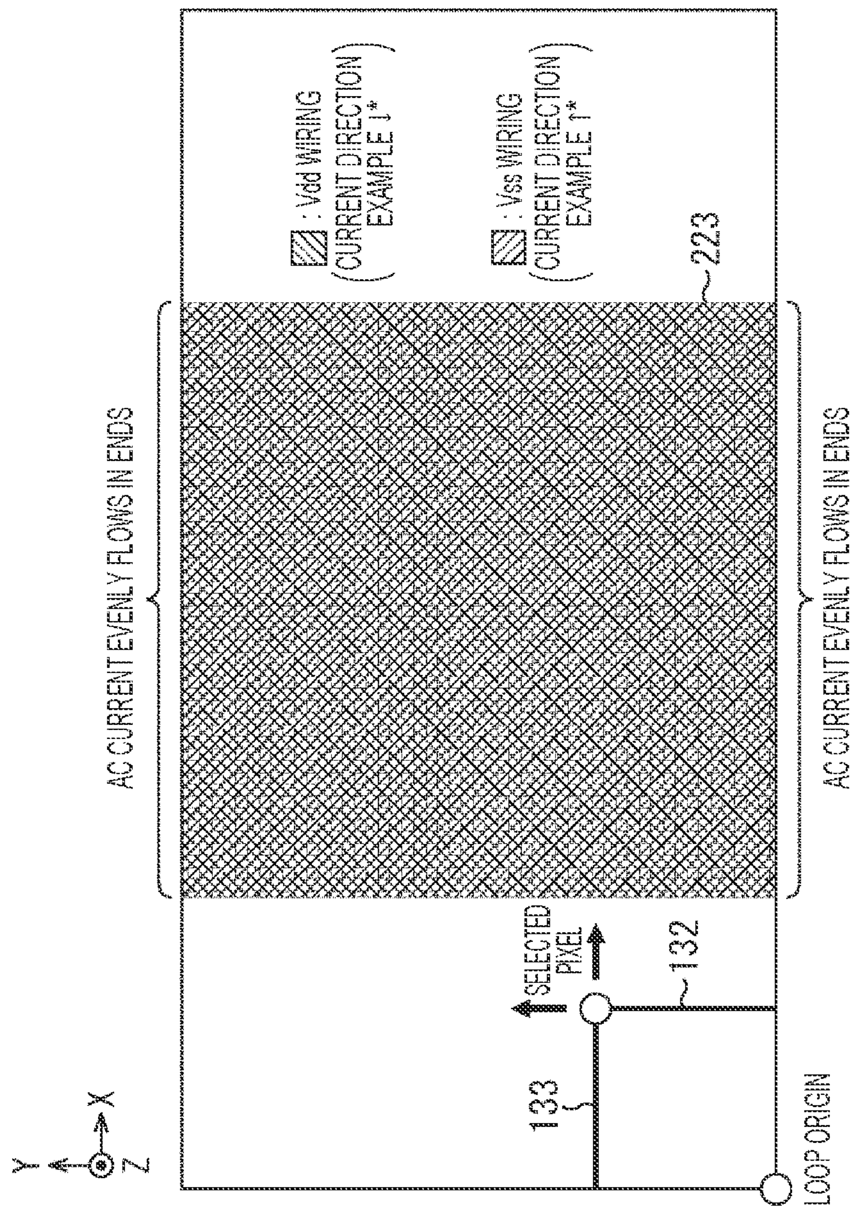
FIG. 23 is a diagram illustrating a current condition of a current flowing in the third configuration example.

FIG. 23 is a diagram illustrating the current condition of the current flowing in the third configuration example (FIGS. 22A, 22B, and 22C).

It is assumed that AC current evenly flows in ends of the planar conductor 221 constituting the conductor layer A and the reticulated conductor 222 constituting the conductor layer B. However, the current direction changes with time. For example, when the current flows through the reticulated conductor 222 that is the Vdd wiring from the upper side to the lower side of the drawing, the current flows through the planar conductor 221 that is the Vss wiring from the lower side to the upper side of the drawing.

In the third configuration example, in a case where the current flows as illustrated in FIG. 23, the magnetic fluxes in the substantially X direction and the substantially Y direction are likely to be generated between the planar conductor 221 that is the Vss wiring and the reticulated conductor 222 that is the Vdd wiring by the conductor loop with the loop plane approximately perpendicular to the X axis and the conductor loop with the loop plane approximately perpendicular to the Y axis, the conductor loops being generated including (cross sections of) the planar conductor 221 and the reticulated conductor 222 in a cross section where the planar conductor 221 and the reticulated conductor 222 are arranged.

Meanwhile, the Victim conductor loop formed using the signal line 132 and the control line 133 is formed in the XY plane in the pixel array 121 of the first semiconductor substrate 101 stacked on the second semiconductor substrate 102 in which the light-shielding structure 151 formed using the conductor layers A and B is formed. In the Victim conductor loop formed on the XY plane, the induced electromotive force is likely to be generated by the magnetic flux in the Z direction, and an image output from the solid-state imaging device 100 further deteriorates (the inductive noise increases) as a change in the induced electromotive force is larger.

Moreover, when the effective dimensions of the Victim conductor loop formed using the signal line 132 and the control line 133 are changed due to movement of selected pixels in the pixel array 121, the change in the induced electromotive force becomes remarkable.

In the case of the third configuration example, the direction (approximately X direction or approximately Y direction) of the magnetic flux generated from the loop plane of the Aggressor conductor loop of the light-shielding structure 151 formed using the conductor layers A and B and the direction (Z direction) of the magnetic flux to generate the induced electromotive force in the Victim conductor loop are substantially orthogonal and differ by approximately 90 degrees. In other words, the direction of the loop plane where the magnetic flux is generated from the Aggressor conductor loop and the direction of the loop plane where the induced electromotive force is generated in the Victim conductor loop differ by approximately 90 degrees. Therefore, it is expected that the deterioration (generation of inductive noise) of the image output from the solid-state imaging device 100 is less than that in the first comparative example.

Figures 24A, 24B, 24C:
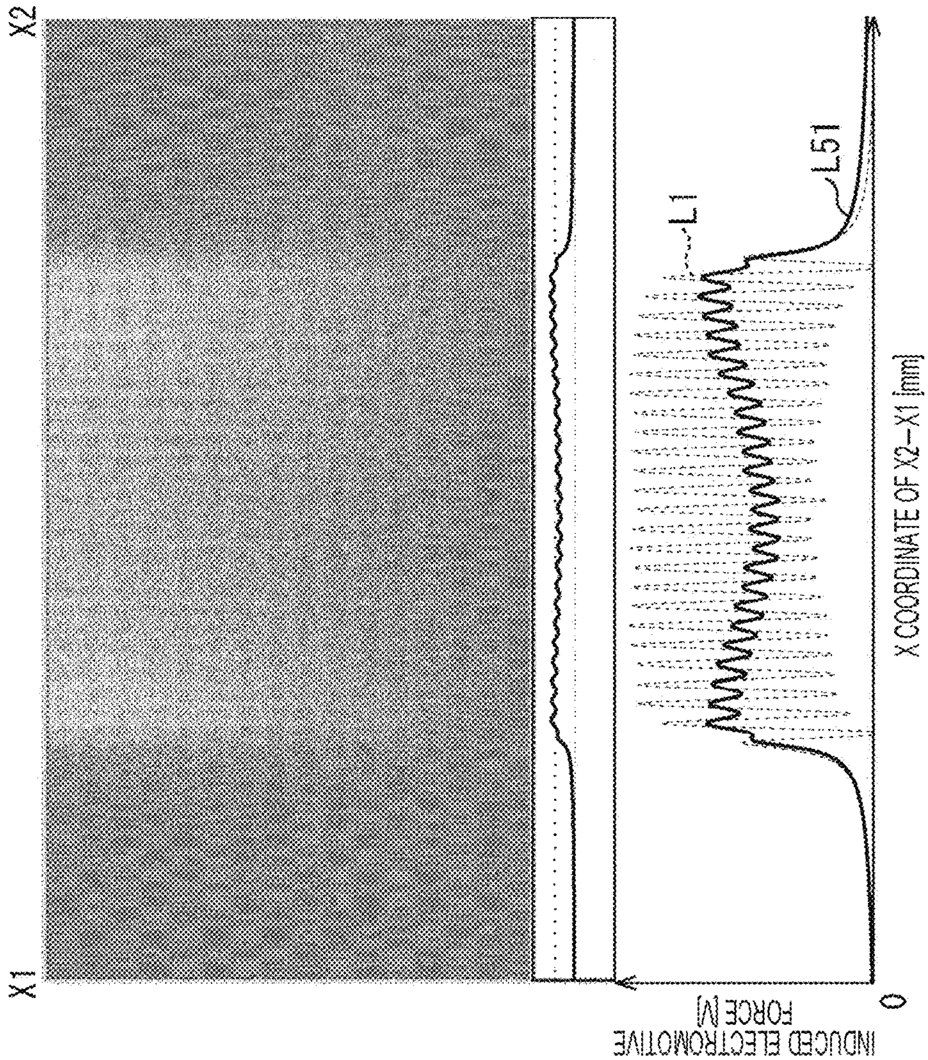
FIGS. 24A, 24B, and 24C are diagrams illustrating a simulation result of inductive noise corresponding to the third configuration example.

FIGS. 24A, 24B, and 24C illustrate a simulation result of the inductive noise generated in the case where the third configuration example (FIGS. 22A, 22B, and 22C) is applied to the solid-state imaging device 100.

FIG. 24A illustrates an image in which the inductive noise can be generated, the image being output from the solid-state imaging device 100. FIG. 24B illustrates a change in a pixel signal in the line segment X1-X2 of the image illustrated in FIG. 24A. FIG. 24C illustrates the solid line L51 representing induced electromotive force that generates the inductive noise in the image. The horizontal axis of FIG. 24C represents X-axis coordinates of the image, and the vertical axis represents the magnitude of the induced electromotive force. Note that the dotted line L1 in FIG. 24C corresponds to the first comparative example (FIGS. 9A, 9B, and 9C).

As is clear from the comparison between the solid line L51 and the dotted line L1 illustrated in FIG. 24C, the third configuration example can suppress a change in the induced electromotive force to be generated in the Victim conductor loop as compared with the first comparative example. Therefore, generation of the inductive noise in the image output from the solid-state imaging device 100 can be suppressed.

Fourth Configuration Example

Figure 25A:
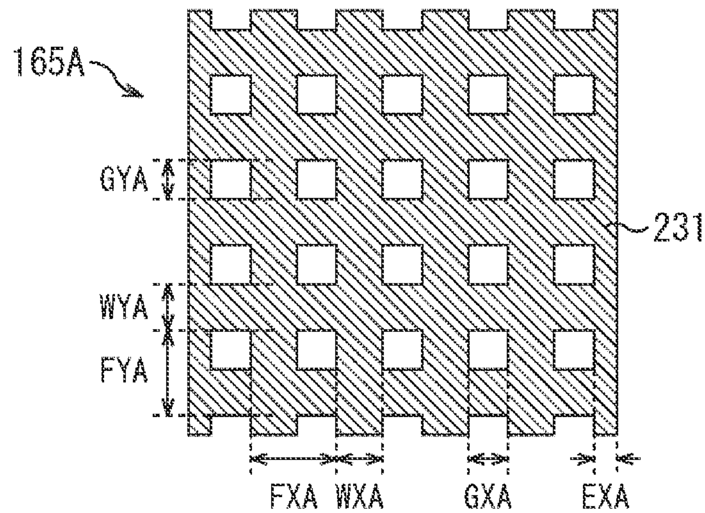
FIGS. 25A, 25B, and 25C are diagrams illustrating a fourth configuration example of the conductor layers A and B.
Figure 25B:
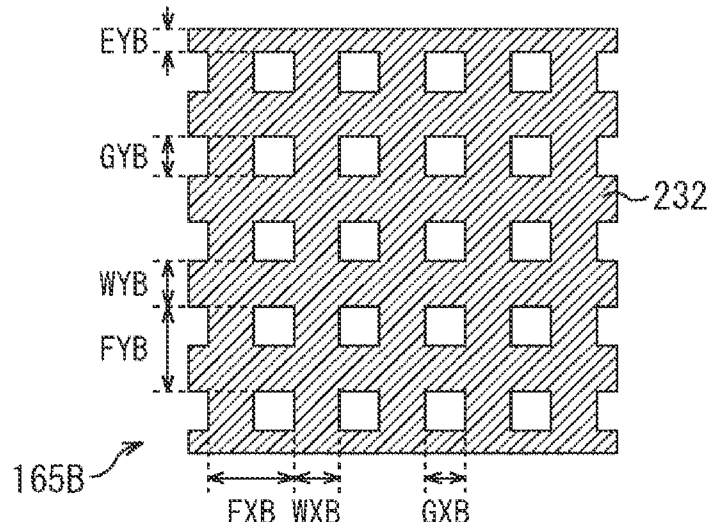
Figure 25C:
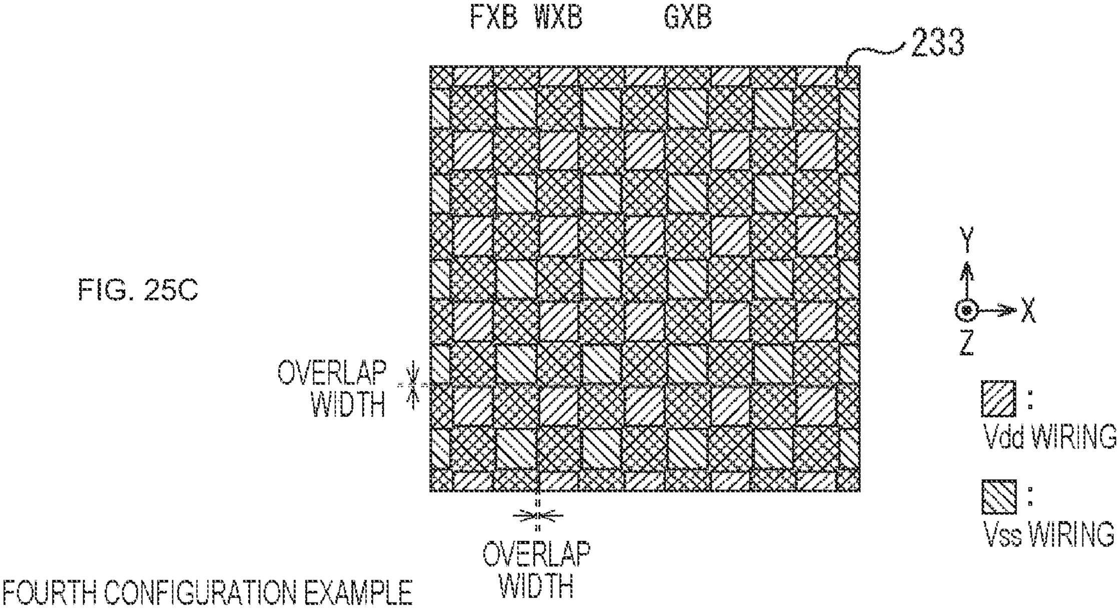

Next, FIGS. 25A, 25B, and 25C illustrate a fourth configuration example of the conductor layers A and B. Note that FIG. 25A illustrates the conductor layer A, and FIG.

25B illustrates the conductor layer B. In the coordinate system in FIGS. 25A, 25B, and 25C, the horizontal direction is the X axis, the vertical direction is the Y axis, and the direction perpendicular to the XY plane is the Z axis.

The conductor layer A in the fourth configuration example is configured by a reticulated conductor 231. The conductor width in the X direction of the reticulated conductor 231 is WXA, the gap width is GXA, the conductor period is FXA (=the conductor width WXA+the gap width GXA), and an end width is EXA (=the conductor width WXA/2). Furthermore, the conductor width in the Y direction of the reticulated conductor 231 is WYA, the gap width is GYA, and the conductor period is FYA (=the conductor width WYA+the gap width GYA). The reticulated conductor 231 is, for example, wiring (Vss wiring) connected to the GND or the negative power supply.

The conductor layer B in the fourth configuration example is configured by a reticulated conductor 232. The conductor width in the X direction of the reticulated conductor 232 is WXB, the gap width is GXB, and the conductor period is FXB (=the conductor width WXB+the gap width GXB). Furthermore, the conductor width in the Y direction of the reticulated conductor 232 is WYB, the gap width is GYB, the conductor period is FYB (=the conductor width WYB+the gap width GYB), and the end width is EYB (=the conductor width WYB/2). The reticulated conductor 232 is, for example, wiring (Vdd wiring) connected to the positive power supply.

Note that the reticulated conductor 231 and the reticulated conductor 232 desirably satisfy the following relationship.

The conductor width WXA=the conductor width WYA=the conductor width WXB=the conductor width WYB The gap width GXA=the gap width GYA=the gap width GXB=the gap width GYB The end width EXA=the end width EYB The conductor period FXA=the conductor period FYA=the conductor period FXB=the conductor period FYB The conductor width WYA=2×the overlap width+the gap width GYA, the conductor width WXA=2×the overlap width+the gap width GXA The conductor width WYB=2×the overlap width+the gap width GYB, the conductor width WXB=2×the overlap width+the gap width GXB Here, the overlap width is a width of an overlapping portion where the conductor portions overlap in a case where the reticulated conductor 231 of the conductor layer A and the reticulated conductor 232 of the conductor layer B are arranged to overlap each other.

As described above, by adjusting all the conductor periods of the reticulated conductor 231 and the reticulated conductor 232 in the X direction and the Y direction, a current distribution of the reticulated conductor 231 and a current distribution of the reticulated conductor 232 can be made substantially uniform and have opposite characteristics. Therefore, the magnetic field generated by the current distribution of the reticulated conductor 231 and the magnetic field generated by the current distribution of the reticulated conductor 232 can be effectively canceled.

Furthermore, by adjusting all the conductor periods, conductor widths, and gap widths of the reticulated conductor 231 and the reticulated conductor 232 in the X direction and the Y direction, the wiring resistance and wiring impedance of the reticulated conductor 231 and the reticulated conductor 232 become uniform in the X direction and the Y direction. Therefore, magnetic field resistance and voltage drop can be made uniform in the X direction and the Y direction.

Furthermore, by setting the end width EXA of the reticulated conductor 231 to ½ of the conductor width WXA, the induced electromotive force generated in the Victim conductor loop by the magnetic field generated around the end of the reticulated conductor 231 can be suppressed. Furthermore, by setting the end width EYB of the reticulated conductor 232 to ½ of the conductor width WYB, the induced electromotive force generated in the Victim conductor loop by the magnetic field generated around the end of the reticulated conductor 231 can be suppressed.

Note that instead of providing the end in the X direction of the reticulated conductor 231 of the conductor layer A, the end in the X direction of the reticulated conductor 232 of the conductor layer B may be provided. Furthermore, instead of providing the end in the Y direction of the reticulated conductor 232 of the conductor layer B, the end of the reticulated conductor 231 of the conductor layer A may be provided in the Y direction.

FIG. 25C illustrates a state of the conductor layers A and B respectively illustrated in FIGS. 25A and 25B, which are viewed from the photodiode 141 side (back surface side). Note that a hatched region 233 where diagonal lines intersect in FIG. 25C represents a region where the reticulated conductor 231 of the conductor layer A and the reticulated conductor 232 of the conductor layer B overlap. In the case of the fourth configuration example, since the active element group 167 is covered with at least one of the conductor layer A or the conductor layer B, the hot carrier light emission from the active element group 167 can be shielded.

Note that to completely shield the hot carrier light emission by the reticulated conductor 231 of the conductor layer A and the reticulated conductor 232 of the conductor layer B, the following relationships need to be satisfied.

The conductor width WYA≥the gap width GYA

The conductor width WXA≥the gap width GXA

The conductor width WYB≥the gap width GYB

The conductor width WXB≥the gap width GXB

In this case, the following relationships are satisfied.

The conductor width WYA=2×the overlap width+the gap width GYA

The conductor width WXA=2×the overlap width+the gap width GXA

The conductor width WYB=2×the overlap width+the gap width GYB

The conductor width WXB=2×the overlap width+the gap width GXB

In the fourth configuration example, in a case where the current flows similarly to the case illustrated in FIG. 23, the magnetic fluxes in the substantially X direction and the substantially Y direction are likely to be generated between the reticulated conductor 231 that is the Vss wiring and the reticulated conductor 232 that is the Vdd wiring by the conductor loop with the loop plane approximately perpendicular to the X axis and the conductor loop with the loop plane approximately perpendicular to the Y axis, the conductor loops being generated including (cross sections of)

the reticulated conductors 231 and 232 in a cross section where the reticulated conductors 231 and 232 are arranged.

Fifth Configuration Example

Figure 26A:
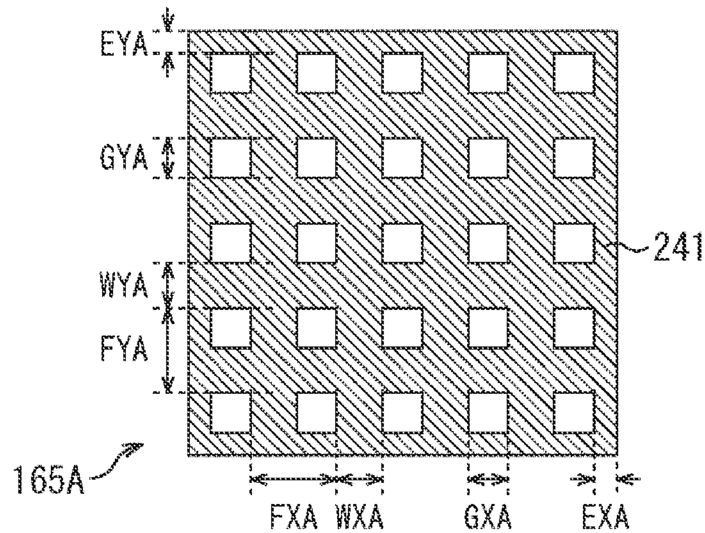
FIGS. 26A, 26B, and 26C are diagrams illustrating a fifth configuration example of the conductor layers A and B.
Figure 26B:
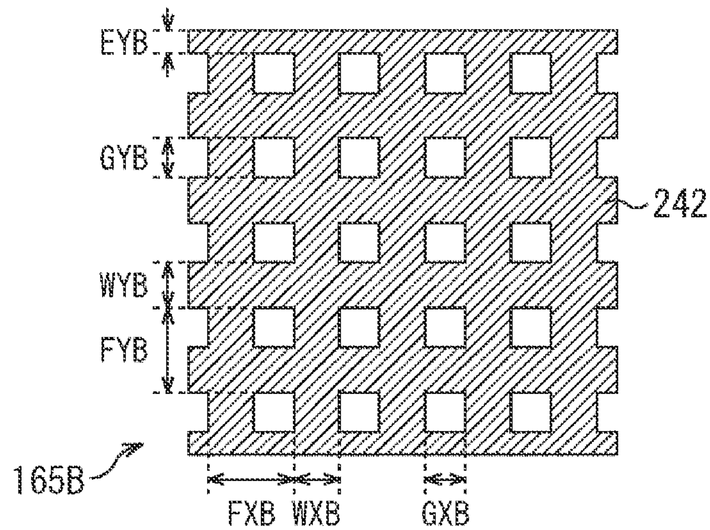
Figure 26C:
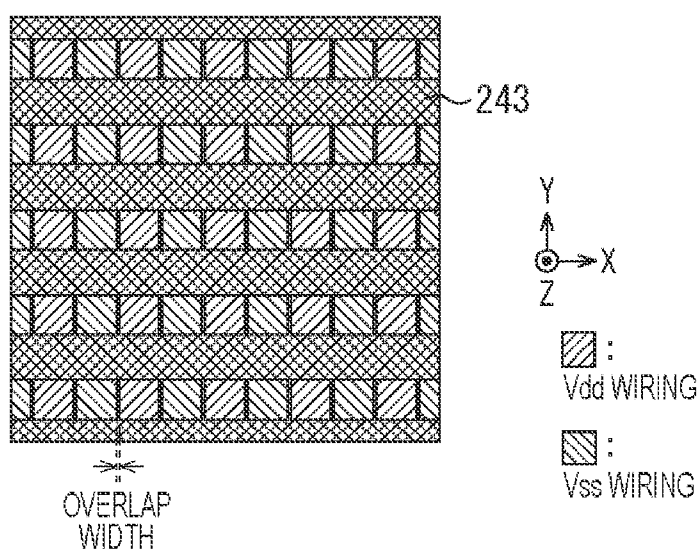

Next, FIGS. 26A, 26B, and 26C illustrate a fifth configuration example of the conductor layers A and B. Note that FIG. 26A illustrates the conductor layer A, and FIG. 26B illustrates the conductor layer B. In the coordinate system in FIGS. 26A, 26B, and 26C, the horizontal direction is the X axis, the vertical direction is the Y axis, and the direction perpendicular to the XY plane is the Z axis.

The conductor layer A in the fifth configuration example is configured by a reticulated conductor 241. The reticulated conductor 241 is obtained by moving the reticulated conductor 231 forming the conductor layer A in the fourth configuration example (FIGS. 25A, 25B, and 25C) in the Y direction by the conductor period FYA/2. The reticulated conductor 241 is, for example, wiring (Vss wiring) connected to the GND or the negative power supply.

The conductor layer B in the fifth configuration example is configured by a reticulated conductor 242. Since the reticulated conductor 242 has a similar shape to the reticulated conductor 232 forming the conductor layer B in the fourth configuration example (FIGS. 25A, 25B, and 25C), the description thereof is omitted. The reticulated conductor 242 is, for example, wiring (Vdd wiring) connected to the positive power supply.

Note that the reticulated conductor 241 and the reticulated conductor 242 desirably satisfy the following relationship.

The conductor width WXA=the conductor width WYA=the conductor width WXB=the conductor width WYB The gap width GXA=the gap width GYA=the gap width GXB=the gap width GYB The end width EXA=the end width EYB The conductor period FXA=the conductor period FYA=the conductor period FXB=the conductor period FYB The conductor width WYA=2×the overlap width+the gap width GYA, the conductor width WXA=2× the overlap width+the gap width GXA The conductor width WYB=2×the overlap width+the gap width GYB, the conductor width WXB=2× the overlap width+the gap width GXB Here, the overlap width is a width of an overlapping portion where the conductor portions overlap in a case where the reticulated conductor 241 of the conductor layer A and the reticulated conductor 242 of the conductor layer B are arranged to overlap each other.

FIG. 26C illustrates a state of the conductor layers A and B respectively illustrated in FIGS. 26A and 26B, which are viewed from the photodiode 141 side (back surface side). Note that a hatched region 243 where diagonal lines intersect in FIG. 26C represents a region where the reticulated conductor 241 of the conductor layer A and the reticulated conductor 242 of the conductor layer B overlap. In the case of the fifth configuration example, since the active element group 167 is covered with at least one of the conductor layer A or the conductor layer B, the hot carrier light emission from the active element group 167 can be shielded.

Furthermore, in the case of the fifth configuration example, the region 243 where the reticulated conductor 241 and the reticulated conductor 242 overlap is continuous in the X direction. In the region 243 where the reticulated conductor 241 and the reticulated conductor 242 overlap, currents having polarities different from each other flow in the reticulated conductor 241 and the reticulated conductor 242, and thus magnetic fields generated from the region 243 cancel each other. Therefore, generation of the inductive noise near the region 243 can be suppressed.

In the fifth configuration example, in a case where the current flows similarly to the case illustrated in FIG. 23, the magnetic fluxes in the substantially X direction and the substantially Y direction are likely to be generated between the reticulated conductor 241 that is the Vss wiring and the reticulated conductor 242 that is the Vdd wiring by the conductor loop with the loop plane approximately perpendicular to the X axis and the conductor loop with the loop plane approximately perpendicular to the Y axis, the conductor loops being generated including (cross sections of) the reticulated conductors 241 and 242 in a cross section where the reticulated conductors 241 and 242 are arranged.

Sixth Configuration Example

Figure 27A:
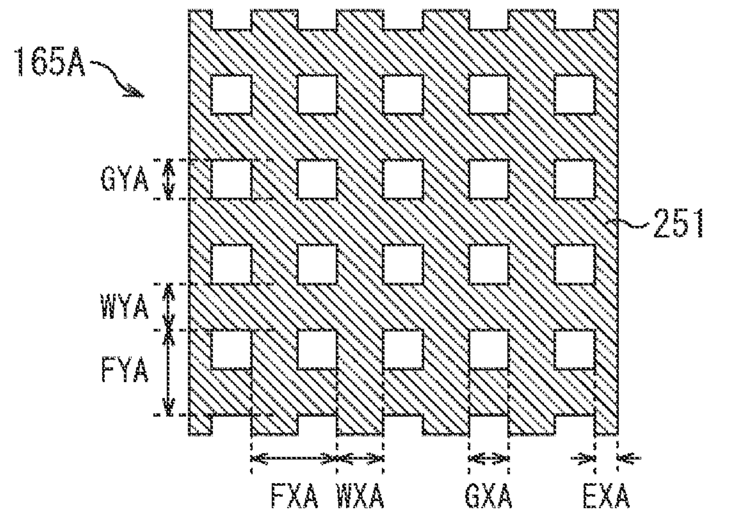
FIGS. 27A, 27B, and 27C are diagrams illustrating a sixth configuration example of the conductor layers A and B.
Figure 27B:
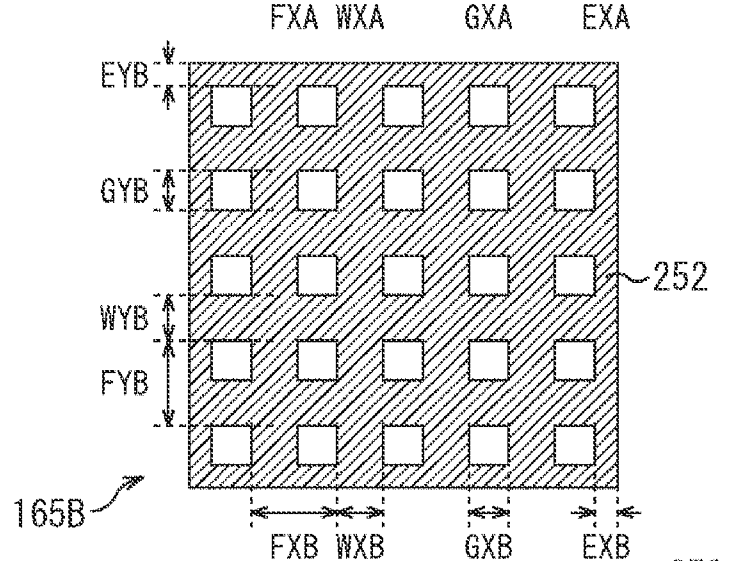
Figure 27C:
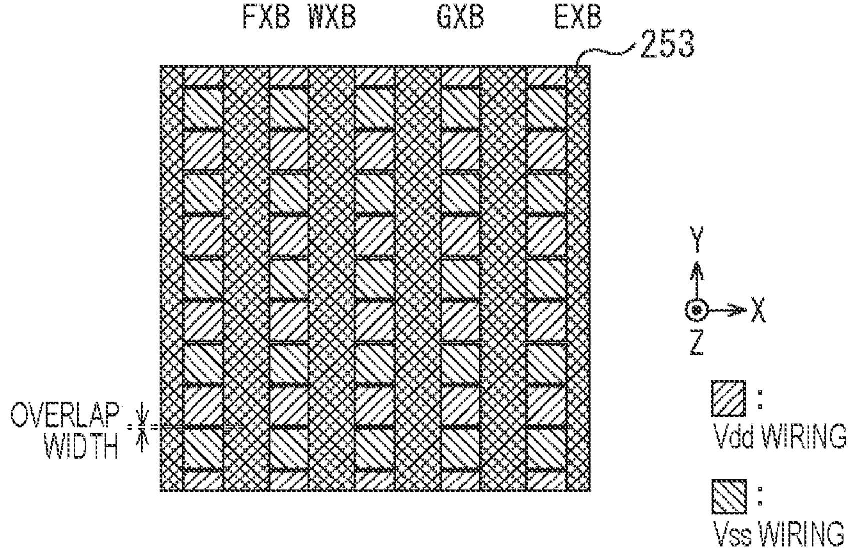

Next, FIGS. 27A, 27B, and 27C illustrate a sixth configuration example of the conductor layers A and B. Note that FIG. 27A illustrates the conductor layer A, and FIG. 27B illustrates the conductor layer B. In the coordinate system in FIGS. 27A, 27B, and 27C, the horizontal direction is the X axis, the vertical direction is the Y axis, and the direction perpendicular to the XY plane is the Z axis.

The conductor layer A in the sixth configuration example is configured by a reticulated conductor 251. Since the reticulated conductor 251 has a similar shape to the reticulated conductor 231 forming the conductor layer A in the fourth configuration example (FIGS. 25A, 25B, and 25C), the description thereof is omitted. The reticulated conductor 251 is, for example, wiring (Vss wiring) connected to the GND or the negative power supply.

The conductor layer B in the sixth configuration example is configured by a reticulated conductor 252. The reticulated conductor 252 is obtained by moving the reticulated conductor 232 forming the conductor layer B in the fourth configuration example (FIGS. 25A, 25B, and 25C) in the X direction by the conductor period FXB/2. The reticulated conductor 252 is, for example, wiring (Vdd wiring) connected to the positive power supply.

Note that the reticulated conductor 251 and the reticulated conductor 252 desirably satisfy the following relationship.

The conductor width WXA=the conductor width WYA=the conductor width WXB=the conductor width WYB The gap width GXA=the gap width GYA=the gap width GXB=the gap width GYB The end width EXA=the end width EYB The conductor period FXA=the conductor period FYA=the conductor period FXB=the conductor period FYB The conductor width WYA=2×the overlap width+the gap width GYA, the conductor width WXA=2× the overlap width+the gap width GXA The conductor width WYB=2×the overlap width+the gap width GYB, the conductor width WXB=2× the overlap width+the gap width GXB Here, the overlap width is a width of an overlapping portion where the conductor portions overlap in a case where the reticulated conductor 251 of the conductor layer A and the reticulated conductor 252 of the conductor layer B are arranged to overlap each other.

FIG. 27C illustrates a state of the conductor layers A and B respectively illustrated in FIGS. 27A and 27B, which are viewed from the photodiode 141 side (back surface side). Note that a hatched region 253 in FIG. 27C where diagonal lines intersect represents a region where the reticulated conductor 251 of the conductor layer A and the reticulated conductor 252 of the conductor layer B overlap. In the case of the sixth configuration example, since the active element group 167 is covered with at least one of the conductor layer A or the conductor layer B, the hot carrier light emission from the active element group 167 can be shielded.

In the sixth configuration example, in a case where the current flows similarly to the case illustrated in FIG. 23, the magnetic fluxes in the substantially X direction and the substantially Y direction are likely to be generated between the reticulated conductor 251 that is the Vss wiring and the reticulated conductor 252 that is the Vdd wiring by the conductor loop with the loop plane approximately perpendicular to the X axis and the conductor loop with the loop plane approximately perpendicular to the Y axis, the conductor loops being generated including (cross sections of) the reticulated conductors 251 and 252 in a cross section where the reticulated conductors 251 and 252 are arranged.

Moreover, in the case of the sixth configuration example, the region 253 where the reticulated conductor 251 and the reticulated conductor 252 overlap is continuous in the Y direction. In the region 253 where the reticulated conductor 251 and the reticulated conductor 252 overlap, currents having polarities different from each other flow in the reticulated conductor 251 and the reticulated conductor 252, and thus magnetic fields generated from the region 253 cancel each other. Therefore, generation of the inductive noise near the region 253 can be suppressed.

Simulation Results of Fourth to Sixth Configuration Examples

Figure 28A:
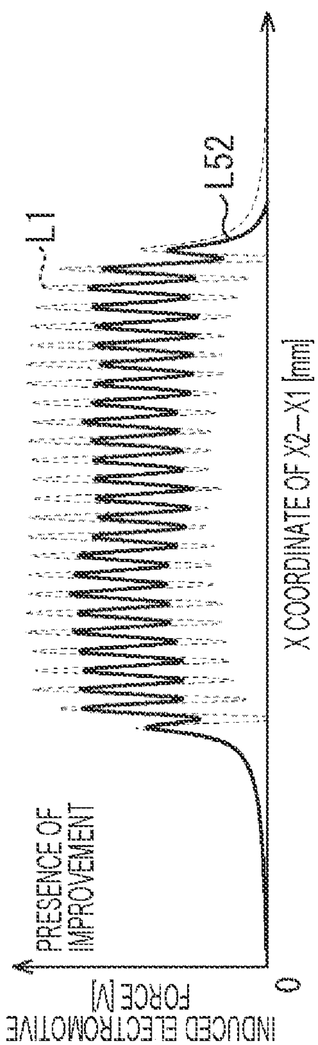
FIGS. 28A, 28B, and 28C are diagrams illustrating simulation results of inductive noise corresponding to the fourth to sixth configuration examples.
Figure 28B:
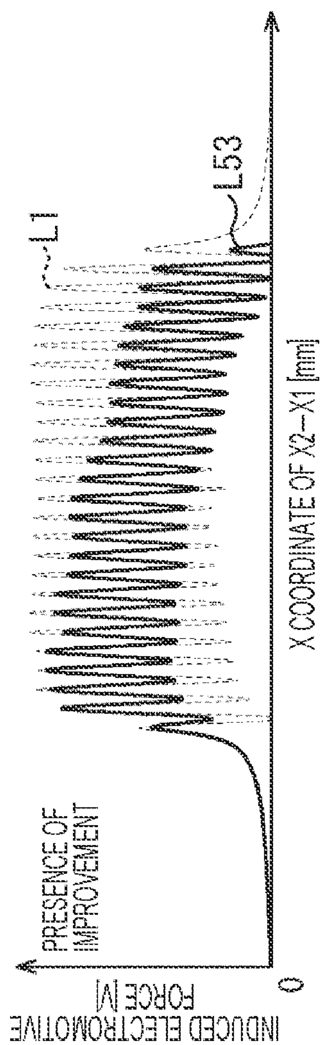
Figure 28C:
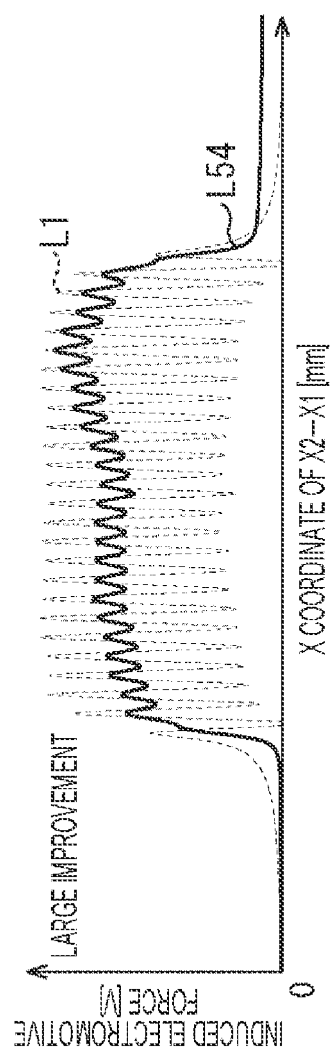

FIGS. 28A, 28B, and 28C illustrate changes in the induced electromotive force that causes the inductive noise in an image, as simulation results of cases where the fourth to sixth configuration examples (FIGS. 25A, 25B, 25C, 26A, 26B, 26C, 27A, 27B, and 27C) are applied to the solid-state imaging device 100. Note that the current conditions of the currents flowing in the fourth to sixth configuration examples are similar to that in the case illustrated in FIG. 23. The horizontal axis in FIGS. 28A, 28B, and 28C represent X-axis coordinates of the image, and the vertical axis represents the magnitude of the induced electromotive force.

The solid line L52 in FIG. 28A corresponds to the fourth configuration example (FIGS. 25A, 25B, and 25C), and the dotted line L1 corresponds to the first comparative example (FIGS. 9A, 9B, and 9C). As is clear from the comparison of the solid line L52 and the dotted line L1, it can be seen that the fourth configuration example can suppress the change in the induced electromotive force to be generated in the Victim conductor loop as compared with the first comparative example, and can suppress the inductive noise.

The solid line L53 in FIG. 28B corresponds to the fifth configuration example (FIGS. 26A, 26B, and 26C), and the dotted line L1 corresponds to the first comparative example (FIGS. 9A, 9B, and 9C). As is clear from the comparison of the solid line L53 and the dotted line L1, it can be seen that the fifth configuration example can suppress the change in the induced electromotive force to be generated in the Victim conductor loop as compared with the first comparative example, and can suppress the inductive noise.

The solid line L54 in FIG. 28C corresponds to the sixth configuration example (FIGS. 27A, 27B, and 27C), and the dotted line L1 corresponds to the first comparative example (FIGS. 9A, 9B, and 9C). As is clear from the comparison of the solid line L54 and the dotted line L1, it can be seen that the sixth configuration example can suppress the change in the induced electromotive force to be generated in the Victim conductor loop as compared with the first comparative example, and can suppress the inductive noise.

Furthermore, as is clear from the comparison of the solid lines L52 to L54, it can be seen that the sixth configuration example can further suppress the change in the induced electromotive force to be generated in the Victim conductor loop as compared with the fourth and fifth configuration examples, and can further suppress the inductive noise.

Seventh Configuration Example

Figures 29A, 29B, 29C:
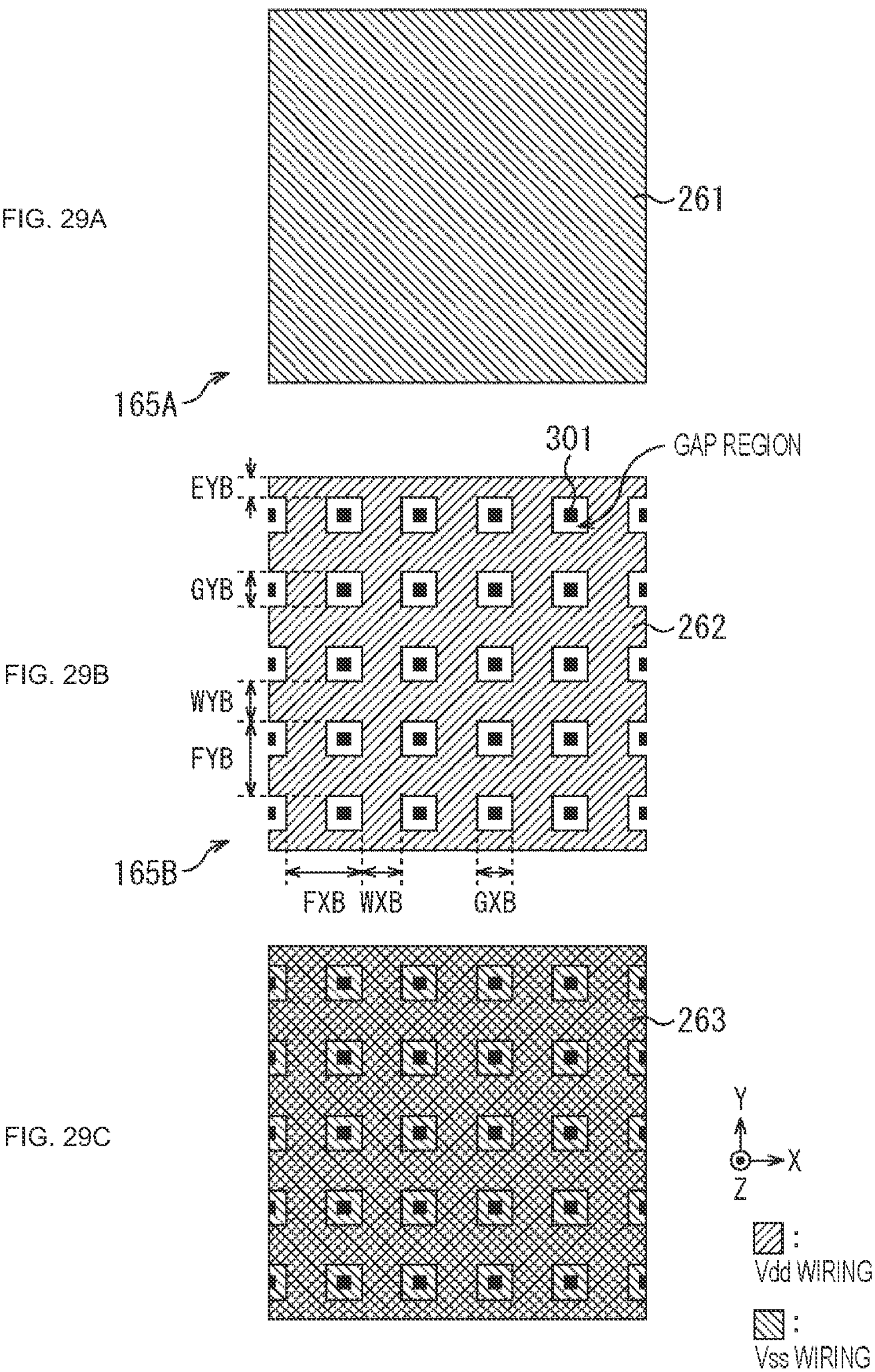
FIGS. 29A, 29B, and 29C are diagrams illustrating a seventh configuration example of the conductor layers A and B.

Next, FIGS. 29A, 29B, and 29C illustrate a seventh configuration example of the conductor layers A and B. Note that FIG. 29A illustrates the conductor layer A, and FIG. 29B illustrates the conductor layer B. In the coordinate system in FIGS. 29A, 29B, and 29C, the horizontal direction is the X axis, the vertical direction is the Y axis, and the direction perpendicular to the XY plane is the Z axis.

The conductor layer A in the seventh configuration example is configured by a planar conductor 261. The planar conductor 261 is, for example, wiring (Vss wiring) connected to the GND or the negative power supply.

The conductor layer B in the seventh configuration example is configured by a reticulated conductor 262 and a relay conductor 301. Since the reticulated conductor 262 has a similar shape to the reticulated conductor 222 of the conductor layer B in the third configuration example (FIGS. 22A, 22B, and 22C), the description thereof is omitted. The reticulated conductor 262 is, for example, wiring (Vdd wiring) connected to the positive power supply.

The relay conductor (another conductor) 301 is arranged in a gap region other than the conductor of the reticulated conductor 262 and is electrically insulated from the reticulated conductor 262, and is connected to Vss to which the planar conductor 261 of the conductor layer A is connected.

The shape of the relay conductor 301 is arbitrary, and a symmetric circular or polygonal shape such as rotational symmetry or mirror plane symmetry is desirable. The relay conductor 301 can be arranged in a center of or at any other position of the gap region of the reticulated conductor 262. The relay conductor 301 may be connected to a conductor layer as Vss wiring different from the conductor layer A. The relay conductor 301 may be connected to a conductor layer as Vss wiring closer to the active element group 167 than the conductor layer B. The relay conductor 301 can be connected to a conductor layer different from the conductor layer A or a conductor layer or the like closer to the active element group 167 than the conductor layer B via the conductor via (VIA) extending in the Z direction.

FIG. 29C illustrates a state of the conductor layers A and B respectively illustrated in FIGS. 29A and 29B, which are viewed from the photodiode 141 side (back surface side). Note that a hatched region 263 in FIG. 29C where diagonal lines intersect represents a region where the planar conductor of the conductor layer A and the reticulated conductor 262 of the conductor layer B overlap. In the case of the seventh configuration example, since the active element group 167 is covered with at least one of the conductor layer A or the conductor layer B, the hot carrier light emission from the active element group 167 can be shielded.

Furthermore, in the case of the seventh configuration example, by providing the relay conductor 301, the planar conductor 261 as Vss wiring can be connected with the active element group 167 at substantially the shortest distance or a short distance. By connecting the planar conductor 261 and the active element group 167 at substantially the shortest distance or a short distance, the voltage drop, energy loss, or inductive noise between the planar conductor 261 and the active element group 167 can be reduced.

Figure 30:
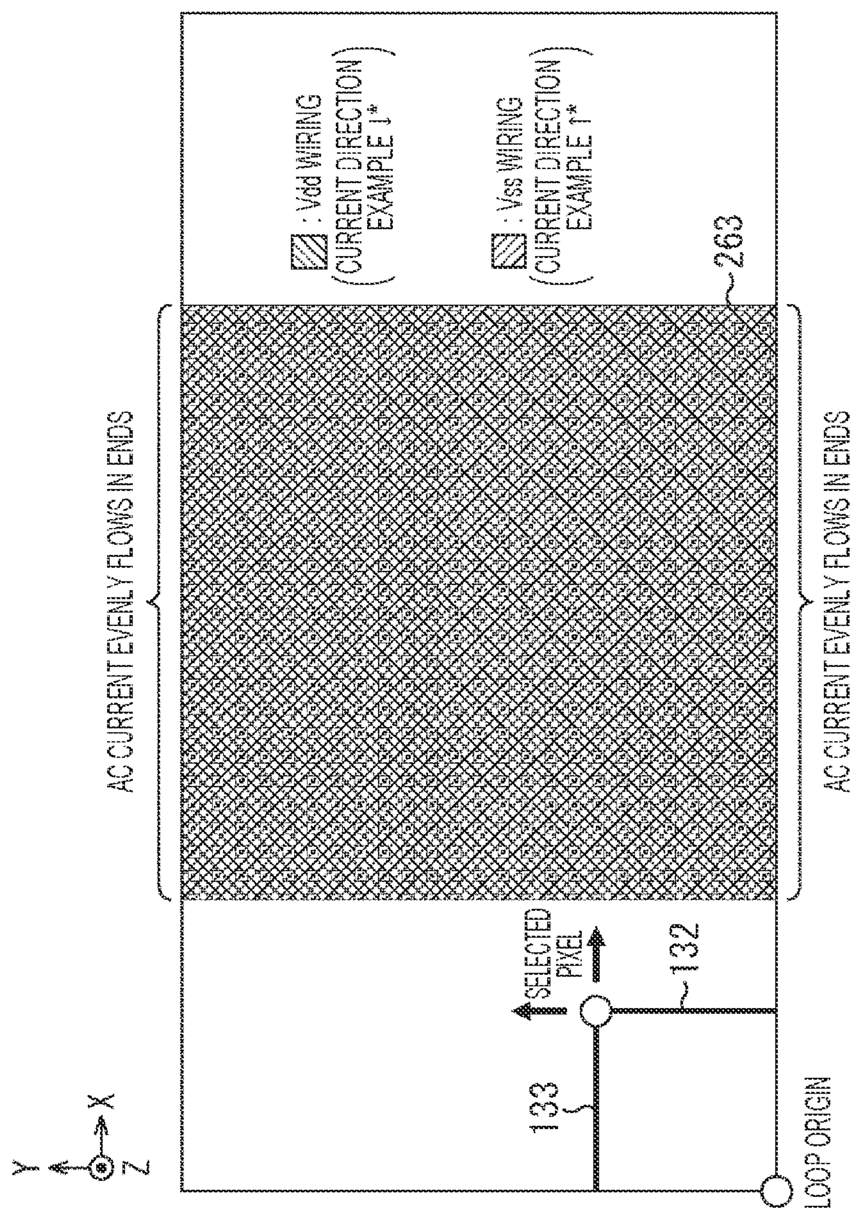
FIG. 30 is a diagram illustrating a current condition of a current flowing in the seventh configuration example.

FIG. 30 is a diagram illustrating the current condition of the current flowing in the seventh configuration example (FIGS. 29A, 29B, and 29C).

It is assumed that AC current evenly flows in ends of the planar conductor 261 constituting the conductor layer A and the reticulated conductor 262 constituting the conductor layer B. However, the current direction changes with time. For example, when the current flows through the reticulated conductor 262 that is the Vdd wiring from the upper side to the lower side of the drawing, the current flows through the planar conductor 261 that is the Vss wiring from the lower side to the upper side of the drawing.

In the seventh configuration example, in a case where the current flows as illustrated in FIG. 30, the magnetic fluxes in the substantially X direction and the substantially Y direction are likely to be generated between the planar conductor 261 that is the Vss wiring and the reticulated conductor 262 that is the Vdd wiring by the conductor loop with the loop plane approximately perpendicular to the X axis and the conductor loop with the loop plane approximately perpendicular to the Y axis, the conductor loops being generated including (cross sections of) the planar conductor 261 and the reticulated conductor 262 in a cross section where the planar conductor 261 and the reticulated conductor 262 are arranged.

Meanwhile, the Victim conductor loop formed using the signal line 132 and the control line 133 is formed in the XY plane in the pixel array 121 of the first semiconductor substrate 101 stacked on the second semiconductor substrate 102 in which the light-shielding structure 151 formed using the conductor layers A and B is formed. In the Victim conductor loop formed on the XY plane, the induced electromotive force is likely to be generated by the magnetic flux in the Z direction, and an image output from the solid-state imaging device 100 further deteriorates (the inductive noise increases) as a change in the induced electromotive force is larger.

Moreover, when the effective dimensions of the Victim conductor loop formed using the signal line 132 and the control line 133 are changed due to movement of selected pixels in the pixel array 121, the change in the induced electromotive force becomes remarkable.

In the case of the seventh configuration example, the direction (approximately X direction or approximately Y direction) of the magnetic flux generated from the loop plane of the Aggressor conductor loop of the light-shielding structure 151 formed using the conductor layers A and B and the direction (Z direction) of the magnetic flux to generate the induced electromotive force in the Victim conductor loop are substantially orthogonal and differ by approximately 90 degrees. In other words, the direction of the loop plane where the magnetic flux is generated from the Aggressor conductor loop and the direction of the loop plane where the induced electromotive force is generated in the Victim conductor loop differ by approximately 90 degrees. Therefore, it is expected that the deterioration (generation of inductive noise) of the image output from the solid-state imaging device 100 is less than that in the first comparative example.

Figures 31A, 31B, 31C:
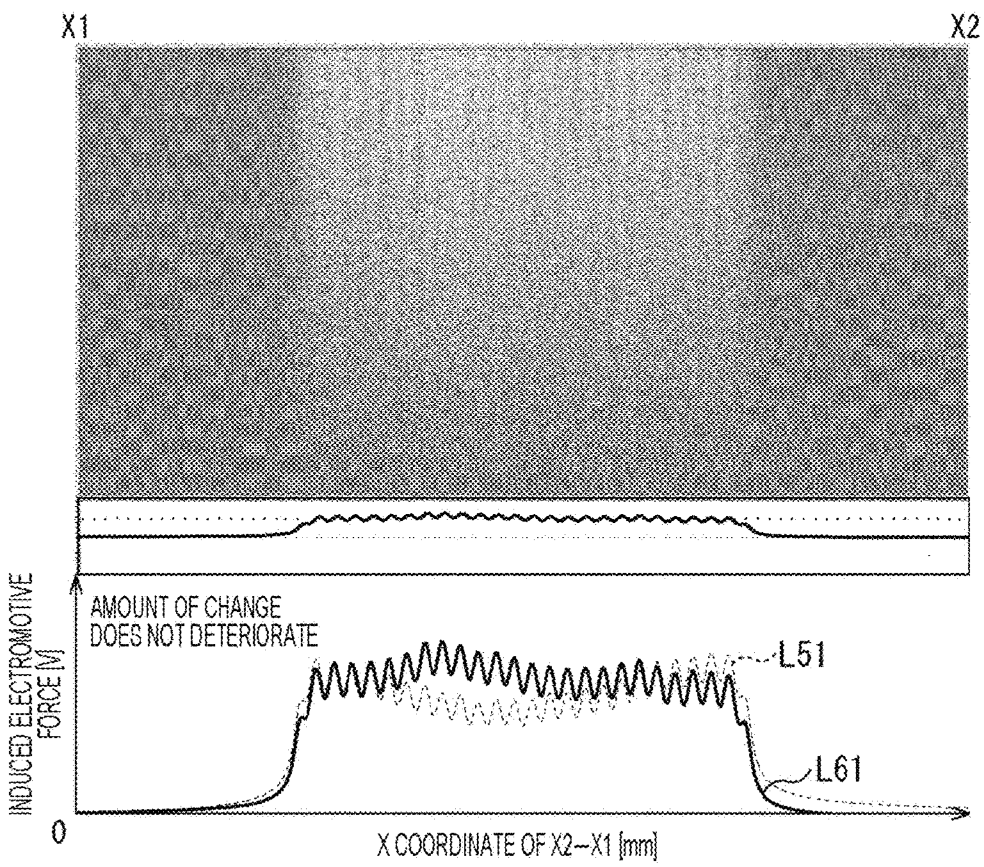
FIGS. 31A, 31B, and 31C are diagrams illustrating a simulation result of inductive noise corresponding to the seventh configuration example.

FIGS. 31A, 31B, and 31C illustrate a simulation result of the inductive noise generated in the case where the seventh configuration example (FIGS. 29A, 29B, and 29C) is applied to the solid-state imaging device 100.

FIG. 31A illustrates an image in which the inductive noise can be generated, the image being output from the solid-state imaging device 100. FIG. 31B illustrates a change in a pixel signal in the line segment X1-X2 of the image illustrated in FIG. 31. FIG. 31C illustrates the solid line L61 representing induced electromotive force that generates the inductive noise in the image. The horizontal axis of FIG. 31C represents X-axis coordinates of the image, and the vertical axis represents the magnitude of the induced electromotive force. Note that the dotted line L51 in FIG. 31C corresponds to the third configuration example (FIGS. 22A, 22B, and 22C).

As is clear from the comparison between the solid line L61 and the dotted line L51 illustrated in FIG. 31C, it can be seen that the seventh configuration example does not deteriorate the change in the induced electromotive force to be generated in the Victim conductor loop as compared with the third configuration example. That is, even the seventh configuration example in which the relay conductor is arranged in the gap of the reticulated conductor 262 of the conductor layer B can suppress the generation of the inductive noise in the image output from the solid-state imaging device 100 to the same extent as the third configuration example. Note that this simulation result is a simulation result of a case where the planar conductor 261 is not connected to the active element group 167 and the reticulated conductor 262 is not connected to the active element group 167. For example, in a case where at least a part of the planar conductor 261 and a part of the active element group 167 are connected via a conductor via or the like at substantially the shortest distance or a short distance, or in a case where at least a part of the reticulated conductor 262 and a part of the active element group 167 are connected via a conductor via or the like at substantially the shortest distance or a short distance, the amount of current flowing through the planar conductor 261 and the reticulated conductor 262 gradually decreases depending on the position. In such a case, there is also a condition that the voltage drop, energy loss, and inductive noise are significantly improved to less than half by providing the relay conductor 301.

Eighth Configuration Example

Figure 32A:
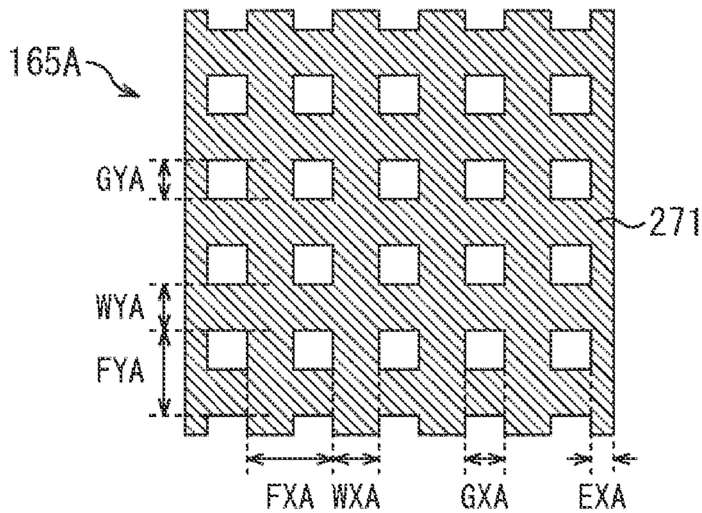
FIGS. 32A, 32B, and 32C are diagrams illustrating an eighth configuration example of the conductor layers A and B.
Figure 32B:
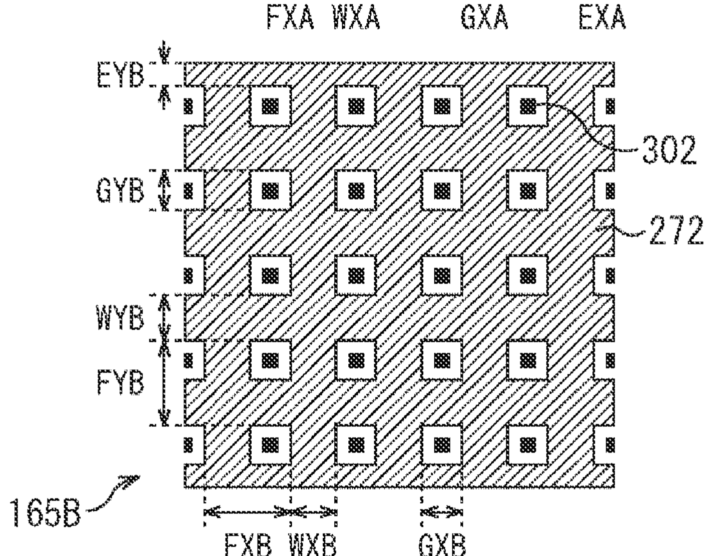
Figure 32C:
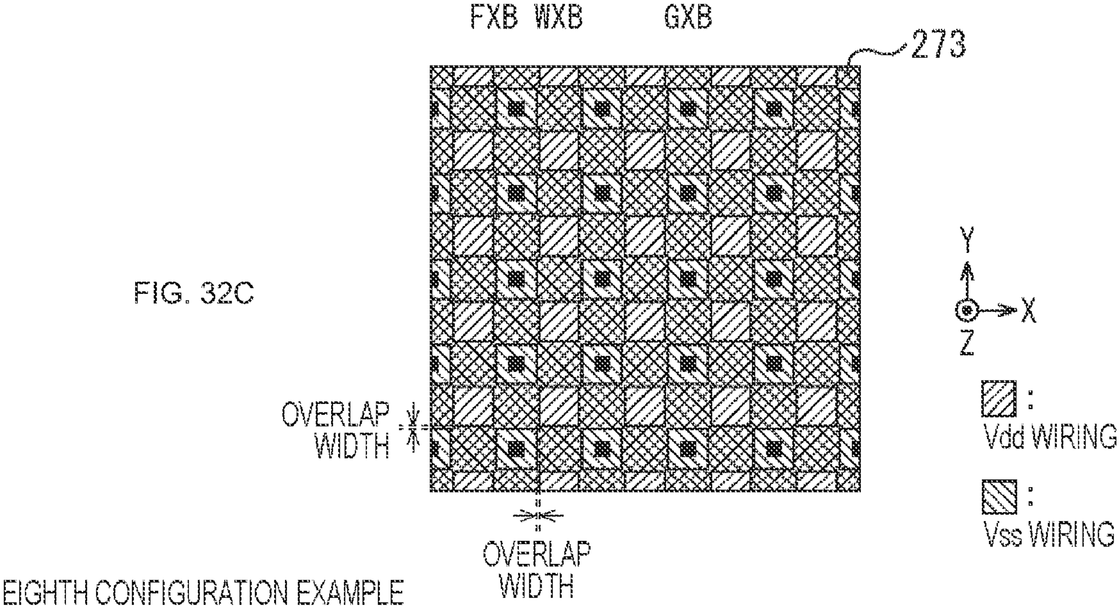

Next, FIGS. 32A, 32B, and 32C illustrate an eighth configuration example of the conductor layers A and B. Note that FIG. 32A illustrates the conductor layer A, and FIG. 32B illustrates the conductor layer B. In the coordinate system in FIGS. 32A, 32B, and 32C, the horizontal direction is the X axis, the vertical direction is the Y axis, and the direction perpendicular to the XY plane is the Z axis.

The conductor layer A in the eighth configuration example is configured by a reticulated conductor 271. Since the reticulated conductor 271 has a similar shape to the reticulated conductor 231 of the conductor layer A in the fourth configuration example (FIGS. 25A, 25B, and 25C), the description thereof is omitted. The reticulated conductor 271 is, for example, wiring (Vss wiring) connected to the GND or the negative power supply.

The conductor layer B in the eighth configuration example is configured by a reticulated conductor 272 and a relay conductor 302. Since the reticulated conductor has a similar shape to the reticulated conductor 232 of the conductor layer B in the fourth configuration example (FIGS. 25A, 25B, and 25C), the description thereof is omitted. The reticulated conductor 232 is, for example, wiring (Vdd wiring) connected to the positive power supply.

The relay conductor (another conductor) 302 is arranged in a gap region other than the conductor of the reticulated conductor 272 and is electrically insulated from the reticulated conductor 272, and is connected to Vss to which the reticulated conductor 271 of the conductor layer A is connected.

Note that the shape of the relay conductor 302 is arbitrary, and a symmetric circular or polygonal shape such as rotational symmetry or mirror plane symmetry is desirable. The relay conductor 302 can be arranged in a center of or at any other position of the gap region of the reticulated conductor 272. The relay conductor 302 may be connected to a conductor layer as Vss wiring different from the conductor layer A. The relay conductor 302 may be connected to a conductor layer as Vss wiring closer to the active element group 167 than the conductor layer B. The relay conductor 302 can be connected to a conductor layer different from the conductor layer A or to a conductor layer or the like closer to the active element group 167 than the conductor layer B via the conductor via (VIA) extending in the Z direction.

FIG. 32C illustrates a state of the conductor layers A and B respectively illustrated in FIGS. 32A and 32B, which are viewed from the photodiode 141 side (back surface side). Note that a hatched region 273 where diagonal lines intersect in FIG. 32C represents a region where the reticulated conductor 271 of the conductor layer A and the reticulated conductor 272 of the conductor layer B overlap. In the case of the eighth configuration example, since the active element group 167 is covered with at least one of the conductor layer A or the conductor layer B, the hot carrier light emission from the active element group 167 can be shielded.

In the eighth configuration example, in a case where the current flows similarly to the case illustrated in FIG. 30, the magnetic fluxes in the substantially X direction and the substantially Y direction are likely to be generated between the reticulated conductor 271 that is the Vss wiring and the reticulated conductor 272 that is the Vdd wiring by the conductor loop with the loop plane approximately perpendicular to the X axis and the conductor loop with the loop plane approximately perpendicular to the Y axis, the conductor loops being generated including (cross sections of) the reticulated conductors 271 and 272 in a cross section where the reticulated conductors 271 and 272 are arranged.

Furthermore, in the case of the eighth configuration example, by providing the relay conductor 302, the reticulated conductor 271 as Vss wiring can be connected with the active element group 167 at substantially the shortest distance or a short distance. By connecting the reticulated conductor 271 and the active element group 167 at substantially the shortest distance or a short distance, the voltage drop, energy loss, or inductive noise between the reticulated conductor 271 and the active element group 167 can be reduced.

Ninth Configuration Example

Figure 33A:
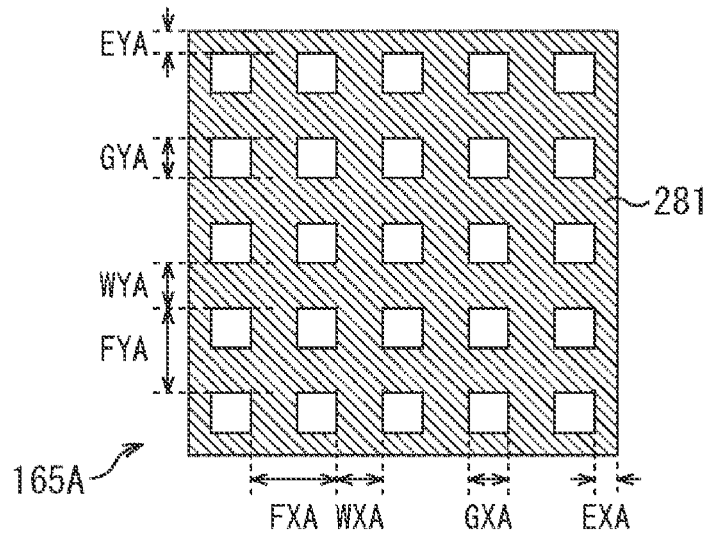
FIGS. 33A, 33B, and 33C are diagrams illustrating a ninth configuration example of the conductor layers A and B.
Figure 33B:
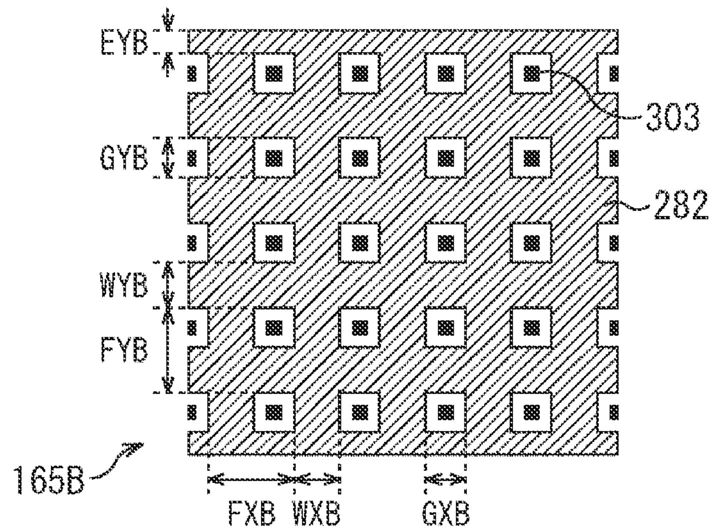
Figure 33C:
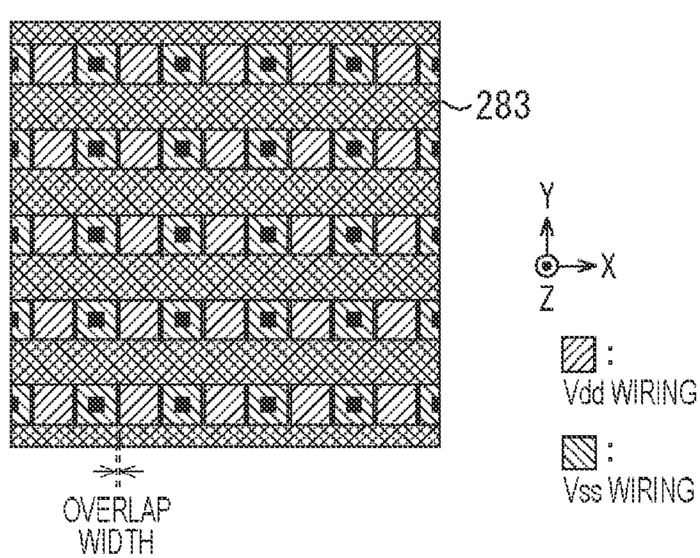

Next, FIGS. 33A, 33B, and 33C illustrate a ninth configuration example of the conductor layers A and B. Note that FIG. 33A illustrates the conductor layer A, and FIG. 33B illustrates the conductor layer B. In the coordinate system in FIGS. 33A, 33B, and 33C, the horizontal direction is the X axis, the vertical direction is the Y axis, and the direction perpendicular to the XY plane is the Z axis.

The conductor layer A in the ninth configuration example is configured by a reticulated conductor 281. Since the reticulated conductor 281 has a similar shape to the reticulated conductor 241 of the conductor layer A in the fifth configuration example (FIGS. 26A, 26B, and 26C), the description thereof is omitted. The reticulated conductor is, for example, wiring (Vss wiring) connected to the GND or the negative power supply.

The conductor layer B in the ninth configuration example is configured by a reticulated conductor 282 and a relay conductor 303. Since the reticulated conductor has a similar shape to the reticulated conductor 242 of the conductor layer B in the fifth configuration example (FIGS. 26A, 26B, and 26C), the description thereof is omitted. The reticulated conductor 282 is, for example, wiring (Vdd wiring) connected to the positive power supply.

FIG. 33C illustrates a state of the conductor layers A and B respectively illustrated in FIGS. 33A and 33B, which are viewed from the photodiode 141 side (back surface side). Note that a hatched region 283 in FIG. 33C where diagonal lines intersect represents a region where the reticulated conductor 281 of the conductor layer A and the reticulated conductor 282 of the conductor layer B overlap. In the case of the ninth configuration example, since the active element group 167 is covered with at least one of the conductor layer A or the conductor layer B, the hot carrier light emission from the active element group 167 can be shielded.

The relay conductor (another conductor) 303 is arranged in a gap region other than the conductor of the reticulated conductor 282 and is electrically insulated from the reticulated conductor 282, and is connected to Vss to which the reticulated conductor 281 of the conductor layer A is connected Note that the shape of the relay conductor 303 is arbitrary, and a symmetric circular or polygonal shape such as rotational symmetry or mirror plane symmetry is desirable. The relay conductor 303 can be arranged in a center of or at any other position of the gap region of the reticulated conductor 282. The relay conductor 303 may be connected to a conductor layer as Vss wiring different from the conductor layer A. The relay conductor 303 may be connected to a conductor layer as Vss wiring closer to the active element group 167 than the conductor layer B. The relay conductor 303 can be connected to a conductor layer different from the conductor layer A or to a conductor layer or the like closer to the active element group 167 than the conductor layer B via the conductor via (VIA) extending in the Z direction.

Tenth Configuration Example

Figure 34A:
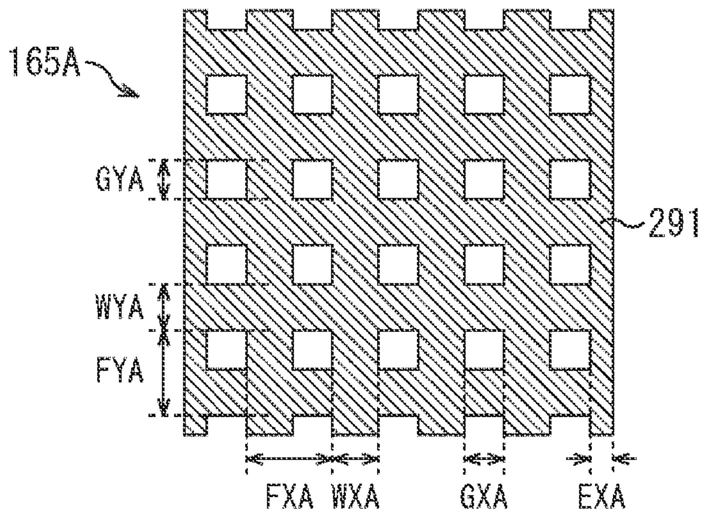
FIGS. 34A, 34B, and 34C are diagrams illustrating a tenth configuration example of the conductor layers A and B.
Figure 34B:
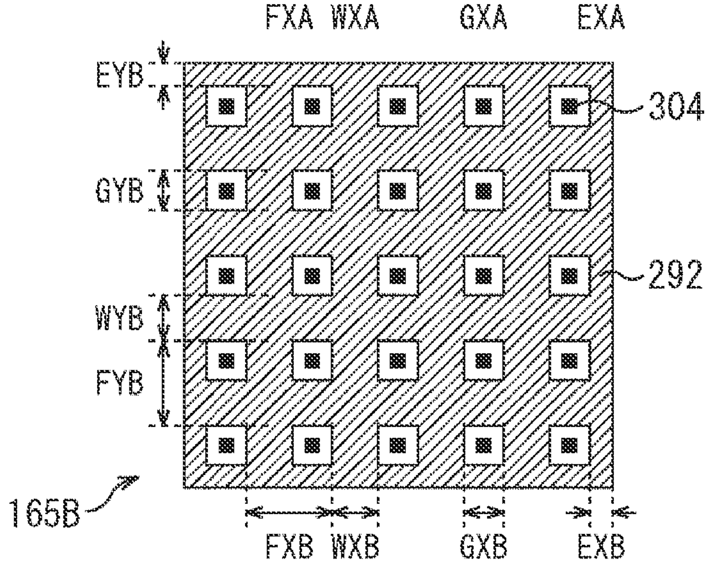
Figure 34C:
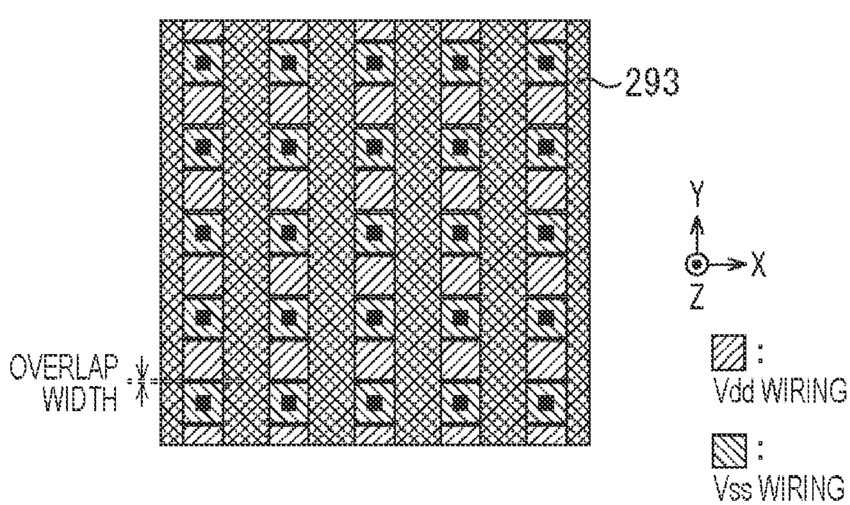

Next, FIGS. 34A, 34B, and 34C illustrate a tenth configuration example of the conductor layers A and B. Note that FIG. 34A illustrates the conductor layer A, and FIG. 34B illustrates the conductor layer B. In the coordinate system in FIGS. 34A, 34B, and 34C, the horizontal direction is the X axis, the vertical direction is the Y axis, and the direction perpendicular to the XY plane is the Z axis.

In the ninth configuration example, in a case where the current flows similarly to the case illustrated in FIG. 30, the magnetic fluxes in the substantially X direction and the substantially Y direction are likely to be generated between the reticulated conductor 281 that is the Vss wiring and the reticulated conductor 282 that is the Vdd wiring by the conductor loop with the loop plane approximately perpendicular to the X axis and the conductor loop with the loop plane approximately perpendicular to the Y axis, the conductor loops being generated including (cross sections of) the reticulated conductors 281 and 282 in a cross section where the reticulated conductors 281 and 282 are arranged.

Furthermore, in the case of the ninth configuration example, by providing the relay conductor 303, the reticulated conductor 281 as Vss wiring can be connected with the active element group 167 at substantially the shortest distance or a short distance. By connecting the reticulated conductor 281 and the active element group 167 at substantially the shortest distance or a short distance, the voltage drop, energy loss, or inductive noise between the reticulated conductor 281 and the active element group 167 can be reduced.

The conductor layer A in the tenth configuration example is configured by a reticulated conductor 291. Since the reticulated conductor 291 has a similar shape to the reticulated conductor 251 of the conductor layer A in the sixth configuration example (FIGS. 27A, 27B, and 27C), the description thereof is omitted. The reticulated conductor is, for example, wiring (Vss wiring) connected to the GND or the negative power supply.

The conductor layer B in the tenth configuration example is configured by a reticulated conductor 292 and a relay conductor 304. Since the reticulated conductor has a similar shape to the reticulated conductor 252 of the conductor layer B in the sixth configuration example (FIGS. 27A, 27B, and 27C), the description thereof is omitted. The reticulated conductor 292 is, for example, wiring (Vdd wiring) connected to the positive power supply.

The relay conductor (another conductor) 304 is arranged in a gap region other than the conductor of the reticulated conductor 292 and is electrically insulated from the reticulated conductor 292, and is connected to Vss to which the reticulated conductor 291 of the conductor layer A is connected Note that the shape of the relay conductor 304 is arbitrary, and a symmetric circular or polygonal shape such as rotational symmetry or mirror plane symmetry is desirable. The relay conductor 304 can be arranged in a center of or at any other position of the gap region of the reticulated conductor 292. The relay conductor 304 may be connected to a conductor layer as Vss wiring different from the conductor layer A. The relay conductor 304 may be connected to a conductor layer as Vss wiring closer to the active element group 167 than the conductor layer B. The relay conductor 304 can be connected to a conductor layer different from the conductor layer A or to a conductor layer or the like closer to the active element group 167 than the conductor layer B via the conductor via (VIA) extending in the Z direction.

FIG. 34C illustrates a state of the conductor layers A and B respectively illustrated in FIGS. 34A and 34B, which are viewed from the photodiode 141 side (back surface side). Note that a hatched region 293 where diagonal lines intersect in FIG. 34C represents a region where the reticulated conductor 291 of the conductor layer A and the reticulated conductor 292 of the conductor layer B overlap. In the case of the tenth configuration example, since the active element group 167 is covered with at least one of the conductor layer A or the conductor layer B, the hot carrier light emission from the active element group 167 can be shielded.

In the tenth configuration example, in a case where the current flows similarly to the case illustrated in FIG. 30, the magnetic fluxes in the substantially X direction and the substantially Y direction are likely to be generated between the reticulated conductor 291 that is the Vss wiring and the reticulated conductor 292 that is the Vdd wiring by the conductor loop with the loop plane approximately perpendicular to the X axis and the conductor loop with the loop plane approximately perpendicular to the Y axis, the conductor loops being generated including (cross sections of) the reticulated conductors 291 and 292 in a cross section where the reticulated conductors 291 and 292 are arranged.

Furthermore, in the case of the tenth configuration example, by providing the relay conductor 304, the reticulated conductor 291 as Vss wiring can be connected with the active element group 167 at substantially the shortest distance or a short distance. By connecting the reticulated conductor 291 and the active element group 167 at substantially the shortest distance or a short distance, the voltage drop, energy loss, or inductive noise between the reticulated conductor 291 and the active element group 167 can be reduced.

Simulation Results of Eighth to Tenth Configuration Examples

Figure 35A:
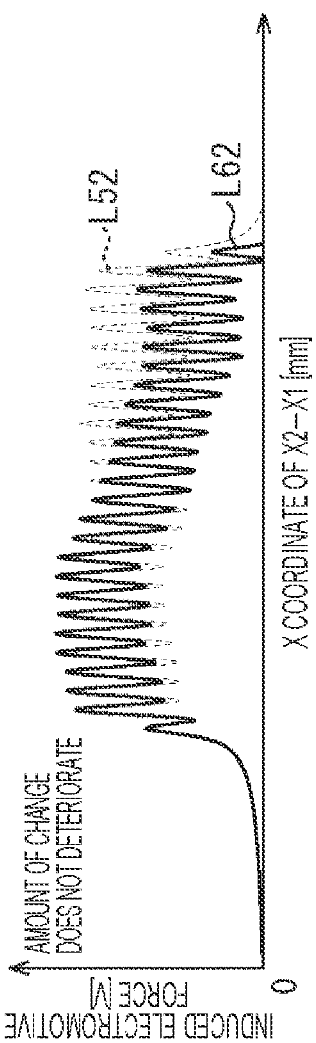
FIGS. 35A, 35B, and 35C are diagrams illustrating simulation results of inductive noise corresponding to the eighth to tenth configuration examples.
Figure 35B:
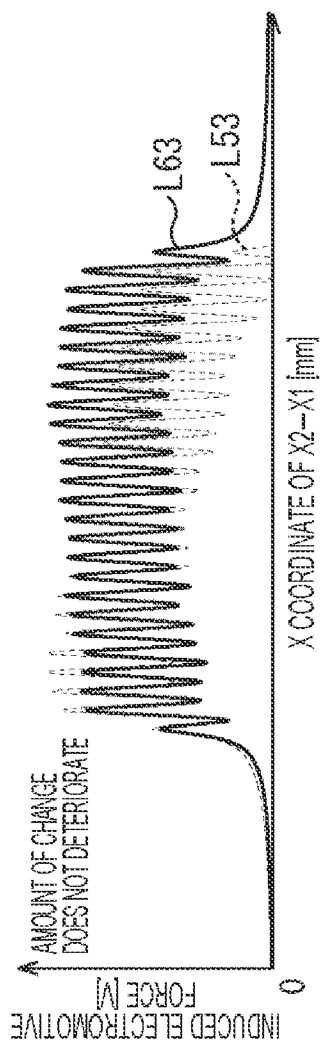
Figure 35C:
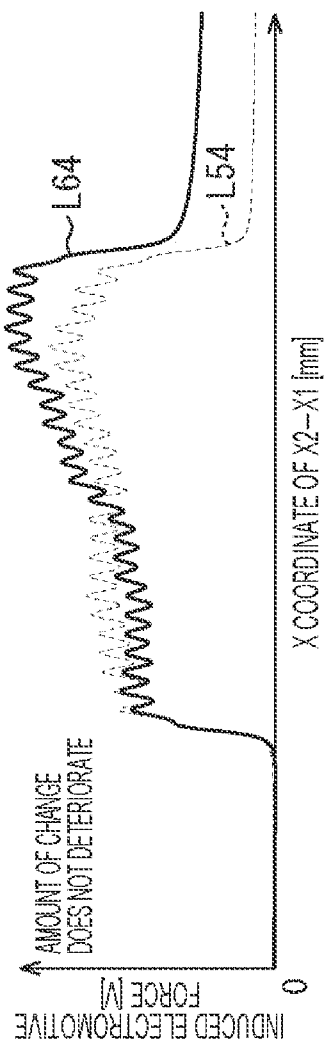

FIGS. 35A, 35B, and 35C illustrate changes in the induced electromotive force that causes the inductive noise in an image, as simulation results of cases where the eighth to tenth configuration examples (FIGS. 32A, 32B, 32C, 33A. 33B, 33C, 34A, 34B, and 34C) are applied to the solid-state imaging device 100. Note that the current conditions of the currents flowing in the eighth to tenth configuration examples are similar to that in the case illustrated in FIG. 30. The horizontal axis in FIGS. 35A, 35B, and 35C represent X-axis coordinates of the image, and the vertical axis represents the magnitude of the induced electromotive force.

The solid line L62 in FIG. 35A corresponds to the eighth configuration example (FIGS. 32A, 32B, and 32C), and the dotted line L52 corresponds to the fourth configuration example (FIGS. 25A, 25B, and 25C). As is clear from the comparison between the solid line L62 and the dotted line L52, it can be seen that the eighth configuration example does not deteriorate the change in the induced electromotive force to be generated in the Victim conductor loop as compared with the fourth configuration example. That is, even the eighth configuration example in which the relay conductor 302 is arranged in the gap of the reticulated conductor 272 of the conductor layer B can suppress the generation of the inductive noise in the image output from the solid-state imaging device 100 to the same extent as the fourth configuration example. Note that this simulation result is a simulation result of a case where the reticulated conductor 271 is not connected to the active element group 167 and the reticulated conductor 272 is not connected to the active element group 167. For example, in a case where at least a part of the reticulated conductor 271 and a part of the active element group 167 are connected via a conductor via or the like at substantially the shortest distance or a short distance, or in a case where at least a part of the reticulated conductor 272 and a part of the active element group 167 are connected via a conductor via or the like at substantially the shortest distance or a short distance, the amount of current flowing through the reticulated conductor 271 and the reticulated conductor 272 gradually decreases depending on the position. In such a case, there is also a condition that the voltage drop, energy loss, and inductive noise are significantly improved to less than half by providing the relay conductor 302.

The solid line L63 in FIG. 35B corresponds to the ninth configuration example (FIGS. 33A, 33B, and 33C), and the dotted line L53 corresponds to the fifth configuration example (FIGS. 26A, 26B, and 26C). As is clear from the comparison between the solid line L63 and the dotted line L53, it can be seen that the ninth configuration example does not deteriorate the change in the induced electromotive force to be generated in the Victim conductor loop as compared with the fifth configuration example. That is, even the ninth configuration example in which the relay conductor 303 is arranged in the gap of the reticulated conductor 282 of the conductor layer B can suppress the generation of the inductive noise in the image output from the solid-state imaging device 100 to the same extent as the fifth configuration example. Note that this simulation result is a simulation result of a case where the reticulated conductor 281 is not connected to the active element group 167 and the reticulated conductor 282 is not connected to the active element group 167. For example, in a case where at least a part of the reticulated conductor 281 and a part of the active element group 167 are connected via a conductor via or the like at the at substantially the shortest distance shortest distance or a short distance, or in a case where at least a part of the reticulated conductor 282 and a part of the active element group 167 are connected via a conductor via or the like at substantially the shortest distance or a short distance, the amount of current flowing through the reticulated conductor 281 and the reticulated conductor 282 gradually decreases depending on the position. In such a case, there is also a condition that the voltage drop, energy loss, and inductive noise are significantly improved to less than half by providing the relay conductor 303.

The solid line L64 in FIG. 35C corresponds to the tenth configuration example (FIGS. 34A, 34B, and 34C), and the dotted line L54 corresponds to the sixth configuration example (FIGS. 27A, 27B, and 27C). As is clear from the comparison between the solid line L64 and the dotted line L54, it can be seen that the tenth configuration example does not deteriorate the change in the induced electromotive force to be generated in the Victim conductor loop as compared with the sixth configuration example. That is, even the tenth configuration example in which the relay conductor 304 is arranged in the gap of the reticulated conductor 292 of the conductor layer B can suppress the generation of the inductive noise in the image output from the solid-state imaging device 100 to the same extent as the sixth configuration example. Note that this simulation result is a simulation result of a case where the reticulated conductor 291 is not connected to the active element group 167 and the reticulated conductor 292 is not connected to the active element group 167. For example, in a case where at least a part of the reticulated conductor 291 and a part of the active element group 167 are connected via a conductor via or the like at substantially the shortest distance or a short distance, or in a case where at least a part of the reticulated conductor 292 and a part of the active element group 167 are connected via a conductor via or the like at substantially the shortest distance or a short distance, the amount of current flowing through the reticulated conductor 291 and the reticulated conductor 292 gradually decreases depending on the position. In such a case, there is also a condition that the voltage drop, energy loss, and inductive noise are significantly improved to less than half by providing the relay conductor 304.

Furthermore, as is clear from the comparison of the solid lines L62 to L64, it can be seen that the tenth configuration example can further suppress the change in the induced electromotive force to be generated in the Victim conductor loop as compared with the eighth and ninth configuration examples, and can further suppress the inductive noise.

Eleventh Configuration Example

Figure 36A:
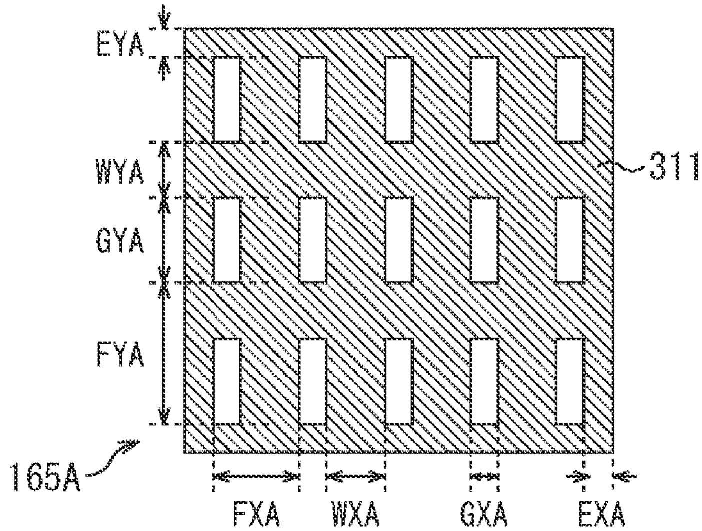
FIGS. 36A, 36B, and 36C are diagrams illustrating an eleventh configuration example of the conductor layers A and B.
Figure 36B:
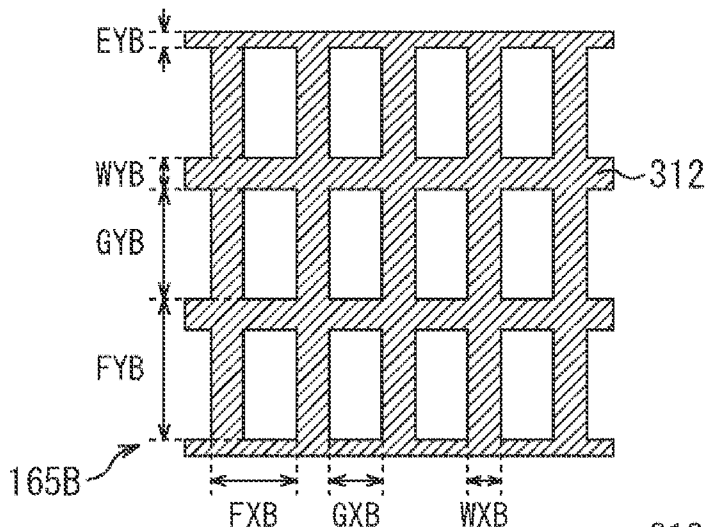
Figure 36C:
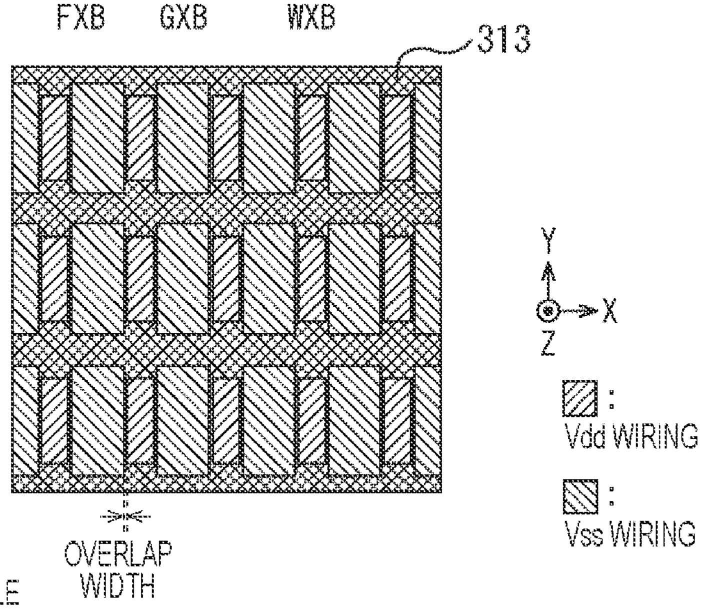

Next, FIGS. 36A, 36B, and 36C illustrate an eleventh configuration example of the conductor layers A and B. Note that FIG. 36A illustrates the conductor layer A, and FIG. 36B illustrates the conductor layer B. In the coordinate system in FIGS. 36A, 36B, and 36C, the horizontal direction is the X axis, the vertical direction is the Y axis, and the direction perpendicular to the XY plane is the Z axis.

The conductor layer A in the eleventh configuration example is configured by a reticulated conductor 311 having a resistance value in the X direction (first direction) and a resistance value in the Y direction (second direction) that are different from each other. The reticulated conductor 311 is, for example, wiring (Vss wiring) connected to the GND or the negative power supply.

The conductor width in the X direction of the reticulated conductor 311 is WXA, the gap width is GXA, the conductor period is FXA (=the conductor width WXA+the gap width GXA), and an end width is EXA (=the conductor width WXA/2). Furthermore, the conductor width in the Y direction of the reticulated conductor 311 is WYA, the gap width is GYA, the conductor period is FYA (=the conductor width WYA+the gap width GYA), and the end width is EYA (=the conductor width WYA/2). In the reticulated conductor 311, the gap width GYA>the gap width GXA is satisfied. Therefore, the gap region of the reticulated conductor 311 has a shape longer in the Y direction than in the X direction, the resistance values differ between the X direction and the Y direction, and the resistance value in the Y direction is smaller than the resistance value in the X direction.

The conductor layer B in the eleventh configuration example is configured by a reticulated conductor 312 having a resistance value in the X direction and a resistance value in the Y direction that are different from each other. The reticulated conductor 312 is, for example, wiring (Vdd wiring) connected to the positive power supply.

The conductor width in the X direction of the reticulated conductor 312 is WXB, the gap width is GXB, and the conductor period is FXB (=the conductor width WXB+the gap width GXB). Furthermore, the conductor width in the Y direction of the reticulated conductor 312 is WYB, the gap width is GYB, the conductor period is FYB (=the conductor width WYB+the gap width GYB), and the end width is EYB (=the conductor width WYB/2). In the reticulated conductor 312, the gap width GYB>the gap width GXB is satisfied. Therefore, the gap region of the reticulated conductor 312 has a shape longer in the Y direction than in the X direction, the resistance values differ between the X direction and the Y direction, and the resistance value in the Y direction is smaller than the resistance value in the X direction.

Note that, in a case where a sheet resistance value of the reticulated conductor 311 is larger than a sheet resistance value of the reticulated conductor 312, the reticulated conductor 311 and the reticulated conductor 312 desirably satisfy the following relationships.

The conductor width WYA≥the conductor width WYB

The conductor width WXA≥the conductor width WXB

The gap width GXA≤the gap width GXB

The gap width GYA≤the gap width GYB

On the contrary, in a case where the sheet resistance value of the reticulated conductor 311 is smaller than the sheet resistance value of the reticulated conductor 312, the reticulated conductor 311 and the reticulated conductor 312 desirably satisfy the following relationships.

The conductor width WYA≤the conductor width WYB

The conductor width WXA≤the conductor width WXB

The gap width GXA≥the gap width GXB

The gap width GYA≥the gap width GYB

Moreover, the sheet resistance values and the conductor widths of the reticulated conductors 311 and 312 desirably satisfy the following relationships.

(The sheet resistance value of reticulated conductor 311)/(the sheet resistance value of reticulated conductor 312)≈the conductor width WYA/the conductor width WYB (The sheet resistance value of reticulated conductor 311)/(the sheet resistance value of reticulated conductor 312)≈the conductor width WXA/the conductor width WXB The limitations regarding the dimensional relationship disclosed in the present specification are not essential, and the current distribution of the reticulated conductor 311 and the current distribution of the reticulated conductor 312 are desirably substantially uniform, substantially the same, or substantially similar, and have opposite characteristics.

For example, it is desirable that a ratio of the wiring resistance in the X direction of the reticulated conductor 311 and the wiring resistance in the Y direction of the reticulated conductor 311, and a ratio of the wiring resistance in the X direction of the reticulated conductor 312 and the wiring resistance in the Y direction of the reticulated conductor 312 be substantially the same.

Furthermore, it is desirable that a ratio of wiring inductance in the X direction of the reticulated conductor 311 and wiring inductance in the Y direction of the reticulated conductor 311, and a ratio of wiring inductance in the X direction of the reticulated conductor 312 and wiring inductance in the Y direction of the reticulated conductor 312 be substantially the same.

Furthermore, it is desirable that a ratio of wiring capacitance in the X direction of the reticulated conductor 311 and wiring capacitance in the Y direction of the reticulated conductor 311, and a ratio of wiring capacitance in the X direction of the reticulated conductor 312 and wiring capacitance in the Y direction of the reticulated conductor 312 be substantially the same.

Furthermore, it is desirable that a ratio of wiring impedance in the X direction of the reticulated conductor 311 and wiring impedance in the Y direction of the reticulated conductor 311, and a ratio of wiring impedance in the X direction of the reticulated conductor 312 and wiring impedance in the Y direction of the reticulated conductor 312 be substantially the same.

In other words, it is desirable but is not essential to satisfy one of the following relationships (the wiring resistance in the X direction of the reticulated conductor 311×the wiring resistance in the Y direction of the reticulated conductor 312)≈(the wiring resistance in the X direction of the reticulated conductor 312×the wiring resistance in the Y direction of the reticulated conductor 311), (the wiring inductance in the X direction of the reticulated conductor 311× the wiring inductance in the Y direction of the reticulated conductor 312) (the wiring inductance in the X direction of the reticulated conductor 312×the wiring inductance in the Y direction of the reticulated conductor 311), (the wiring capacitance in the X direction of the reticulated conductor 311×the wiring capacitance in the Y direction of the reticulated conductor 312) (the wiring capacitance in the X direction of the reticulated conductor 312×the wiring capacitance in the Y direction of the reticulated conductor 311), and (the wiring impedance in the X direction of the reticulated conductor 311×the wiring impedance in the Y direction of the reticulated conductor 312) (the wiring impedance in the X direction of the reticulated conductor 312×the wiring impedance in the Y direction of the reticulated conductor 311).

Note that the above-described wiring resistance, wiring inductance, wiring capacitance, and wiring impedance can be replaced with conductor resistance, conductor inductance, conductor capacitance, and conductor impedance, respectively.

Note that the above-described impedance Z, resistor R, inductance L, and capacitance C have a relationship of $Z=R+j\omega L+1\div(j\omega C)$, using an angular frequency ω and an imaginary unit j.

Note that the relationship among these ratios may be satisfied as a whole of the reticulated conductor 311 and the reticulated conductor 312 or may be satisfied within a part of the reticulated conductor 311 and the reticulated conductor 312, and it is sufficient that the relationship is satisfied within an arbitrary range.

Moreover, a circuit that adjusts the current distributions to be substantially uniform, substantially the same, or substantially similar, and to have opposite characteristics.

By satisfying the above-described relationships, the current distribution of the reticulated conductor 311 and the current distribution of the reticulated conductor 312 can be made substantially uniform and have opposite characteristics. Therefore, the magnetic field generated by the current distribution of the reticulated conductor 311 and the magnetic field generated by the current distribution of the reticulated conductor 312 can be effectively canceled.

FIG. 36C illustrates a state of the conductor layers A and B respectively illustrated in FIGS. 36A and 36B, which are viewed from the photodiode 141 side (back surface side). Note that a hatched region 313 where diagonal lines intersect in FIG. 36C represents a region where the reticulated conductor 311 of the conductor layer A and the reticulated conductor 312 of the conductor layer B overlap. In the case of the eleventh configuration example, since the active element group 167 is covered with at least one of the conductor layer A or the conductor layer B, the hot carrier light emission from the active element group 167 can be shielded.

Furthermore, in the case of the eleventh configuration example, the region 313 where the reticulated conductor 311 and the reticulated conductor 312 overlap is continuous in the X direction. In the region 313 where the reticulated conductor 311 and the reticulated conductor 312 overlap, currents having polarities different from each other flow in the reticulated conductor 311 and the reticulated conductor 312, and thus magnetic fields generated from the region 313 cancel each other. Therefore, generation of the inductive noise near the region 313 can be suppressed.

Furthermore, in the case of the eleventh configuration example, the gap width GYA in the Y direction and the gap width GXA in the X direction of the reticulated conductor 311 are formed to be different, and the gap width GYB in the Y direction and the gap width GXB in the X direction of the reticulated conductor 312 are formed to be different.

By forming the reticulated conductors 311 and 312 to have the shapes having a difference in the gap widths in the X direction and the Y direction, restrictions such as dimensions of a wiring region, dimensions of a gap region, and occupancy of the wiring region in each conductor layer in actually designing and manufacturing the conductor layers can be secured, and the degree of freedom in designing wiring layout can be increased. Furthermore, the wiring can be designed in a layout that is advantageous in terms of voltage drop (IR-Drop), inductive noise, and the like, as compared with a case having no difference in the gap widths.

Figure 37:
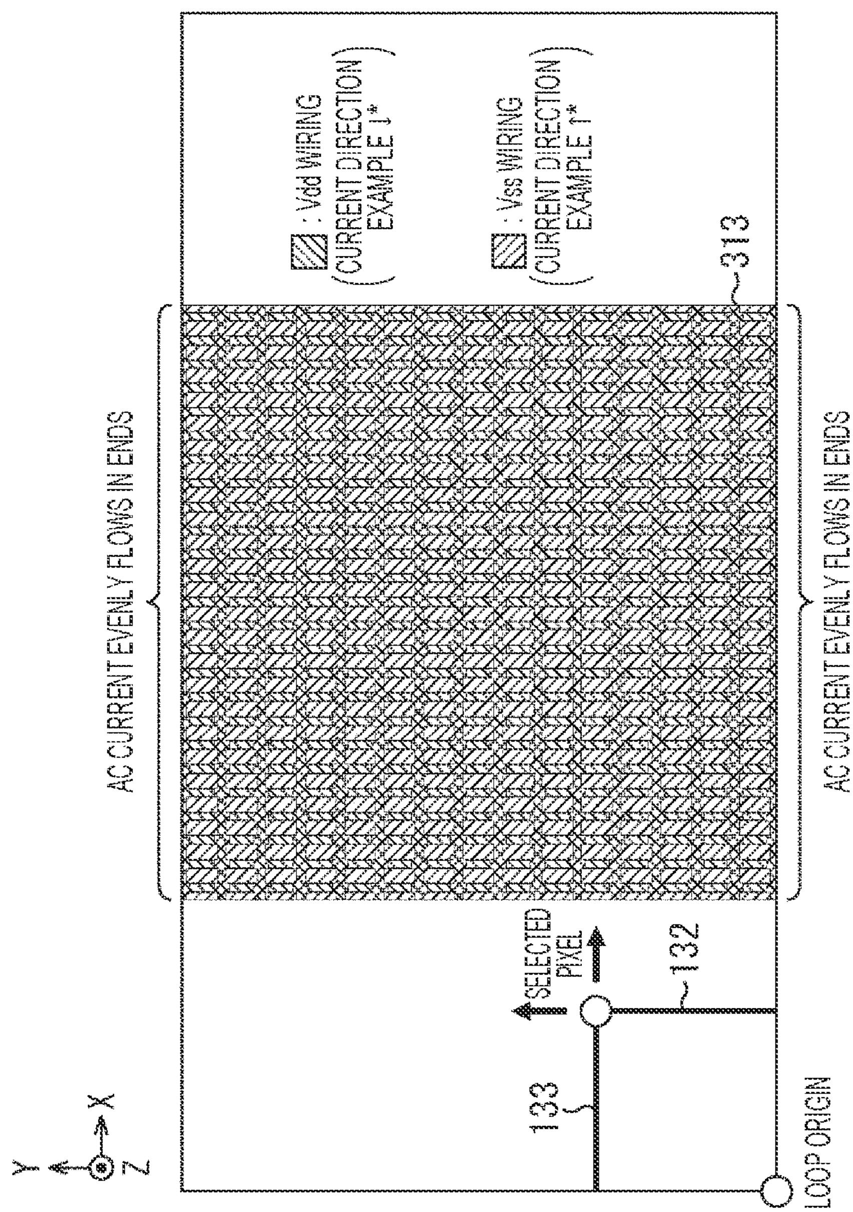
FIG. 37 is a diagram illustrating a current condition of a current flowing in the eleventh configuration example.

FIGS. 37A, 37B, and 37C are diagrams illustrating the current condition of the current flowing in the eleventh configuration example (FIGS. 36A, 36B, and 36C).

It is assumed that AC current evenly flows in ends of the reticulated conductor 311 constituting the conductor layer A and the reticulated conductor 312 constituting the conductor layer B. However, the current direction changes with time. For example, when the current flows through the reticulated conductor 312 that is the Vdd wiring from the upper side to the lower side of the drawing, the current flows through the reticulated conductor 311 that is the Vss wiring from the lower side to the upper side of the drawing.

In the eleventh configuration example, in a case where the current flows as illustrated in FIGS. 37A, 37B, and 37C, the magnetic fluxes in the substantially X direction and the substantially Y direction are likely to be generated between the reticulated conductor 311 that is the Vss wiring and the reticulated conductor 312 that is the Vdd wiring by the conductor loop with the loop plane approximately perpendicular to the X axis and the conductor loop with the loop plane approximately perpendicular to the Y axis, the conductor loops being generated including (cross sections of) the reticulated conductors 311 and 312 in a cross section where the reticulated conductors 311 and 312 are arranged.

Meanwhile, the Victim conductor loop formed using the signal line 132 and the control line 133 is formed in the XY plane in the pixel array 121 of the first semiconductor substrate 101 stacked on the second semiconductor substrate 102 in which the light-shielding structure 151 formed using the conductor layers A and B is formed. In the Victim conductor loop formed on the XY plane, the induced electromotive force is likely to be generated by the magnetic flux in the Z direction, and an image output from the solid-state imaging device 100 further deteriorates (the inductive noise increases) as a change in the induced electromotive force is larger.

Moreover, when the effective dimensions of the Victim conductor loop formed using the signal line 132 and the control line 133 are changed due to movement of selected pixels in the pixel array 121, the change in the induced electromotive force becomes remarkable.

In the case of the eleventh configuration example, the direction (approximately X direction or approximately Y direction) of the magnetic flux generated from the loop plane of the Aggressor conductor loop of the light-shielding structure 151 formed using the conductor layers A and B and the direction (Z direction) of the magnetic flux to generate the induced electromotive force in the Victim conductor loop are substantially orthogonal and differ by approximately 90 degrees. In other words, the direction of the loop plane where the magnetic flux is generated from the Aggressor conductor loop and the direction of the loop plane where the induced electromotive force is generated in the Victim conductor loop differ by approximately 90 degrees. Therefore, it is expected that the deterioration (generation of inductive noise) of the image output from the solid-state imaging device 100 is less than that in the first comparative example.

Figures 38A, 38B, 38C:
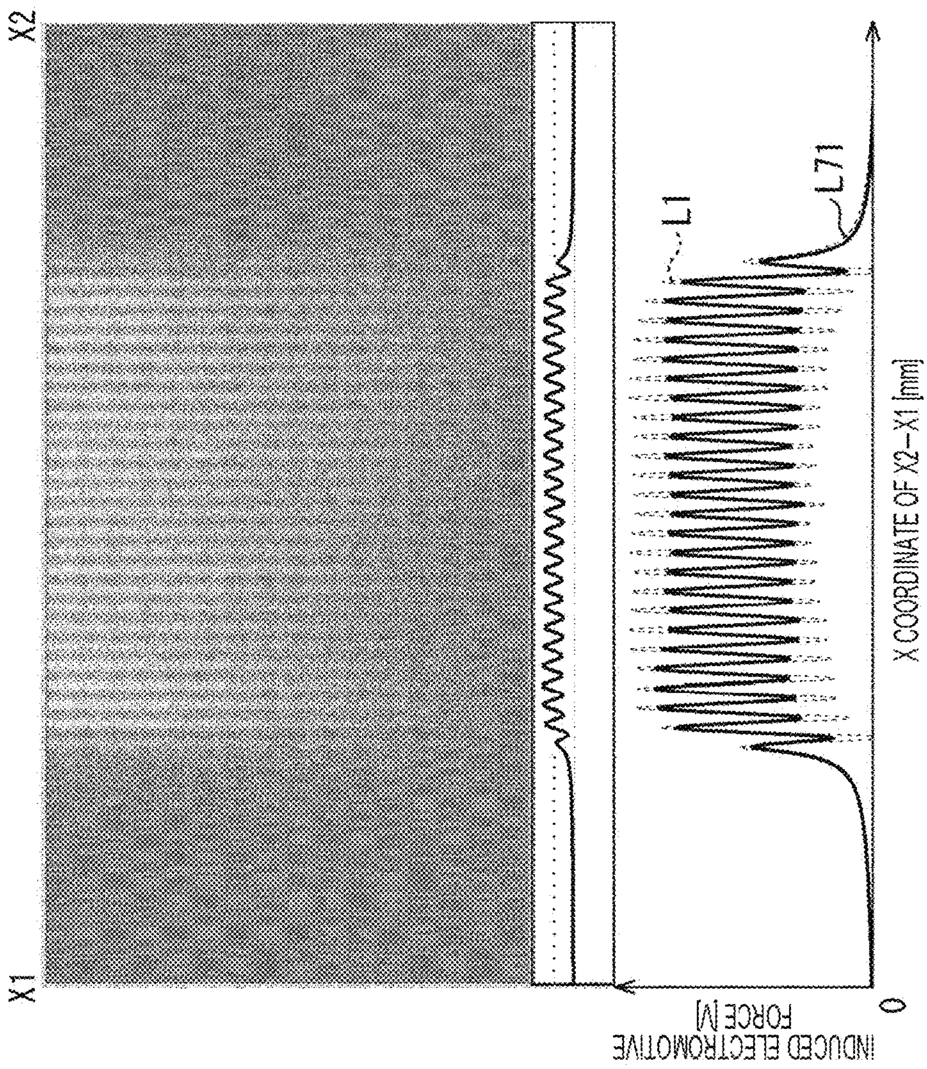
FIGS. 38A, 38B, and 38C are diagrams illustrating a simulation result of inductive noise corresponding to the eleventh configuration example.

FIGS. 38A, 38B, and 38C illustrate a simulation result of the inductive noise generated in the case where the eleventh configuration example (FIGS. 36A, 36B, and 36C) is applied to the solid-state imaging device 100.

FIG. 38A illustrates an image in which the inductive noise can be generated, the image being output from the solid-state imaging device 100. FIG. 38B illustrates a change in a pixel signal in the line segment X1-X2 of the image illustrated in FIG. 38A. FIG. 38C illustrates the solid line L71 representing induced electromotive force that generates the inductive noise in the image. The horizontal axis of FIG. 38C represents X-axis coordinates of the image, and the vertical axis represents the magnitude of the induced electromotive force. Note that the dotted line L1 in FIG. 38C corresponds to the first comparative example (FIGS. 9A, 9B, and 9C).

As is clear from the comparison of the solid line L71 and the dotted line L1 illustrated in FIG. 38C, it can be seen that the eleventh configuration example can suppress the change in the induced electromotive force to be generated in the Victim conductor loop as compared with the first comparative example, and can suppress the inductive noise.

Twelfth Configuration Example

Figure 39A:
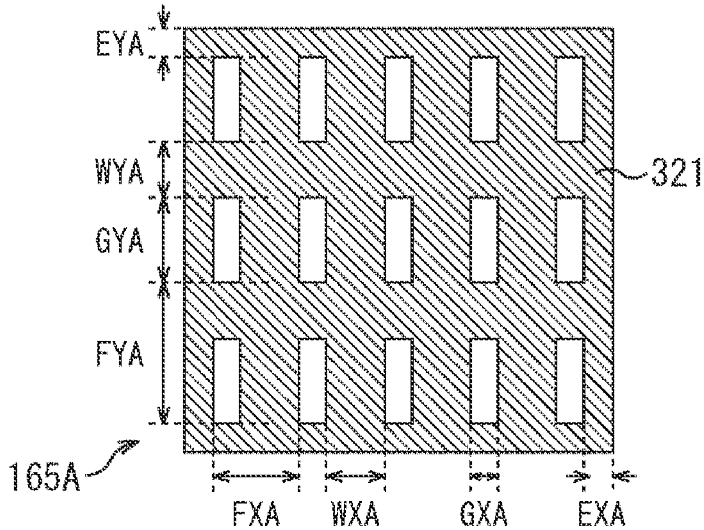
FIGS. 39A, 39B, and 39C are diagrams illustrating a twelfth configuration example of the conductor layers A and B.
Figure 39B:
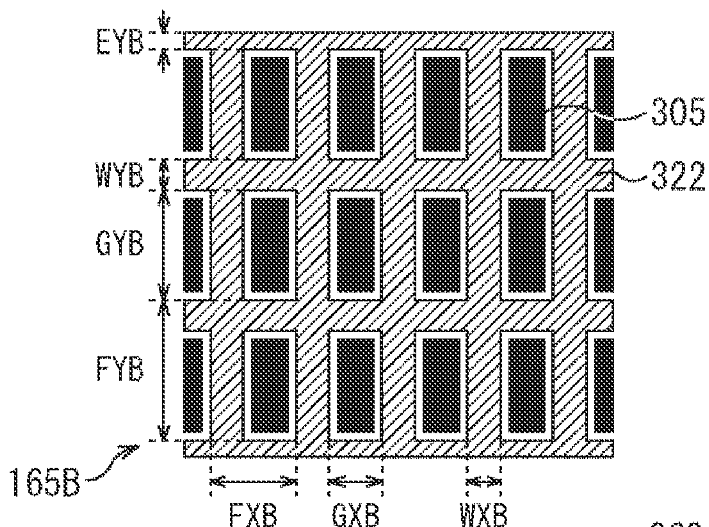
Figure 39C:
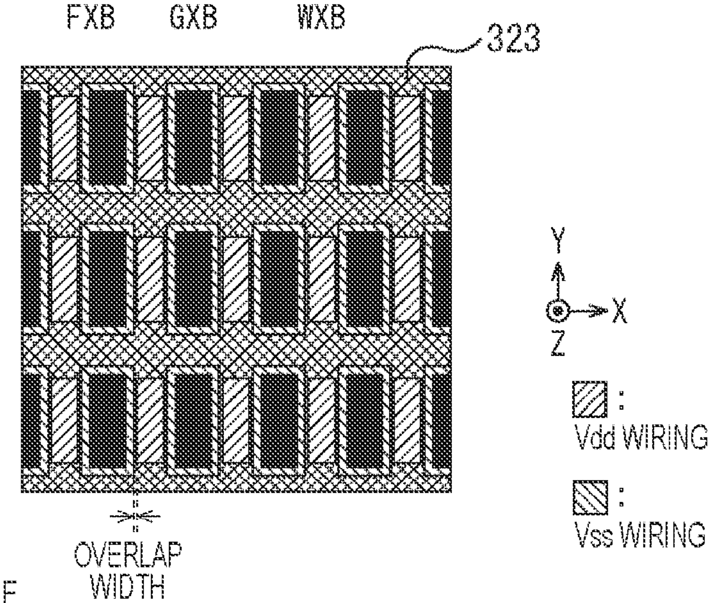

Next, FIGS. 39A, 39B, and 39C illustrate a twelfth configuration example of the conductor layers A and B. Note that FIG. 39A illustrates the conductor layer A, and FIG. 39B illustrates the conductor layer B. In the coordinate system in FIGS. 39A, 39B, and 39C, the horizontal direction is the X axis, the vertical direction is the Y axis, and the direction perpendicular to the XY plane is the Z axis.

The conductor layer A in the twelfth configuration example is configured by a reticulated conductor 321. Since the reticulated conductor 321 has a similar shape to the reticulated conductor 311 of the conductor layer A in the eleventh configuration example (FIGS. 36A, 36B, and 36C), the description thereof is omitted. The reticulated conductor 321 is, for example, wiring (Vss wiring) connected to the GND or the negative power supply.

The conductor layer B in the twelfth configuration example is configured by a reticulated conductor 322 and a relay conductor 305. Since the reticulated conductor 322 has a similar shape to the reticulated conductor 312 of the conductor layer B in the eleventh configuration example (FIGS. 36A, 36B, and 36C), the description thereof is omitted. The reticulated conductor 322 is, for example, wiring (Vdd wiring) connected to the positive power supply.

The relay conductor (another conductor) 305 is arranged in a rectangular gap region long in the Y direction other than the conductor of the reticulated conductor 322 and is electrically insulated from the reticulated conductor 322, and is connected to Vss to which the reticulated conductor 321 of the conductor layer A is connected Note that the shape of the relay conductor 305 is arbitrary, and a symmetric circular or polygonal shape such as rotational symmetry or mirror plane symmetry is desirable. The relay conductor 305 can be arranged in a center of or at any other position of the gap region of the reticulated conductor 322. The relay conductor 305 may be connected to a conductor layer as Vss wiring different from the conductor layer A. The relay conductor 305 may be connected to a conductor layer as Vss wiring closer to the active element group 167 than the conductor layer B. The relay conductor 305 can be connected to a conductor layer different from the conductor layer A or a conductor layer or the like closer to the active element group 167 than the conductor layer B via the conductor via (VIA) extending in the Z direction.

FIG. 39C illustrates a state of the conductor layers A and B respectively illustrated in FIGS. 39A and 39B, which are viewed from the photodiode 141 side (back surface side). Note that a hatched region 323 in FIG. 39C where diagonal lines intersect represents a region where the reticulated conductor 321 of the conductor layer A and the reticulated conductor 322 of the conductor layer B overlap. In the case of the twelfth configuration example, since the active element group 167 is covered with at least one of the conductor layer A or the conductor layer B, the hot carrier light emission from the active element group 167 can be shielded.

In the twelfth configuration example, in a case where the current flows similarly to the case illustrated in FIGS. 37A, 37B, and 37C, the magnetic fluxes in the substantially X direction and the substantially Y direction are likely to be generated between the reticulated conductor 321 that is the Vss wiring and the reticulated conductor 322 that is the Vdd wiring by the conductor loop with the loop plane approximately perpendicular to the X axis and the conductor loop with the loop plane approximately perpendicular to the Y axis, the conductor loops being generated including (cross sections of) the reticulated conductors 321 and 322 in a cross section where the reticulated conductors 321 and 322 are arranged.

Moreover, in the case of the twelfth configuration example, the region 323 where the reticulated conductor 321 and the reticulated conductor 322 overlap is continuous in the X direction. In the region 323 where the reticulated conductor 321 and the reticulated conductor 322 overlap, currents having polarities different from each other flow in the reticulated conductor 321 and the reticulated conductor 322, and thus magnetic fields generated from the region 323 cancel each other. Therefore, generation of the inductive noise near the region 323 can be suppressed.

Furthermore, in the case of the twelfth configuration example, by providing the relay conductor 305, the reticulated conductor 321 as Vss wiring can be connected with the active element group 167 at substantially the shortest distance or a short distance. By connecting the reticulated conductor 321 and the active element group 167 at substantially the shortest distance or a short distance, the voltage drop, energy loss, or inductive noise between the reticulated conductor 321 and the active element group 167 can be reduced.

Note that the twelfth configuration example may be rotated by 90 degrees in an XY plane shape and used. Furthermore, the angle is not limited to 90 degrees and the configuration may be rotated by an arbitrary angle and used. For example, the configuration may be diagonal with respect to the X axis and the Y axis.

Thirteenth Configuration Example

Figure 40A:
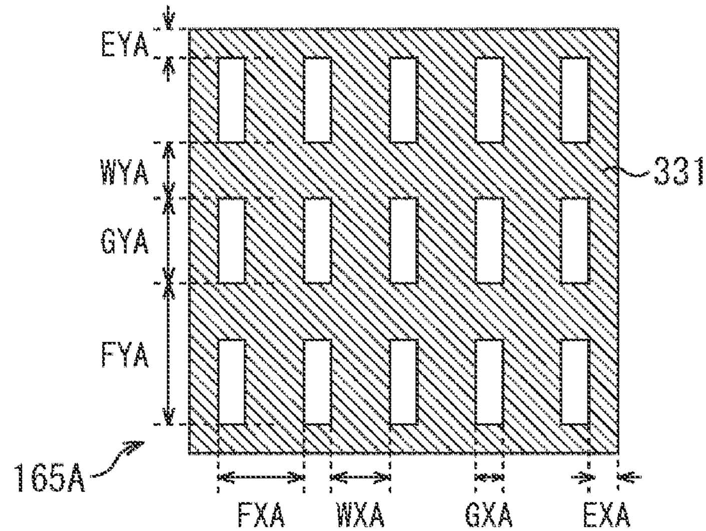
FIGS. 40A, 40B, and 40C are diagrams illustrating a thirteenth configuration example of the conductor layers A and B.
Figure 40B:
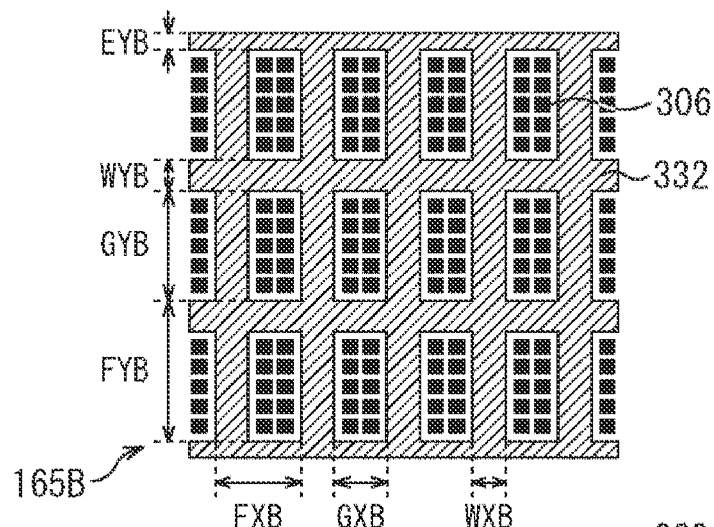
Figure 40C:
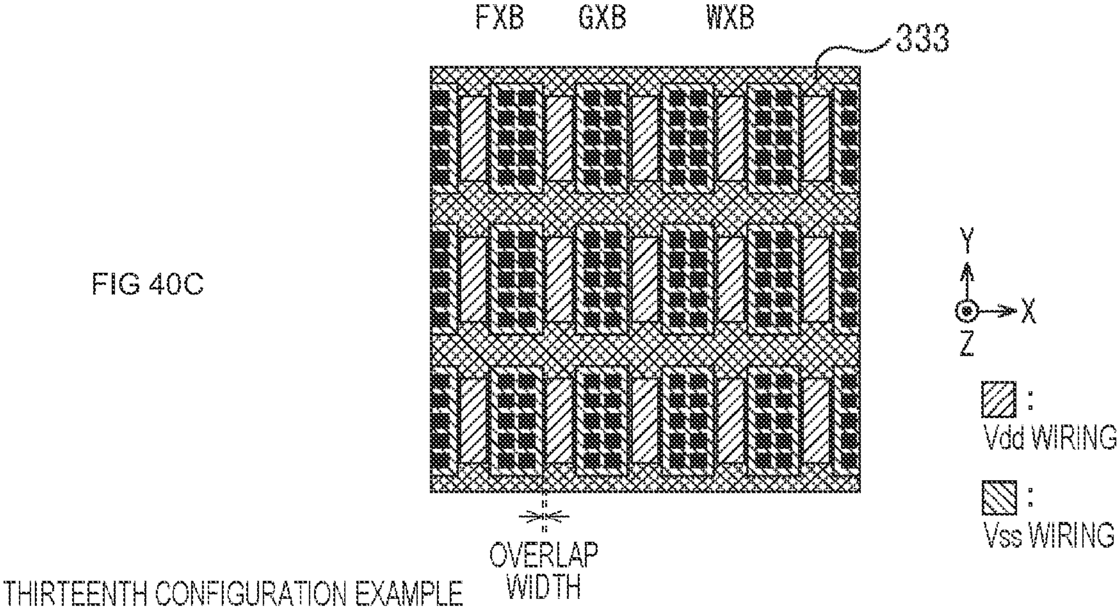

Next, FIGS. 40A, 40B, and 40C illustrate a thirteenth configuration example of the conductor layers A and B. Note that FIG. 40A illustrates the conductor layer A, and FIG. 40B illustrates the conductor layer B. In the coordinate system in FIGS. 40A, 40B, and 40C, the horizontal direction is the X axis, the vertical direction is the Y axis, and the direction perpendicular to the XY plane is the Z axis.

The conductor layer A in the thirteenth configuration example is configured by a reticulated conductor 331. Since the reticulated conductor 331 has a similar shape to the reticulated conductor 311 of the conductor layer A in the eleventh configuration example (FIGS. 36A, 36B, and 36C), the description thereof is omitted. The reticulated conductor 331 is, for example, wiring (Vss wiring) connected to the GND or the negative power supply.

The conductor layer B in the thirteenth configuration example is configured by a reticulated conductor 332 and a relay conductor 306. Since the reticulated conductor 332 has a similar shape to the reticulated conductor 312 of the conductor layer B in the eleventh configuration example (FIGS. 36A, 36B, and 36C), the description thereof is omitted. The reticulated conductor 332 is, for example, wiring (Vdd wiring) connected to the positive power supply.

The relay conductor (another conductor) 306 is obtained by dividing the relay conductor 305 in the twelfth configuration example (FIGS. 39A, 39B, and 39C) into a plurality of (10 in the case of FIGS. 40A, 40B, and 40C) parts with a space. The relay conductor 306 is arranged in a rectangular gap region long in the Y direction of the reticulated conductor 332 and is electrically insulated from the reticulated conductor 332, and is connected to Vss to which the reticulated conductor 331 of the conductor layer A is connected The number of divisions of the relay conductor and the presence/absence of connection to Vss may be different depending on a region. In this case, the current distribution can be finely adjusted at the time of design, leading to suppression of the inductive noise and reduction of the voltage drop (IR-Drop).

Note that the shape of the relay conductor 306 is arbitrary, and a symmetric circle or polygon such as rotational symmetry or mirror plane symmetry is desirable. The number of divisions of the relay conductor 306 can be arbitrarily changed. The relay conductor 306 can be arranged in a center of or at any other position of the gap region of the reticulated conductor 332. The relay conductor 306 may be connected to a conductor layer as Vss wiring different from the conductor layer A. The relay conductor 306 may be connected to a conductor layer as Vss wiring closer to the active element group 167 than the conductor layer B. The relay conductor 306 can be connected to a conductor layer different from the conductor layer A or to a conductor layer or the like closer to the active element group 167 than the conductor layer B via the conductor via (VIA) extending in the Z direction.

FIG. 40C illustrates a state of the conductor layers A and B respectively illustrated in FIGS. 40A and 40B, which are viewed from the photodiode 141 side (back surface side). Note that a hatched region 333 where diagonal lines intersect in FIG. 40C represents a region where the reticulated conductor 331 of the conductor layer A and the reticulated conductor 332 of the conductor layer B overlap. In the case of the thirteenth configuration example, since the active element group 167 is covered with at least one of the conductor layer A or the conductor layer B, the hot carrier light emission from the active element group 167 can be shielded.

In the thirteenth configuration example, in a case where the current flows similarly to the case illustrated in FIGS. 37A, 37B, and 37C, the magnetic fluxes in the substantially X direction and the substantially Y direction are likely to be generated between the reticulated conductor 331 that is the Vss wiring and the reticulated conductor 332 that is the Vdd wiring by the conductor loop with the loop plane approximately perpendicular to the X axis and the conductor loop with the loop plane approximately perpendicular to the Y axis, the conductor loops being generated including (cross sections of) the reticulated conductors 331 and 332 in a cross section where the reticulated conductors 331 and 332 are arranged.

Moreover, in the case of the thirteenth configuration example, the region 333 where the reticulated conductor 331 and the reticulated conductor 332 overlap is continuous in the X direction. In the region 333, currents having polarities different from each other flow in the reticulated conductor 331 and the reticulated conductor 332, and thus magnetic fields generated from the region 333 cancel each other. Therefore, generation of the inductive noise near the region 333 can be suppressed.

Furthermore, in the case of the thirteenth configuration example, by providing the relay conductor 306, the reticulated conductor 331 as Vss wiring can be connected with the active element group 167 at substantially the shortest distance or a short distance. By connecting the reticulated conductor 331 and the active element group 167 at substantially the shortest distance or a short distance, the voltage drop, energy loss, or inductive noise between the reticulated conductor 331 and the active element group 167 can be reduced.

Furthermore, in the thirteenth configuration example, the relay conductor 306 is divided into the plurality of parts, the current distribution in the conductor layer A and the current distribution in the conductor layer B can be made substantially uniform and have opposite polarities. Therefore, the magnetic field generated from the conductor layer A and the magnetic field generated from the conductor layer B can cancel each other. Therefore, in the thirteenth configuration example, it is possible to make it difficult to cause a current distribution difference between the Vdd wiring and the Vss wiring due to an external factor. Therefore, the sixteenth configuration example is suitable for a case where the current distribution of the XY plane is complicated, or a case where the impedances of the conductors connected to the reticulated conductors 331 and 332 are different between the Vdd wiring and the Vss wiring.

Note that the thirteenth configuration example may be rotated by 90 degrees in an XY plane shape and used. Furthermore, the angle is not limited to 90 degrees and the configuration may be rotated by an arbitrary angle and used. For example, the configuration may be diagonal with respect to the X axis and the Y axis.

Simulation Results of Twelfth and Thirteenth Configuration Examples

Figure 41A:
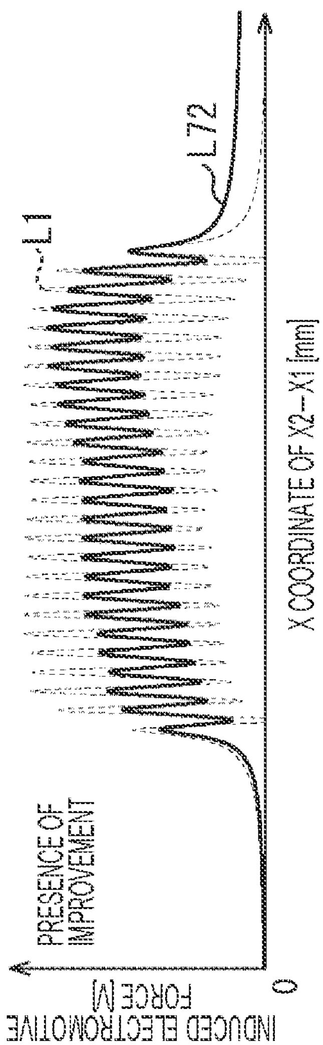
FIGS. 41A and 41B are diagrams illustrating simulation results of inductive noise corresponding to the twelfth and thirteenth configuration examples.
Figure 41B:
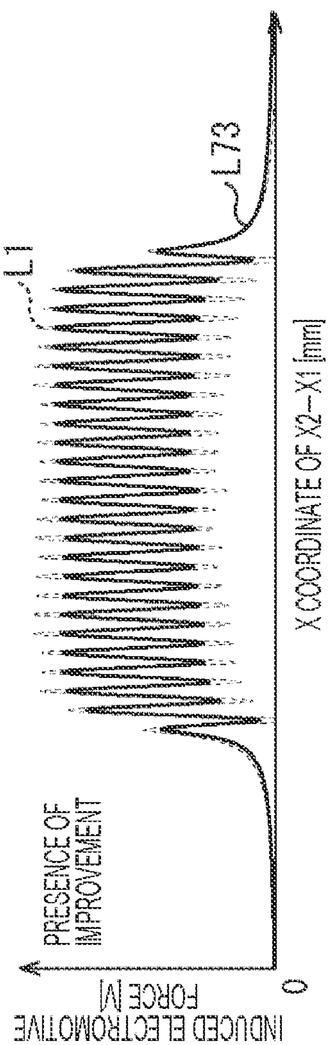

FIGS. 41A and 41B illustrate changes in the induced electromotive force that causes the inductive noise in an image, as simulation results of cases where the twelfth (FIGS. 39A, 39B, and 39C) and thirteenth (FIGS. 40A, 40B, and 40C) configuration examples are applied to the solid-state imaging device 100. Note that the current conditions of the currents flowing in twelfth and thirteenth configuration examples are similar to that in the case illustrated in FIGS. 37A, 37B, and 37C. The horizontal axis in FIGS. 41A and 41B represent X-axis coordinates of the image, and the vertical axis represents the magnitude of the induced electromotive force.

The solid line L72 in FIG. 41A corresponds to the twelfth configuration example (FIGS. 39A, 39B, and 39C), and the dotted line L1 corresponds to the first comparative example (FIGS. 9A, 9B, and 9C). As is clear from the comparison between the solid line L72 and the dotted line L1, it can be seen that the twelfth configuration example does not change the induced electromotive force to be generated in the Victim conductor loop as compared with the first comparative example. Therefore, the twelfth configuration example can suppress the inductive noise in the image output from the solid-state imaging device 100 as compared with the first comparative example. Note that this simulation result is a simulation result of a case where the reticulated conductor is not connected to the active element group 167 and the reticulated conductor 322 is not connected to the active element group 167. For example, in a case where at least a part of the reticulated conductor 321 and a part of the active element group 167 are connected via a conductor via or the like at substantially the substantially shortest distance or a short distance, or in a case where at least a part of the reticulated conductor 322 and a part of the active element group 167 are connected via a conductor via or the like at substantially the shortest distance or a short distance, the amount of current flowing through the reticulated conductor 321 and the reticulated conductor 322 gradually decreases depending on the position. In such a case, there is a condition that the voltage drop, energy loss, and inductive noise are significantly improved to less than half by providing the relay conductor 305.

The solid line L73 in B in FIG. 41B corresponds to the thirteenth configuration example (FIGS. 40A, 40B, and 40C), and the dotted line L1 corresponds to the first comparative example (FIGS. 9A, 9B, and 9C). As is clear from the comparison between the solid line L73 and the dotted line L1, it can be seen that the thirteenth configuration example does not change the induced electromotive force to be generated in the Victim conductor loop as compared with the first comparative example. Therefore, the thirteenth configuration example can suppress the inductive noise in the image output from the solid-state imaging device 100 as compared with the first comparative example. Note that this simulation result is a simulation result of a case where the reticulated conductor 331 is not connected to the active element group 167 and the reticulated conductor 332 is not connected to the active element group 167. For example, in a case where at least a part of the reticulated conductor 331 and a part of the active element group 167 are connected via a conductor via or the like at substantially the shortest distance or a short distance, or in a case where at least a part of the reticulated conductor 332 and a part of the active element group 167 are connected via a conductor via or the like at substantially the shortest distance or a short distance, the amount of current flowing through the reticulated conductor 331 and the reticulated conductor 332 gradually decreases depending on the position. In such a case, there is also a condition that the voltage drop, energy loss, and inductive noise are significantly improved to less than half by providing the relay conductor 306.

5. Arrangement Example of Electrodes in Semiconductor Substrate in which Conductor Layers A and B are Formed Next, arrangement of electrodes in a semiconductor substrate in which conductors having different resistance values in the X direction and the Y direction are formed, as in the eleventh to thirteenth configuration examples of the conductor layers A and B, will be described.

Note that the following description will be given using a case in which the thirteenth configuration example (FIGS. 40A, 40B, and 40C) including the conductor layers A and B including the conductors (the reticulated conductors 331 and 332) in which the resistance value in the Y direction is smaller than the resistance value in the X direction is formed in a semiconductor substrate as an example. Note that, the same applies to cases where the eleventh and twelfth configuration examples of the conductor layers A and B including the conductors in which the resistance value in the Y direction is smaller than the resistance value in the X direction are formed in a semiconductor substrate.

In the thirteenth configuration example of the conductor layers A and B formed in the semiconductor substrate, since the resistance values of the conductors (reticulated conductors 331 and 332) in the Y direction are smaller than the resistance values in the X direction, a current easily flows in the Y direction. Therefore, to make the voltage drop (IR-Drop) in the conductors in the thirteenth configuration example of the conductor layers A and B as small as possible, it is desirable to arrange a plurality of pads (electrodes) to be arranged in the semiconductor substrate more densely in the X direction that is the direction with the large resistance value than in the Y direction that is the direction with the small resistance value. However, the pads may be more densely arranged in the Y direction than in the X direction.

First Arrangement Example of Pads on Semiconductor Substrate

FIGS. 42A, 42B, 42C, 42D, and 42E is a are plan views illustrating a first arrangement example in which the pads are arranged more densely in the X direction than in the Y direction on the semiconductor substrate. Note that, in the coordinate system in FIGS. 42A, 42B, 42C, 42D, and 42E, the horizontal direction is the X axis, the vertical direction is the Y axis, and the direction perpendicular to the XY plane is the Z axis.

Figures 42A, 42B, 42C, 42D, 42E:
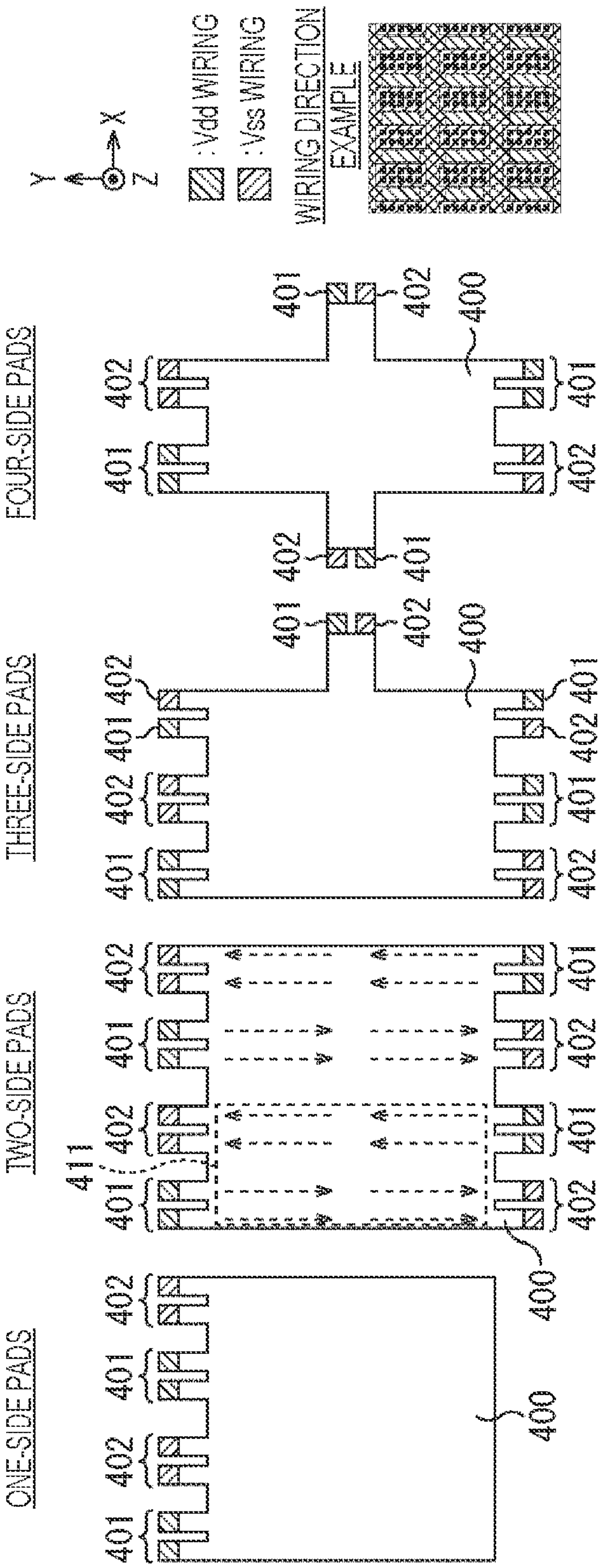
FIGS. 42A, 42B, 42C, 42D, and 42E are plan views illustrating a first arrangement example of pads on a semiconductor substrate.

FIG. 42A illustrates a case of arranging pads on one side of a wiring region 400 in which a plurality of the thirteenth configuration examples (FIGS. 40A, 40B, and 40C) each including the conductor layers A and B is formed. FIG. 42B illustrates a case of arranging pads on two sides facing each other in the Y direction of the wiring region 400 in which a plurality of the thirteenth configuration examples (FIGS. 40A, 40B, and 40C) each including the conductor layers A and B is formed. Note that the dotted arrow in the figure illustrates an example of the direction of the current flowing there, and a current loop 411 by the current illustrated by the dotted arrow is generated. The direction of the current indicated by the dotted arrow changes from moment to moment.

FIG. 42D illustrates a case of arranging pads on three sides of the wiring region 400 in which a plurality of the thirteenth configuration examples (FIGS. 40A 40B, and 40C) each including the conductor layers A and B is formed. D in FIG. 42D illustrates a case of arranging pads on four sides of the wiring region 400 in which a plurality of the thirteenth configuration examples (FIGS. 40A, 40B, and 40C) each including the conductor layers A and B is formed. E in FIG. 42E illustrates the orientation of the plurality of thirteenth configuration examples of the conductor layers A and B formed in the wiring region 400.

A pad 401 arranged in the wiring region 400 is connected to the Vdd wiring, and a pad 402 is, for example, wiring (Vss wiring) connected to the GND or the negative power supply.

In the case of the first arrangement example illustrated in FIGS. 42A, 42B. 42C, 42D, and 42E, each of the pads 401 and 402 includes one or a plurality (two in the case of FIGS. 42A, 42B, 42C, 42D, and 42E) of adjacently arranged pads. The pads 401 and 402 are arranged adjacent to each other. The pad 401 including one pad and the pad 402 including one pad are arranged adjacent to each other, and the pad 401 including two pads and the pad 402 including two pads are arranged adjacent to each other. The polarities of the pads 401 and 402 (the connection destination is the Vdd wiring or the Vss wiring) are opposite polarities. The number of pads 401 and the number of pads 402 arranged in the wiring region 400 are substantially the same.

As a result, the current distributions respectively flowing through the conductor layers A and B formed in the wiring region 400 can be made substantially uniform and have opposite polarities. Therefore, the magnetic fields respectively generated from the conductor layers A and B and the induced electromotive forces based on the magnetic fields can be effectively canceled.

Furthermore, as illustrated in and D in FIGS. 42B, 42C, and 42D, in a case where the pads are formed on two or more sides of the wiring region 400, the polarities of the pads facing each other on the opposite sides are opposite. As a result, as illustrated by the dotted arrows in FIG. 42B, currents in the same direction are likely to be distributed at positions where the X coordinate of the wiring region 400 is common and the Y coordinates are different.

Second Arrangement Example of Pads on Semiconductor Substrate

Next, FIGS. 43A, 43B, 43C, and 43D are plan view illustrating a second arrangement example in which the pads are arranged more densely in the X direction than in the Y direction on the semiconductor substrate. Note that, in the coordinate system in FIGS. 43A, 43B, 43C, and 43D, the horizontal direction is the X axis, the vertical direction is the Y axis, and the direction perpendicular to the XY plane is the Z axis.

Figures 43A, 43B, 43C, 43D:
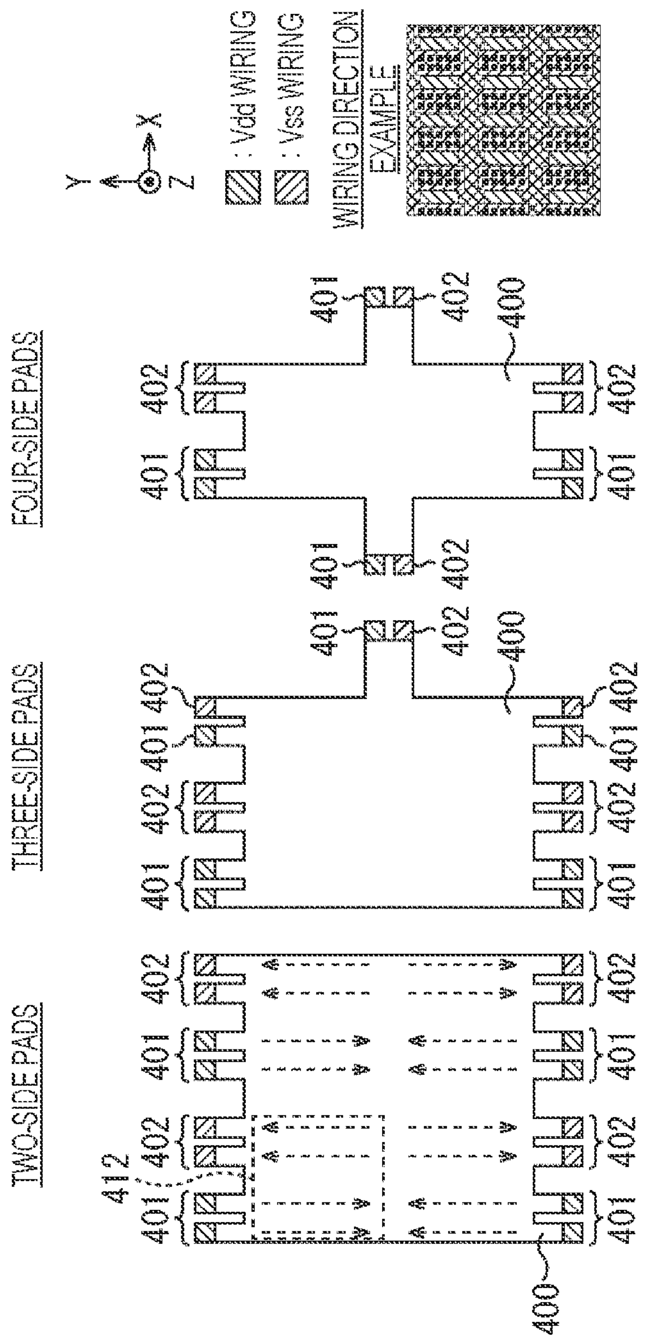
FIGS. 43A, 43B, 43C, and 43D are plan views illustrating a second arrangement example of pads on a semiconductor substrate.

FIG. 43A illustrates a case of arranging pads on two sides facing each other in the Y direction of the wiring region 400 in which a plurality of the thirteenth configuration examples (FIGS. 40A, 40B, and 40C) each including the conductor layers A and B is formed. Note that the dotted arrow in the figure illustrates the direction of the current flowing there, and a current loop 412 by the current illustrated by the dotted arrow is generated. The direction of the current indicated by the dotted arrow changes from moment to moment.

FIG. 43B illustrates a case of arranging pads on three sides of the wiring region 400 in which a plurality of the thirteenth configuration examples (FIGS. 40A 40B, and 40C) each including the conductor layers A and B is formed. FIG. 43D illustrates a case of arranging pads on four sides of the wiring region 400 in which a plurality of the thirteenth configuration examples (FIGS. 40A, 40B, and 40C) each including the conductor layers A and B is formed. D in FIG. 43D illustrates the orientation of the plurality of thirteenth configuration examples of the conductor layers A and B formed in the wiring region 400.

The pad 401 arranged in the wiring region 400 is connected to the Vdd wiring, and the pad 402 is, for example, wiring (Vss wiring) connected to the GND or the negative power supply.

In the case of the second arrangement example illustrated in FIGS. 43A 43B, 43C, 43D, and 43E, each of the pads 401 and 402 includes a plurality (two in the case of FIGS. 43A, 43B, 43C, 43D, and 43E) of adjacently arranged pads. The pads 401 and 402 are arranged adjacent to each other. The pad 401 including one pad and the pad 402 including one pad are arranged adjacent to each other, and the pad 401 including two pads and the pad 402 including two pads are arranged adjacent to each other. The polarities of the pads 401 and 402 (the connection destination is the Vdd wiring or the Vss wiring) are opposite polarities. The number of pads 401 and the number of pads 402 arranged in the wiring region 400 are substantially the same.

As a result, the current distributions respectively flowing through the conductor layers A and B formed in the wiring region 400 can be made substantially uniform and have opposite polarities. Therefore, the magnetic fields respectively generated from the conductor layers A and B and the induced electromotive forces based on the magnetic fields can be effectively canceled.

Moreover, in the second arrangement example, the polarities of the pads facing each other on the opposite sides are the same. Note that the polarities of some of the pads facing each other on the opposite sides may be opposite. As a result, a current loop 412, which is smaller than the current loop 411 illustrated in FIG. 42B, is generated in the wiring region 400. The size of the current loop affects the distribution range of the magnetic field, and the smaller the electric field loop, the narrower the distribution range of the magnetic field. Therefore, in the second arrangement example, the distribution range of the magnetic field is narrower than that in the first arrangement example. Therefore, in the second arrangement example, the generated induced electromotive force and the inductive noise based on the induced electromotive force can be made smaller than that in the first arrangement example.

Third Arrangement Example of Pads on Semiconductor Substrate

Next, FIGS. 44A, 44B, 44C, 44D, and 44E are plan view illustrating a third arrangement example in which the pads are arranged more densely in the X direction than in the Y direction on the semiconductor substrate. Note that, in the coordinate system in FIGS. 44A, 44B, 44C, 44D, and 44E, the horizontal direction is the X axis, the vertical direction is the Y axis, and the direction perpendicular to the XY plane is the Z axis.

Figures 44A, 44B, 44C, 44D, 44E:
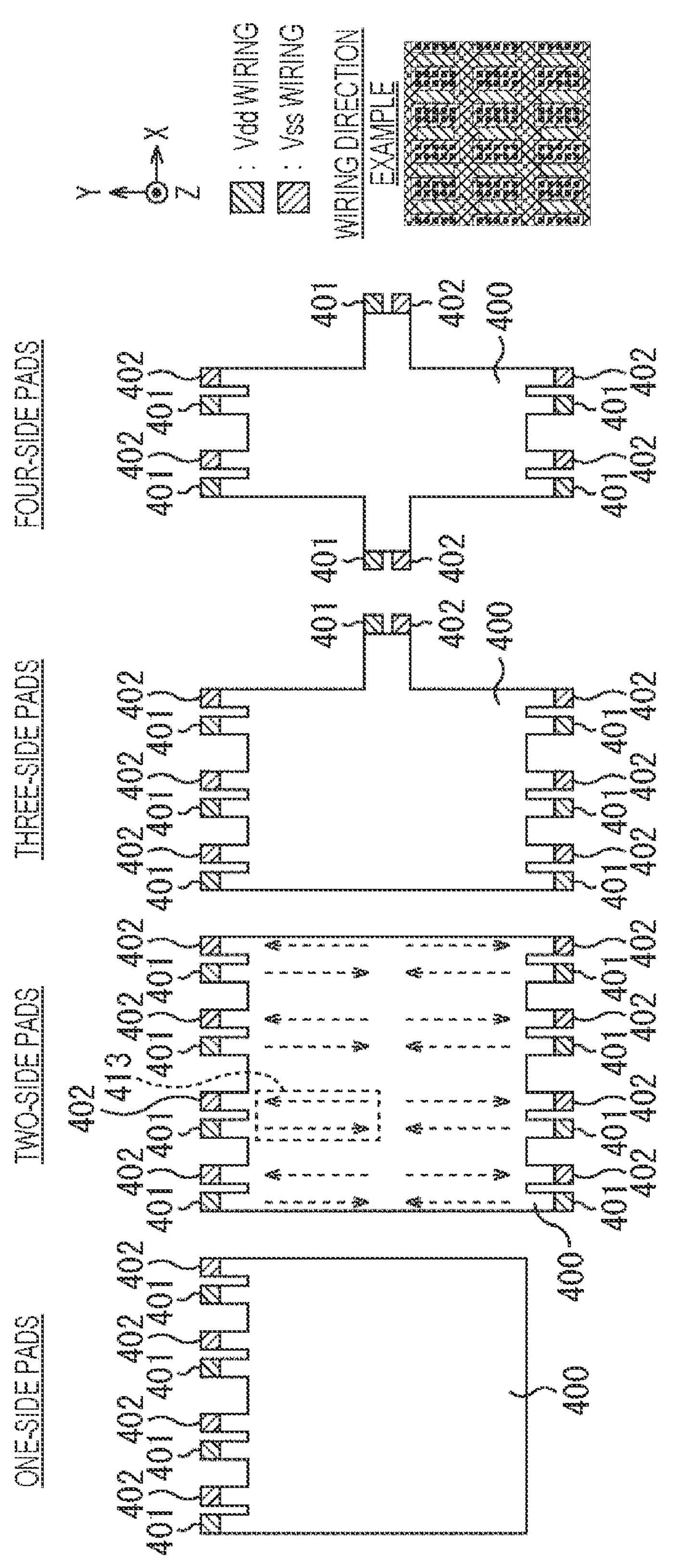
FIGS. 44A, 44B, 44C, 44D, and 44E plan views illustrating a third arrangement example of pads on a semiconductor substrate.

FIG. 44A illustrates a case of arranging pads on one side of the wiring region 400 in which a plurality of the thirteenth configuration examples (FIGS. 40A, 40B, and 40C) each including the conductor layers A and B is formed. FIG. 44B illustrates a case of arranging pads on two sides facing each other in the Y direction of the wiring region 400 in which a plurality of the thirteenth configuration examples (FIGS. 40A, 40B, and 40C) each including the conductor layers A and B is formed. Note that the dotted arrow in the figure illustrates the direction of the current flowing there, and a current loop 413 by the current illustrated by the dotted arrow is generated.

FIG. 44D illustrates a case of arranging pads on three sides of the wiring region 400 in which a plurality of the thirteenth configuration examples (FIGS. 40A 40B, and 40C) each including the conductor layers A and B is formed. D in FIG. 44D illustrates a case of arranging pads on four sides of the wiring region 400 in which a plurality of the thirteenth configuration examples (FIGS. 40A, 40B, and 40C) each including the conductor layers A and B is formed. E in FIG. 44E illustrates the orientation of the plurality of thirteenth configuration examples of the conductor layers A and B formed in the wiring region 400.

The pad 401 arranged in the wiring region 400 is connected to the Vdd wiring, and the pad 402 is, for example, wiring (Vss wiring) connected to the GND or the negative power supply.

In the case of the third arrangement example illustrated in FIGS. 44A, 44B, 44C, 44D, and 44E, the polarities (connection destination is Vdd wiring or Vss wiring) of the pads forming a pad group including a plurality (two in the case of FIGS. 44A, 44B. 44C, 44D, and 44E) of adjacently arranged pads are opposite. The number of pads 401 and the number of pads 402 arranged on one or all sides of the wiring region 400 are substantially the same.

Moreover, in the third arrangement example, the polarities of the pads facing each other on the opposite sides are the same. Note that the polarities of some of the pads facing each other on the opposite sides may be opposite.

As a result, the current loop 413 that is smaller than the current loop 412 illustrated in FIG. 43A is generated in the wiring region 400. Therefore, in the third arrangement example, the distribution range of the magnetic field is narrower than that in the second arrangement example. Therefore, in the third arrangement example, the generated induced electromotive force and the inductive noise based on the induced electromotive force can be made smaller than that in the second arrangement example.

Figure 45C:
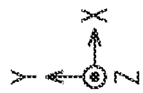
FIGS. 45A, 45B, 45C, 45D, 45E, and 45F are diagrams illustrating examples of a conductor having different resistance values in an X direction and a Y direction.
Figure 45C:
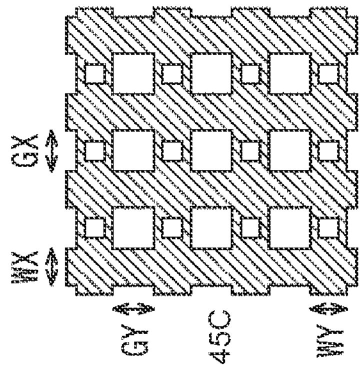
Figure 45F:
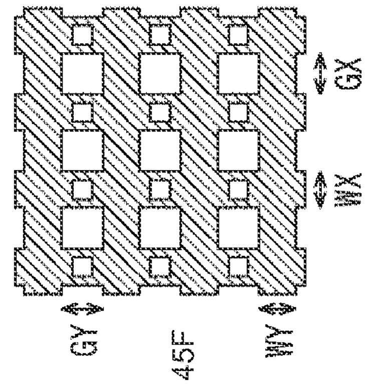
Figure 45B:
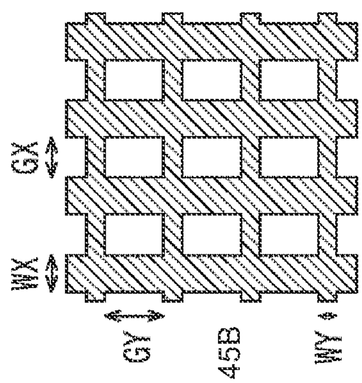
Figure 45E:
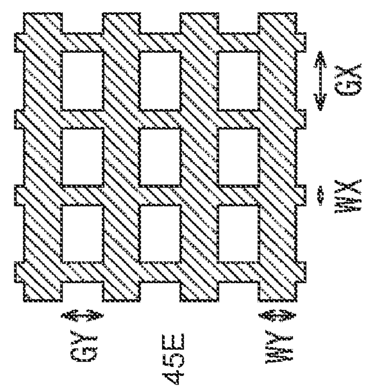
Figure 45A:
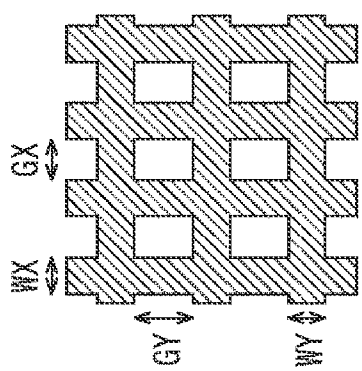
Figure 45D:
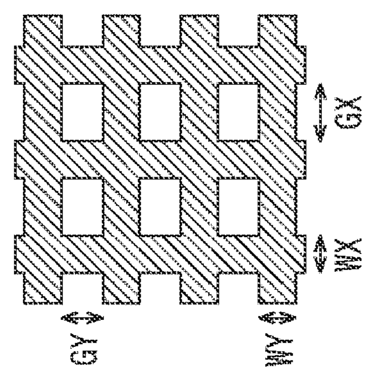

Example of Conductors Having Different Resistance Values in Y Direction and in X Direction FIGS. 45A, 45B, 45C, 45D, 45E, and 45F are plan views illustrating other examples of the conductors constituting the conductor layers A and B. That is, FIGS. 45A, 45B, 45C, 45D, 45E, and 45F are plan views illustrating examples of conductors having different resistance values in the Y direction and the X direction. Note that FIGS. 45A, 45B, and 45C illustrate examples in which the resistance value in the Y direction is smaller than the resistance value in the X direction, and FIGS. 45D, 45E, and 45F illustrate examples in which the resistance value in the X direction smaller than the resistance value in the Y direction.

FIG. 45A illustrates a reticulated conductor in which a conductor width WX in the X direction and a conductor width WY in the Y direction are equal, and a gap width GX in the X direction is narrower than a gap width GY in the Y direction. FIG. 45B illustrates a reticulated conductor in which the conductor width WX in the X direction is wider than the conductor width WY in the Y direction, and the gap width GX in the X direction is narrower than the gap width GY in the Y direction. FIG. 45D illustrates a reticulated conductor in which the conductor width WX in the X direction and the conductor width WY in the Y direction are equal, the gap width GX in the X direction and the gap width GY in the Y direction are equal, and a hole is provided in a region of a portion long in the X direction having the conductor width WY, the region not intersecting with a portion long in the Y direction having the conductor width WX.

FIG. 45D illustrates a reticulated conductor in which the conductor width WX in the X direction and the conductor width WY in the Y direction are equal, and the gap width GX in the X direction is wider than the gap width GY in the Y direction. E is FIG. 45E illustrates a reticulated conductor in which the conductor width WX in the X direction is narrower than the conductor width WY in the Y direction, and the gap width GX in the X direction is wider than the gap width GY in the Y direction. FIG. 45F illustrates a reticulated conductor in which the conductor width WX in the X direction and the conductor width WY in the Y direction are equal, the gap width GX in the X direction and the gap width GY in the Y direction are equal, and a hole is provided in a region of a portion long in the Y direction having the conductor width WX, the region not intersecting with a portion long in the X direction having the conductor width WY.

In the first to third arrangement examples of the pads in the wiring region illustrated in FIGS. 42A, 42B, 42C, 42D, 42E, 43A, 43B, 43C, 43D, 44A, 44B. 44C, 44D, and 44E, the resistance value in the Y direction as illustrated in FIGS. 45A, 45B, and 45C smaller than the resistance value in the X direction. In a case where a conductor in which a current easily flows in the Y direction is formed in the wiring region 400, it has an effect of suppressing the voltage drop (IR-Drop) in the conductor.

Furthermore, in the first to third arrangement examples of the pads in the wiring region 400 illustrated in FIGS. 42A, 42B, 42C, 42D, 42E, 43A, 43B, 43C, 43D, 44A, 44B, 44C, 44D, and 44E, the resistance value in the X direction as illustrated in in FIGS. 45D, 45E, and 45F are smaller than the resistance value in the Y direction, and in a case where a conductor in which a current easily flows in the X direction is formed in the wiring region 400, the current is easily diffused in the X direction, and the magnetic field near the pads arranged on the side of the wiring region is less likely to be concentrated. Therefore, the effect of suppressing generation of the inductive noise can be expected.

6. Modification of Configuration Example of Conductor Layers A and B

Next, modifications of some of the first to thirteenth configuration examples of the conductor layers A and B will be described.

Figure 46A:
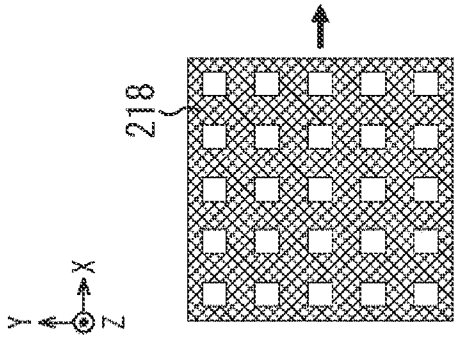
FIGS. 46A, 46B, and 46C are diagrams illustrating a modification in which a conductor period in the X direction of the second configuration example of the conductor layers A and B is deformed by a factor of ½ and an effect of the modification.
Figure 46B:
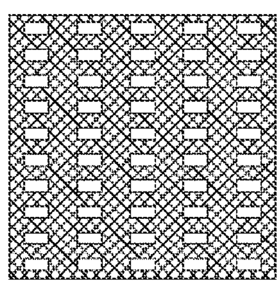
Figure 46C:
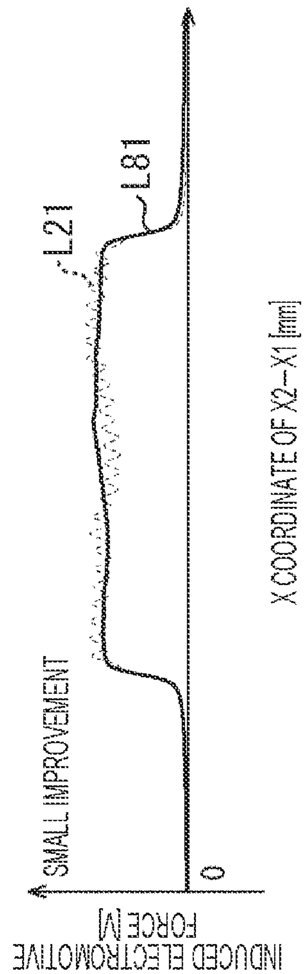

FIGS. 46A, 46B, and 46C are a diagrams illustrating a modification in which the conductor period in the X direction of the second configuration example (FIGS. 15A, 15B, and 15C) of the conductor layers A and B is deformed by a factor of ½ and an effect of the modification. Note that FIG. 46A illustrates the second configuration example of the conductor layers A and B, and FIG. 46B illustrates the modification of the second configuration example of the conductor layers A and B.

FIG. 46C illustrates a change in the induced electromotive force that causes the inductive noise in an image, as a simulation result of a case where the modification illustrated in FIG. 46B is applied to the solid-state imaging device 100. Note that the current condition of the current flowing in this modification is similar to the case illustrated in FIG. 13. The horizontal axis in FIGS. 46A, 46B, and 46C represent X-axis coordinates of the image, and the vertical axis represents the magnitude of the induced electromotive force.

The solid line L81 in FIG. 46C corresponds to the modification illustrated in FIG. 46B and the dotted line L21 corresponds to the second configuration example (FIGS. 15A, 15B, and 15C). As is clear from the comparison between the solid line L81 and the dotted line L21, this modification has a slightly less change in the induced electromotive force to be generated in the Victim conductor loop than the second configuration example. Therefore, it can be seen that this modification can slightly suppress the inductive noise as compared with the second configuration example.

Figure 47C:
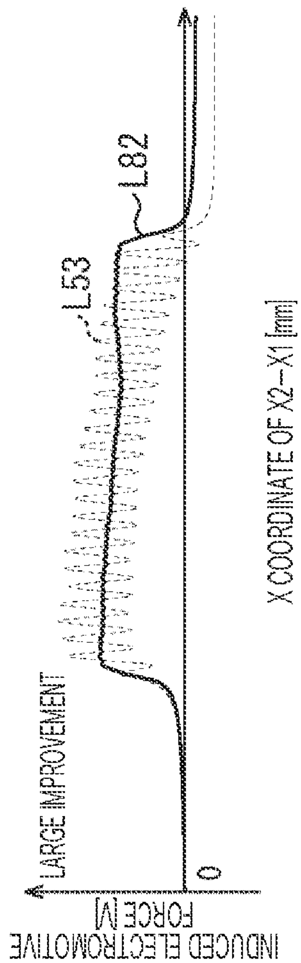
FIGS. 47A, 47B, and 47C are diagrams illustrating a modification in which the conductor period in the X direction of the fifth configuration example of the conductor layers A and B is deformed by a factor of ½ and an effect of the modification.
Figure 47B:
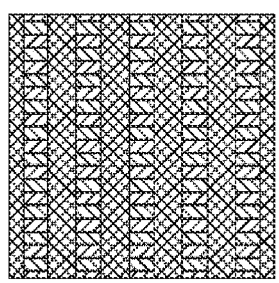
Figure 47A:
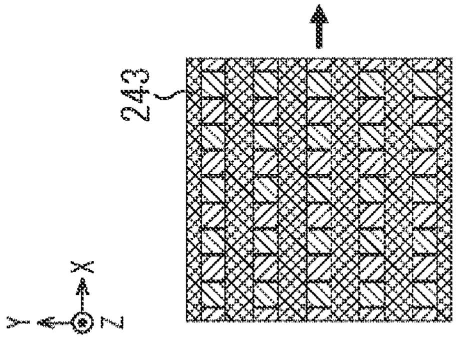

FIGS. 47A, 47B, and 47C are diagrams illustrating a modification in which the conductor period in the X direction of the fifth configuration example (FIGS. 26A, 26B, and 26C) of the conductor layers A and B is deformed by a factor of ½ and an effect of the modification. Note that FIG. 47A illustrates the fifth configuration example of the conductor layers A and B, and FIG. 47B illustrates the modification of the fifth configuration example of the conductor layers A and B.

FIG. 47C illustrates a change in the induced electromotive force that causes the inductive noise in an image, as a simulation result of a case where the modification illustrated in FIG. 47B is applied to the solid-state imaging device 100. Note that the current condition of the current flowing in this modification is similar to the case illustrated in FIG. 23. The horizontal axis in FIGS. 47A, 47B, and 47C represent X-axis coordinates of the image, and the vertical axis represents the magnitude of the induced electromotive force.

The solid line L82 in FIG. 47C corresponds to the modification illustrated in FIG. 47B and the dotted line L53 corresponds to the fifth configuration example (FIGS. 26A, 26B, and 26C). As is clear from the comparison between the solid line L82 and the dotted line L53, this modification has a very little change in the induced electromotive force to be generated in the Victim conductor loop as compared with the fifth configuration example. Therefore, it can be seen that this modification can further suppress the inductive noise as compared with the fifth configuration example.

Figure 48C:
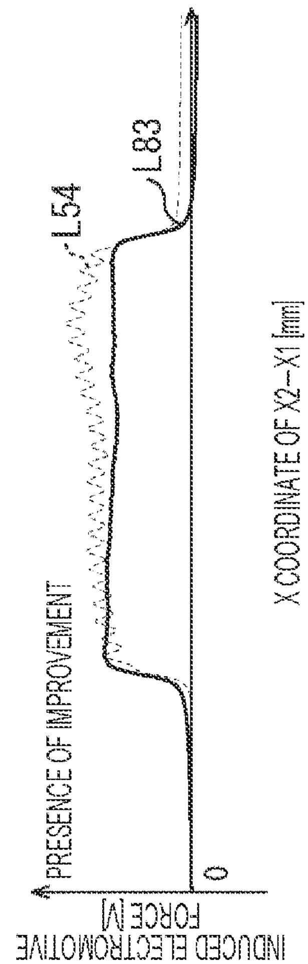
FIGS. 48A, 48B, and 48C are diagrams illustrating a modification in which the conductor period in the X direction of the sixth configuration example of the conductor layers A and B is deformed by a factor of ½ and an effect of the modification.
Figure 48B:
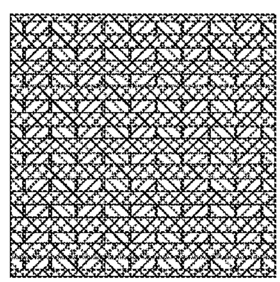
Figure 48A:
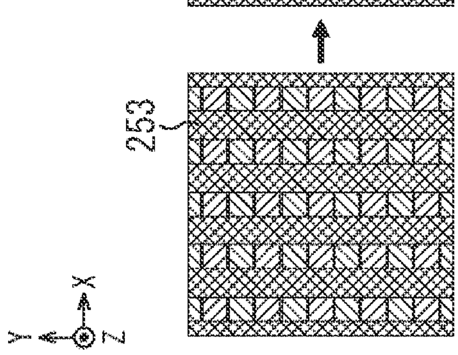

FIGS. 48A, 48B, and 48C are diagrams illustrating a modification in which the conductor period in the X direction of the sixth configuration example (FIGS. 27A, 27B, and 27C) of the conductor layers A and B is deformed by a factor of ½ and an effect of the modification. Note that FIG. 48A illustrates the sixth configuration example of the conductor layers A and B, and FIG. 48B illustrates the modification of the sixth configuration example of the conductor layers A and B.

FIG. 48C illustrates a change in the induced electromotive force that causes the inductive noise in an image, as a simulation result of a case where the modification illustrated in FIG. 48B is applied to the solid-state imaging device 100. Note that the current condition of the current flowing in this modification is similar to the case illustrated in FIG. 23. The horizontal axis in FIGS. 48A, 48B, and 48C represent X-axis coordinates of the image, and the vertical axis represents the magnitude of the induced electromotive force.

The solid line L83 in FIG. 48C corresponds to the modification illustrated in FIG. 48B, and the dotted line L54 corresponds to the sixth configuration example (FIGS. 27A, 27B, and 27C). As is clear by comparing the solid line L83 and the dotted line L54, this modification has a smaller change in the induced electromotive force to be generated in the Victim conductor loop than the sixth configuration example. Therefore, it can be seen that this modification can further suppress the inductive noise as compared with the sixth configuration example.

Figure 49A:
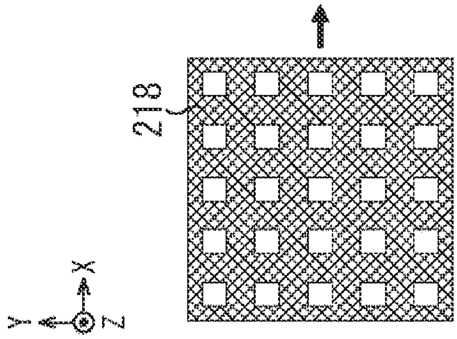
FIGS. 49A, 49B, and 49C are diagrams illustrating a modification in which the conductor period in the Y direction of the second configuration example of the conductor layers A and B is deformed by a factor of ½ and an effect of the modification.
Figure 49B:
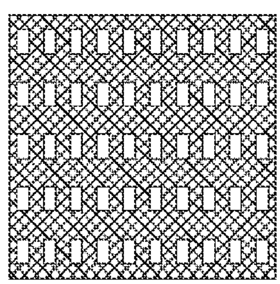
Figure 49C:
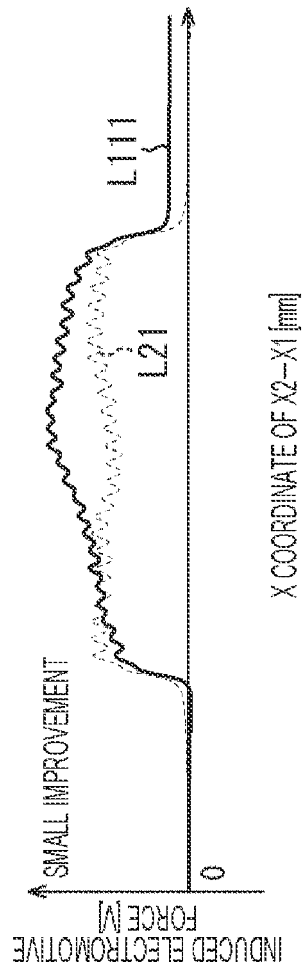

FIGS. 49A, 49B, and 49C are diagrams illustrating a modification in which the conductor period in the Y direction of the second configuration example (FIGS. 15A, 15B, and 15C) of the conductor layers A and B is deformed by a factor of ½ and an effect of the modification. Note that FIG. 49A illustrates the second configuration example of the conductor layers A and B, and FIG. 49B illustrates the modification of the second configuration example of the conductor layers A and B.

FIG. 49C illustrates a change in the induced electromotive force that causes the inductive noise in an image, as a simulation result of a case where the modification illustrated in FIG. 49B is applied to the solid-state imaging device 100. Note that the current condition of the current flowing in this modification is similar to the case illustrated in FIG. 13. The horizontal axis in FIGS. 49A, 49B, and 49C represent X-axis coordinates of the image, and the vertical axis represents the magnitude of the induced electromotive force.

The solid line L111 in FIG. 49C corresponds to the modification illustrated in FIG. 49B and the dotted line L21 corresponds to the second configuration example. As is clear from the comparison between the solid line L111 and the dotted line L21, this modification has a slightly less change in the induced electromotive force to be generated in the Victim conductor loop than the second configuration example. Therefore, it can be seen that this modification can slightly suppress the inductive noise as compared with the second configuration example.

Figure 50C:
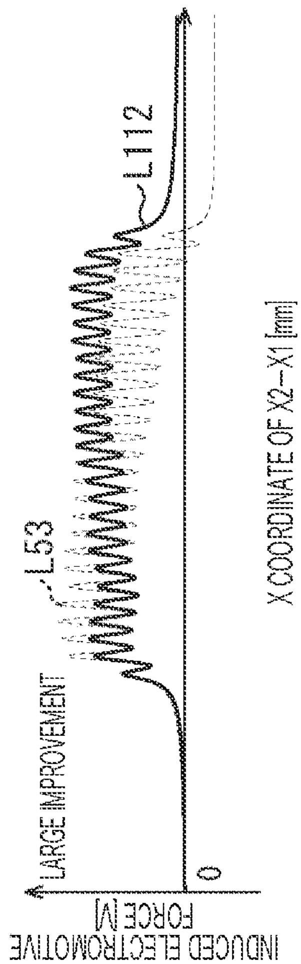
FIGS. 50A, 50B, and 50C are diagrams illustrating a modification in which the conductor period in the Y direction of the fifth configuration example of the conductor layers A and B is deformed by a factor of ½ and an effect of the modification.
Figure 50B:
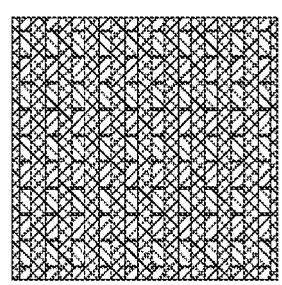
Figure 50A:
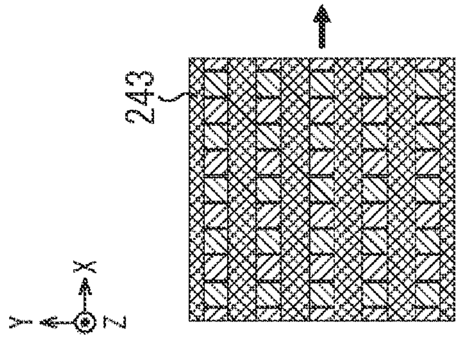

FIGS. 50A, 50B, and 50C are diagrams illustrating a modification in which the conductor period in the Y direction of the fifth configuration example (FIGS. 26A, 26B, and 26C) of the conductor layers A and B is deformed by a factor of ½ and an effect of the modification. Note that FIG. 50A illustrates the fifth configuration example of the conductor layers A and B, and FIG. 50B illustrates the modification of the fifth configuration example of the conductor layers A and B.

FIG. 50C illustrates a change in the induced electromotive force that causes the inductive noise in an image, as a simulation result of a case where the modification illustrated in FIG. 50B is applied to the solid-state imaging device 100. Note that the current condition of the current flowing in this modification is similar to the case illustrated in FIG. 23. The horizontal axis in FIGS. 50A, 50B, and 50C represent X-axis coordinates of the image, and the vertical axis represents the magnitude of the induced electromotive force.

The solid line L112 in FIG. 50C corresponds to the modification illustrated in FIG. 50B and the dotted line L53 corresponds to the fifth configuration example. As is clear from the comparison between the solid line L112 and the dotted line L53, this modification has a very little change in the induced electromotive force to be generated in the Victim conductor loop as compared with the fifth configuration example. Therefore, it can be seen that this modification can further suppress the inductive noise as compared with the fifth configuration example.

Figure 51A:
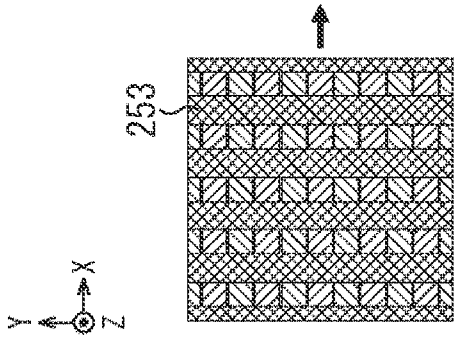
FIGS. 51A, 51B, and 51C are diagrams illustrating a modification in which the conductor period in the Y direction of the sixth configuration example of the conductor layers A and B is deformed by a factor of ½ and an effect of the modification.
Figure 51B:
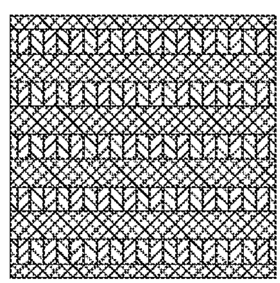
Figure 51C:
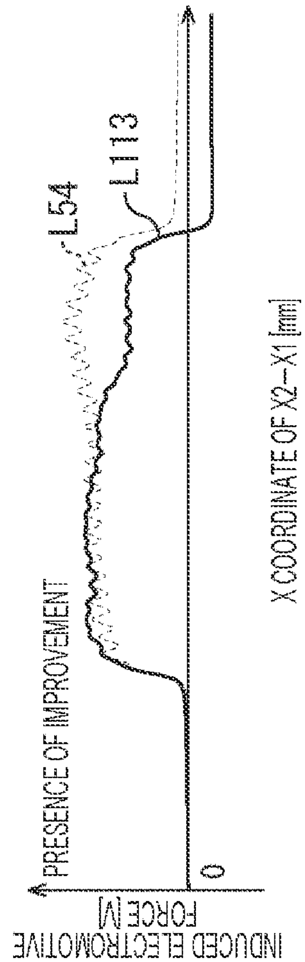

FIGS. 51A, 51B, and 51C are diagrams illustrating a modification in which the conductor period in the Y direction of the sixth configuration example (FIGS. 27A, 27B, and 27C) of the conductor layers A and B is deformed by a factor of ½ and an effect of the modification. Note that FIG. 51A illustrates the sixth configuration example of the conductor layers A and B, and FIG. 51B illustrates the modification of the sixth configuration example of the conductor layers A and B.

FIG. 51C illustrates a change in the induced electromotive force that causes the inductive noise in an image, as a simulation result of a case where the modification illustrated in FIG. 51B is applied to the solid-state imaging device 100. Note that the current condition of the current flowing in this modification is similar to the case illustrated in FIG. 23. The horizontal axis in FIGS. 51A, 51B, and 51C represent X-axis coordinates of the image, and the vertical axis represents the magnitude of the induced electromotive force.

The solid line L113 in FIG. 51C corresponds to the modification illustrated in FIG. 51B, and the dotted line L54 corresponds to the sixth configuration example. As is clear by comparing the solid line L113 and the dotted line L54, this modification has a smaller change in the induced electromotive force to be generated in the Victim conductor loop than the sixth configuration example. Therefore, it can be seen that this modification can further suppress the inductive noise as compared with the sixth configuration example.

Figures 52A, 52B, 52C:
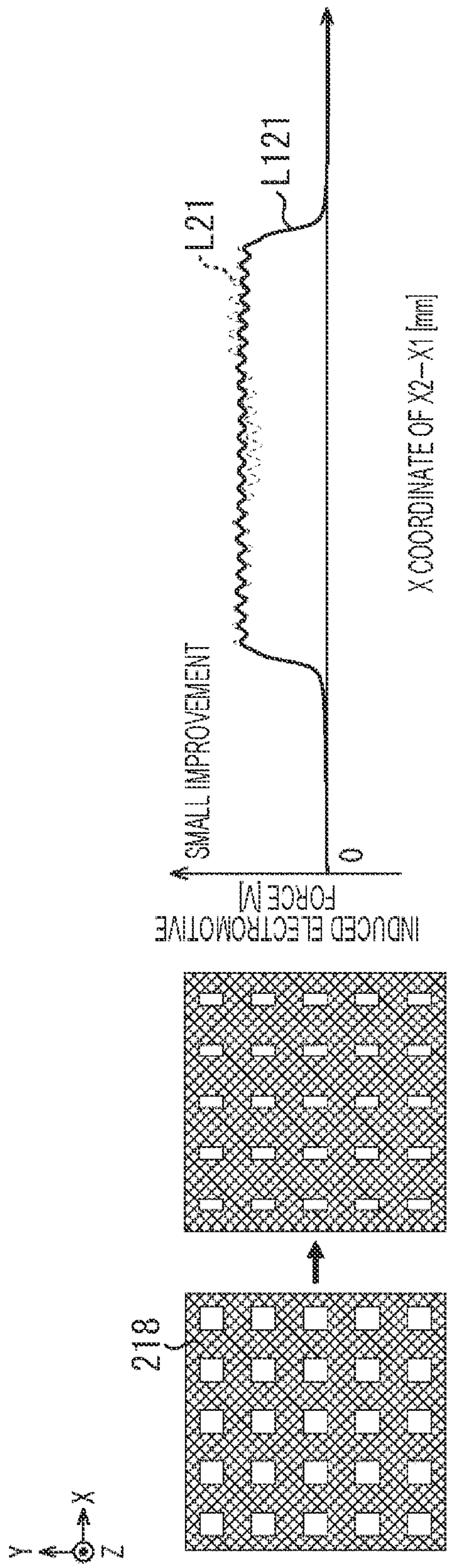
FIGS. 52A, 52B, and 52C are diagrams illustrating a modification in which a conductor width in the X direction of the second configuration example of the conductor layers A and B is deformed by a factor of 2 and an effect of the modification.

FIGS. 52A, 52B, and 52C Ica are diagrams illustrating a modification in which the conductor width in the X direction of the second configuration example (FIGS. 15A, 15B, and 15C) of the conductor layers A and B is deformed by a factor of 2 and an effect of the modification. Note that FIG. 52A illustrates the second configuration example of the conductor layers A and B, and FIG. 52B illustrates the modification of the second configuration example of the conductor layers A and B.

FIG. 52C illustrates a change in the induced electromotive force that causes the inductive noise in an image, as a simulation result of a case where the modification illustrated in FIG. 52B is applied to the solid-state imaging device 100. Note that the current condition of the current flowing in this modification is similar to the case illustrated in FIG. 13. The horizontal axis in FIGS. 52A, 52B, and 52C represent X-axis coordinates of the image, and the vertical axis represents the magnitude of the induced electromotive force.

The solid line L121 in FIG. 52C corresponds to the modification illustrated in FIG. 52B, and the dotted line L21 corresponds to the second configuration example. As is clear from the comparison between the solid line L121 and the dotted line L21, this modification has a slightly less change in the induced electromotive force to be generated in the Victim conductor loop than in the second configuration example. Therefore, it can be seen that this modification can slightly suppress the inductive noise as compared with the second configuration example.

Figure 53A:
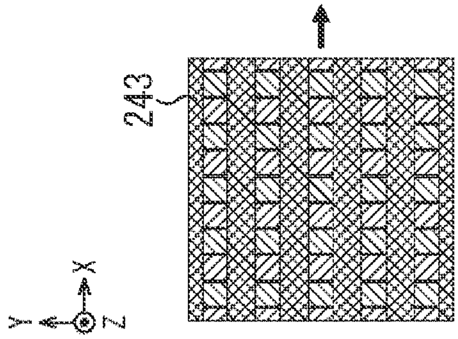
FIGS. 53A, 53B, and 53C are diagrams illustrating a modification in which the conductor width in the X direction of the fifth configuration example of the conductor layers A and B is deformed by a factor of 2 and an effect of the modification.
Figure 53B:
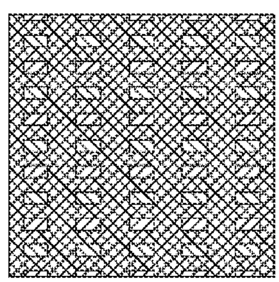
Figure 53C:
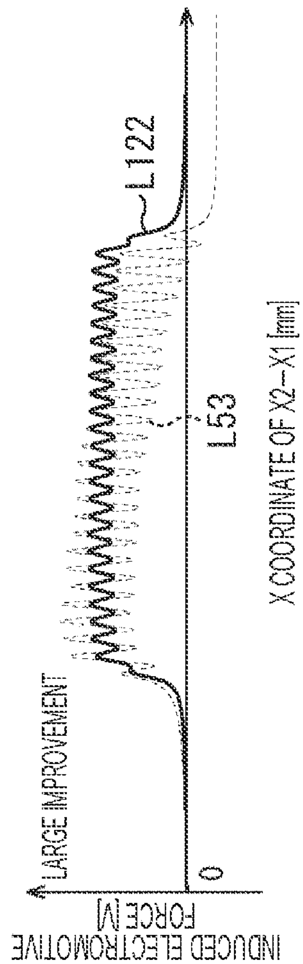

FIGS. 53A, 53B, and 53C are diagrams illustrating a modification in which the conductor width in the X direction of the fifth configuration example (FIGS. 26A, 26B, and 26C) of the conductor layers A and B is deformed by a factor of 2 and an effect of the modification. Note that FIG. 53A illustrates the fifth configuration example of the conductor layers A and B, and FIG. 53B illustrates the modification of the fifth configuration example of the conductor layers A and B.

FIG. 53C illustrates a change in the induced electromotive force that causes the inductive noise in an image, as a simulation result of a case where the modification illustrated in FIG. 53B is applied to the solid-state imaging device 100. Note that the current condition of the current flowing in this modification is similar to the case illustrated in FIG. 23. The horizontal axis in FIGS. 53A, 53B, and 53C represent X-axis coordinates of the image, and the vertical axis represents the magnitude of the induced electromotive force.

The solid line L122 in FIG. 53C corresponds to the modification illustrated in FIG. 53B and the dotted line L53 corresponds to the fifth configuration example. As is clear from the comparison between the solid line L122 and the dotted line L53, this modification has a very little change in the induced electromotive force to be generated in the Victim conductor loop as compared with the fifth configuration example. Therefore, it can be seen that this modification can further suppress the inductive noise as compared with the fifth configuration example.

Figure 54A:
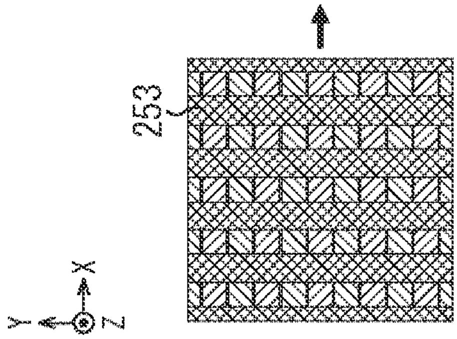
FIGS. 54A, 54B, and 54C are diagrams illustrating a modification in which the conductor width in the X direction of the sixth configuration example of the conductor layers A and B is deformed by a factor of 2 and an effect of the modification.
Figure 54B:
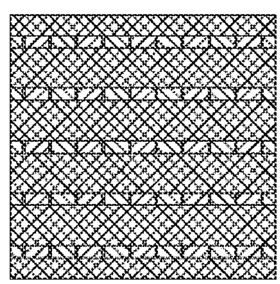
Figure 54C:
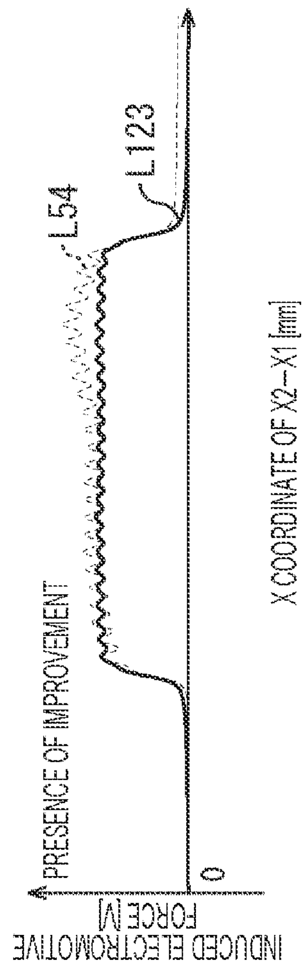

FIGS. 54A, 54B, and 54C are diagrams illustrating a modification in which the conductor width in the X direction of the sixth configuration example (FIGS. 27A, 27B, and 27C) of the conductor layers A and B is deformed by a factor of 2 and an effect of the modification. Note that FIG. 54A illustrates the sixth configuration example of the conductor layers A and B, and FIG. 54B illustrates the modification of the sixth configuration example of the conductor layers A and B.

FIG. 54C illustrates a change in the induced electromotive force that causes the inductive noise in an image, as a simulation result of a case where the modification illustrated in FIG. 54B is applied to the solid-state imaging device 100. Note that the current condition of the current flowing in this modification is similar to the case illustrated in FIG. 23. The horizontal axis in FIGS. 54A, 54B, and 54C represent X-axis coordinates of the image, and the vertical axis represents the magnitude of the induced electromotive force.

The solid line L123 in FIG. 54C corresponds to the modification illustrated in FIG. 54B, and the dotted line L54 corresponds to the sixth configuration example. As is clear from the comparison between the solid line L123 and the dotted line L54, this modification has a smaller change in the induced electromotive force to be generated in the Victim conductor loop than the sixth configuration example. Therefore, it can be seen that this modification can further suppress the inductive noise as compared with the sixth configuration example.

Figure 55A:
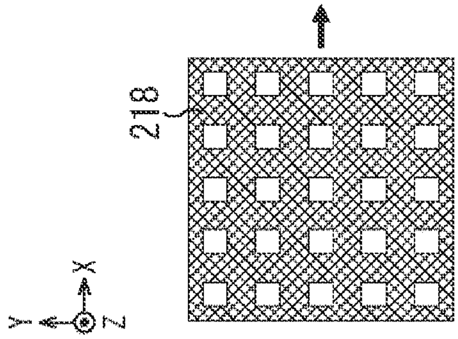
FIGS. 55A, 55B, and 55C are diagrams illustrating a modification in which the conductor width in the Y direction of the second configuration example of the conductor layers A and B is deformed by a factor of 2 and an effect of the modification.
Figure 55B:
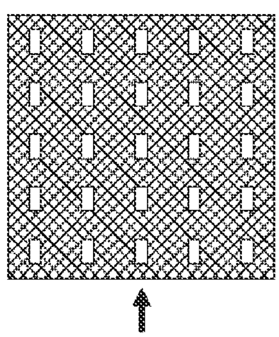
Figure 55C:
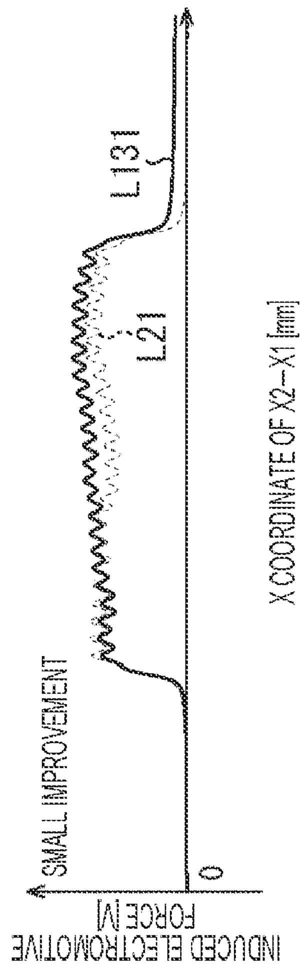

FIGS. 55A, 55B, and 55C are diagrams illustrating a modification in which the conductor width in the Y direction of the second configuration example (FIGS. 15A, 15B, and 15C) of the conductor layers A and B is deformed by a factor of 2 and an effect of the modification. Note that FIG. 55A illustrates the second configuration example of the conductor layers A and B, and FIG. 55B illustrates the modification of the second configuration example of the conductor layers A and B.

FIG. 55C illustrates a change in the induced electromotive force that causes the inductive noise in an image, as a simulation result of a case where the modification illustrated in FIG. 55B is applied to the solid-state imaging device 100. Note that the current condition of the current flowing in this modification is similar to the case illustrated in FIG. 13. The horizontal axis in FIGS. 55A, 55B, and 55C represent X-axis coordinates of the image, and the vertical axis represents the magnitude of the induced electromotive force.

The solid line L131 in FIG. 55C corresponds to the modification illustrated in FIG. 55B and the dotted line L21 corresponds to the second configuration example. As is clear from the comparison between the solid line L131 and the dotted line L21, this modification has a slightly less change in the induced electromotive force to be generated in the Victim conductor loop than the second configuration example. Therefore, it can be seen that this modification can slightly suppress the inductive noise as compared with the second configuration example.

Figure 56C:
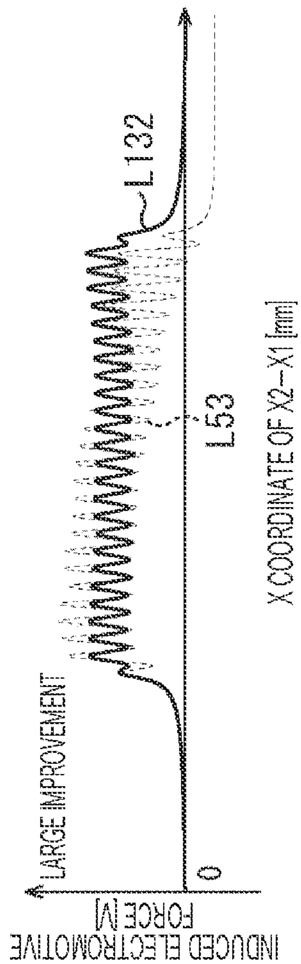
FIGS. 56A, 56B, and 56C are diagrams illustrating a modification in which the conductor width in the Y direction of the fifth configuration example of the conductor layers A and B is deformed by a factor of 2 and an effect of the modification.
Figure 56B:
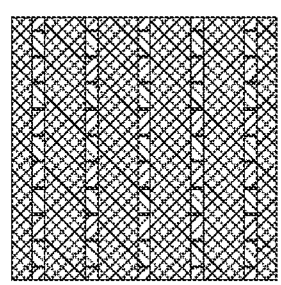
Figure 56A:
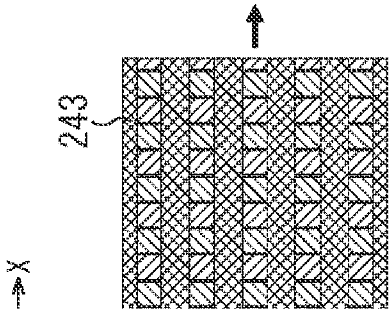

FIGS. 56A, 56B, and 56C are diagrams illustrating a modification in which the conductor width in the Y direction of the fifth configuration example (FIGS. 26A, 26B, and 26C) of the conductor layers A and B is deformed by a factor of 2 and an effect of the modification. Note that FIG. 56A illustrates the fifth configuration example of the conductor layers A and B, and FIG. 56B illustrates the modification of the fifth configuration example of the conductor layers A and B.

FIG. 56C illustrates a change in the induced electromotive force that causes the inductive noise in an image, as a simulation result of a case where the modification illustrated in FIG. 56B is applied to the solid-state imaging device 100. Note that the current condition of the current flowing in this modification is similar to the case illustrated in FIG. 23. The horizontal axis in FIGS. 56A, 56B, and 56C represent X-axis coordinates of the image, and the vertical axis represents the magnitude of the induced electromotive force.

The solid line L132 in FIG. 56C corresponds to the modification illustrated in FIG. 56B and the dotted line L53 corresponds to the fifth configuration example. As is clear from the comparison between the solid line L132 and the dotted line L53, this modification has a very little change in the induced electromotive force to be generated in the Victim conductor loop as compared with the fifth configuration example. Therefore, it can be seen that this modification can further suppress the inductive noise as compared with the fifth configuration example.

Figures 57A, 57B, 57C:
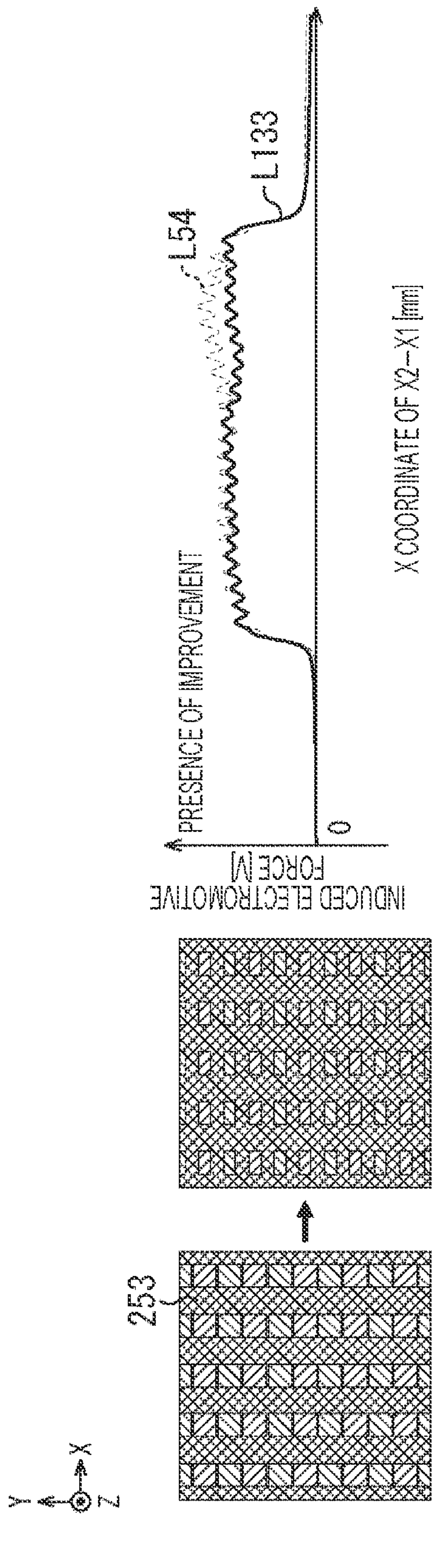
FIGS. 57A, 57B, and 57C are diagrams illustrating a modification in which the conductor width in the Y direction of the sixth configuration example of the conductor layers A and B is deformed by a factor of 2 and an effect of the modification.

FIGS. 57A, 57B, and 57C are diagrams illustrating a modification in which the conductor width in the Y direction of the sixth configuration example (FIGS. 27A, 27B, and 27C) of the conductor layers A and B is deformed by a factor of 2 and an effect of the modification. Note that FIG. 57A illustrates the sixth configuration example of the conductor layers A and B, and FIG. 57B illustrates the modification of the sixth configuration example of the conductor layers A and B.

FIG. 57C illustrates a change in the induced electromotive force that causes the inductive noise in an image, as a simulation result of a case where the modification illustrated in FIG. 57B is applied to the solid-state imaging device 100. Note that the current condition of the current flowing in this modification is similar to the case illustrated in FIG. 23. The horizontal axis in FIGS. 57A, 57B, and 57C represent X-axis coordinates of the image, and the vertical axis represents the magnitude of the induced electromotive force.

The solid line L133 in FIG. 57C corresponds to the modification illustrated in FIG. 57B, and the dotted line L54 corresponds to the sixth configuration example. As is clear from the comparison between the solid line L133 and the dotted line L54, this modification has a smaller change in the induced electromotive force to be generated in the Victim conductor loop than the sixth configuration example. Therefore, it can be seen that this modification can further suppress the inductive noise as compared with the sixth configuration example.

7. Modification of Reticulated Conductor

Next, FIGS. 58A, 58B, 58C, 58D, 58E, and 58F are plan views illustrating modifications of the reticulated conductor applicable to each of the above-described configuration examples of the conductor layers A and B.

Figure 58A:
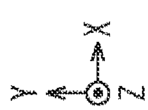
Figure 58A:
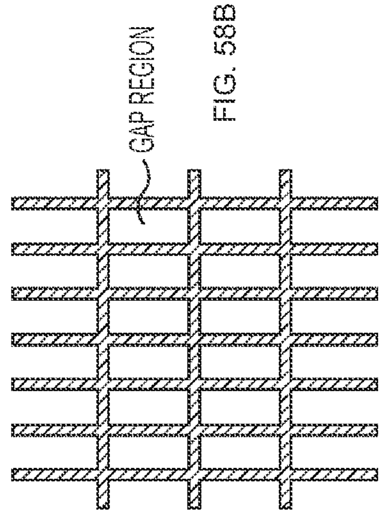

FIG. 58A is simplified illustration of the shape of the reticulated conductor used in each of the above-described configuration examples of the conductor layers A and B. The reticulated conductor adopted in each of the above-described configuration examples of the conductor layers A and B has a rectangular gap region, and the rectangular gap regions are linearly arranged in the X direction and the Y direction.

Figure 58B:
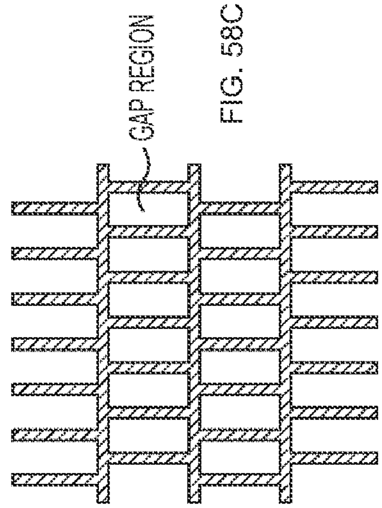
Figure 58C:
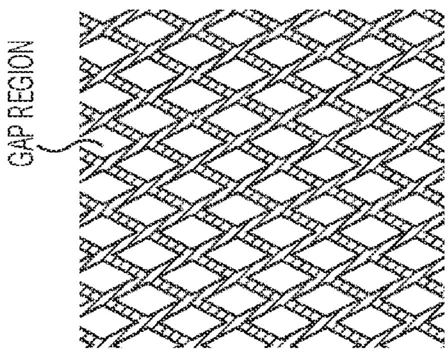

FIG. 58B is simplified illustration of a first modification of the reticulated conductor. In the first modification of the reticulated conductor, the gap region is rectangular, and the gap regions are linearly arranged in the X direction and are arranged in the Y direction with a stepwise shift.

Figure 58D:
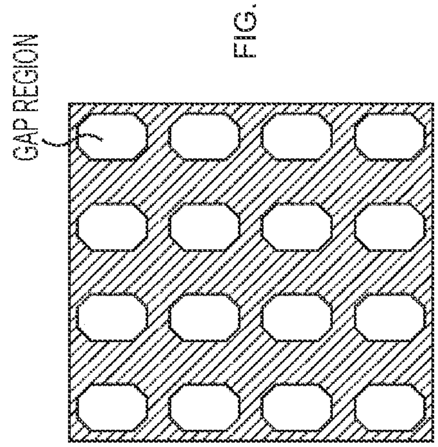

FIG. 58D is simplified illustration of a second modification of the reticulated conductor. In the second modification of the reticulated conductor, the gap region is rhombic, and the gap regions are linearly arranged in a diagonal direction.

FIG. 58D is simplified illustration of a third modification of the reticulated conductor. In the third modification of the reticulated conductor, the gap region is circular or polygonal other than rectangular (octagonal in the case of FIG. 58D), and the gap regions are linearly arranged in the X direction and the Y direction.

Figure 58E:
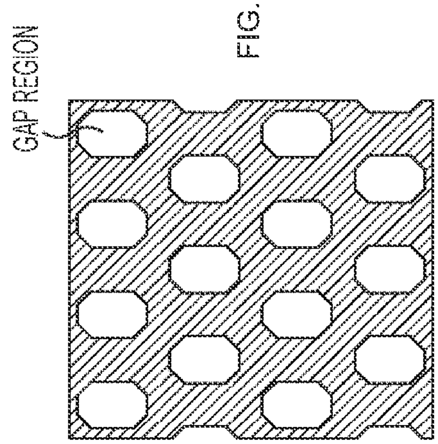

FIG. 58E is simplified illustration of a fourth modification of the reticulated conductor. In the fourth modification of the reticulated conductor, the gap region is circular or polygonal other than rectangular (octagonal in the case of FIG. 58E), and the gap regions are linearly arranged in the X direction, and are arranged in the Y direction with a stepwise shift.

Figure 58F:
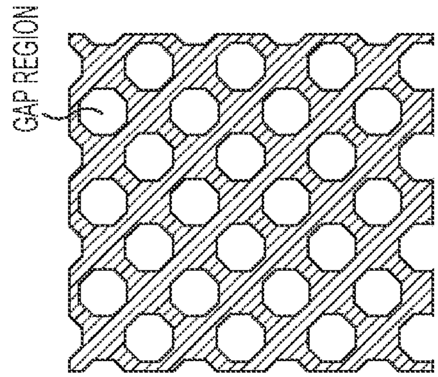

FIG. 58F is simplified illustration of a fifth modification of the reticulated conductor. In the fifth modification of the reticulated conductor, the gap region is circular or polygonal other than rectangular (octagonal in the case of FIG. 58F), and the gap regions are linearly arranged in the diagonal direction.

Note that the shape of the reticulated conductor applicable to each configuration example of the conductor layers A and B is not limited to the modifications illustrated in FIGS. 58A, 58B, 58C, 58D, 58E, and 58F as long as the shape is reticulated.

8. Various Effects

Improvement of Degree of Freedom in Layout Design

As described above, in each of the configuration examples of the conductor layers A and B, the planar conductor or the reticulated conductor is adopted. In general, the reticulated conductor (lattice conductor) has a wiring structure that is periodic in the X direction and the Y direction. Therefore, by designing the reticulated conductor having a basic periodic structure that is a unit of the periodic structure (for one period) and repeatedly arranging the basic periodic structure in the X direction and the Y direction, the wiring layout can be more easily designed than the case of using the linear conductor. In other words, in the case of using the reticulated conductor, the degree of freedom in layout is improved as compared with the case of using the linear conductor. Therefore, the man-hours, time, and cost required for the layout design can be reduced.

Figure 59:
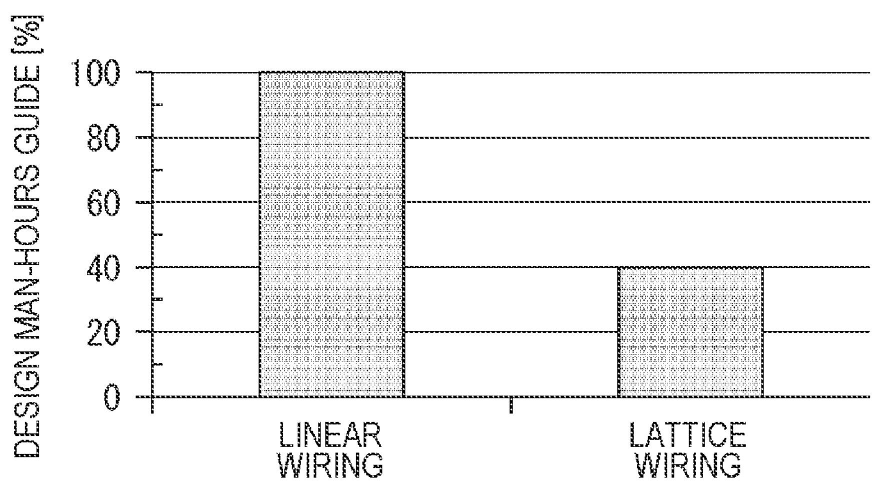
FIG. 59 is a diagram for describing improvement of layout freedom.

FIG. 59 simulates the design man-hours in the case of using the linear conductor and the case of using the reticulated conductor (lattice conductor) in designing the circuit wiring layout that satisfies a predetermined condition.

In the case of FIG. 59, when the design man-hours in designing the layout using the linear conductor is 100%, the design man-hours in designing the layout using the reticulated conductor (lattice conductor) is about 40%, which can be seen that the man-hours can significantly be reduced.

Reduction of Voltage Drop (IR-drop)

Figure 60A:
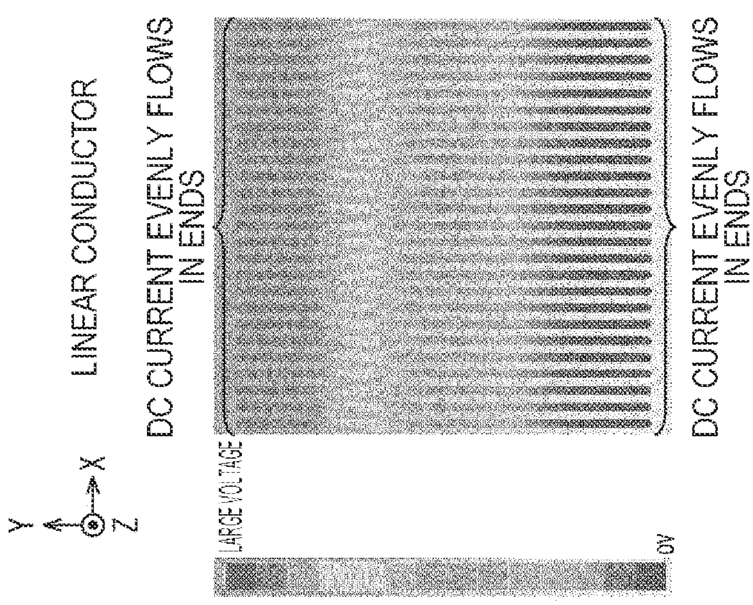
FIGS. 60A, 60B, and 60C are diagrams for describing a reduction in voltage drop (IR-Drop).
Figure 60B:
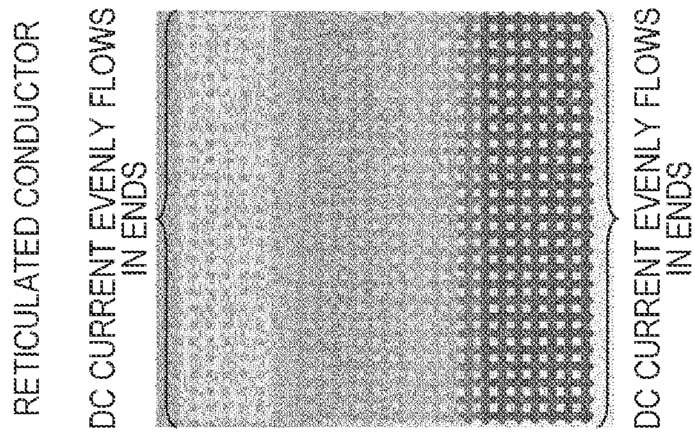
Figure 60C:
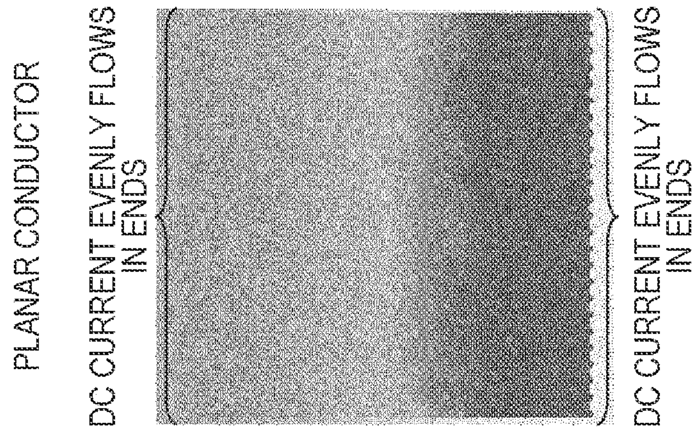

FIGS. 60A, 60B, and 60C are diagrams illustrating a voltage change in a case of causing a DC current to flow in the Y direction under the same condition through conductors of the same material but different shapes arranged on the XY plane.

FIG. 60A corresponds to the linear conductor, FIG. 60B corresponds to the reticulated conductor, and FIG. 60C corresponds to the planar conductor. The shade of color represents the voltage. Comparing FIGS. 60A, 60B, and 60C, it can be seen that the voltage change is the largest in the linear conductor, followed by the reticulated conductor and the planar conductor in that order.

Figure 61:
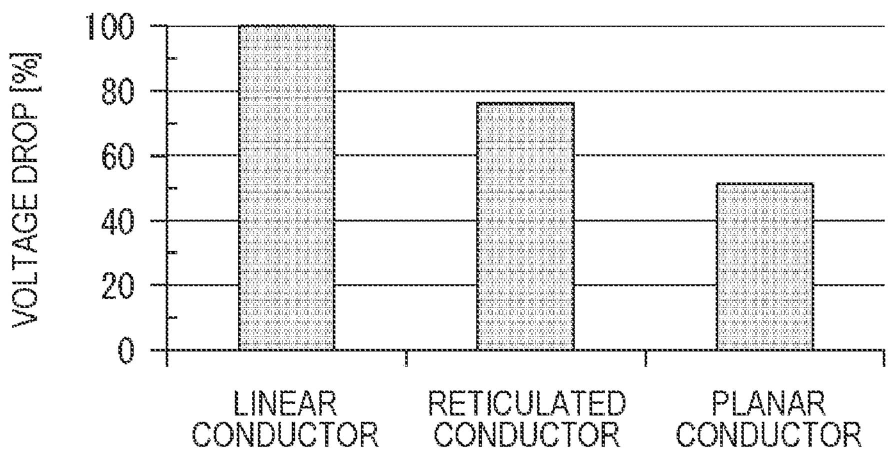
FIG. 61 is a diagram for describing a reduction in voltage drop (IR-Drop).

FIG. 61 is a diagram illustrating a relative graph of the voltage drops of the linear conductor, the reticulated conductor, and the planar conductor, assuming that the voltage drop of the linear conductor illustrated in FIG. 60A is 100%.

As is clear from FIG. 61, it can be seen that the planar conductor and the reticulated conductor can reduce the voltage drop (IR-Drop), which can be a fatal obstacle to the driving of the semiconductor device, as compared with the linear conductor.

However, it is known that in many cases, the planar conductor cannot be manufactured in the current semiconductor substrate manufacturing process. Therefore, it is realistic to adopt a configuration example using the reticulated conductor for both the conductor layers A and B. However, this does not apply to the case where the semiconductor substrate manufacturing process has been advanced to manufacture the planar conductor. There are some cases where the planar conductor can be manufactured for the uppermost metal or the lowermost metal in metal layers.

Reduction of Capacitive Noise

The conductor (planar conductor or reticulated conductor) forming the conductor layers A and B may cause not only the inductive noise but also capacitive noise for the Victim conductor loop including the signal line 132 and the control line 133.

Here, the capacitive noise refers to generation of a voltage in the signal line 132 and the control line 133 by capacitive coupling between the conductor forming the conductor layers A and B, and the signal line 132 and the control line 133, in a case where a voltage is applied to the conductor, and occurrence of voltage noise in the signal line 132 or the control line 133 as the applied voltage changes. This voltage noise becomes noise of the pixel signal.

The magnitude of the capacitive noise is considered to be substantially proportional to the capacitance and voltage between the conductor forming the conductor layers A and B and the wiring of the signal line 132, the control line 133, and the like. The capacitance is a capacitance $C=F*S/d$ between two conductors in a case where an overlapping area of the two conductors (one may be a conductor and the other may be wiring) is S, the two conductors are arranged in parallel with a distance d, and a dielectric with a dielectric constant F is uniformly added between the conductors. Therefore, it can be seen that the larger the overlapping area S of the two conductors, the larger the capacitive noise.

Figure 62A:
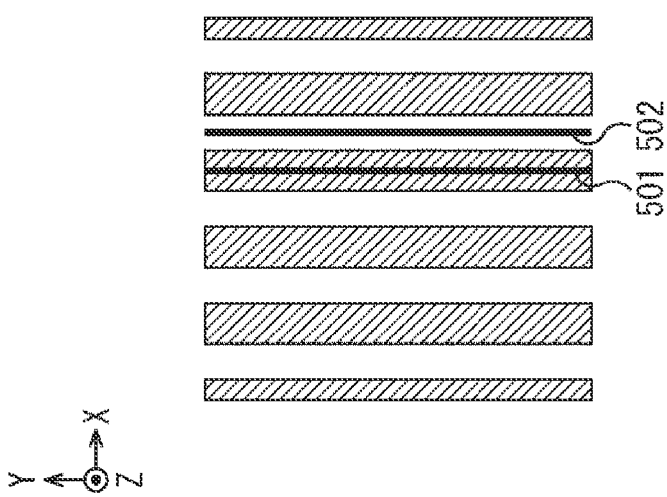
FIGS. 62A, 62B, and 62C diagrams for describing reduction of capacitive noise.
Figure 62B:
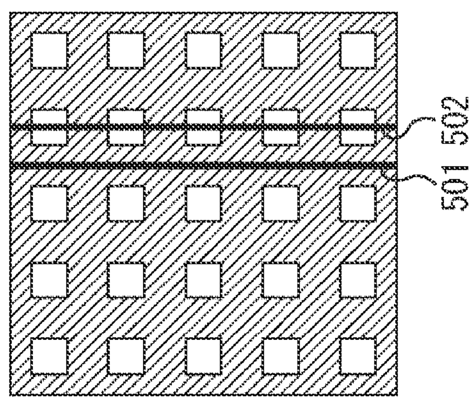
Figure 62C:
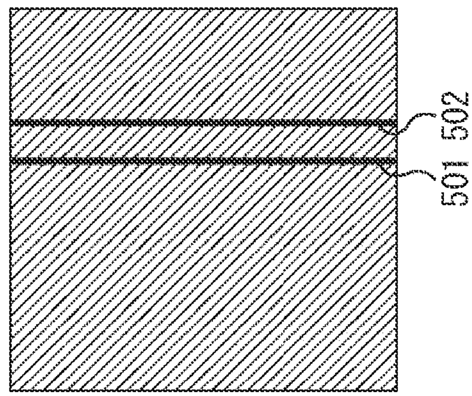

FIGS. 62A, 62B, and 62C are diagrams for describing a difference in capacitance between conductors of the same material but different shapes arranged on the XY plane, and other conductors (wiring).

FIG. 62A corresponds to the linear conductor long in the Y direction and wirings 501 and 502 (corresponding to the signal line 132 and the control line 133) linearly formed in the Y direction with a space in the Z direction from the linear conductor. Note that the wiring 501 as a whole overlaps with the conductor region of the linear conductor, but the wiring 502 as a whole overlaps with the gap region of the linear conductor and does not have an area overlapping with the conductor region.

FIG. 62B corresponds to the reticulated conductor and wirings 501 and 502 linearly formed in the Y direction with a space in the Z direction from the reticulated conductor. Note that the wiring 501 as a whole overlaps with the conductor region of the reticulated conductor, but substantially half of the wiring 502 overlaps with the conductor region of the reticulated conductor.

FIG. 62C corresponds to the planar conductor and wirings 501 and linearly formed in the Y direction with a space in the Z direction from the planar conductor. Note that the wirings 501 and 502 as a whole overlap with the conducting region of the planar conductor.

In a case of comparing the differences between the capacitance of the conductor (linear conductor, reticulated conductor, or planar conductor) and the wiring 501, and the capacitance of the conductor (linear conductor, reticulated conductor, or planar conductor) and the wiring 502 in FIGS. 62A, 62B, and 62C, the difference is the largest in the linear conductor, followed by the reticulated conductor and the planar conductor.

That is, in the linear conductor, the difference in capacitance between the linear conductor and the wiring is large due to the difference in the XY coordinates of the wiring, and generation of the capacitive noise is also significantly different. Therefore, there is a possibility of noise of a pixel signal having high visibility in an image.

In contrast, in the reticulated conductor and the planar conductor, the difference in capacitance between the conductor and the wiring due to the difference in the XY coordinates of the wiring is smaller than the linear conductor, and thus generation of the capacitive noise can be made smaller. Therefore, the noise of the pixel signal due to the capacitive noise can be suppressed.

Reduction of Radioactive Noise

As described above, the reticulated conductor is used in the configuration examples of the conductor layers A and B other than the first configuration example. The reticulated conductor can be expected to have an effect of reducing radioactive noise. Here, it is assumed that the radioactive noise includes radioactive noise (unnecessary radiation) from the inside to the outside of the solid-state imaging device 100 and radioactive noise (transmitted noise) from the outside to the inside of the solid-state imaging device 100.

Since the radioactive noise from the outside to the inside of the solid-state imaging device 100 can generate voltage noise and pixel signal noise in the signal line 132 and the like, the effect of suppressing the voltage noise and pixel signal noise can be expected in a case of adopting a configuration example using the reticulated conductor for at least one of the conductor layer A or B.

Since the conductor period of the reticulated conductor affects a frequency band of the radioactive noise that can be reduced by the reticulated conductor, the radioactive noise in a broader frequency band can be reduced in a case of using the reticulated conductors having different conductor periods for the conductor layers A and B than a case of using the reticulated conductors having the same conductor frequency for the conductor layers A and B.

Note that the above-described effects are merely examples and are not limited, and other effects may be exhibited.

9. Configuration Example with Different Drawing Portion

By the way, in the case where the wiring layer 165A as the conductor layer A or the wiring layer 165B as the conductor layer B is connected to the pad 401 or 402, for example, a wiring lead-out portion for being connected to the pad 401 or 402 is provided, as illustrated in FIGS. 42A, 42B, 42C, 42D, 42E, 43A, 43B, 43C, 43D, 44A, 44B, 44C, 44D, and 44E. The wiring lead-out portion is usually formed to have a narrow wiring width according to the size of the pad.

Figure 63A:
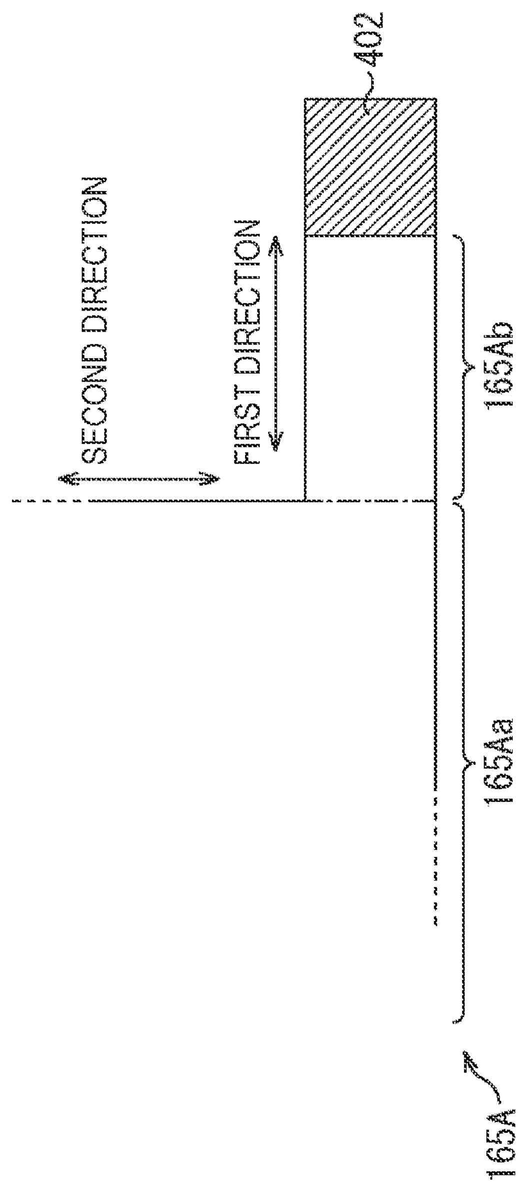
FIGS. 63A and 63B are diagrams for illustrating a main conductor portion and a lead-out conductor portion of a conductor layer.

Therefore, consider the case by dividing the wiring layer 165A (conductor layer A) into a main conductor portion 165Aa and a lead-out conductor portion 165Ab as illustrated in FIG. 63A. The main conductor portion 165Aa is a portion provided to mainly shield the hot carrier light emission from the active element group 167 and suppress generation of the inductive noise, and has a larger area than the lead-out conductor portion 165Ab. The lead-out conductor portion 165Ab is a portion provided to mainly connect the main conductor portion 165Aa and the pad 402 and supply a predetermined voltage such as the GND or the negative power supply (Vss) to the main conductor portion 165Aa. The length (width) of at least one of the X direction (first direction) or the Y direction (second direction) of the lead-out conductor portion 165Ab is shorter (narrower) than the length (width) of the main conductor portion 165Aa. A connecting portion between the main conductor portion 165Aa and the lead-out conductor portion 165Ab illustrated by the alternate long and short dash line in FIG. 63A is referred to as a joint portion.

Figure 63B:
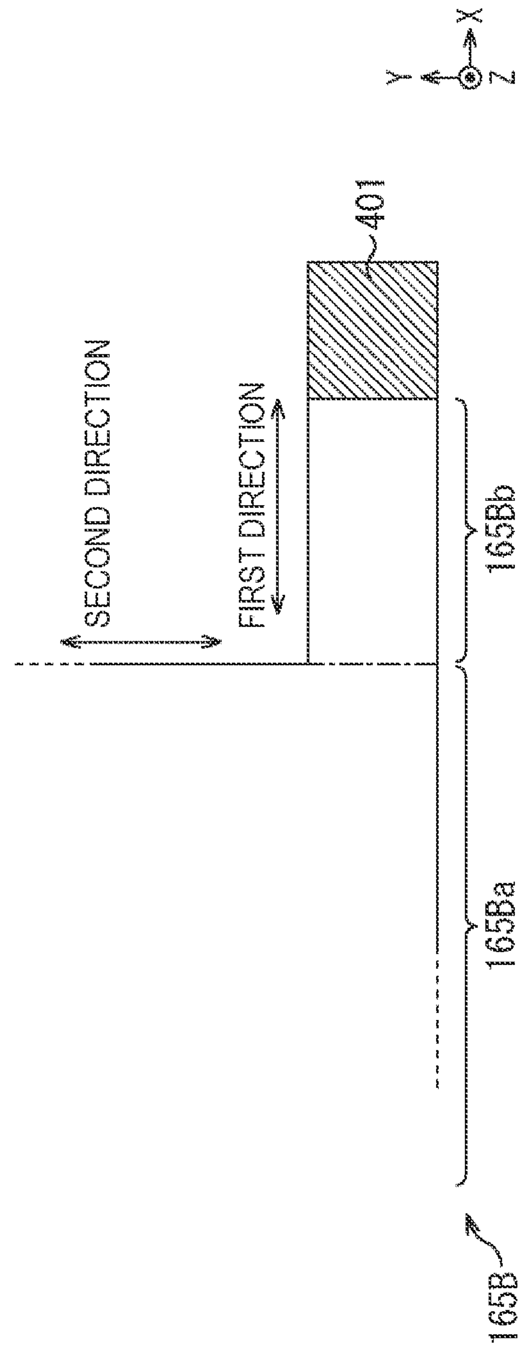

Similarly, consider the case by dividing the wiring layer 165B (conductor layer B) into a main conductor portion 165B and a lead-out conductor portion 165B as illustrated in FIG. 63B. The main conductor portion 165B is a portion provided to mainly shield the hot carrier light emission from the active element group 167 and suppress generation of the inductive noise, and has a larger area than the lead-out conductor portion 165Bb. The lead-out conductor portion 165B is a portion provided to mainly connect the main conductor portion 165Ba and the pad 401 and supply a predetermined voltage such as the positive power supply (Vdd) to the main conductor portion 165Ba. The length (width) of at least one of the X direction (first direction) or the Y direction (second direction) of the lead-out conductor portion 165Bb is shorter (narrower) than the length (width) of the main conductor portion 165Ba. A connecting portion between the main conductor portion 165B and the lead-out conductor portion 65B illustrated by the alternate long and short dash line in FIG. 63B is referred to as a joint portion.

Note that, in a case of collectively referring to the main conductor portion 165Aa and the main conductor portion 165Ba and in a case of collectively referring to the lead-out conductor portion 165Ab and the lead-out conductor portion 165Bb without distinguishing the wiring layer 165A (conductor layer A) and the wiring layer 165B (conductor layer B), they are respectively referred to as main conductor portion(s) **165*a* and lead-out conductor portion(s) 165*b***.

For facilitating the understanding, in FIGS. 63A and 63B, the description has been given on the assumption that the lead-out conductor portion 165Ab and the lead-out conductor portion 165B are connected to the pad 401 or 402. However, the lead-out conductor portion 165Ab and the lead-out conductor portion 165B are not necessarily connected to the pad 401 or 402, and it is sufficient that they are connected to another wiring or electrode.

Furthermore, FIGS. 63A and 63B illustrate an example in which the pads 401 and 402 have substantially the same shape and are arranged at substantially the same position. However, the configuration is not limited to the example. For example, the pads 401 and 402 may have different shapes or may be arranged at different positions. Furthermore, the pads 401 and 402 may have smaller dimensions than the example illustrated in FIGS. 63A and 63B, may not be in contact with each other in the wiring layer 165A, or may not be in contact with each other in the wiring layer 165B, or a plurality of the pads 401 and 402 may be provided.

In the above-described first to thirteenth configuration examples, for the wiring layer 165A, the main conductor portion 165Aa and the lead-out conductor portion 165Ab are not particularly distinguished, and both the main conductor portion 165Aa and the lead-out conductor portion 165Ab have been formed using the same wiring pattern such as the planar conductor or the reticulated conductor.

As for the wiring layer 165B, the main conductor portion 165Ba and the lead-out conductor portion 165Bb are not particularly distinguished, and both the main conductor portion 165Ba and the lead-out conductor portion 165Bb have been formed using the same wiring pattern such as the planar conductor or the reticulated conductor.

Moreover, FIGS. 63A and 63B illustrate, but is not limited to, the example in which the end positions in the Y direction substantially match in the main conductor portion 165Aa and the lead-out conductor portion 165Ab. For example, the main conductor portion 165Aa and the lead-out conductor portion 165Ab may be configured such that the end positions do not match. Similarly, FIGS. 63A and 63B illustrate, but is not limited to, the example in which the end positions in the Y direction substantially match in the main conductor portion 165B and the lead-out conductor portion 165Bb. For example, the main conductor portion 165B and the lead-out conductor portion 165B may be configured such that the end positions do not match. The shapes and positions of the main conductor portions 165*a* and the lead-out conductor portions 165*b* and the relationship between the pads 401 and 402 are similar in the configuration examples to be described below.

Figure 64A:
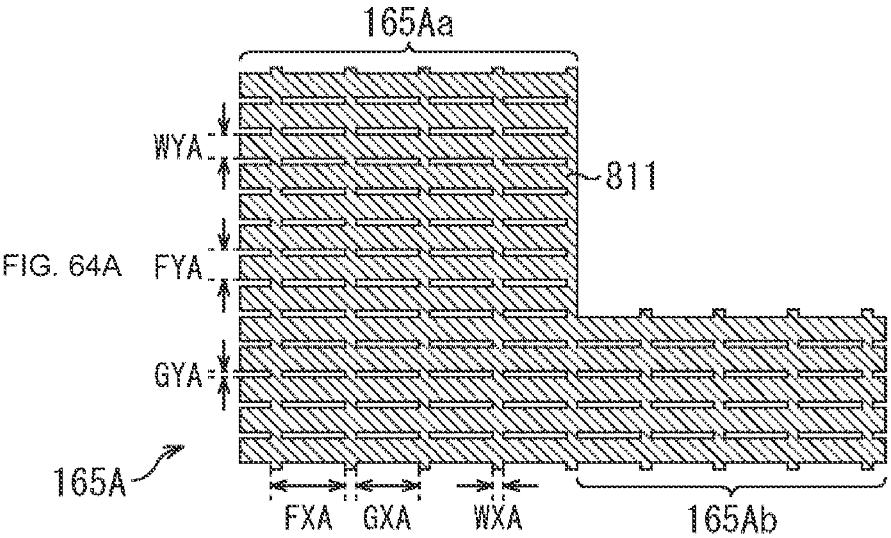
FIGS. 64A, 64B, and 64C are diagrams illustrating an eleventh configuration example of the conductor layers A and B.
Figure 64B:
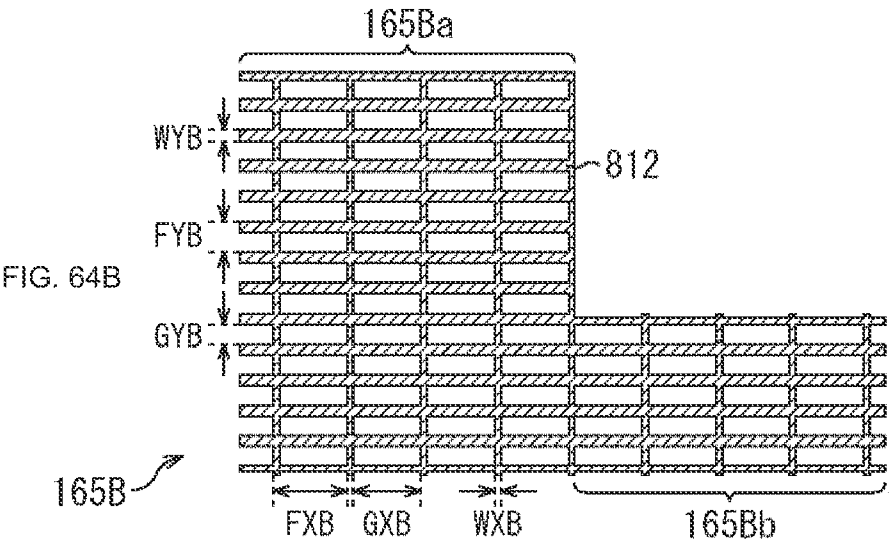
Figure 64C:
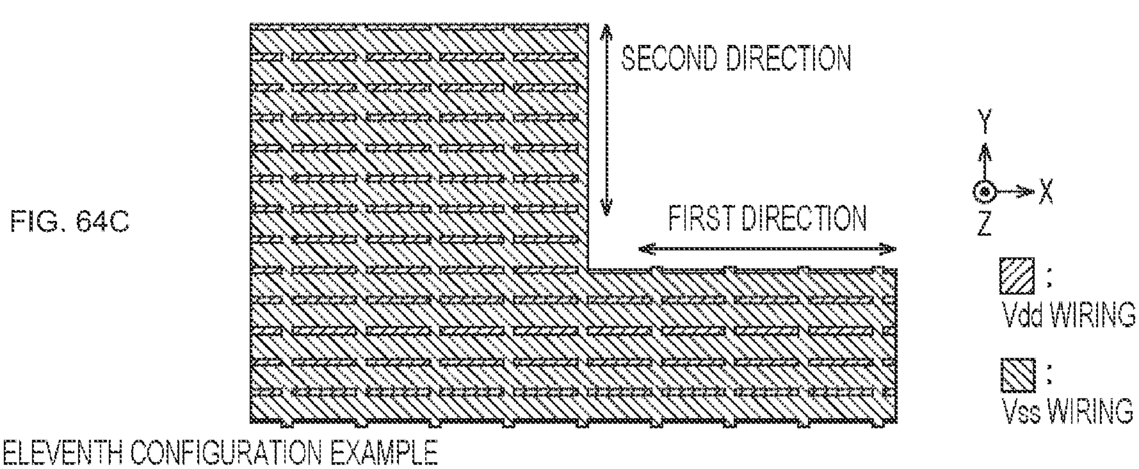

FIGS. 64A, 64B, and 64C illustrate examples in which the eleventh configuration example illustrated in FIGS. 36A, 36B, and 36C are applied to the wiring layer 165A and the wiring layer 165B, using different wiring patterns, as an example of the first to thirteenth configuration examples.

FIG. 64A illustrates the conductor layer A (wiring layer 165A) and FIG. 64B illustrates the conductor layer B (wiring layer 165B). In the coordinate system in FIGS. 64A, 64B, and 64C, the horizontal direction is the X axis, the vertical direction is the Y axis, and the direction perpendicular to the XY plane is the Z axis.

In the eleventh configuration example illustrated in FIGS. 36A, 36B, and 36C, the reticulated conductor 311 of the conductor layer A illustrated in FIG. 36A is an example of the shape in which the conductor width WXA in the X direction is wider than the gap width GXA, whereas a reticulated conductor 811 of the conductor layer A in FIG. 64A has a shape in which the conductor width WXA in the X direction is narrower than the gap width GXA. Furthermore, in the Y direction, the reticulated conductor 311 illustrated in FIG. 36A is an example of the shape in which the conductor width WYA is narrower than the gap width GYA, whereas the reticulated conductor 811 of the conductor layer A in FIG. 64A has a shape in which the conductor width WYA is wider than the gap width GYA. The reticulated conductor 311 of the conductor layer A illustrated in FIG. 36A is an example of the shape in which the conductor width WYA and the conductor width WXA are substantially the same, whereas the reticulated conductor 811 of the conductor layer A in FIG. 64A has a shape in which the conductor width WYA is wider than the conductor width WXA. Then, in the reticulated conductor 811 of the conductor layer A in FIG. 64, the same pattern is periodically arranged with the conductor period FXA in the X direction, and the same pattern is periodically arranged with the conductor period FYA in the Y direction, both in the main conductor portion 165Aa and the lead-out conductor portion 165Ab.

The conductor layer B has a shape in which a ratio of the gap width GXB to the conductor width WXB in the X direction (gap width GXB/conductor width WXB) of a reticulated conductor 812 of the conductor layer B in FIG. 64B is larger than the ratio of the gap width GXB to the conductor width WXB in the X direction (gap width GXB/conductor width WXB) of the reticulated conductor 312 of the conductor layer B illustrated in FIG. 36B. In other words, the reticulated conductor 812 of the conductor layer B in FIG. 64B has a larger difference between the conductor width WXB and the gap width GXB than the reticulated conductor 312 of the conductor layer B illustrated in B in FIG. 36B. In the Y direction, the ratio of the gap width GYB to the conductor width WYB (gap width GYB/conductor width WYB) of the reticulated conductor 812 of the conductor layer B in FIG. 64B is smaller than the ratio of the gap width GYB to the conductor width WYB (gap width GYB/conductor width WYB) of the reticulated conductor 312 of the conductor layer B illustrated in FIG. 36B. The reticulated conductor 312 of the conductor layer B illustrated in FIG. 36B is an example of the shape in which the conductor width WYB and the conductor width WXB are substantially the same, whereas the reticulated conductor 812 of the conductor layer B in FIG. 64B has a shape in which the conductor width WYB is wider than the conductor width WXB. Then, in the reticulated conductor 812 of the conductor layer B in FIG. 64B, the same pattern is periodically arranged with the conductor period FXB in the X direction, and the same pattern is periodically arranged with the conductor period FYB in the Y direction, both in the main conductor portion 165B and the lead-out conductor portion 165Bb.

FIG. 64C illustrates a state of the conductor layers A and B respectively illustrated in FIGS. 64A and 64B, which are viewed from the conductor layer A side (photodiode 141 side). In FIG. 64C, regions of the conductor layer B, which overlap with and are hidden by the conductor layer A, are not illustrated.

As illustrated in FIG. 64C, in the case of the eleventh configuration example, the active element group 167 is covered with at least one of the conductor layer A or the conductor layer B, the hot carrier light emission from the active element group 167 can be shielded, and generation of the inductive noise can be suppressed.

As described above, the first to thirteenth configuration examples are examples in which the main conductor portion 165Aa and the lead-out conductor portion 165Ab are not particularly distinguished and are formed using the same wiring pattern in the wiring layer 165A (conductor layer A), and the main conductor portion 165Ba and the lead-out conductor portion 165Bb are not particularly distinguished and are formed using the same wiring pattern in the wiring layer 165B (conductor layer B).

However, since the lead-out conductor portion 165*b* is formed with a smaller area than the main conductor portion 165*a* and is also a portion where the current is concentrated, it is desirable to have a configuration in which the wiring resistance is small and the current is easily diffused in the main conductor portion 165*a*.

Therefore, hereinafter, a configuration example in which the wiring pattern of the lead-out conductor portion 165Ab of the wiring layer 165A (conductor layer A) is made different from the wiring pattern of the main conductor portion 165Aa, and also the wiring pattern of the lead-out conductor portion 165Bb of the wiring layer 165B (conductor layer B) is made different from the wiring pattern of the main conductor portion 165Ba will be described.

Fourteenth Configuration Example

Figures 65A, 65B, 65C:
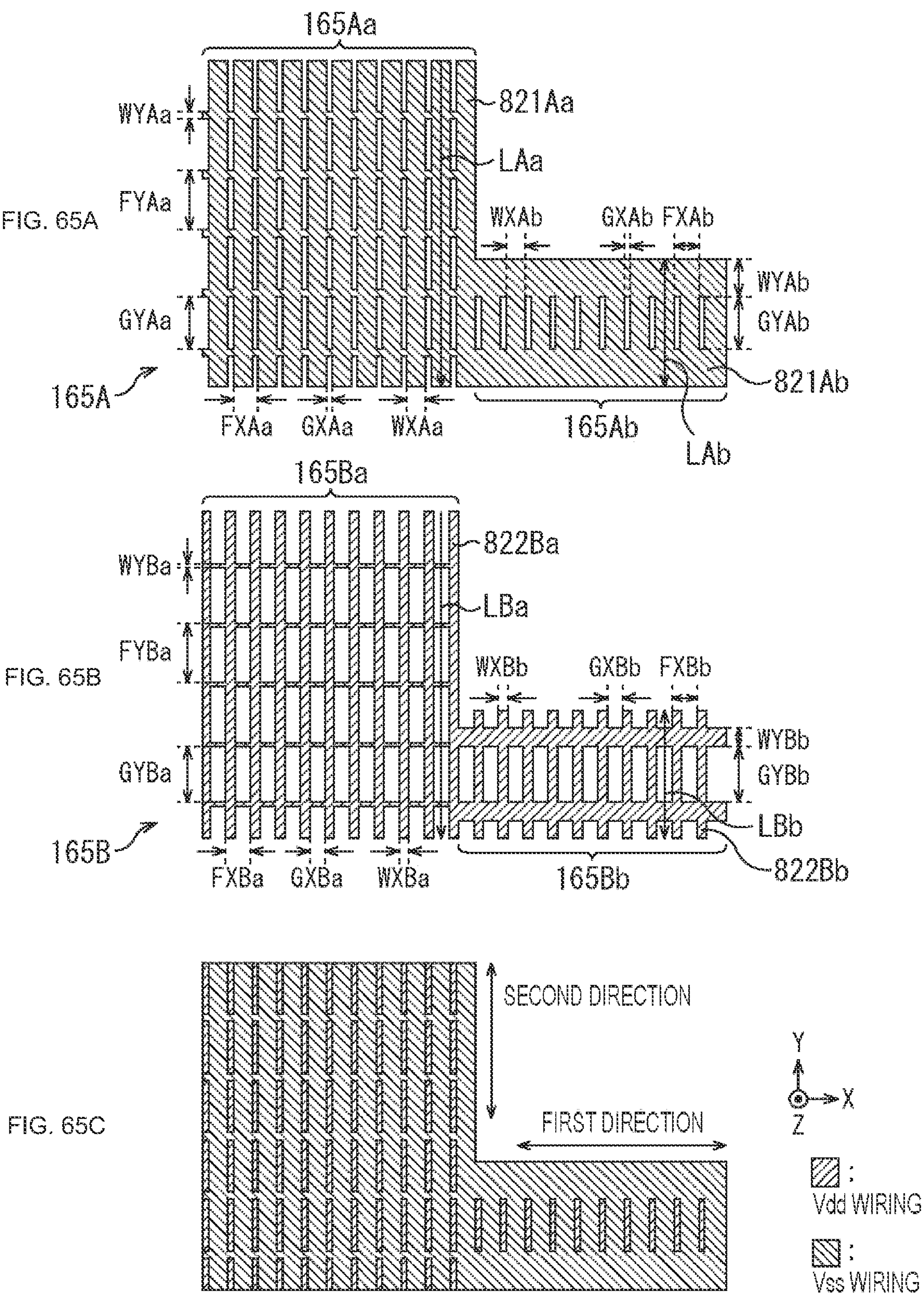
FIGS. 65A, 65B, and 65C diagrams illustrating a fourteenth configuration example of the conductor layers A and B.

FIGS. 65A, 65B, and 65C illustrate a fourteenth configuration example of the conductor layers A and B. Note that FIG. 65A illustrates the conductor layer A, and FIG. 65B illustrates the conductor layer B. In the coordinate system in FIGS. 65A, 65B, and 65C, the horizontal direction is the X axis, the vertical direction is the Y axis, and the direction perpendicular to the XY plane is the Z axis.

The conductor layer A in the fourteenth configuration example includes a reticulated conductor 821Aa of the main conductor portion 165Aa and a reticulated conductor 821Ab of the lead-out conductor portion 165Ab, as illustrated in FIG. 65A. The reticulated conductor 821Aa and the reticulated conductor 821Ab are, for example, wiring (Vss wiring) connected to GND or the negative power supply.

The reticulated conductor 821Aa of the main conductor portion 165Aa has a conductor width WXAa and a gap width GXAa and is configured such that the same pattern is periodically arranged with a conductor period FXAa in the X direction, and has a conductor width WYAa and a gap width GYAa and is configured such that the same pattern is periodically arranged with a conductor period FYAa in the Y direction. Therefore, the reticulated conductor 821Aa has a shape including a repeating pattern in which a predetermined basic pattern is repeatedly arranged with a conductor period in at least one of the X direction or the Y direction.

The reticulated conductor 821Ab of the lead-out conductor portion 165Ab has a conductor width WXAb and a gap width GXAb and is configured such that the same pattern is periodically arranged with a conductor period FXAb in the X direction, and has a conductor width WYAb and a gap width GYAb in the Y direction. Therefore, the reticulated conductor 821Ab has a shape including a repeating pattern in which a predetermined basic pattern is repeatedly arranged with a conductor period in at least one of the X direction or the Y direction.

Furthermore, when comparing the corresponding conductor widths WXA, gap widths GXA, conductor widths WYA, and gap widths GYA of the reticulated conductor 821Aa of the main conductor portion 165Aa and the reticulated conductor 821Ab of the lead-out conductor portion 165Ab, at least one widths have different values, and the repeating pattern of the reticulated conductor 821Ab of the lead-out conductor portion 165Ab is different from the repeating pattern of the reticulated conductor 821Aa of the main conductor portion 165Aa.

When comparing a total length LAa in the Y direction of the reticulated conductor 821Aa of the main conductor portion 165Aa with a total length LAb in the Y direction of the reticulated conductor 821Ab of the lead-out conductor portion 165Ab, the total length LAa of the reticulated conductor 821Aa is longer than the total length LAb of the reticulated conductor 821Ab. Therefore, the reticulated conductor 821Ab of the lead-out conductor portion 165Ab has a locally more concentrated current than the reticulated conductor 821Aa of the main conductor portion 165Aa, and thus has a larger voltage drop (particularly IR-Drop).

Here, the repeating pattern of the reticulated conductor 821Ab of the lead-out conductor portion 165Ab has a shape in which the current flows at least in a first direction, where the X direction toward the main conductor portion 165Aa is the first direction, and the conductor width (wiring width) WYAb in a second direction (Y direction) orthogonal to the first direction is larger than the conductor width (wiring width) WYAa in the second direction of the reticulated conductor 821Aa of the main conductor portion 165Aa. As a result, the wiring resistance of the reticulated conductor 821Ab of the lead-out conductor portion 165Ab, which is the current concentration point, can be reduced, so that the voltage drop can be further improved. Note that the example in which the conductor width WYAb is larger than the conductor width WYAa has been described. However, the configuration is not limited to the example, and for example, the conductor width WXAb may be larger than the conductor width WXAa. As a result, the wiring resistance of the reticulated conductor 821Ab can be reduced, so that the voltage drop can be further improved.

Furthermore, at least a part of the reticulated conductor 821Aa of the main conductor portion 165Aa has a pattern (shape) in which the current is more likely to flow in the Y direction (second direction) than in the X direction (first direction). Specifically, the wiring resistance is made smaller in the Y direction than in the X direction as at least one of the wiring widths (conductor width WXAa and conductor width WYAa) or the wiring gaps (gap width GXAa and gap width GYAa) is different. As a result, the current is easily diffused in the Y direction in the main conductor portion 165Aa having the total length LAa longer than the total length LAb of the reticulated conductor 821Ab, so that the electrodes concentrated around the joint portion between the main conductor portion 165Aa and the lead-out conductor portion 165Ab can be alleviated, and the inductive noise can be further improved.

The conductor layer B in the fourteenth configuration example includes a reticulated conductor 822Ba of the main conductor portion 165B and a reticulated conductor 822Bb of the lead-out conductor portion 165Bb, as illustrated in B in FIG. 65B. The reticulated conductor 822Ba and the reticulated conductor 822Bb are, for example, wiring (Vdd wiring) connected to the positive power supply.

The reticulated conductor 822Ba of the main conductor portion 165Ba has a conductor width WXBa and a gap width GXBa and is configured such that the same pattern is periodically arranged with a conductor period FXBa in the X direction, and has a conductor width WYBa and a gap width GYBa and is configured such that the same pattern is periodically arranged with a conductor period FYBa in the Y direction. Therefore, the reticulated conductor 822Ba has a shape including a repeating pattern in which a predetermined basic pattern is repeatedly arranged with a conductor period in at least one of the X direction or the Y direction.

The reticulated conductor 822Bb of the lead-out conductor portion 165Bb has a conductor width WXBb and a gap width GXBb and is configured such that the same pattern is periodically arranged with a conductor period FXBb in the X direction, and has a conductor width WYBb and a gap width GYBb in the Y direction. Therefore, the reticulated conductor 822Bb has a shape including a repeating pattern in which a predetermined basic pattern is repeatedly arranged with a conductor period in at least one of the X direction or the Y direction.

Furthermore, when comparing the corresponding conductor widths WXB, gap widths GXB, conductor widths WYB, and gap widths GYB of the reticulated conductor 822Ba of the main conductor portion 165Ba and the reticulated conductor 822Bb of the lead-out conductor portion 165Bb, at least one widths have different values, and the repeating pattern of the reticulated conductor 822Bb of the lead-out conductor portion 165Bb is different from the repeating pattern of the reticulated conductor 822Ba of the main conductor portion 165Ba.

When comparing a total length LBa in the Y direction of the reticulated conductor 822Ba of the main conductor portion 165Ba with a total length LBb in the Y direction of the reticulated conductor 822Bb of the lead-out conductor portion 165Bb, the total length LBa of the reticulated conductor 822Ba is longer than the total length LBb of the reticulated conductor 822Bb. Therefore, the reticulated conductor 822Bb of the lead-out conductor portion 165Bb has a locally more concentrated current than the reticulated conductor 822Ba of the main conductor portion 165Ba, and thus has a larger voltage drop (particularly IR-Drop).

Here, the repeating pattern of the reticulated conductor 822Bb of the lead-out conductor portion 165Bb has a shape in which the current flows at least in the first direction, where the X direction toward the main conductor portion 165Ba is the first direction, and the conductor width (wiring width) WYBb in the second direction (Y direction) orthogonal to the first direction is larger than the conductor width (wiring width) WYBa in the second direction of the reticulated conductor 822Ba of the main conductor portion 165Ba. As a result, the wiring resistance of the reticulated conductor 822Bb of the lead-out conductor portion 165Bb, which is the current concentration point, can be reduced, so that the voltage drop can be further improved. Note that the example in which the conductor width WYBb is larger than the conductor width WYBa has been described. However, the configuration is not limited to the example, and for example, the conductor width WXBb may be larger than the conductor width WXBa. As a result, the wiring resistance of the reticulated conductor 822Bb can be reduced, so that the voltage drop can be further improved.

Furthermore, at least a part of the reticulated conductor 822Ba of the main conductor portion 165Ba has a pattern (shape) in which the current is more likely to flow in the Y direction (second direction) than in the X direction (first direction). Specifically, the wiring resistance is made smaller in the Y direction than in the X direction as at least one of the wiring widths (conductor width WXBa and conductor width WYBa) or the wiring gaps (gap width GXBa and gap width GYBa) is different. As a result, the current is easily diffused in the Y direction in the main conductor portion 165Ba having the total length LBa longer than the total length LBb of the reticulated conductor 822Bb, so that the electrodes concentrated around the joint portion between the main conductor portion 165Ba and the lead-out conductor portion 165Bb can be alleviated, and the inductive noise can be further improved.

According to the fourteenth configuration example, in the wiring layer 165A (conductor layer A), the repeating pattern of the reticulated conductor 821Ab of the lead-out conductor portion 165Ab is formed to be different from the repeating pattern of the reticulated conductor 821Aa of the main conductor portion 165Aa, and the main conductor portion 165Aa and the lead-out conductor portion 165Ab are electrically connected, whereby the wiring resistance of the lead-out conductor portion 165Ab can be made small and the voltage drop can be further improved. In the wiring layer 165B (conductor layer B), the repeating pattern of the reticulated conductor 822Bb of the lead-out conductor portion 165Bb is formed to be different from the repeating pattern of the reticulated conductor 822Ba of the main conductor portion 165Ba, and the main conductor portion 165Ba and the lead-out conductor portion 165Bb are electrically connected, whereby the wiring resistance of the lead-out conductor portion 165Bb can be made small and the voltage drop can be further improved.

Furthermore, as illustrated in FIG. 65C, in the state where the conductor layer A and the conductor layer B are stacked, the active element group 167 is covered with at least one of the conductor layer A or the conductor layer B. That is, the main conductor portion 165Aa of the wiring layer 165A and the main conductor portion 165B of the wiring layer 165B form a light-shielding structure, and the lead-out conductor portion 165Ab of the wiring layer 165A and the lead-out conductor portion 65B of the wiring layer 165B form a light-shielding structure. Thereby, the hot carrier light emission from the active element group 167 can be shielded in the fourteenth configuration example similarly to the above-described first to thirteenth configuration examples.

Modification of Fourteenth Configuration Example

FIGS. 66A, 66B, 66C, 67A, 67B, 67C, 68A, 68B, and 68C illustrate first to third modifications of the fourteenth configuration example. Note that since FIGS. 66A, 66B, 66C, 67A, 67B, 67C, 68A, 68B, and 68C correspond to FIGS. 65A, 65B, and 65C and are given the same reference numerals, description of common parts will be omitted as appropriate, and different parts will be described.

In the fourteenth configuration example illustrated in FIGS. 65A, 65B, and 65C, the joint portion of the main conductor portion 165Aa and the lead-out conductor portion 165Ab is arranged on a side of a rectangle surrounding an outer periphery of the main conductor portion 165Aa in the wiring layer 165A (conductor layer A). However, the configuration is not limited thereto.

Figure 66A:
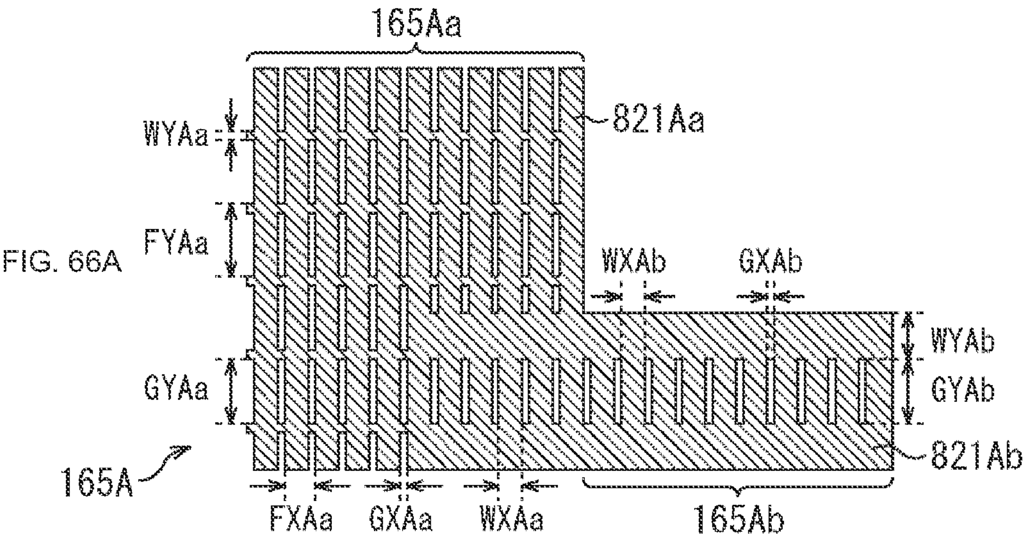
FIGS. 66A, 66B, and 66C are diagrams illustrating a first modification of the fourteenth configuration example of the conductor layers A and B.

For example, as illustrated in FIG. 66A, the main conductor portion 165Aa and the lead-out conductor portion 165Ab may be connected so that the reticulated conductor 821Ab of the lead-out conductor portion 165Ab enters the inside of the rectangle surrounding the outer periphery of the main conductor portion 165Aa.

Figure 67A:
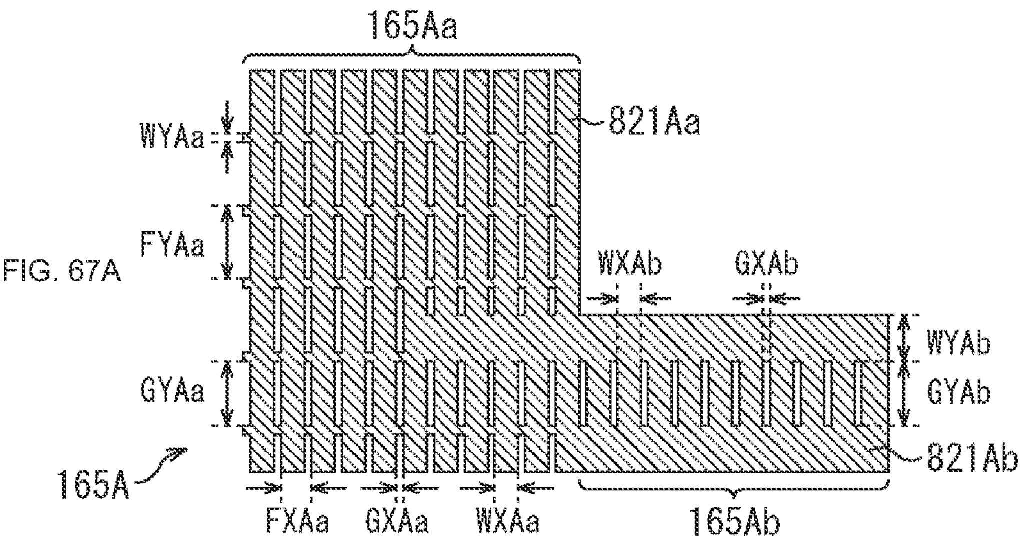
FIGS. 67A, 67B, and 67C are diagrams illustrating a second modification of the fourteenth configuration example of the conductor layers A and B.
Figure 68A:
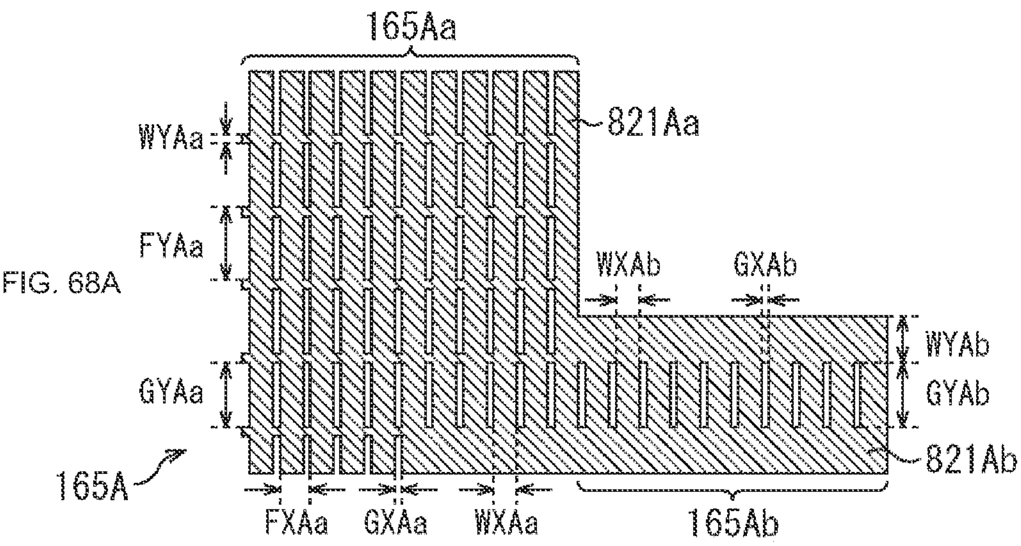
FIGS. 68A, 68B, and 68C are diagrams illustrating a third modification of the fourteenth configuration example of the conductor layers A and B.

Furthermore, for example, the main conductor portion 165Aa and the lead-out conductor portion 165Ab may be connected such that only a part of the plurality of wirings of the conductor width WYAb extending toward the main conductor portion 165Aa of the reticulated conductor 821Ab of the lead-out conductor portion 165Ab enters the inside of the rectangle surrounding the outer periphery of the main conductor portion 165Aa, as illustrated in FIG. 67A and in FIG. 68A. In the reticulated conductor 821Ab of the lead-out conductor portion 165Ab in FIG. 67A, the upper wiring of the two wirings of the conductor width WYAb extends to enter the inside of the rectangle surrounding the outer periphery of the main conductor portion 165Aa. In the reticulated conductor 821Ab of the lead-out conductor portion 165Ab in FIG. 68A, the lower wiring extends to enter the inside of the rectangle surrounding the outer periphery of the main conductor portion 165Aa.

The same applies to the wiring layer 165B (conductor layer B). That is, in the fourteenth configuration example illustrated in FIGS. 65A, 65B, and 65C, the joint portion of the main conductor portion 165B and the lead-out conductor portion 165B is arranged on a side of a rectangle surrounding an outer periphery of the main conductor portion 165Ba. However, the configuration is not limited thereto.

Figure 66B:
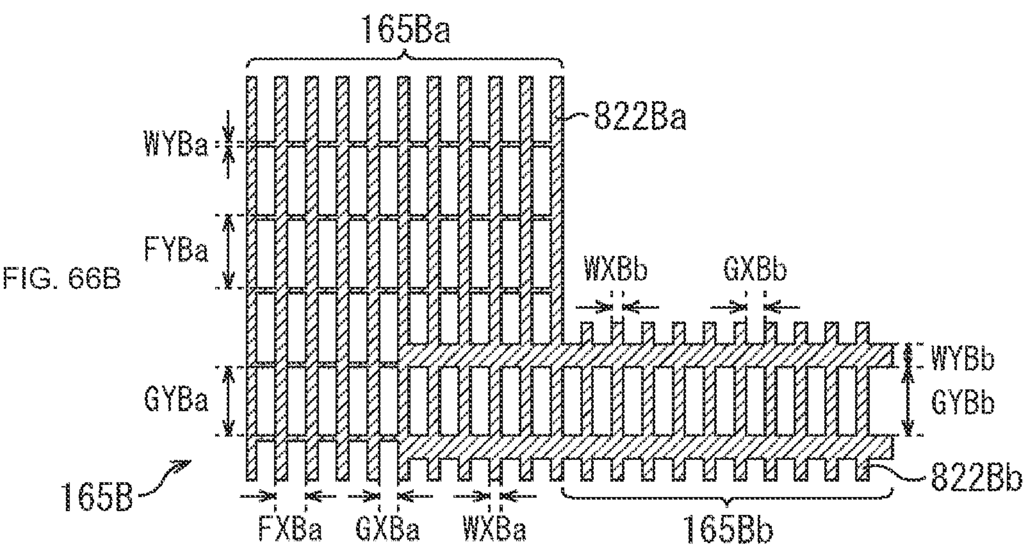
Figure 66C:
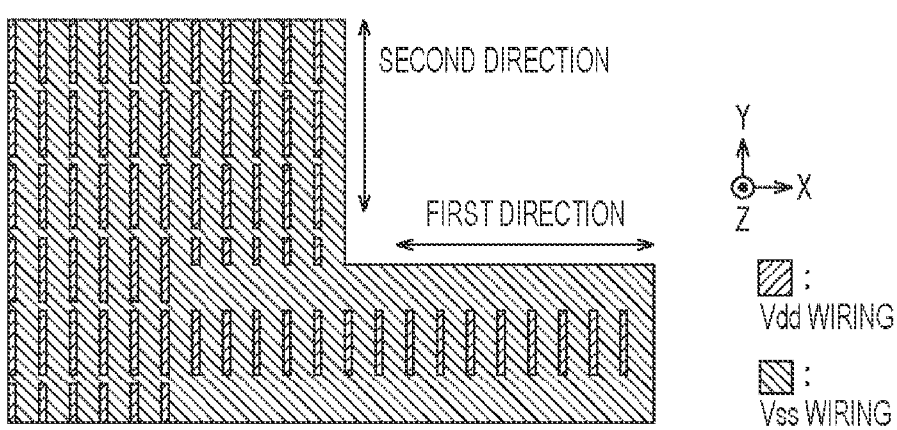

For example, as illustrated in FIG. 66B, the main conductor portion 65B and the lead-out conductor portion 165B may be connected so that the reticulated conductor 822Bb of the lead-out conductor portion 165B enters the inside of the rectangle surrounding the outer periphery of the main conductor portion 165Ba.

Figure 67B:
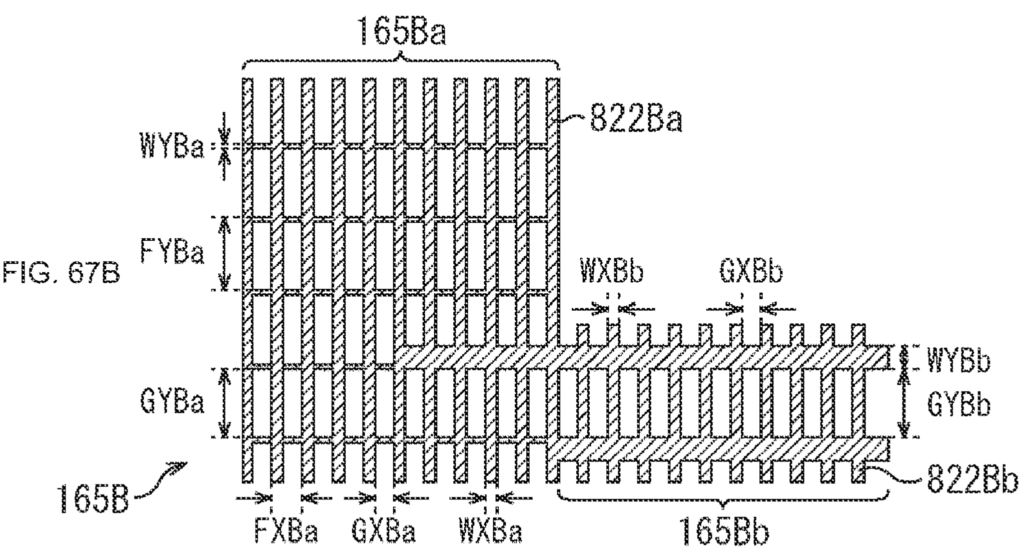
Figure 67C:
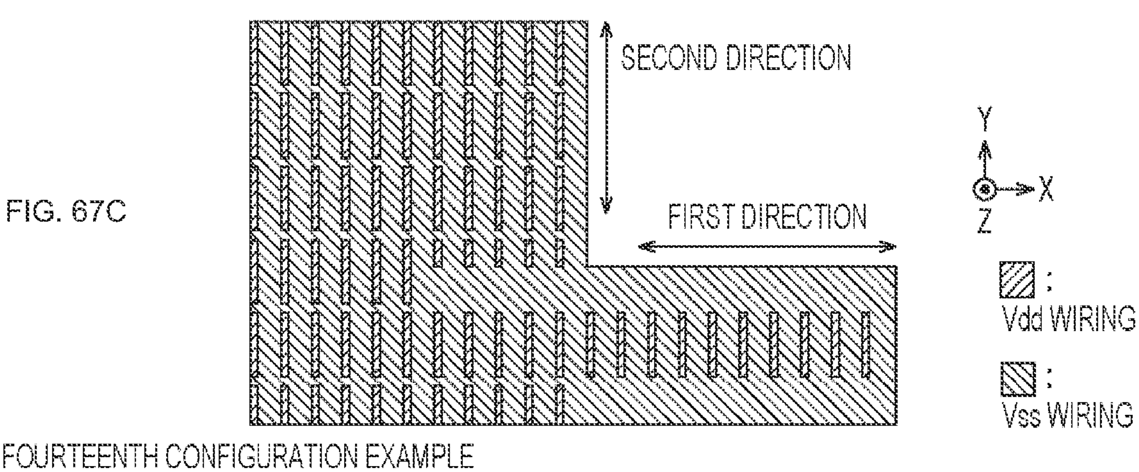
Figure 68B:
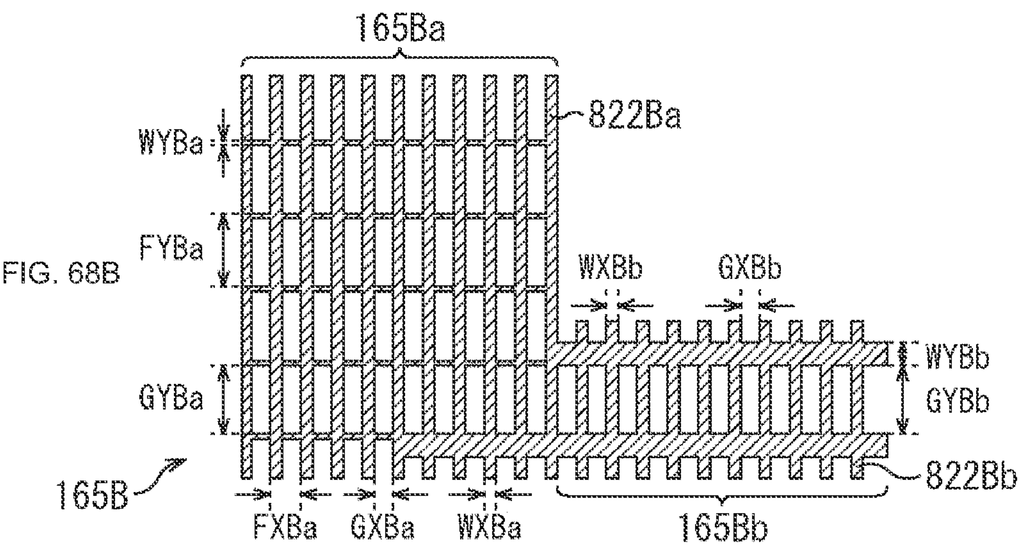
Figure 68C:
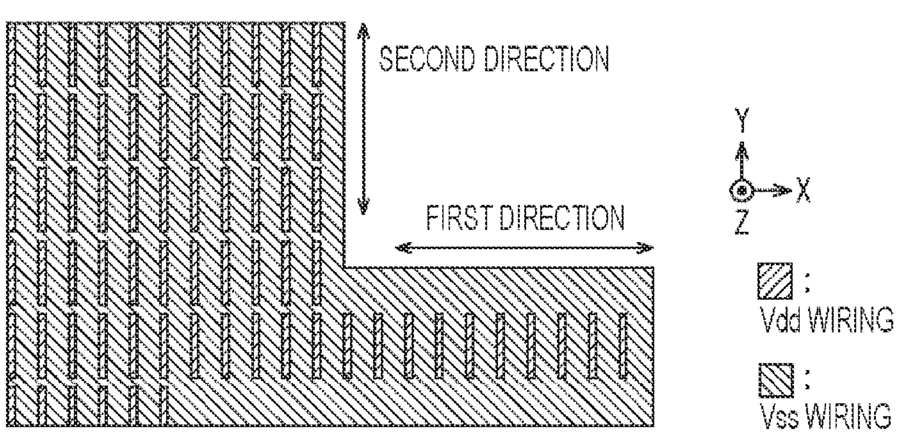

Furthermore, for example, the main conductor portion 165B and the lead-out conductor portion 165B may be connected such that only a part of the plurality of wirings of the conductor width WYBb extending toward the main conductor portion 65B of the reticulated conductor 822Bb of the lead-out conductor portion 165B enters the inside of the rectangle surrounding the outer periphery of the main conductor portion 165Ba, as illustrated in FIGS. 67B and 68B. In the reticulated conductor 822Bb of the lead-out conductor portion 165B in FIG. 67B, the upper wiring of the two wirings of the conductor width WYBb extends to enter the inside of the rectangle surrounding the outer periphery of the main conductor portion 165Ba. In the reticulated conductor 822Bb of the lead-out conductor portion 165B in FIG. 68B the lower wiring extends to enter the inside of the rectangle surrounding the outer periphery of the main conductor portion 165Ba.

As illustrated in FIGS. 66A, 66B, 66C, 67A, 67B, 67C, 68A, 68B, and 68C, the shape of the portion connecting the main conductor portion 165*a* and the lead-out conductor portion 165*b* may be complicatedly configured.

In the first to third modifications of the fourteenth configuration example illustrated in FIGS. 66A, 66B, 66C, 67A, 67B, 67C, 68A, 68B, and 68C, the main conductor portion 165Aa and the lead-out conductor portion 165Ab are connected such that the reticulated conductor 821Ab of the lead-out conductor portion 165Ab enters the inside of the rectangle surrounding the outer periphery of the main conductor portion 165Aa. However, the reticulated conductor 821Aa of the main conductor portion 165Aa may extend outside the rectangle surrounding the outer periphery of the main conductor portion 165Aa and enter the lead-out conductor portion 165Ab. Furthermore, the reticulated conductor 822Ba of the main conductor portion 165B may extend outside the rectangle surrounding the outer periphery of the main conductor portion 165B and enter the lead-out conductor portion 165Bb.

Fifteenth Configuration Example

Figure 69A:
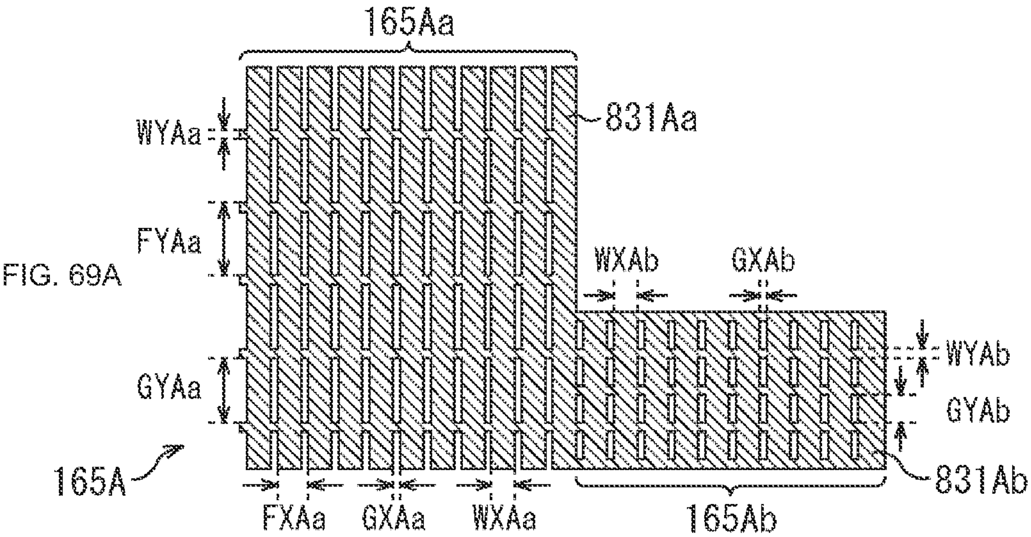
FIGS. 69A, 69B, and 69C are diagrams illustrating a fifteenth configuration example of the conductor layers A and B.
Figure 69B:
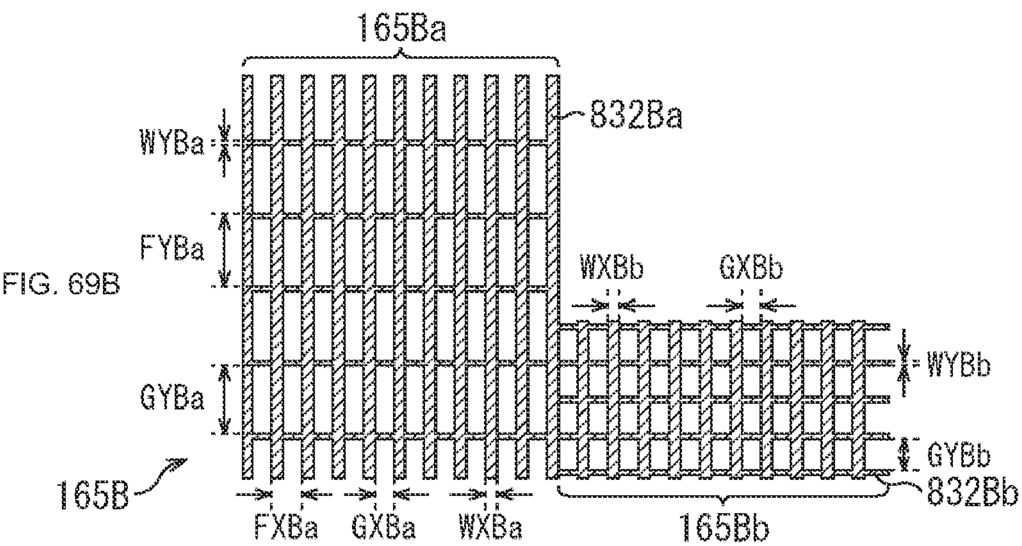
Figure 69C:
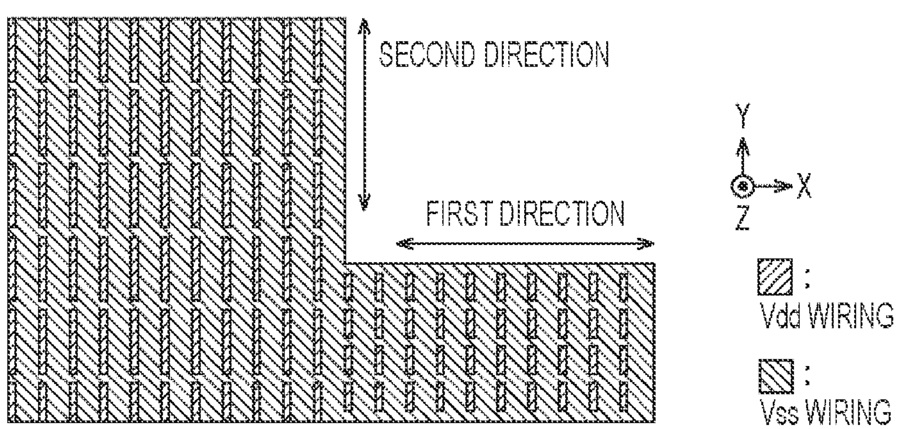

FIGS. 69A, 69B, and 69C illustrate a fifteenth configuration example of the conductor layers A and B. Note that FIG. 69A illustrates the conductor layer A, and FIG. 69B illustrates the conductor layer B. In the coordinate system in FIGS. 69A, 69B, and 69C, the horizontal direction is the X axis, the vertical direction is the Y axis, and the direction perpendicular to the XY plane is the Z axis.

The conductor layer A in the fifteenth configuration example includes a reticulated conductor 831Aa of the main conductor portion 165Aa and a reticulated conductor 831Ab of the lead-out conductor portion 165Ab, as illustrated in FIG. 69. The reticulated conductor 831Aa and the reticulated conductor 831Ab are, for example, wiring (Vss wiring) connected to the GND or the negative power supply. The reticulated conductor 831Aa of the main conductor portion 165Aa is similar to the reticulated conductor 821Aa of the main conductor portion 165Aa in the fourteenth configuration example in FIGS. 65A, 65B, and 65C. Meanwhile, the reticulated conductor 831Ab of the lead-out conductor portion 165Ab is different from the reticulated conductor 821Ab of the lead-out conductor portion 165Ab in the fourteenth configuration example in FIGS. 65A, 65B, and 65C.

Specifically, the gap width GYAb in the Y direction of the reticulated conductor 831Ab of the lead-out conductor portion 165Ab is formed to be smaller than the gap width GYAa in the Y direction of the reticulated conductor 831Aa of the main conductor portion 165Aa. In the fourteenth configuration example illustrated in FIGS. 65A, 65B, and 65C, the gap width GYAb in the Y direction of the reticulated conductor 821Ab of the lead-out conductor portion 165Ab is the same as the gap width GYAa in the Y direction of the reticulated conductor 821Aa of the main conductor portion 165Aa.

By forming the gap width GYAb in the Y direction of the reticulated conductor 831Ab of the lead-out conductor portion 165Ab to be smaller than the gap width GYAa in the Y direction of the reticulated conductor 831Aa of the main conductor portion 165Aa, the wiring resistance of the reticulated conductor 831Ab of the lead-out conductor portion 165Ab, which is the current concentration point, can be reduced, so that the voltage drop can be further improved. Note that the description has been given using the example in which the gap width GYAb is smaller than the gap width GYAa. However, the configuration is not limited thereto, and for example, the gap width GXAb may be formed to be smaller than the gap width GXAa. As a result, the wiring resistance of the reticulated conductor 831Ab can be reduced, so that the voltage drop can be further improved.

The conductor layer B in the fifteenth configuration example includes a reticulated conductor 832Ba of the main conductor portion 165B and a reticulated conductor 832Bb of the lead-out conductor portion 165Bb, as illustrated in FIG. 69B. The reticulated conductor 832Ba and the reticulated conductor 832Bb are, for example, wiring (Vdd wiring) connected to the positive power supply.

The reticulated conductor 832Ba of the main conductor portion 165B is similar to the reticulated conductor 822Ba of the main conductor portion 165B in the fourteenth configuration example in FIGS. 65A, 65B, and 65C. Meanwhile, the reticulated conductor 832Bb of the lead-out conductor portion 165B is different from the reticulated conductor 822Bb of the lead-out conductor portion 165B in the fourteenth configuration example in FIGS. 65A, 65B, and 65C.

Specifically, the gap width GYBb in the Y direction of the reticulated conductor 832Bb of the lead-out conductor portion 165B is formed to be smaller than the gap width GYBa in the Y direction of the reticulated conductor 832Ba of the main conductor portion 165Ba. In the fourteenth configuration example in FIGS. 65A, 65B, and 65C, the gap width GYBb in the Y direction of the reticulated conductor 822Bb of the lead-out conductor portion 165B is the same as the gap width GYBa in the second direction of the reticulated conductor 822Ba of the main conductor portion 165Ba.

By forming the gap width GYBb in the Y direction of the reticulated conductor 832Bb of the lead-out conductor portion 165Bb to be smaller than the gap width GYBa in the Y direction of the reticulated conductor 832Ba of the main conductor portion 165Ba, the wiring resistance of the reticulated conductor 832Bb of the lead-out conductor portion 165Bb, which is the current concentration point, can be reduced, so that the voltage drop can be further improved. Note that the description has been given using the example in which the gap width GYBb is smaller than the gap width GYBa. However, the configuration is not limited thereto, and for example, the gap width GXBb may be formed to be smaller than the gap width GXBa. As a result, the wiring resistance of the reticulated conductor 832Bb can be reduced, so that the voltage drop can be further improved.

Furthermore, as illustrated in FIG. 69C, in the state where the conductor layer A and the conductor layer B are stacked, the active element group 167 is covered with at least one of the conductor layer A or the conductor layer B. That is, the main conductor portion 165Aa of the wiring layer 165A and the main conductor portion 165B of the wiring layer 165B form a light-shielding structure, and the lead-out conductor portion 165Ab of the wiring layer 165A and the lead-out conductor portion 65B of the wiring layer 165B form a light-shielding structure. Thereby, the hot carrier light emission from the active element group 167 can also be shielded in the fifteenth configuration example.

First Modification of Fifteenth Configuration Example

Figures 70A, 70B, 70C:
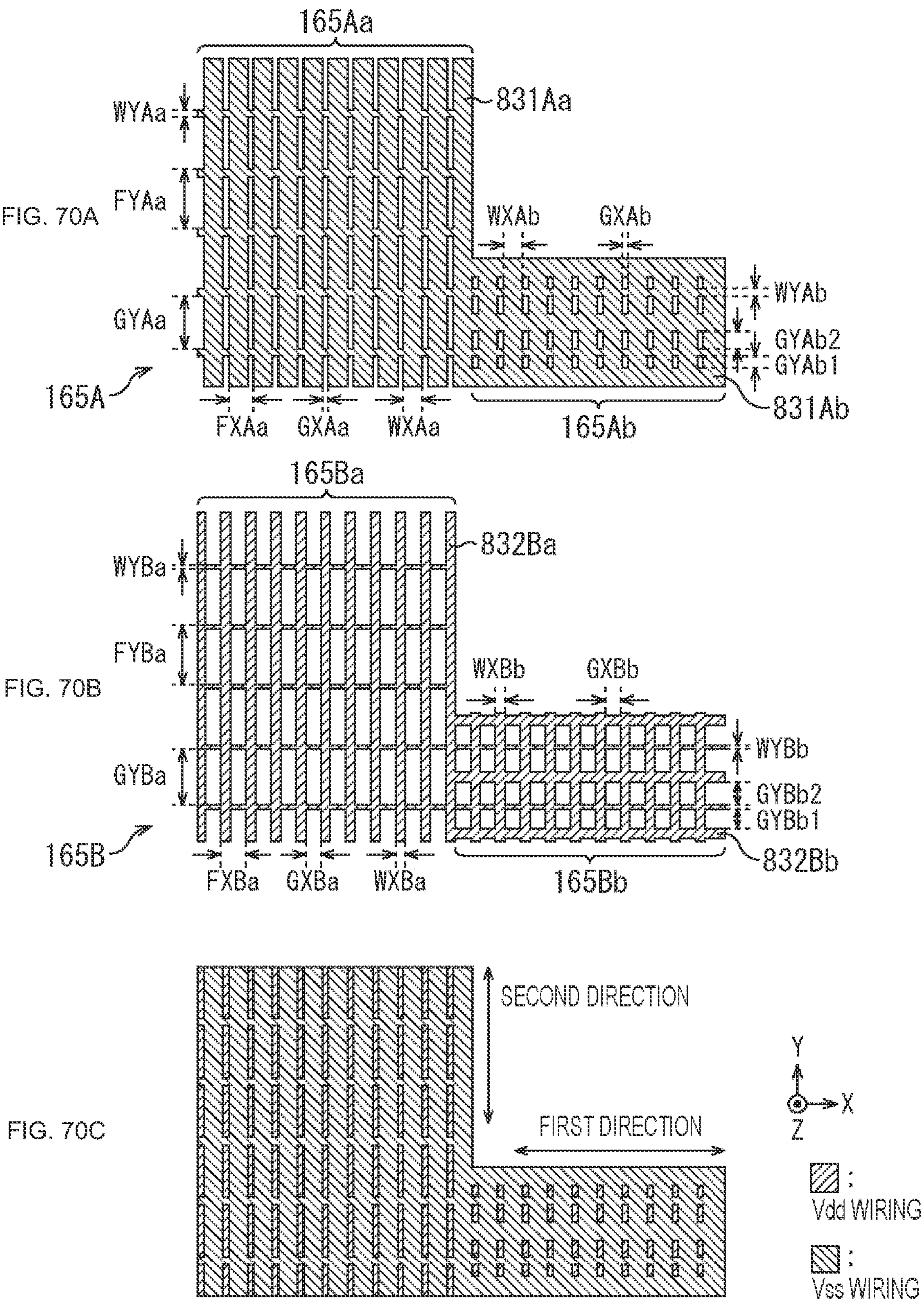
FIGS. 70A, 70B, and 70C are diagrams illustrating a first modification of the fifteenth configuration example of the conductor layers A and B.

FIGS. 70A, 70B, and 70C illustrate a first modification of the fifteenth configuration example. Note that FIG. 70A illustrates the conductor layer A, and FIG. 70B illustrates the conductor layer B. FIG. 70C illustrates a state of the conductor layers A and B respectively illustrated in FIGS. 70A and 70B, which are viewed from the conductor layer A side. In the coordinate system in FIGS. 70A, 70B, and 70C, the horizontal direction is the X axis, the vertical direction is the Y axis, and the direction perpendicular to the XY plane is the Z axis.

The first modification of the fifteenth configuration example is different from the fifteenth configuration example illustrated in FIGS. 69A, 69B, and 69C in that all the gap widths GYAb in the Y direction of the lead-out conductor portion 165Ab of the wiring layer 165A are not uniform. Specifically, as illustrated in FIG. 70A the reticulated conductor 831Ab of the lead-out conductor portion 165Ab of the wiring layer 165A has two types of gap widths GYAb: a small gap width GYAb1 and a large gap width GYAb2.

Furthermore, the first modification of the fifteenth configuration example is different from the fifteenth configuration example illustrated in FIGS. 69A, 69B, and 69C in that all the gap widths GYBb in the Y direction of the lead-out conductor portion 65B of the wiring layer 165B are not uniform. Specifically, as illustrated in FIG. 70B the reticulated conductor 832Bb of the lead-out conductor portion 165Bb of the wiring layer 165B has two types of gap widths GYBb: a small gap width GYBb1 and a large gap width GYBb2.

Even in the first modification of the fifteenth configuration example, the lead-out conductor portion 165Ab of the wiring layer 165A and the lead-out conductor portion 165B of the wiring layer 165B form the light-shielding structure in the state where the conductor layer A and the conductor layer B are stacked, as illustrated in FIG. 70C.

Second Modification of Fifteenth Configuration Example

Figure 71A:
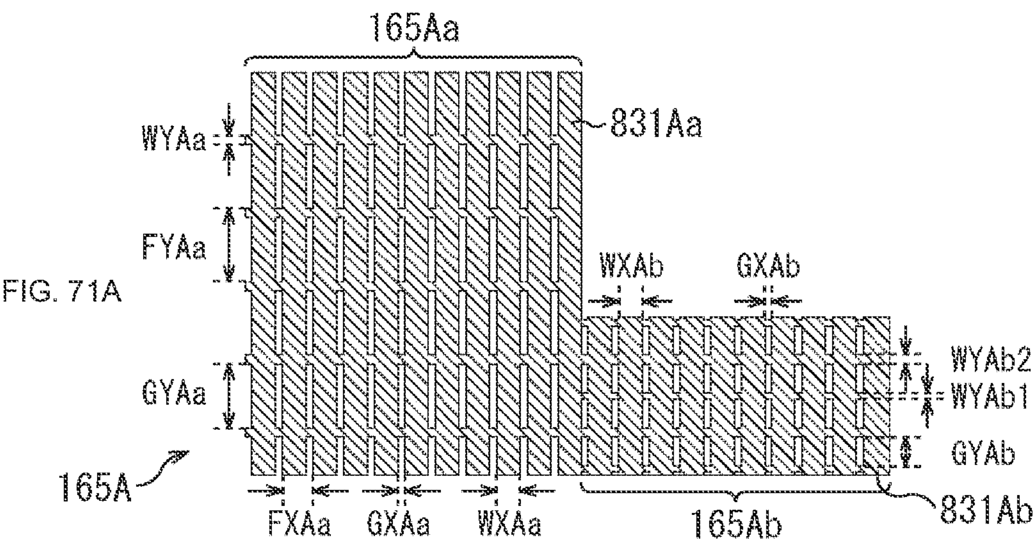
FIGS. 71A, 71B, and 71C are diagrams illustrating a second modification of the fifteenth configuration example of the conductor layers A and B.
Figure 71B:
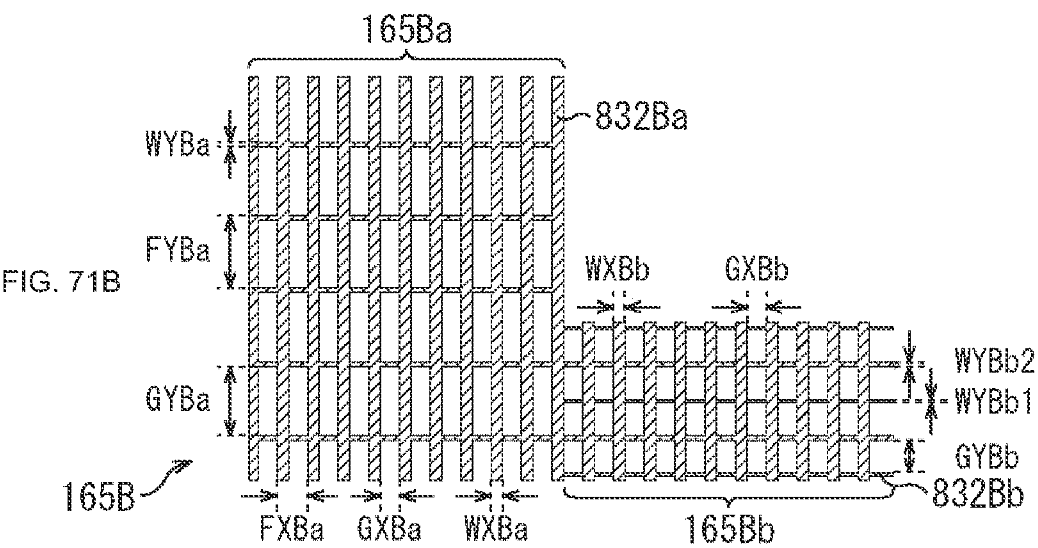
Figure 71C:
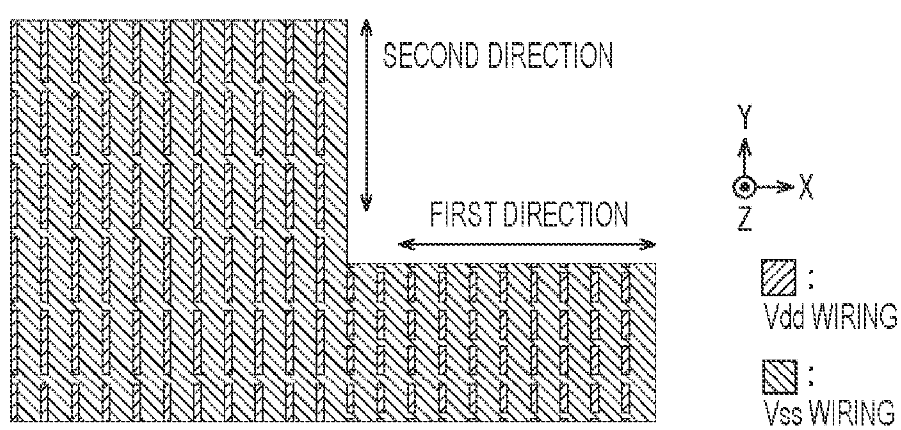

FIGS. 71A, 71B, and 71C illustrate a second modification of the fifteenth configuration example. Note that FIG. 71A illustrates the conductor layer A, and FIG. 71B illustrates the conductor layer B. FIG. 71C illustrates a state of the conductor layers A and B respectively illustrated in FIGS. 71A and 71B, which are viewed from the conductor layer A side. In the coordinate system in FIGS. 71A, 71B, and 71C, the horizontal direction is the X axis, the vertical direction is the Y axis, and the direction perpendicular to the XY plane is the Z axis.

The second modification of the fifteenth configuration example is different from the fifteenth configuration example illustrated in FIGS. 69A, 69B, and 69C in that all the conductor widths WYAb in the Y direction of the lead-out conductor portion 165Ab of the wiring layer 165A are not uniform. Specifically, as illustrated in FIG. 71A, the reticulated conductor 831Ab of the lead-out conductor portion 165Ab of the wiring layer 165A has two types of conductor widths WYAb: a small conductor width WYAb1 and a large conductor width WYAb2.

Furthermore, the second modification of the fifteenth configuration example is different from the fifteenth configuration example illustrated in FIGS. 69A, 69B, and 69C in that all the conductor widths WYBb in the Y direction of the lead-out conductor portion 165B of the wiring layer 165B are not uniform. Specifically, as illustrated in FIG. 71B, the reticulated conductor 832Bb of the lead-out conductor portion 165B of the wiring layer 165B has two types of conductor widths WYBb: a small conductor width WYBb1 and a large conductor width WYBb2.

Even in the second modification of the fifteenth configuration example, the lead-out conductor portion 165Ab of the wiring layer 165A and the lead-out conductor portion 165B of the wiring layer 165B form the light-shielding structure in the state where the conductor layer A and the conductor layer B are stacked, as illustrated in FIG. 71C.

As in the first modification and the second modification of the fifteenth configuration example, the gap width GYAb or the conductor width WYAb of the lead-out conductor portion 165Ab of the wiring layer 165A or the gap width GYBb or the conductor width WYBb of the lead-out conductor portion 165Bb of the wiring layer 165B is made non-uniform, so that the degree of freedom in wiring can be increased. Each conductor layer generally has a restriction on occupancy of a conductor region. However, since the wiring resistances of the lead-out conductor portions 165Ab and 165Bb can be minimized within the restriction on the occupancy due to the increase in the degree of freedom in wiring, the voltage drop can be further improved. Note that the description has been given using the example in which all the gap widths GYAb are not uniform, the example in which all the gap widths GYBb are not uniform, the example in which all the conductor widths WYAb are not uniform, and the case in which all the conductor widths WYBb are not uniform. However, the configuration is not limited to the examples. For example, the conductor layers may be configured such that all the gap widths GXAb in the X direction, all the gap widths GXBb in the X direction, all the conductor widths WXAb in the X direction, or all the conductor widths WXBb in the X direction are not uniform. Even in these cases, the degree of freedom in wiring can be increased, so that the voltage drop can be further improved for the similar reason as described above.

Sixteenth Configuration Example

Figure 72A:
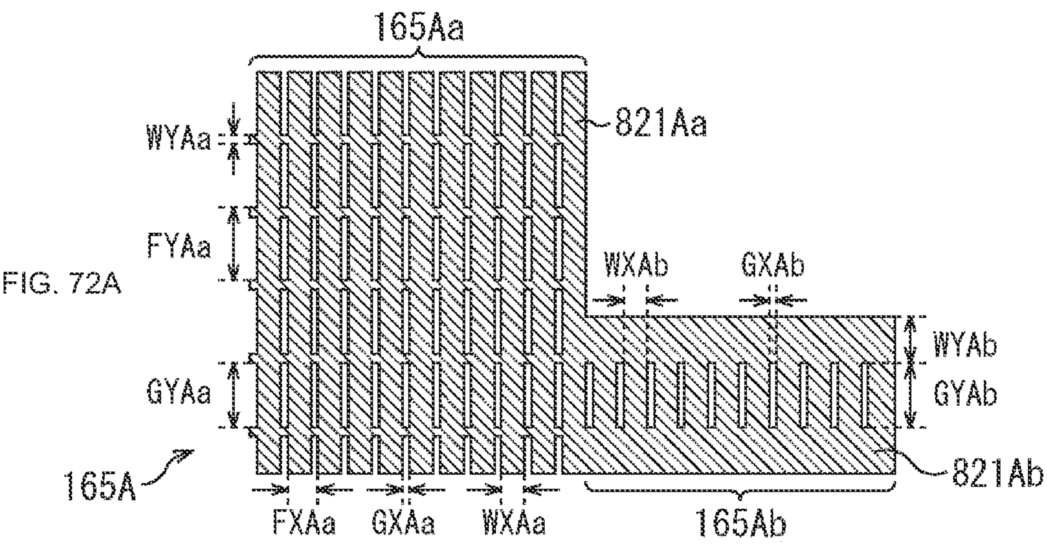
FIGS. 72A, 72B, and 72C are diagrams illustrating a sixteenth configuration example of the conductor layers A and B.
Figure 72B:
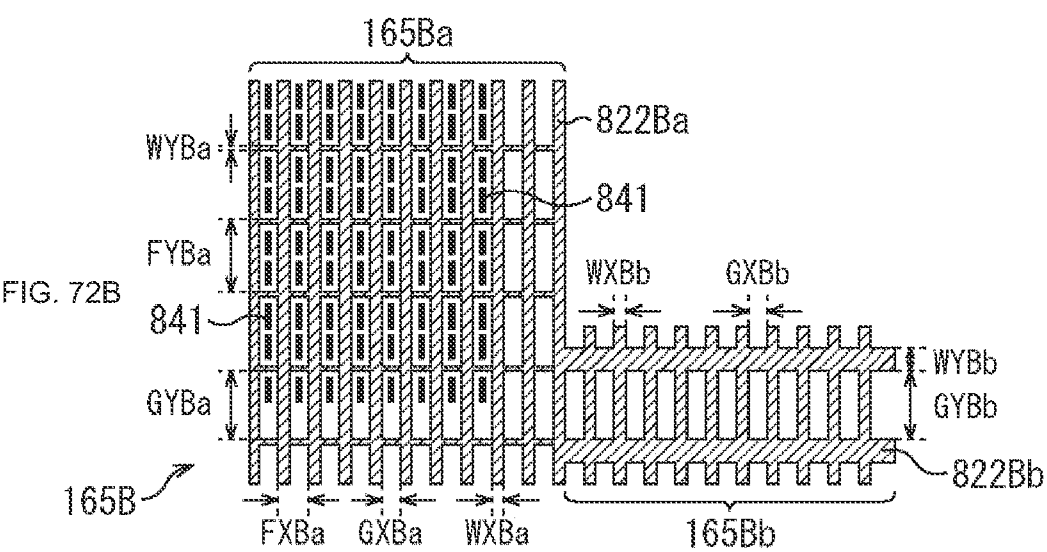
Figure 72C:
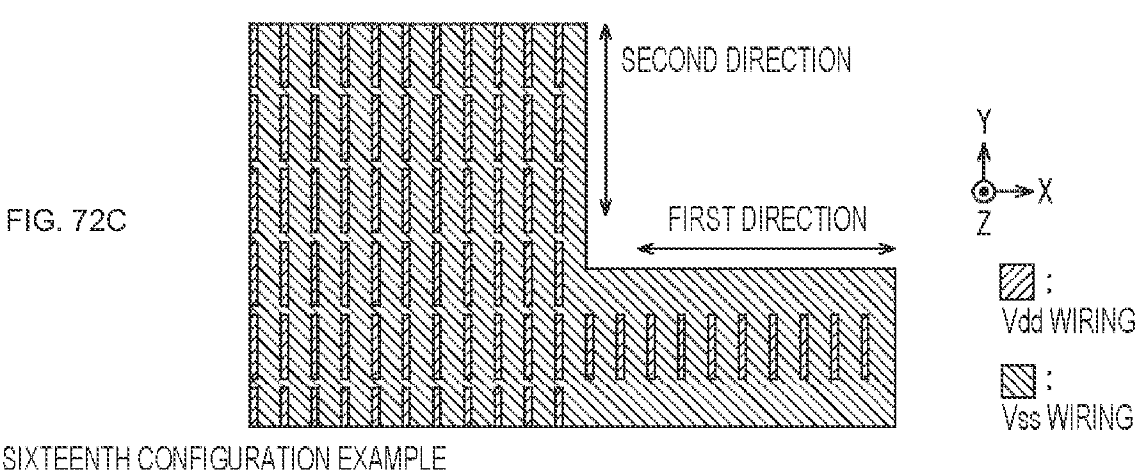

FIGS. 72A, 72B, and 72C illustrate a sixteenth configuration example of the conductor layers A and B. Note that FIG. 72A illustrates the conductor layer A, and FIG. 72B illustrates the conductor layer B. In the coordinate system in FIGS. 72A, 72B, and 72C, the horizontal direction is the X axis, the vertical direction is the Y axis, and the direction perpendicular to the XY plane is the Z axis.

Since the conductor layer A of the sixteenth configuration example illustrated in FIG. 72A is similar to the conductor layer A of the fourteenth configuration example illustrated in FIGS. 65A, 65B, and 65C, description thereof will be omitted.

The conductor layer B of the sixteenth configuration example illustrated in FIG. 72B has a configuration in which a relay conductor 841 is further added to the conductor layer B of the fourteenth configuration example illustrated in FIGS. 65A, 65B, and 65C. More specifically, the main conductor portion 165B includes the reticulated conductor 822Ba and a plurality of relay conductors 841, and the lead-out conductor portion 165B includes the reticulated conductor 822Bb similar to the fourteenth configuration example.

In the main conductor portion 165Ba, the relay conductor 841 is arranged in a rectangular gap region long in the Y direction other than the reticulated conductor 822Ba and is electrically isolated from the reticulated conductor 822Ba, and is connected to, for example, Vss wiring to which the reticulated conductor 821Aa of the conductor layer A is connected. One or a plurality of relay conductors 841 is arranged in the gap region of the reticulated conductor 822Ba. FIG. 72B illustrates an example in which a total of two relay conductors 841 are arranged in the gap region of the reticulated conductor 822Ba in two-row one-column arrangement.

In FIG. 72B, the relay conductors 841 are arranged in only some gap regions of the reticulated conductor 822Ba in the entire region of the main conductor portion 165Ba.

However, the relay conductor 841 may be arranged in the gap regions of the entire region of the main conductor portion 165Ba. Furthermore, in the conductor layer B of the sixteenth configuration example, the relay conductor 841 is not arranged in the gap region of the reticulated conductor 822Bb of the lead-out conductor portion 165Bb. However, the relay conductor 841 may be arranged in the gap region of the reticulated conductor 822Bb.

First Modification of Sixteenth Configuration Example

Figure 73A:
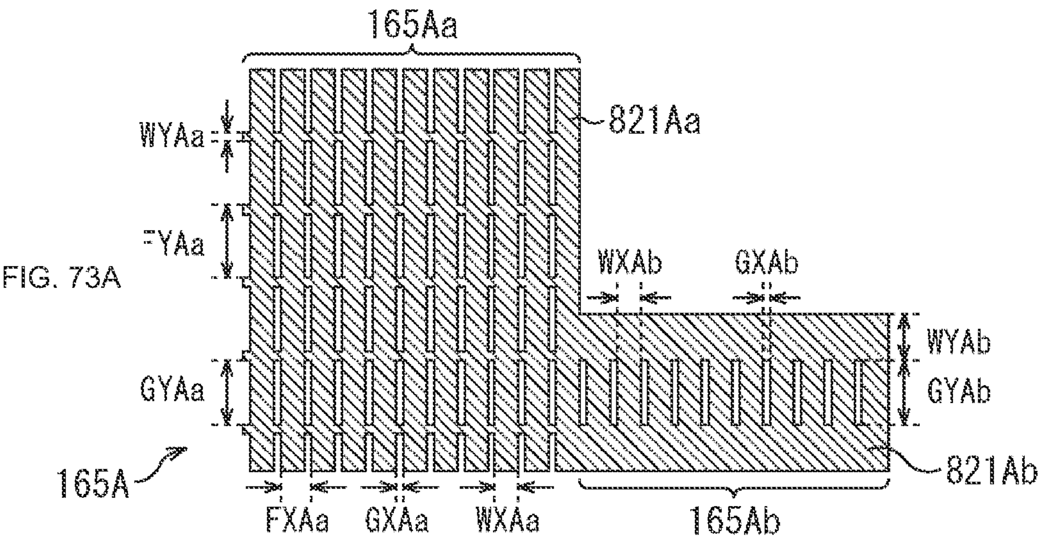
FIGS. 73A, 73B, and 73C are diagrams illustrating a first modification of the sixteenth configuration example of the conductor layers A and B.
Figure 73B:
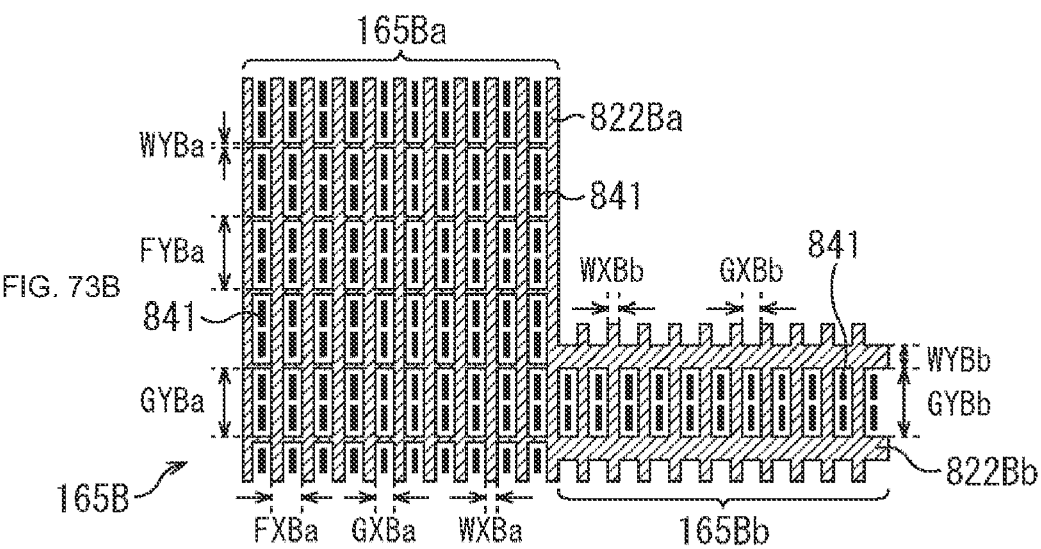
Figure 73C:
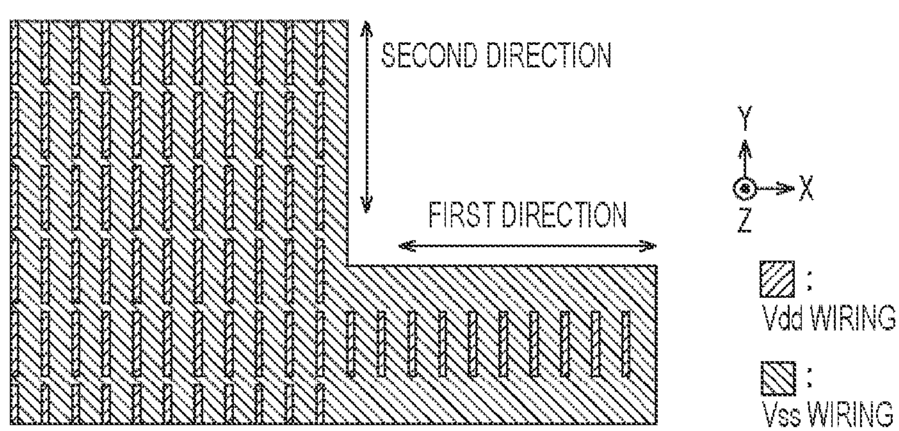

FIGS. 73A, 73B, and 73C illustrate a first modification of the sixteenth configuration example.

In the first modification of the sixteenth configuration example in FIGS. 73A 73B, and 73C, the relay conductor 841 is arranged in the gap regions of the entire region of the main conductor portion 165B of the conductor layer B, and is arranged in the gap regions of the reticulated conductor 822Bb of the lead-out conductor portion 165Bb. Other configurations in the first modification in FIGS. 73A, 73B, and 73C are similar to those in the sixteenth configuration example illustrated in FIGS. 72A, 72B, and 72C.

Second Modification of Sixteenth Configuration Example

Figure 74A:
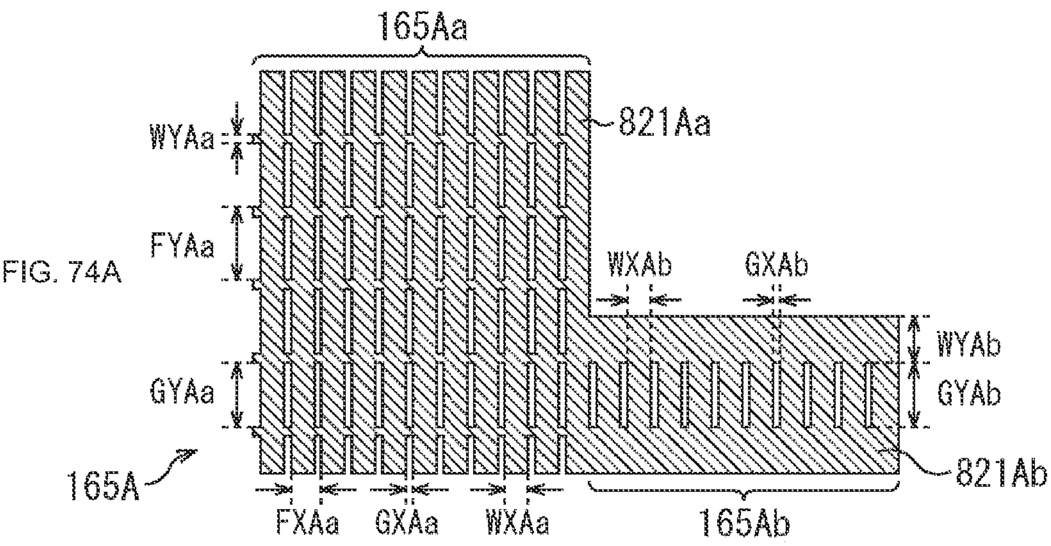
FIGS. 74A, 74B, and 74C are diagrams illustrating a second modification of the sixteenth configuration example of the conductor layers A and B.
Figure 74B:
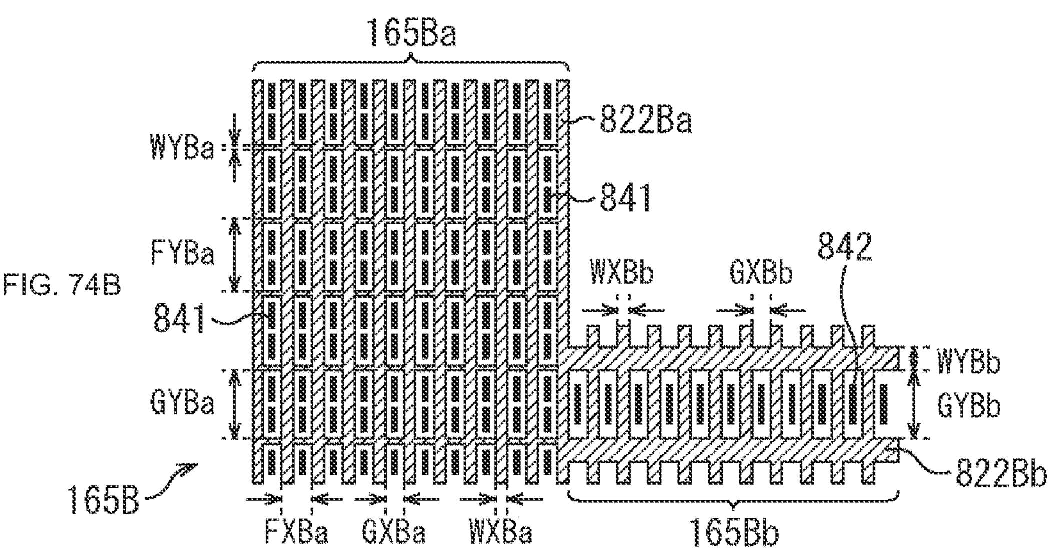
Figure 74C:
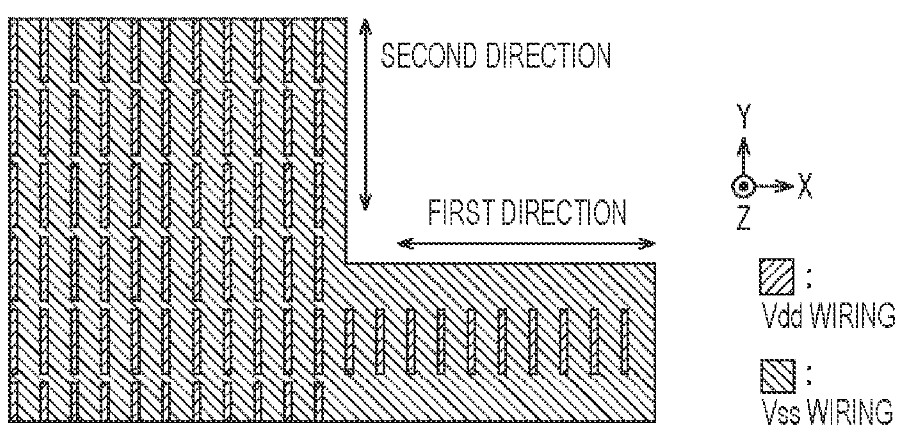

FIGS. 74A, 74B, and 74C illustrate a second modification of the sixteenth configuration example.

The second modification of the sixteenth configuration example in FIGS. 74A, 74B, and 74C are similar to the first modification in that the relay conductor 841 is arranged in the gap regions of the entire region of the main conductor portion 165Ba of the conductor layer B. Meanwhile, the second modification of the sixteenth configuration example is different from the first modification in that a relay conductor 842 different from the relay conductor 841 is arranged in the gap regions of the reticulated conductor 822Bb of the lead-out conductor portion 165Bb. Other configurations in the second modification in FIGS. 74A, 74B, and 74C are similar to those in the sixteenth configuration example illustrated in FIGS. 72A, 72B, and 72C.

As in the second modification, the numbers and shapes of the relay conductors 841 arranged in the gap regions of the reticulated conductor 822Ba of the main conductor portion 165Ba and the relay conductors 842 arranged in the gap regions of the reticulated conductor 822Bb of the lead-out conductor portion 165Bb, of the conductor layer B may be different.

In the case where the relay conductor 841 is not arranged in the gap region of the reticulated conductor 822Bb of the lead-out conductor portion 165Bb, as in the conductor layer B of the sixteenth configuration example in FIGS. 72A, 72B, and 72C, the degree of freedom in wiring (reticulated conductor 822Bb) can be increased. Each conductor layer generally has a restriction on occupancy of a conductor region. However, since the wiring resistance of the lead-out conductor portion 165B can be minimized within the restriction on the occupancy due to the increase in the degree of freedom in wiring, the voltage drop can be further improved.

Meanwhile, in the case where the relay conductor 841, the relay conductor 842, or the like is arranged in the gap regions of the reticulated conductor 822Bb of the lead-out conductor portion 165Bb, and in a case where active elements such as MOS transistors and diodes are arranged in the region of the lead-out conductor portion 165Bb or in upper and lower layers at the same plane positions as the lead-out conductor portion 165Bb, the voltage drop can be further improved.

Furthermore, by making the numbers and shapes different between the relay conductor 841 arranged in the gap regions of the reticulated conductor 822Ba of the main conductor portion 165Ba and the relay conductor 842 arranged in the gap regions of the reticulated conductor 822Bb of the lead-out conductor portion 165Bb, of the conductor layer B, the occupancy in the conductor regions of each conductor layer can be maximized in the main conductor portion 165Ba and the lead-out conductor portion 165Bb. Therefore, the voltage drop can be further improved as the wiring resistance is made small.

Note that the shape of the relay conductor 841 is arbitrary, and a symmetric circle or polygon such as rotational symmetry or mirror plane symmetry is desirable. The relay conductor 841 can be arranged in a center of or at any other position of the gap region of the reticulated conductor 822Ba. The relay conductor 841 may be connected to a conductor layer as Vss wiring different from the conductor layer A. The relay conductor 841 may be connected to a conductor layer as Vss wiring closer to the active element group 167 than the conductor layer B. The relay conductor 841 can be connected to a conductor layer different from the conductor layer A or to a conductor layer or the like closer to the active element group 167 than the conductor layer B via the conductor via (VIA) extending in the Z direction. The same applies to the relay conductor 842.

The sixteenth configuration example in FIGS. 72A, 72B, 72C, 73A, 73B, 73C, 74A, 74B, and 74C illustrates an example of arranging the relay conductor 841 or 842 in the gap regions of the reticulated conductors 822Ba and 822Bb of the conductor layer B. However, the same or different relay conductors may be arranged in the gap regions of the reticulated conductors 821Aa and 821Ab of the conductor layer A.

Seventeenth Configuration Example

Figure 75A:
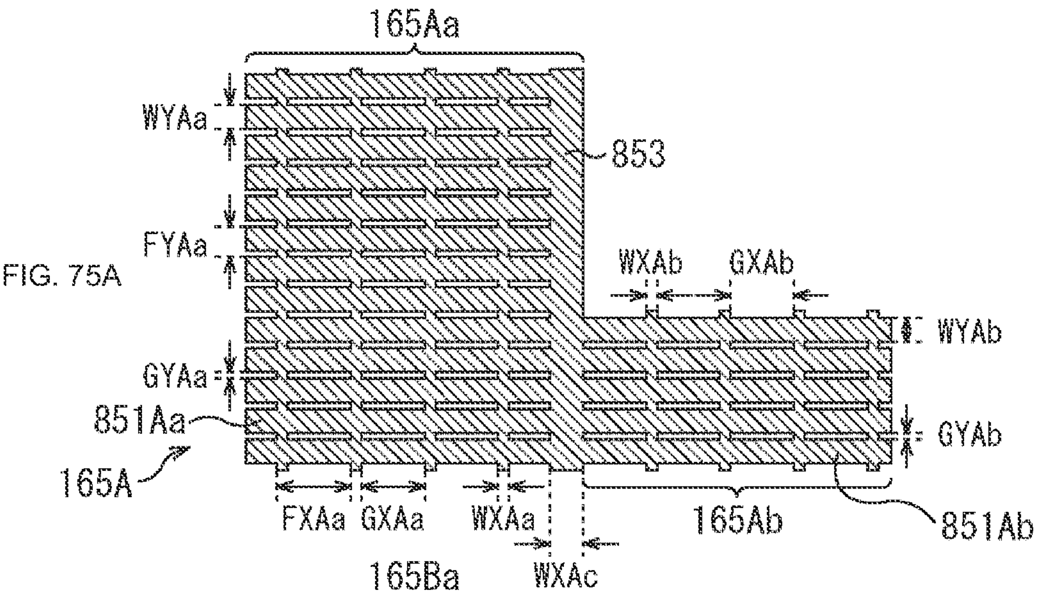
FIGS. 75A, 75B, and 75C are diagrams illustrating a seventeenth configuration example of the conductor layers A and B.
Figure 75B:
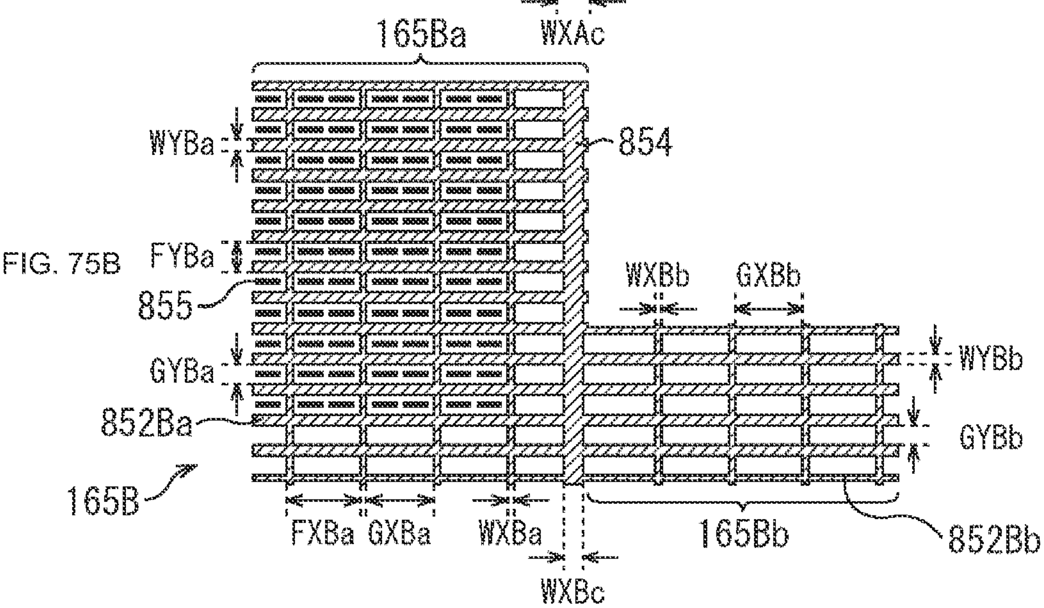
Figure 75C:
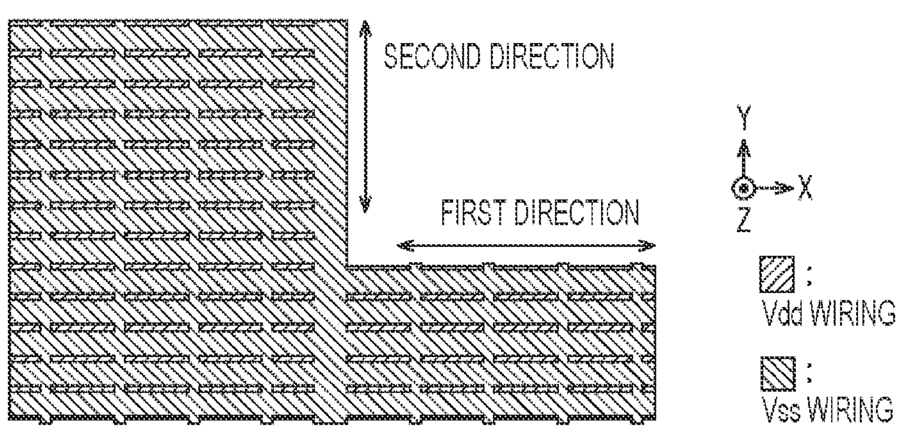

FIGS. 75A, 75B, and 75C illustrate a seventeenth configuration example of the conductor layers A and B. Note that FIG. 75A illustrates the conductor layer A, and FIG. 75B illustrates the conductor layer B. In the coordinate system in FIGS. 75A, 75B, and 75C, the horizontal direction is the X axis, the vertical direction is the Y axis, and the direction perpendicular to the XY plane is the Z axis.

When comparing the conductor layer A in the seventeenth configuration example illustrated in FIG. 75A with the conductor layer A of the fourteenth configuration example illustrated in FIG. 65A, the shape of a reticulated conductor Aa of the main conductor portion 165Aa and the shape of a reticulated conductor Ab of the lead-out conductor portion 165Ab are different.

In other words, the gap region of the reticulated conductor 821Aa in the fourteenth configuration example in FIG. 65A has the vertically long rectangular shape, whereas the gap region of the reticulated conductor 851Aa in the seventeenth configuration example in FIG. 75A has a horizontally long rectangular shape. Furthermore, the gap region of the reticulated conductor 821Ab in FIG. 65A has the vertically long rectangular shape, whereas the gap region of the reticulated conductor Ab in FIG. 75A has a horizontally long rectangular shape.

The reticulated conductor 851Ab of the lead-out conductor portion 165Ab in FIG. 75A is common to the reticulated conductor 821Ab in the fourteenth configuration example in FIG. 65A in that the current more easily flows in the X direction (first direction) toward the main conductor portion 165Aa than in the Y direction (second direction) orthogonal to the X direction.

Meanwhile, the reticulated conductor 851Aa of the main conductor portion 165Aa in FIG. 75A has a shape in which the current more easily flows in the X direction than in the Y direction, whereas the reticulated conductor 821Aa of the main conductor portion 165Aa in the fourteenth configuration example in FIG. 65A has the shape in which the current more easily flows in the Y direction.

That is, the conductor layer A in the seventeenth configuration example illustrated in FIG. 75A is different from the conductor layer A of the fourteenth configuration example in FIG. 65A in the direction in which the current easily flows in the main conductor portion 165Aa.

Furthermore, the main conductor portion 165Aa of the conductor layer A in the seventeenth configuration example includes a reinforced conductor 853 reinforced such that the current more easily flows in the Y direction than in the X direction. A conductor width WXAc of the reinforced conductor 853 is desirably formed to be larger than one or both of the conductor width WXAa in the X direction and the conductor width WYAa in the Y direction of the reticulated conductor 851Aa. The conductor width WXAc of the reinforced conductor 853 is formed to be larger than the conductor width WXAa in the X direction or the conductor width WYAa in the Y direction of the reticulated conductor 851Aa, whichever is smaller. Note that, in the example in FIGS. 75A, 75B, and 75C, the position in the X direction at which the reinforced conductor 853 is formed is a position closest to the lead-out conductor portion 165Ab in the region of the main conductor portion 165Aa. However, it is sufficient that the position is a position near the joint portion.

Since the reticulated conductor 851Aa of the main conductor portion 165Aa can be formed in the shape that allows the current to easily flow in the X direction, the layout can be created with a minimum number of repetitions of the basic pattern, which increases the degree of freedom in designing the wiring layout. Furthermore, the voltage drop can be further improved depending on arrangement of the active elements such as MOS transistors and diodes.

Then, by providing the reinforced conductor 853 reinforced such that the current can easily flow in the Y direction, the current can be easily diffused in the Y direction in the main conductor portion 165Aa, so that the current concentration around the joint portion between the main conductor portion 165Aa and the lead-out conductor portion 165Ab can be alleviated. In a case where the current is locally concentrated, the inductive noise deteriorates due to the concentrated portion. However, since the current concentration can be reduced, the inductive noise can be further improved.

When comparing the conductor layer B in the seventeenth configuration example illustrated in FIG. 75B with the conductor layer B of the fourteenth configuration example illustrated in FIG. 65B, the shape of a reticulated conductor 852Ba of the main conductor portion 165B and the shape of a reticulated conductor 852Bb of the lead-out conductor portion 165B are different.

In other words, the gap region of the reticulated conductor 822Ba in the fourteenth configuration example illustrated in FIG. 65B has the vertically long rectangular shape, whereas the gap region of the reticulated conductor 852Ba in the seventeenth configuration example illustrated in FIG. 75B has a horizontally long rectangular shape. Furthermore, the gap region of the reticulated conductor 822Bb in FIG. 65B has the vertically long rectangular shape, whereas the gap region of the reticulated conductor 852Bb in FIG. 75B has a horizontally long rectangular shape.

The reticulated conductor 852Bb of the lead-out conductor portion 165B in FIG. 75B is common to the reticulated conductor 822Bb in the fourteenth configuration example in FIG. 65B in that the current more easily flows in the X direction (first direction) toward the main conductor portion 165B than in the Y direction (second direction) orthogonal to the X direction.

Meanwhile, the reticulated conductor 852Ba of the main conductor portion 65B in FIG. 75B has a shape in which the current more easily flows in the X direction than in the Y direction, whereas the reticulated conductor 822Ba of the main conductor portion 165Ba in the fourteenth configuration example in FIG. 65B has the shape in which the current more easily flows in the Y direction.

That is, the conductor layer B in the seventeenth configuration example illustrated in FIG. 75B is different from the conductor layer B of the fourteenth configuration example in FIG. 65B in the direction in which the current easily flows in the main conductor portion 165Ba.

Furthermore, the main conductor portion 165B of the conductor layer B in the seventeenth configuration example includes a reinforced conductor 854 reinforced such that the current more easily flows in the Y direction than in the X direction. A conductor width WXBc of the reinforced conductor 854 is desirably formed to be larger than one or both of the conductor width WXBa in the X direction and the conductor width WYBa in the Y direction of the reticulated conductor 852Ba. The conductor width WXBc of the reinforced conductor 854 is formed to be larger than the conductor width WXBa in the X direction or the conductor width WYBa in the Y direction of the reticulated conductor 852Ba, whichever is smaller. In the example in FIGS. 75A, 75B, and 75C, the position in the X direction at which the reinforced conductor 854 is formed is a position closest to the lead-out conductor portion 165B in the region of the main conductor portion 165Ba. However, it is sufficient that the position is a position near the joint portion.

As illustrated in FIG. 75C, the reinforced conductor 853 of the conductor layer A and the reinforced conductor 854 of the conductor layer B are formed at overlapping positions. In the state where the conductor layer A and the conductor layer B are stacked, the active element group 167 is covered with at least one of the conductor layer A or the conductor layer B. Therefore, the hot carrier light emission from the active element group 167 can be shielded even in the seventeenth configuration example. Note that, for example, in a case where light-shielding is not necessary near the reinforced conductor 853 or the reinforced conductor 854, the reinforced conductor 853 and the reinforced conductor 854 may not be formed at overlapping positions. Furthermore, for example, at least one of the reinforced conductor 853 or the reinforced conductor 854 may not be provided depending on the current distribution of the main conductor portion 165*a*.

Since the reticulated conductor 852Ba of the main conductor portion 165Ba can be formed in the shape that allows the current to easily flow in the X direction, the layout can be created with a minimum number of repetitions of the basic pattern, which increases the degree of freedom in designing the wiring layout. Furthermore, the voltage drop can be further improved depending on arrangement of the active elements such as MOS transistors and diodes.

Then, by providing the reinforced conductor 854 reinforced such that the current easily flows in the Y direction, the current can be easily diffused in the second direction in the main conductor portion 165Ba, so that the current concentration around the joint portion between the main conductor portion 165Ba and the lead-out conductor portion 165Bb can be alleviated. In a case where the current is locally concentrated, the inductive noise deteriorates due to the concentrated portion. However, since the current concentration can be reduced, the inductive noise can be further improved.

Moreover, the conductor layer B in the seventeenth configuration example illustrated in FIG. 75B is different from the conductor layer B of the fourteenth configuration example in FIG. 65B in that a relay conductor 855 is arranged in at least some gap regions of the reticulated conductor 852Ba of the main conductor portion 165Ba. The relay conductor 855 may be or may not be arranged.

First Modification of Seventeenth Configuration Example

Figure 76A:
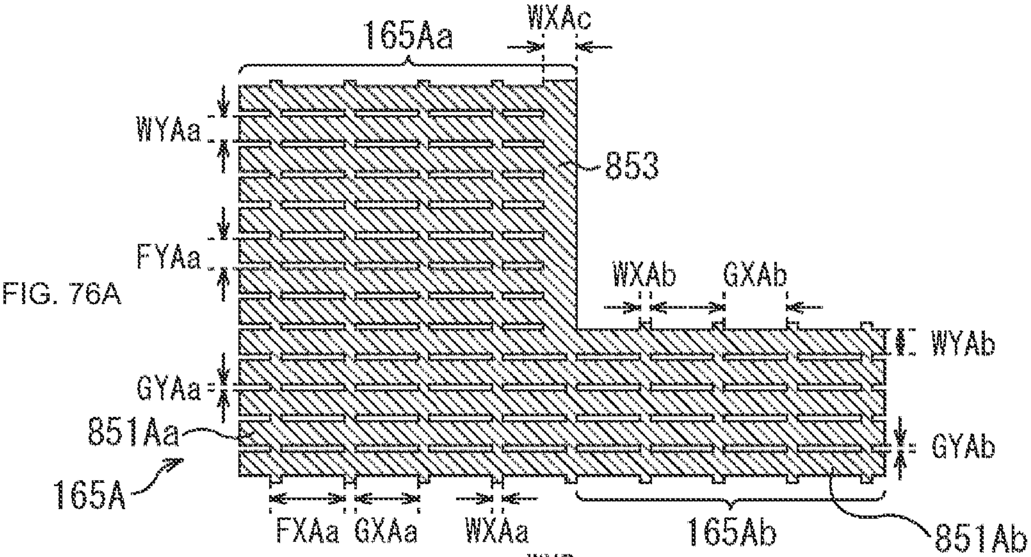
FIGS. 76A, 76B, and 76C are diagrams illustrating a first modification of the seventeenth configuration example of the conductor layers A and B.
Figure 76B:
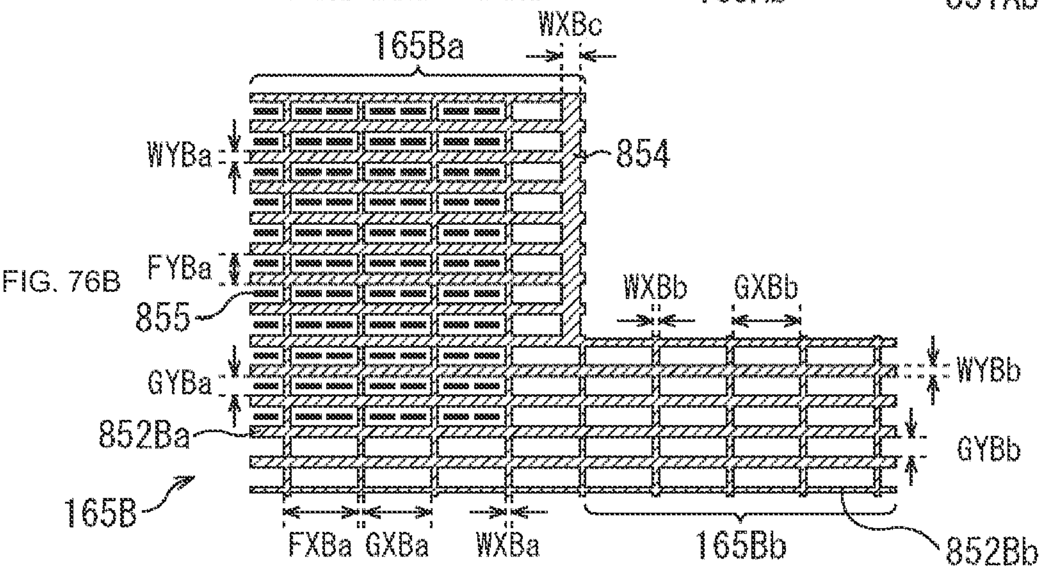
Figure 76C:
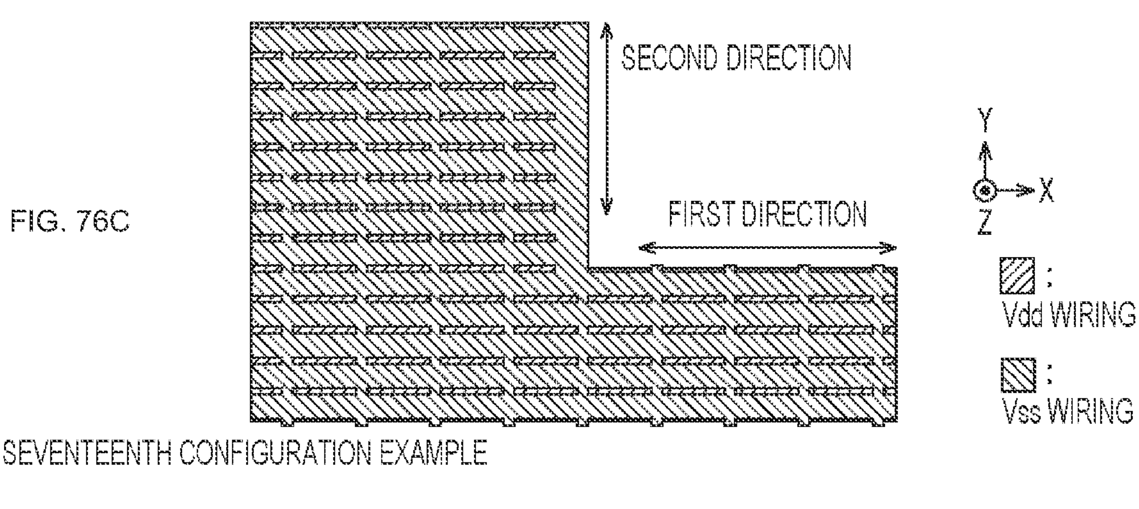

FIGS. 76A, 76B, and 76C illustrate a first modification of the seventeenth configuration example.

The first modification of the seventeenth configuration example is different from the conductor layer A of the seventeenth configuration example illustrated in FIG. 75A in that the reinforced conductor 853 of the conductor layer A illustrated in FIG. 76A is not formed over the entire length in the Y direction of the main conductor portion 165Aa but formed in a part in the Y direction. More specifically, in the first modification in FIGS. 76A, 76B, and 76C, the reinforced conductor 853 of the conductor layer A is formed at a position in the Y direction excluding the position of the joint portion in the Y direction. Other configurations of the conductor layer A in the first modification are similar to those of the conductor layer A in the seventeenth configuration example illustrated in FIG. 75.

Similarly, the conductor layer B of the first modification of the seventeenth configuration example is different from the conductor layer B of the seventeenth configuration example illustrated in FIG. 75B in that the reinforced conductor 854 of the conductor layer B illustrated in FIG. 76B is not formed over the entire length in the Y direction of the main conductor portion 165B but formed in a part in the Y direction. More specifically, in the first modification in FIGS. 76A, 76B, and 76C, the reinforced conductor 854 of the conductor layer B is formed at a position in the Y direction excluding the position of the joint portion in the Y direction. Other configurations of the conductor layer B in the first modification are similar to those of the conductor layer B in the seventeenth configuration example illustrated in FIG. 75A.

Second Modification of Seventeenth Configuration Example

Figure 77A:
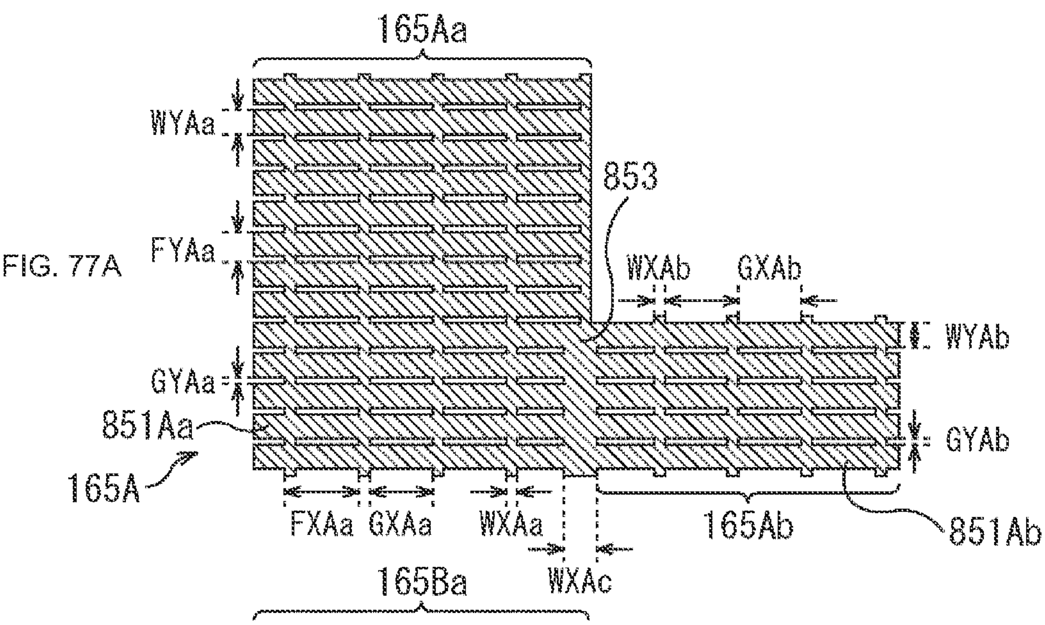
FIGS. 77A, 77B, and 77C are diagrams illustrating a second modification of the seventeenth configuration example of the conductor layers A and B.
Figure 77B:
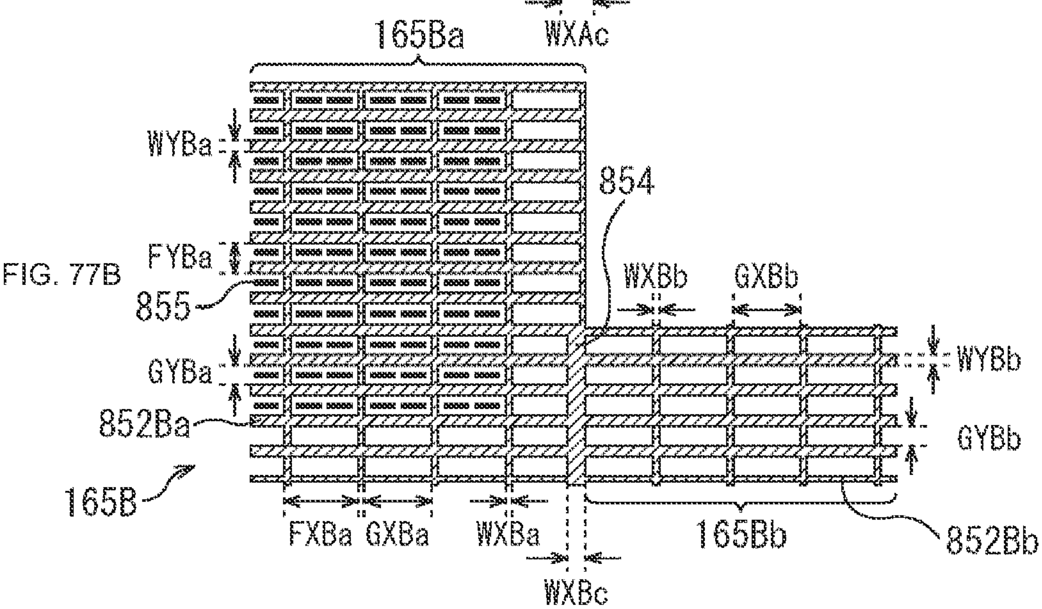
Figure 77C:
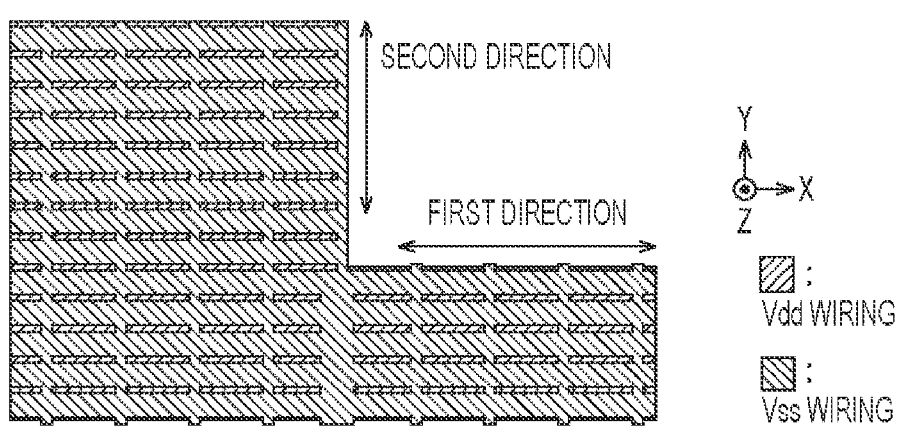

FIGS. 77A, 77B, and 77C illustrate a second modification of the seventeenth configuration example.

The second modification of the seventeenth configuration example is different from the conductor layer A of the seventeenth configuration example illustrated in FIG. 75A in that the reinforced conductor 853 of the conductor layer A illustrated in FIG. 77A is not formed over the entire length in the Y direction of the main conductor portion 165Aa but formed in a part in the Y direction. More specifically, in the second modification in FIGS. 77A, 77B, and 77C, the reinforced conductor 853 of the conductor layer A is formed only at the position in the Y direction of the joint portion. Other configurations of the conductor layer A in the second modification are similar to those of the conductor layer A in the seventeenth configuration example illustrated in FIG. 75A.

Similarly, the conductor layer B of the first modification of the seventeenth configuration example is different from the conductor layer B of the seventeenth configuration example illustrated in FIG. 75B in that the reinforced conductor 854 of the conductor layer B illustrated in FIG. 77B is not formed over the entire length in the Y direction of the main conductor portion 165B but formed in a part in the Y direction. More specifically, in the second modification in FIGS. 77A, 77B, and 77C, the reinforced conductor 854 of the conductor layer B is formed only at the position in the Y direction of the joint portion. Other configurations of the conductor layer B in the second modification are similar to those of the conductor layer B in the seventeenth configuration example illustrated in FIG. 75.

As in the first modification and the second modification of the seventeenth configuration example, the reinforced conductor 853 of the conductor layer A and the reinforced conductor 854 of the conductor layer B are not necessarily formed over the entire length in the Y direction of the main conductor portion 165Aa, and may be formed in a region in the Y direction of a predetermined part.

Eighteenth Configuration Example

Figure 78A:
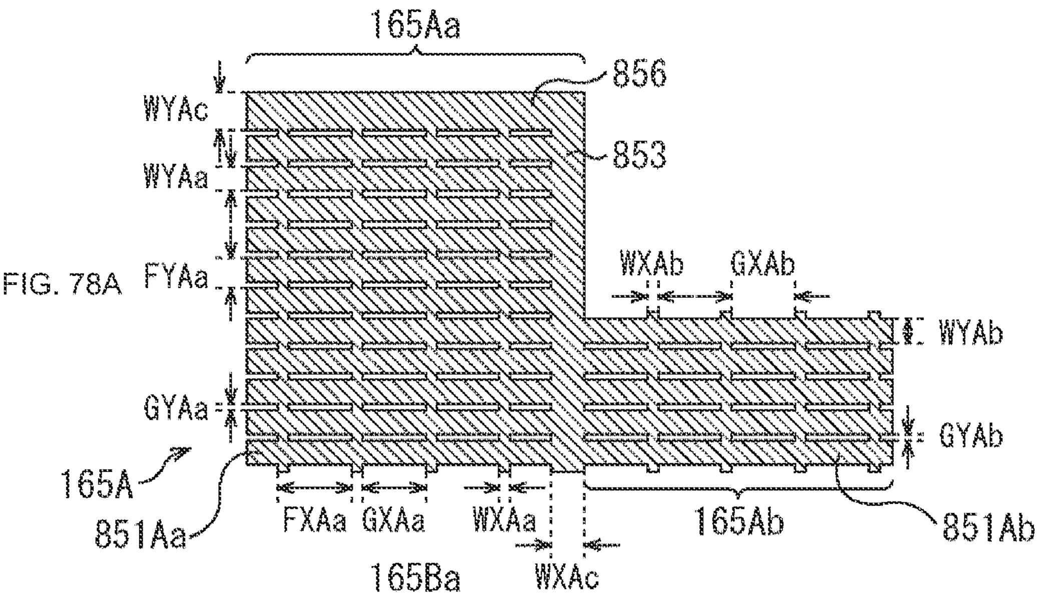
FIGS. 78A, 78B, and 78C are diagrams illustrating an eighteenth configuration example of the conductor layers A and B.
Figure 78B:
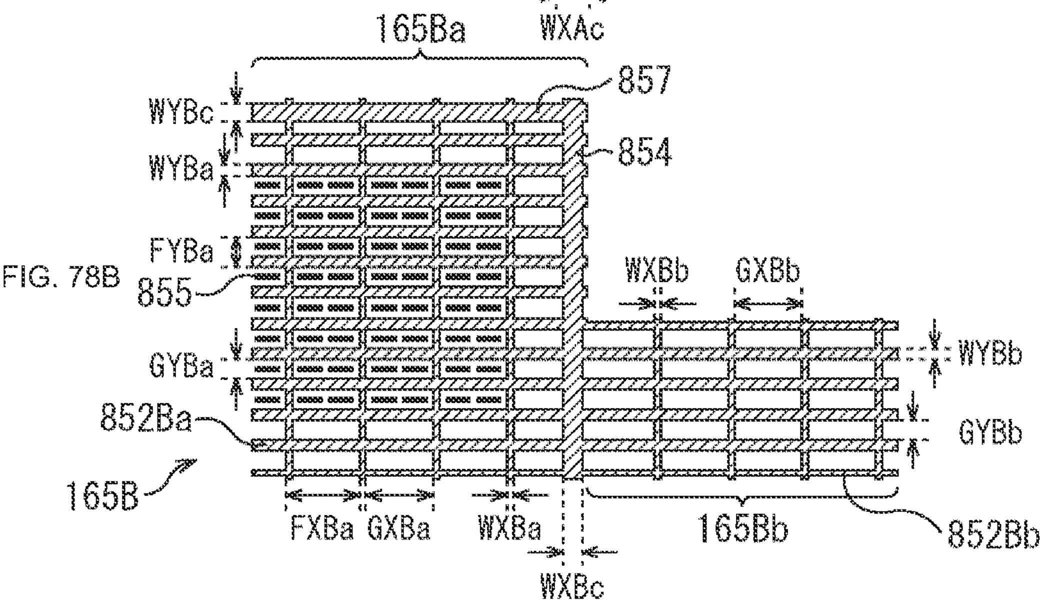
Figure 78C:
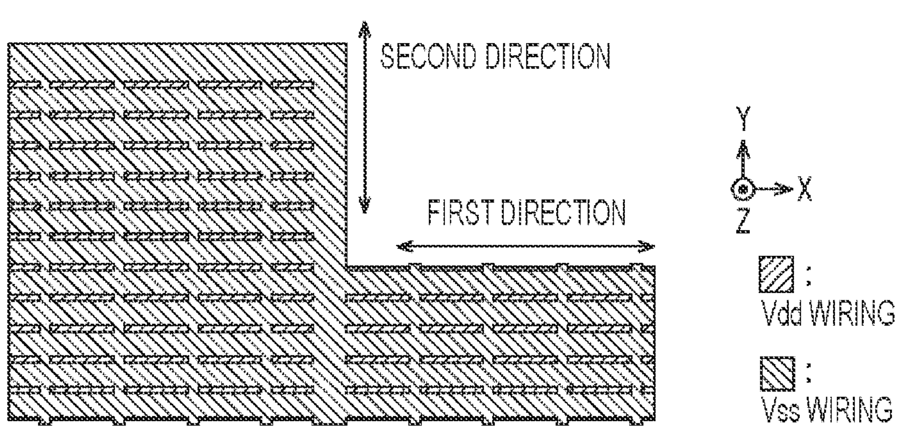

FIGS. 78A, 78B, and 78C illustrate an eighteenth configuration example of the conductor layers A and B. Note that FIG. 78A illustrates the conductor layer A, and FIG. 78B illustrates the conductor layer B. FIG. 78C illustrates a state of the conductor layers A and B respectively illustrated in FIGS. 78A and 78B, which are viewed from the conductor layer A side. In the coordinate system in FIGS. 78A, 78B, and 78C, the horizontal direction is the X axis, the vertical direction is the Y axis, and the direction perpendicular to the XY plane is the Z axis.

The eighteenth configuration example illustrated in FIGS. 78A, 78B, and 78C has a configuration in which a part of the seventeenth configuration example illustrated in FIGS. 75A, 75B, and 75C changed. Note that, in FIGS. 78A, 78B, and 78C, a portion corresponding to FIGS. 75A, 75B, and 75C are given the same reference numeral and description thereof is omitted as appropriate.

The conductor layer A of the eighteenth configuration example illustrated in FIG. 78A is common to the seventeenth configuration example illustrated in FIGS. 75A, 75B, and 75C in including the reticulated conductor 851Aa having the shape in which the current easily flows in the X direction and the reinforced conductor 853 reinforced such that the current easily flows in the Y direction.

Meanwhile, the conductor layer A in the eighteenth configuration example is different from that in the seventeenth configuration example illustrated in FIGS. 75A 75B, and 75C in further including a reinforced conductor 856 reinforced such that the current more easily flows in the X direction than in the Y direction. A conductor width WYAc of the reinforced conductor 856 is desirably formed to be larger than one or both of the conductor width WXAa in the X direction and the conductor width WYAa in the Y direction of the reticulated conductor 851Aa. The conductor width WYAc of the reinforced conductor 856 is formed to be larger than the conductor width WXAa in the X direction or the conductor width WYAa in the Y direction of the reticulated conductor 851Aa, whichever is smaller. A plurality of the reinforced conductors 856 may be arranged in a region of the main conductor portion 165Aa at predetermined intervals in the Y direction or one reinforced conductor 856 may be arranged at a predetermined position in the Y direction.

By providing the reinforced conductor 856 reinforced such that the current can easily flow in the X direction, the current can easily flow not only in the Y direction by the reinforced conductor 853 but also in the X direction, and the current concentration around the joint portion between the main conductor portion 165Aa and the lead-out conductor portion 165Ab can be alleviated. In a case where the current is locally concentrated, the inductive noise deteriorates due to the concentrated portion. However, since the current concentration can be reduced, the inductive noise can be further improved.

The conductor layer B of the eighteenth configuration example illustrated in FIG. 78B is common to the seventeenth configuration example illustrated in FIGS. 75A, 75B, and 75C in including the reticulated conductor 852Ba having the shape in which the current easily flows in the X direction and the reinforced conductor 854 reinforced such that the current easily flows in the Y direction.

Meanwhile, the conductor layer B in the eighteenth configuration example is different from that in the seventeenth configuration example illustrated in FIGS. 75A 75B, and 75C in further including a reinforced conductor 857 reinforced such that the current more easily flows in the X direction than in the Y direction. A conductor width WYBc of the reinforced conductor 857 is desirably formed to be larger than one or both of the conductor width WXBa in the X direction and the conductor width WYBa in the Y direction of the reticulated conductor 852Ba. The conductor width WYBc of the reinforced conductor 857 is formed to be larger than the conductor width WXBa in the X direction or the conductor width WYBa in the Y direction of the reticulated conductor 852Ba, whichever is smaller. A plurality of the reinforced conductors 857 may be arranged in a region of the main conductor portion 165B at predetermined intervals in the Y direction or one reinforced conductor 857 may be arranged at a predetermined position in the Y direction.

As illustrated in FIG. 78C, the reinforced conductor 856 of the conductor layer A and the reinforced conductor 857 of the conductor layer B are formed at overlapping positions. In the state where the conductor layer A and the conductor layer B are stacked, the active element group 167 is covered with at least one of the conductor layer A or the conductor layer B. Therefore, the hot carrier light emission from the active element group 167 can be shielded even in the eighteenth configuration example. Note that, for example, in a case where light-shielding is not necessary near the reinforced conductor 856 or the reinforced conductor 857, the reinforced conductor and the reinforced conductor 857 may not be formed at overlapping positions. Furthermore, for example, at least one of the reinforced conductor 856 or the reinforced conductor 857 may not be provided depending on the current distribution of the main conductor portion 165*a*.

By providing a reinforced conductor 857 reinforced such that the current can easily flow in the X direction, the current can easily flow not only in the Y direction by the reinforced conductor 854 but also in the X direction, and the current concentration around the joint portion between the main conductor portion 165Ba and the lead-out conductor portion 165Bb can be alleviated. In a case where the current is locally concentrated, the inductive noise deteriorates due to the concentrated portion. However, since the current concentration can be reduced, the inductive noise can be further improved.

In the seventeenth configuration example in FIGS. 75A, 75B, and 75C, the configuration including the reinforced conductors 853 and 854 reinforced such that the current easily flows in the Y direction has been described. In the eighteenth configuration example in FIGS. 78A, 78B, and 78C, the configuration including the reinforced conductors 856 and 857 reinforced such that the current easily flows in the X direction in addition to the reinforced conductors 853 and 854 has been described.

Although not illustrated, as a modification of the seventeenth configuration example or the eighteenth configuration example, a configuration in which the conductor layer A does not include the reinforced conductor 853 and includes the reinforced conductor 856, and the conductor layer B does not include the reinforced conductor 854 and includes the reinforced conductor 857 may be adopted. In other words, a configuration provided with only the reinforced conductors 856 and 857 as the reinforced conductors may be adopted.

By providing the reinforced conductor 856 reinforced such that the current easily flows in the X direction, the current can be easily diffused in the Y direction depending on the relationship of the wiring resistance even in the case of not including the reinforced conductor 853, and the current concentration near the joint portion between the main conductor portion 165Aa and the lead-out conductor portion 165Ab can be alleviated. In a case where the current is locally concentrated, the inductive noise deteriorates due to the concentrated portion. However, since the current concentration can be reduced, the inductive noise can be further improved.

By providing the reinforced conductor 857 reinforced such that the current easily flows in the X direction, the current can be easily diffused in the Y direction depending on the relationship of the wiring resistance even in the case of not including the reinforced conductor 854, and the current concentration near the joint portion between the main conductor portion 165Ba and the lead-out conductor portion 165Bb can be alleviated. In a case where the current is locally concentrated, the inductive noise deteriorates due to the concentrated portion. However, since the current concentration can be reduced, the inductive noise can be further improved.

Nineteenth Configuration Example

FIG. 79 illustrates a nineteenth configuration example of the conductor layers A and B. Note that A in FIG. 79 illustrates the conductor layer A, and B in FIG. 79 illustrates the conductor layer B. C in FIG. 79 illustrates a state of the conductor layers A and B respectively illustrated in A and B in FIG. 79, which are viewed from the conductor layer A side. In the coordinate system in FIG. 79, the horizontal direction is the X axis, the vertical direction is the Y axis, and the direction perpendicular to the XY plane is the Z axis.

Nineteenth Configuration Example

Figure 79A:
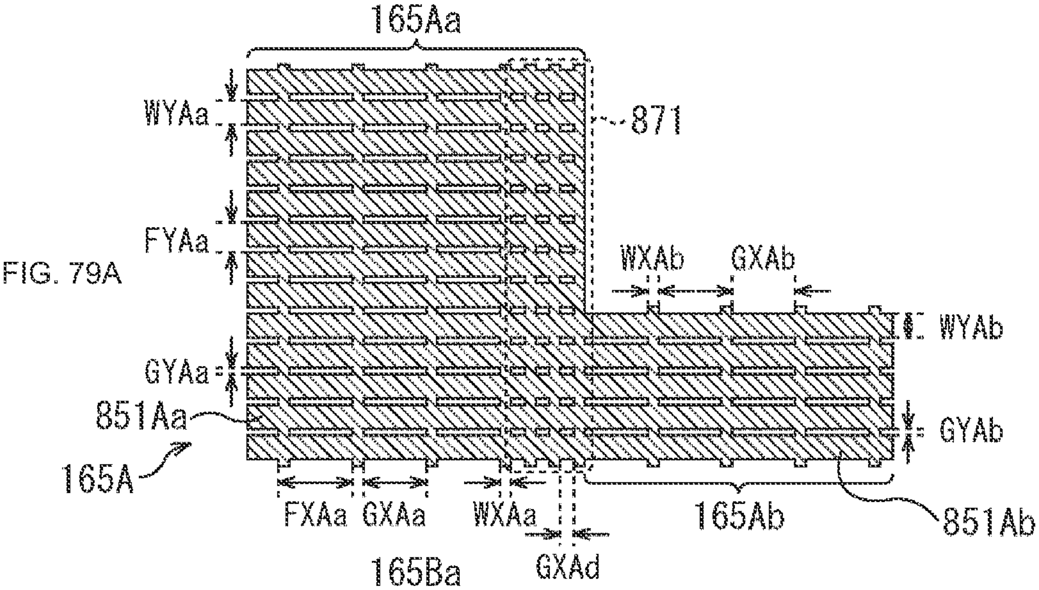
FIGS. 79A, 79B, and 79C are diagrams illustrating a nineteenth configuration example of the conductor layers A and B.
Figure 79B:
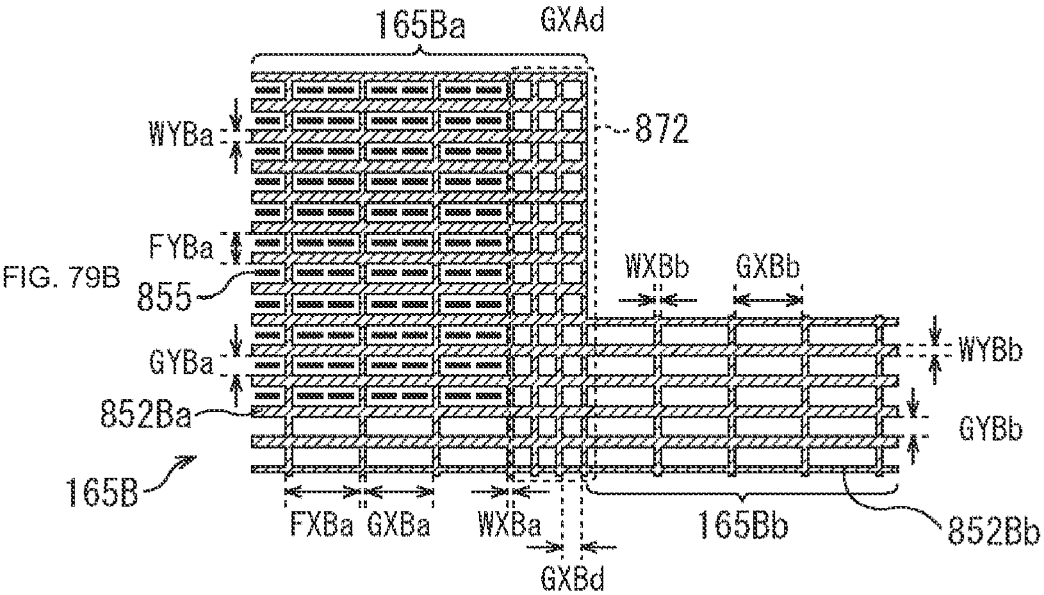
Figure 79C:
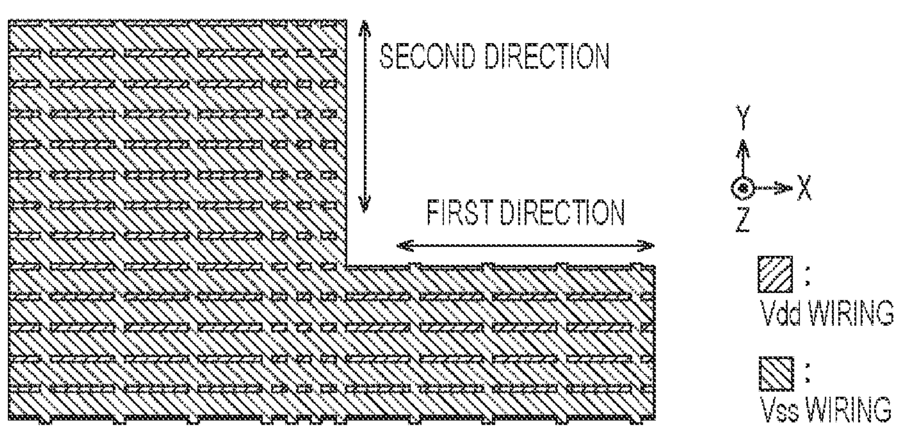

FIGS. 79A, 79B, and 79C illustrate a nineteenth configuration example of the conductor layers A and B. Note that FIG. 79A illustrates the conductor layer A, and FIG. 79B illustrates the conductor layer B. FIG. 79C illustrates a state of the conductor layers A and B respectively illustrated in FIGS. 79A and 79B, which are viewed from the conductor layer A side. In the coordinate system in FIGS. 79A, 79B, and 79C, the horizontal direction is the X axis, the vertical direction is the Y axis, and the direction perpendicular to the XY plane is the Z axis.

The nineteenth configuration example illustrated in FIGS. 79A, 79B, and 79C has a configuration in which a part of the seventeenth configuration example illustrated in FIGS. 75A, 75B, and 75C changed. Note that, in FIGS. 79A, 79B, and 79C, a portion corresponding to FIGS. 75A, 75B, and 75C are given the same reference numeral and description thereof is omitted as appropriate.

The conductor layer A in the nineteenth configuration example illustrated in FIG. 79A is different in that the reinforced conductor 853 of the seventeenth configuration example illustrated in FIGS. 75A, 75B, and 75C are replaced with a reinforced conductor 871 and is common in the other points. The reinforced conductor includes a plurality of wirings extending in the Y direction. The wirings constituting the reinforced conductor 871 are evenly spaced in the X direction with a gap width GXAd. The gap width GXAd is smaller than the gap width GXAa of the reticulated conductor 851Aa of the main conductor portion 165Aa.

The conductor layer B in the nineteenth configuration example illustrated in FIG. 79B is different in that the reinforced conductor 854 of the seventeenth configuration example illustrated in FIGS. 75A, 75B, and 75C are replaced with a reinforced conductor 872 and is common in the other points. The reinforced conductor includes a plurality of wirings extending in the Y direction. The wirings constituting the reinforced conductor 872 are evenly spaced in the X direction with a gap width GXBd. The gap width GXBd is smaller than the gap width GXBa of the reticulated conductor 852Ba of the main conductor portion 165Ba.

As illustrated in FIG. 79C, the reinforced conductor 871 of the conductor layer A and the reinforced conductor 872 of the conductor layer B are formed at overlapping positions. In the state where the conductor layer A and the conductor layer B are stacked, the active element group 167 is covered with at least one of the conductor layer A or the conductor layer B. Therefore, the hot carrier light emission from the active element group 167 can be shielded even in the nineteenth configuration example. Note that, for example, in a case where light-shielding is not necessary near the reinforced conductor 871 or the reinforced conductor 872, the reinforced conductor and the reinforced conductor 872 may not be formed at overlapping positions. Furthermore, for example, at least one of the reinforced conductor 871 or the reinforced conductor 872 may not be provided depending on the current distribution of the main conductor portion 165*a*.

Modifications of Nineteenth Configuration Example

Figure 80A:
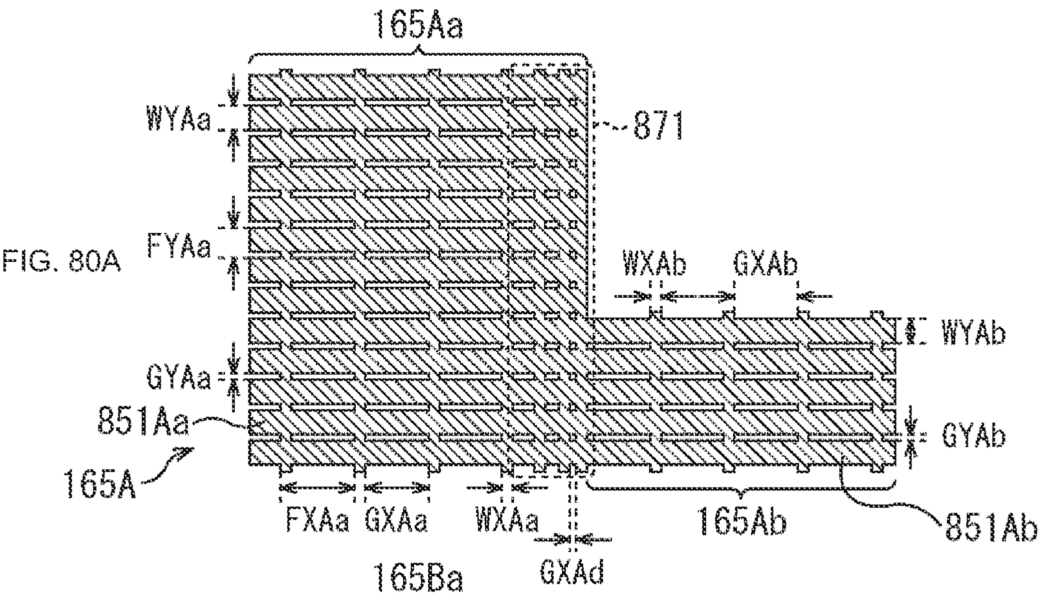
FIGS. 80A, 80B, and 80C are diagrams illustrating a modification of the nineteenth configuration example of the conductor layers A and B.
Figure 80B:
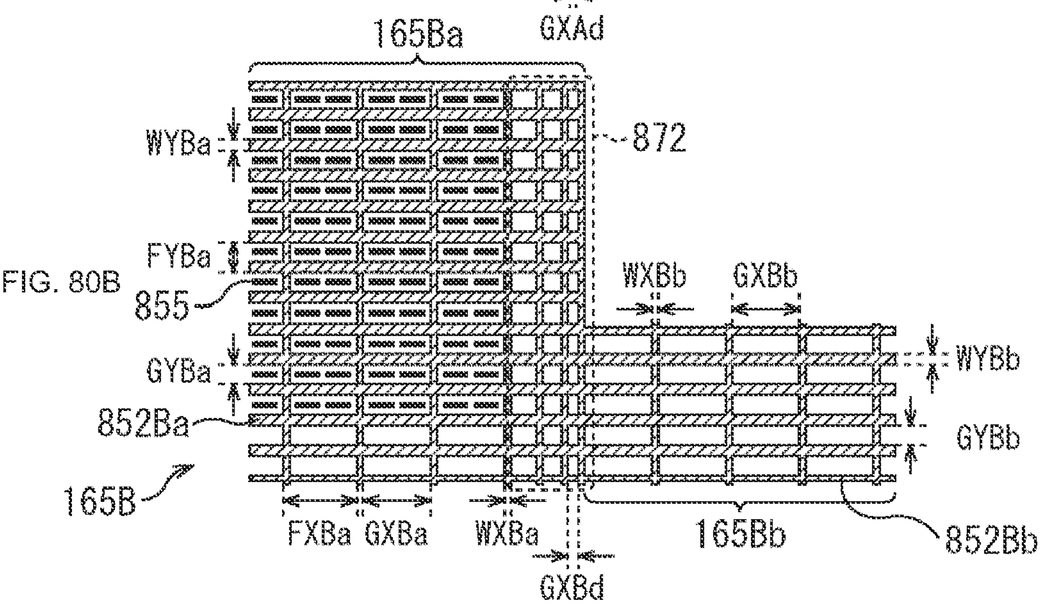
Figure 80C:
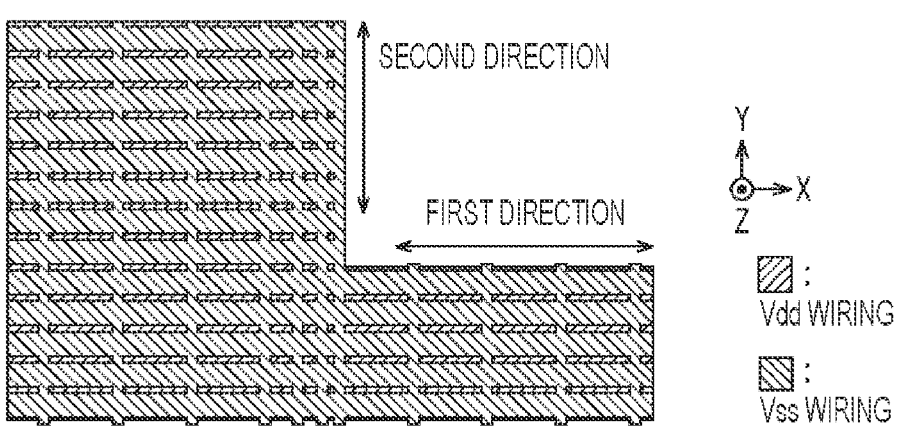

FIGS. 80A, 80B, and 80C illustrate a modification of the nineteenth configuration example.

In the nineteenth configuration example illustrated in FIGS. 79A, 79B, and 79C, the plurality of wirings constituting the reinforced conductor 871 of the conductor layer A has been evenly spaced in the X direction with the gap width GXAd. A plurality of wirings constituting the reinforced conductor 872 of the conductor layer B has been evenly spaced in the X direction with the gap width GXAd.

In contrast, in FIGS. 80A, 80B, and 80C as the modification of the nineteenth configuration example, each gap width GXAd of adjacent wirings is different among the plurality of wirings constituting the reinforced conductor 871 of the conductor layer A. At least one of the gap widths GXAd is smaller than the gap width GXAa of the reticulated conductor 851Aa of the main conductor portion 165Aa. In the plurality of wirings constituting the reinforced conductor 872 of the conductor layer B, the gap widths GXBd of adjacent wirings are different. At least one of the gap widths GXBd is smaller than the gap width GXBa of the reticulated conductor 852Ba of the main conductor portion 165Ba.

Note that, in the example in FIGS. 80A, 80B, and 80C, the plurality of gap widths GXAd and gap widths GXBd is formed to be gradually shortened from the left side. However, the configuration is not limited thereto, and the plurality of gap widths may be formed to be gradually shortened from the right side or may be random widths.

As described above, the modification of the nineteenth configuration example in FIGS. 80A, 80B, and 80C are similar to the nineteenth configuration example illustrated in FIGS. 79A, 79B, and 79C except that the gap widths GXAd and GXBd are not uniform and are modulated.

The reinforced conductor 871 of the conductor layer A and the reinforced conductor 872 of the conductor layer B can be configured using a plurality of wirings arranged with the predetermined gap width GXAd or GXBd, as in the nineteenth configuration example and the modification illustrated in FIGS. 79A, 79B, 79C, 80A, 80B, and 80C.

By providing the reinforced conductors 871 and 872 reinforced such that the current can easily flow in the Y direction, the current can be easily diffused in the Y direction, so that the current concentration around the joint portion can be alleviated. In a case where the current is locally concentrated, the inductive noise deteriorates due to the concentrated portion. However, since the current concentration can be reduced, the inductive noise can be further improved. In the nineteenth configuration example and its modification illustrated in FIGS. 79A, 79B, 79C, 80A, 80B, and 80C, the configuration including at least the gap width smaller than the gap width GXAa or the gap width GXBa in the X direction, and including the reinforced conductors 871 and 872 reinforced such that the current easily flows in the Y direction has been described. However, the configuration is not limited thereto. For example, although not illustrated, a configuration including at least a gap width smaller than the gap width GYAa or the gap width GYBa in the Y direction and including a reinforced conductor reinforced such that the current easily flows in the X direction similarly to the eighteenth configuration example in FIGS. 78A, 78B, and 78C may be adopted. Furthermore, any of the configuration including the reinforced conductor reinforced such that the current easily flows in the X direction, the configuration including the reinforced conductor reinforced such that the current easily flows in the Y direction, or a configuration including both the reinforced conductor reinforced such that the current easily flows in the X direction and the reinforced conductor reinforced such that the current easily flows in the Y direction may be adopted. Even in these cases, the current concentration can be alleviated depending on the relationship of the wiring resistance, so that the inductive noise can be further improved.

Twentieth Configuration Example

Figure 81A:
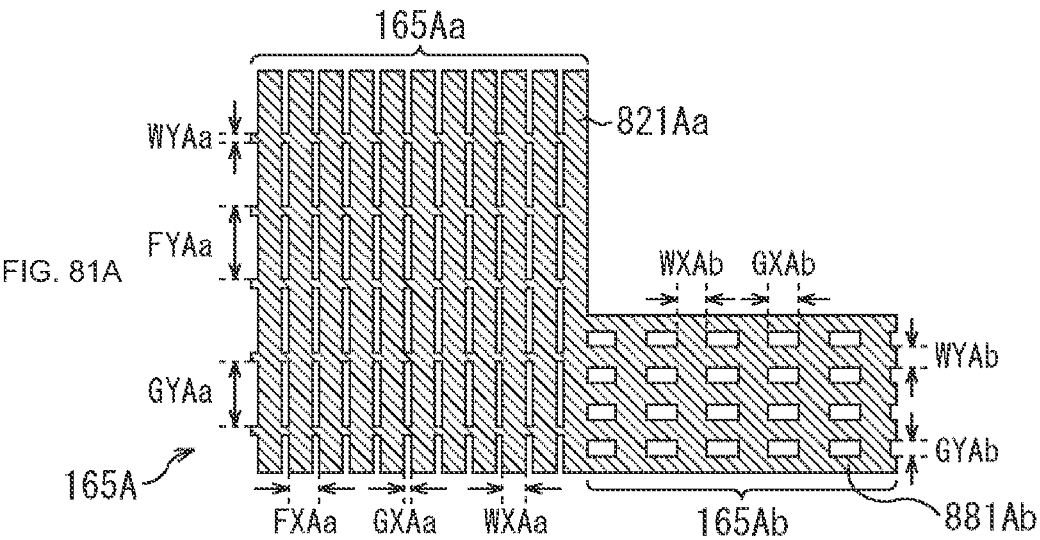
FIGS. 81A, 81B, and 81C are diagrams illustrating a twentieth configuration example of the conductor layers A and B.
Figure 81B:
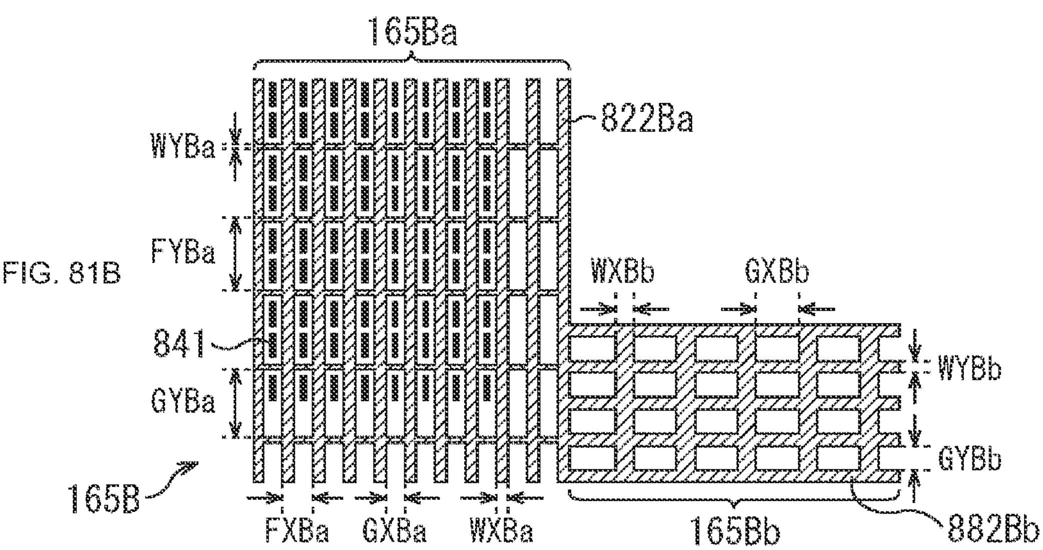
Figure 81C:
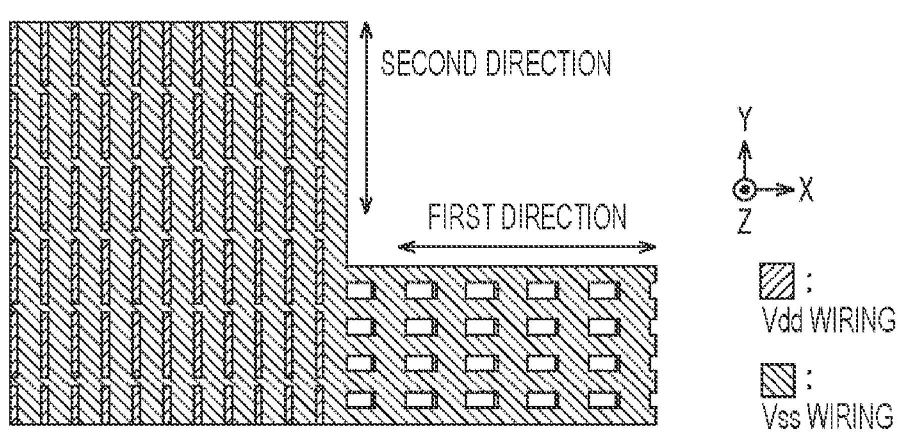

FIGS. 81A, 81B, and 81C illustrate a twentieth configuration example of the conductor layers A and B. Note that FIG. 81A illustrates the conductor layer A, and FIG. 81B illustrates the conductor layer B. FIG. 81C illustrates a state of the conductor layers A and B respectively illustrated in FIGS. 81A and 81B, which are viewed from the conductor layer A side. In the coordinate system in FIGS. 81A, 81B, and 81C, the horizontal direction is the X axis, the vertical direction is the Y axis, and the direction perpendicular to the XY plane is the Z axis.

The twentieth configuration example illustrated in FIGS. 81A, 81B, and 81C has a configuration in which a part of the sixteenth configuration example illustrated in FIGS. 72A, 72B, and 72C are changed. Note that, in FIGS. 81A, 81B, and 81C, a portion corresponding to FIGS. 72A, 72B, and 72C given the same reference numeral and description thereof is omitted as appropriate.

The conductor layer A of the twentieth configuration example illustrated in FIG. 81A is common to the conductor layer A of the sixteenth configuration example illustrated in FIGS. 72A, 72B, and 72C in that the main conductor portion 165Aa includes the reticulated conductor 821Aa. Meanwhile, the conductor layer A of the twentieth configuration example is different from the conductor layer A of the sixteenth configuration example illustrated in FIGS. 72A, 72B, and 72C in that the lead-out conductor portion 165Ab includes a reticulated conductor 881Ab different from the reticulated conductor 821Ab.

The conductor layer B of the twentieth configuration example illustrated in FIG. 81B is common to the conductor layer B of the sixteenth configuration example illustrated in FIGS. 72A, 72B, and 72C in that the main conductor portion 165B includes the reticulated conductor 822Ba and the relay conductor 841 arranged in the gap region. The conductor layer B of the twentieth configuration example is different from the conductor layer B of the sixteenth configuration example illustrated in FIGS. 72A, 72B, and 72C in that the lead-out conductor portion 165Bb includes a reticulated conductor 882Bb different from the reticulated conductor 822Bb.

That is, the twentieth configuration example is different in the shape of the repeating pattern of the lead-out conductor portion 165*b* from the sixteenth configuration example illustrated in FIGS. 72A, 72B, and 72C.

As illustrated in FIG. 81C, some regions of the lead-out conductor portion 165*b* are open regions in the state where the conductor layer A and the conductor layer B are stacked.

As described above, it is not necessary to adopt a light-shielding structure in the entire region of the conductor layer A and the conductor layer B, and a region where the active elements such as MOS transistors and diodes are not arranged may not be shielded.

The twentieth configuration example in FIGS. 81A, 81B, and 81C has the configuration in which some regions of the lead-out conductor portions 165*b* of the conductor layer A and the conductor layer B are not shielded. However, a configuration in which some regions of the main conductor portions 165*a* of the conductor layer A and the conductor layer B are not shielded may be adopted. By not adopting the light-shielding structure for the regions where shielding is not required, the degree of freedom in designing the wiring layout further increases, whereby a wiring pattern that further improves the inductive noise and further improves the voltage drop can be adopted.

Twenty-first Configuration Example

The above-described fourteenth to twentieth configuration examples are the examples in which the conductor layers of the lead-out conductor portion 165*b* connected to the main conductor portion 165*a* are the reticulated conductors.

However, the conductor layer of the lead-out conductor portion 165*b* is not limited to the reticulated conductor, and may be configured by a planar conductor or a linear conductor similarly to the main conductor portion 165*a*.

In the following twenty-first to twenty-fourth configuration examples, configuration examples in which the conductor layer of the lead-out conductor portion 165*b* is formed using a planar conductor or a linear conductor will be described.

Figure 82A:
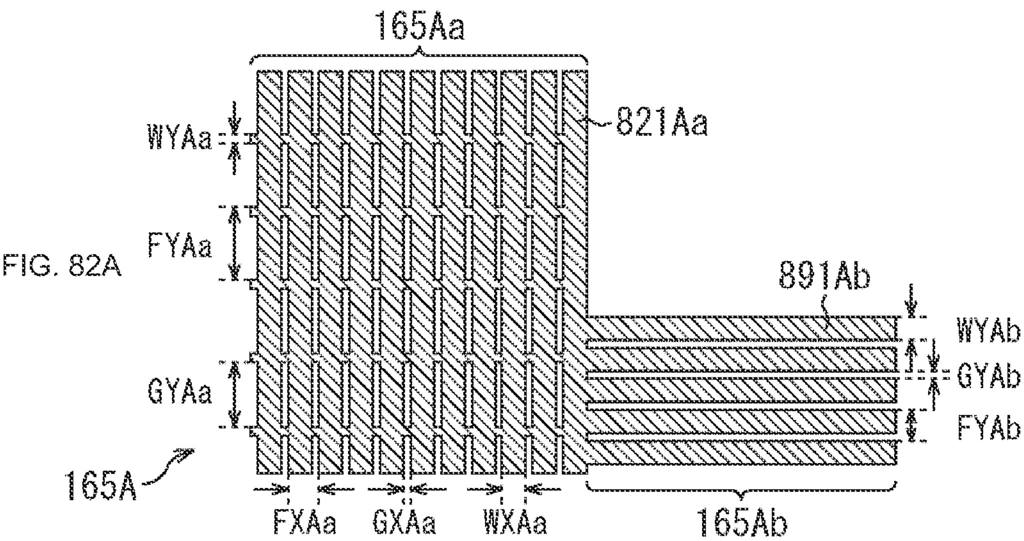
FIGS. 82A, 82B, and 82C are diagrams illustrating a twenty-first configuration example of the conductor layers A and B.
Figure 82B:
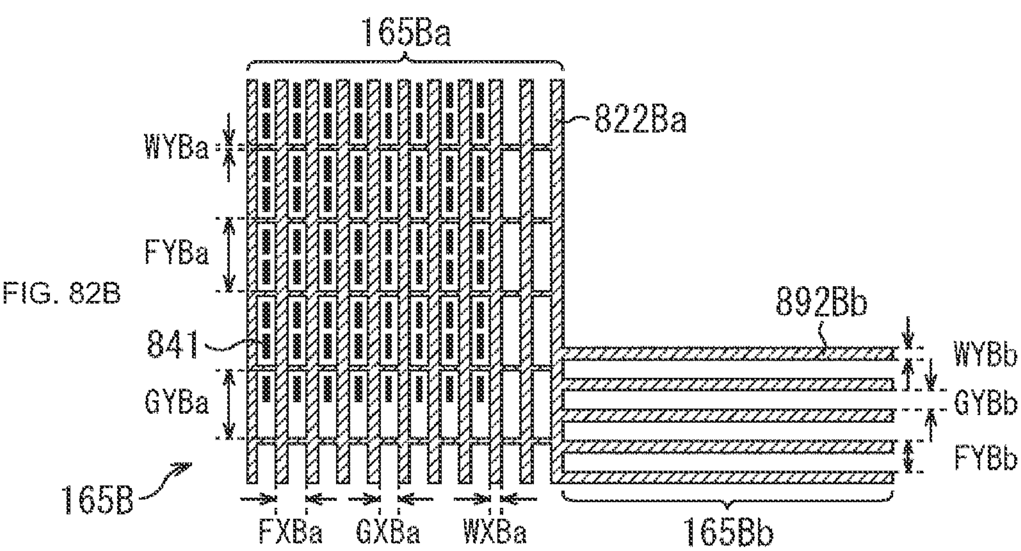
Figure 82C:
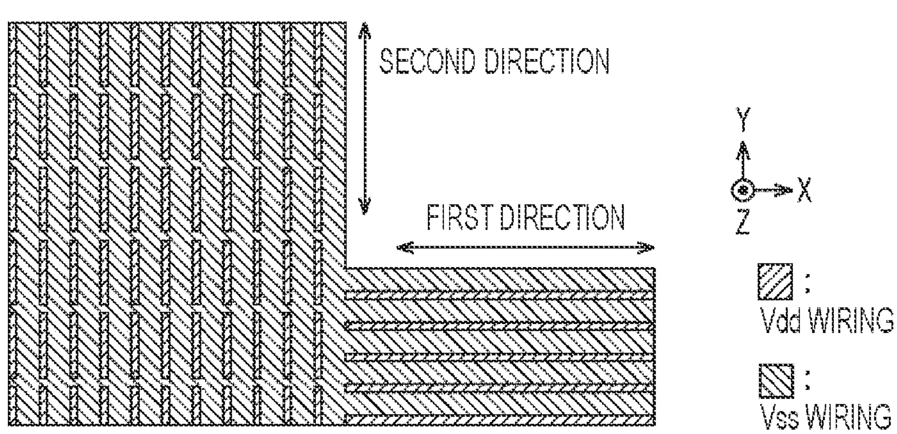

FIGS. 82A, 82B, and 82C illustrate a twenty-first configuration example of the conductor layers A and B. Note that FIG. 82A illustrates the conductor layer A, and FIG. 81 illustrates the conductor layer B. FIG. 82C illustrates a state of the conductor layers A and B respectively illustrated in FIGS. 82A and 82B, which are viewed from the conductor layer A side. In the coordinate system in FIGS. 82A, 82B, and 82C, the horizontal direction is the X axis, the vertical direction is the Y axis, and the direction perpendicular to the XY plane is the Z axis.

The twenty-first configuration example illustrated in FIGS. 82A, 82B, and 82C has a configuration in which the conductor layer of the lead-out conductor portion 165*b* of the sixteenth configuration example illustrated in FIGS. 72A, 72B, and 72C are changed. Note that, in FIGS. 82A, 82B, and 82C, a portion corresponding to FIGS. 72A, 72B, and 72C are given the same reference numeral and description thereof is omitted as appropriate.

A linear conductor 891Ab long in the X direction is periodically arranged in the Y direction with a conductor period FYAb instead of the reticulated conductor 821Ab of the sixteenth configuration example, in the lead-out conductor portion 165Ab of the conductor layer A of the twenty-first configuration example illustrated in FIG. 82A. The conductor period FYAb is equal to the sum of the conductor width WYAb in the Y direction and the gap width GYAb in the Y direction (the conductor period FYAb=the conductor width WYAb in the Y direction+the gap width GYAb in the Y direction).

A linear conductor 892Bb long in the X direction is periodically arranged in the Y direction with a conductor period FYBb instead of the reticulated conductor 822Bb of the sixteenth configuration example, in the lead-out conductor portion 165B of the conductor layer B of the twenty-first configuration example illustrated in FIG. 82B. The conductor period FYBb is equal to the sum of the conductor width WYBb in the Y direction and the gap width GYBb in the Y direction (the conductor period FYBb=the conductor width WYBb in the Y direction+the gap width GYBb in the Y direction).

As illustrated in FIG. 82C, in the state where the conductor layer A and the conductor layer B are stacked, the active element group 167 is covered with at least one of the conductor layer A or the conductor layer B. Therefore, the hot carrier light emission from the active element group 167 can be shielded even in the twenty-first configuration example.

Twenty-second Configuration Example

Figure 83A:
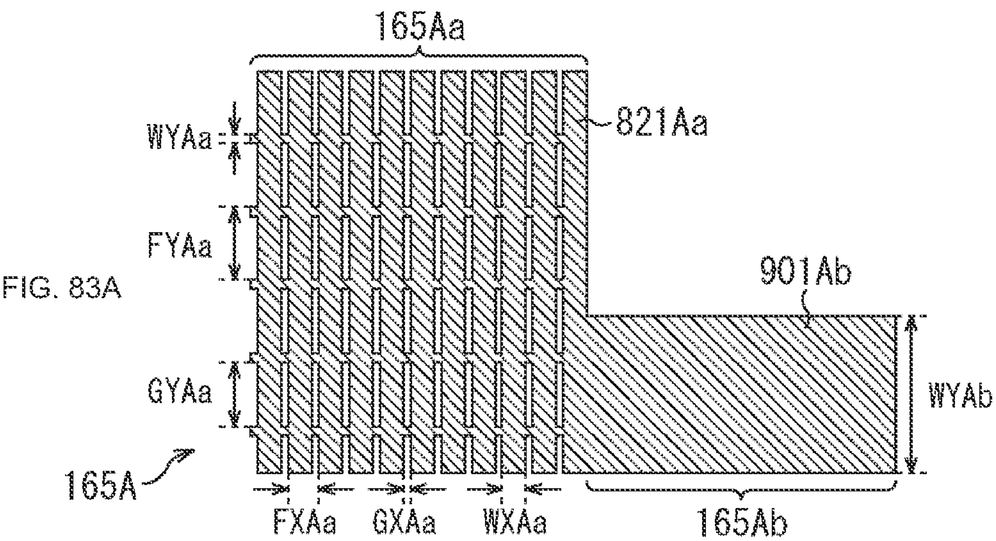
FIGS. 83A, 83B, and 83C are diagrams illustrating a twenty-second configuration example of the conductor layers A and B.
Figure 83B:
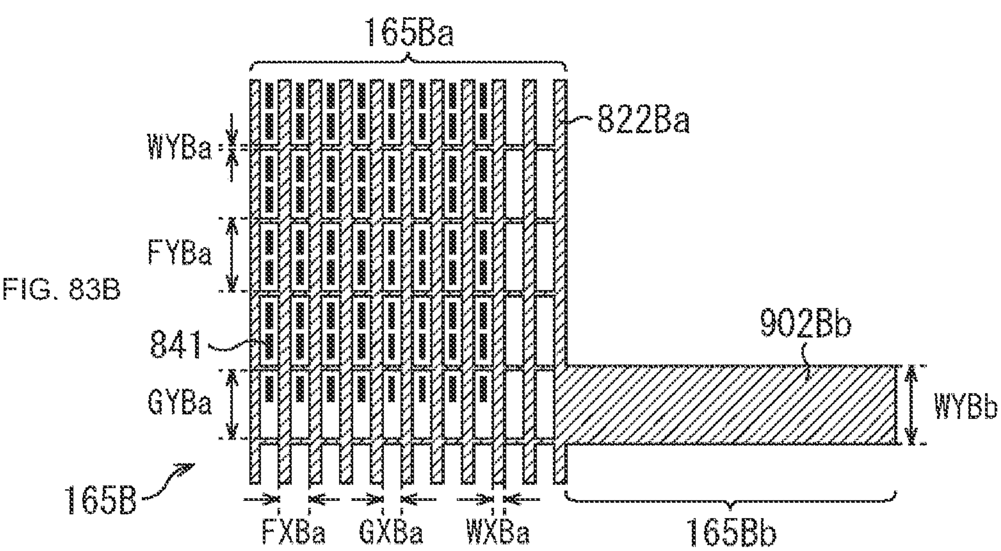
Figure 83C:
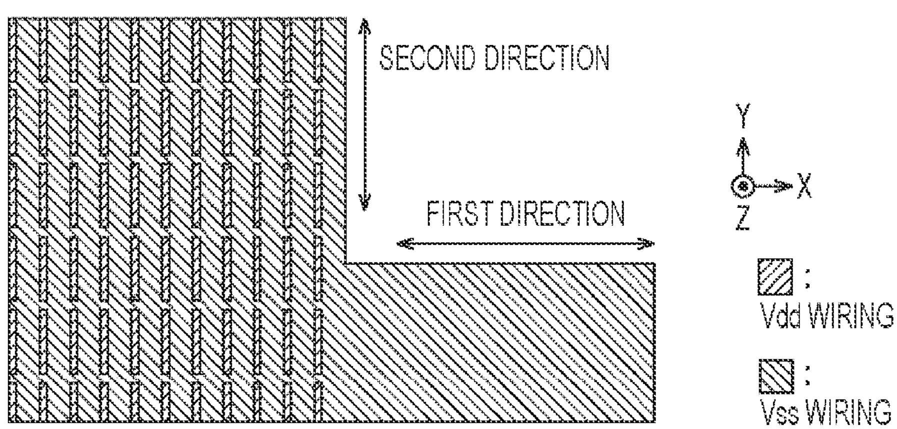

FIGS. 83A, 83B, and 83C illustrate a twenty-second configuration example of the conductor layers A and B. Note that FIG. 83A illustrates the conductor layer A, and FIG. 83B illustrates the conductor layer B. FIG. 83C illustrates a state of the conductor layers A and B respectively illustrated in FIGS. 83A and 83B, which are viewed from the conductor layer A side. In the coordinate system in FIGS. 83A, 83B, and 83C, the horizontal direction is the X axis, the vertical direction is the Y axis, and the direction perpendicular to the XY plane is the Z axis.

The twenty-second configuration example illustrated in FIGS. 83A, 83B, and 83C has a configuration in which the conductor layer of the lead-out conductor portion 165*b* of the sixteenth configuration example illustrated in FIGS. 72A, 72B, and are changed. Note that, in FIGS. 83A, 83B, and 83C, a portion corresponding to FIGS. 72A, 72B, and 72C given the same reference numeral and description thereof is omitted as appropriate.

A planar conductor 901Ab is arranged instead of the reticulated conductor Ab of the sixteenth configuration example, in the lead-out conductor portion 165Ab of the conductor layer A of the twenty-second configuration example illustrated in FIG. 83A. The planar conductor 901Ab has the conductor width WYAb in the Y direction.

A planar conductor 902Bb is arranged instead of the reticulated conductor 822Bb of the sixteenth configuration example, in the lead-out conductor portion 165B of the conductor layer B of the twenty-second configuration example illustrated in FIG. 83B. The planar conductor 902Bb has the conductor width WYBb in the Y direction.

As illustrated in FIG. 83C, in the state where the conductor layer A and the conductor layer B are stacked, the active element group 167 is covered with at least one of the conductor layer A or the conductor layer B. Therefore, the hot carrier light emission from the active element group 167 can be shielded even in the twenty-second configuration example.

Figure 84A:
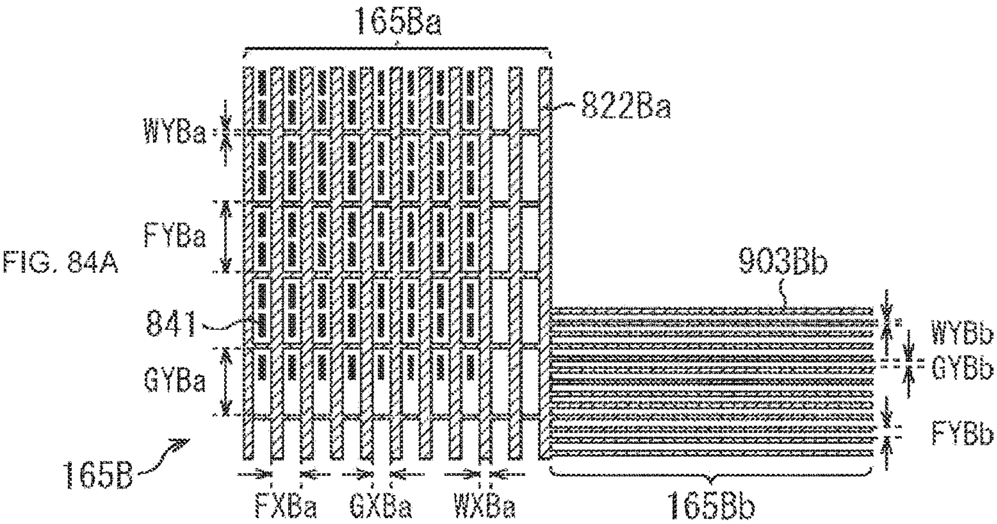
FIGS. 84A and 84B are diagrams illustrating another configuration example of the conductor layer B in the twenty-second configuration example.
Figure 84B:
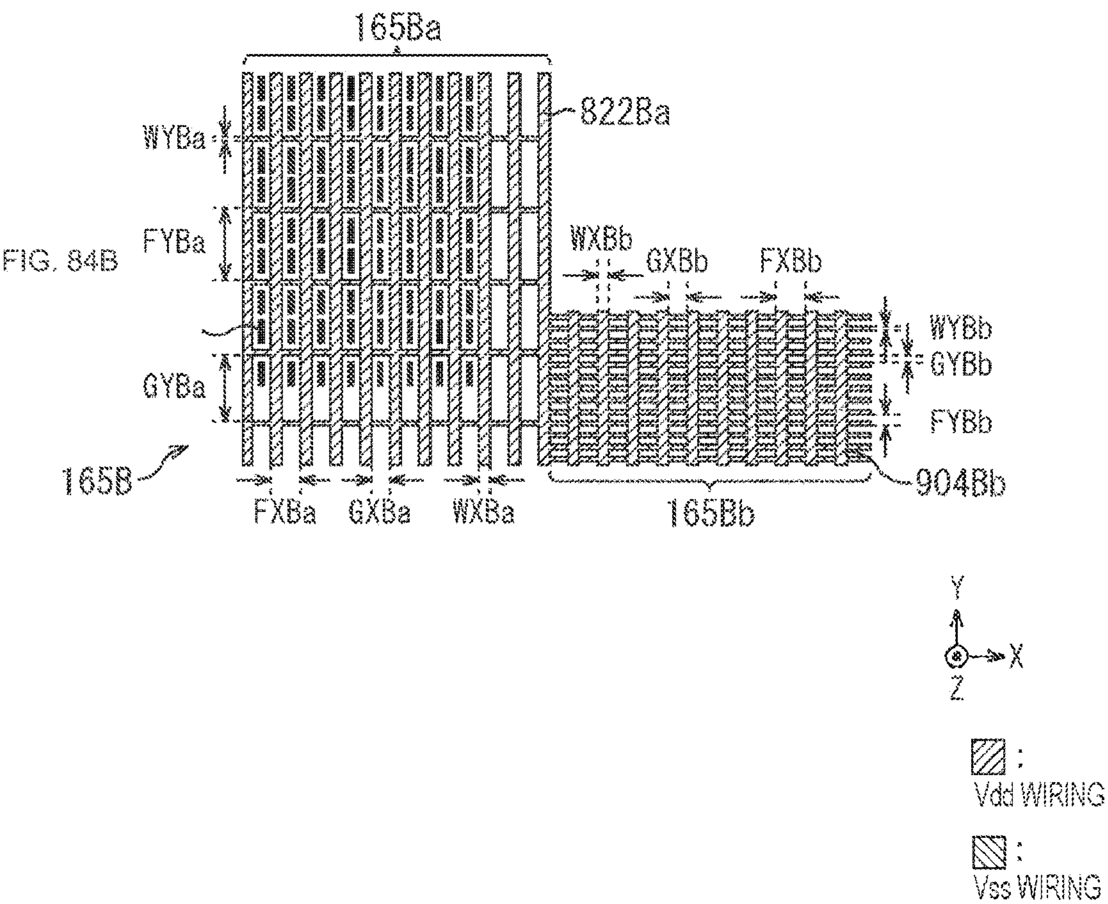

Note that, in the twenty-second configuration example, the conductor layer B in FIG. 84A or 84B may be adopted instead of the conductor layer B illustrated in FIG. 83B.

The conductor layers B illustrated in FIGS. 84A and 84B differ only in the lead-out conductor portion 165*b* from the conductor layer B illustrated in FIG. 83B.

A linear conductor 903Bb long in the X direction is periodically arranged in the Y direction with the conductor period FYBb instead of the planar conductor 901Ab illustrated in FIG. 83B, in the lead-out conductor portion 165Bb of the conductor layer B in FIG. 84A. Note that the conductor period FYBb=a conductor width WYBb in the Y direction+a gap width GYBb in the Y direction.

A reticulated conductor 904Bb is provided instead of the planar conductor Ab illustrated in FIG. 83B, in the lead-out conductor portion 165B of the conductor layer B in FIG. 84B. The reticulated conductor 904Bb has a conductor width WXBb and a gap width GXBb and is configured such that the same pattern is periodically arranged with a conductor period FXBb in the X direction, and has a conductor width WYBb and a gap width GYBb and is configured such that the same pattern is periodically arranged with a conductor period FYBb in the Y direction. Therefore, the reticulated conductor 904Bb has a shape including a repeating pattern in which a predetermined basic pattern is repeatedly arranged with a conductor period in at least one of the X direction or the Y direction.

A plan view in a state where the conductor layer B in FIG. 84A or 84B are stacked with the conductor layer A illustrated in FIG. 83A is similar to FIG. 83C.

Twenty-third Configuration Example

Figure 85A:
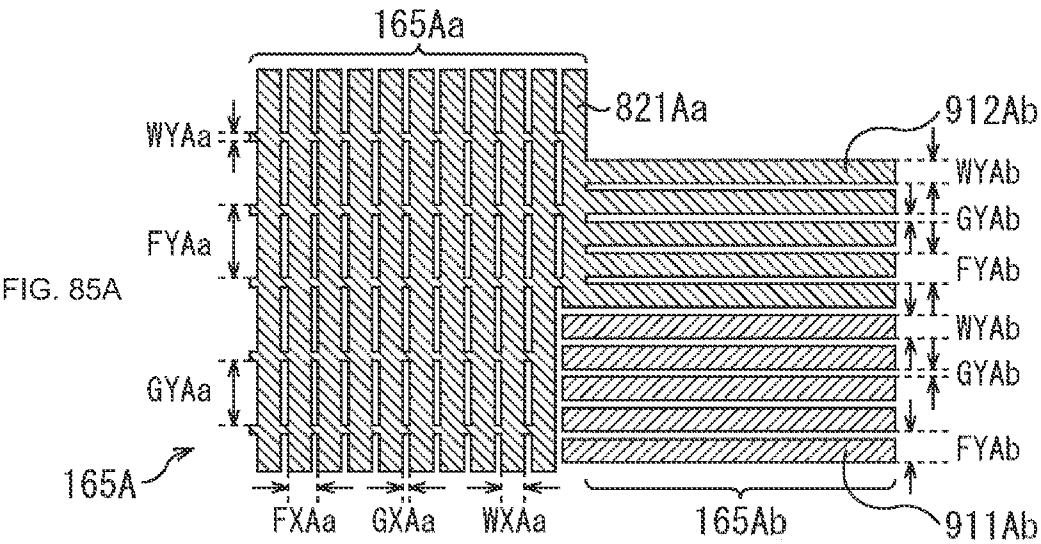
FIGS. 85A, 85B, and 85C are diagrams illustrating a twenty-third configuration example of the conductor layers A and B.
Figure 85B:
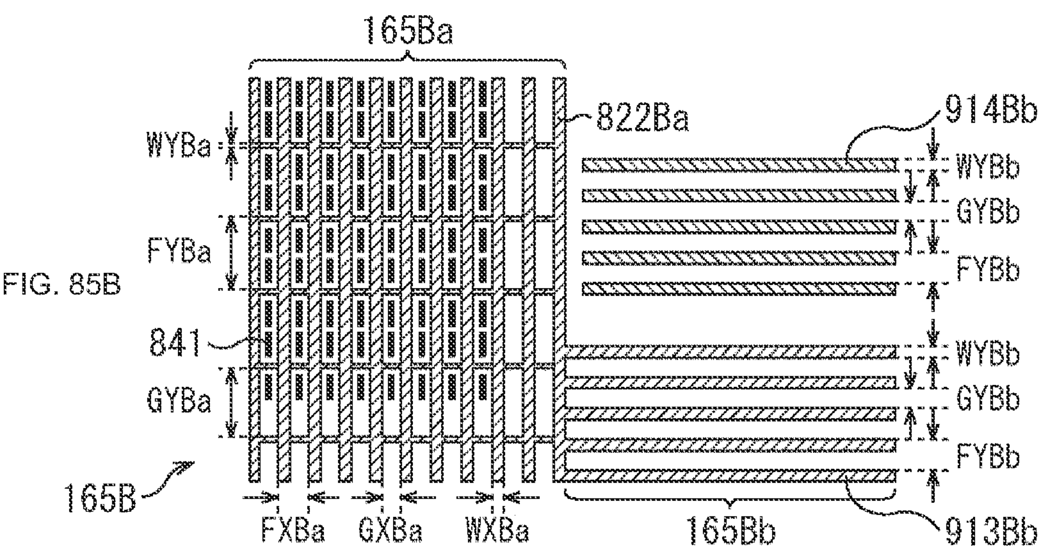
Figure 85C:
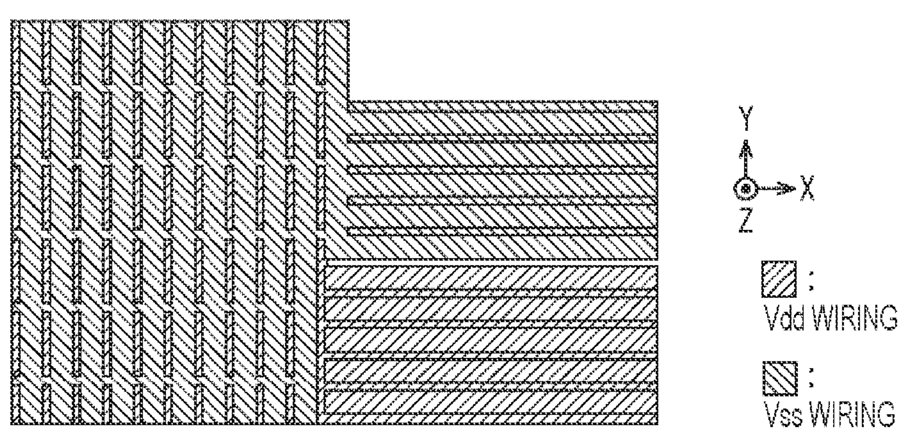

FIGS. 85A, 85B, and 85C illustrate are a twenty-third configuration example of the conductor layers A and B. Note that FIG. 85A illustrates the conductor layer A, and FIG. 85B illustrates the conductor layer B. FIG. 85C illustrates a state of the conductor layers A and B respectively illustrated in FIGS. 85A and 85B, which are viewed from the conductor layer A side. In the coordinate system in FIGS. 85A, 85B, and 85C, the horizontal direction is the X axis, the vertical direction is the Y axis, and the direction perpendicular to the XY plane is the Z axis.

The twenty-third configuration example illustrated in FIGS. 85A, 85B, and 85C has a configuration in which the conductor layer of the lead-out conductor portion 165*b* of the sixteenth configuration example illustrated in FIGS. 72A, 72B, and 72C are changed. Note that, in FIGS. 85A, 85B, and 85C, a portion corresponding to FIGS. 72A, 72B, and 72C are given the same reference numeral and description thereof is omitted as appropriate.

A linear conductor 911Ab long in the X direction is periodically arranged in the Y direction with the conductor period FYAb and a linear conductor 912Ab long in the X direction is periodically arranged in the Y direction with the conductor period FYAb, instead of the reticulated conductor 821Ab of the sixteenth configuration example, in the lead-out conductor portion 165Ab of the conductor layer A of the twenty-third configuration example illustrated in FIG. 85A. The linear conductor 911Ab is, for example, wiring (Vdd wiring) connected to the positive power supply. The linear conductor 912Ab is, for example, wiring (Vss wiring) connected to the GND or the negative power supply. The conductor period FYAb is equal to the sum of the conductor width WYAb in the Y direction and the gap width GYAb in the Y direction (the conductor period FYAb=the conductor width WYAb+the gap width GYAb).

A linear conductor 913B long in the X direction is periodically arranged in the Y direction with the conductor period FYBb and a linear conductor 914Bb long in the X direction is periodically arranged in the Y direction with the conductor period FYBb, instead of the reticulated conductor 822Bb of the sixteenth configuration example, in the lead-out conductor portion 165B of the conductor layer B of the twenty-third configuration example illustrated in FIG. 85B. The linear conductor 913B is, for example, wiring (Vdd wiring) connected to the positive power supply. The linear conductor 914Bb is, for example, wiring (Vss wiring) connected to the GND or the negative power supply. The conductor period FYBb is equal to the sum of the conductor width WYBb in the Y direction and the gap width GYBb in the Y direction (the conductor period FYBb=the conductor width WYBb+the gap width GYBb).

The linear conductor 912Ab of the lead-out conductor portion 165Ab of the conductor layer A is electrically connected to the reticulated conductor 821Aa of the main conductor portion 165Aa, and is electrically connected to the linear conductor 914Bb of the lead-out conductor portion 165Bb of the conductor layer B via the conductor via (VIA) extending in the Z direction, for example.

The linear conductor 913Bb of the lead-out conductor portion 165Bb of the conductor layer B is electrically connected to the reticulated conductor 822Ba of the main conductor portion 165Ba, and is electrically connected to the linear conductor 911Ab of the lead-out conductor portion 165Ab of the conductor layer A via the conductor via (VIA) extending in the Z direction, for example.

As illustrated in FIG. 85C, in the state where the conductor layer A and the conductor layer B are stacked, the active element group 167 is covered with at least one of the conductor layer A or the conductor layer B. Therefore, the hot carrier light emission from the active element group 167 can be shielded even in the twenty-first configuration example.

In the above-described fourteenth to twenty-second configuration examples, the Vdd wiring and the Vss wiring having different polarities are arranged to overlap on the same plane region in the lead-out conductor portion 165*b*. However, as in the twenty-third configuration example in FIGS. 85A, 85B, and 85C, the Vdd wiring and the Vss wiring having different polarities may be shifted and arranged on different plane regions, and the GND, the negative power supply, and the positive power supply be transmitted using both the conductor layer A and the conductor layer B.

Note that the linear conductor 911Ab of the lead-out conductor portion 165Ab of the conductor layer A may be used as dummy wiring without being electrically connected to the linear conductor 913Bb of the lead-out conductor portion 165Bb of the conductor layer B. The linear conductor 914Bb of the lead-out conductor portion 165Bb of the conductor layer B may be used as dummy wiring without being electrically connected to the linear conductor 912Ab of the lead-out conductor portion 165Ab of the conductor layer A.

Note that FIGS. 85A, 85B, and 85C illustrate an example in which a group of linear conductors 911Ab and a group of linear conductors 912Ab are adjacently arranged. However, the configuration is not limited to the example. For example, a plurality of groups of linear conductors 911Ab and a plurality of groups of linear conductors 912Ab may be provided, and a group of linear conductors 911Ab and a group of linear conductors 912Ab may be alternately arranged.

Furthermore, FIGS. 85A, 85B, and 85C illustrate an example in which the linear conductor 911Ab including a plurality of linear conductors and the linear conductor 912Ab including a plurality of linear conductors are adjacently arranged. However, the configuration is not limited to the example. For example, one linear conductor 911Ab and one linear conductor 912Ab may be alternately arranged.

Furthermore, FIGS. 85A, 85B, and 85C illustrate an example in which a group of linear conductors 913Bb and a group of linear conductors 914Bb are adjacently arranged. However, the configuration is not limited to the example. For example, a plurality of groups of linear conductors 913Bb and a plurality of groups of linear conductors 914Bb may be provided, and a group of linear conductors 913Bb and a group of linear conductors 914Bb may be alternately arranged.

Furthermore, FIGS. 85A, 85B, and 85C illustrate an example in which the linear conductor 913Bb including a plurality of linear conductors and the linear conductor 914Bb including a plurality of linear conductors are adjacently arranged. However, the configuration is not limited to the example. For example, one linear conductor 913B and one linear conductor 914B may be alternately arranged.

Twenty-fourth Configuration Example

Figure 86A:
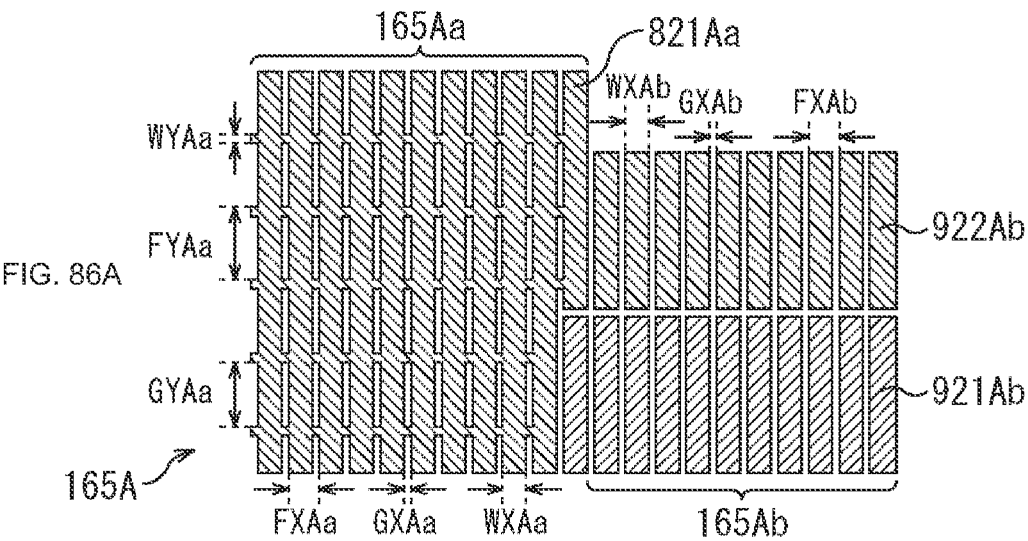
FIGS. 86A, 86B, and 86C are diagrams illustrating a twenty-fourth configuration example of the conductor layers A and B.
Figure 86B:
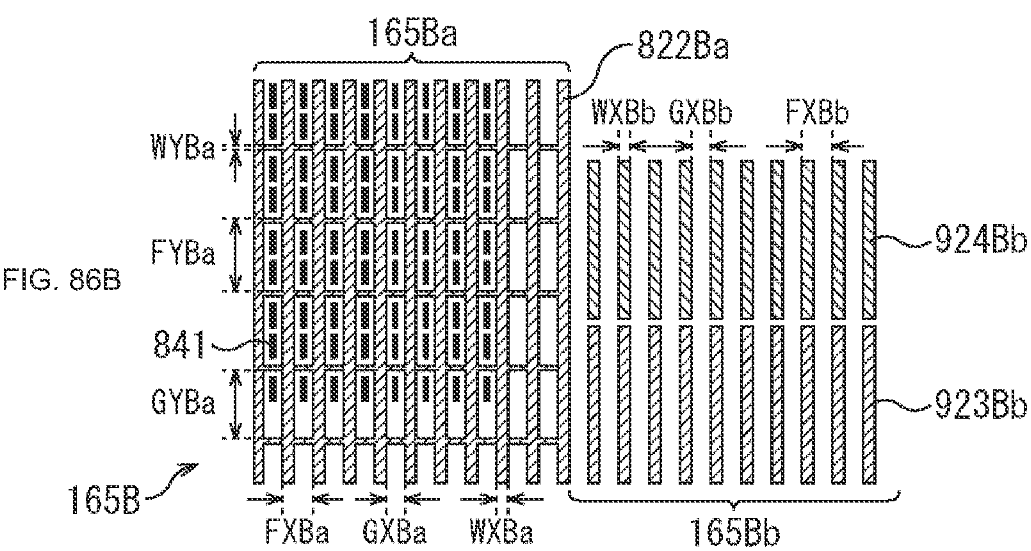
Figure 86C:
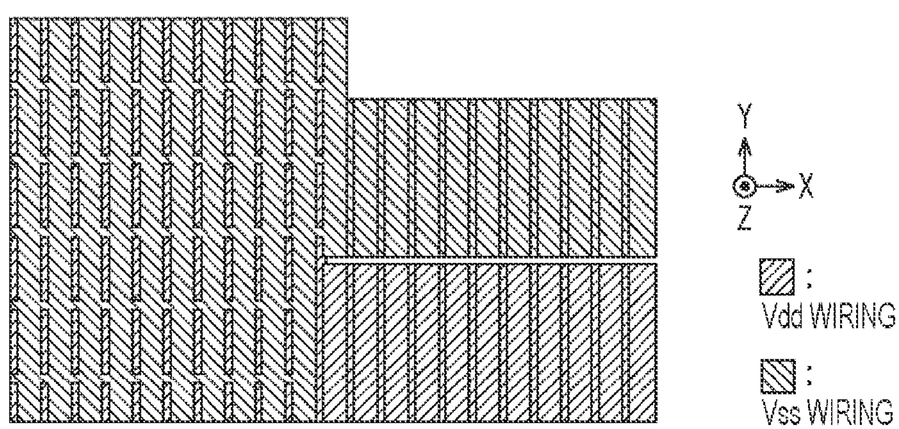

FIGS. 86A, 86B, and 86C illustrate a twenty-fourth configuration example of the conductor layers A and B. Note that FIG. 86A illustrates the conductor layer A, and FIG. 86B illustrates the conductor layer B. FIG. 86C illustrates a state of the conductor layers A and B respectively illustrated in FIGS. 86A and 86B, which are viewed from the conductor layer A side. In the coordinate system in FIGS. 86A, 86B, and 86C, the horizontal direction is the X axis, the vertical direction is the Y axis, and the direction perpendicular to the XY plane is the Z axis.

The twenty-fourth configuration example illustrated in FIGS. 86A, 86B, and 86C has a configuration in which the conductor layer of the lead-out conductor portion 165*b* of the sixteenth configuration example illustrated in FIGS. 72A, 72B, and 72C are changed. Note that, in FIGS. 86A, 86B, and 86C, a portion corresponding to FIGS. 72A, 72B, and 72C are given the same reference numeral and description thereof is omitted as appropriate.

A linear conductor 921Ab long in the Y direction is periodically arranged in the X direction with the conductor period FXAb and a linear conductor 922Ab long in the Y direction is periodically arranged in the X direction with the conductor period FXAb, instead of the reticulated conductor 821Ab of the sixteenth configuration example, in the lead-out conductor portion 165Ab of the conductor layer A of the twenty-fourth configuration example illustrated in FIG. 86A. The linear conductor 921Ab is, for example, wiring (Vdd wiring) connected to the positive power supply. The linear conductor 922Ab is, for example, wiring (Vss wiring) connected to the GND or the negative power supply. The conductor period FXAb is equal to the sum of the conductor width WXAb in the X direction and the gap width GXAb in the X direction (the conductor period FXAb=the conductor width WXAb+the gap width GXAb).

A linear conductor 923Bb long in the Y direction is periodically arranged in the X direction with the conductor period FXBb and a linear conductor 924Bb long in the Y direction is periodically arranged in the X direction with the conductor period FXBb, instead of the reticulated conductor 822Bb of the sixteenth configuration example, in the lead-out conductor portion 165B of the conductor layer B of the twenty-fourth configuration example illustrated in FIG. 86B. The linear conductor 923Bb is, for example, wiring (Vdd wiring) connected to the positive power supply. The linear conductor 924Bb is, for example, wiring (Vss wiring) connected to the GND or the negative power supply. The conductor period FXBb is equal to the sum of the conductor width WXBb in the X direction and the gap width GXBb in the X direction (the conductor period FXBb=the conductor width WXBb+the gap width GXBb).

The linear conductor 922Ab of the lead-out conductor portion 165Ab of the conductor layer A is electrically connected to the linear conductor 924Bb of the lead-out conductor portion 165Bb of the conductor layer B via, for example, the conductor via (VIA) extending in the Z direction, and is electrically connected to the reticulated conductor 821Aa of the main conductor portion 165Aa via the linear conductor 924Bb.

That is, for example, the GND or the negative power supply is alternately transmitted in the linear conductor 922Ab of the conductor layer A and in the linear conductor 924Bb of the conductor layer B in the lead-out conductor portion 165*b*, and reaches the reticulated conductor 821Aa of the main conductor portion 165Aa.

The linear conductor 923Bb of the lead-out conductor portion 165Bb of the conductor layer B is electrically connected to the linear conductor 921Ab of the lead-out conductor portion 165Ab of the conductor layer A via, for example, the conductor via (VIA) extending in the Z direction, and is electrically connected to the reticulated conductor 822Ba of the main conductor portion 165Ba via the linear conductor 921Ab.

That is, for example, the positive power supply is alternately transmitted in the linear conductor 921Ab of the conductor layer A and in the linear conductor 923Bb of the conductor layer B in the lead-out conductor portion 165*b* and reaches the reticulated conductor 822Ba of the main conductor portion 165Ba.

As illustrated in FIG. 86C, in the state where the conductor layer A and the conductor layer B are stacked, the active element group 167 is covered with at least one of the conductor layer A or the conductor layer B. Therefore, the hot carrier light emission from the active element group 167 can be shielded even in the twenty-first configuration example.

In the above-described fourteenth to twenty-second configuration examples, the Vdd wiring and the Vss wiring having different polarities are arranged to overlap on the same plane region in the lead-out conductor portion 165*b*. However, as in the twenty-fourth configuration example in FIGS. 86A, 86B, and 86C, the Vdd wiring and the Vss wiring having different polarities may be shifted and arranged on different plane regions, and the GND, the negative power supply, and the positive power supply may be transmitted using both the conductor layer A and the conductor layer B.

As described above, the conductor layer of the lead-out conductor portion 165*b* is not limited to the reticulated conductor, and may be configured by a planar conductor or a linear conductor, as in the twenty-first to twenty-fourth configuration examples illustrated in FIGS. 82A, 82B, 82C, 83A, 83B, 83C, 84A, 84B, 85A, 85B, 85C, 86A, 86B, and 86C. Furthermore, not only one layer of the conductor layer A or B but also two layers of the conductor layers A and B may be used.

With such a configuration, any of effects of satisfying the wiring layout restrictions, further improving the degree of freedom in designing the wiring layout, further improving the inductive noise, further improving the voltage drop, or the like can be exhibited.

Twenty-fifth Configuration Example

Figure 87A:
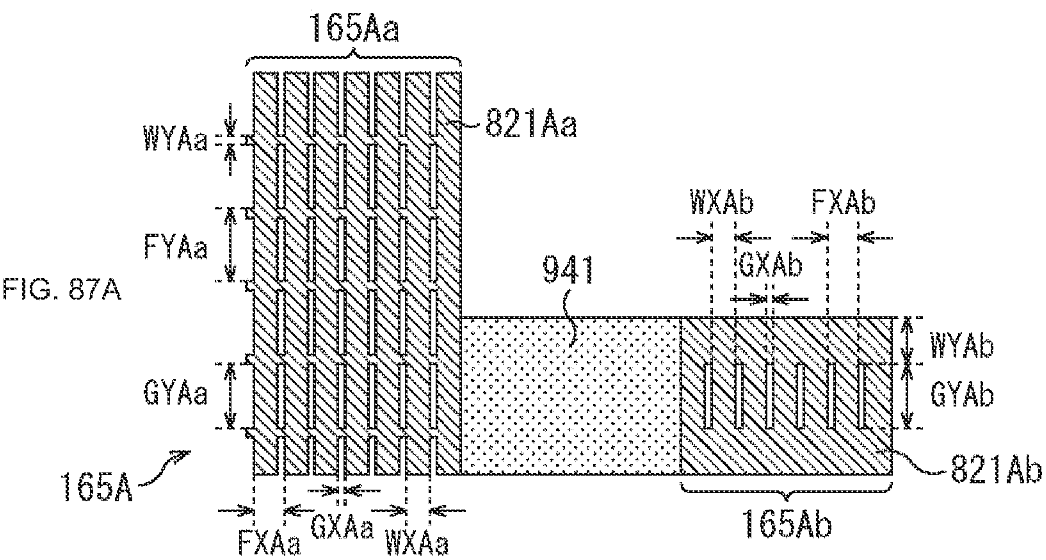
FIGS. 87A, 87B, and 87C are diagrams illustrating a twenty-fifth configuration example of the conductor layers A and B.
Figure 87B:
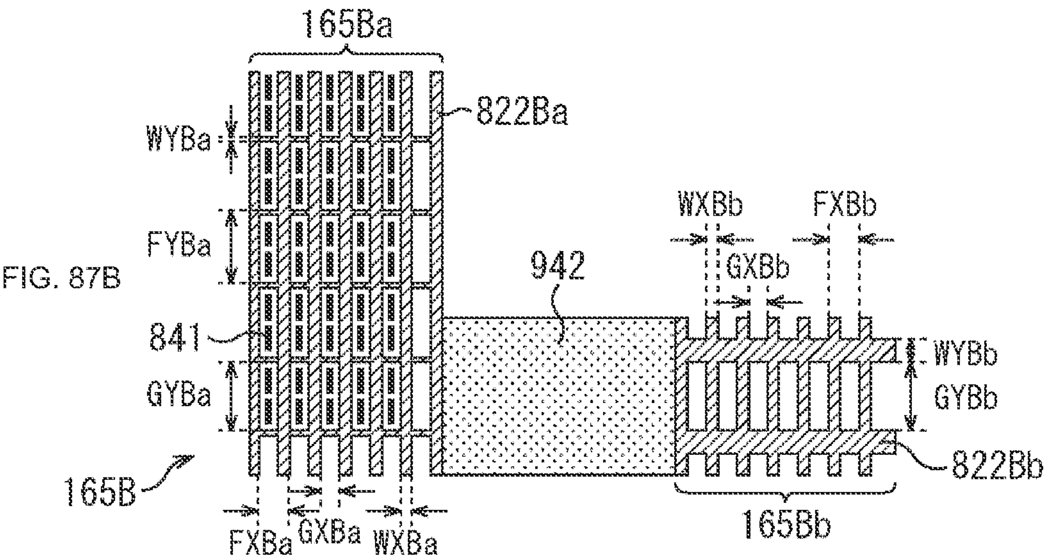
Figure 87C:
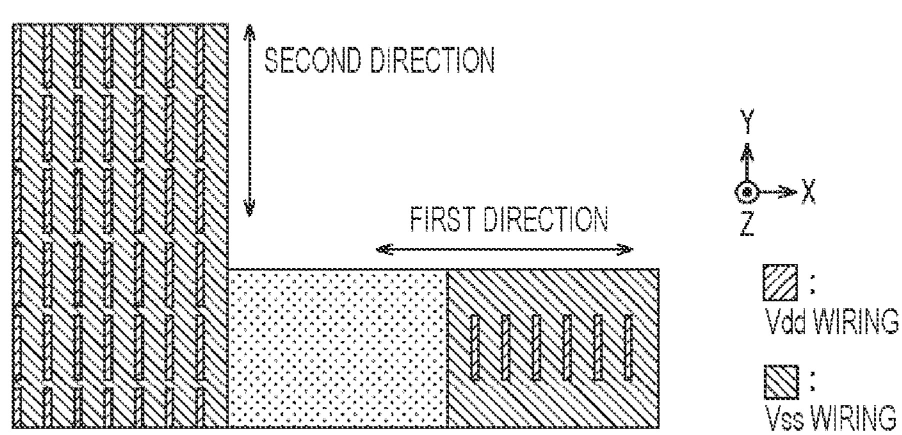

FIGS. 87A, 87B, and 87C illustrate a twenty-fifth configuration example of the conductor layers A and B. Note that FIG. 87A illustrates the conductor layer A, and FIG. 87B illustrates the conductor layer B. FIG. 87C illustrates a state of the conductor layers A and B respectively illustrated in FIGS. 87A and 87B, which are viewed from the conductor layer A side. In the coordinate system in FIGS. 87A, 87B, and 87C, the horizontal direction is the X axis, the vertical direction is the Y axis, and the direction perpendicular to the XY plane is the Z axis.

The twenty-fifth configuration example illustrated in FIGS. 87A, 87B, and 87C has a configuration in which a part is added to the sixteenth configuration example illustrated in FIGS. 72A, 72B, and 72C. Note that, in FIGS. 86A, 86B, and 86C, a portion corresponding to FIGS. 72A, 72B, and 72C are given the same reference numeral and description thereof is omitted as appropriate.

In the conductor layer A of the twenty-fifth configuration example illustrated in FIG. 87A, a conductor 941 having a shape that optionally contains a repeating pattern different from the reticulated conductor 821Aa and the reticulated conductor 821Ab is added between the reticulated conductor 821Aa of the main conductor portion 165Aa and the reticulated conductor 821Ab of the lead-out conductor portion 165Ab in the sixteenth configuration example illustrated in FIGS. 72A, 72B, and 72C. Note that the conductor 941 desirably has a shape including the repeating pattern in order to efficiently design the wiring layout, but may have a shape not including the repeating pattern. Since the pattern of the conductor 941 can take any shape, the conductor 941 in FIG. 87A is represented by a planar shape without any particular specification. The conductor 941 is electrically connected to both the reticulated conductor 821Aa and the reticulated conductor 821Ab. In other words, the reticulated conductor 821Aa of the main conductor portion 165Aa and the reticulated conductor Ab of the lead-out conductor portion 165Ab are electrically connected via the conductor 941.

In the conductor layer B of the twenty-fifth configuration example illustrated in FIG. 87B, a conductor 942 having a shape that optionally contains a repeating pattern different from the reticulated conductor 822Ba and the reticulated conductor 822Bb is added between the reticulated conductor 822Ba of the main conductor portion 165B and the reticulated conductor 822Bb of the lead-out conductor portion 165B in the sixteenth configuration example illustrated in FIGS. 72A, 72B, and 72C. Note that the conductor 942 desirably has a shape including the repeating pattern in order to efficiently design the wiring layout, but may have a shape not including the repeating pattern. Since the pattern of the conductor 942 can take any shape, the conductor 942 in FIG. 87B is represented by a planar shape without any particular specification. The conductor 942 is electrically connected to both the reticulated conductor 822Ba and the reticulated conductor 822Bb. In other words, the reticulated conductor 822Ba of the main conductor portion 165B and the reticulated conductor 822Bb of the lead-out conductor portion 165B are electrically connected via the conductor 942.

According to the twenty-fifth configuration example, the reticulated conductor 821Aa of the main conductor portion 165Aa and the reticulated conductor 821Ab of the lead-out conductor portion 165Ab are connected via the predetermined conductor 941 in the conductor layer A, whereby the degree of freedom in designing the wiring layout can be further improved and the degree of freedom in the vicinity of pads can be particularly improved.

The reticulated conductor 822Ba of the main conductor portion 165Ba and the reticulated conductor 822Bb of the lead-out conductor portion 165Bb are connected via the predetermined conductor 942 in the conductor layer B, whereby the degree of freedom in designing the wiring layout can be further improved and the degree of freedom in the vicinity of pads can be particularly improved.

Twenty-sixth Configuration Example

Figure 88A:
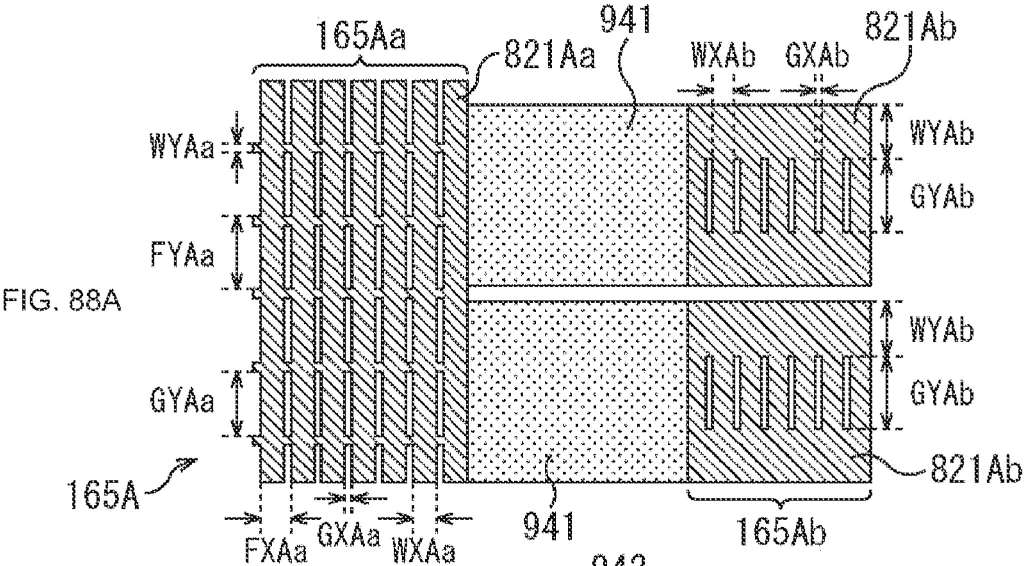
FIGS. 88A, 88B, and 88C are diagrams illustrating a twenty-sixth configuration example of the conductor layers A and B.
Figure 88B:
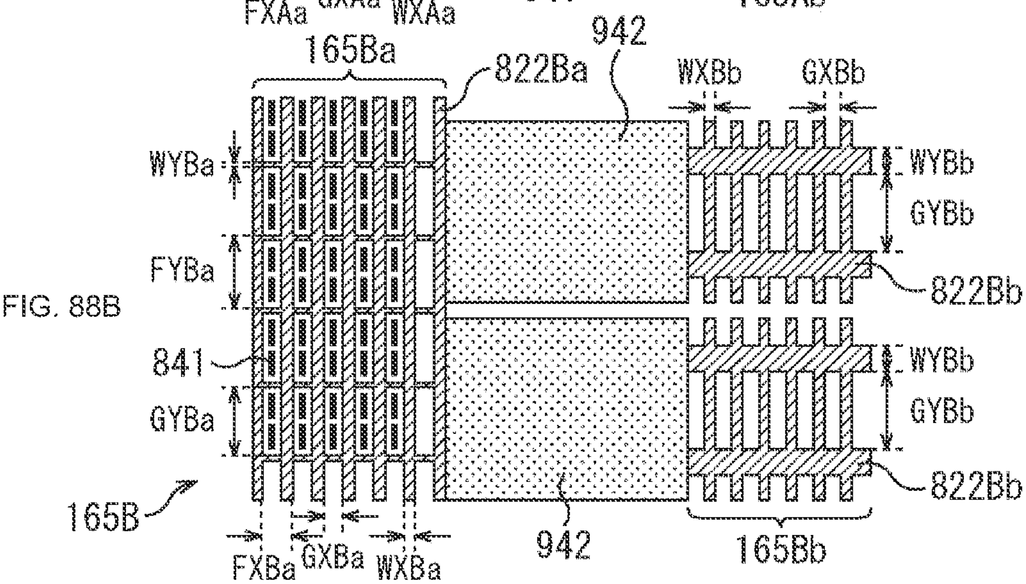
Figure 88C:
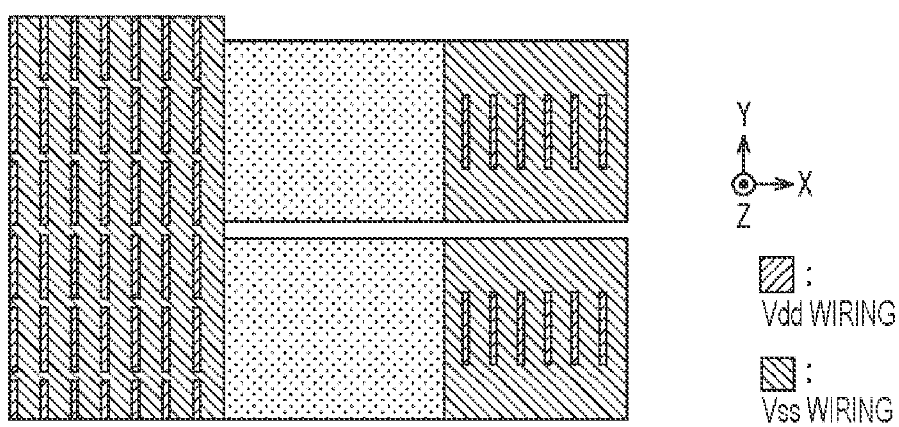

FIGS. 88A, 88B, and 88C illustrate a twenty-sixth configuration example of the conductor layers A and B. Note that FIG. 88A illustrates the conductor layer A, and FIG. 88B illustrates the conductor layer B. FIG. 88C illustrates a state of the conductor layers A and B respectively illustrated in FIGS. 88A and 88B, which are viewed from the conductor layer A side. In the coordinate system in FIGS. 88A, 88B, and 88C, the horizontal direction is the X axis, the vertical direction is the Y axis, and the direction perpendicular to the XY plane is the Z axis.

The twenty-sixth configuration example illustrated in FIGS. 88A, 88B, and 88C has a configuration in which a part of the twenty-fifth configuration example illustrated in FIGS. 87A, 87B, and 87C changed. Note that, in FIGS. 86A, 86B, and 86C, a portion corresponding to FIGS. 87A, 87B, and 87C are given the same reference numeral and description thereof is omitted as appropriate.

The conductor layer A of the twenty-sixth configuration example illustrated in FIG. 88A includes the reticulated conductor 821Aa similar to the twenty-fifth configuration example illustrated in FIGS. 87A, 87B, and 87C, in the main conductor portion 165Aa. Furthermore, the conductor layer A of the twenty-sixth configuration example includes a plurality of the reticulated conductors 821Ab and the conductors similar to the twenty-fifth configuration example in the Y direction at predetermined intervals in the lead-out conductor portion 165Ab. In other words, the conductor layer A of the twenty-sixth configuration example in FIG. 88A has a configuration in which a plurality of the reticulated conductors 821Ab and the conductors 941 of the lead-out conductor portion 165Ab of the twenty-fifth configuration example illustrated in FIGS. 87A, 87B, and 87C are provided in the Y direction at predetermined intervals. Note that all of the plurality of conductors 941 may be the same or may not be the same.

The conductor layer B of the twenty-sixth configuration example illustrated in FIG. 88B includes the reticulated conductor 822Ba similar to the twenty-fifth configuration example illustrated in FIGS. 87A, 87B, and 87C, in the main conductor portion 165Ba. Furthermore, the conductor layer B of the twenty-sixth configuration example includes a plurality of the reticulated conductors 822Bb and the conductors similar to the twenty-fifth configuration example in the Y direction at predetermined intervals in the lead-out conductor portion 165Bb. In other words, the conductor layer B of the twenty-sixth configuration example in FIG. 88B has a configuration in which a plurality of the reticulated conductors 822Bb and the conductors 942 of the lead-out conductor portion 165B of the twenty-fifth configuration example illustrated in FIGS. 87A, 87B, and 87C are provided in the Y direction at predetermined intervals. Note that all of the plurality of conductors 942 may be the same or may not be the same.

With such a configuration, any of effects of satisfying the wiring layout restrictions, further improving the degree of freedom in designing the wiring layout, further improving the inductive noise, further improving the voltage drop, or the like can be exhibited.

Twenty-seventh Configuration Example

Figure 89A:
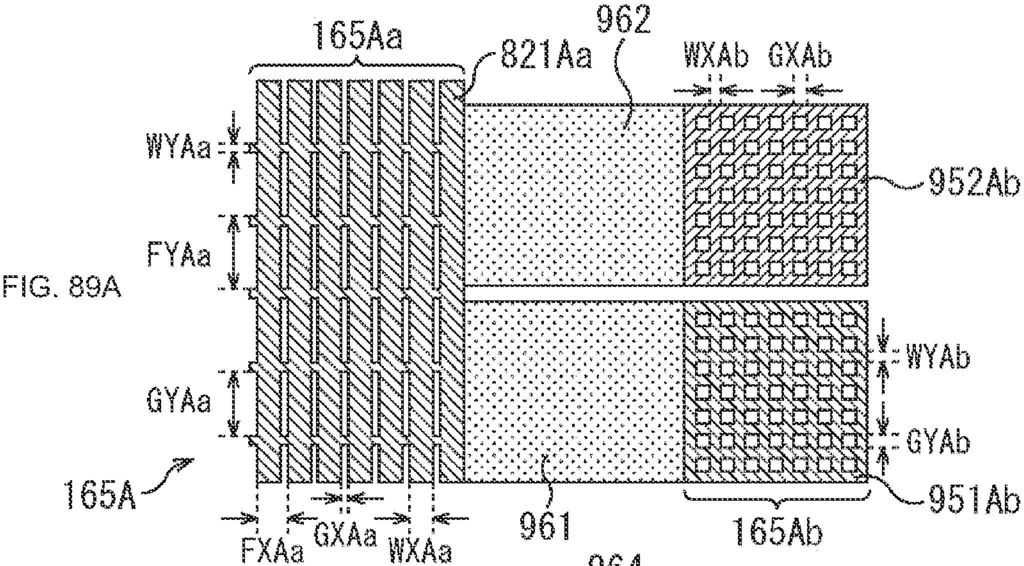
FIGS. 89A, 89B, and 89C are diagrams illustrating a twenty-seventh configuration example of the conductor layers A and B.
Figure 89B:
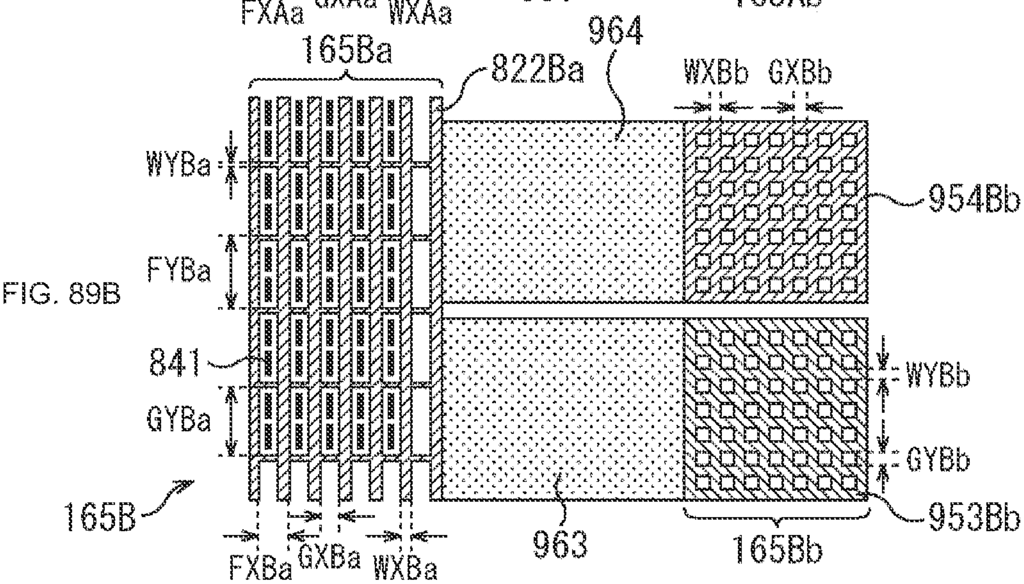
Figure 89C:
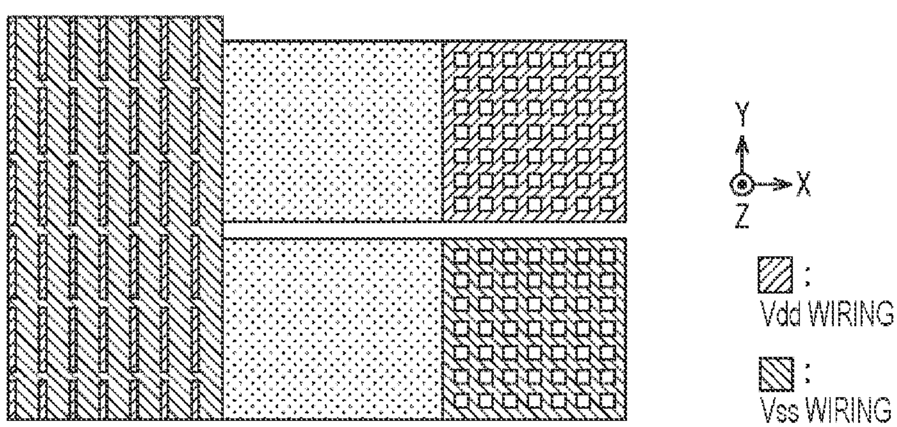

FIGS. 89A, 89B, and 89C illustrate a twenty-seventh configuration example of the conductor layers A and B. Note that FIG. 89A illustrates the conductor layer A, and FIG. 89B illustrates the conductor layer B. FIG. 89C illustrates a state of the conductor layers A and B respectively illustrated in FIGS. 89A and 89B, which are viewed from the conductor layer A side. In the coordinate system in FIGS. 89A, 89B, and 89C, the horizontal direction is the X axis, the vertical direction is the Y axis, and the direction perpendicular to the XY plane is the Z axis.

The twenty-seventh configuration example illustrated in FIGS. 89A, 89B, and 89C has a configuration in which a part of the twenty-sixth configuration example illustrated in FIGS. 88A, 88B, and 88C changed. Note that, in FIGS. 89A, 89B, and 89C, a portion corresponding to FIGS. 88A, 88B, and 88C are given the same reference numeral and description thereof is omitted as appropriate.

The main conductor portion 165Aa of the conductor layer A of the twenty-seventh configuration example illustrated in FIG. 89A includes the reticulated conductor 821Aa similar to the twenty-sixth configuration example illustrated in FIGS. 88A, 88B, and 88C. The lead-out conductor portion 165Ab of the conductor layer A of the twenty-seventh configuration example includes a reticulated conductor 951Ab and a reticulated conductor 952Ab. The shapes of the reticulated conductor 951Ab and the reticulated conductor 952Ab are each having the conductor width WXAb and the gap width GXAb in the X direction and the conductor width WYAb and the gap width GYAb in the Y direction. Note that the reticulated conductor 952Ab is, for example, wiring (Vdd wiring) connected to the positive power supply and the reticulated conductor 951Ab is, for example, wiring (Vss wiring) connected to the GND or the negative power supply.

A conductor 961 having a shape that optionally contains a repeating pattern different from the reticulated conductor 821Aa of the main conductor portion 165Aa and the reticulated conductor 951Ab of the lead-out conductor portion 165Ab is arranged between the reticulated conductor 821Aa and the reticulated conductor 951Ab. A conductor 962 having a shape that optionally contains a repeating pattern different from the reticulated conductor 821Aa of the main conductor portion 165Aa and the reticulated conductor 952Ab of the lead-out conductor portion 165Ab is arranged between the reticulated conductor 821Aa and the reticulated conductor 952Ab. Note that the conductor 961 or 962 desirably has a shape including a repeating pattern in order to efficiently design the wiring layout, but may have a shape not including the repeating pattern. Since the pattern of the conductors 961 and 962 can take any shape, the conductors 961 and 962 in FIG. 89A are represented by a planar shape without any particular specification.

The main conductor portion 165B of the conductor layer B of the twenty-seventh configuration example illustrated in FIG. 89B includes the reticulated conductor 822Ba similar to the twenty-sixth configuration example illustrated in FIGS. 88A, 88B, and 88C. The lead-out conductor portion 165B of the conductor layer B of the twenty-seventh configuration example includes a reticulated conductor 953Bb and a reticulated conductor 954Bb. The shapes of the reticulated conductor 953Bb and the reticulated conductor 954Bb are each including the conductor width WXBb and the gap width GXBb in the X direction and the conductor width WYBb and the gap width GYBb in the Y direction. Note that the reticulated conductor 954Bb is, for example, wiring (Vdd wiring) connected to the positive power supply and the reticulated conductor 953Bb is, for example, wiring (Vss wiring) connected to the GND or the negative power supply.

A conductor 963 having a shape that optionally contains a repeating pattern different from the reticulated conductor 822Ba of the main conductor portion 65B and the reticulated conductor 953Bb of the lead-out conductor portion 165B is arranged between the reticulated conductor 822Ba and the reticulated conductor 953Bb. A conductor 964 having a shape that optionally contains a repeating pattern different from the reticulated conductor 822Ba of the main conductor portion 165B and the reticulated conductor 954Bb of the lead-out conductor portion 165B is arranged between the reticulated conductor 822Ba and the reticulated conductor 954Bb. Note that the conductor 963 or 964 desirably has a shape including a repeating pattern in order to efficiently design the wiring layout, but may have a shape not including the repeating pattern. Since the pattern of the conductors 963 and 964 can take any shape, the conductors 963 and 964 in FIG. 89B are represented by a planar shape without any particular specification.

The conductor 961 of the conductor layer A is electrically connected to the reticulated conductor 821Aa of the main conductor portion 165Aa and at least one of the reticulated conductor 951Ab or 953Bb of the lead-out conductor portion 165*b* directly or indirectly via, for example, a conductor that is at least a part of the conductor 963. In other words, the reticulated conductor 821Aa of the main conductor portion 165Aa and at least one of the reticulated conductor 951Ab or 953Bb of the lead-out conductor portion 165*b* are electrically connected via the conductor 961. Furthermore, the reticulated conductor 951Ab of the lead-out conductor portion 165Ab is electrically connected to the reticulated conductor 953Bb of the lead-out conductor portion 165Bb of the conductor layer B via, for example, the conductor via (VIA) extending in the Z direction. The conductor 961 and the conductor 963 may also be electrically connected via, for example, a conductor via (VIA) extending in the Z direction.

The conductor 964 of the conductor layer B is electrically connected to the reticulated conductor 822Ba of the main conductor portion 165Ba and at least one of the reticulated conductor 952Ab or 954Bb of the lead-out conductor portion 165*b* directly or indirectly via, for example, a conductor that is at least a part of the conductor 962. In other words, the reticulated conductor 822Ba of the main conductor portion 165Ba and at least one of the reticulated conductor 952Ab or 954Bb of the lead-out conductor portion 165*b* are electrically connected via the conductor 964. Furthermore, the reticulated conductor 952Ab of the lead-out conductor portion 165Ab is electrically connected to the reticulated conductor 954Bb of the lead-out conductor portion 165Bb of the conductor layer B via, for example, the conductor via (VIA) extending in the Z direction. The conductor 962 and the conductor 964 may also be electrically connected via, for example, a conductor via (VIA) extending in the Z direction.

For example, in the twenty-sixth configuration example in FIGS. 88A, 88B, and 88C, when looking at the polarities of the conductor layer A and the conductor layer B at the same plane position of the main conductor portion 165*a* and the lead-out conductor portion 165*b*, the main conductor portion 165Aa of the conductor layer A and the main conductor portion 165B of the conductor layer B have different polarities between the Vss wiring and the Vdd wiring, and the lead-out conductor portion 165Ab of the conductor layer A and the lead-out conductor portion 165B of the conductor layer B also have different polarities.

In contrast, in the twenty-seventh configuration example in FIGS. 89A, 89B, and 89C, when looking at the polarities of the conductor layer A and the conductor layer B at the same plane position of the main conductor portion 165*a* and the lead-out conductor portion 165*b*, the main conductor portion 165Aa of the conductor layer A and the main conductor portion 165B of the conductor layer B have different polarities between the Vss wiring and the Vdd wiring, but the lead-out conductor portion 165Ab of the conductor layer A and the lead-out conductor portion 165B of the conductor layer B have the same polarity. With such a polarity arrangement, in the case where the upper and lower conductor layer A and conductor layer B are configured, the lead-out conductor portion 165*b* electrically connected with the upper and lower conductor layer A and conductor layer B can be used as a pad (electrode).

According to the twenty-seventh configuration example, any of effects of satisfying the wiring layout restrictions, further improving the degree of freedom in designing the wiring layout, further improving the inductive noise, further improving the voltage drop, and the like can be exhibited.

Twenty-eighth Configuration Example

Figure 90A:
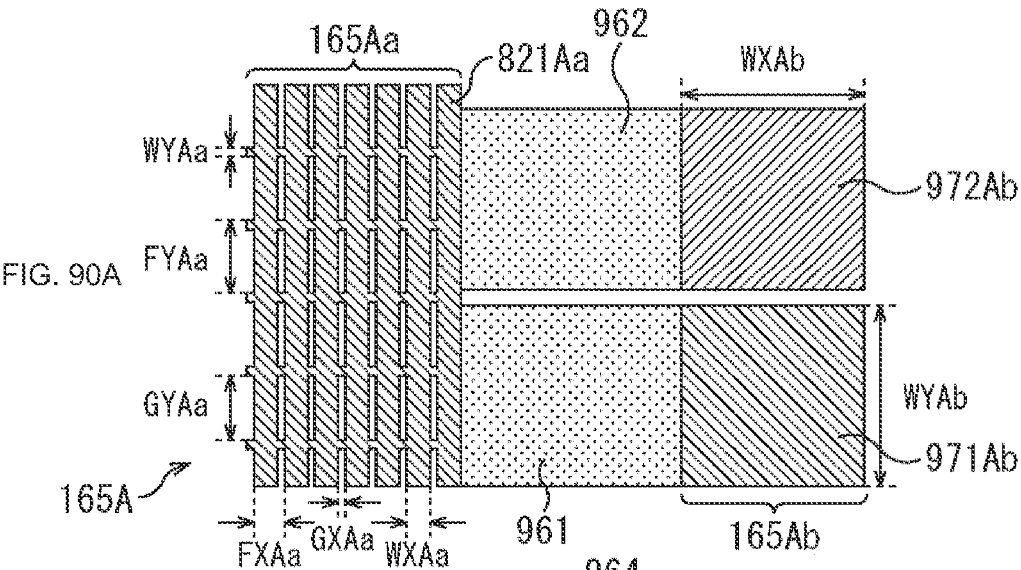
FIGS. 90A, 90B, and 90C are diagrams illustrating a twenty-eighth configuration example of the conductor layers A and B.
Figure 90B:
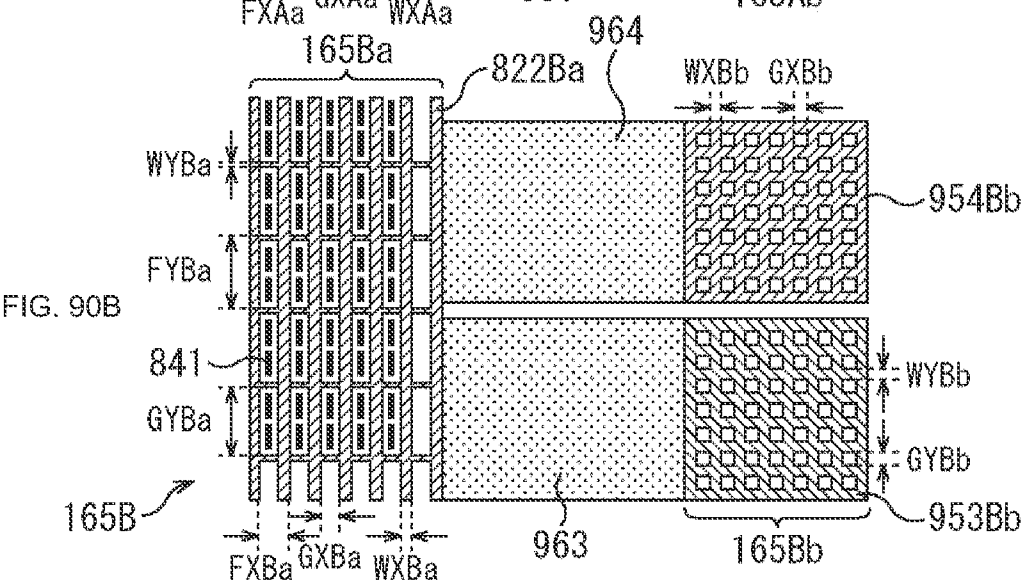
Figure 90C:
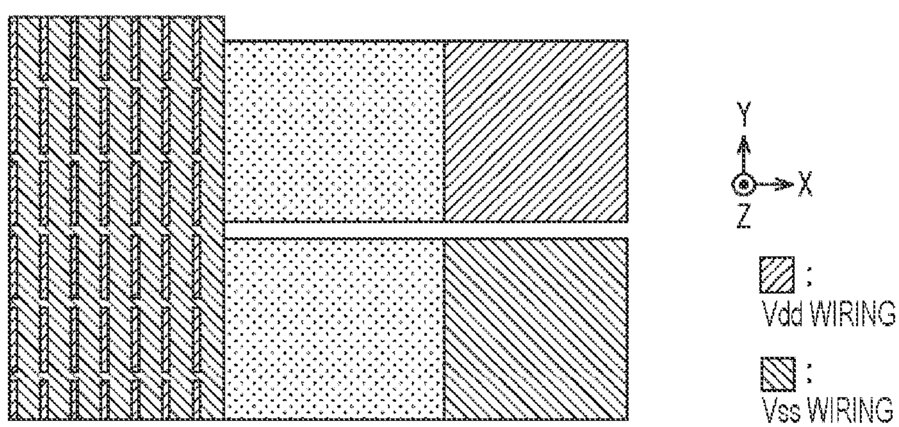

FIGS. 90A, 90B, and 90C illustrate a twenty-eighth configuration example of the conductor layers A and B. Note that FIG. 90A illustrates the conductor layer A, and FIG. 90B illustrates the conductor layer B. FIG. 90C illustrates a state of the conductor layers A and B respectively illustrated in FIGS. 90A and 90B, which are viewed from the conductor layer A side. In the coordinate system in FIGS. 90A, 90B, and 90C, the horizontal direction is the X axis, the vertical direction is the Y axis, and the direction perpendicular to the XY plane is the Z axis.

The twenty-eighth configuration example illustrated in FIGS. 90A, 90B, and CC has a configuration in which a part of the twenty-seventh configuration example illustrated in FIGS. 89A, 89B, and 89C are changed. Note that, in FIGS. 90A, 90B, and 90C, a portion corresponding to FIGS. 89A, 89B, and 89C are given the same reference numeral and description thereof is omitted as appropriate.

The twenty-eighth configuration example illustrated in FIGS. 90A, 90B, and 90C are different only in the shape of the lead-out conductor portion 165Ab of the conductor layer A from the twenty-seventh configuration example in FIGS. 89A, 89B, and 89C and is common in the other points to the twenty-seventh configuration example in FIGS. 89A, 89B, and 89C.

Specifically, in the lead-out conductor portion 165Ab of the conductor layer A in the twenty-seventh configuration example in FIGS. 89A, 89B, and 89C, the reticulated conductor 951Ab and the reticulated conductor 952Ab having the shapes with the conductor width WXAb and the gap width GXAb in the X direction and the conductor width WYAb and the gap width GYAb in the Y direction are formed.

In contrast, in the lead-out conductor portion 165Ab of the conductor layer A in the twenty-eighth configuration example in FIGS. 90A, 90B, and 90C, a planar conductor 971Ab and a planar conductor 972Ab having shapes with the conductor width WXAb in the X direction and the conductor width WYAb in the Y direction are formed.

In other words, in the twenty-eighth configuration example in FIGS. 90A 90B, and 90C, the lead-out conductor portion 165Ab of the conductor layer A includes the planar conductor 971Ab instead of the reticulated conductor 951Ab in the twenty-seventh configuration example in FIGS. 89A, 89B, and 89C and the planar conductor 972Ab instead of the reticulated conductor 952Ab in the twenty-seventh configuration example in FIGS. 89A, 89B, and 89C.

The twenty-seventh configuration example in FIGS. 89A, 89B, and 89C are an example in which the shapes of the lead-out conductor portions 165*b* of the upper and lower conductor layer A and conductor layer B are the same shapes. However, different shapes may be adopted as in the twenty-eighth configuration example in FIGS. 90A, 90B, and 90C.

Figure 91A:
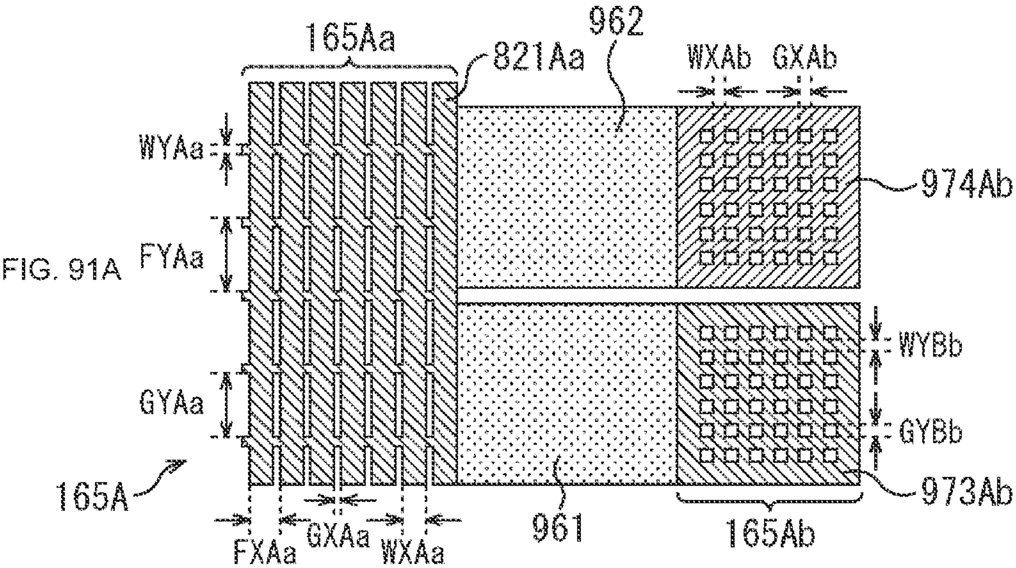
FIGS. 91A and 91B are diagrams illustrating other configuration examples of the conductor layer A in the twenty-eighth configuration example.

Moreover, while the shape of the lead-out conductor portion 165Ab of the conductor layer A is planar in the twenty-eighth configuration example in FIGS. 90A 90B, and 90C, a light-shielding structure may be formed using a reticulated conductor 973Ab of the conductor layer A in FIG. 91A and the reticulated conductor 953Bb of the conductor layer B in FIG. 90B and a light-shielding structure may be formed using a reticulated conductor 974Ab of the conductor layer A in FIG. 91A and the reticulated conductor 954Bb of the conductor layer B in FIG. 90B, even if the upper and lower layers have the same reticulated shape like the reticulated conductor 973Ab and the reticulated conductor 974Ab of the lead-out conductor portion 165Ab of the conductor layer A illustrated in FIG. 91. Moreover, the conductor width WXAb or the gap width GXAb in the X direction and the conductor width WYAb or the gap width GYAb in the Y direction may be substantially the same size as the reticulated conductor 953Bb or the reticulated conductor 954Bb of the lead-out conductor portion 165B of the conductor layer B.

Figure 91B:
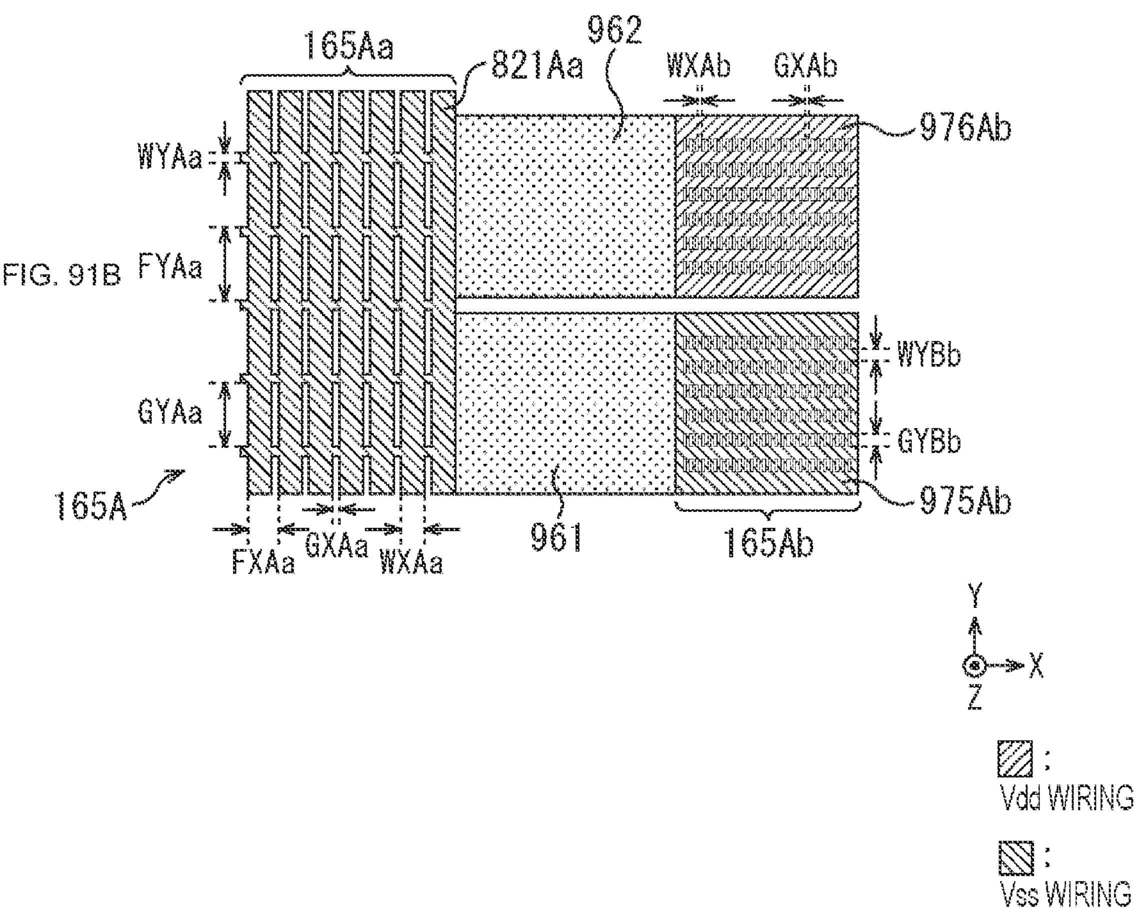

Alternatively, as in a reticulated conductor 975Ab and a reticulated conductor 976Ab of the lead-out conductor portion 165Ab of the conductor layer A illustrated in FIG. 91B, the conductor width WXAb or the gap width GXAb in the X direction may be made smaller than the reticulated conductor 953Bb or the reticulated conductor 954Bb of the lead-out conductor portion 165B of the conductor layer B in FIG. 90B. Moreover, a light-shielding structure may be formed using the reticulated conductor 975Ab of the conductor layer A in FIG. 91B and the reticulated conductor 953Bb of the conductor layer B in FIG. 90B, and a light-shielding structure may be formed using the reticulated conductor 976Ab of the conductor layer A in FIG. 91B and the reticulated conductor 954Bb of the conductor layer B in FIG. 90B. In addition, although not illustrated, the conductor width WYAb or the gap width GYAb in the Y direction of the lead-out conductor portion 165Ab of the conductor layer A may be made smaller than the reticulated conductor 953Bb or the reticulated conductor 954Bb of the lead-out conductor portion 165B of the conductor layer B, and the conductor width WXAb or the gap width GXAb in the X direction, or the conductor width WYAb or the gap width GYAb in the Y direction, of the lead-out conductor portion 165Ab of the conductor layer A, may be made larger than the reticulated conductor 953Bb or the reticulated conductor 954Bb of the lead-out conductor portion 165B of the conductor layer B.

FIGS. 91A and 91B illustrate other configuration examples of the conductor layer A in the twenty-eighth configuration example in FIGS. 90A, 90B, and 90C.

Summary of Fourteenth to Twenty-eighth Configuration Examples

In the fourteenth to twenty-eighth configuration examples illustrated in FIGS. 65A, 65B, 65C, 66A, 66B, 66C, 67A, 67B, 67C, 68A, 68B, 68C, 69A, 69B, 69C, 70A, 70B, 70C, 71A, 71B, 71C, 72A, 72B, 72C, 73A, 73B, 73C, 74A, 74B, 74C, 75A, 75B, 75C, 76A, 76B, 76C, 77A, 77B, 77C, 78A, 78B, 78C, 79A, 79B, 79C, 80A, 80B, 80C, 81A, 81B, 81C, 82A, 82B, 82C, 83A, 83B, 83C, 84A, 84B, 84C, 85A, 85B, 85C, 86A, 86B, 86C, 87A, 87B, 87C, 88A, 88B, 88C, 89A, 89B, 89C, 90A, 90B, and 90C, the repeating patterns of the main conductor portion 165*a* and the lead-out conductor portion 165*b* are different patterns (shapes) both in the conductor layer A and the conductor layer B.

The conductor layer A (first conductor layer) includes the main conductor portion 165Aa (first conductor portion) including a conductor having a shape in which a planar, linear, or reticulated repeating pattern (first basic pattern) is repeatedly arranged on the same plane in the X direction or the Y direction, and the lead-out conductor portion 165Ab (fourth conductor portion) including a conductor having a shape in which a planar, linear, or reticulated repeating pattern (fourth basic pattern) is repeatedly arranged on the same plane in the X direction or the Y direction. Here, the repeating pattern of the conductor of the main conductor portion 165Aa and the repeating pattern of the conductor of the lead-out conductor portion 165Ab have different shapes, and a conductor having a pattern different from the above repeating patterns may be present between the conductor of the main conductor portion 165Aa and the conductor of the lead-out conductor portion 165Ab.

The conductor layer B (second conductor layer) includes the main conductor portion 165Ba (second conductor portion) including a conductor having a shape in which a planar, linear, or reticulated repeating pattern (second basic pattern) is repeatedly arranged on the same plane in the X direction or the Y direction, and the lead-out conductor portion 165Bb (third conductor portion) including a conductor having a shape in which the planar, linear, or reticulated repeating pattern (third basic pattern) is repeatedly arranged on the same plane in the X direction or the Y direction. Here, the repeating pattern of the conductor of the main conductor portion 165Ba and the repeating pattern of the conductor of the lead-out conductor portion 165Bb have different shapes, and a conductor having a pattern different from the above repeating patterns may be present between the conductor of the main conductor portion 165Ba and the conductor of the lead-out conductor portion 165Bb.

In each of the above configuration examples, the conductor described as the wiring (Vss wiring) connected to the GND or the negative power supply, for example, may be the wiring (Vdd wiring) connected to the positive power supply, for example. The conductor described as the wiring (Vdd wiring) connected to the positive power supply, for example, may be the wiring (Vss wiring) connected to the GND or the negative power supply, for example.

In each of the above-described configuration examples, the total length LAa in the Y direction of the conductor of the main conductor portion 165Aa has been longer than the total length LAb in the Y direction of the conductor of the lead-out conductor portion 165Ab. However, the total length LAa and the total length LAb may be the same or substantially the same, or the total length LAa may be shorter than the total length LAb.

Similarly, the total length LBa in the Y direction of the main conductor portion 165Ba has been longer than the total length LBb in the Y direction of the lead-out conductor portion 165Bb. However, the total length LBa and the total length LBb may be the same or substantially the same, or the total length LBa may be shorter than the total length LBb.

In each of the above-described configuration examples, as an example of the repeating patterns of the main conductor portion 165Aa and the main conductor portion 165Ba, a repeating pattern example in which the current easily flows in the X direction may be adopted for the configuration example using the repeating pattern in which the current easily flows in the Y direction than in the X direction, and on the contrary, a repeating pattern example in which the current easily flows in the Y direction may be adopted for the configuration example using the repeating pattern in which the current easily flows in the X direction than in the Y direction. Furthermore, a repeating pattern example in which the current easily flows in the X direction and Y direction to the same extent.

In each of the above-described configuration examples, the conductor patterns of the main conductor portion 165Aa of the conductor layer A (wiring layer 165A) and the main conductor portion 165Ba of the conductor layer B (wiring layer 165B) may be any of the patterns described in the first to thirteenth configuration examples. Note that some of the above-described configuration examples have been described using the example in which all the conductor periods, conductor widths, and gap widths are uniform. However, this is not the case. For example, the conductor period, the conductor width, and the gap width may be non-uniform, or the conductor period, the conductor width, and the gap width may be modulated depending on a position. Furthermore, some of the above-described configuration examples have been described using the example in which the conductor periods, conductor widths, gap widths, wiring shapes, wiring positions, the numbers of wirings, and the like are substantially the same in the Vdd wiring and the Vss wiring. However, this is not the case. For example, the Vdd wiring and the Vss wiring may have different conductor periods, different conductor widths, different gap widths, different wiring shapes, or different wiring positions. The wiring position may be shifted or misaligned, and the number of wirings may be different.

10. Connection Configuration Example with Pads

Next, the relationship between the conductor layers A and B and the pads will be described with reference to FIGS. 92A, 92B, 93A, 93B, 93C, 94A, 94B, 94C, 95A, 95B, 95A, 95C, 96A, 96B, 96C, 97A, 97B, 97C, 98A, 98B, 98A, 98C, 99A, 99B, 99C, 100A, 100B, 100C, 101A, 101B, 101C, 102A, 102B, 102C, 103A, 103B, 103C, 104A, 104B. 104C, 105A, 105B, 105C, 106A, 106B, 106C, 107A, 107B, 107C, 108A, 108B, and 108C.

Figure 92A:
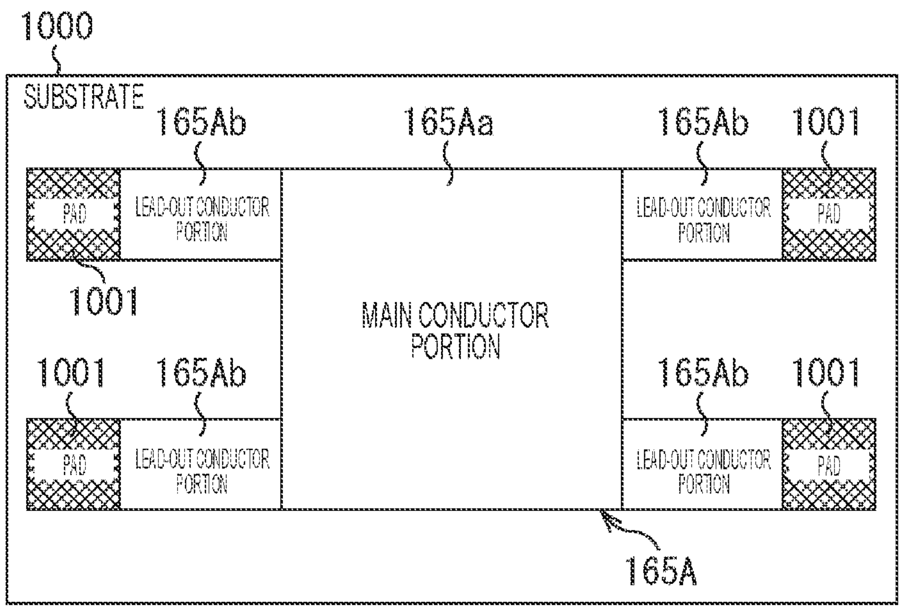
FIGS. 92A and 92B are plan views illustrating the entire conductor layer A formed on the substrate.
Figure 92B:
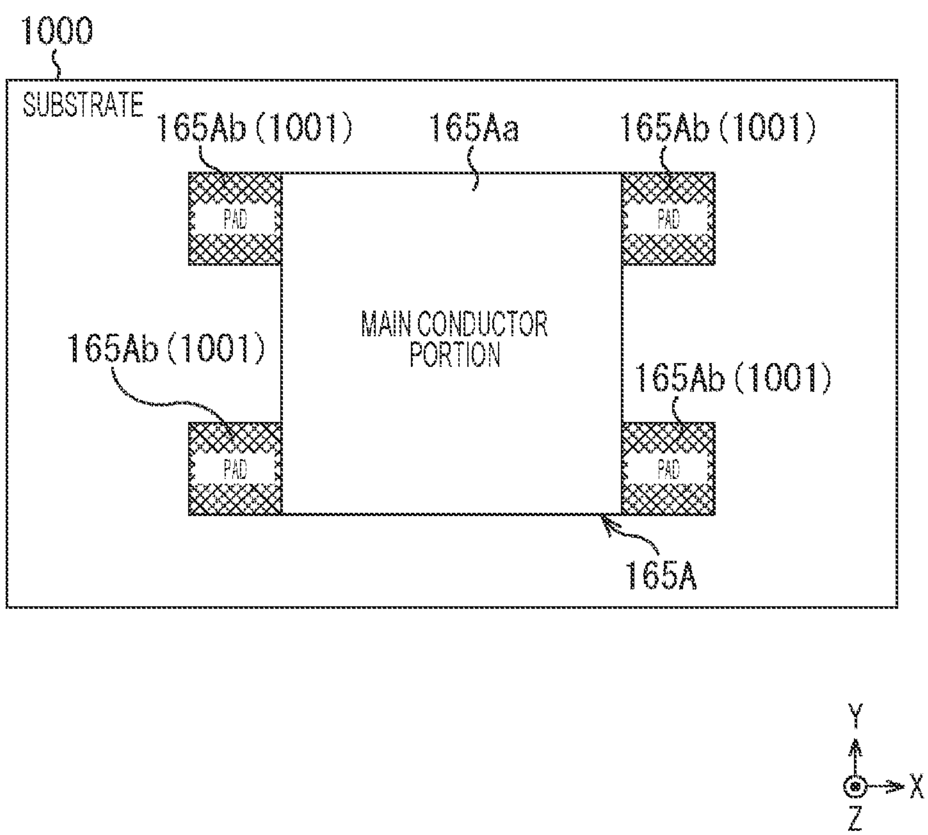

FIGS. 92A and 92B are plan views illustrating the entire conductor layer A formed on the substrate.

As described above, the conductor layer A (wiring layer 165A) includes the main conductor portion 165Aa and the lead-out conductor portion 165Ab.

In a case where the pads are separately provided from the conductor layer A, the lead-out conductor portion 165Ab is provided at a position close to a pad 1001, and connects the main conductor portion 165Aa and the pad 1001, as illustrated in FIG. 92A. Meanwhile, there are some cases where the lead-out conductor portion 165Ab configures the pad 1001, as illustrated in FIG. 92B.

The main conductor portion 165Aa is formed in a main region of a substrate 1000, for example, a central region of the substrate, with an area larger than the lead-out conductor portion 165Ab, and shields the active elements such as MOMS transistors and diodes formed in a region of the main conductor portion 165Aa or in another layer in the Z direction perpendicular to a plane of the region.

Note that FIGS. 92A and 92B illustrate an example of the arrangement and shape of the conductor layer A, and the arrangement and shape of the conductor layer A are not limited to this example. Therefore, the positions and areas in the substrate 1000 on which the main conductor portion 165Aa, the lead-out conductor portion 165Ab, and the pad 1001 are formed are arbitrary, and the active elements may not be formed in a region of the main conductor portion 165Aa or the lead-out conductor portion 165Ab or in another layer in the Z direction perpendicular to the plane of the region. The lead-out conductor portion 165Ab may not be provided at the position near the pad 1001. Furthermore, the arrangement of the lead-out conductor portion 165Ab and the pad 1001 with respect to the main conductor portion 165Aa may be sides on the Y direction side or may be both sides on the X direction side and the Y direction side, instead of the sides on the X direction side, of the four sides of the main conductor portion 165Aa as in FIGS. 92A and 92B. Moreover, the number of pads 1001 may be one or three or more instead of two on each side as in FIGS. 92A and 92B.

FIGS. 92A and 92B illustrate examples of the conductor layer A (wiring layer 165A). However, the same applies to the conductor layer B (wiring layer 165B).

With such a configuration, any of effects of satisfying the wiring layout restrictions, further improving the degree of freedom in designing the wiring layout, further improving the inductive noise, further improving the voltage drop, or the like can be exhibited.

In FIGS. 92A and 92B, for example, whether the pad 1001 is an electrode (Vdd electrode) connected to the positive power supply or an electrode (Vss electrode) connected to the GND or the negative power supply has not been particularly distinguished. However, the arrangement of the pad 1001 when distinguished will be described below.

Fourth Arrangement Example of Pads

Figures 93A, 93B, 93C:
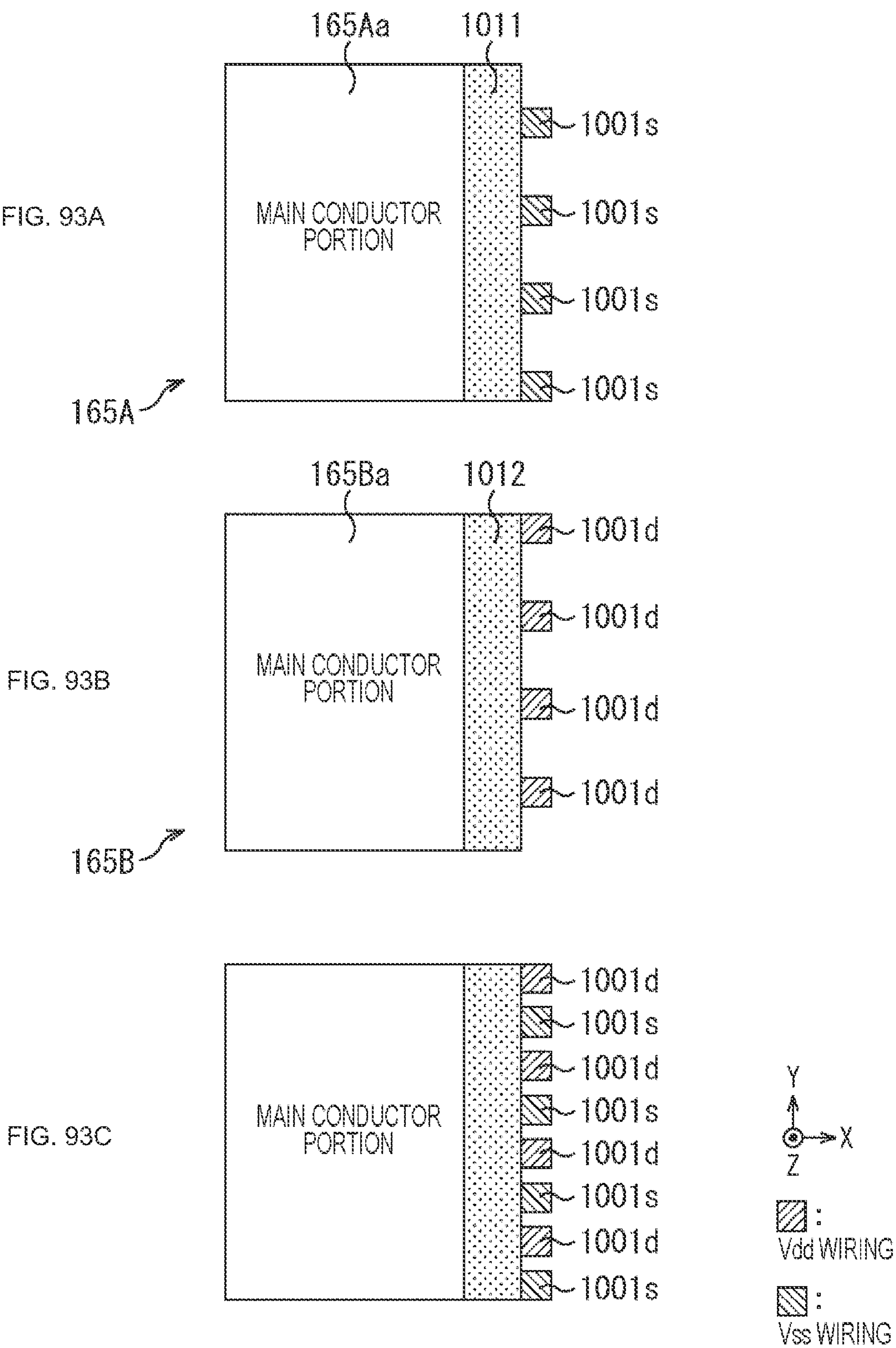
FIGS. 93A, 93B, and 93C plan views illustrating a fourth arrangement example of pads.

FIGS. 93A, 93B, and 93C illustrate a fourth arrangement example of pads.

FIG. 93A is a plan view illustrating an arrangement example of the conductor layer A (wiring layer 165A) and pads 1001*s* connected to the conductor layer A.

FIG. 93B is a plan view illustrating an arrangement example of the conductor layer B (wiring layer 165B) and pads 1001*d* connected to the conductor layer B.

FIG. 93C is a plan view of a state in which the conductor layers A and B and the pads 1001*s* and 1001*d* respectively illustrated in FIGS. 93A and 93B are stacked.

In FIGS. 93A, 93B, and 93C, the pad 1001*s* represents, for example, the pad 1001 to which GND or a negative power supply (Vss) is supplied, and the pad 1001*d* represents, for example, the pad 1001 to which a positive power supply (Vdd) is supplied.

As illustrated in FIG. 93A, a plurality of the pads 1001*s* is connected to a predetermined side of the rectangular main conductor portion 165Aa at predetermined intervals via a conductor 1011 having a shape optionally including a predetermined repeating pattern. Each pad 1001*s* may be configured by the lead-out conductor portion 165Ab, as in the twenty-seventh configuration example illustrated in FIGS. 89A 89B, and 89C, for example, or the conductor 1011 may be configured by the lead-out conductor portion 165Ab. Furthermore, in the case where the pad 1001*s* is the lead-out conductor portion 165Ab, the conductor 1011 may be omitted or may be present.

As illustrated in FIG. 93B a plurality of the pads 1001*d* is connected to a predetermined side of the rectangular main conductor portion 165B and to the same side as the side where the pads 1001*s* are arranged in the conductor layer A at predetermined intervals via the conductor 1012 having a shape optionally including a predetermined repeating pattern. Each pad 1001*d* may be configured by the lead-out conductor portion 165Bb, as in the twenty-seventh configuration example illustrated in FIGS. 89A, 89B, and 89C, for example, or the conductor 1012 may be configured by the lead-out conductor portion 165Bb. Furthermore, in the case where the pad 1001*d* is the lead-out conductor portion 165Bb, the conductor 1012 may be omitted or may be present.

As illustrated in FIG. 93C, in the state where the conductor layers A and B are stacked, the arrangement of the pads 1001*s* and the pads 1001*d* is an alternate arrangement in which the pad 1001*s* and the pad 1001*d* are alternately arranged in the Y direction. In this case, as described with reference to FIGS. 42A 42B, 42C, 42D, 42E, 43A, 43B, 43C, 43D, 44A, 44B, 44C, 44D, and 44E, the magnetic field generated from each of the conductor layers A and B and the induced electromotive force based on the magnetic field can be effectively canceled, so that the inductive noise can be further improved. However, since the arrangement is not symmetrically arranged in the Y direction, in a case where the pads 1001 are arranged over a wide area, that is, in a case where the main conductor portion 165Aa or 165Ba, the lead-out conductor portion 165Ab or 165Bb, or the conductor 1011 or 1012 is longer in the arrangement direction of the pads 1001 (in FIGS. 93A, 93B, and 93C, the Y direction is longer than the X direction), there may be a magnetic field that cannot be canceled, and the induced electromotive force increases as the Victim conductor loop becomes larger and is accumulated, and the inductive noise may deteriorate.

Fifth Arrangement Example of Pads

Figure 94A:
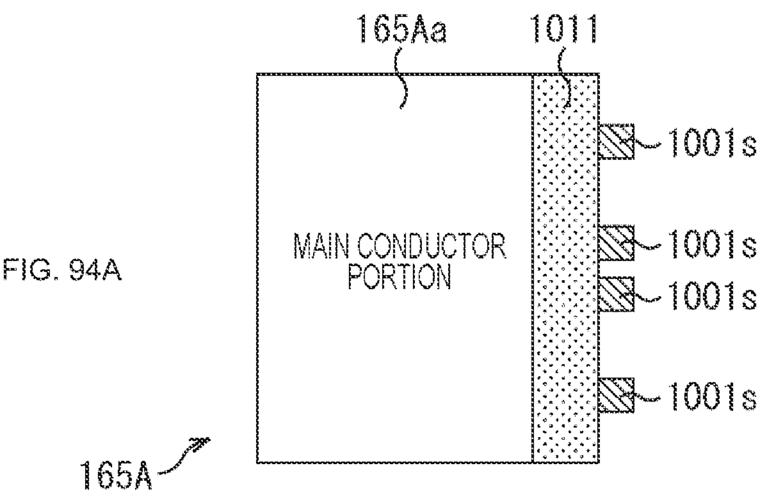
FIGS. 94A, 94B, and 94C are plan views illustrating a fifth arrangement example of pads.
Figure 94B:
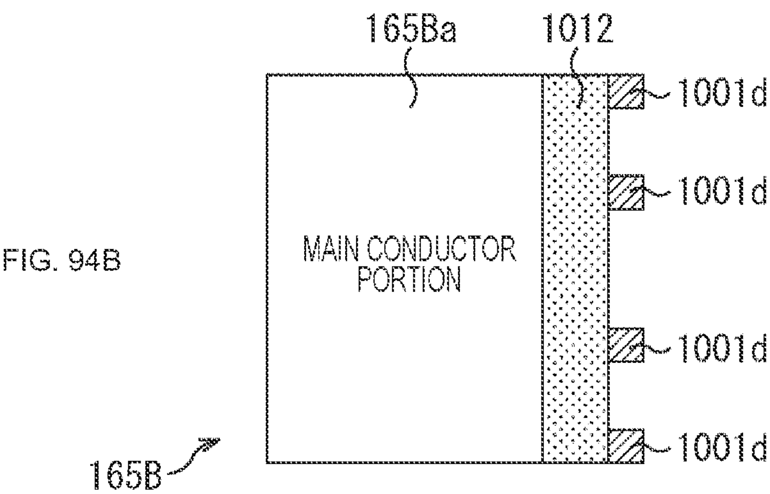
Figure 94C:
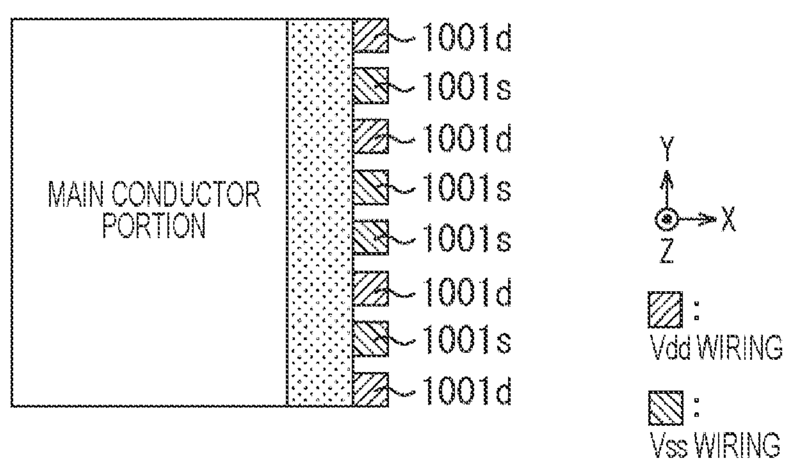

FIGS. 94A, 94B, and 94C illustrate a fifth arrangement example of pads.

FIG. 94A is a plan view illustrating an arrangement example of the conductor layer A (wiring layer 165A) and the pads 1001*s* connected to the conductor layer A.

FIG. 94B is a plan view illustrating an arrangement example of the conductor layer B (wiring layer 165B) and the pads 1001*d* connected to the conductor layer B.

FIG. 94C is a plan view of a state in which the conductor layers A and B and the pads 1001*s* and 1001*d* respectively illustrated in FIGS. 94A and 94B are stacked.

In FIGS. 94A, 94B, and 94C, the pad 1001*s* represents, for example, the pad 1001 to which GND or a negative power supply is supplied, and the pad 1001*d* represents, for example, the pad 1001 to which a positive power supply is supplied.

As illustrated in FIG. 94, a plurality of the pads 1001*s* is connected to a predetermined side of the rectangular main conductor portion 165Aa at predetermined intervals via the conductor 1011 having a shape optionally including a predetermined repeating pattern. Each pad 1001*s* may be configured by the lead-out conductor portion 165Ab or the conductor 1011 may be configured by the lead-out conductor portion 165Ab. Furthermore, in the case where the pad 1001*s* is the lead-out conductor portion 165Ab, the conductor 1011 may be omitted or may be present.

As illustrated in FIG. 94B a plurality of the pads 1001*d* is connected to a predetermined side of the rectangular main conductor portion 165B and to the same side as the side where the pads 1001*s* are arranged in the conductor layer A at predetermined intervals via the conductor 1012 having a shape optionally including a predetermined repeating pattern. Each pad 1001*d* may be configured by the lead-out conductor portion 165B or the conductor 1012 may be configured by the lead-out conductor portion 165Bb. Furthermore, in the case where the pad 1001*d* is the lead-out conductor portion 165Bb, the conductor 1012 may be omitted or may be present.

As illustrated in FIG. 94C, in the state where the conductor layers A and B are stacked, the arrangement of the pads 1001*s* and 1001*d* is a mirror-symmetrical arrangement in which a set of pads 1001 is folded back in the Y direction and sequentially arranged, where four consecutive pads 1001*s* and 1001*d* in the Y direction are set as one set. In this case, as compared with the alternate arrangement illustrated in FIGS. 93A, 93B, and 93C, the magnetic field generated from each of the conductor layers A and B and the induced electromotive force based on the magnetic field can be more effectively canceled, so that the inductive noise can be further improved depending on the layout other than the pads.

Sixth Arrangement Example of Pads

Figure 95A:
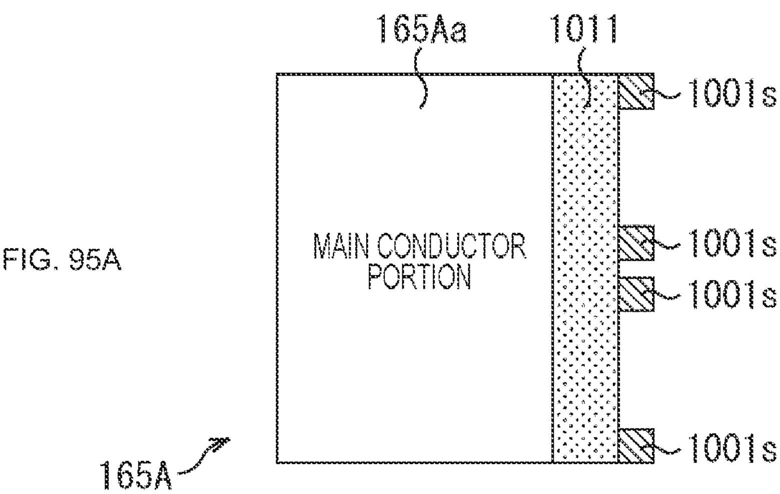
FIGS. 95A, 95B, and 95C are plan views illustrating a sixth arrangement example of pads.
Figure 95B:
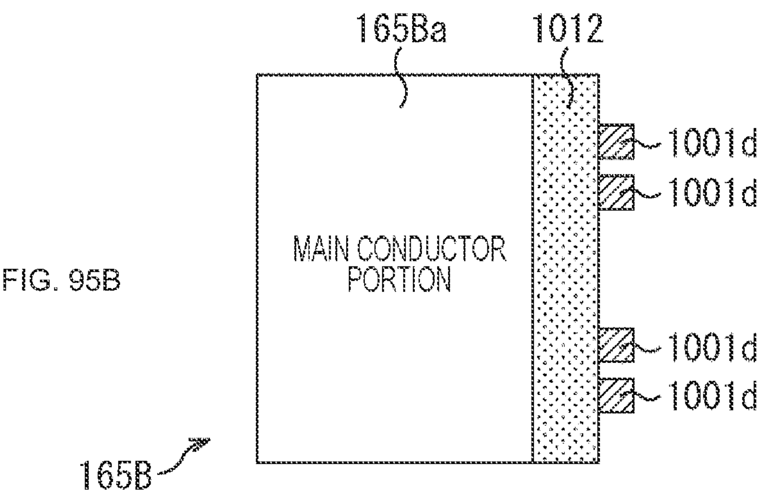
Figure 95C:
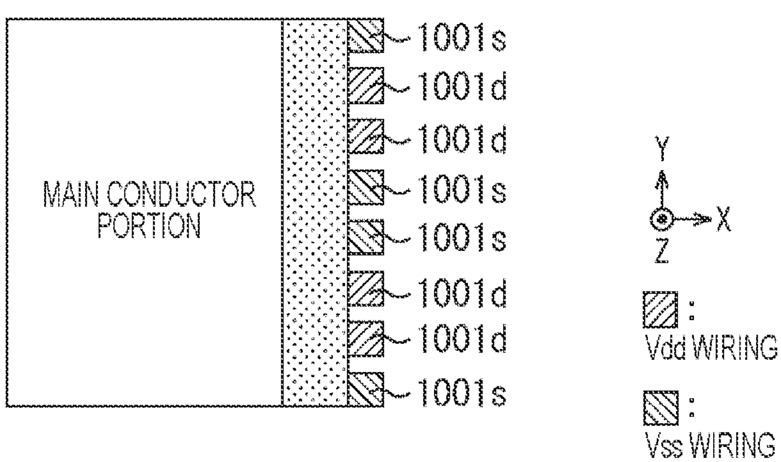

FIGS. 95A, 95B, and 95C illustrate a sixth arrangement example of pads.

FIG. 95A is a plan view illustrating an arrangement example of the conductor layer A (wiring layer 165A) and the pads 1001*s* connected to the conductor layer A.

FIG. 95B is a plan view illustrating an arrangement example of the conductor layer B (wiring layer 165B) and the pads 1001*d* connected to the conductor layer B.

FIG. 95C is a plan view of a state in which the conductor layers A and B and the pads 1001*s* and 1001*d* respectively illustrated in FIGS. 95A and 9B are stacked.

In FIGS. 95A, 95B, and 95C, the pad 1001*s* represents, for example, the pad 1001 to which GND or a negative power supply is supplied, and the pad 1001*d* represents, for example, the pad 1001 to which a positive power supply is supplied.

As illustrated in FIG. 95A, a plurality of the pads 1001*s* is connected to a predetermined side of the rectangular main conductor portion 165Aa at predetermined intervals via the conductor 1011 having a shape optionally including a predetermined repeating pattern. Each pad 1001*s* may be configured by the lead-out conductor portion 165Ab or the conductor 1011 may be configured by the lead-out conductor portion 165Ab. Furthermore, in the case where the pad 1001*s* is the lead-out conductor portion 165Ab, the conductor 1011 may be omitted or may be present.

As illustrated in FIG. 95B a plurality of the pads 1001*d* is connected to a predetermined side of the rectangular main conductor portion 165B and to the same side as the side where the pads 1001*s* are arranged in the conductor layer A at predetermined intervals via the conductor 1012 having a shape optionally including a predetermined repeating pattern. Each pad 1001*d* may be configured by the lead-out conductor portion 165B or the conductor 1012 may be configured by the lead-out conductor portion 165Bb. Furthermore, in the case where the pad 1001*d* is the lead-out conductor portion 165Bb, the conductor 1012 may be omitted or may be present.

As illustrated in FIG. 95C, in the state where the conductor layers A and B are stacked, the arrangement of the pads 1001*s* and 1001*d* is a mirror-symmetrical arrangement in which a set of pads 1001 is folded back in the Y direction and sequentially arranged, where four consecutive pads 1001*s* and 1001*d* in the Y direction are set as one set. Moreover, the four pads 1001*s* and pads 1001*d* that constitute one set also have a mirror-symmetrical arrangement in which two of the four pads 1001 are folded back in the Y direction with reference to a center line in the Y direction. In the case of adopting such a two-stage configuration with a mirror arrangement, a range in which a residual magnetic field is accumulated is narrower than that of a one-stage mirror arrangement illustrated in FIGS. 94A, 94B, and 94C, the induced electromotive force is more effectively canceled, and the inductive noise can be further improved depending on the layout other than the pads.

Seventh Arrangement Example of Pads

Figures 96A, 96B, 96C:
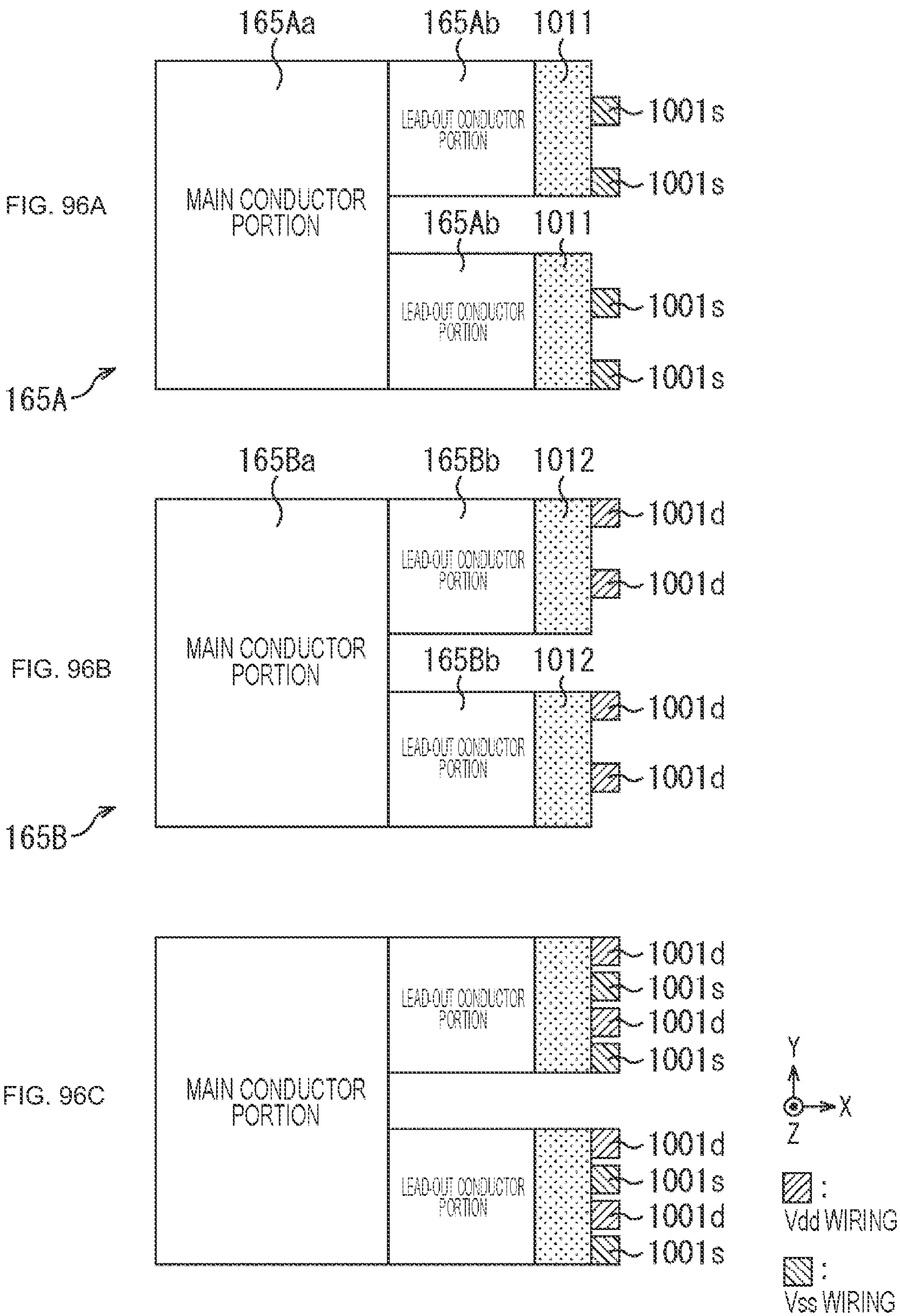
FIGS. 96A, 96B, and 96C are plan views illustrating a seventh arrangement example of pads.

FIGS. 96A, 96B, and 96C illustrate a seventh arrangement example of pads.

FIG. 96A is a plan view illustrating an arrangement example of the conductor layer A (wiring layer 165A) and the pads 1001*s* connected to the conductor layer A.

FIG. 96B is a plan view illustrating an arrangement example of the conductor layer B (wiring layer 165B) and the pads 1001*d* connected to the conductor layer B.

FIG. 96C is a plan view of a state in which the conductor layers A and B and the pads 1001*s* and 1001*d* respectively illustrated in FIGS. 96A and 9B are stacked.

In FIGS. 96A, 96B, and 96C, the pad 1001*s* represents, for example, the pad 1001 to which GND or a negative power supply is supplied, and the pad 1001*d* represents, for example, the pad 1001 to which a positive power supply is supplied.

As illustrated in FIG. 96A, a plurality of the lead-out conductor portions 165Ab is connected to a predetermined side of the rectangular main conductor portion 165Aa, and a plurality of the pads 1001*s* is connected to an outer peripheral portion of each of the lead-out conductor portions 165Ab at predetermined intervals via the conductor 1011 having a shape optionally including a predetermined repeating pattern. The conductor 1011 may be omitted or may be present. Furthermore, the conductor may be located between the main conductor portion 165Aa and the lead-out conductor portion 165Ab.

As illustrated in FIG. 96B, a plurality of the lead-out conductor portions 65B is connected to a predetermined side of the rectangular main conductor portion 165Ba, and a plurality of the pads 1001*d* is connected to the outer peripheral portion of each of the lead-out conductor portions 165B at predetermined intervals via the conductor 1012 having a shape optionally including a predetermined repeating pattern. The conductor 1012 may be omitted or may be present. Furthermore, the conductor may be located between the main conductor portion 165B and the lead-out conductor portion 165Bb.

As illustrated in FIG. 96C, in the state where the conductor layers A and B are stacked, the arrangement of the pads 1001*s* and the pads 1001*d* is an alternate arrangement in which the pad 1001*s* and the pad 1001*d* are alternately arranged in the Y direction. In this case, the magnetic field generated from each of the conductor layers A and B and the induced electromotive force based on the magnetic field can be effectively canceled, so that the inductive noise can be further improved. However, since the arrangement is not symmetrically arranged in the Y direction, in a case where the pads 1001 are arranged over a wide area, that is, in a case where the main conductor portion 165Aa or 165Ba, the lead-out conductor portion 165Ab or 165Bb, or the conductor 1011 or 1012 is longer in the arrangement direction of the pads (in FIGS. 96A, 96B, and 96C, the Y direction is longer than the X direction), there may be a magnetic field that cannot be canceled, and the induced electromotive force increases as the Victim conductor loop becomes larger and is accumulated, and the inductive noise may deteriorate.

Eighth Arrangement Example of Pads

Figure 97A:
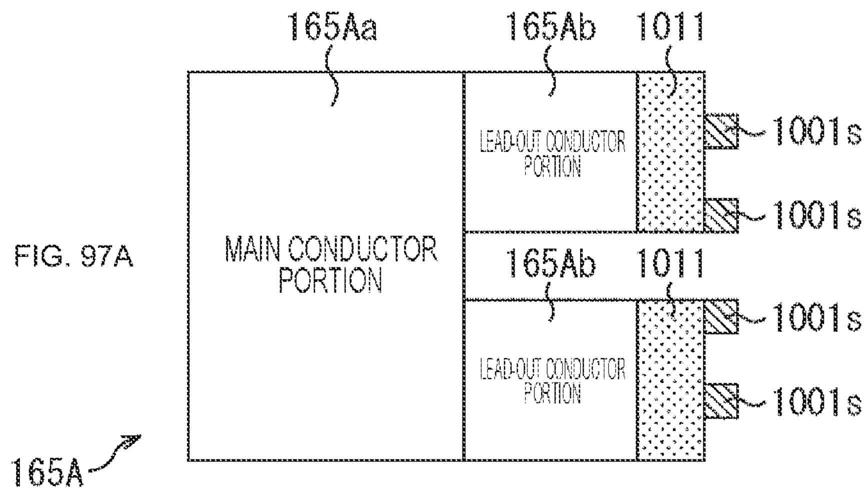
FIGS. 97A, 97B, and 97C are plan views illustrating an eighth arrangement example of pads.
Figure 97B:
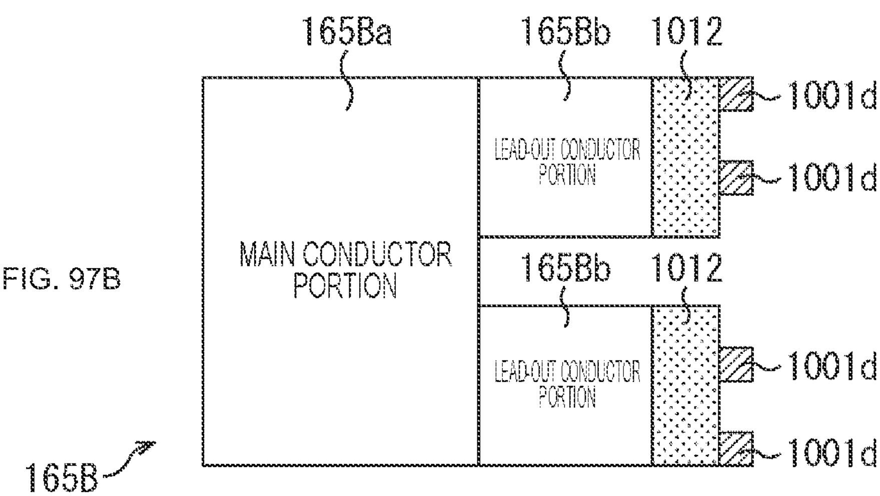
Figure 97C:
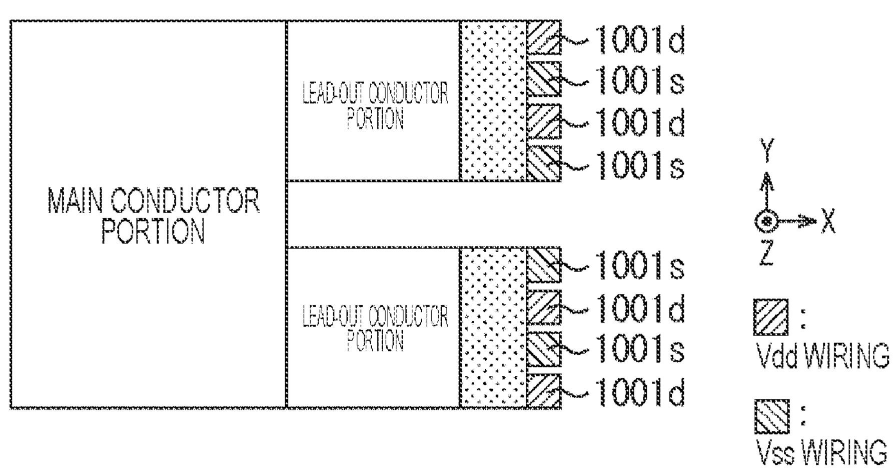

FIGS. 97A, 97B, and 97C illustrate an eighth arrangement example of pads.

FIG. 97A is a plan view illustrating an arrangement example of the conductor layer A (wiring layer 165A) and the pads 1001*s* connected to the conductor layer A.

FIG. 97B is a plan view illustrating an arrangement example of the conductor layer B (wiring layer 165B) and the pads 1001*d* connected to the conductor layer B.

FIG. 97C is a plan view of a state in which the conductor layers A and B and the pads 1001*s* and 1001*d* respectively illustrated in FIGS. 97A and 97B are stacked.

In FIGS. 97A, 97B, and 97C, the pad 1001*s* represents, for example, the pad 1001 to which GND or a negative power supply is supplied, and the pad 1001*d* represents, for example, the pad 1001 to which a positive power supply is supplied.

As illustrated in FIG. 97A, a plurality of the lead-out conductor portions 165Ab is connected to a predetermined side of the rectangular main conductor portion 165Aa, and a plurality of the pads 1001*s* is connected to the outer peripheral portion of each of the lead-out conductor portions 165Ab at predetermined intervals via the conductor 1011 having a shape optionally including a predetermined repeating pattern. The conductor 1011 may be omitted or may be present. Furthermore, the conductor may be located between the main conductor portion 165Aa and the lead-out conductor portion 165Ab.

As illustrated in FIG. 97B, a plurality of the lead-out conductor portions 65B is connected to a predetermined side of the rectangular main conductor portion 165Ba, and a plurality of the pads 1001*d* is connected to the outer peripheral portion of each of the lead-out conductor portions 165B at predetermined intervals via the conductor 1012 having a shape optionally including a predetermined repeating pattern. The conductor 1012 may be omitted or may be present. Furthermore, the conductor may be located between the main conductor portion 165B and the lead-out conductor portion 165Bb.

As illustrated in FIG. 97C, in the state where the conductor layers A and B are stacked, the arrangement of the pads 1001*s* and 1001*d* is a mirror-symmetrical arrangement in which a set of pads 1001 is folded back in the Y direction and sequentially arranged, where four consecutive pads 1001*s* and 1001*d* in the Y direction are set as one set. In this case, as compared with the alternate arrangement illustrated in FIGS. 96A, 96B, and 96C, the magnetic field generated from each of the conductor layers A and B and the induced electromotive force based on the magnetic field can be more effectively canceled, so that the inductive noise can be further improved depending on the layout other than the pads.

Ninth Arrangement Example of Pads

Figure 98A:
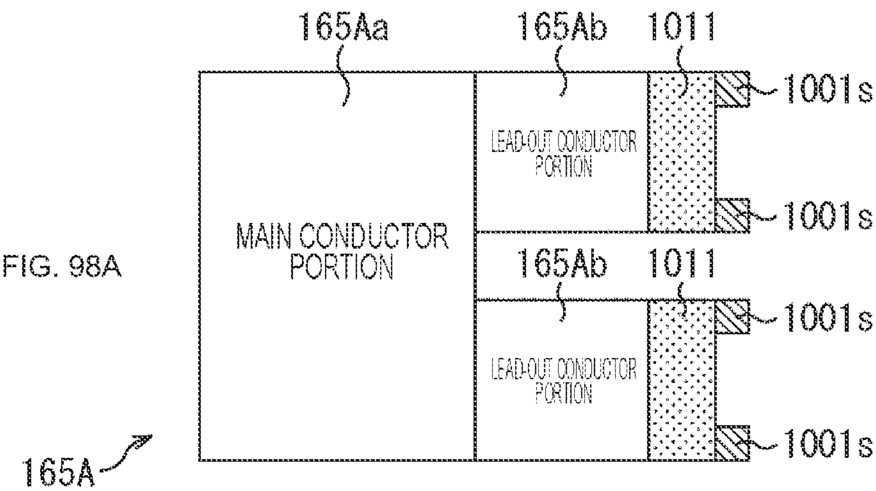
FIGS. 98A, 98B, and 98C are plan views illustrating a ninth arrangement example of pads.
Figure 98B:
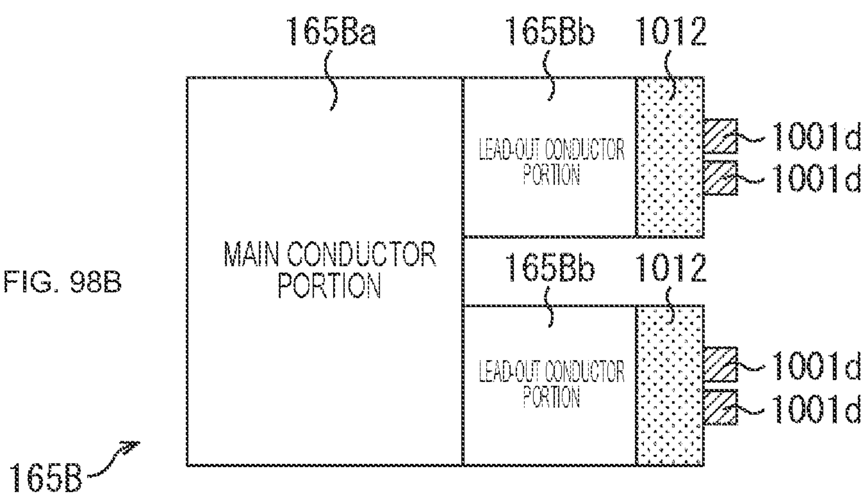
Figure 98C:
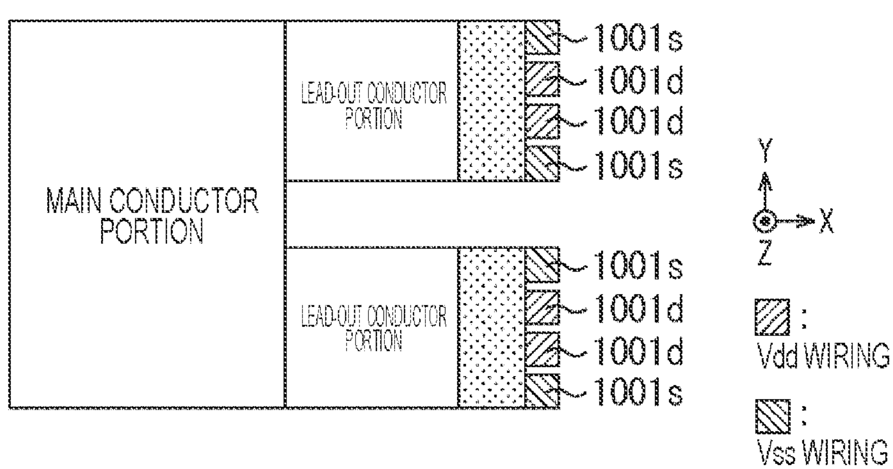

FIGS. 98A, 98B, and 98C illustrate a ninth arrangement example of pads.

FIG. 98A is a plan view illustrating an arrangement example of the conductor layer A (wiring layer 165A) and the pads 1001*s* connected to the conductor layer A.

FIG. 98B is a plan view illustrating an arrangement example of the conductor layer B (wiring layer 165B) and the pads 1001*d* connected to the conductor layer B.

FIG. 98C is a plan view of a state in which the conductor layers A and B and the pads 1001*s* and 1001*d* respectively illustrated in FIGS. 98A and 98B are stacked.

In FIGS. 98A, 98B, and 98C, the pad 1001*s* represents, for example, the pad 1001 to which GND or a negative power supply is supplied, and the pad 1001*d* represents, for example, the pad 1001 to which a positive power supply is supplied.

As illustrated in FIG. 98A, a plurality of the lead-out conductor portions 165Ab is connected to a predetermined side of the rectangular main conductor portion 165Aa, and a plurality of the pads 1001*s* is connected to the outer peripheral portion of each of the lead-out conductor portions 165Ab at predetermined intervals via the conductor 1011 having a shape optionally including a predetermined repeating pattern. The conductor 1011 may be omitted or may be present. Furthermore, the conductor may be located between the main conductor portion 165Aa and the lead-out conductor portion 165Ab.

As illustrated in FIG. 98B, a plurality of the lead-out conductor portions 65B is connected to a predetermined side of the rectangular main conductor portion 165Ba, and a plurality of the pads 1001*d* is connected to the outer peripheral portion of each of the lead-out conductor portions 165B at predetermined intervals via the conductor 1012 having a shape optionally including a predetermined repeating pattern. The conductor 1012 may be omitted or may be present. Furthermore, the conductor 1012 may be located between the main conductor portion 165B and the lead-out conductor portion 165Bb.

As illustrated in FIG. 98C, in the state where the conductor layers A and B are stacked, the arrangement of the pads 1001*s* and 1001*d* is a mirror-symmetrical arrangement in which a set of pads 1001 is folded back in the Y direction and sequentially arranged, where four consecutive pads 1001*s* and 1001*d* in the Y direction are set as one set. Moreover, the four pads 1001*s* and pads 1001*d* that constitute one set also have a mirror-symmetrical arrangement in which two of the four pads 1001 are folded back in the Y direction with reference to a center line in the Y direction. In the case of adopting such a two-stage configuration with a mirror arrangement, a range in which a residual magnetic field is accumulated is narrower than that of a one-stage mirror arrangement illustrated in FIGS. 97A, 97B, and 97C, the induced electromotive force is more effectively canceled, and the inductive noise can be further improved depending on the layout other than the pads.

Tenth Arrangement Example of Pads

Figure 99A:
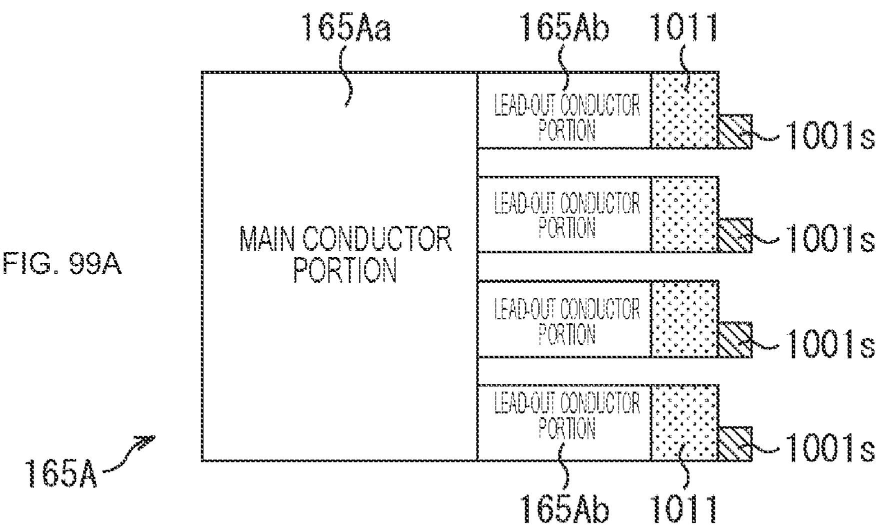
FIGS. 99A, 99B, and 99C are plan views illustrating a tenth arrangement example of pads.
Figure 99B:
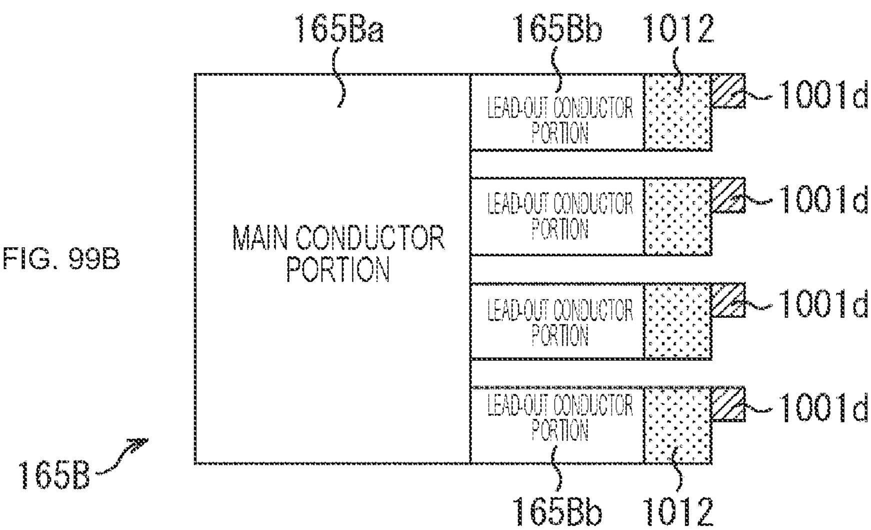
Figure 99C:
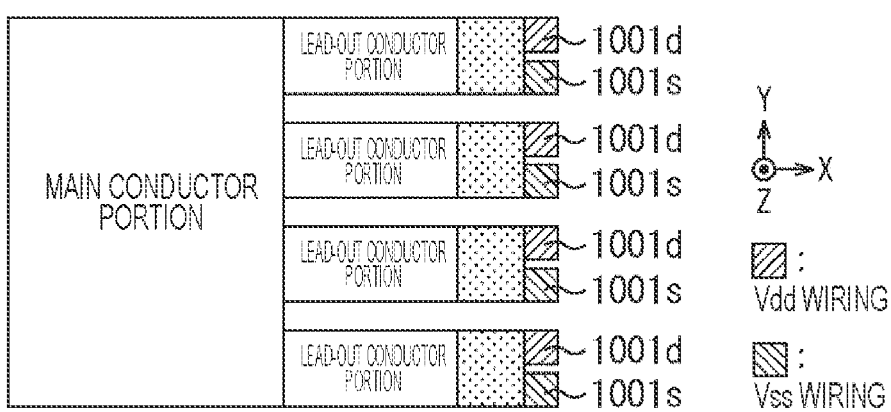

FIGS. 99A, 99B, and 99C illustrate a tenth arrangement example of pads.

FIG. 99A is a plan view illustrating an arrangement example of the conductor layer A (wiring layer 165A) and the pads 1001*s* connected to the conductor layer A.

FIG. 99B is a plan view illustrating an arrangement example of the conductor layer B (wiring layer 165B) and the pads 1001*d* connected to the conductor layer B.

FIG. 99C is a plan view of a state in which the conductor layers A and B and the pads 1001*s* and 1001*d* respectively illustrated in FIGS. 99A and 99B are stacked.

In FIGS. 99A, 99B, and 99C, the pad 1001*s* represents, for example, the pad 1001 to which GND or a negative power supply is supplied, and the pad 1001*d* represents, for example, the pad 1001 to which a positive power supply is supplied.

As illustrated in FIG. 99A, a plurality of the lead-out conductor portions 165Ab is connected to a predetermined side of the rectangular main conductor portion 165Aa, and one pad 1001*s* is connected to the outer peripheral portion of each of the lead-out conductor portions 165Ab via the conductor 1011 having a shape optionally including a predetermined repeating pattern. The conductor 1011 may be omitted or may be present. Furthermore, the conductor 1011 may be located between the main conductor portion 165Aa and the lead-out conductor portion 165Ab.

As illustrated in FIG. 99B, a plurality of the lead-out conductor portions 65B is connected to a predetermined side of the rectangular main conductor portion 165Ba, and one pad 1001*d* is connected to the outer peripheral portion of each of the lead-out conductor portions 165B via the conductor 1012 having a shape optionally including a predetermined repeating pattern. The conductor 1012 may be omitted or may be present. Furthermore, the conductor 1012 may be located between the main conductor portion 165B and the lead-out conductor portion 165Bb.

As illustrated in FIG. 99C, in the state where the conductor layers A and B are stacked, the arrangement of the pads 1001*s* and the pads 1001*d* is an alternate arrangement in which the pad 1001*s* and the pad 1001*d* are alternately arranged in the Y direction. In this case, the magnetic field generated from each of the conductor layers A and B and the induced electromotive force based on the magnetic field can be effectively canceled, so that the inductive noise can be further improved. However, since the arrangement is not symmetrically arranged in the Y direction, in a case where the pads 1001 are arranged over a wide area, that is, in a case where the main conductor portion 165Aa or 165Ba, the lead-out conductor portion 165Ab or 165Bb, or the conductor 1011 or 1012 is longer in the arrangement direction of the pads (in FIGS. 99A, 99B, and 99C, the Y direction is longer than the X direction), there may be a magnetic field that cannot be canceled, and the induced electromotive force increases as the Victim conductor loop becomes larger and is accumulated, and the inductive noise may deteriorate.

Eleventh Arrangement Example of Pads

Figure 100A:
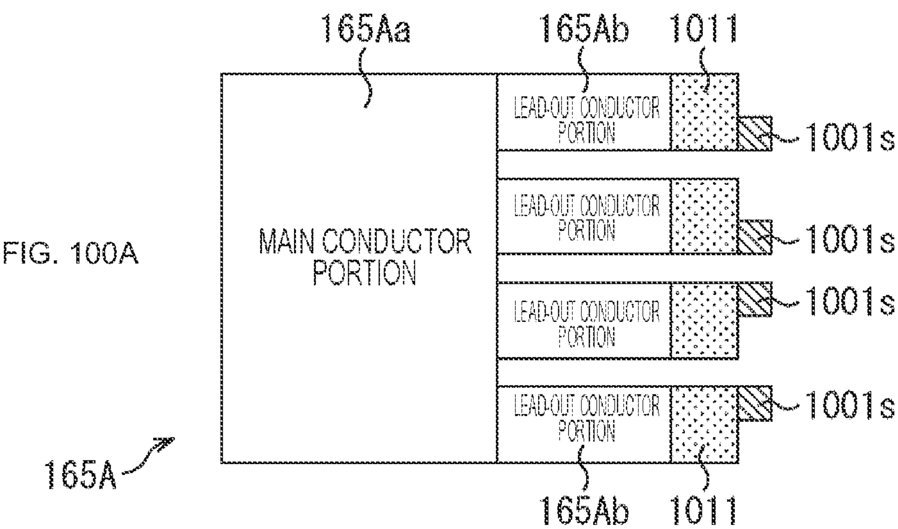
FIGS. 100A, 100B, and 100C are plan views illustrating an eleventh arrangement example of pads.
Figure 100B:
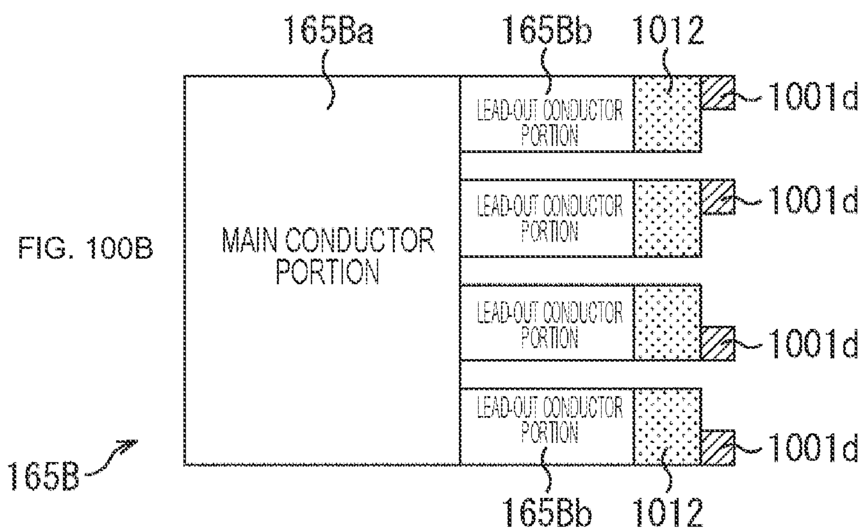
Figure 100C:
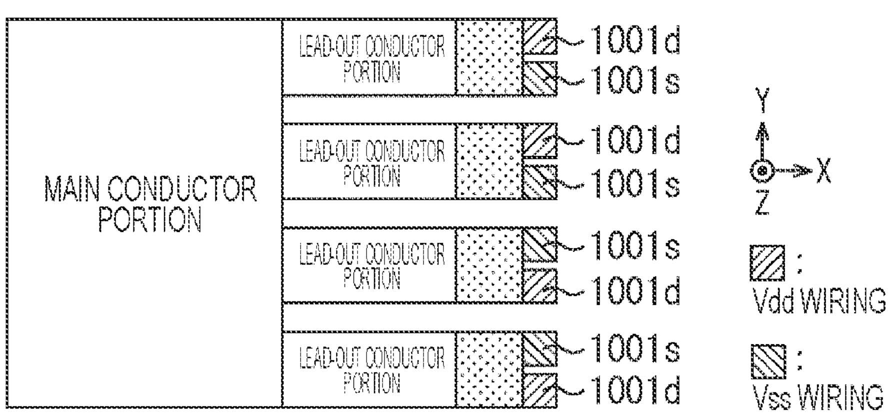

FIGS. 100A, 100B, and 100C illustrate an eleventh arrangement example of pads.

FIG. 100A is a plan view illustrating an arrangement example of the conductor layer A (wiring layer 165A) and the pads 1001*s* connected to the conductor layer A.

FIG. 100B is a plan view illustrating an arrangement example of the conductor layer B (wiring layer 165B) and the pads 1001*d* connected to the conductor layer B.

FIG. 100C is a plan view of a state in which the conductor layers A and B and the pads 1001*s* and 1001*d* respectively illustrated in FIGS. 100A and 100B are stacked.

In FIGS. 100A, 1008, and 100C, the pad 1001*s* represents, for example, the pad 1001 to which GND or a negative power supply is supplied, and the pad 1001*d* represents, for example, the pad 1001 to which a positive power supply is supplied.

As illustrated in in FIG. 100A, a plurality of the lead-out conductor portions 165Ab is connected to a predetermined side of the rectangular main conductor portion 165Aa, and one pad 1001*s* is connected to the outer peripheral portion of each of the lead-out conductor portions 165Ab via the conductor 1011 having a shape optionally including a predetermined repeating pattern. The conductor 1011 may be omitted or may be present. Furthermore, the conductor 1011 may be located between the main conductor portion 165Aa and the lead-out conductor portion 165Ab.

As illustrated in FIG. 100B a plurality of the lead-out conductor portions 165B is connected to a predetermined side of the rectangular main conductor portion 165Ba, and one pad 1001*d* is connected to the outer peripheral portion of each of the lead-out conductor portions 165B via the conductor 1012 having a shape optionally including a predetermined repeating pattern. The conductor 1012 may be omitted or may be present. Furthermore, the conductor 1012 may be located between the main conductor portion 165B and the lead-out conductor portion 165Bb.

As illustrated in FIG. 100C, in the state where the conductor layers A and B are stacked, the arrangement of the pads 1001*s* and 1001*d* is a mirror-symmetrical arrangement in which a set of pads 1001 is folded back in the Y direction and sequentially arranged, where four consecutive pads 1001*s* and 1001*d* in the Y direction are set as one set. In this case, as compared with the alternate arrangement illustrated in FIGS. 99A, 99B, and 99C, the magnetic field generated from each of the conductor layers A and B and the induced electromotive force based on the magnetic field can be more effectively canceled, so that the inductive noise can be further improved depending on the layout other than the pads.

Twelfth Arrangement Example of Pads

Figure 101A:
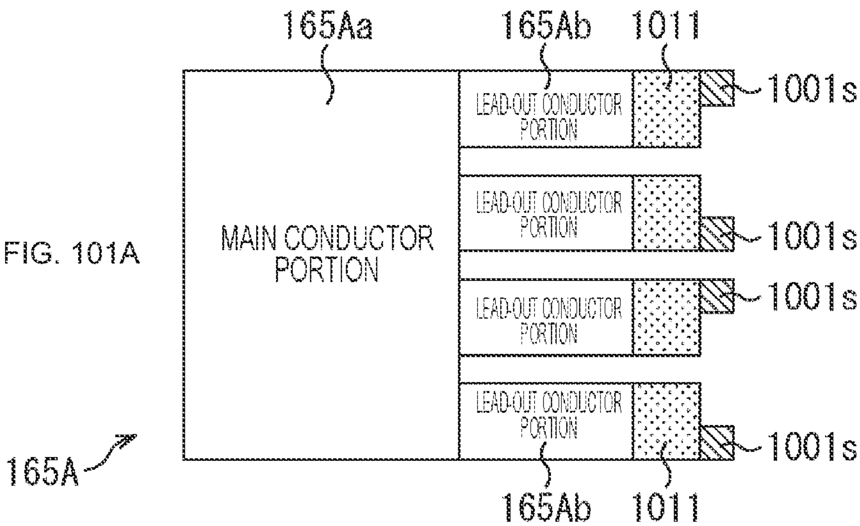
FIGS. 101A, 101B, and 101C plan views illustrating a twelfth arrangement example of pads.
Figure 101B:
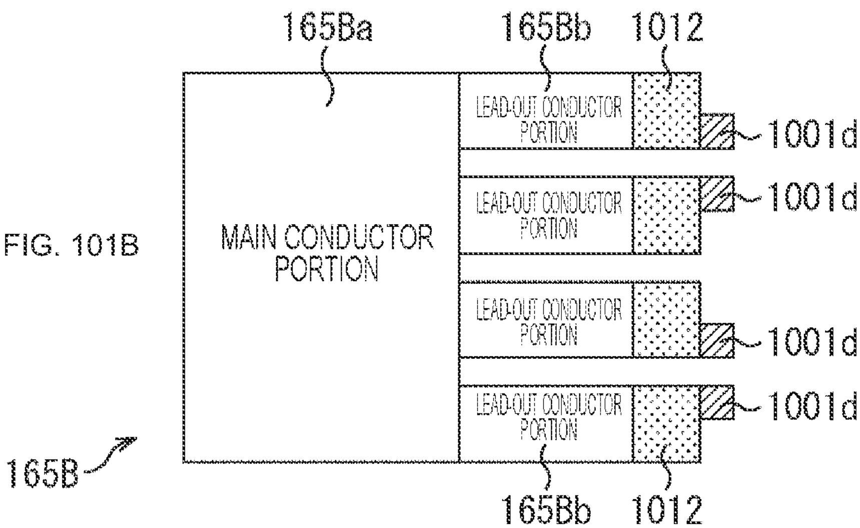
Figure 101C:
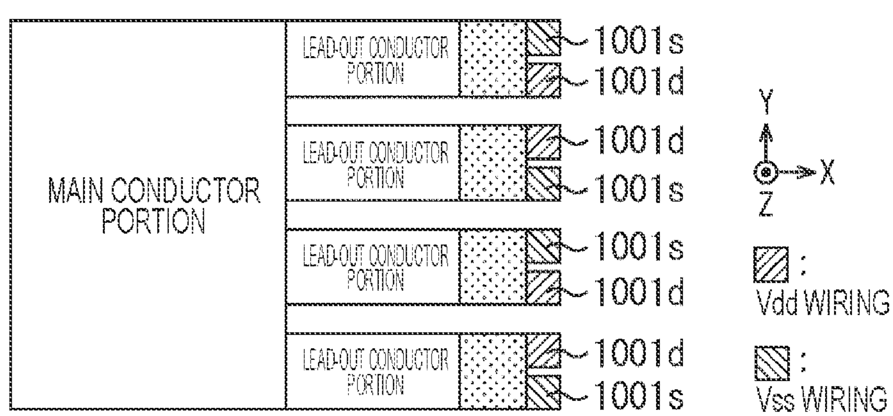

FIGS. 101A, 101B, and 101C illustrate a twelfth arrangement example of pads.

FIG. 101A is a plan view illustrating an arrangement example of the conductor layer A (wiring layer 165A) and the pads 1001*s* connected to the conductor layer A.

FIG. 101B is a plan view illustrating an arrangement example of the conductor layer B (wiring layer 165B) and the pads 1001*d* connected to the conductor layer B.

FIG. 101C is a plan view of a state in which the conductor layers A and B and the pads 1001*s* and 1001*d* respectively illustrated in FIGS. 101A and 101B are stacked.

In FIGS. 101A, 101B, and 101C, the pad 1001*s* represents, for example, the pad 1001 to which GND or a negative power supply is supplied, and the pad 1001*d* represents, for example, the pad 1001 to which a positive power supply is supplied.

As illustrated in FIG. 101, a plurality of the lead-out conductor portions 165Ab is connected to a predetermined side of the rectangular main conductor portion 165Aa, and one pad 1001*s* is connected to the outer peripheral portion of each of the lead-out conductor portions 165Ab via the conductor 1011 having a shape optionally including a predetermined repeating pattern. The conductor 1011 may be omitted or may be present. Furthermore, the conductor 1011 may be located between the main conductor portion 165Aa and the lead-out conductor portion 165Ab.

As illustrated in FIG. 101B a plurality of the lead-out conductor portions 165B is connected to a predetermined side of the rectangular main conductor portion 165Ba, and one pad 1001*d* is connected to the outer peripheral portion of each of the lead-out conductor portions 165B via the conductor 1012 having a shape optionally including a predetermined repeating pattern. The conductor 1012 may be omitted or may be present. Furthermore, the conductor 1012 may be located between the main conductor portion 165B and the lead-out conductor portion 165Bb.

As illustrated in FIG. 101C, in the state where the conductor layers A and B are stacked, the arrangement of the pads 1001*s* and 1001*d* is a mirror-symmetrical arrangement in which a set of pads 1001 is folded back in the Y direction and sequentially arranged, where four consecutive pads 1001*s* and 1001*d* in the Y direction are set as one set. Moreover, the four pads 1001*s* and pads 1001*d* that constitute one set also have a mirror-symmetrical arrangement in which two of the four pads 1001 are folded back in the Y direction with reference to a center line in the Y direction. In the case of adopting such a two-stage configuration with a mirror arrangement, a range in which a residual magnetic field is accumulated is narrower than that of a one-stage mirror arrangement illustrated in FIGS. 100A, 100B, and 100C, the induced electromotive force is more effectively canceled, and the inductive noise can be further improved depending on the layout other than the pads.

Thirteenth Arrangement Example of Pads

Figures 102A, 102B, 102C:
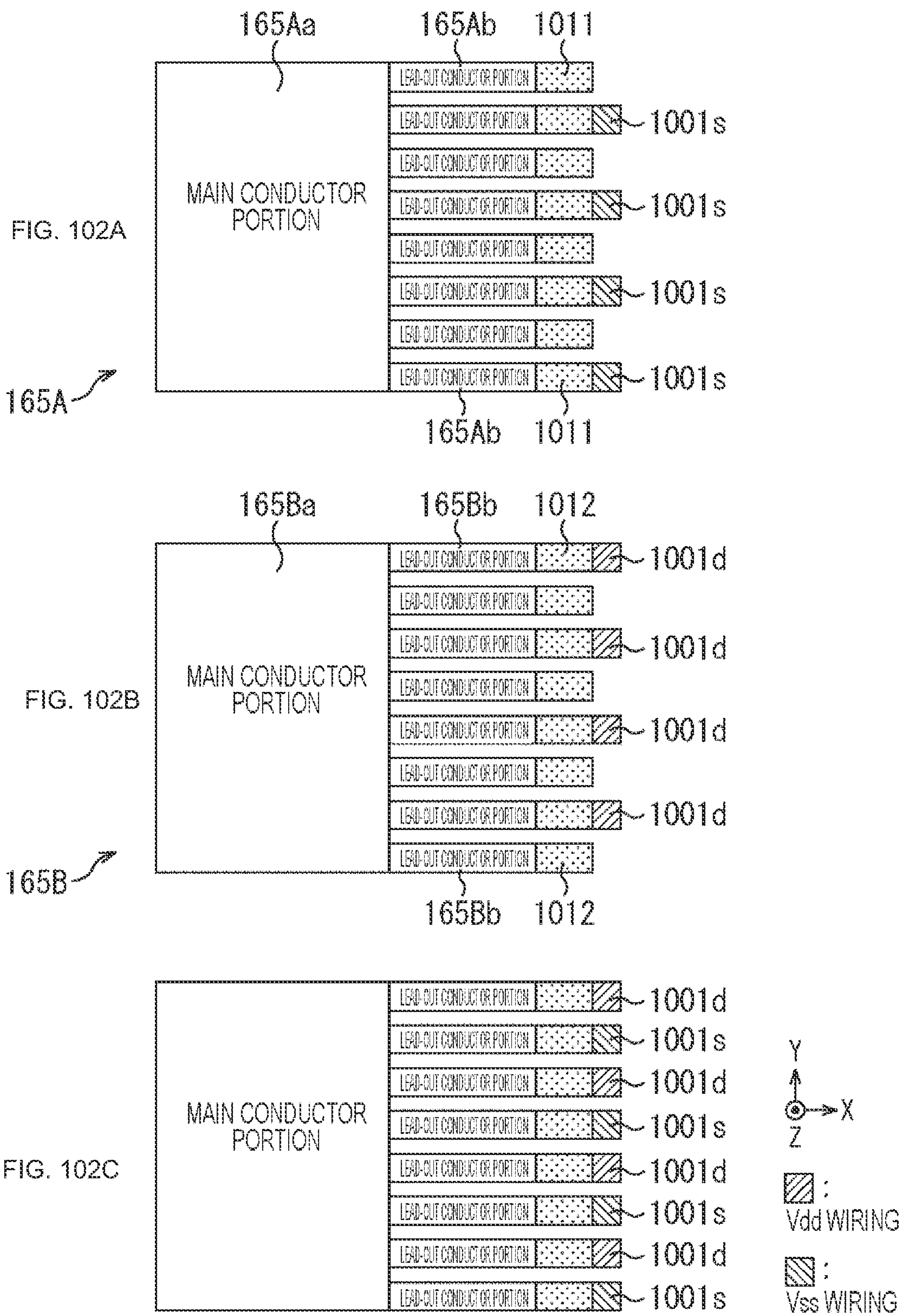
FIGS. 102A, 102B, and 102C are plan views illustrating a thirteenth arrangement example of pads.

FIGS. 102A, 102B, and 102C illustrate a thirteenth arrangement example of the pad.

FIG. 102A is a plan view illustrating an arrangement example of the conductor layer A (wiring layer 165A) and the pads 1001*s* connected to the conductor layer A.

FIG. 102B is a plan view illustrating an arrangement example of the conductor layer B (wiring layer 165B) and the pads 1001*d* connected to the conductor layer B.

FIG. 102C is a plan view of a state in which the conductor layers A and B and the pads 1001*s* and 1001*d* respectively illustrated in FIGS. 102A and 102B are stacked.

In FIGS. 102A, 102B, and 102C, the pad 1001*s* represents, for example, the pad 1001 to which GND or a negative power supply is supplied, and the pad 1001*d* represents, for example, the pad 1001 to which a positive power supply is supplied.

As illustrated in in FIG. 102A, a plurality of the lead-out conductor portions 165Ab is connected to a predetermined side of the rectangular main conductor portion 165Aa, and the conductor 1011 having a shape optionally including a predetermined repeating pattern is connected to the outer peripheral portion of each of the lead-out conductor portions 165Ab. Furthermore, one pad 1001*s* is connected to a part of the plurality of lead-out conductor portions 165Ab via the conductor 1011. The conductor 1011 may be omitted or may be present. Furthermore, the conductor 1011 may be located between the main conductor portion 165Aa and the lead-out conductor portion 165Ab.

As illustrated in FIG. 102B a plurality of the lead-out conductor portions 165B is connected to a predetermined side of the rectangular main conductor portion 165Ba, and the conductor 1012 having a shape optionally including a predetermined repeating pattern is connected to the outer peripheral portion of each of the lead-out conductor portions 165Bb. Furthermore, one pad 1001*d* is arranged in a part of the plurality of lead-out conductor portions 165B via the conductor 1012. The conductor 1012 may be omitted or may be present. Furthermore, the conductor 1012 may be located between the main conductor portion 165B and the lead-out conductor portion 165Bb.

As illustrated in FIG. 102C, in the state where the conductor layers A and B are stacked, the arrangement of the pads 1001*s* and the pads 1001*d* is an alternate arrangement in which the pad 1001*s* and the pad 1001*d* are alternately arranged in the Y direction. In this case, the magnetic field generated from each of the conductor layers A and B and the induced electromotive force based on the magnetic field can be effectively canceled, so that the inductive noise can be further improved. However, since the arrangement is not symmetrically arranged in the Y direction, in a case where the pads 1001 are arranged over a wide area, that is, in a case where the main conductor portion 165Aa or 165Ba, the lead-out conductor portion 165Ab or 165Bb, or the conductor 1011 or 1012 is longer in the arrangement direction of the pads (in FIGS. 102A, 102B, and 102C, the Y direction is longer than the X direction), there may be a magnetic field that cannot be canceled, and the induced electromotive force increases as the Victim conductor loop becomes larger and is accumulated, and the inductive noise may deteriorate.

Fourteenth Arrangement Example of Pads

Figure 103A:
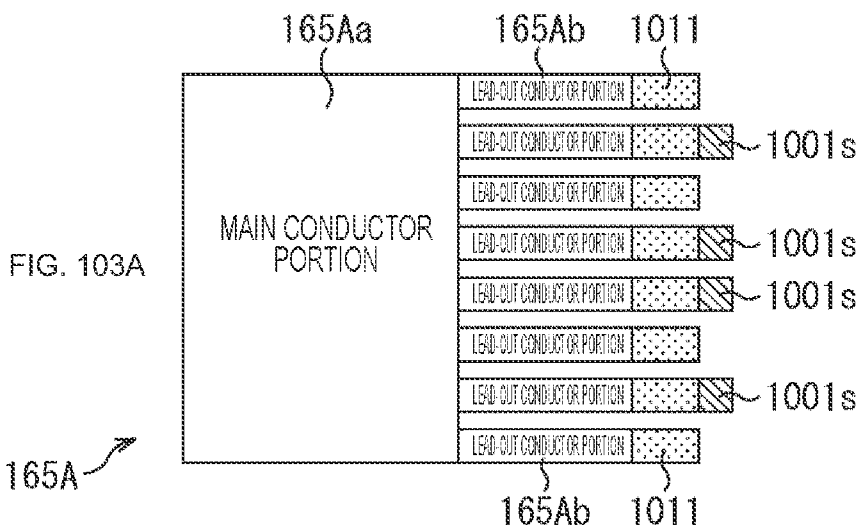
FIGS. 103A, 103B, and 103C are plan views illustrating a fourteenth arrangement example of pads.
Figure 103B:
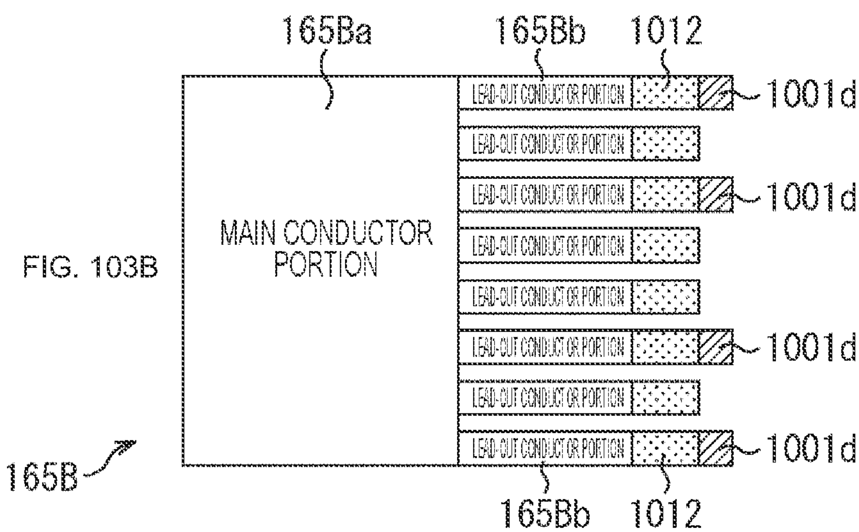
Figure 103C:
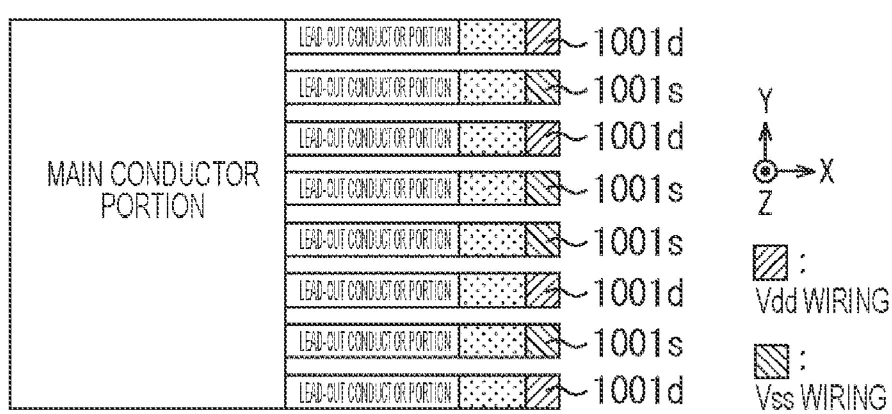

FIGS. 103A, 103B, and 103C illustrate a fourteenth arrangement example of pads.

FIG. 103A is a plan view illustrating an arrangement example of the conductor layer A (wiring layer 165A) and the pads 1001*s* connected to the conductor layer A.

FIG. 103B is a plan view illustrating an arrangement example of the conductor layer B (wiring layer 165B) and the pads 1001*d* connected to the conductor layer B.

FIG. 103C is a plan view of a state in which the conductor layers A and B and the pads 1001*s* and 1001*d* respectively illustrated in FIGS. 103A and 103B are stacked.

In FIGS. 103A and 103B, the pad 1001*s* represents, for example, the pad to which GND or a negative power supply is supplied, and the pad 1001*d* represents, for example, the pad 1001 to which a positive power supply is supplied.

As illustrated in in FIG. 103A, a plurality of the lead-out conductor portions 165Ab is connected to a predetermined side of the rectangular main conductor portion 165Aa, and the conductor 1011 having a shape optionally including a predetermined repeating pattern is connected to the outer peripheral portion of each of the lead-out conductor portions 165Ab. Furthermore, one pad 1001*s* is connected to a part of the plurality of lead-out conductor portions 165Ab via the conductor 1011. The conductor 1011 may be omitted or may be present. Furthermore, the conductor 1011 may be located between the main conductor portion 165Aa and the lead-out conductor portion 165Ab.

As illustrated in FIG. 103B a plurality of the lead-out conductor portions 165B is connected to a predetermined side of the rectangular main conductor portion 165Ba, and the conductor 1012 having a shape optionally including a predetermined repeating pattern is connected to the outer peripheral portion of each of the lead-out conductor portions 165Bb. Furthermore, one pad 1001*d* is arranged in a part of the plurality of lead-out conductor portions 165B via the conductor 1012. The conductor 1012 may be omitted or may be present. Furthermore, the conductor 1012 may be located between the main conductor portion 165B and the lead-out conductor portion 165Bb.

As illustrated in FIG. 103C, in the state where the conductor layers A and B are stacked, the arrangement of the pads 1001*s* and 1001*d* is a mirror-symmetrical arrangement in which a set of pads 1001 is folded back in the Y direction and sequentially arranged, where four consecutive pads 1001*s* and 1001*d* in the Y direction are set as one set. In this case, as compared with the alternate arrangement illustrated in FIGS. 102A, 102B, and 102C, the magnetic field generated from each of the conductor layers A and B and the induced electromotive force based on the magnetic field can be more effectively canceled, so that the inductive noise can be further improved depending on the layout other than the pads.

Fifteenth Arrangement Example of Pads

Figure 104A:
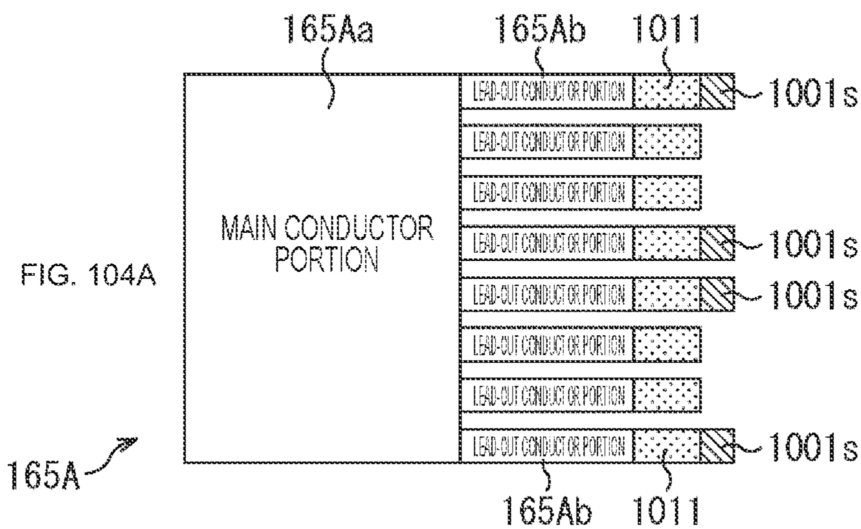
FIGS. 104A, 104B, and 104C are plan views illustrating a fifteenth arrangement example of pads.
Figure 104B:
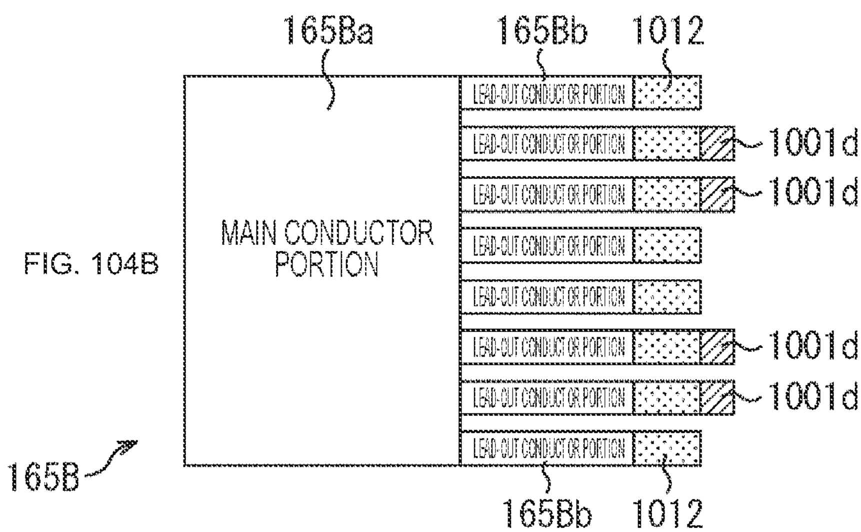
Figure 104C:
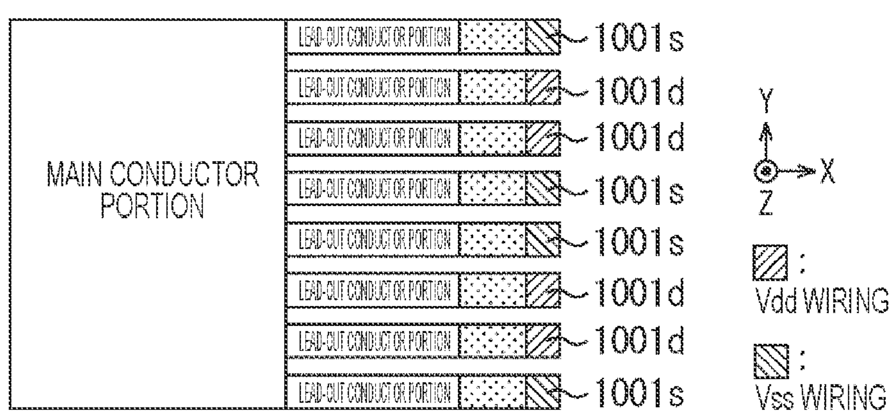

FIGS. 104A, 104B, and 104C illustrate a fifteenth arrangement example of pads.

FIG. 104A is a plan view illustrating an arrangement example of the conductor layer A (wiring layer 165A) and the pads 1001*s* connected to the conductor layer A.

FIG. 104B is a plan view illustrating an arrangement example of the conductor layer B (wiring layer 165B) and the pads 1001*d* connected to the conductor layer B.

FIG. 104C is a plan view of a state in which the conductor layers A and B and the pads 1001*s* and 1001*d* respectively illustrated in FIGS. 104A and 104B are stacked.

In FIGS. 104A, 104B, and 104C, the pad 1001*s* represents, for example, the pad 1001 to which GND or a negative power supply is supplied, and the pad 1001*d* represents, for example, the pad 1001 to which a positive power supply is supplied.

As illustrated in in FIG. 104A, a plurality of the lead-out conductor portions 165Ab is connected to a predetermined side of the rectangular main conductor portion 165Aa, and the conductor 1011 having a shape optionally including a predetermined repeating pattern is connected to the outer peripheral portion of each of the lead-out conductor portions 165Ab. Furthermore, one pad 1001*s* is connected to a part of the plurality of lead-out conductor portions 165Ab via the conductor 1011. The conductor 1011 may be omitted or may be present. Furthermore, the conductor 1011 may be located between the main conductor portion 165Aa and the lead-out conductor portion 165Ab.

As illustrated in FIG. 104B a plurality of the lead-out conductor portions 165B is connected to a predetermined side of the rectangular main conductor portion 165Ba, and the conductor 1012 having a shape optionally including a predetermined repeating pattern is connected to the outer peripheral portion of each of the lead-out conductor portions 165Bb. Furthermore, one pad 1001*d* is arranged in a part of the plurality of lead-out conductor portions 165B via the conductor 1012. The conductor 1012 may be omitted or may be present. Furthermore, the conductor 1012 may be located between the main conductor portion 165B and the lead-out conductor portion 165Bb.

As illustrated in FIG. 104C, in the state where the conductor layers A and B are stacked, the arrangement of the pads 1001*s* and 1001*d* is a mirror-symmetrical arrangement in which a set of pads 1001 is folded back in the Y direction and sequentially arranged, where four consecutive pads 1001*s* and 1001*d* in the Y direction are set as one set. Moreover, the four pads 1001*s* and pads 1001*d* that constitute one set also have a mirror-symmetrical arrangement in which two of the four pads 1001 are folded back in the Y direction with reference to a center line in the Y direction. In the case of adopting such a two-stage configuration with a mirror arrangement, a range in which a residual magnetic field is accumulated is narrower than that of a one-stage mirror arrangement illustrated in FIGS. 103A, 103B, and 103C, the induced electromotive force is more effectively canceled, and the inductive noise can be further improved depending on the layout other than the pads.

In the pad arrangement examples described with reference to FIGS. 93A, 93B, 93C, 94A, 94B, 94C, 95A, 95B, 95A, 95C, 96A, 96B, 96C, 97A, 97B, 97C, 98A, 98B, 98A, 98C, 99A, 99B, 99C, 100A, 100B, 100C, 101A, 101B, 101C, 102A, 102B, 102C, 103A, 103B, 103C, 104A, 104B, and 104C, the examples in which the total number of pads connected to a predetermined one side of the main conductor portions 165*a* of the conductor layers A and B is eight, and the arrangement of the eight pads 1001 continuous in the Y direction is the alternate arrangement, one-stage mirror arrangement, and two-stage mirror arrangement have been described. However, a total number of pads other than eight may be arranged in the alternate arrangement, one-stage mirror arrangement, and two-stage mirror arrangement. The number of pads in one set to be arranged in the alternate arrangement or the mirror arrangement is not limited to two or four, and is arbitrary.

Furthermore, the number of pads connected to one lead-out conductor portion 165*b* is not limited to one or two illustrated in FIGS. 93A, 93B, 93C, 94A, 94B, 94C, 95A, 95B, 95A, 95C, 96A, 96B, 96C, 97A, 97B, 97C, 98A, 98B, 98A, 98C, 99A, 99B, 99C, 100A, 100B, 100C, 101A, 101B, 101C, 102A, 102B, 102C, 103A, 103B, 103C, 104A, 104B, and 104C, and may be three or more.

The case where the total number of pads is eight has been described as an example, but this is not the case. The number of pads may be increased or the number of pads may be decreased.

The configuration elements illustrated as the examples of pad arrangement may be omitted in part or in whole, the part or the whole may be changed, the part or the whole may be altered, the part or the whole may be replaced with another configuration element, or another configuration element may be added to the part or the whole. Furthermore, a part or the whole of the configuration elements described as examples of pad arrangement may be divided into a plurality of elements, the part or the whole may be separated into a plurality of elements, or at least some of the plurality of divided or separated configuration elements may have different functions or characteristics. Moreover, at least some of the configuration elements illustrated as examples of pad arrangement may be arbitrarily combined to form different pad arrangement. Moreover, at least some of the configuration elements illustrated as examples of pad arrangement may be moved to form different pad arrangement. Moreover, a coupling element or a relay element may be added to a combination of at least some of the configuration elements illustrated as examples of pad arrangement to form different pad arrangement. Moreover, a switching element or a switching function may be added to a combination of at least some of the configuration elements illustrated as examples of pad arrangement to form different pad arrangement.

Moreover, FIGS. 93A, 93B, 93C, 94A, 94B, 94C, 95A, 95B, 95C, 96A, 95B, 95A, 95C, 96A, 96B, 96C, 97A, 97B, 97C, 98A, 98B, 98A, 98C, 99A, 99B, 99C, 100A, 100B, 100C, 101A, 101B, 101C, 102A, 102B, 102C, 103A, 103B, 103C, 104A, 104B, and 104C illustrate the examples in which the plurality of pads 1001 is connected to only the predetermined one side of the main conductor portions 165*a* of the rectangular conductor layers A and B have been described for simplicity. However, the pads may be connected to a side other than the side illustrated in FIGS. 93A, 93B, 93C, 94A, 94B, 94C, 95A, 95B, 95C, 96A, 96B, 96C, 97A, 97B, 97C, 98A, 98B, 98A, 98C, 99A, 99B, 99C, 100A, 100B, 100C, 101A, 101B, 101C, 102A, 102B, 102C, 103A, 103B, 103C, 104A, 104B, and 104C, or may be any two sides, three sides, or four sides.

Sixteenth Arrangement Example of Pads

Next, examples of orthogonal pad arrangement in cases where a plurality of pads 1001 is arranged on adjacent two sides of the rectangular main conductor portions 165*a* of the conductor layers A and B will be described with reference to FIGS. 105A, 105B, 105C, 106A, 106B, 106C, 107A, 107B, 107C, 108A, 108B, and, 108C.

Figure 105A:
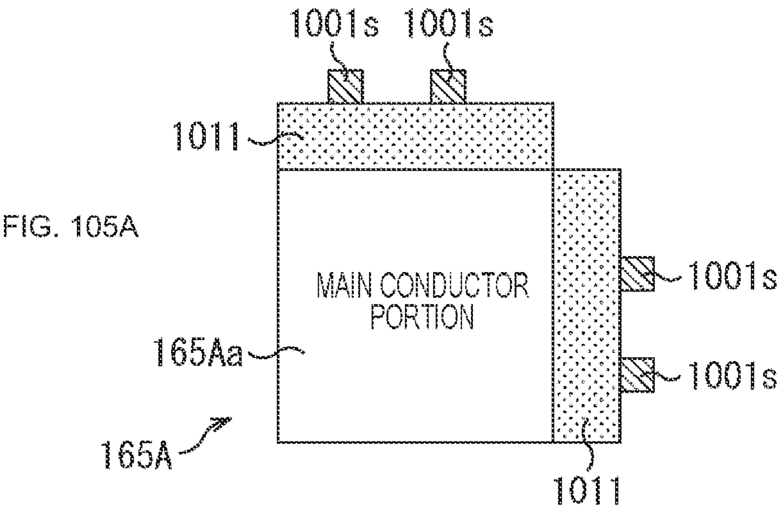
FIGS. 105A, 105B, and 105C are plan views illustrating a sixteenth arrangement example of pads.
Figure 105B:
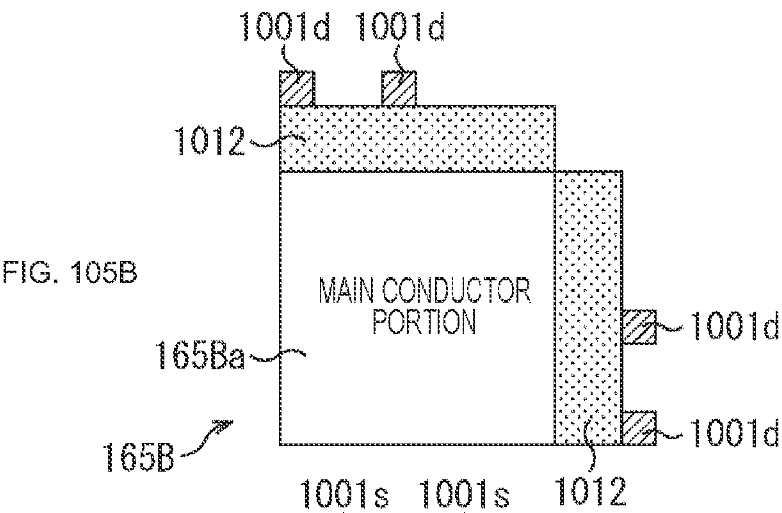
Figure 105C:
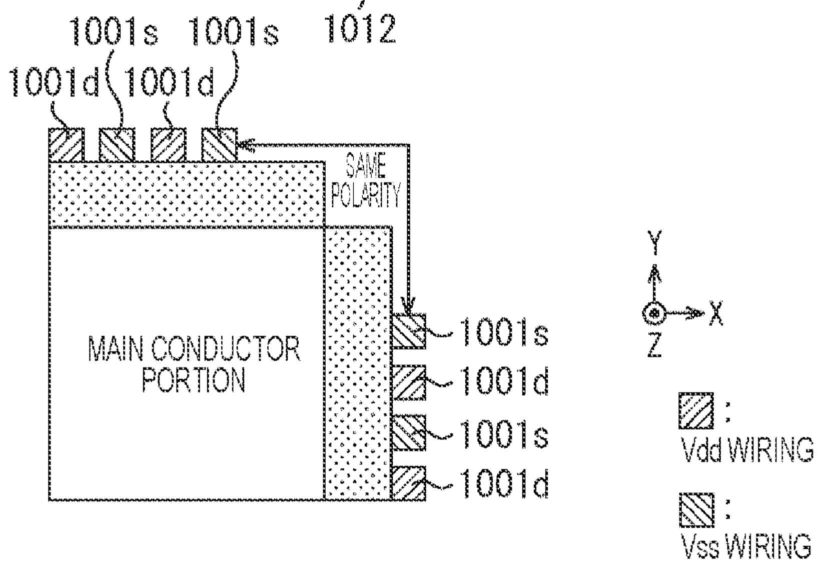

FIGS. 105A, 105B, and 105C illustrate a sixteenth arrangement example of pads.

FIG. 105A is a plan view illustrating an arrangement example of the conductor layer A (wiring layer 165A) and the pads 1001*s* connected to the conductor layer A.

FIG. 105B is a plan view illustrating an arrangement example of the conductor layer B (wiring layer 165B) and the pads 1001*d* connected to the conductor layer B.

FIG. 105C is a plan view of a state in which the conductor layers A and B and the pads 1001*s* and 1001*d* respectively illustrated in FIGS. 105A and 105B are stacked.

In FIGS. 105A, 105B, and 105C, the pad 1001*s* represents, for example, the pad 1001 to which GND or a negative power supply is supplied, and the pad 1001*d* represents, for example, the pad 1001 to which a positive power supply is supplied.

As illustrated in FIG. 105A, a plurality of the pads 1001*s* is connected to adjacent two sides of the rectangular main conductor portion 165Aa at predetermined intervals via the conductor 1011 having a shape optionally including a predetermined repeating pattern. Each pad 1001*s* may be configured by the lead-out conductor portion 165Ab or the conductor 1011 may be configured by the lead-out conductor portion 165Ab. Furthermore, in the case where the pad 1001*s* is the lead-out conductor portion 165Ab, the conductor 1011 may be omitted or may be present.

As illustrated in FIG. 105B, a plurality of the pads 1001*d* is connected to adjacent two sides of the rectangular main conductor portion 165B at predetermined intervals via the conductor 1012 having a shape optionally including a predetermined repeating pattern. Each pad 1001*d* may be configured by the lead-out conductor portion 165B or the conductor 1012 may be configured by the lead-out conductor portion 165Bb. Furthermore, in the case where the pad 1001*d* is the lead-out conductor portion 165Bb, the conductor 1012 may be omitted or may be present.

As illustrated in FIG. 105C, in the state where the conductor layers A and B are stacked, the arrangement of the pads 1001*s* and the pads 1001*d* is an alternate arrangement in which the pad 1001*s* and the pad 1001*d* are alternately arranged on adjacent two sides of the rectangular main conductor portion 165*a*. Furthermore, among the pads 1001*s* and pads 1001*d* alternately arranged on the two sides, the polarities of the pads 1001 at the ends of the two sides are both the pads s connected to the GND or the negative power supply. In this way, among the plurality of pads 1001 on the two sides in which the pads 1001*s* and the pads 1001*d* are alternately arranged, the polarities of the pads 1001 at the ends closest to a corner of the substrate 1000 are the same polarity, and the pads 1001*s* with the polarity having higher electrostatic discharge (ESD) resistance are adopted, whereby the ESD resistance can be enhanced.

Note that the polarities of the pads 1001 at the ends of the two sides where the pad 1001*s* and the pad 1001*d* are alternately arranged are favorably set to the pads 1001*s* connected to the GND or the negative power supply, for example, in consideration of the ESD resistance. However, the pads 1001 may be set to the pads 1001*d* connected to the positive power supply, for example.

Seventeenth Arrangement Example of Pads

Figures 106A, 106B, 106C:
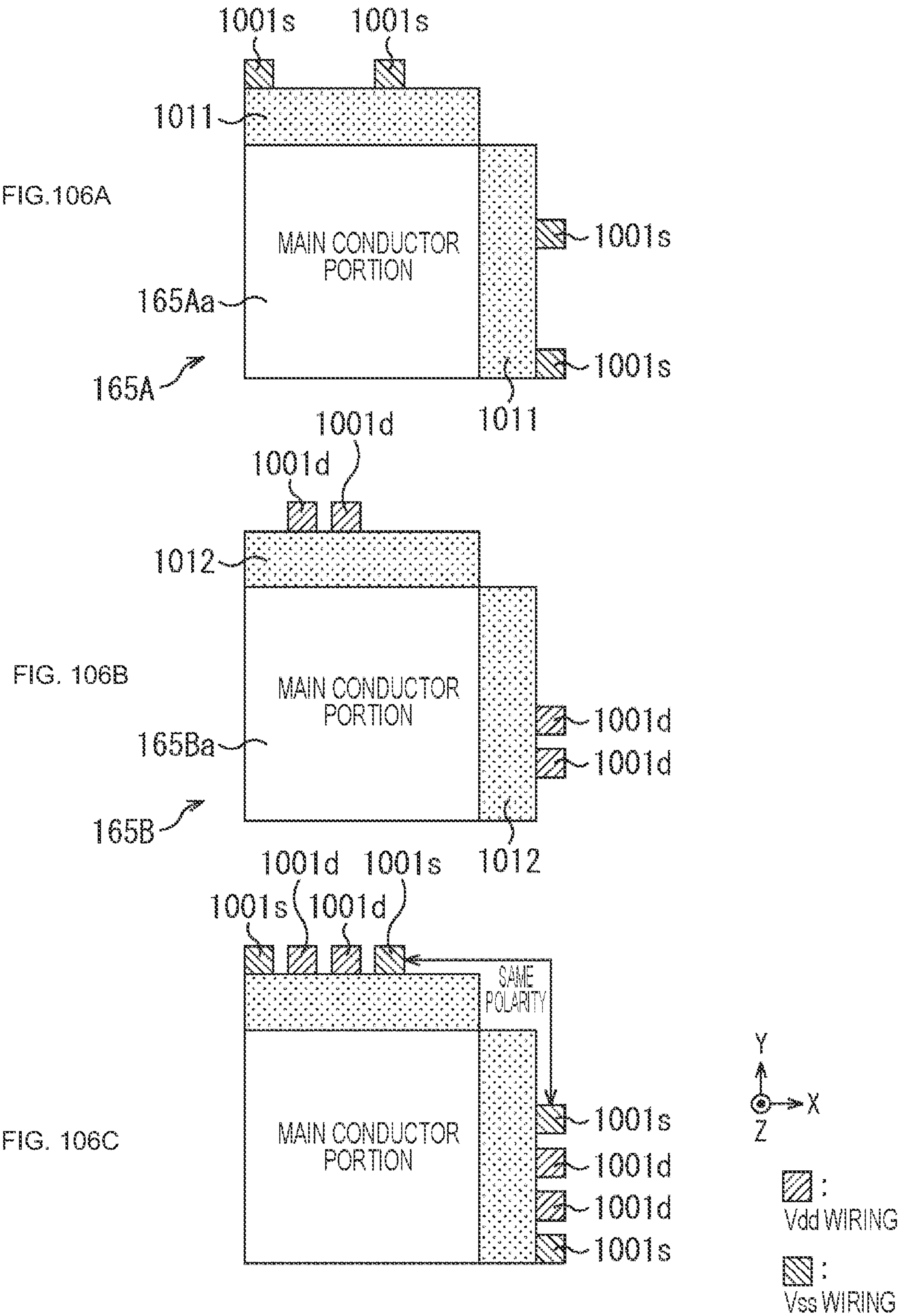
FIGS. 106A, 106B, and 106C are plan views illustrating a seventeenth arrangement example of pads.

FIGS. 106A, 106B, and 106C illustrate a seventeenth arrangement example of pads.

FIG. 106A is a plan view illustrating an arrangement example of the conductor layer A (wiring layer 165A) and the pads 1001*s* connected to the conductor layer A.

FIG. 106B is a plan view illustrating an arrangement example of the conductor layer B (wiring layer 165B) and the pads 1001*d* connected to the conductor layer B.

FIG. 106C is a plan view of a state in which the conductor layers A and B and the pads 1001*s* and 1001*d* respectively illustrated in FIGS. 106A and 106B are stacked.

In FIGS. 106A and 106B, the pad 1001*s* represents, for example, the pad to which GND or a negative power supply is supplied, and the pad 1001*d* represents, for example, the pad 1001 to which a positive power supply is supplied.

As illustrated in FIG. 106A, a plurality of the pads 1001*s* is connected to adjacent two sides of the rectangular main conductor portion 165Aa at predetermined intervals via the conductor 1011 having a shape optionally including a predetermined repeating pattern. Each pad 1001*s* may be configured by the lead-out conductor portion 165Ab or the conductor 1011 may be configured by the lead-out conductor portion 165Ab. Furthermore, in the case where the pad 1001*s* is the lead-out conductor portion 165Ab, the conductor 1011 may be omitted or may be present.

As illustrated in FIG. 106B, a plurality of the pads 1001*d* is connected to adjacent two sides of the rectangular main conductor portion 165B at predetermined intervals via the conductor 1012 having a shape optionally including a predetermined repeating pattern. Each pad 1001*d* may be configured by the lead-out conductor portion 165B or the conductor 1012 may be configured by the lead-out conductor portion 165Bb. Furthermore, in the case where the pad 1001*d* is the lead-out conductor portion 165Bb, the conductor 1012 may be omitted or may be present.

As illustrated in FIG. 106C, in the state where the conductor layers A and B are stacked, the arrangement of the pads 1001*s* and 1001*d* is a mirror-symmetrical arrangement in which a set of pads 1001 is folded back in the Y direction and sequentially arranged, where four consecutive pads 1001*s* and 1001*d* are set as one set, as in the pad arrangement example illustrated in FIG. 95C. Furthermore, among the pads 1001*s* and pads 1001*d* mirror-symmetrically arranged on the two sides, the polarities of the pads 1001 at the ends of the two sides are both the pads 1001*s* connected to the GND or the negative power supply. In this way, among the plurality of pads 1001 on the two sides in which the pads 1001*s* and the pads 1001*d* are mirror-symmetrically arranged, the polarities of the pads 1001 at the ends closest to a corner of the substrate 1000 are the same polarity, and the pads 1001*s* with the polarity having higher ESD resistance are adopted, whereby the ESD resistance can be enhanced. Furthermore, with the mirror-symmetrical arrangement, the impedance difference between the Vss wiring and the Vdd wiring becomes small and the current difference becomes small, so that the inductive noise can be further improved as compared with the sixteenth arrangement example in FIGS. 105A, 105B, and 105C.

Note that the polarities of the pads 1001 at the ends of the two sides where the pad 1001*s* and the pad 1001*d* are mirror-symmetrically arranged are favorably set to the pads 1001*s* connected to the GND or the negative power supply, for example, in consideration of the ESD resistance. However, the pads 1001 may be set to the pads 1001*d* connected to the positive power supply, for example.

Eighteenth Arrangement Example of Pads

Figure 107A:
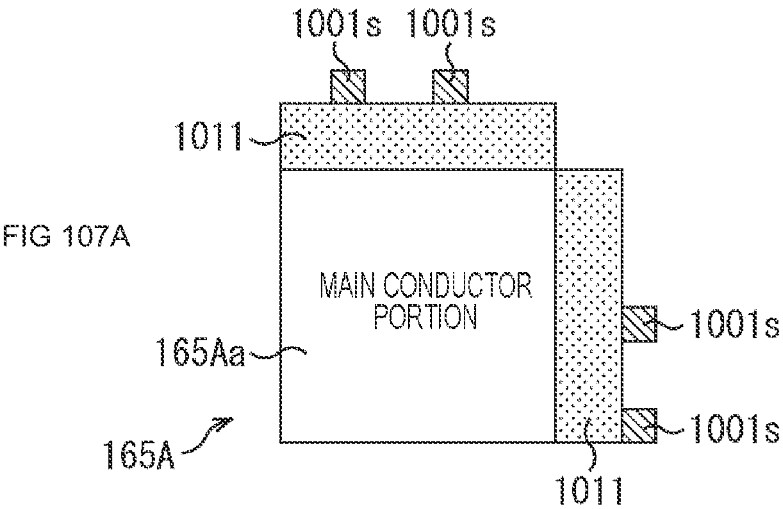
FIGS. 107A, 107B, and 107C plan views illustrating an eighteenth arrangement example of pads.
Figure 107B:
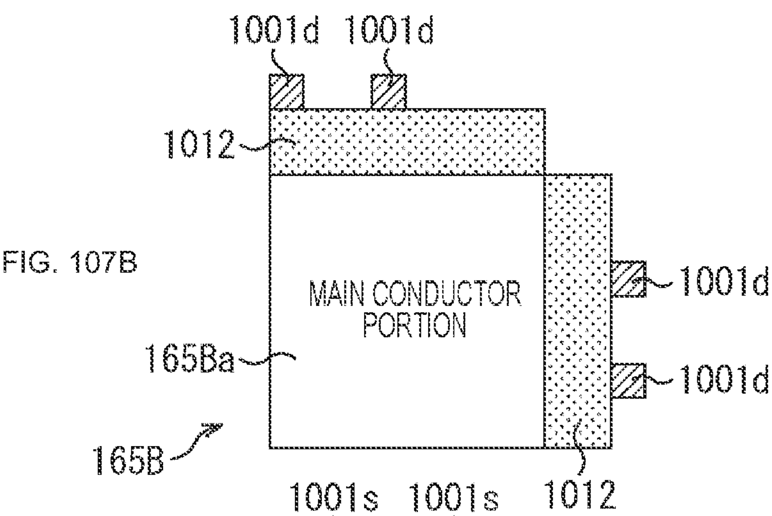
Figure 107C:
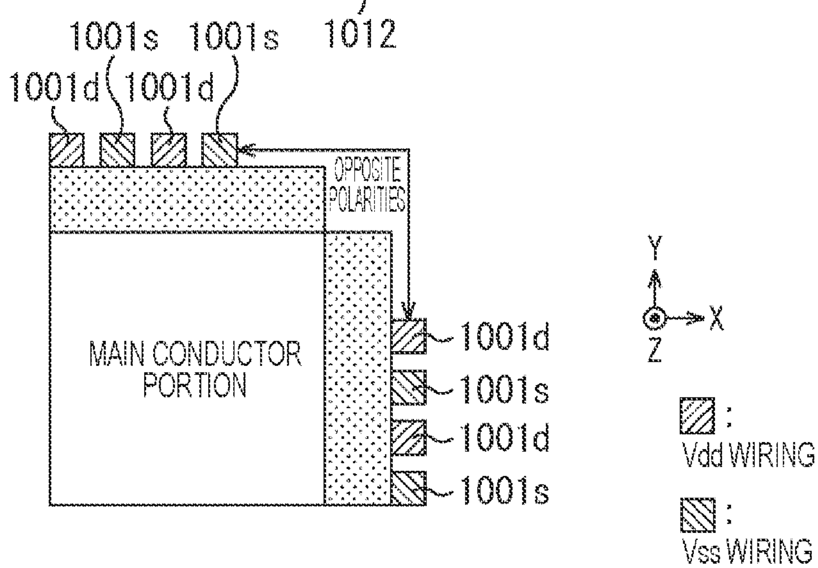

FIGS. 107A, 107B, and 107C illustrate an eighteenth arrangement example of pads.

FIG. 107A is a plan view illustrating an arrangement example of the conductor layer A (wiring layer 165A) and the pads 1001*s* connected to the conductor layer A.

FIG. 107B is a plan view illustrating an arrangement example of the conductor layer B (wiring layer 165B) and the pads 1001*d* connected to the conductor layer B.

FIG. 107C is a plan view of a state in which the conductor layers A and B and the pads 1001*s* and 1001*d* respectively illustrated in FIGS. 107A 107B, and 107C are stacked.

In FIGS. 107A, 107B, and 107C, the pad 1001*s* represents, for example, the pad 1001 to which GND or a negative power supply is supplied, and the pad 1001*d* represents, for example, the pad 1001 to which a positive power supply is supplied.

As illustrated in FIG. 107A, a plurality of the pads 1001*s* is connected to adjacent two sides of the rectangular main conductor portion 165Aa at predetermined intervals via the conductor 1011 having a shape optionally including a predetermined repeating pattern. Each pad 1001*s* may be configured by the lead-out conductor portion 165Ab or the conductor 1011 may be configured by the lead-out conductor portion 165Ab. Furthermore, in the case where the pad 1001*s* is the lead-out conductor portion 165Ab, the conductor 1011 may be omitted or may be present.

As illustrated in FIG. 107B, a plurality of the pads 1001*d* is connected to adjacent two sides of the rectangular main conductor portion 165Ba at predetermined intervals via the conductor 1012 having a shape optionally including a predetermined repeating pattern. Each pad 1001*d* may be configured by the lead-out conductor portion 165Bb or the conductor 1012 may be configured by the lead-out conductor portion 165Bb. Furthermore, in the case where the pad 1001*d* is the lead-out conductor portion 165Bb, the conductor 1012 may be omitted or may be present.

As illustrated in FIG. 107C, in the state where the conductor layers A and B are stacked, the arrangement of the pads 1001*s* and 1001*d* is an alternate arrangement in which the pad 1001*s* and the pad 1001*d* are alternately arranged, similarly to the pad arrangement example illustrated in FIGS. 105A, 105B, and 105C. However, among the pads 1001*s* and the pads 1001*d* arranged on the two sides, the polarities of the pads 1001 at the ends of the two sides are opposite polarities of the pad s and the pad 1001*d*, which is different from the pad arrangement example illustrated in FIGS. 105A, 105B, and 105C. By setting the polarities of the pads 1001 at the ends closest to a corner of the substrate 1000 to the opposite polarities among the plurality of pads 1001 on the two sides where the pad 1001*s* and the pad 1001*d* are alternately arranged, the impedance difference between the Vss wiring and the Vdd wiring can be further reduced and the current difference further becomes smaller, whereby the inductive noise can be further improved as compared with the seventeenth arrangement example in FIGS. 106A, 106B, and 106C.

Nineteenth Arrangement Example of Pads

Figure 108A:
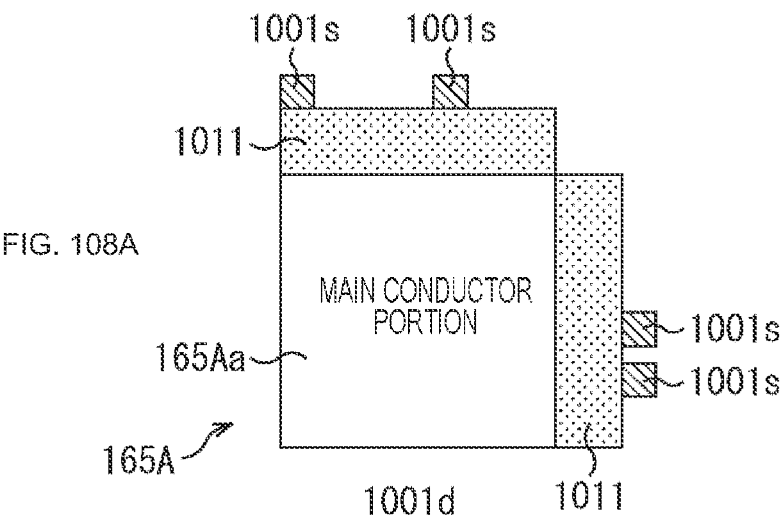
FIGS. 108A, 108B, and 108C plan views illustrating a nineteenth arrangement example of pads.
Figure 108B:
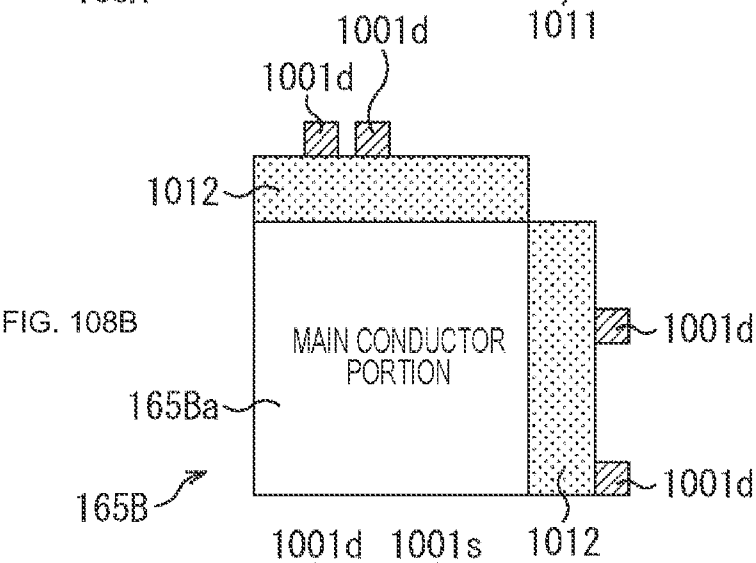
Figure 108C:
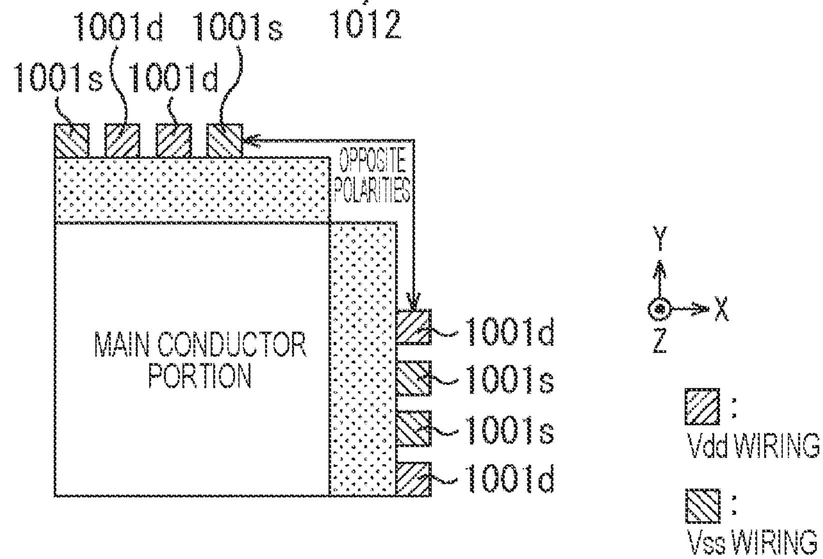

FIGS. 108A, 108B, and 108C illustrate a nineteenth arrangement of pads.

FIG. 108A is a plan view illustrating an arrangement example of the conductor layer A (wiring layer 165A) and the pads 1001*s* connected to the conductor layer A.

FIG. 108B is a plan view illustrating an arrangement example of the conductor layer B (wiring layer 165B) and the pads 1001*d* connected to the conductor layer B.

FIG. 108C is a plan view of a state in which the conductor layers A and B and the pads 1001*s* and 1001*d* respectively illustrated in FIGS. 108A and 108B are stacked.

In FIGS. 108A, 108B, and 108C, the pad 1001*s* represents, for example, the pad 1001 to which GND or a negative power supply is supplied, and the pad 1001*d* represents, for example, the pad 1001 to which a positive power supply is supplied.

As illustrated in FIG. 108A, a plurality of the pads 1001*s* is connected to adjacent two sides of the rectangular main conductor portion 165Aa at predetermined intervals via the conductor 1011 having a shape optionally including a predetermined repeating pattern. Each pad 1001*s* may be configured by the lead-out conductor portion 165Ab or the conductor 1011 may be configured by the lead-out conductor portion 165Ab. Furthermore, in the case where the pad 1001*s* is the lead-out conductor portion 165Ab, the conductor 1011 may be omitted or may be present.

As illustrated in FIG. 108B, a plurality of the pads 1001*d* is connected to adjacent two sides of the rectangular main conductor portion 165B at predetermined intervals via the conductor 1012 having a shape optionally including a predetermined repeating pattern. Each pad 1001*d* may be configured by the lead-out conductor portion 165B or the conductor 1012 may be configured by the lead-out conductor portion 165Bb. Furthermore, in the case where the pad 1001*d* is the lead-out conductor portion 165Bb, the conductor 1012 may be omitted or may be present.

As illustrated in FIG. 108C, in the state where the conductor layers A and B are stacked, the arrangement of the pads 1001*s* and 1001*d* is a mirror-symmetrical arrangement of the pads 1001*s* and the pads 1001*d*, similarly to the pad arrangement example illustrated in FIGS. 106A, 106B, and 106C. However, among the pads 1001*s* and the pads 1001*d* arranged on the two sides, the polarities of the pads at the ends of the two sides are opposite polarities of the pad 1001*s* and the pad d, which is different from the pad arrangement example illustrated in FIGS. 106A 106B, and 106C. By setting the polarities of the pads 1001 at the ends closest to a corner of the substrate 1000 to the opposite polarities among the plurality of pads 1001 on the two sides where the pad 1001*s* and the pad 1001*d* are mirror-symmetrically arranged, the impedance difference between the Vss wiring and the Vdd wiring can be further reduced and the current difference further becomes smaller, whereby the inductive noise can be further improved as compared with the seventeenth arrangement example in FIGS. 106A, 106B, and 106C.

In the sixteenth to nineteenth arrangement examples of pads described with reference to FIGS. 105A, 105B, and 105C, 106A, 106B, 106C, 107A, 107B. 107C, 108A, 108B, and 108C, the examples in which the plurality of pads 1001 is arranged on the adjacent two sides of the rectangular main conductor portion 165*a* at predetermined intervals via the conductor 1011 or 1012 have been described. However, the sides on which the pads 1001 are arranged are not limited to two sides and may be three or four sides.

Furthermore, in the sixteenth to nineteenth arrangement examples described with reference to FIGS. 105A, 105B, and 105C, 106A, 106B, 106C, 107A, 107B, 107C, 108A, 108B, and 108C, the alternate arrangement in FIGS. 93A, 93B, and 93C and the two-stage mirror arrangement in FIGS. 95A, 95B, and 95C have been adopted as the form of the pads 1001 arranged on one side. However, a form in which the one-stage mirror arrangement in FIGS. 94A, 94B, and 94C are adopted, and the polarities of the pads 1001 at the ends closest to a corner are set to the same polarities or opposite polarities may be adopted.

Moreover, in the sixteenth to nineteenth arrangement examples described with reference to FIGS. 105A, 105B, and 105C, 106A, 106B, 106C, 107A, 107B, 107C, 108A, 108B, and 108C, the lead-out conductor portion 165*b* has been omitted. However, a form in which the alternate arrangement in FIGS. 93A, 93B, and the one-stage mirror arrangement in FIGS. 94A, 94B, and 94C, or the two-stage mirror arrangement in FIGS. 95A, 95B, and 95C are adopted for the configuration provided with the lead-out conductor portion 165*b* on a side of the rectangular main conductor portion 165Aa as in FIGS. 96A, 96B, 96C, 97A, 97B, 97C, 98A, 98B, 98C, 99A, 99B, 99C, 100A, 100B, 100C, 101A, 101B, 101C, 102A, 102B, 102C, 103A, 103B, 103C, 104A, 104B, and 104C, and the polarities of the pads 1001 at the ends closest to a corner are set to the same polarities or opposite polarities may be adopted.

Note that the lead-out conductor portions 165Ab and 165B and the conductors 1011 and 1012 are favorably configured such that, but not limited to, the GND or the negative power supply is supplied from the pad 1001*s* to the main conductor portion 165Aa, and the positive power supply of the opposite polarity is supplied from the pad 1001*d* to the main conductor portion 165Ba. In other words, the lead-out conductor portions 165Ab and 165B and the conductors 1011 and 1012 are favorably configured such that, but not limited to, the GND or the negative power supply and the positive power supply of the opposite polarity supplied from the pads 1001 are not completely short-circuited. Note that at least some of FIGS. 92A, 92B, 92C, 93A. 98C, 99A, 99B, 99C, 100A, 100B, 100C, 101A, 101B, 101C, 102A, 102B, 102C, 103A, 103B, 103C, 104A, 104B, 104C, 105A, 105B, 105C, 106A, 106B, 106C, 107A, 107B. 107C, 108A, 108B, and 108C illustrate the example of arranging the plurality of pads 1001*s*, the example of arranging the plurality of pads 1001*d*, the example of arranging the plurality of conductors 1011, the example of arranging the plurality of conductors 1012, the example of arranging the plurality of lead-out conductor portions 165Ab, the example of arranging the plurality of lead-out conductor portions 165Bb, and the like. In each drawing, all the pads 1001*s* may be the same, not all the pads 1001*s* need to be the same, all the pads 1001*d* may be the same, not all the pads 1001*d* need to be the same, all the conductors 1011 may be the same, not all the conductors 1011 need to be the same, all the conductors 1012 may be the same, not all the conductors need to be the same, all the lead-out conductor portions 165Ab may be the same, not all the lead-out conductor portions 165Ab need to be the same, all the lead-out conductor portions 165B may be the same, and not all the lead-out conductor portions 65B need to be the same. Note that it is desirable but not limited to satisfy at least any one of the following: the total number of pads 1001*s* and the total number of pads d directly or indirectly connected to the main conductor portion 165*a* in the substrate 1000 are the same or substantially the same, the total number of pads 1001*s* and the total number of pads 1001*d* directly or indirectly connected to the main conductor portion 165*a* on predetermined adjacent two sides of the substrate 1000 are the same or substantially the same, the total number of pads 1001*s* and the total number of pads 1001*d* directly or indirectly connected to the main conductor portion 165*a* on predetermined facing two sides of the substrate 1000 are the same or substantially the same, the total number of pads 1001*s* and the total number of pads d directly or indirectly connected to the main conductor portion 165*a* on a predetermined side of the substrate 1000 are the same or substantially the same, the total number of pads 1001*s* and the total number of pads 1001*d* directly or indirectly connected to at least two lead-out conductor portions 165*b* on predetermined adjacent two sides of the substrate 1000 are the same or substantially the same, the total number of pads 1001*s* and the total number of pads 1001$d$ directly or indirectly connected to at least two lead-out conductor portions 165$b$ on predetermined facing two sides of the substrate 1000 are the same or substantially the same, the total number of pads 1001$s$ and the total number of pads 1001$d$ directly or indirectly connected to at least one lead-out conductor portion 165$b$ on a predetermined side of the substrate are the same or substantially the same, the total number of pads 1001$s$ and the total number of pads 1001$d$ directly or indirectly connected to at least two sets of conductors 1011 and 1012 on predetermined adjacent two sides of the substrate 1000 are the same or substantially the same, the total number of pads 1001$s$ and the total number of pads 1001$d$ directly or indirectly connected to at least two sets of conductors and 1012 on predetermined facing two sides of the substrate 1000 are the same or substantially the same, or the total number of pads 1001$s$ and the total number of pads 1001$d$ directly or indirectly connected to at least one set of conductors 1011 and on a predetermined side of the substrate 1000 are the same or substantially the same. For example, the total number of pads 1001$s$ and the total number of pads d may not be the same, or the total number of pads 1001$s$ and the total number of pads 1001$d$ may not be substantially the same.

Figure 109A:
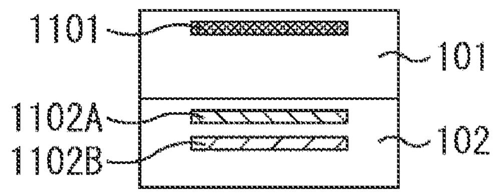
FIGS. 109A, 109B, and 109C are cross-sectional views illustrating substrate arrangement examples of a Victim conductor loop and an Aggressor conductor loop.
Figure 109B:
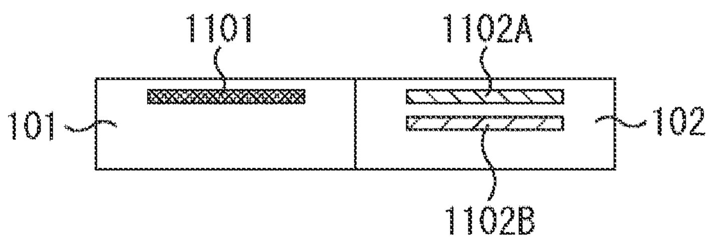
Figure 109C:
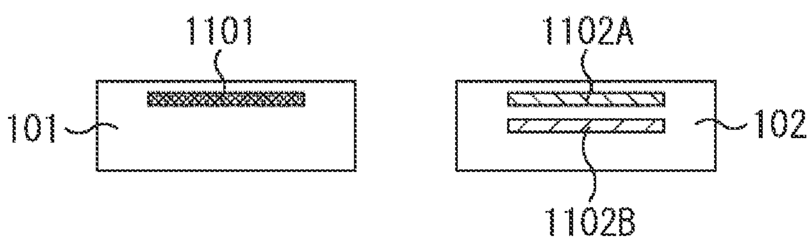

Substrate Arrangement Example of Victim Conductor Loop and Aggressor Conductor Loop FIGS. 109A, 109B, and 109C illustrate substrate arrangement examples of the Victim conductor loop and the Aggressor conductor loop.

FIG. 109A is a cross-sectional view schematically illustrating a substrate arrangement example of the Victim conductor loop and the Aggressor conductor loop.

In each of the above-described configuration examples, as illustrated in FIG. 109A, a Victim conductor loop 1101 being included in the first semiconductor substrate 101, Aggressor conductor loops 1102A and 1102B being included in the second semiconductor substrate 102, and the stacked structure of the first semiconductor substrate 101 and the second semiconductor substrate 102 have been described.

However, a structure in which the first semiconductor substrate 101 and the second semiconductor substrate 102 are not stacked, and the first semiconductor substrate 101 and the second semiconductor substrate 102 are arranged adjacent to each other as illustrated in FIG. 109B or a structure in which the first semiconductor substrate 101 and the second semiconductor substrate 102 are arranged on the same plane with a predetermined interval as illustrated in FIG. 109C may be adopted.

Moreover, as the substrate arrangement of the Victim conductor loop and the Aggressor conductor loop, various arrangement configurations as illustrated in FIGS. 110A, 110B, 110C, 110D, 110E, 110F, 110D, 110H, and 110I can be adopted.

Figures 110A, 110B, 110C, 110D, 110E, 110F, 110G, 110H, 110I:
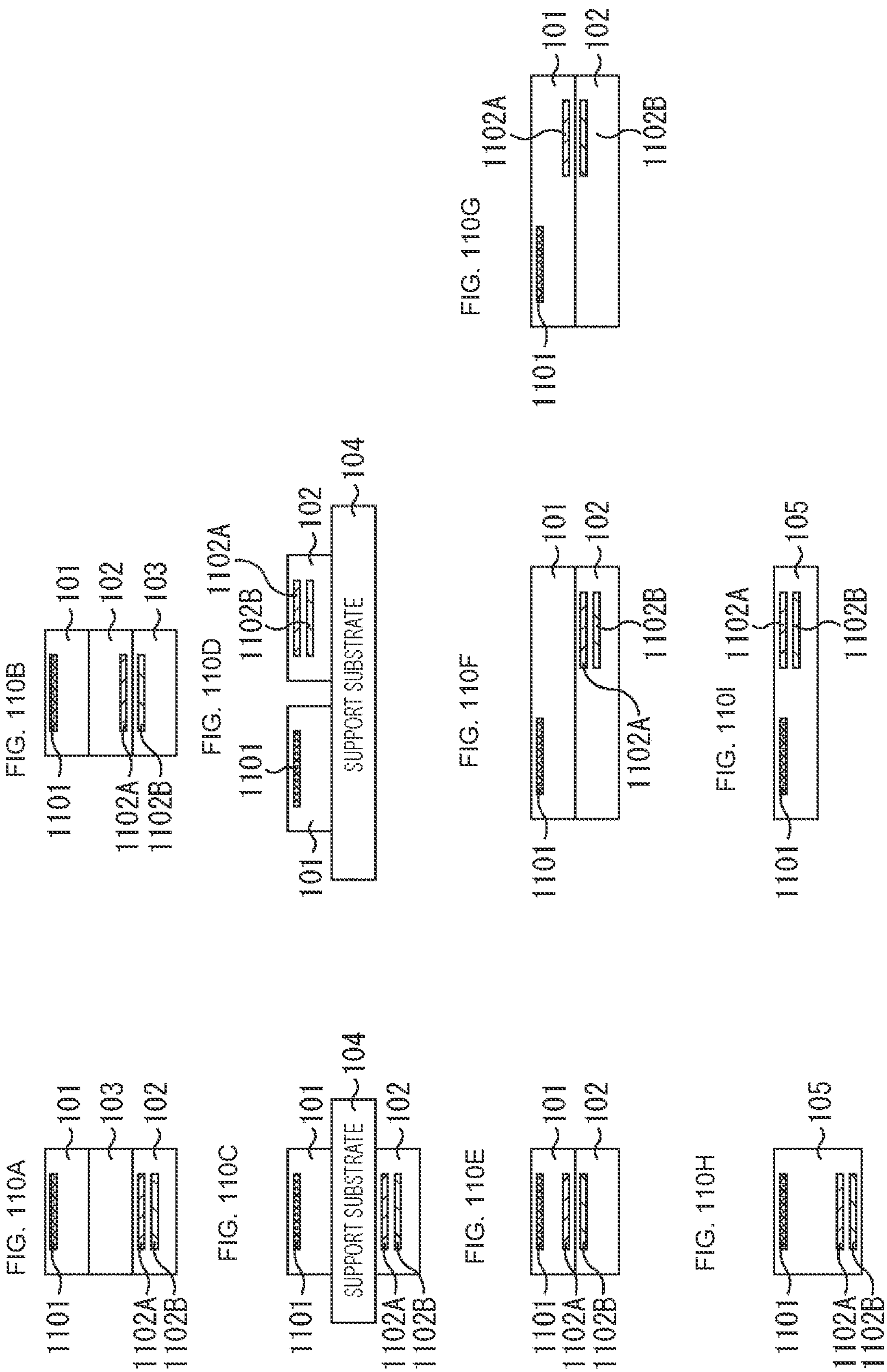

FIG. 110A illustrates a structure in which the Victim conductor loop 1101 is included in the first semiconductor substrate 101, the Aggressor conductor loops 1102A and 1102B are included in the second semiconductor substrate 102, a third semiconductor substrate 103 is inserted between the first semiconductor substrate and the second semiconductor substrate 102, and the first semiconductor substrate to the third semiconductor substrate 103 are stacked.

FIG. 1108 illustrates a structure in which the Victim conductor loop 1101 is included in the first semiconductor substrate 101, the Aggressor conductor loop 1102A is included in the second semiconductor substrate 102, the Aggressor conductor loop 1102B is included in the third semiconductor substrate 103, and the first semiconductor substrate 101 to the third semiconductor substrate 103 are stacked in that order.

FIG. 110D illustrates a structure in which the Victim conductor loop 1101 is included in the first semiconductor substrate 101, the Aggressor conductor loops 1102A and 1102B are included in the second semiconductor substrate 102, a support substrate 104 is inserted between the first semiconductor substrate 101 and the second semiconductor substrate 102, and the first semiconductor substrate 101, the support substrate 104, and the second semiconductor substrate 102 are stacked in this order. The support substrate 104 may be omitted, and the first semiconductor substrate and the second semiconductor substrate 102 may be arranged with a predetermined gap.

FIG. 11 OD illustrates a structure in which the Victim conductor loop 1101 is included in the first semiconductor substrate 101, the Aggressor conductor loops 1102A and 1102B are included in the second semiconductor substrate 102, and the first semiconductor substrate 101 and the second semiconductor substrate 102 are placed on the support substrate 104 and arranged on the same plane with a predetermined interval. The support substrate 104 may be omitted, and the first semiconductor substrate 101 and the second semiconductor substrate 102 may be supported to be arranged in the same plane at different places.

FIG. 110E illustrates a structure in which the Victim conductor loop and Aggressor conductor loop 1102A are included in the first semiconductor substrate 101, the Aggressor conductor loop 1102B is included in the second semiconductor substrate 102, and the first semiconductor substrate 101 and the second semiconductor substrate 102 are stacked. Here, the region on the XY plane where the Victim conductor loop 1101 is formed in the first semiconductor substrate 101 at least partly overlaps with the region on the XY plane where the Aggressor conductor loops 1102A and 1102B are formed in the second semiconductor substrate 102.

FIG. 110F illustrates a structure in which the Victim conductor loop 1101 is included in the first semiconductor substrate 101, the Aggressor conductor loops 1102A and 1102B are included in the second semiconductor substrate 102, and the first semiconductor substrate 101 and the second semiconductor substrate 102 are stacked. Here, the region on the XY plane where the Victim conductor loop 1101 is formed in the first semiconductor substrate 101 may be completely different from or partly overlap with the region on the XY plane where the Aggressor conductor loops 1102A and 1102B are formed in the second semiconductor substrate 102.

FIG. 110G illustrates a structure in which the Victim conductor loop and Aggressor conductor loop 1102A are included in the first semiconductor substrate 101, the Aggressor conductor loop 1102B is included in the second semiconductor substrate 102, and the first semiconductor substrate 101 and the second semiconductor substrate 102 are stacked. Here, the region on the XY plane where the Victim conductor loop 1101 is formed in the first semiconductor substrate 101 is different from the region on the XY plane where the Aggressor conductor loops 1102A and 1102B are formed.

FIG. 110H illustrates a structure in which the Victim conductor loop and the Aggressor conductor loops 1102A and 1102B are included in one semiconductor substrate 105. Note that the region on the XY plane where the Victim conductor loop 1101 is formed in the one semiconductor substrate 105 at least partly overlaps with the region on the XY plane where the Aggressor conductor loops 1102A and 1102B are formed.

FIG. 110I illustrates a structure in which the Victim conductor loop 1101 and the Aggressor conductor loops 1102A and 1102B are included in one semiconductor substrate 105. Note that the region on the XY plane where the Victim conductor loop 1101 is formed in the one semiconductor substrate 105 is different from the region on the XY plane where the Aggressor conductor loops 1102A and 1102B are formed.

The stacking order of the substrates illustrated in FIGS. 110A, 110B, 110C, 110D, 110E, 110F, 110D, 110H, and 110I may be inverted, and the positions of the Victim conductor loop 1101 and the Aggressor conductor loops 1102A and 1102B may be made upside down.

As described above, the number and arrangement of the semiconductor substrates including the Victim conductor loop 1101 and the Aggressor conductor loops 1102A and 1102B, and the presence or absence of the support substrate can have various structures.

The Aggressor conductor loop that generates the magnetic flux passing through the loop plane of the Victim conductor loop may or may not overlap with the Victim conductor loop. Moreover, the Aggressor conductor loop may be formed in a plurality of semiconductor substrates stacked on the semiconductor substrate in which the Victim conductor loop is formed, or may be formed in the same semiconductor substrate as the Victim conductor loop.

Moreover, the Aggressor conductor loop is not a semiconductor substrate, and for example, various substrates such as a printed circuit board, a flexible printed circuit board, an interposer substrate, a package substrate, an inorganic substrate, and an organic substrate are conceivable. However, it is sufficient that any substrate may be used as long as the substrate includes a conductor or can form a conductor, and may exist in a circuit other than the semiconductor substrate such as a package in which the semiconductor substrate is sealed. In general, the distance of the Aggressor conductor loop to the Victim conductor loop becomes shorter in the order of the case where the Aggressor conductor loop is formed in the semiconductor substrate, the case where the Aggressor conductor loop is formed in the package, and the case where the Aggressor conductor loop is formed in the printed circuit board. Since the inductive noise and capacitive noise that can occur in the Victim conductor loop are more likely to increase as the distance of the Aggressor conductor loop to the Victim conductor loop is shorter, the present technology can be more effective as the distance of the Aggressor conductor loop to the Victim conductor loop is shorter. Moreover, application of the present technology is not limited to the substrates. The present technology can be applied to conductors themselves represented by wires and plates, such as bonding wires, lead wires, antenna wires, power wires, GND wires, coaxial wires, dummy wires, and sheet metal.

Figure 111:
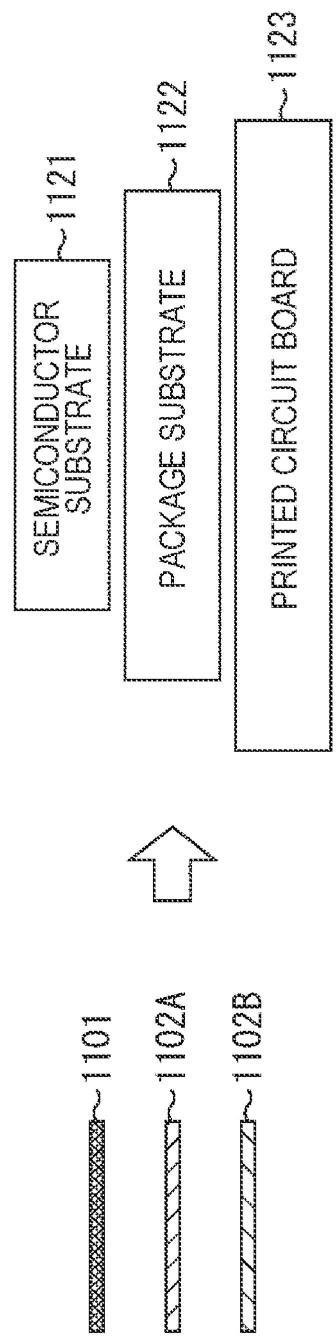
FIG. 111 is diagrams illustrating arrangement examples of the Victim conductor loop and the Aggressor conductor loop in a structure in which three types of substrates are stacked.

Next, as illustrated in FIG. 111, in a structure in which three types of substrates: a semiconductor substrate 1121, a package substrate 1122, and a printed circuit board 1123 are stacked, examples of arranging a conductor 1101 (hereinafter referred to as Victim conductor loop 1101), which is at least a part of the Victim conductor loop, and conductors 1102A and 1102B that are at least a part of the Aggressor conductor loop (hereinafter referred to as Aggressor conductor loops 1102A and 1102B) will be described. Note that although not shown, the Victim conductor loop or Aggressor conductor loop may include at least conductors arranged in two or more of the semiconductor substrate 1121, the package substrate 1122, and the printed circuit board 1123. The semiconductor substrate 1121 can be replaced with any of a package substrate, an interposer substrate, a printed circuit board, a flexible printed circuit board, an inorganic substrate, an organic substrate, a substrate including a conductor, or a substrate capable of forming a conductor. Furthermore, the package substrate 1122 can be replaced with any of a semiconductor substrate, an interposer substrate, a printed circuit board, a flexible printed circuit board, an inorganic substrate, an organic substrate, a substrate including a conductor, or a substrate capable of forming a conductor. Moreover, the printed circuit board 1123 can be replaced with any of a semiconductor substrate, a package substrate, an interposer substrate, a flexible printed circuit board, an inorganic substrate, an organic substrate, a substrate including a conductor, or a substrate capable of forming a conductor.

FIGS. 112A, 112B, 112C, 112D, 112E, 112F, 112D, 112H, 112I, 112J, 112K, 112L, 112M, 112N, 112O, 112P, 112Q, and 112R illustrate arrangement examples of the Victim conductor loop and the Aggressor conductor loop in a stacked structure in which the three types of substrates illustrated in FIG. 111 are stacked.

Figures 112A, 112B, 112C, 112D, 112E, 112F, 112G, 112H, 112I, 112J, 112K, 112L, 112M, 112N, 112O, 112P, 112Q, 112R:
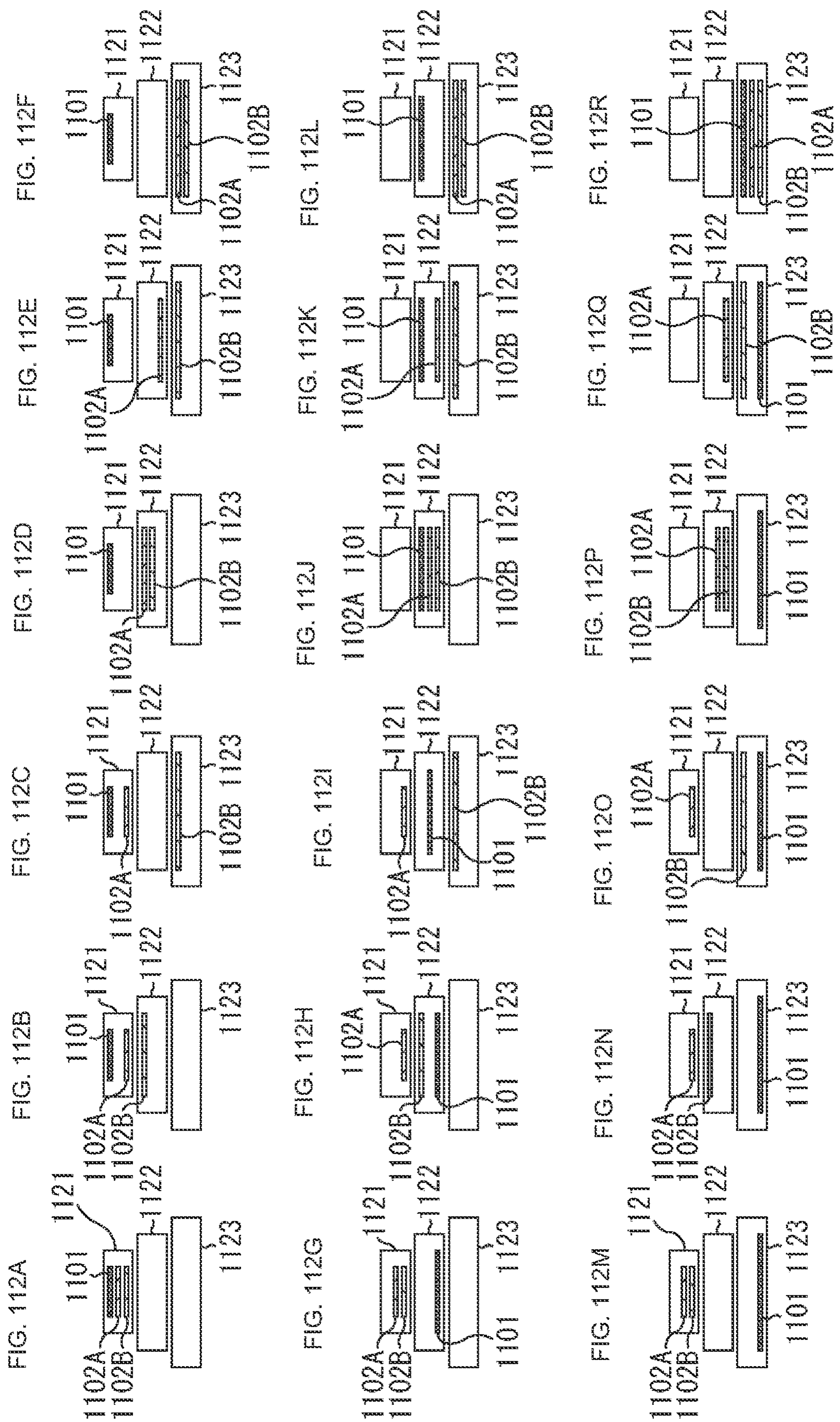
FIGS. 112A, 112B, 112C, 112D, 112E, 112F, 112G, 112H, 112I, 112J, 112K, 112L, 112M, 112N, 112O, 112P, 112Q, and 112R are diagrams illustrating arrangement examples of the Victim conductor loop and the Aggressor conductor loop in a structure in which three types of substrates are stacked.

FIG. 112A illustrates a schematic diagram of a stacked structure in which the Victim conductor loop 1101 and the Aggressor conductor loops 1102A and 1102B are all included in the semiconductor substrate 1121. The package substrate and the printed circuit board 1123 in which none of the Victim conductor loop 1101 and the Aggressor conductor loops 1102A and 1102B are formed may be omitted.

FIG. 112B illustrates a schematic diagram of a stacked structure in which the Victim conductor loop 1101 and the Aggressor conductor loop 1102A are included in the semiconductor substrate 1121 and the Aggressor conductor loop 1102B is included in the package substrate 1122. The printed circuit board 1123 in which none of the Victim conductor loop 1101 and the Aggressor conductor loops 1102A and 1102B are formed may be omitted.

FIG. 112C illustrates a schematic diagram of a stacked structure in which the Victim conductor loop 1101 and the Aggressor conductor loop 1102A are included in the semiconductor substrate 1121 and the Aggressor conductor loop 1102B is included in the printed circuit board 1123. The package substrate 1122 in which none of the Victim conductor loop 1101 and the Aggressor conductor loops 1102A and 1102B are formed may be omitted.

FIG. 112D illustrates a schematic diagram of a stacked structure in which the Victim conductor loop 1101 is included in the semiconductor substrate 1121 and the Aggressor conductor loops 1102A and 1102B are included in the package substrate 1122. The printed circuit board 1123 in which none of the Victim conductor loop 1101 and the Aggressor conductor loops 1102A and 1102B are formed may be omitted.

FIG. 112E illustrates a schematic diagram of a stacked structure in which the Victim conductor loop 1101 is included in the semiconductor substrate 1121, the Aggressor conductor loop 1102A is included in the package substrate 1122, and the Aggressor conductor loop 1102B is included in the printed circuit board 1123.

FIG. 112F illustrates a schematic diagram of a stacked structure in which the Victim conductor loop 1101 is included in the semiconductor substrate 1121 and the Aggressor conductor loops 1102A and 1102B are included in the printed circuit board 1123. The package substrate 1122 in which none of the Victim conductor loop and the Aggressor conductor loops 1102A and 1102B are formed may be omitted.

FIG. 112G illustrates a schematic diagram of a stacked structure in which the Aggressor conductor loops 1102A and 1102B are included in the semiconductor substrate 1121 and the Victim conductor loop 1101 is included in the package substrate 1122. The printed circuit board 1123 in which none of the Victim conductor loop 1101 and the Aggressor conductor loops 1102A and 1102B are formed be omitted.

FIG. 112H illustrates a schematic diagram of a stacked structure in which the Aggressor conductor loop 1102A is included in the semiconductor substrate and the Aggressor conductor loop 1102B and the Victim conductor loop 1101 are included in the package substrate 1122. The printed circuit board 1123 in which none of the Victim conductor loop 1101 and the Aggressor conductor loops 1102A and 1102B are formed may be omitted.

FIG. 112I illustrates a schematic diagram of a stacked structure in which the Aggressor conductor loop 1102A is included in the semiconductor substrate 1121, the Victim conductor loop 1101 is included in the package substrate 1122, and the Aggressor conductor loop 1102B is included in the printed circuit board 1123.

FIG. 112J illustrates a schematic diagram of a stacked structure in which the Victim conductor loop 1101 and the Aggressor conductor loops 1102A and 1102B are all included in the package substrate 1122. The semiconductor substrate and the printed circuit board 1123 in which none of the Victim conductor loop 1101 and the Aggressor conductor loops 1102A and 1102B are formed may be omitted.

FIG. 112K illustrates a schematic diagram of a stacked structure in which the Victim conductor loop 1101 and the Aggressor conductor loop 1102A are included in the package substrate 1122 and the Aggressor conductor loop 1102B is included in the printed circuit board 1123. The semiconductor substrate 1121 in which none of the Victim conductor loop 1101 and the Aggressor conductor loops 1102A and 1102B are formed may be omitted.

FIG. 112L illustrates a schematic diagram of a stacked structure in which the Victim conductor loop 1101 is included in the package substrate 1122 and the Aggressor conductor loops 1102A and 1102B are included in the printed circuit board 1123. The semiconductor substrate 1121 in which none of the Victim conductor loop and the Aggressor conductor loops 1102A and 1102B are formed may be omitted.

FIG. 112M illustrates a schematic diagram of a stacked structure in which the Aggressor conductor loops 1102A and 1102B are included in the semiconductor substrate 1121 and the Victim conductor loop 1101 is included in the printed circuit board 1123. The package substrate 1122 in which none of the Victim conductor loop 1101 and the Aggressor conductor loops 1102A and 1102B are formed may be omitted.

FIG. 112N illustrates a schematic diagram of a stacked structure in which the Aggressor conductor loop 1102A is included in the semiconductor substrate 1121, the Aggressor conductor loop 1102B is included in the package substrate 1122, and the Victim conductor loop 1101 is included in the printed circuit board 1123.

FIG. 112O illustrates a schematic diagram of a stacked structure in which the Aggressor conductor loop 1102A is included in the semiconductor substrate and the Aggressor conductor loop 1102B and the Victim conductor loop 1101 are included in the printed circuit board 1123. The package substrate 1122 in which none of the Victim conductor loop 1101 and the Aggressor conductor loops 1102A and 1102B are formed may be omitted.

FIG. 112P illustrates a schematic diagram of a stacked structure in which Aggressor conductor loops 1102A and 1102B are included in the package substrate 1122 and the Victim conductor loop 1101 is included in the printed circuit board 1123. The semiconductor substrate 1121 in which none of the Victim conductor loop 1101 and the Aggressor conductor loops 1102A and 1102B are formed may be omitted.

FIG. 112Q illustrates a schematic diagram of a stacked structure in which the Aggressor conductor loop 1102A is included in the package substrate 1122 and the Aggressor conductor loop 1102B and the Victim conductor loop 1101 are included in the printed circuit board 1123. The semiconductor substrate 1121 in which none of the Victim conductor loop 1101 and the Aggressor conductor loops 1102A and 1102B are formed may be omitted.

FIG. 112R illustrates a schematic diagram of a stacked structure in which the Victim conductor loop 1101 and the Aggressor conductor loops 1102A and 1102B are all included in the printed circuit board 1123. The semiconductor substrate 1121 and the package substrate 1122 in which none of the Victim conductor loop 1101 and the Aggressor conductor loops 1102A and 1102B are formed may be omitted.

The stacking order of the substrates illustrated in FIGS. 112A 112B, 112C, 112D, 112E, 112F, 112G, 112H, 112I, 112J, 112K, 112L, 112M, 112N, 112O, 112P, 112Q, and 112R may be inverted, and the positions of the Victim conductor loop 1101 and the Aggressor conductor loop 1102A or the Aggressor conductor loop 1102B may be made upside down.

As described above, the Victim conductor loop 1101 and the Aggressor conductor loops 1102A and 1102B can be formed in any region of the semiconductor substrate 1121, the package substrate 1122, and the printed circuit board 1123.

Package Stacking Examples of First Semiconductor Substrate 101 and Second Semiconductor Substrate 102 Forming Solid-state Imaging Device 100

Figure 113A:
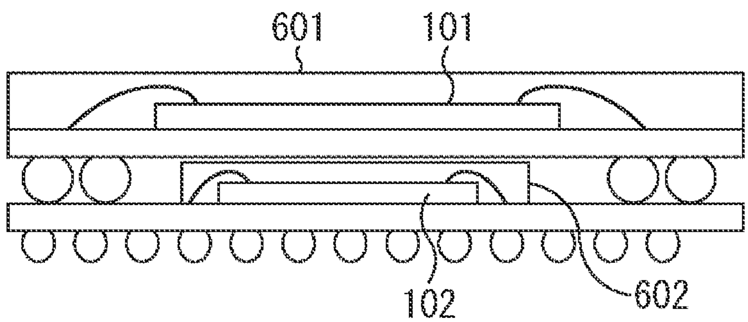
FIGS. 113A, 113B, and 113C are diagrams illustrating package stacking examples of a first semiconductor substrate and a second semiconductor substrate forming a solid-state imaging device.
Figure 113B:
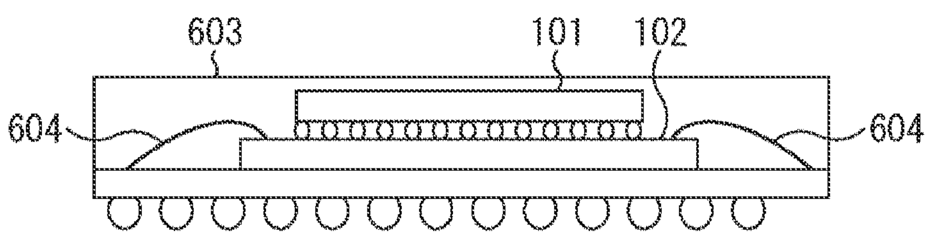
Figure 113C:
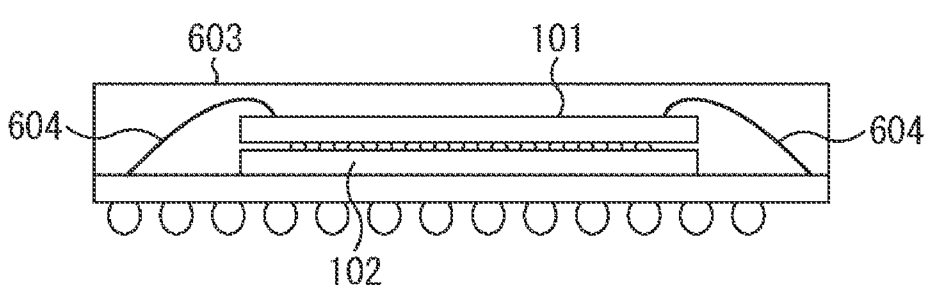

FIGS. 113A, 113B, and 113C are diagrams illustrating package stacking examples of the first semiconductor substrate 101 and the second semiconductor substrate 102 forming the solid-state imaging device 100.

The first semiconductor substrate 101 and the second semiconductor substrate 102 may be stacked in any manner as a package.

For example, as illustrated in FIG. 113A, the first semiconductor substrate 101 and the second semiconductor substrate 102 are individually sealed with a sealing material, and resulting packages 601 and 602 may be stacked.

Furthermore, as illustrated in FIG. 113B or 113C, the first semiconductor substrate 101 and the second semiconductor substrate 102 may be stacked and sealed with a sealing material to form a package 603. In this case, a bonding wire 604 may be connected to the second semiconductor substrate 102 as illustrated in FIG. 1138 or may be connected to the first semiconductor substrate as illustrated in FIG. 113C.

Moreover, the package may be in any form. For example, the package may be a chip size package (CSP) or a wafer level chip size package (WL-CSP), and an interposer board or a rewiring layer may be used in the package. Furthermore, any form without a package may be adopted. For example, a semiconductor substrate may be mounted as a chip on board (COB). For example, any of the following forms may be adopted: ball grid array BGA), chip on board (COB), chip on tape (COT), chip size package/chip scale package (CSP), dual in-line memory module (DIMM), dual in-line package (DIP), fine-pitch ball grid array (FBGA), fine-pitch land grid array (FLGA), fine-pitch quad flat package (FQFP), single in-line package with heatsink (HSIP), leadless chip carrier (LCC), low profile fine pitch land grid array (LFLGA), land grid array (LGA), low-profile quad flat package (LQFP), multi-chip fine-pitch ball grid array (MC-FBGA), multi-chip module (MCM), multi-chip package (MCP), molded chip size package (M-CSP), mini flat package (MFP), metric quad flat package (MQFP), metal quad (MQUAD), micro small outline package (MSOP), pin grid array (PGA), plastic leaded chip carrier (PLCC), plastic leadless chip carrier (PLCC), quad flat i-leaded package (QFI), quad flat j-leaded package (QFJ), quad flat non-leaded package (QFN), quad flat package (QFP), quad tape carrier package (QTCP), quad in-line package (QUIP), shrink dual in-line package (SDIP), single in-line memory module (SIMM), single in-line package (SIP), stacked multi chip package (S-MCP), small outline non-leaded board (SNB), small outline i-leaded package (SOI), small outline j-leaded package (SOJ), small outline non leaded package (SON), small outline package (SOP), shrink single in-line package (SSIP), shrink small outline package (SSOP), shrink zigzag in-line package (SZIP), tape-automated bonding (TAB), tape carrier package (TCP), thin quad flat package (TQFP), thin small outline package (TSOP), thin shrink small outline package (TS-SOP), ultra chip scale package (UCSP), ultra thin small outline package (UTSOP), very short pitch small outline package (VSO), very small outline package (VSOP), wafer level chip size package (WL-CSP), zigzag in-line package (ZIP), and micro multi-chip package (μMCP).

The present technology can be applied to, for example, any sensor such as charge-coupled device (CCD) image sensor, CCD sensor, CMOS sensor, MOS sensor, infrared (IR) sensor, ultraviolet (UV) sensor, time of flight (ToF) sensor, or distance measurement sensor, a circuit board, a device, or an electronic device.

Furthermore, the present technology is suitable for, but not limited to, sensors, circuit boards, devices, and electronic devices in which some devices such as transistors, diodes, and antennas arrayed, and is particularly suitable for, but not limited to, sensors, circuit boards, devices, and electronic devices in which some devices are arrayed on substantially the same plane.

The present technology can be applied to, for example, various memory sensors related to memory devices, circuit boards for memory, memory devices, or electronic devices including memories, various CCD sensors related to CCD, circuit boards for CCD, CCD devices, or electronic devices including CCDs, various CMOS sensors related to CMOS, circuit boards for CMOS, CMOS devices, or electronic devices including CMOSs, various MOS sensors related to MOS, circuit boards for MOS, MOS devices, or electronic devices including MOSs, various display sensors related to light emitting devices, circuit boards for display, display devices, or electronic devices including displays, various laser sensors related to light emitting devices, laser circuit boards, laser devices, or electronic devices including lasers, or various antenna sensors related to antenna devices, antenna circuit boards, antenna devices, electronic devices including antennas, or the like. Among them, the present technology can be favorably applied to, but not limited to, sensors including the Victim conductor loop with variable loop paths, sensors including circuit boards, devices, electronic devices, or control lines or signal lines, sensors including circuit boards, devices, electronic devices, or horizontal control lines or vertical signal lines, circuit boards, devices, electronic devices, or the like.

11. Arrangement Example of Conductive Shield

In the above-described configuration examples, the inductive noise being able to be reduced by devising the configurations of the conductor layer A (wiring layer 165A) and the conductor layer B (wiring layer 165B) has been described. A configuration for further improving the inductive noise by further including a conductive shield will be described.

FIGS. 114A, 114B, 114C, 115A, 115B, and 115C are cross-sectional views illustrating configuration examples in which the conductive shield is provided for the solid-state imaging device 100 in which the first semiconductor substrate 101 and the second semiconductor substrate 102 illustrated in FIG. 6 are stacked.

Note that, in FIGS. 114A, 114B, 114C, 115A, 115B, and 115C and, description of configurations other than the conductive shield is omitted as appropriate as the configurations are similar to the structure illustrated in FIG. 6.

Figure 114A:
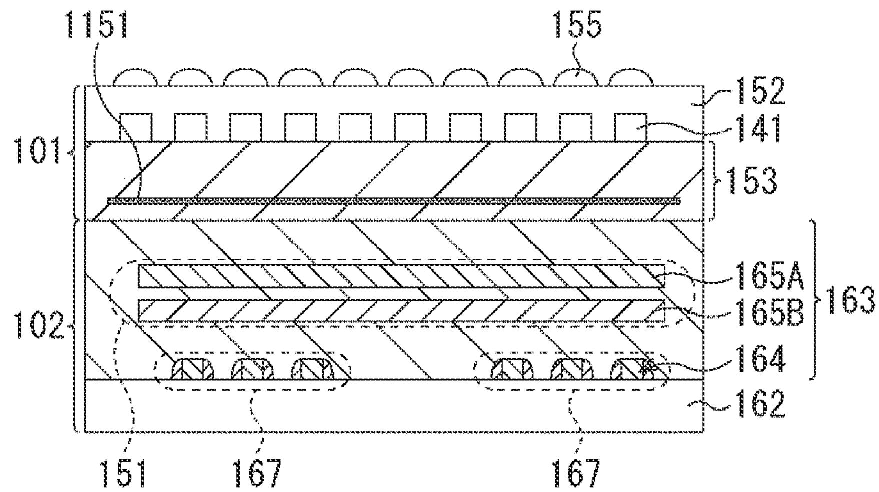
FIGS. 114A, 114B, and 114C are cross-sectional views illustrating configuration examples provided with a conductive shield.
Figure 114B:
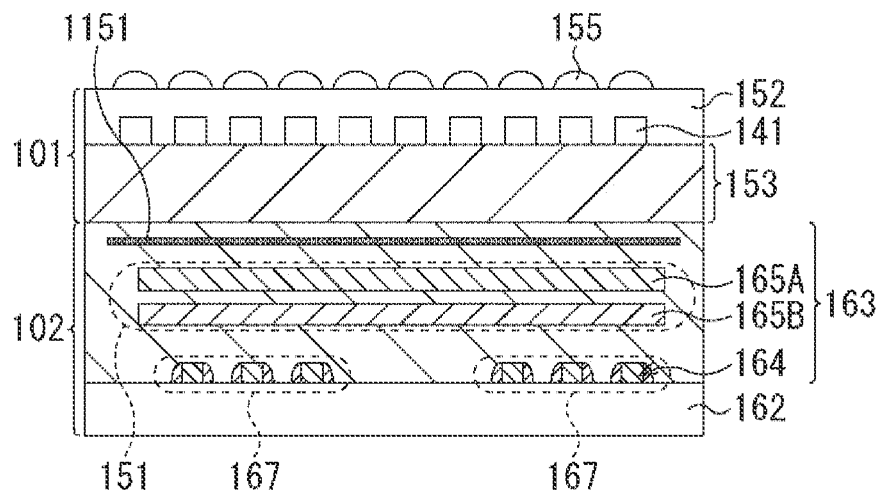

FIG. 114A is a cross-sectional view illustrating a first configuration example in which a conductive shield is provided for the solid-state imaging device 100 illustrated in FIG. 6

FIG. 114, a conductive shield 1151 is formed in the multilayer wiring layer 153 of the first semiconductor substrate 101.

FIG. 1148 is a cross-sectional view illustrating a second configuration example in which a conductive shield is provided for the solid-state imaging device 100 illustrated in FIG. 6

In FIG. 1148 the conductive shield 1151 is formed in the multilayer wiring layer 163 of the second semiconductor substrate 102.

Figure 114C:
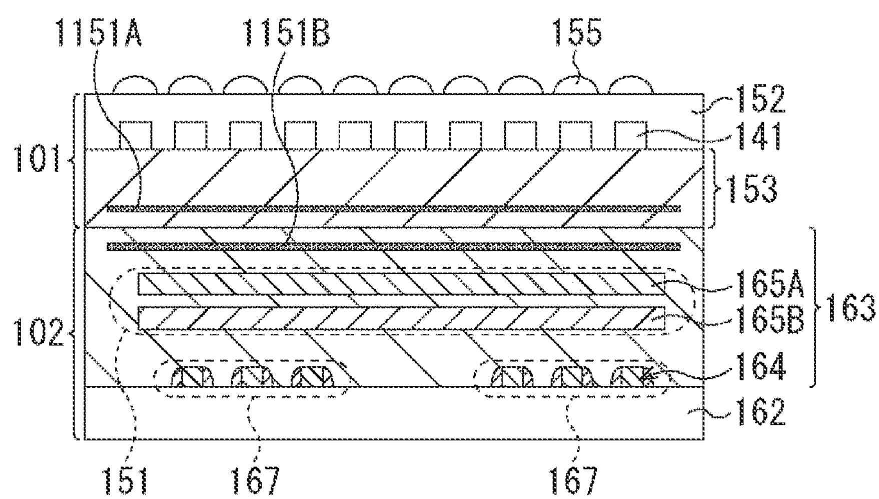

FIG. 114C is a cross-sectional view illustrating a third configuration example in which a conductive shield is provided for the solid-state imaging device 100 illustrated in FIG. 6

FIG. 114C, the conductive shield 1151 is formed in each of the multilayer wiring layers of the first semiconductor substrate 101 and the second semiconductor substrate 102. More specifically, the conductive shield 1151A is formed in the multilayer wiring layer 153 of the first semiconductor substrate 101, and the conductive shield 1151B is formed in the multilayer wiring layer 163 of the second semiconductor substrate 102.

Figure 115A:
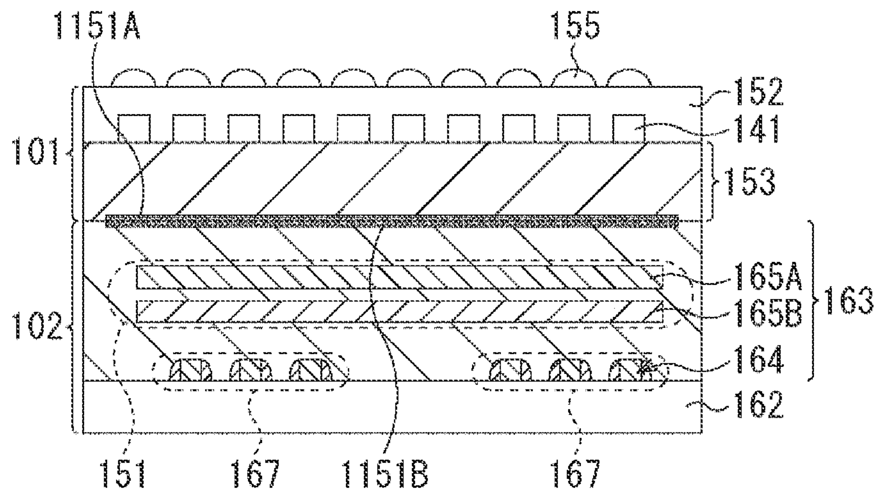
FIGS. 115A, 115B, and 115C are cross-sectional views illustrating configuration examples provided with a conductive shield.

FIG. 115A is a cross-sectional view illustrating a fourth configuration example in which a conductive shield is provided for the solid-state imaging device 100 illustrated in FIG. 6

FIG. 115A the conductive shield 1151 is formed in each of the multilayer wiring layers of the first semiconductor substrate 101 and the second semiconductor substrate 102, and the conductive shields 1151 are bonded. More specifically, a conductive shield 1151A is formed on a bonding surface in the multilayer wiring layer 153 of the first semiconductor substrate 101, the bonding surface being for bonding with the multilayer wiring layer 163 of the second semiconductor substrate 102, a conductive shield 1151B is formed on a bonding surface in the multilayer wiring layer of the second semiconductor substrate 102, the bonding surface for bonding with the multilayer wiring layer 153 of the first semiconductor substrate 101, and the conductive shields 1151A and 1151B are bonded by similar metal bonding such as Cu—Cu bonding, Au—Au bonding, or Al—Al bonding, or dissimilar metal bonding such as Cu—Au bonding, Cu—Al bonding, or Au—Al bonding.

Note that FIGS. 114C and 115A are examples in which plane regions of the conductive shields 1151A and 1151B match, but at least the plane regions overlap and are bonded in part.

FIG. 1158 is a cross-sectional view illustrating a fifth configuration example in which a conductive shield is provided for the solid-state imaging device 100 illustrated in FIG. 6

Figure 115B:
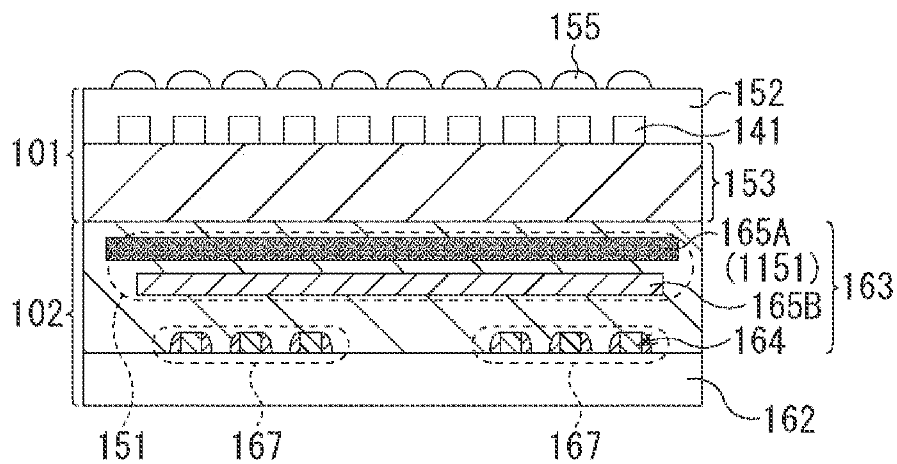

FIG. 115B illustrates a configuration in which the wiring layer 165A, which is the conductor layer A, also functions as the conductive shield 1151. A part of the wiring layer 165A may be the conductive shield 1151.

Figure 115C:
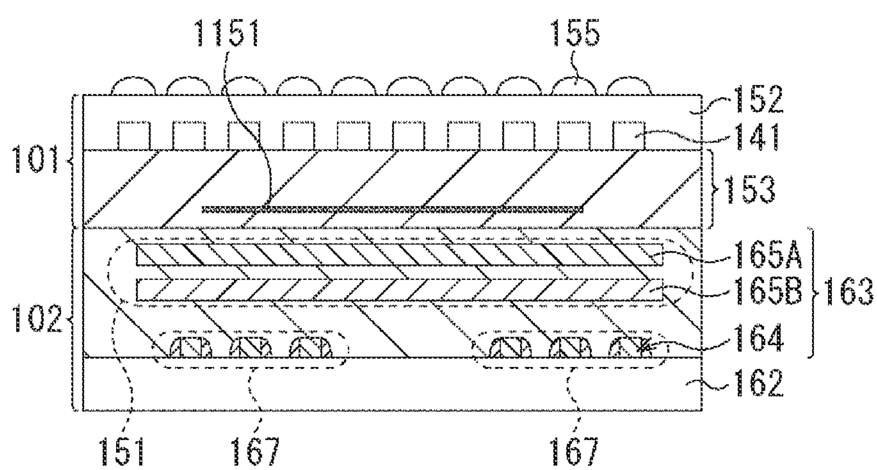

FIG. 115C is a cross-sectional view illustrating a sixth configuration example in which a conductive shield is provided for the solid-state imaging device 100 illustrated in FIG. 6

In the sixth configuration example in FIG. 115C, the conductive shield 1151 is formed in the multilayer wiring layer 153, similarly to the first configuration example illustrated in FIG. 114, but the plane region in which the conductive shield is formed is smaller than the plane region of the wiring layer 165A as the conductor layer A and the wiring layer 165B as the conductor layer B.

The area of the plane region where the conductive shield 1151 is formed is favorably equal to or larger than the area of the plane region of the wiring layer 165A as the conductor layer A and the wiring layer 165B as the conductor layer B, as in the first configuration example in FIG. 114A, but may be smaller, as in FIG. 115B.

The inductive noise can be further improved by providing the conductive shield 1151, as in the first to sixth configuration examples in FIGS. 114A, 114B, 114C, 115A, 115B, and 115C.

In the first to sixth configuration examples in FIGS. 114A, 114B, 114C, 115A, 115B, and 115C, the wiring layers shielded by the conductive shield 1151 are two layers of the wiring layers 165A and 165B, but one layer may be shielded.

In the first to sixth configuration examples in FIGS. 114A, 114B, 114C, 115A, 115B, and 115C, a magnetic shield may be used instead of the conductive shield 1151. The magnetic shield may be conductive or non-conductive. In the case where the magnetic shield is conductive, the inductive noise and the capacitive noise can be further improved.

Next, the arrangement and the planar shape of the conductive shield 1151 with respect to the signal line 132 formed in the first semiconductor substrate 101 will be described with reference to FIGS. 116A, 116B, 117A, 117B, 118A, 118B, 119A, and 119B.

FIGS. 116A, 116B, 117A, 117B, 118A, 118B, 119A, and 119B illustrate first to fourth configuration examples of the arrangement and the planar shape of the conductive shield 1151 with respect to the signal line 132. The first to fourth configuration examples in FIGS. 116A, 116B, 117A, 117B, 118A, 118B, 119A, and 119B have the same configuration other than the planar shape of the conductive shield 1151.

Figure 116A:
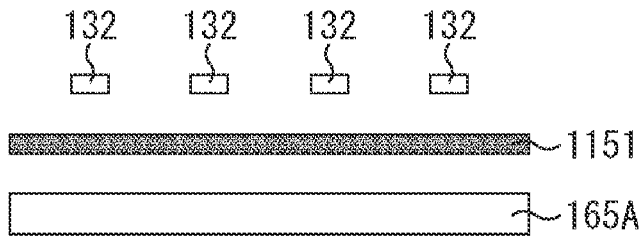
FIGS. 116A and 116B are diagrams illustrating a first configuration example of arrangement of a conductive shield with respect to a signal line and a planar shape.
Figure 116B:
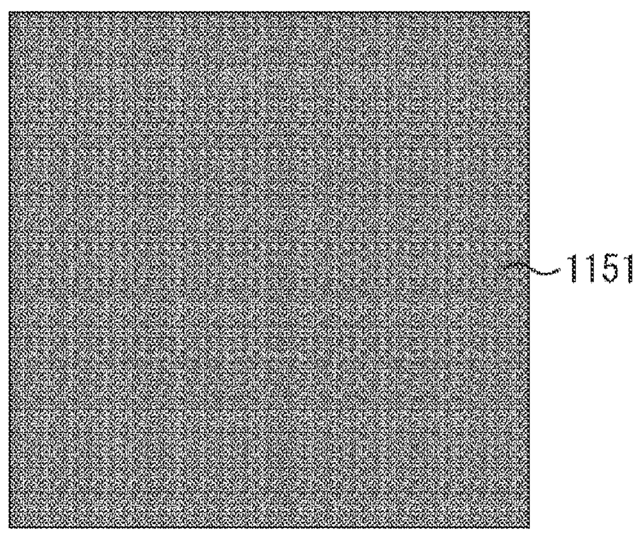

FIG. 116A is a cross-sectional view illustrating a positional relationship in the Z direction of the signal line 132 through which an analog pixel signal is transmitted on the first semiconductor substrate 101, the conductive shield 1151, and the wiring layer 165A. FIG. 1168 is a plan view illustrating a planar shape of the conductive shield 1151.

As illustrated in FIG. 116A, the conductive shield 1151 is arranged between the signal line 132 and the wiring layer 165A. As illustrated in FIG. 1168, the planar shape of the conductive shield 1151 can be formed in a planar shape.

Figure 117A:
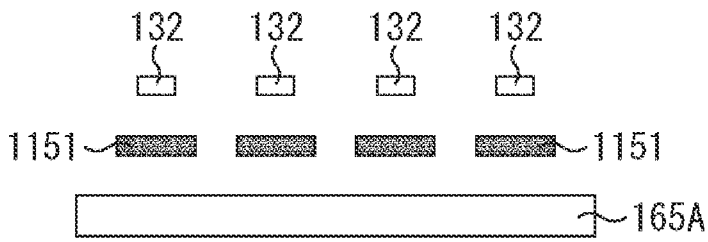
FIGS. 117A and 117B diagrams illustrating a second configuration example of arrangement of a conductive shield with respect to a signal line and a planar shape.
Figure 117B:
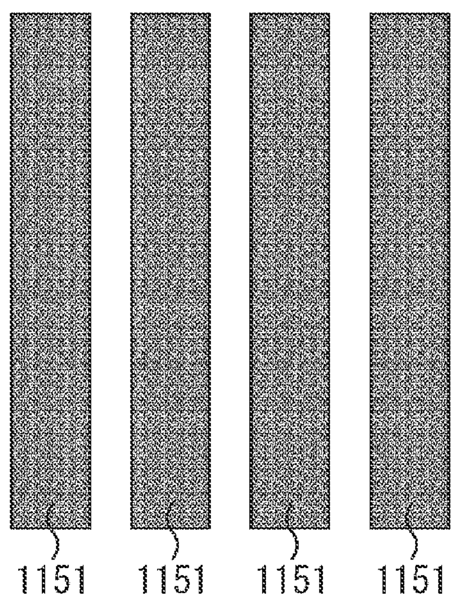

Alternatively, as in the second configuration example in FIGS. 117A and 117B, the planar shape of the conductive shield 1151 is formed in a linear shape, and each linear region can be formed to correspond to and overlap with the signal line 132 in a one-to-one manner.

Figure 118A:
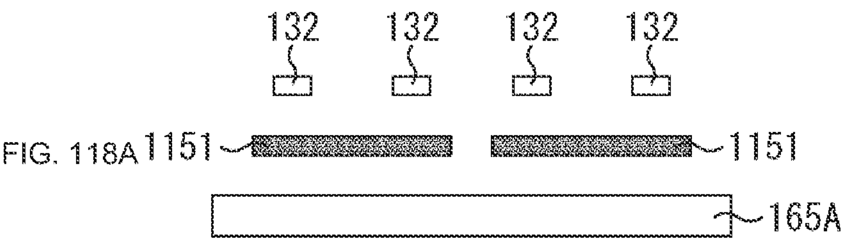
FIGS. 118A and 118B are diagrams illustrating a third configuration example of arrangement of a conductive shield with respect to a signal line and a planar shape.
Figure 118B:
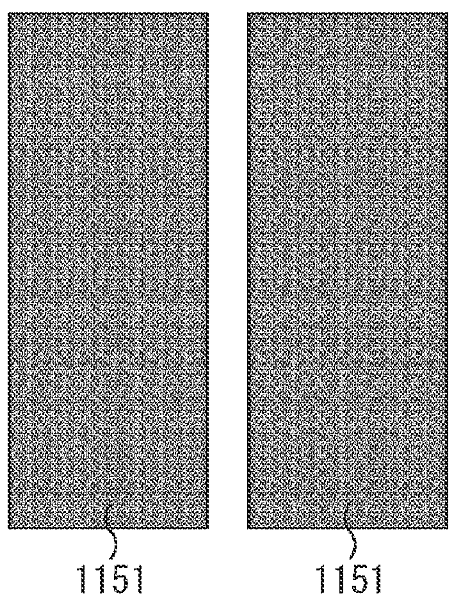

Alternatively, each linear region of the conductive shield 1151 does not have to correspond one-to-one with the signal line 132, as in the second configuration example in FIGS. 117A and 117B. For example, one linear region may be formed to overlap with a plurality of signal lines 132, as in the third configuration example in FIGS. 118A and 118B. FIGS. 118A and 118B illustrate a planar shape in which one linear region of the conductive shield 1151 corresponds to two signal lines 132. However, a planar shape corresponding to three or more signal lines 132 may be adopted.

Figure 119A:
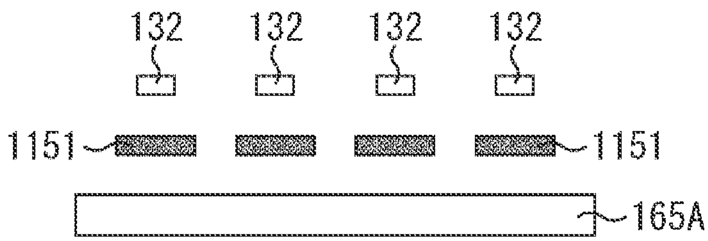
FIGS. 119A and 119B are diagrams illustrating a fourth configuration example of arrangement of a conductive shield with respect to a signal line and a planar shape.
Figure 119B:
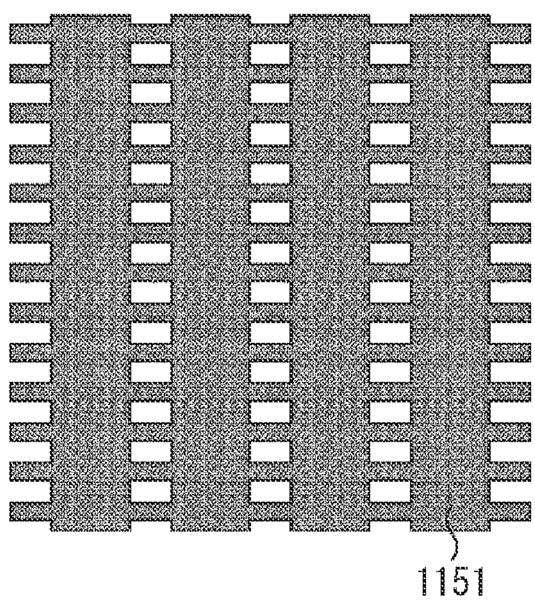

Alternatively, the planar shape of the conductive shield 1151 may be formed in a reticulated shape, as in the fourth configuration example in FIGS. 119A and 119B, instead of the linear shape. Conductor widths, gap widths, and conductor periods of a vertical conductor extending in the vertical direction (Y direction) of the reticulated conductive shield 1151, and of a horizontal conductor extending in the horizontal direction (X direction) may be different or the same.

In the first to fourth configuration examples in FIGS. 116A, 1168, 117A, 117B, 118A, 118B, 119A, and 119B the conductive shield 1151 is placed in one layer but can be placed in two layers, as illustrated in FIG. 114C and in FIG. 115A. Furthermore, the wiring layer 165A illustrated in FIGS. 116A, 116B, 117A, 117B, 118A, 118B, 119A, and 119B is similarly applied to the wiring layer 165B.

The conductive shield 1151 is formed at a position where the conductive shield 1151 overlaps with the entire region of the signal line 132, but may be at a position where the conductive shield 1151 overlaps with a part of the region or a position where the conductive shield 1151 does not overlap with the region. Note that since noise is often propagated via a signal line, the conductive shield 1151 is favorably located at the position where the conductive shield 1151 overlaps with the signal line 132.

Although the forming position of the conductive shield 1151 with respect to the signal line 132 through which the analog pixel signal is transmitted in the first semiconductor substrate 101 has been described, the configuration may be applied to another signal line for signal transmission, control line, wire, conductor, or GND, instead of the signal line 132 for pixel signal transmission. The conductive shield 1151 is favorably connected to the GND or the negative power supply to efficiently dissipate noise, but may be connected to another control line, another signal line, another conductor, or another wire. Alternatively, the conductive shield 1151 may not be connected to another control line, another signal line, another conductor, another wire, or the like.

By providing the conductive shield 1151, the inductive noise and the capacitive noise can be further improved.

12. Configuration Example of Case Having Three Conductor Layers

Arrangement Example of Case Having Three Conductor Layers

In each of the above-described configuration examples, the wiring pattern of the two conductor layers: the conductor layer A as the wiring layer 165A and the conductor layer B as the wiring layer 165B has been described.

However, a third conductor layer is sometimes further arranged near the two conductor layers of the wiring layer 165A (conductor layer A) and the wiring layer 165B (conductor layer B).

The third conductor layer is used as, for example, wiring for relaying the GND or the negative power supply to the Vss wiring of the conductor layer A as the wiring layer 165A, wiring for relaying the positive power supply to the Vdd wiring of the conductor layer B as the wiring layer 165B, reinforcing wiring for minimizing the voltage drop (IR-Drop) of the conductor layer A or the conductor layer B, or the like.

When the third conductor layer is referred to as a wiring layer 165C or a conductor layer C, corresponding to the names of the wiring layers 165A and 165B, and the conductor layers A and B in the above-described configuration examples, the wiring layer 165C that is the third conductor layer is arranged in any of the positional relationships in FIGS. 120A, 120B, and 120C with respect to the wiring layers 165A and 165B.

FIGS. 120A, 120B, and 120C are schematic cross-sectional views illustrating arrangement examples of the wiring layer 165C with respect to the wiring layers 165A and 165B.

In the first semiconductor substrate 101, at least a part of the control lines 133 for controlling the transistors of the pixels 131, or a wiring layer 170 (fourth conductor layer) containing at least a part of the signal lines 132 for transmitting the pixel signals is formed. In the second semiconductor substrate 102, an active element layer 171 including active elements such as the MOS transistor 164 is formed. At least a part of the control lines 133 or at least a part of the signal lines 132 may form at least a part of the Victim conductor loop (Victim conductor loop 11 or Victim conductor loop 1101), but this is not the case.

As described with reference to FIG. 6 and the like, the wiring layer 165A is arranged on the wiring layer 170 side of the first semiconductor substrate 101, and the wiring layer 165B is arranged on the active element layer 171 side.

In contrast to the arrangement of the wiring layers 165A and 165B, the wiring layer 165C (conductor layer C) may be arranged between the wiring layer 165B and the active element layer 171 as illustrated in FIG. 120A. In this case, the wiring layers are stacked in the order of the wiring layer 170, the wiring layer 165A, the wiring layer 165B, the wiring layer 165C, and the active element layer 171 from the first semiconductor substrate 101 side.

Alternatively, the wiring layer 165C (conductor layer C) may be arranged between the wiring layer 165A and the wiring layer 165B, as illustrated in FIG. 120B. In this case, the wiring layers are stacked in the order of the wiring layer 170, the wiring layer 165A, the wiring layer 165C, the wiring layer 165B, and the active element layer 171 from the first semiconductor substrate 101 side.

Moreover, the wiring layer 165C (conductor layer C) may be arranged between the wiring layer 170 and the wiring layer 165A as illustrated in FIG. 120C. In this case, the wiring layers are stacked in the order of the wiring layer 170, the wiring layer 165C, the wiring layer 165A, the wiring layer 165B, and the active element layer from the first semiconductor substrate 101 side.

Note that FIGS. 120A, 120B, and 120C are diagrams illustrating the positional relationship among the three conductor layers of the wiring layers 165A to 165C, and the arrangement of a wiring layer 170 of the first semiconductor substrate and an active element layer 171 of the second semiconductor substrate 102 may be reversed. Furthermore, the first semiconductor substrate 101 does not have to include either the signal line 132 or the control line 133, and even in a case where the first semiconductor substrate 101 includes both the signal line 132 and the control line 133, it is sufficient that at least a part of either the signal line 132 or the control line 133 is formed in the wiring layer 170. Furthermore, the signal line 132 or the control line 133 may be provided in the second semiconductor substrate 102 instead of the first semiconductor substrate 101. Furthermore, at least a part of the signal line 132 or the control line 133 may be included in the first semiconductor substrate 101 and the second semiconductor substrate 102, and the signal line 132 or the control line 133 may straddle at least the first semiconductor substrate 101 and the second semiconductor substrate 102, for example. Furthermore, at least one of the wiring layer 165A, the wiring layer 165B, or the wiring layer 165C may be provided in the second semiconductor substrate 102 instead of the first semiconductor substrate 101. Furthermore, the arrangement of the wiring layer 170 of the first semiconductor substrate 101 and the active element layer 171 of the second semiconductor substrate may be omitted. Furthermore, the first semiconductor substrate 101 and the second semiconductor substrate 102 may not be separate bodies but may be integrally configured as one semiconductor substrate. Furthermore, the wiring layer 170 is interpreted as Victim conductor loop 1101, the wiring layer 165A is interpreted as Aggressor conductor loop 1102A, and the wiring layer 165B is interpreted as Aggressor conductor loop 1102B, and the wiring layer 165C may be arranged at an arbitrary position in the substrate arrangement examples illustrated in FIGS. 109A, 109B, 109C, 110A, 110B, 110C, 110D, 110E, 110F, 110G, 110H, 1101, 111, 112A, 112B. 112C, 112D, 112E, 112F, 112G, 112H, 112I, 112J, 112K, 112L, 112M, 112N, 112O, 112P, 112Q, and 112R. The positional relationship among the three conductor layers of the wiring layers 165A to 165C is desirably the positional relationship illustrated in FIGS. 120A, 120B, and 120C but this is not the case.

Problem of Case Having Three Conductor Layers

In each of the above-described configuration examples, the wiring layout for shielding the hot carrier light emission from the active element group 167 and improving at least the inductive noise, the capacitive noise, or the voltage drop in the two conductor layers of the conductor layer A (wiring layer 165A) and the conductor layer B (wiring layer 165B) has been proposed. However, the inductive noise may further deteriorate depending on the wiring layout of the third conductor layer.

FIGS. 121A, 121B, 121C, 121D, 121E, and 121F Arg diagrams illustrating examples of wiring patterns of the wiring layer 165C.

Figures 121A, 121B, 121C, 121D, 121E, 121F:
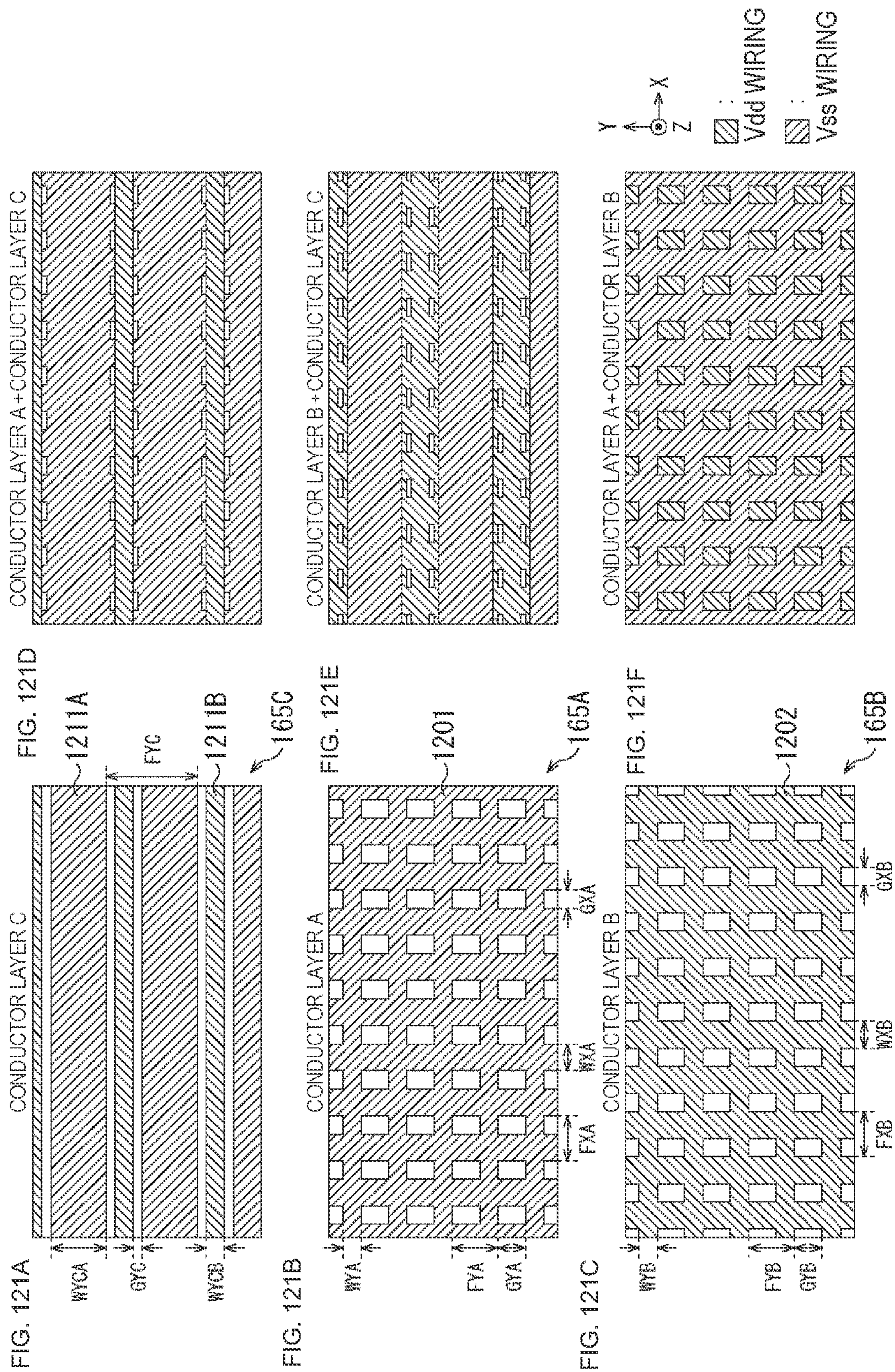

FIG. 121A illustrates the conductor layer C (wiring layer 165C), FIG. 121B illustrates the conductor layer A (wiring layer 165A), and FIG. 121C illustrates the conductor layer B (wiring layer 165B).

Furthermore, FIG. 121C is a plan view of a stacked state of the conductor layer A and the conductor layer C, FIG. 121E is a plan view of a stacked state of the conductor layer B and the conductor layer C, and FIG. 121E is a plan view of a stacked state of the conductor layer A and the conductor layer B.

In the coordinate system in FIGS. 121A, 121B, 121C, 121D, 121E, and F, the horizontal direction is the X axis, the vertical direction is the Y axis, and the direction perpendicular to the XY plane is the Z axis.

For the conductor layer A (wiring layer 165A) and the conductor layer B (wiring layer 165B) in FIGS. 121A, 121B, 121C, 121D, 121E, and 121F, the eleventh configuration example described with reference to FIGS. 36A, 36B, and 36C are adopted, which uses the reticulated conductor having the resistance value in the X direction (first direction) and the resistance value in the Y direction (second direction), which are different from each other.

The conductor layer AFB in FIG. 121B is configured by a reticulated conductor 1201. The reticulated conductor 1201 has the conductor width WXA, the gap width GXA, and the conductor period FXA in the X direction, and the conductor width WYA, the gap width GYA, and the conductor period FYA in the Y direction. The reticulated conductor 1201 is a conductor having a shape in which basic patterns (first basic pattern) of the conductor period FXA and the conductor period FYA are repeatedly arranged on the same plane. The reticulated conductor 1201 is, for example, wiring (Vss wiring) connected to the GND or the negative power supply.

In the reticulated conductor 1201, the conductor width WXA>the conductor width WYA and the gap width GYA>the gap width GXA. The gap region of the reticulated conductor 1201 has a shape longer in the Y direction than in the X direction, the resistance values are different between the X direction and the Y direction, and the resistance value in the Y direction is smaller than the resistance value in the X direction. Therefore, in the reticulated conductor 1201, the current is more likely to flow in the Y direction than in the X direction.

The conductor layer B in FIG. 121C is configured by a reticulated conductor 1202. The reticulated conductor 1202 has the conductor width WXB, the gap width GXB, and the conductor period FXB in the X direction, and the conductor width WYB, the gap width GYB, and the conductor period FYB in the Y direction. The reticulated conductor 1202 is a conductor having a shape in which basic patterns (second basic pattern) of the conductor period FXB and the conductor period FYB are repeatedly arranged on the same plane. The reticulated conductor 1202 is, for example, wiring (Vdd wiring) connected to the positive power supply.

In the reticulated conductor 1202, the conductor width WXB>the conductor width WYB and the gap width GYB>the gap width GXB. The gap region of the reticulated conductor 1202 has a shape longer in the Y direction than in the X direction, the resistance values are different between the X direction and the Y direction, and the resistance value in the Y direction is smaller than the resistance value in the X direction. Therefore, in the reticulated conductor 1202, the current is more likely to flow in the Y direction than in the X direction.

The reticulated conductor 1201 of the conductor layer A and the reticulated conductor 1202 of the conductor layer B form a differential structure. That is, as described in the eleventh configuration example and the like, the current distribution of the reticulated conductor 1201 of the conductor layer A and the current distribution of the reticulated conductor 1202 of the conductor layer B are substantially uniform and have opposite characteristics. Here, the substantially uniform is a difference in a range that can be regarded as uniform, but for example, the difference may be a difference in a range not exceeding at least twice. More specifically, an AC current substantially uniformly flows in ends of the reticulated conductor 1201 of the conductor layer A and the reticulated conductor 1202 of the conductor layer B, and current directions are opposite between the reticulated conductor 1201 and the reticulated conductor 1202. As a result, the magnetic field generated by the current distribution of the reticulated conductor 1201 and the magnetic field generated by the current distribution of the reticulated conductor 1202 are effectively canceled. As a result, the inductive noise can be suppressed.

The conductor layer B in FIG. 121C is configured by a reticulated conductor 1202. The reticulated conductor 1202 has the conductor width WXB, the gap width GXB, and the conductor period FXB in the X direction, and the conductor width WYB, the gap width GYB, and the conductor period FYB in the Y direction. The reticulated conductor 1202 is a conductor having a shape in which basic patterns (second basic pattern) of the conductor period FXB and the conductor period FYB are repeatedly arranged on the same plane. The reticulated conductor 1202 is, for example, wiring (Vdd wiring) connected to the positive power supply.

Furthermore, as illustrated in FIG. 121F, an opened region is no longer present due to the stacked layer of the conductor layer A and the conductor layer B. Therefore, the hot carrier light emission from the active element group 167 can be shielded.

Meanwhile, the conductor layer C in FIG. 121A is a conductor layer having a low sheet resistance through which a current easily flows, and a linear conductor 1211A long in the X direction and a linear conductor 1211B long in the X direction are alternately and periodically arranged in the Y direction. The linear conductor 1211A is, for example, wiring (Vss wiring) connected to the GND or the negative power supply. The linear conductor 1211B is, for example, wiring (Vdd wiring) connected to the positive power supply. The linear conductor 1211A is connected to, for example, a pad (not illustrated) on an outer periphery of the semiconductor substrate, and is electrically connected to the reticulated conductor 1201 of the conductor layer A. The reticulated conductor 1201 of the conductor layer A and the linear conductor 1211A of the conductor layer C may be electrically connected via, for example, a conductor via (VIA) extending in the Z direction. The linear conductor 1211B is connected to, for example, a pad (not illustrated) on an outer periphery of the semiconductor substrate, and is electrically connected to the reticulated conductor 1202 of the conductor layer B. The reticulated conductor 1202 of the conductor layer B and the linear conductor 1211B of the conductor layer C may be electrically connected via, for example, a conductor via (VIA) extending in the Z direction.

The linear conductor 1211A has a conductor width WYCA in the Y direction and the linear conductor 1211B has a conductor width WYCB in the Y direction, and the conductor width WYCA of the linear conductor 1211A is larger than the conductor width WYCB of the linear conductor 1211B (conductor width WYCA>conductor width WYCB). There is a gap with a gap width GYC between the linear conductor 1211A and the linear conductor 1211B in the Y direction. Then, the one linear conductor 1211A and the one linear conductor 1211B are periodically arranged in the Y direction with a conductor period FYC (=the conductor width WYCA+the conductor width WYCB+2×the gap width GYC).

When the conductor layer C in which the linear conductor 1211A and the linear conductor 1211B are periodically arranged in the Y direction in the conductor period FYC is viewed in a predetermined plane range (plane region), the sum of the conductor widths WYCA of a plurality of linear conductors 1211A and the sum of the conductor widths WYCB of a plurality of linear conductors 1211B in the predetermined plane range are significantly different because the conductor width WYCA of the linear conductor 1211A and the conductor width WYCB of the linear conductor 1211B are different. In this case, since the current distribution of the linear conductor 1211A and the current distribution of the linear conductor 1211B are significantly different, generation of the inductive noise cannot be suppressed and the inductive noise is deteriorated. Specifically, since the resistance value in the X direction significantly differs between the linear conductor 1211A and the linear conductor 1211B, the current distribution significantly differs between the linear conductor 1211A and the linear conductor 1211B, and the total amount of current flowing through the linear conductor 1211A becomes larger than the total amount of current flowing through the linear conductor 1211B. Furthermore, the total amount of current flowing through the reticulated conductor 1202 becomes larger than the total amount of current flowing through the reticulated conductor 1201 according to the law of current conservation (Kirchhoff's first law). As a result, since the current distribution significantly differs between the reticulated conductor 1201 and the reticulated conductor 1202, generation of the inductive noise cannot be suppressed and the inductive noise is deteriorated.

Therefore, the effect of suppressing the inductive noise in the two conductor layers of the conductor layer A or the conductor layer B is reduced depending on the wiring layout of the conductor layer C.

Therefore, hereinafter, a configuration of effectively reducing the inductive noise in a case of having a stacked structure of the three conductor layers of the wiring layers 165A to 165C will be described. Note that the configuration examples in FIGS. 121A, 121B, 121C, 121D, 121E, and 121F are not excluded because the configuration examples in FIGS. 121A, 121B, 121C, 121D, 121E, and 121F may be applicable depending on the magnitude of the inductive noise.

First Configuration Example of Three-layer Conductor Layer

FIGS. 122A, 122B, 122C, 122D, 122E, and 122F illustrate a first configuration example of a three-layer conductor layer.

Figures 122A, 122B, 122C, 122D, 122E, 122F:
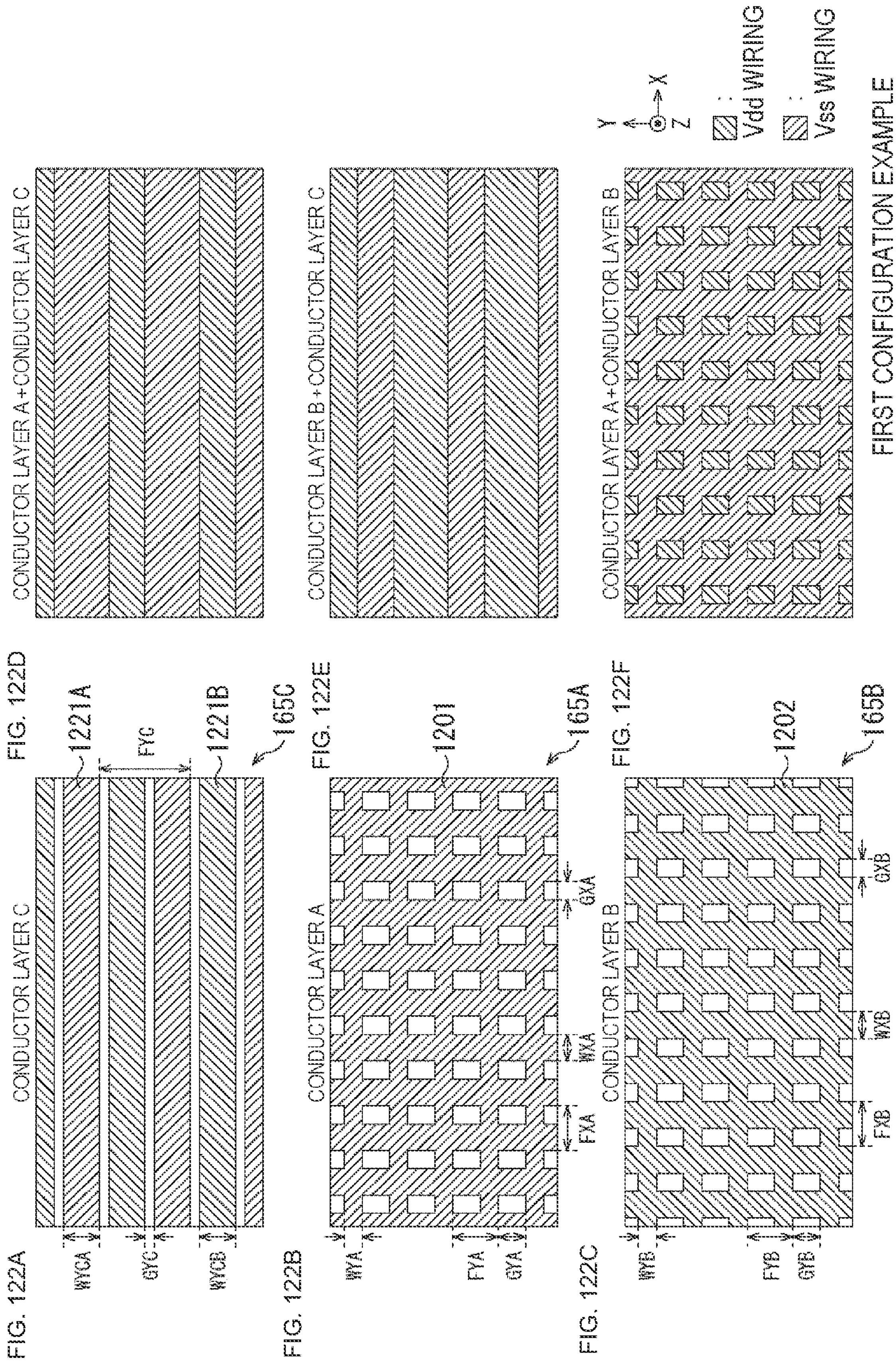

FIG. 122A illustrates the conductor layer C (wiring layer 165C), FIG. 122B illustrates the conductor layer A (wiring layer 165A), and FIG. 122D illustrates the conductor layer B (wiring layer 165B).

Furthermore, FIG. 122D is a plan view of a stacked state of the conductor layer A and the conductor layer C, FIG. 122E is a plan view of a stacked state of the conductor layer B and the conductor layer C, and FIG. 122F is a plan view of a stacked state of the conductor layer A and the conductor layer B.

The conductor layer FIGS. 122A and 122B are configured by the same reticulated conductor 1201 as in FIGS. 121A, 121B, 121C, 121D, 121E, and 121F. That is, the reticulated conductor 1201 has the conductor width WXA, the gap width GXA, and the conductor period FXA in the X direction, and the conductor width WYA, the gap width GYA, and the conductor period FYA in the Y direction. The reticulated conductor 1201 is a conductor having a shape in which basic patterns (first basic pattern) of the conductor period FXA and the conductor period FYA are repeatedly arranged on the same plane. The reticulated conductor 1201 is, for example, wiring (Vss wiring) connected to the GND or the negative power supply.

The conductor layer B in FIG. 122C is configured by the same reticulated conductor 1202 as in FIGS. 121A, 121B, 121C, 121D, 121E, and 121F. That is, the reticulated conductor 1202 has the conductor width WXB, the gap width GXB, and the conductor period FXB in the X direction, and the conductor width WYB, the gap width GYB, and the conductor period FYB in the Y direction. The reticulated conductor is a conductor having a shape in which basic patterns (second basic pattern) of the conductor period FXB and the conductor period FYB are repeatedly arranged on the same plane. The reticulated conductor 1202 is, for example, wiring (Vdd wiring) connected to the positive power supply. The conductor periods of the reticulated conductor 1201 and the reticulated conductor 1202 are the same. That is, the conductor period FXA=the conductor period FXB and the conductor period FYA=the conductor period FYB. In addition, the conductor periods may be substantially the same. Here, the substantially the same is a difference in a range that can be regarded as the same, but for example, the difference may be a difference in a range not exceeding at least twice.

The conductor layer FIG. 122A is a conductor layer having a low sheet resistance through which a current easily flows, and a linear conductor 1221A (third basic pattern) long in the X direction and a linear conductor 1221B (fourth basic pattern) long in the X direction are alternately and periodically arranged in the Y direction.

The linear conductor 1221A is, for example, wiring (Vss wiring) connected to the GND or the negative power supply. The linear conductor 1221B is, for example, wiring (Vdd wiring) connected to the positive power supply. The linear conductor 1221A and the linear conductor 1221B are differential conductors (differential structure) having the current directions opposite to each other. The linear conductor 1221A is connected to, for example, a pad (not illustrated) on an outer periphery of the semiconductor substrate, and is electrically connected to the reticulated conductor 1201 of the conductor layer A. The reticulated conductor 1201 of the conductor layer A and the linear conductor 1221A of the conductor layer C may be electrically connected via, for example, a conductor via (VIA) extending in the Z direction. The linear conductor 1221B is connected to, for example, a pad (not illustrated) on an outer periphery of the semiconductor substrate, and is electrically connected to the reticulated conductor 1202 of the conductor layer B. The reticulated conductor 1202 of the conductor layer B and the linear conductor 1221B of the conductor layer C may be electrically connected via, for example, a conductor via (VIA) extending in the Z direction.

The linear conductor 1221A has the conductor width WYCA in the Y direction and the linear conductor 1221B has the conductor width WYCB in the Y direction, and the conductor width WYCA of the linear conductor 1221A is the same as the conductor width WYCB of the linear conductor 1221B (conductor width WYCA=conductor width WYCB). Note that the conductor width WYCA and the conductor width WYCB may not be the same or may be substantially the same (the conductor width WYCA the conductor width WYCB). There is a gap with the gap width GYC between the linear conductor 1221A and the linear conductor 1221B in the Y direction.

Then, the one linear conductor 1221A and the one linear conductor 1221B are periodically arranged in the Y direction with the conductor period FYC (=the conductor width WYCA+the conductor width WYCB+2×the gap width GYC). The conductor period FYC of the linear conductor 1221A and the conductor period FYC of the linear conductor 1221B are the same or substantially the same.

Furthermore, the conductor period FYC that is a repetition period of the linear conductor 1221A of the conductor layer C is an integral multiple of the conductor period FYA that is a repetition period in the Y direction of the reticulated conductor 1201 of the conductor layer A. FIGS. 122A, 122B, 122C, 122D, 122E, and 122F illustrate an example in which the conductor period FYC is twice the conductor period FYA.

The conductor period FYC that is a repetition period of the linear conductor 1221B of the conductor layer C is an integral multiple of the conductor period FYB that is a repetition period in the Y direction of the reticulated conductor 1202 of the conductor layer B. FIGS. 122A, 122B, 122C, 122D, 122E, and 122F illustrate an example in which the conductor period FYC is twice the conductor period FYB.

Note that the conductor width WYCA, the conductor width WYCB, and the gap width GYC can be designed to arbitrary values.

When the conductor layer C in which the linear conductor 1221A and the linear conductor 1221B are periodically arranged in the Y direction in the conductor period FYC is viewed in a predetermined plane range (plane region), the sum of the conductor widths WYCA of a plurality of linear conductors 1221A and the sum of the conductor widths WYCB of a plurality of linear conductors 1221B in the predetermined plane range are the same or substantially the same because the conductor width WYCA of the linear conductor 1221A and the conductor width WYCB of the linear conductor 1221B are the same or substantially the same. As a result, the current distribution of the linear conductor 1221A and the current distribution of the linear conductor 1221B become the same or substantially the same, so that generation of inductive noise can be suppressed.

Furthermore, in a case where the conductor layer C is arranged near the wiring layer 170, as illustrated in FIG. 120C, for example, the capacitive noise due to capacitive coupling between the linear conductor 1221A and the linear conductor B of the conductor layer C, and the signal line 132 and the control line 133 of the wiring layer 170 can occur. However, since the linear conductor 1221A and the linear conductor 1221B have the same wiring pattern repeated in the Y direction, the capacitive noise can be completely canceled in the Y direction. The capacitive noise can be significantly improved as the conductor layer C is closer to the wiring layer 170.

As illustrated in FIG. 122F, the stacked layer of the conductor layers A and B has a light-shielding structure, and the hot carrier light emission from the active element group 167 can be shielded. In addition, as illustrated in FIGS. 122D and 122E and, the stacked layer of the conductor layers A and C and the stacked layer of the conductor layers B and C have also a light-shielding structure, and the light-shielding property is maintained. Thereby, since the light-shielding restrictions of the conductor layers A and B can be significantly alleviated, the conductive area of the conductor layers A and B can be used to the maximum, the wiring resistance can be lowered, and the voltage drop can be further improved. Furthermore, the degree of freedom in layout of the conductor layers A and B can be improved.

Moreover, in the case where the reticulated conductor 1201 of the conductor layer A and the linear conductor 1221A of the conductor layer C are electrically connected, and the reticulated conductor 1202 of the conductor layer B and the linear conductor 1221B of the conductor layer C are electrically connected, the current amount of the conductor layers A and B can be made small. Therefore, the inductive noise and the voltage drop from the conductor layer A or B can be further improved.

Second Configuration Example of Three-layer Conductor Layer

FIGS. 123A, 123B, 123C, 123D, 123E, and 123F illustrate a second configuration example of the three-layer conductor layer.

Figures 123A, 123B, 123C, 123D, 123E, 123F:
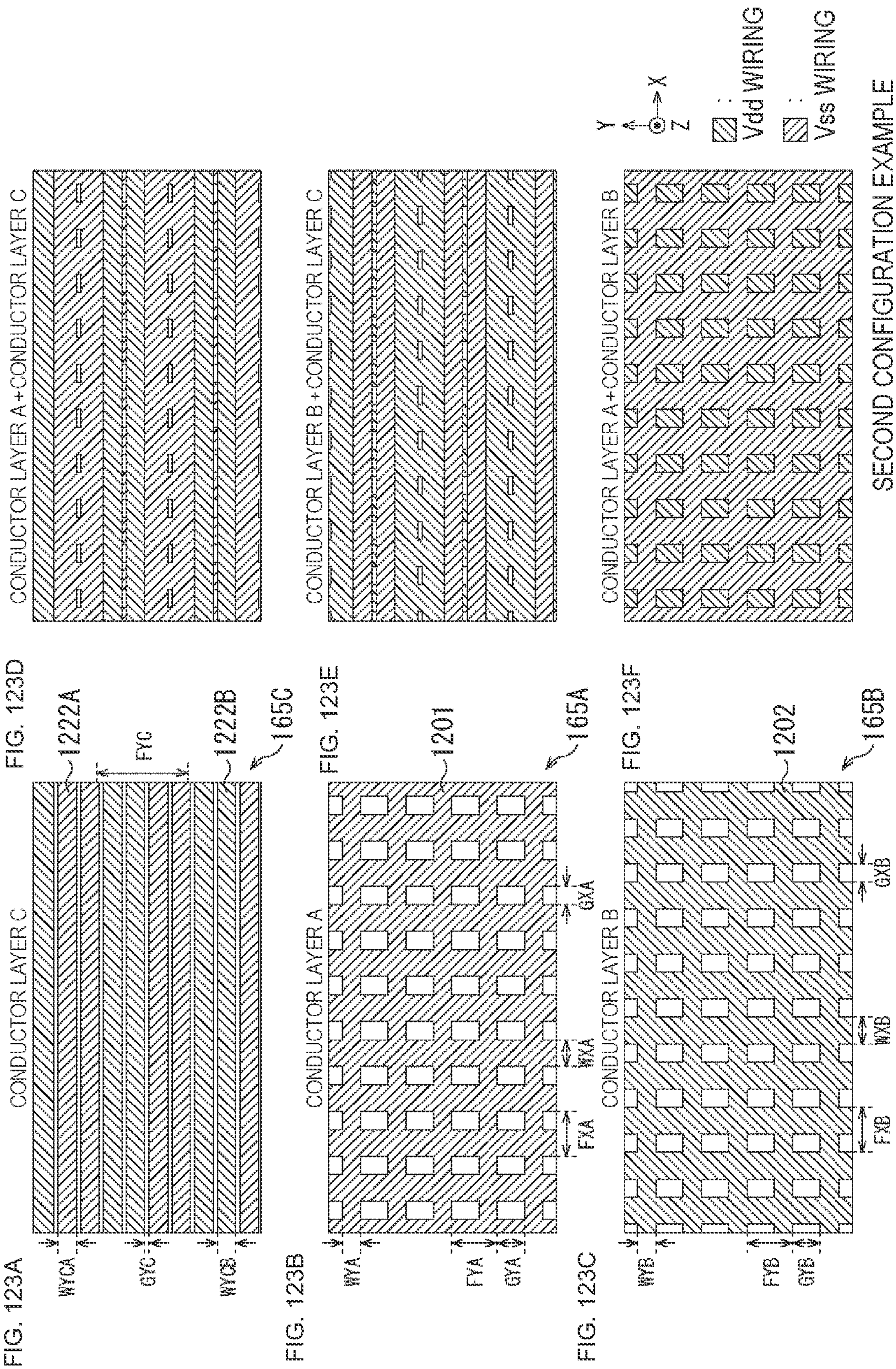
Figures 124A, 124B, 124C, 124D, 124E, 124F:
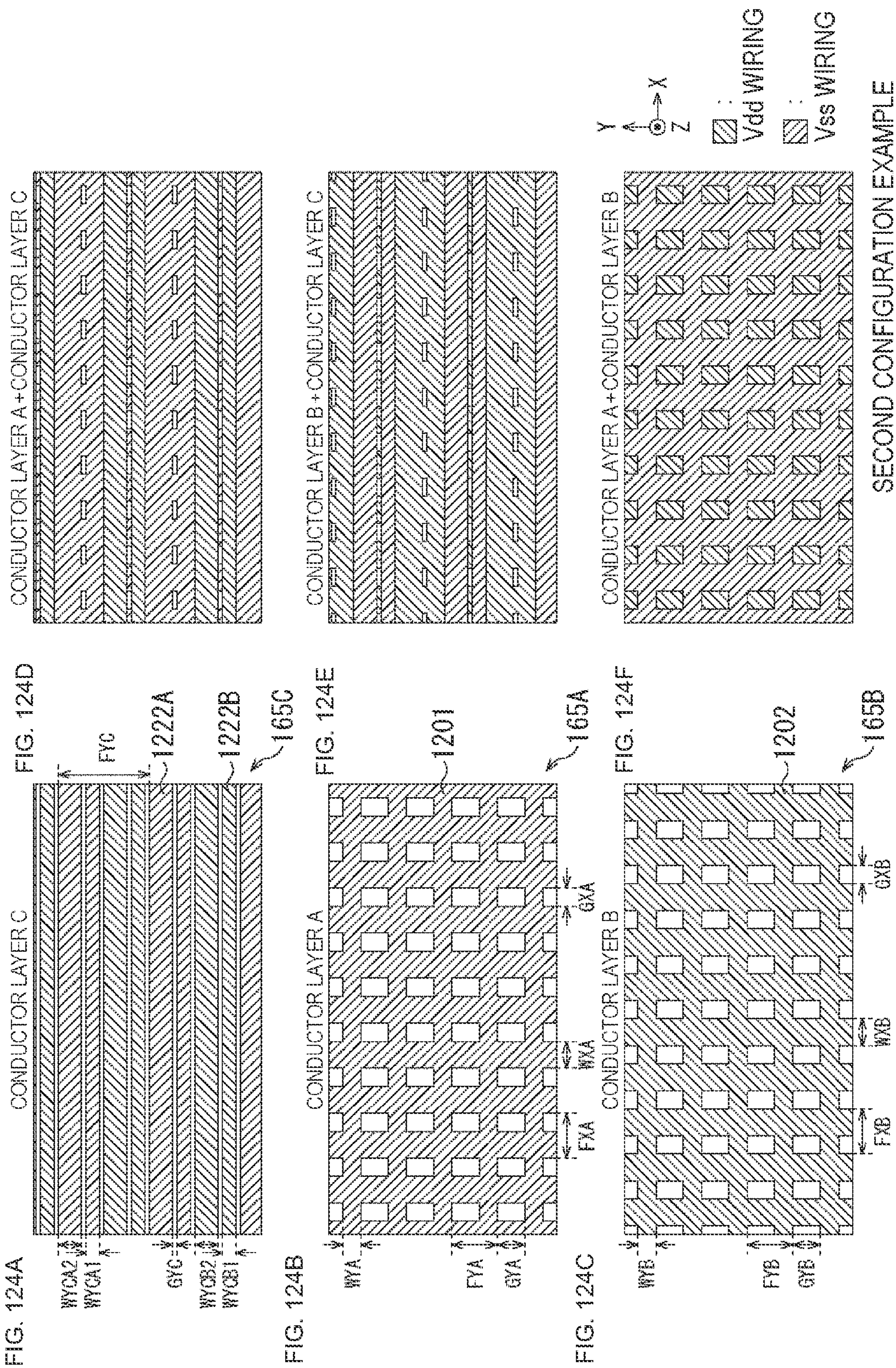
Figures 125A, 125B, 125C, 125D, 125E, 125F:
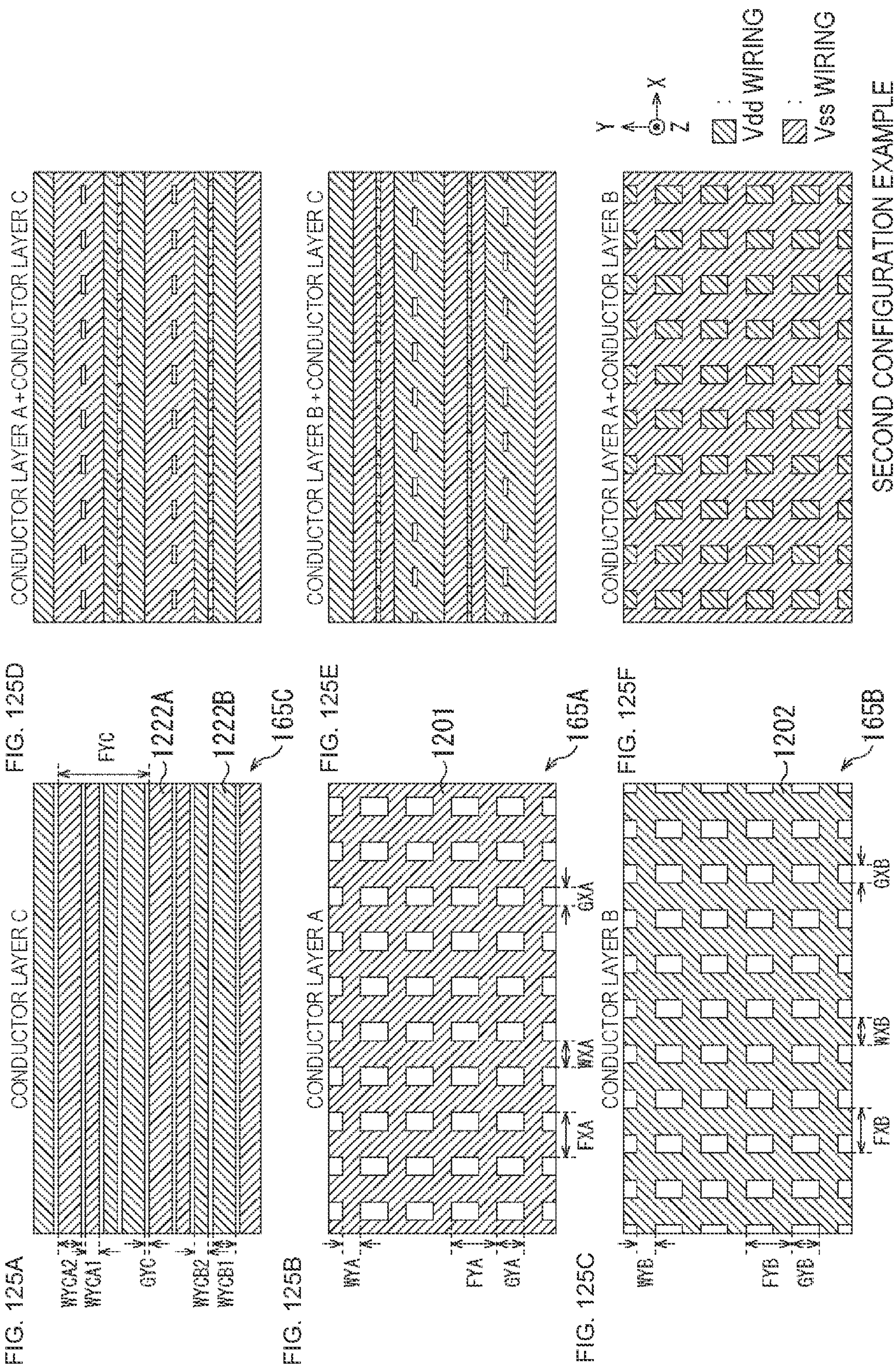

FIG. 123A illustrates the conductor layer C (wiring layer 165C), FIG. 123B illustrates the conductor layer A (wiring layer 165A), and FIG. 123D illustrates the conductor layer B (wiring layer 165B).

Furthermore, FIG. 123D is a plan view of a stacked state of the conductor layer A and the conductor layer C, FIG. 123E is a plan view of a stacked state of the conductor layer B and the conductor layer C, and FIG. 123F is a plan view of a stacked state of the conductor layer A and the conductor layer B.

The conductor layer A in FIG. 123B is a reticulated conductor 1201 that is the same as the first configuration example in FIGS. 122A, 122B, 122C, 122D, 122E, and 122F, and the conductor layer B in FIG. 123D is a reticulated conductor that is the same as the first configuration example in FIGS. 122A, 122B, 122C, 122D, 122E, and 122F. Therefore, description thereof is omitted.

The conductor layer FIG. 123A is configured such that two linear conductors 1222A long in the X direction and two linear conductors 1222B long in the X direction are alternately and periodically arranged in the Y direction.

The linear conductor 1222A is, for example, wiring (Vss wiring) connected to the GND or the negative power supply. The linear conductor 1222B is, for example, wiring (Vdd wiring) connected to the positive power supply. The linear conductor 1222A and the linear conductor 1222B are differential conductors whose current directions are opposite to each other. The linear conductor 1222A is connected to, for example, a pad (not illustrated) on an outer periphery of the semiconductor substrate, and is electrically connected to the reticulated conductor 1201 of the conductor layer A. The reticulated conductor 1201 of the conductor layer A and the linear conductor 1222A of the conductor layer C may be electrically connected via, for example, a conductor via (VIA) extending in the Z direction. The linear conductor 1222B is connected to, for example, a pad (not illustrated) on an outer periphery of the semiconductor substrate, and is electrically connected to the reticulated conductor 1202 of the conductor layer B. The reticulated conductor 1202 of the conductor layer B and the linear conductor 1222B of the conductor layer C may be electrically connected via, for example, a conductor via (VIA) extending in the Z direction.

The linear conductor 1222A has the conductor width WYCA in the Y direction and the linear conductor 1222B has the conductor width WYCB in the Y direction, and the conductor width WYCA of the linear conductor 1222A is the same as the conductor width WYCB of the linear conductor 1222B (conductor width WYCA=conductor width WYCB). Note that the conductor width WYCA and the conductor width WYCB may not be the same or may be substantially the same (the conductor width WYCA the conductor width WYCB). There is a gap with the gap width GYC between the linear conductors 1222A adjacent in the Y direction, between the linear conductors 1222B adjacent in the Y direction, or between the linear conductors 1222A and the linear conductors 1222B.

Then, the two linear conductors 1222A and the two linear conductors 1222B are periodically arranged in the Y direction with a conductor period FYC (=2×the conductor width WYCA+2×the conductor width WYCB+4×the gap width GYC). In other words, the conductor period FYC of the two linear conductors 1222A and the conductor period FYC of the two linear conductors 1222B are the same or substantially the same.

Note that the conductor width WYCA, the conductor width WYCB, and the gap width GYC can be designed to arbitrary values. Furthermore, FIGS. 123A, 123B. 123C, 123D, 123E, and 123F illustrate an example in which the two linear conductors 1222A and two linear conductors 1222B are periodically arranged. However, the configuration is not limited thereto, and three or more linear conductors may be periodically arranged, for example. Furthermore, FIGS. 123A, 123B, 123C, 123D, 123E, and 123F illustrate an example in which the same numbers of linear conductors 1222A and linear conductors 1222B are periodically arranged. However, the configuration is not limited thereto, and different numbers of linear conductors 1222A and linear conductors 1222B may be periodically arranged.

When the conductor layer C in which the linear conductor 1222A and the linear conductor 1222B are periodically arranged in the Y direction in the conductor period FYC is viewed in a predetermined plane range (plane region), the sum of the conductor widths WYCA of a plurality of linear conductors 1222A and the sum of the conductor widths WYCB of a plurality of linear conductors 1222B in the predetermined plane range are the same or substantially the same because the conductor width WYCA of the linear conductor 1222A and the conductor width WYCB of the linear conductor 1222B are the same or substantially the same. As a result, the current distribution of the linear conductor 1222A and the current distribution of the linear conductor 1222B become the same or substantially the same, so that generation of inductive noise can be suppressed.

Furthermore, in a case where the conductor layer C is arranged near the wiring layer 170, as illustrated in FIG. 120C, for example, the capacitive noise due to capacitive coupling between the linear conductor 1222A and the linear conductor 1222B of the conductor layer C, and the signal line 132 and the control line 133 of the wiring layer 170 can occur. However, since the linear conductor 1222A and the linear conductor 1222B have the same wiring pattern repeated in the Y direction, the capacitive noise can be completely canceled in the Y direction. The capacitive noise can be significantly improved as the conductor layer C is closer to the wiring layer 170.

As illustrated in FIG. 123E, the stacked layer of the conductor layers A and B has a light-shielding structure, and the hot carrier light emission from the active element group 167 can be shielded, and as illustrated in in FIGS. 123D and 123E, the light-shielding property is maintained in a fixed range in the stacked layer of the conductor layers A and C and the stacked layer of the conductor layers B and C. Thereby, since the light-shielding restrictions of the conductor layers A and B can be alleviated, the conductive area of the conductor layers A and B can be used to the maximum, the wiring resistance can be lowered, and the voltage drop can be further improved. Furthermore, the degree of freedom in layout of the conductor layers A and B can be improved.

Moreover, in the case where the reticulated conductor 1201 of the conductor layer A and the linear conductor 1222A of the conductor layer C are electrically connected, and the reticulated conductor 1202 of the conductor layer B and the linear conductor 1222B of the conductor layer C are electrically connected, the current amount of the conductor layers A and B can be made small. Therefore, the inductive noise and the voltage drop from the conductor layer A or B can be further improved.

Modification of Second Configuration Example of Three-layer Conductor Layer

FIGS. 124A, 124B, 124C, 124D, 124E, and 124F illustrate a first modification of the second configuration example of the three-layer conductor layer.

FIGS. 124A, 124B, 124C, 124D, 124E, and 124F correspond to FIGS. 123A, 123B, 123C, 123D, 123E, and 123F, respectively, and description of common parts having the same reference numerals will be omitted as appropriate, and different parts will be described.

In the second configuration example in FIGS. 123A, 123B, 123C, 123D, 123E, and 123F, in the conductor layer C, the conductor widths WYCA in the Y direction of the two linear conductors 1222A adjacent in the Y direction are the same. In contrast, in the first modification in FIGS. 124A, 124B, 124C, 124D, 124E, and 124F, the conductor widths of the two linear conductors 1222A adjacent in the Y direction are different, which are a conductor width WYCA1 and a conductor width WYCA2 (conductor width WYCA1<conductor width WYCA2). Note that the conductor width WYCA1 and the conductor width WYCA2 can be designed to arbitrary values.

Similarly, in the second configuration example in FIGS. 123A, 123B, 123C, 123D, 123E, and 123F, in the conductor layer C, the conductor widths WYCB in the Y direction of the two linear conductors 1222B adjacent in the Y direction are the same. In contrast, in the first modification in FIGS. 124A, 124B, 124C, 124D, 124E, and 124F, the conductor widths of the two linear conductors 1222B adjacent in the Y direction are different, which are a conductor width WYCB1 and a conductor width WYCB2 (conductor width WYCB1<conductor width WYCB2). Note that the conductor width WYCB1 and the conductor width WYCB2 can be designed to arbitrary values.

The configuration of the first modification in FIGS. 124A, 124B, 124C, 124D, 124E, and 124F similar to the second configuration example in FIGS. 123A, 123B, 123C, 123D, 123E, and 123F except for the difference in the conductor widths of the linear conductors 1222A and 1222B.

FIGS. 125A, 125B, 125C, 125D, 125E, and 125F illustrate a second modification of the second configuration example of the three-layer conductor layer.

FIGS. 125A, 125B, 125C, 125D, 125E, and 125F correspond to FIGS. 123A, 123B, 123C, 123D, 123E, and 123F, respectively, and description of common parts having the same reference numerals will be omitted as appropriate, and different parts will be described.

The second modification in FIGS. 125A, 125B, 125C, 125D, 125E, and 125E are different from the second configuration example in FIGS. 123A, 123B. 123C, 123D, 123E, and 123F and is common to the first modification in FIGS. 124A 124B, 124C, 124D, 124E, and 124F in that the conductor widths of the two linear conductors 1222A adjacent in the Y direction are different are different in the conductor layer C. Furthermore, the second modification in FIGS. 125A, 125B, 125C, 125D, 125E, and 125F different from the second configuration example in FIGS. 123A, 123B, 123C, 123D, 123E, and 123F and is common to the first modification in FIGS. 124A 124B, 124C, 124D, 124E, and 124F in that the conductor widths of the two linear conductors 1222B adjacent in the Y direction are different Meanwhile, in the first modification in FIGS. 124A, 124B, 124C, 124D, 124E, and 124F, the arrangement of the two linear conductors 1222A having different conductor widths is the same as the arrangement of the two linear conductors 1222B. Specifically, in a case where the two linear conductors 1222A are arranged in the Y direction in the order of the linear conductor 1222A with a narrow conductor width (with the conductor width WYCA1) and the linear conductor 1222A with a wide conductor width (with the conductor width WYCA2), the two linear conductors 1222B are also arranged in the Y direction in the order of the linear conductor 1222B with a narrow conductor width (with the conductor width WYCB1) and the linear conductor 1222B with a wide conductor width (with the conductor width WYCB2)

In contrast, in the second modification in FIGS. 125A, 125B, 125C, 125D, 125E, and 125F, the arrangement of the two linear conductors 1222A having different conductor widths is different from the arrangement of the two linear conductors 1222B. Specifically, in a case where the two linear conductors 1222A are arranged in the Y direction in the order of the linear conductor 1222A with a narrow conductor width (with the conductor width WYCA1) and the linear conductor 1222A with a wide conductor width (with the conductor width WYCA2), the two linear conductors 1222B are arranged in the Y direction in the order of the linear conductor 1222B with a wide conductor width (with the conductor width WYCB1) and the linear conductor 1222B with a narrow conductor width (with the conductor width WYCB2) In other words, the two linear conductors 1222A and 1222B with different conductor widths are arranged mirror-symmetrically in the Y direction.

The configuration of the second modification in FIGS. 125A, 125B, 125C, 125D, 125E, and 125F similar to the second configuration example in FIGS. 123A, 123B, 123C, 123D, 123E, and 123F except for the difference in the conductor widths of the linear conductors 1222A and 1222B.

Even in the first modification and the second modification in FIGS. 124& 124B, 124C, 124D, 124E, 124F, 125A, 125B, 125C, 125D, 125E and 125E when the conductor layer C is viewed in a predetermined plane range (plane region), the sum of the conductor widths WYCA1 and WYCA2 of a plurality of linear conductors 1222A and the sum of the conductor widths WYCB1 and WYCB2 of a plurality of linear conductors 1222B in the predetermined plane range are the same or substantially the same. As a result, the current distribution of the linear conductor 1222A and the current distribution of the linear conductor 1222B become the same or substantially the same, so that generation of inductive noise can be suppressed.

Even in the first modification and the second modification in FIGS. 124A, 124B, 124C, 124D, 124E, 124F, 125A, 125B, 125C, 125D, 125E and 125F, the capacitive noise can be significantly improved and the light-shielding restriction of the conductor layers A and B can be alleviated. Furthermore, the wiring resistance can be lowered and the voltage drop can be improved. Moreover, the degree of freedom in layout of the conductor layers A and B can be improved.

Third Configuration Example of Three-layer Conductor Layer

FIGS. 126A, 126B, 126C, 126D, 126E, and 126F illustrate a third configuration example of the three-layer conductor layer.

Figures 126A, 126B, 126C, 126D, 126E, 126F:
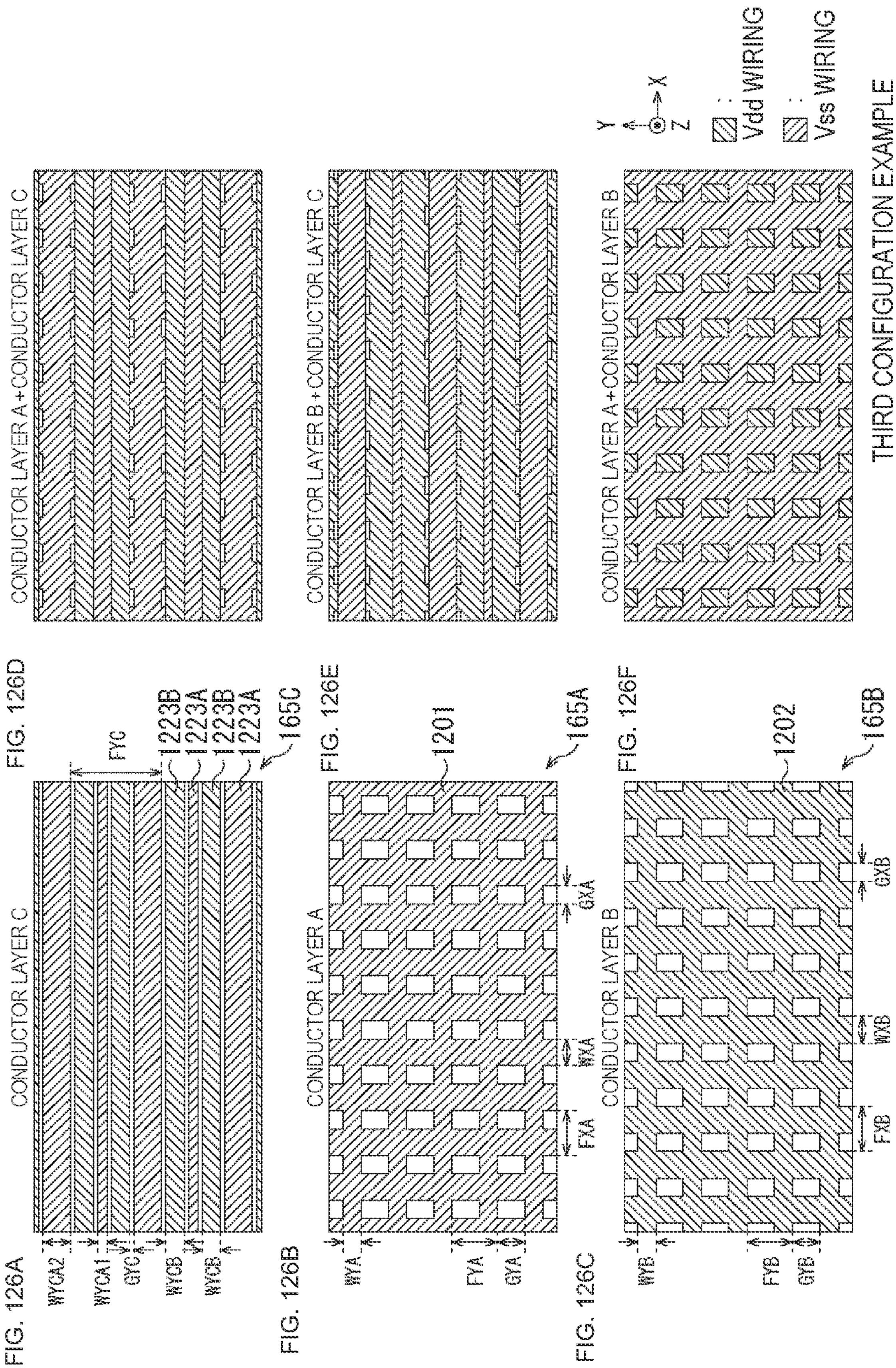
Figures 127A, 127B, 127C, 127D, 127E, 127F:
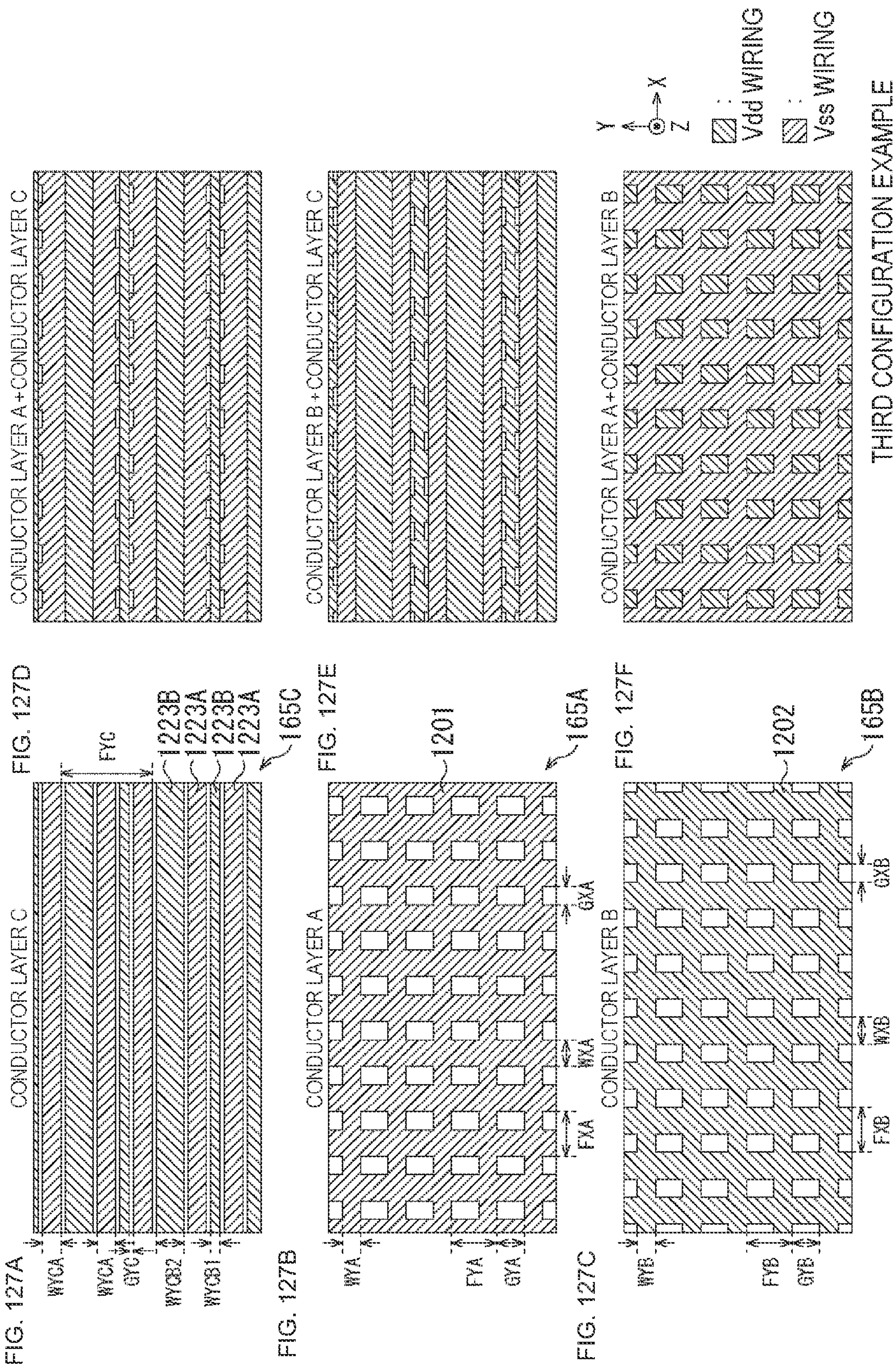

FIG. 126A illustrates the conductor layer C (wiring layer 165C), FIG. 126B illustrates the conductor layer A (wiring layer 165A), and FIG. 126C illustrates the conductor layer B (wiring layer 165B).

Furthermore, FIG. 126D is a plan view of a stacked state of the conductor layer A and the conductor layer C, FIG. 126E is a plan view of a stacked state of the conductor layer B and the conductor layer C, and FIG. 126F is a plan view of a stacked state of the conductor layer A and the conductor layer B.

The conductor layer A in FIG. 126B is a reticulated conductor 1201 that is the same as the first configuration example in FIGS. 122A, 122B, 122C, 122D, 122E, and 122F, and the conductor layer B in FIG. 126D is a reticulated conductor that is the same as the first configuration example in FIGS. 122A, 122B, 122C, 122D, 122E, and 122F. Therefore, description thereof is omitted.

The conductor layer FIG. 126A is similar to the first configuration example in FIGS. 122A, 122B, 122C, 122D, 122E, and 122F in that a linear conductor 1223A long in the X direction and a linear conductor 1223B long in the X direction are alternately and periodically arranged in the Y direction. Note that, in the first configuration example in FIGS. 122A, 122B, 122C, 122D, 122E, and 122F, the conductor widths of the linear conductors 1221A arranged in order in the Y direction are all the same, which are the conductor width WYCA.

In contrast, in the third configuration example in FIGS. 126A, 126B, 126C, 126D, 126E, and 126F, among the linear conductors 1223A and the linear conductors 1223B alternately and periodically arranged in the Y direction, for the linear conductors 1223A, the linear conductors 1223A having the different conductor width WYCA1 and conductor width WYCA2 are alternately arranged in the Y direction, whereas, for the linear conductors 1223B, the linear conductors 1223A having the same conductor width WYCB are arranged.

The third configuration example in FIGS. 126A, 126B, 126C, 126D, 126E, and 126F similar to the first configuration example in FIGS. 122A, 122B, 122C, 122D, 122E, and 122F except for the difference in the conductor widths of the linear conductors 1223A and 1223B.

That is, the linear conductor 1223A is, for example, wiring (Vss wiring) connected to the GND or the negative power supply. The linear conductor 1223B is, for example, a wiring (Vdd wiring) connected to the positive power supply. The linear conductor 1223A and the linear conductor 1223B are differential conductors whose current directions are opposite to each other. The linear conductor 1223A is connected to, for example, a pad (not illustrated) on an outer periphery of the semiconductor substrate, and is electrically connected to the reticulated conductor 1201 of the conductor layer A. The reticulated conductor 1201 of the conductor layer A and the linear conductor 1223A of the conductor layer C may be electrically connected via, for example, a conductor via (VIA) extending in the Z direction. The linear conductor 1223B is connected to, for example, a pad (not illustrated) on an outer periphery of the semiconductor substrate, and is electrically connected to the reticulated conductor 1202 of the conductor layer B. The reticulated conductor 1202 of the conductor layer B and the linear conductor 1223B of the conductor layer C may be electrically connected via, for example, a conductor via (VIA) extending in the Z direction.

There is a gap with the gap width GYC between the linear conductor 1223A and the linear conductor 1223B adjacent in the Y direction. Then, the two linear conductors 1223A and the two linear conductors 1223B are periodically arranged in the Y direction with the conductor period FYC (=the conductor width WYCA1+the conductor width WYCA2+2×the conductor width WYCB+4×the gap width GYC). Note that the conductor width WYCA1, the conductor width WYCA2, the conductor width WYCB, and the gap width GYC can be designed to any values. Furthermore, FIGS. 126A, 126B, 126C, 126D, 126E, and 126F illustrate an example in which the two linear conductors 1223A and two linear conductors 1223B are periodically arranged. However, the configuration is not limited thereto, and three or more linear conductors may be periodically arranged, for example. Furthermore, FIGS. 126A, 126B, 126C, 126D, 126E, and 126F illustrate an example in which the same numbers of linear conductors 1223A and linear conductors 1223B are periodically arranged. However, the configuration is not limited thereto, and different numbers of linear conductors 1223A and linear conductors 1223B may be periodically arranged.

When the conductor layer C in which the linear conductor 1223A and the linear conductor 1223B are periodically arranged in the Y direction in the conductor period FYC is viewed in a predetermined plane range (plane region), the sum of the conductor widths WYCA1 and WYCA2 of a plurality of linear conductors 1223A and the sum of the conductor widths WYCB of a plurality of linear conductors 1223B in the predetermined plane range are the same or substantially the same. As a result, the current distribution of the linear conductor 1223A and the current distribution of the linear conductor 1223B become the same or substantially the same, so that generation of inductive noise can be suppressed.

Even in the third configuration example in FIGS. 126A, 126B, 126C, 126D, 126E, and 126F, the capacitive noise can be significantly improved and the light-shielding restriction of the conductor layers A and B can be alleviated. Furthermore, the wiring resistance can be lowered and the voltage drop can be improved. Moreover, the degree of freedom in layout of the conductor layers A and B can be improved.

Modification of Third Configuration Example of Three-layer Conductor Layer

FIGS. 127A, 127B, 127C, 127D, 127E, and 127F illustrate a modification of the third configuration example of the three-layer conductor layer.

FIGS. 127A, 127B, 127C, 127D, 127E, and 127F correspond to FIGS. 126A, 126B, 126C, 126D, 126E, and 126F respectively, and description of common parts having the same reference numerals will be omitted as appropriate, and different parts will be described.

In the third configuration example in FIGS. 126A, 126B, 126C, 126D, 126E, and 126F, there are two types of conductor widths: the conductor width WYCA1 and the conductor width WYCA2 for the conductor widths of the linear conductors 1223A, and the linear conductors 1223B have the same conductor width WYCB, among the linear conductors 1223A and the linear conductors 1223B alternately and periodically arranged in the Y direction in the conductor layer C.

In contrast, in the modification of the third configuration example in FIGS. 127A, 127B, 127C, 127D, 127E, and 127F, the linear conductors 1223A have the same conductor width WYCA, and there are two types of conductor widths: the conductor width WYCB1 and the conductor width WYCB2 for the conductor widths of the linear conductors 1223B, among the linear conductors 1223A and the linear conductors 1223B alternately and periodically arranged in the Y direction in the conductor layer C. In the modification of the third configuration example in FIGS. 127A 127B, 127C, 127D, 127E, and 127F the linear conductors 1223B having different conductor width WYCB1 and conductor width WYCB2 are alternately arranged in the Y direction.

The modification of the third configuration example in FIGS. 127A, 127B, 127C, 127D, 127E, and 127F are similar to the third configuration example in FIGS. 126A, 126B, 126C, 126D, 126E, and 126F except for the difference in the conductor widths of the linear conductors 1223A and 1223B.

When the conductor layer C in which the linear conductor 1223A and the linear conductor 1223B are periodically arranged in the Y direction in the conductor period FYC is viewed in a predetermined plane range (plane region), the sum of the conductor widths WYCA of a plurality of linear conductors 1223A and the sum of the conductor widths WYCB1 and WYCB2 of a plurality of linear conductors 1223B in the predetermined plane range are the same or substantially the same. As a result, the current distribution of the linear conductor 1223A and the current distribution of the linear conductor 1223B become the same or substantially the same, so that generation of inductive noise can be suppressed.

Even in the modification of the third configuration example in FIGS. 127A 127B, 127C, 127D, 127E, and 127F, the capacitive noise can be significantly improved and the light-shielding restriction of the conductor layers A and B can be alleviated. Furthermore, the wiring resistance can be lowered and the voltage drop can be improved. Moreover, the degree of freedom in layout of the conductor layers A and B can be improved.

Fourth Configuration Example of Three-layer Conductor Layer

FIGS. 128A, 128B, 128C, 128D, 128E, and 128F illustrate a fourth configuration example of the three-layer conductor layer.

Figures 128A, 128B, 128C, 128D, 128E, 128F:
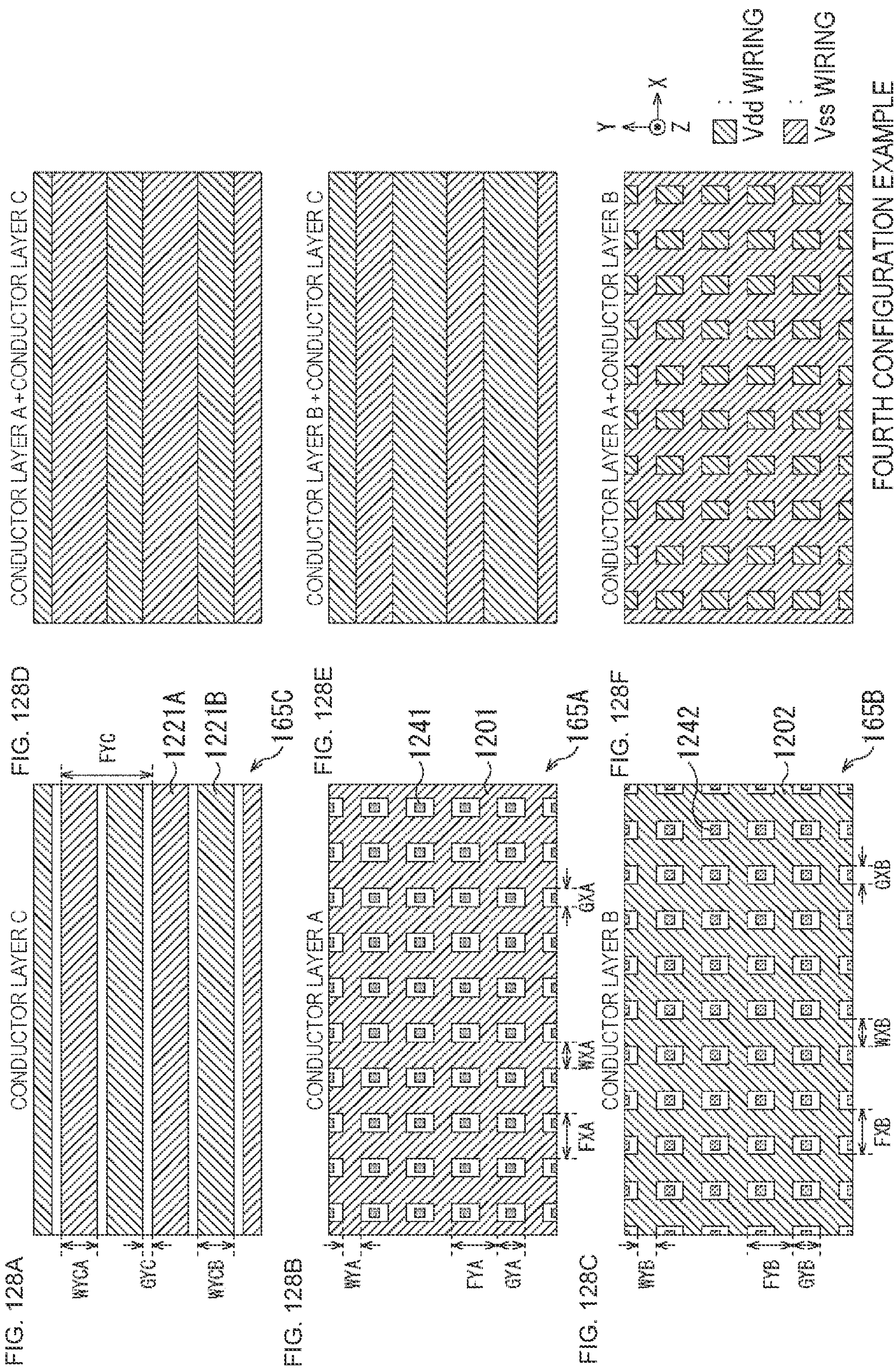

FIG. 128A illustrates the conductor layer C (wiring layer 165C), FIG. 128B illustrates the conductor layer A (wiring layer 165A), and FIG. 128D illustrates the conductor layer B (wiring layer 165B).

Furthermore, FIG. 128D is a plan view of a stacked state of the conductor layer A and the conductor layer C, FIG. 128E is a plan view of a stacked state of the conductor layer B and the conductor layer C, and FIG. 128F is a plan view of a stacked state of the conductor layer A and the conductor layer B.

In the fourth configuration example in FIGS. 128A, 128B, 128C, 128D, 128E, and 128F, a portion corresponding to that in the first configuration example illustrated in FIGS. 122A, 122B, 122C, 122D, 122E, and 122F are given the same reference numeral and description of the portion is omitted as appropriate, and description will be given focusing on different portions.

The conductor layer FIG. 128A is similar to the conductor layer C of the first configuration example illustrated in FIGS. 122A, 122B, 122C, 122D, 122E, and 122F. That is, the conductor layer C is configured such that a linear conductor A long in the X direction and a linear conductor 1221B long in the X direction are alternately and periodically arranged in the Y direction with the conductor period FYC.

The conductor layer A in FIG. 128B has the same reticulated conductor 1201 as in FIGS. 121A, 121B, 121C, 121D, 121E, and 121F. Furthermore, the conductor layer A includes a relay conductor 1241 (first relay conductor) inside the gap having the gap width GXA in the X direction and the gap width GYA in the Y direction of the reticulated conductor 1201. The relay conductor 1241 is arranged one-to-one in all the gaps of the reticulated conductor 1201. The distance between the relay conductors 1241, in other words, the period of the relay conductor 1241 is also the conductor periods FXA and FYA.

The relay conductor 1241 is, for example, wiring (Vdd wiring) connected to the positive power supply, and electrically connects the reticulated conductor 1202 of the conductor layer B and the linear conductor 1221B of the conductor layer C via, for example, the conductor via (VIA) extending in the Z direction, in the case of the stacking order illustrated in FIG. 120C. In other words, the reticulated conductor 1202 of the conductor layer B and the linear conductor 1221B of the conductor layer C are electrically connected via the relay conductor 1241 of the conductor layer A. Furthermore, the relay conductor 1241 may electrically connect the reticulated conductor 1202 of the conductor layer B and a conductor of a conductor layer different from the conductor layers A to C via, for example, the conductor via (VIA) extending in the Z direction, in the case of the stacking order illustrated in FIG. 120A. Furthermore, the relay conductor 1241 may electrically connect the linear conductor B of the conductor layer C and a conductor of a conductor layer different from the conductor layers A to C via, for example, the conductor via (VIA) extending in the Z direction, in the case of the stacking order illustrated in FIG. 120B. Furthermore, not all the relay conductors 1241 may be used for electrical connection, all the relay conductors 1241 may be used for electrical connection, or some of the relay conductors may be used for electrical connection.

By providing the relay conductor 1241, it becomes possible to connect the reticulated conductor 1202 and the linear conductor 1221B in the substantially shortest distance or a short distance to draw the power supply, thereby reducing the voltage drop, energy loss, or inductive noise.

The conductor layer B in FIG. 128C has the same reticulated conductor 1202 as in FIGS. 121A, 121B, 121C, 121D, 121E, and 121F. Furthermore, the conductor layer B includes a relay conductor 1242 (second relay conductor) inside the gap having the gap width GXB in the X direction and the gap width GYB in the Y direction of the reticulated conductor 1202. The relay conductor 1242 is arranged one-to-one in all the gaps of the reticulated conductor 1202. The distance between the relay conductors 1242, in other words, the period of the relay conductors 1242 is also the conductor periods FXB and FYB.

The relay conductor 1242 is, for example, wiring (Vss wiring) connected to GND or the negative power supply, and electrically connects the reticulated conductor of the conductor layer A and the linear conductor 1221A of the conductor layer C via, for example, the conductor via (VIA) extending in the Z direction, in the case of the stacking layer illustrated in FIG. 120A. In other words, the reticulated conductor of the conductor layer B and the linear conductor 1221A of the conductor layer C are electrically connected via the relay conductor 1242 of the conductor layer B. Furthermore, the relay conductor 1242 may electrically connect the reticulated conductor 1201 of the conductor layer A and a conductor of a conductor layer different from the conductor layers A to C via, for example, the conductor via (VIA) extending in the Z direction, in the case of the stacking order illustrated in FIG. 120C. Furthermore, the relay conductor 1242 may electrically connect the linear conductor A of the conductor layer C and a conductor of a conductor layer different from the conductor layers A to C via, for example, the conductor via (VIA) extending in the Z direction, in the case of the stacking order illustrated in FIG. 120B. Furthermore, not all the relay conductors 1242 may be used for electrical connection, all the relay conductors 1242 may be used for electrical connection, or some of the relay conductors may be used for electrical connection.

By providing the relay conductor 1242, it becomes possible to connect the reticulated conductor 1201 and the linear conductor 1221A in the substantially shortest distance or a short distance, thereby reducing the voltage drop, energy loss, or inductive noise.

Furthermore, since the linear conductor 1221A and the linear conductor 1221B in FIG. 128A are conductors long in the X direction, the direction in which the current easily flows is the X direction. Furthermore, the direction in which the current of the reticulated conductors 1201 and 1202 in B and FIG. 128C is likely to flow is the Y direction. Therefore, the direction in which the current of the conductor layer C is likely to flow and the direction in which the current of the conductor layers A and B is likely to flow are substantially orthogonal and differ by approximately 90 degrees. As a result, the current becomes easily diffused (the current is less likely to be concentrated), so that the inductive noise can be further improved.

As illustrated in FIG. 128F, the stacked layer of the conductor layers A and B has a light-shielding structure. Furthermore, as illustrated in FIGS. 128E and 128D, the stacked layer of the conductor layers A and C and the stacked layer of the conductor layers B and C have a light-shielding structure, and the light-shielding property is maintained. As a result, the hot carrier light emission from the active element group 167 can be shielded. Furthermore, since the light-shielding restrictions of the conductor layers A and B can be significantly alleviated, the conductive area of the conductor layers A and B can be used to the maximum, the wiring resistance can be lowered, and the voltage drop can be further improved. The degree of freedom in layout of the conductor layers A and B can be improved.

Modification of Fourth Configuration Example of Three-layer Conductor Layer

FIGS. 129A, 129B, 129C, 129D, 129E, and 129F illustrate a first modification of the fourth configuration example of the three-layer conductor layer.

Figures 129A, 129B, 129C, 129D, 129E, 129F:
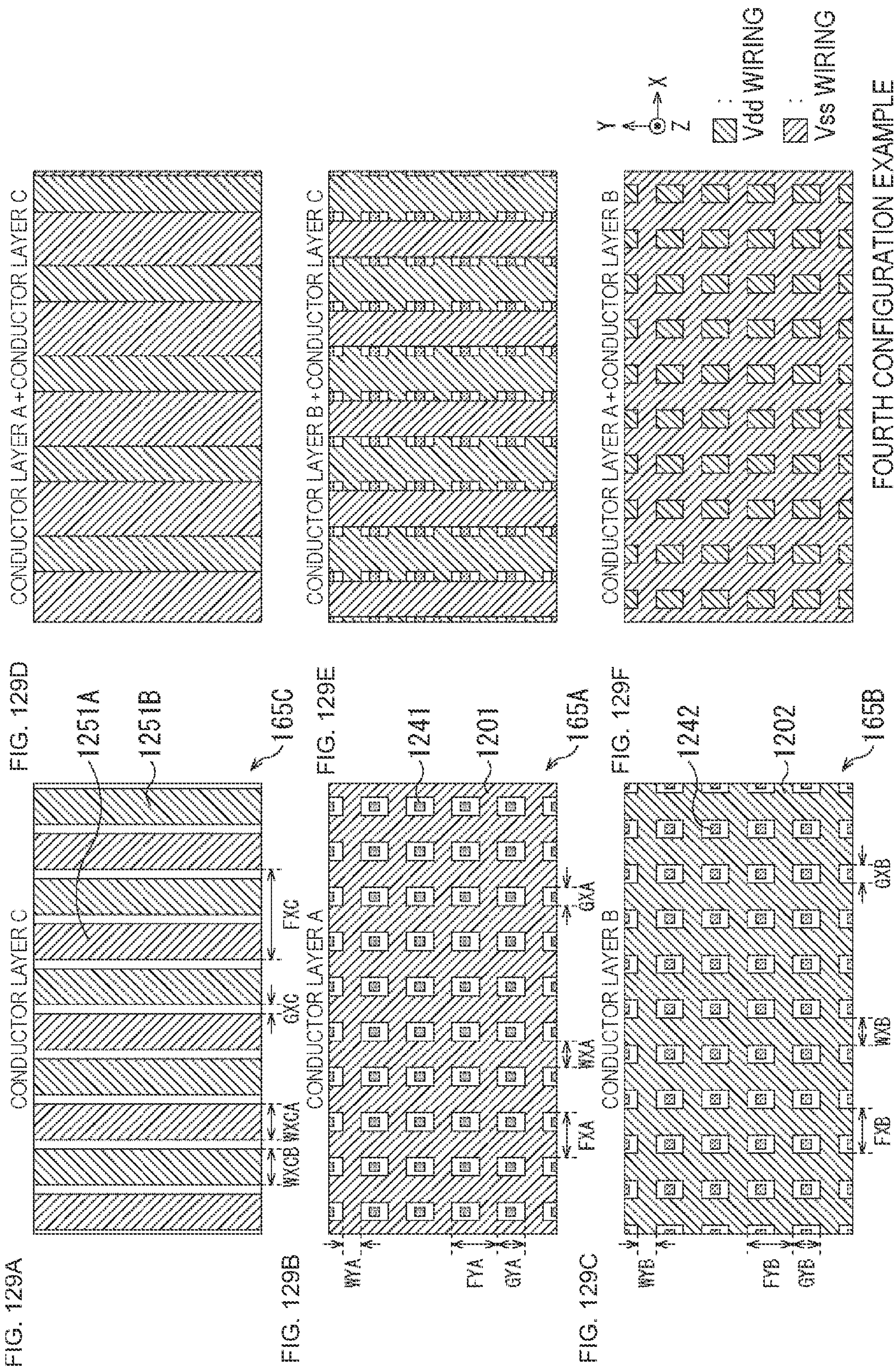
Figures 130A, 130B, 130C, 130D, 130E, 130F:
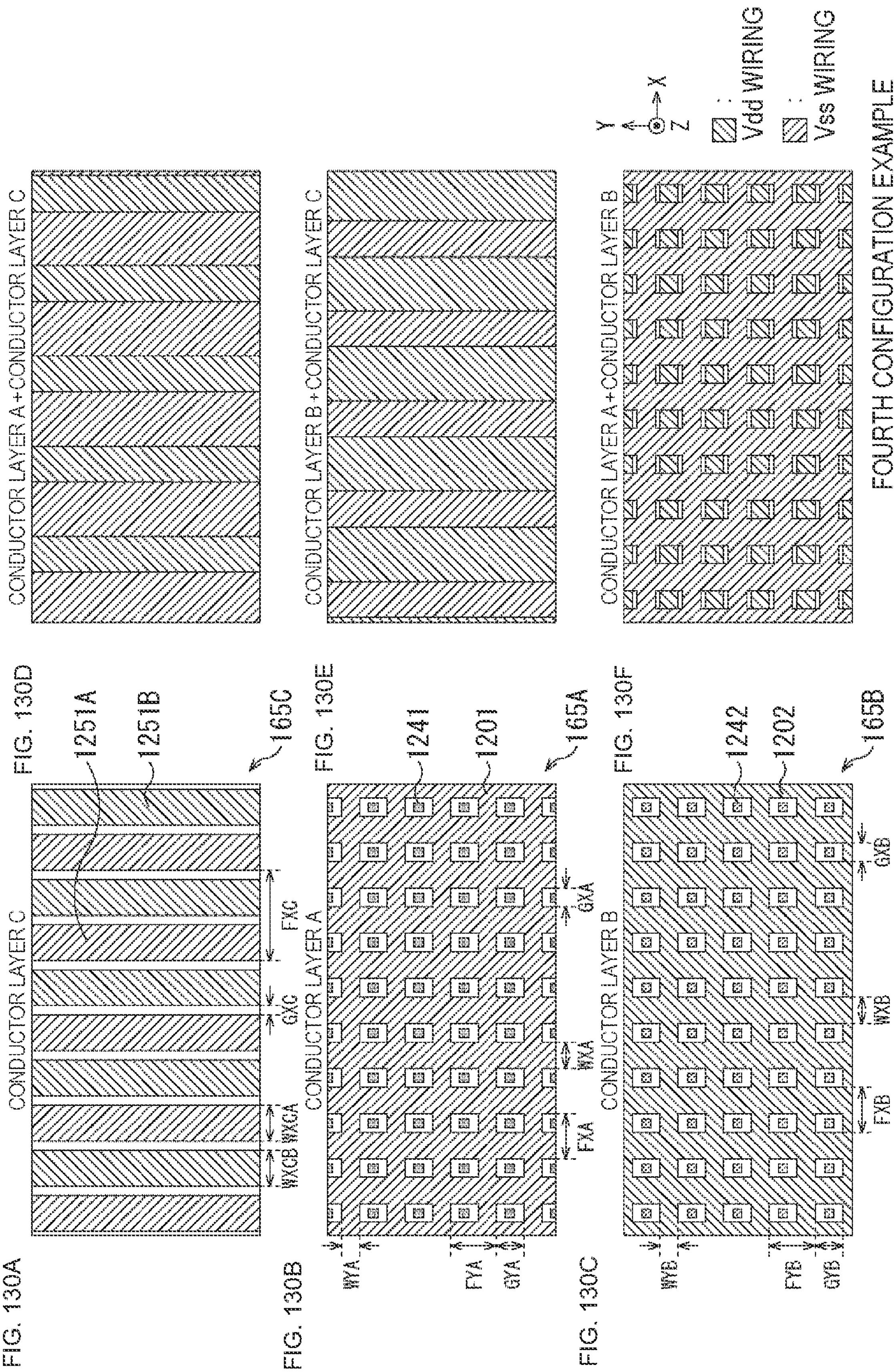

FIG. 129A illustrates the conductor layer C (wiring layer 165C), FIG. 129B illustrates the conductor layer A (wiring layer 165A), and FIG. 129D illustrates the conductor layer B (wiring layer 165B).

Furthermore, FIG. 129D is a plan view of a stacked state of the conductor layer A and the conductor layer C, FIG. 129E is a plan view of a stacked state of the conductor layer B and the conductor layer C, and FIG. 129F is a plan view of a stacked state of the conductor layer A and the conductor layer B.

In FIGS. 129A, 129B, 129C, 129D, 129E, and 129F, a portion corresponding to that in the fourth configuration example illustrated in FIGS. 128A, 128B, 128C, 128D, 128E, and 128F are given the same reference numeral and description of the portion is omitted as appropriate, and description will be given focusing on different portions.

In the first modification of the fourth configuration example, only the configuration of the conductor layer C in FIG. 129A is different from that in FIGS. 128A, 128B, 128C, 128D, 128E, and 128F.

In the conductor layer FIG. 128A, the linear conductor 1221A long in the X direction and the linear conductor 1221B long in the X direction have been alternately and periodically arranged in the Y direction with the conductor period FYC. Furthermore, the direction in which the current of the conductor layer C is likely to flow and the direction in which the current of the conductor layers A and B is likely to flow are substantially orthogonal and differ by approximately 90 degrees.

In contrast, in the conductor layer C in FIG. 129A, a linear conductor A long in the Y direction and a linear conductor 1251B long in the Y direction are alternately and periodically arranged in the X direction.

Furthermore, since the linear conductor 1251A and the linear conductor B in FIG. 129A are conductors long in the Y direction, the direction in which the current easily flows is the Y direction. Furthermore, the direction in which the current of the reticulated conductors 1201 and 1202 in FIGS. 128B and 128C are likely to flow is the Y direction. Thereby, the direction in which the current of the conductor layer C is likely to flow and the direction in which the current of the conductor layers A and B is likely to flow are the same or substantially the same. In this case, the voltage drop can be further improved depending on the wiring layout. Approximately 90 degrees and substantially the same direction is a difference between two directions being 90 degrees or a range that can be regarded as the same angle. The difference is at least less than 45 degrees with respect to 90 degrees or the same angle.

The linear conductor 1251A is, for example, wiring (Vss wiring) connected to the GND or the negative power supply. The linear conductor 1251B is, for example, wiring (Vdd wiring) connected to the positive power supply. The linear conductor 1251A and the linear conductor 1251B are differential conductors whose current directions are opposite to each other. The linear conductor 1251A is connected to, for example, a pad (not illustrated) on an outer periphery of the semiconductor substrate, and is electrically connected to the reticulated conductor 1201 of the conductor layer A. The reticulated conductor 1201 of the conductor layer A and the linear conductor 1251A of the conductor layer C may be electrically connected via, for example, a conductor via (VIA) extending in the Z direction. The linear conductor 1251B is connected to, for example, a pad (not illustrated) on an outer periphery of the semiconductor substrate, and is electrically connected to the reticulated conductor 1202 of the conductor layer B. The reticulated conductor 1202 of the conductor layer B and the linear conductor 1251B of the conductor layer C may be electrically connected via, for example, a conductor via (VIA) extending in the Z direction.

The linear conductor 1251A has a conductor width WXCA in the X direction and the linear conductor 1251B has a conductor width WXCB in the X direction, and the conductor width WXCA of the linear conductor 1251A and the conductor width WXCB of the linear conductor 1251B are the same or substantially the same (the conductor width WXCA=the conductor width WXCB or the conductor width WXCA the conductor width WXCB). There is a gap with a gap width of GXC between the linear conductor 1251A and the linear conductor 1251B in the Y direction.

Then, the one linear conductor 1251A and the one linear conductor 1251B are periodically arranged in the X direction with a conductor period FXC (=the conductor width WXCA+the conductor width WXCB+2×the gap width GXC). In other words, the conductor period FXC of the linear conductor 1251A and the conductor period FXC of the linear conductor 1251B are the same or substantially the same.

Furthermore, the conductor period FXC that is a repetition period of the linear conductor 1251A of the conductor layer C is an integral multiple of the conductor period FXA that is a repetition period in the X direction of the reticulated conductor 1201 of the conductor layer A. FIGS. 129A, 129B, 129C, 129D, 129E, and 129F illustrate an example in which the conductor period FXC is twice the conductor period FYA.

The conductor period FXC that is a repetition period of the linear conductor 1251B of the conductor layer C is an integral multiple of the conductor period FXB that is a repetition period in the X direction of the reticulated conductor 1202 of the conductor layer B. FIGS. 129A, 129B, 129C, 129D, 129E, and 129F illustrate an example in which the conductor period FXC is twice the conductor period FXB.

Note that the conductor width WXCA, the conductor width WXCB, and the gap width GXC can be designed to arbitrary values.

When the conductor layer C in which the linear conductor 1251A and the linear conductor 1251B are periodically arranged in the X direction in the conductor period FXC is viewed in a predetermined plane range (plane region), the sum of the conductor widths WXCA of a plurality of linear conductors 1251A and the sum of the conductor widths WXCB of a plurality of linear conductors 1251B in the predetermined plane range are the same or substantially the same because the conductor width WXCA of the linear conductor 1251A and the conductor width WXCB of the linear conductor 1251B are the same or substantially the same. As a result, the current distribution of the linear conductor 1251A and the current distribution of the linear conductor 1251B become the same or substantially the same, so that generation of inductive noise can be suppressed.

Furthermore, in a case where the conductor layer C is arranged near the wiring layer 170, as illustrated in FIG. 120C, for example, the capacitive noise due to capacitive coupling between the linear conductor 1251A and the linear conductor B of the conductor layer C, and the signal line 132 and the control line 133 of the wiring layer 170 can occur. However, since the linear conductor 1251A and the linear conductor 1251B have the same wiring pattern repeated in the X direction, the capacitive noise can be completely canceled in the X direction. The capacitive noise can be significantly improved as the conductor layer C is closer to the wiring layer 170.

As illustrated in FIG. 129F, the stacked layer of the conductor layers A and B has a light-shielding structure, and the hot carrier light emission from the active element group 167 can be shielded. In addition, as illustrated in FIG. 129D, the stacked layer of the conductor layers A and C has also a light-shielding structure, and the light-shielding property is maintained. Thereby, since the light-shielding restrictions of the conductor layers A and B can be significantly alleviated, the conductive area of the conductor layers A and B can be used to the maximum, the wiring resistance can be lowered, and the voltage drop can be further improved. Furthermore, the degree of freedom in layout of the conductor layers A and B can be improved.

Moreover, in the case where the reticulated conductor 1201 of the conductor layer A and the linear conductor 1251A of the conductor layer C are electrically connected, and the reticulated conductor 1202 of the conductor layer B and the linear conductor 1251B of the conductor layer C are electrically connected, the current amount of the conductor layers A and B can be made small. Therefore, the inductive noise and the voltage drop from the conductor layer A or B can be further improved.

FIGS. 130A, 130B, 130C, 130D, 130E, and 130F illustrate a second modification of the fourth configuration example of the three-layer conductor layer.

FIGS. 130A, 130B, 130C, 130D, 130E, and 130F correspond to FIGS. 129A, 129B, 129C, 129D, 129E, and 129F, respectively, and description of common parts having the same reference numerals will be omitted as appropriate, and different parts will be described.

In the first modification in FIGS. 129A, 129B, 129C, 129D, 129E, and 129F, when viewing the positions of the gaps in the reticulated conductor 1201 of the conductor layer A and the reticulated conductor 1202 of the conductor layer B, the positions in the X direction are different and the positions in the Y direction match.

Meanwhile, in the second modification in FIGS. 130A, 130B, 130C, 130D, 130E, and 130F, when viewing the positions of the gaps in the reticulated conductor of the conductor layer A and the reticulated conductor 1202 of the conductor layer B, the positions in the X direction match and the positions in the Y direction are different.

In other words, when comparing the conductors in the same or substantially the same direction as a direction (Y direction) into which the signal line 132 of the wiring layer 170 extends between the reticulated conductor 1201 of the conductor layer A and the reticulated conductor 1202 of the conductor layer B, all the conductors overlap as viewed from the stacking direction. The conductor layer A and the conductor layer B having such a configuration correspond to the sixth configuration example of the conductor layers A and B illustrated in FIGS. 27A, 27B, and 27C, and can significantly improve the inductive noise, as illustrated in the simulation result in FIG. 28C.

In the first modification in FIGS. 129A, 129B, 129C, 129D, 129E, and 129F, when comparing the positions between the relay conductor 1241 of the conductor layer A and the relay conductor 1242 of the conductor layer B, the positions in the X direction are different and the positions in the Y direction match. Meanwhile, in the second modification in FIGS. 130A, 130B, 130C, 130D, 130E, and 130F, the positions in the X direction match and the positions in the Y direction are different.

In the first modification in FIGS. 129A, 129B, 129C, 129D, 129E, and 129F, the stacked layer of the conductor layers A and B and the stacked layer of the conductor layers A and C have a light-shielding structure, and the light-shielding property is maintained. Meanwhile, in the second modification in FIGS. 130A, 130B, 130C, 130D, 130E, and 130F, the stacked layer of the conductor layers A and C and the stacked layer of the conductor layers B and C have a light-shielding structure, and the light-shielding property is maintained.

The second modification in FIGS. 130A, 130B, 130C, 130D, 130E, and 130F are similar to the first modification in FIGS. 129A, 129B, 129C, 129D, 129E, and 129F except for the above-described points.

Even in the second modification in FIGS. 130A, 130B, 130C, 130D, 130E, and 130F, when the conductor layer C is viewed in a predetermined plane range (plane region), the current distribution of the linear conductor 1251A and the current distribution of the linear conductor 1251B become the same or substantially the same, so that generation of inductive noise can be suppressed.

Furthermore, since the capacitive noise can be completely canceled in the X direction, the capacitive noise can be significantly improved. Since the stacked layer of the conductor layers A and C and the stacked layer of the conductor layers B and C have the light-shielding structure, the light-shielding restrictions of the conductor layers A and B can be significantly alleviated. Furthermore, the wiring resistance can be lowered and the voltage drop can be improved. Moreover, the degree of freedom in layout of the conductor layers A and B can be improved.

Fifth Configuration Example of Three-layer Conductor Layer

FIGS. 131A, 131B, 131C, 131D, 131E, and 131F illustrate a fifth configuration example of the three-layer conductor layer.

Figures 131A, 131B, 131C, 131D, 131E, 131F:
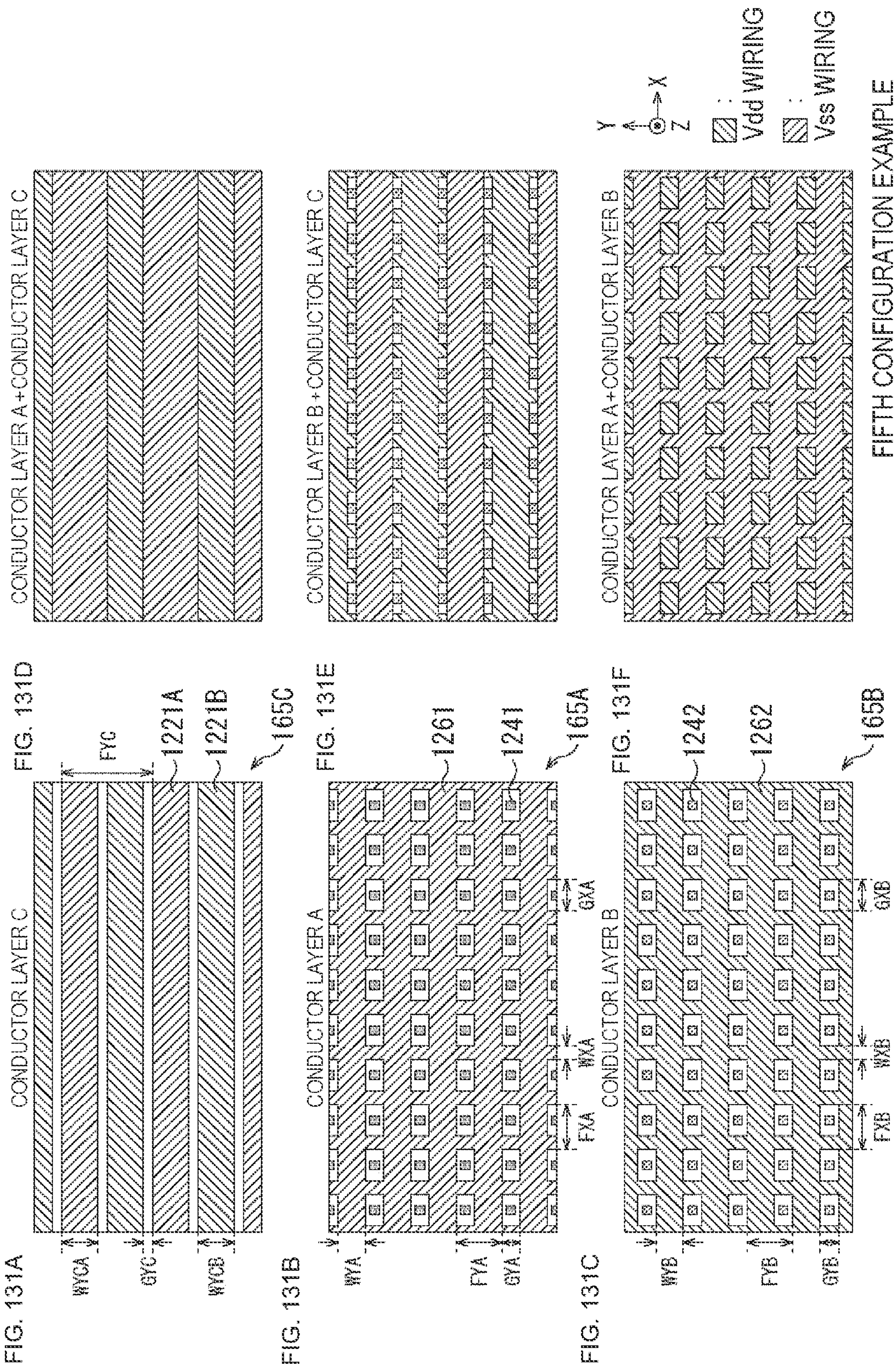

FIG. 131A illustrates the conductor layer C (wiring layer 165C), FIG. 131B illustrates the conductor layer A (wiring layer 165A), and FIG. 131C illustrates the conductor layer B (wiring layer 165B).

Furthermore, FIG. 131C is a plan view of a stacked state of the conductor layer A and the conductor layer C, FIG. 131E is a plan view of a stacked state of the conductor layer B and the conductor layer C, and FIG. 131E is a plan view of a stacked state of the conductor layer A and the conductor layer B.

In the fifth configuration example in FIGS. 131A, 131B, 131C, 131D, 131E, and 131F a portion corresponding to that in the fourth configuration example illustrated in FIGS. 128A, 128B, 128C, 128D, 128E, and 128F are given the same reference numeral and description of the portion is omitted as appropriate, and description will be given focusing on different portions.

The conductor layer A in FIG. 131B has a reticulated conductor 1261. The difference of the reticulated conductor 1261 from the reticulated conductor 1201 of the fourth configuration example illustrated in FIGS. 128A, 128B, 128C, 128D, 128E, and 128E are the ratio of the gap width GXA in the X direction and the gap width GYA in the Y direction. Specifically, the reticulated conductor 1201 of the conductor layer A of the fourth configuration example illustrated in FIGS. 128A, 128B, 128C, 128D, 128E, and 128E has (the gap width GYA/the gap width GXA)>1, whereas the reticulated conductor 1261 of the conductor layer A of the fifth configuration example in FIG. 131B has (the gap width GYA/the gap width GXA)<1.

In other words, the reticulated conductor 1201 of the conductor layer A of the fourth configuration example illustrated in FIGS. 128A, 128B, 128C, 128D, 128E, and 128E has the conductor width WXA>the conductor width WYA and the gap width GYA>the gap width GXA, and is a conductor in which the current easily flows in the Y direction, whereas the reticulated conductor 1261 of the conductor layer A of the fifth configuration example in FIG. 131B has the conductor width WXA<the conductor width WYA and the gap width GYA<the gap width GXA, and is a conductor in which the current easily flows in the X direction.

Moreover, in other words, the direction in which the current easily flows in the conductor layer C of the fourth configuration example illustrated in FIGS. 128A 128B, 128C, 128D, 128E, and 128F and the direction in which the current easily flows in the conductor layers A and B are substantially orthogonal and differ by approximately degrees, whereas the direction in which the current easily flows in the conductor layer C of the fifth configuration example in FIG. 131B and the direction in which the current easily flows in the conductor layers A and B are the same or substantially the same. In the case of the fifth configuration example in FIGS. 131A, 131B, 131C, 131D, 131E, and 131F, the voltage drop can be further improved depending on the wiring layout.

In the fourth configuration example illustrated in FIGS. 128A, 128B, 128C, 128D, 128E, and 128F, when comparing the positions of the gaps between the reticulated conductor 1201 of the conductor layer A and the reticulated conductor 1202 of the conductor layer B, the positions in the X direction are different and the positions in the Y direction match.

Meanwhile, in the fifth configuration example in FIG. 131B the positions of the gaps in the X direction match and the positions of the gaps in the Y direction are different in the reticulated conductor 1261 of the conductor layer A and the reticulated conductor 1262 of the conductor layer B In other words, when comparing the conductors in the same or substantially the same direction as a direction (Y direction) into which the signal line 132 of the wiring layer 170 extends between the reticulated conductor 1261 of the conductor layer A and the reticulated conductor 1262 of the conductor layer B, all the conductors overlap as viewed from the stacking direction. The conductor layer A and the conductor layer B having such a configuration correspond to the sixth configuration example of the conductor layers A and B illustrated in FIGS. 27A, 27B, and 27C, and can significantly improve the inductive noise, as illustrated in the simulation result in FIG. 28C.

The second modification in FIGS. 130A, 130B, 130C, 130D, 130E, and 30F are similar to the fourth configuration example illustrated in FIGS. 128A, 128B, 128C, 128D, 128E, and 128F except for the above-described points.

The conductor layer C in FIG. 131A is the same as the conductor layer C of the fourth configuration example illustrated in FIGS. 128A, 128B, 128C, 128D, 128E, and 128F. Therefore, when the conductor layer C is viewed in a predetermined plane range (plane region), the current distribution of the linear conductor 1221A and the current distribution of the linear conductor 1221B become the same or substantially the same, so that generation of inductive noise can be suppressed.

Since the linear conductor 1221A and the linear conductor 1221B have the same wiring pattern repeated in the Y direction, the capacitive noise can be completely canceled in the Y direction. The capacitive noise can be significantly improved as the conductor layer C is closer to the wiring layer 170.

As illustrated in FIG. 131F the stacked layer of the conductor layers A and B has a light-shielding structure, and the hot carrier light emission from the active element group 167 can be shielded. In addition, as illustrated in FIG. 131C, the stacked layer of the conductor layers A and C has also a light-shielding structure, and the light-shielding property is maintained. Thereby, since the light-shielding restrictions of the conductor layers A and B can be significantly alleviated, the conductive area of the conductor layers A and B can be used to the maximum, the wiring resistance can be lowered, and the voltage drop can be further improved. Furthermore, the degree of freedom in layout of the conductor layers A and B can be improved.

Moreover, in the case where the reticulated conductor 1261 of the conductor layer A and the linear conductor 1221A of the conductor layer C are electrically connected, and the reticulated conductor 1262 of the conductor layer B and the linear conductor 1221B of the conductor layer C are electrically connected, the current amount of the conductor layers A and B can be made small. Therefore, the inductive noise and the voltage drop from the conductor layer A or B can be further improved.

Sixth Configuration Example of Three-layer Conductor Layer

FIGS. 132A, 132B, 132C, 132D, 132E, and 132F illustrate a sixth configuration example of the three-layer conductor layer.

Figures 132A, 132B, 132C, 132D, 132E, 132F:
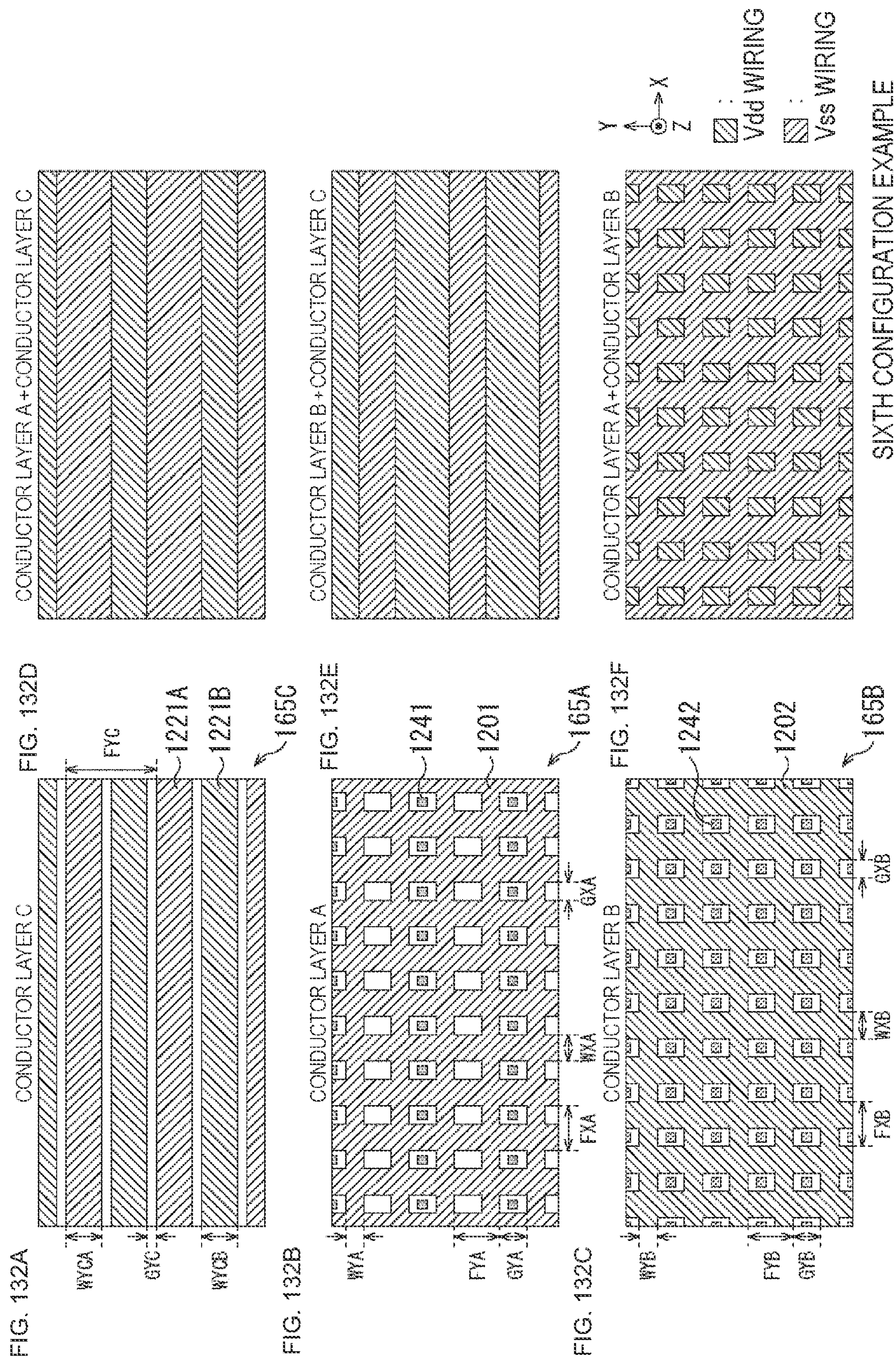

FIG. 132A illustrates the conductor layer C (wiring layer 165C), FIG. 132B illustrates the conductor layer A (wiring layer 165A), and FIG. 132D illustrates the conductor layer B (wiring layer 165B).

Furthermore, FIG. 132D is a plan view of a stacked state of the conductor layer A and the conductor layer C, FIG. 132E is a plan view of a stacked state of the conductor layer B and the conductor layer C, and FIG. 132F is a plan view of a stacked state of the conductor layer A and the conductor layer B.

In the sixth configuration example in FIGS. 132A, 132B, 132C, 132D, 132E, and 132F, a portion corresponding to that in the fourth configuration example illustrated in FIGS. 128A, 128B, 128C, 128D, 128E, and 128F given the same reference numeral and description of the portion is omitted as appropriate, and description will be given focusing on different portions.

The sixth configuration example in FIGS. 132A, 132B, 132C, 132D, 132E, and 132F a configuration in which a part of the relay conductor 1241 of the conductor layer A is omitted in the fourth configuration example illustrated in FIGS. 128A 128B, 128C, 128D, 128E, and 128F. Specifically, in the fourth configuration example in FIGS. 128A, 128B, 128C, 128D, 128E, and 128F, the relay conductor 1241 is formed in all the gaps in a matrix of the reticulated conductor 1201, whereas in the sixth configuration example in FIGS. 132A, 132B, 132C, 132D, 132E, and 132F, a row in which the relay conductor 1241 is formed and a row in which the relay conductor 1241 is not formed are alternately arranged in the Y direction in units of rows. The relay conductor 1241 of the conductor layer A is located in the XY plane region of the linear conductor 1221B of the conductor layer C.

In this way, the relay conductor 1241 formed in each gap of the reticulated conductor 1201 may be thinned out and arranged in a part of the gaps instead of being arranged in all the gaps. The restrictions such as occupancy of the wiring region in the conductor layer A can be secured, and the degree of freedom in designing the wiring layout can be increased.

The sixth configuration example in FIGS. 132A, 132B, 132C, 132D, 132E, and 132F are similar to the fourth configuration example illustrated in FIGS. 128A 128B, 128C, 128D, 128E, and 128F except for the above-described points.

The conductor layer C in FIG. 132A is the same as the conductor layer C of the fourth configuration example illustrated in FIGS. 128A, 128B, 128C, 128D, 128E, and 128F. Therefore, when the conductor layer C is viewed in a predetermined plane range (plane region), the current distribution of the linear conductor 1221A and the current distribution of the linear conductor 1221B become the same or substantially the same, so that generation of inductive noise can be suppressed.

Since the linear conductor 1221A and the linear conductor 1221B have the same wiring pattern repeated in the Y direction, the capacitive noise can be completely canceled in the Y direction. The capacitive noise can be significantly improved as the conductor layer C is closer to the wiring layer 170.

As illustrated in FIG. 132F, the stacked layer of the conductor layers A and B has a light-shielding structure, and the hot carrier light emission from the active element group 167 can be shielded. In addition, as illustrated in FIGS. 132D and 132E, the stacked layer of the conductor layers A and C and the stacked layer of the conductor layers B and C have also a light-shielding structure, and the light-shielding property is maintained. Thereby, since the light-shielding restrictions of the conductor layers A and B can be significantly alleviated, the conductive area of the conductor layers A and B can be used to the maximum, the wiring resistance can be lowered, and the voltage drop can be further improved. Furthermore, the degree of freedom in layout of the conductor layers A and B can be improved.

By providing the relay conductor 1241 in the conductor layer A, it becomes possible to connect the reticulated conductor 1202 and the linear conductor 1221B in the substantially shortest distance or a short distance to draw the power supply, thereby reducing the voltage drop, energy loss, or inductive noise.

By providing the relay conductor 1242 in the conductor layer B, it becomes possible to connect the reticulated conductor 1201 and the linear conductor 1221A in the substantially shortest distance or a short distance, thereby reducing the voltage drop, energy loss, or inductive noise.

In the sixth configuration example in FIGS. 132A, 132B, 132C, 132D, 132E, and 132F, the direction in which the current of the conductor layer C is likely to flow and the direction in which the current of the conductor layers A and B is likely to flow are substantially orthogonal and differ by approximately 90 degrees. As a result, the current becomes easily diffused (the current is less likely to be concentrated), so that the inductive noise can be further improved.

Modification of Sixth Configuration Example of Three-layer Conductor Layer

FIGS. 133A, 133B, 133C, 133D, 133E, and 133F illustrate a modification of the sixth configuration example of the three-layer conductor layer.

Figures 133A, 133B, 133C, 133D, 133E, 133F:
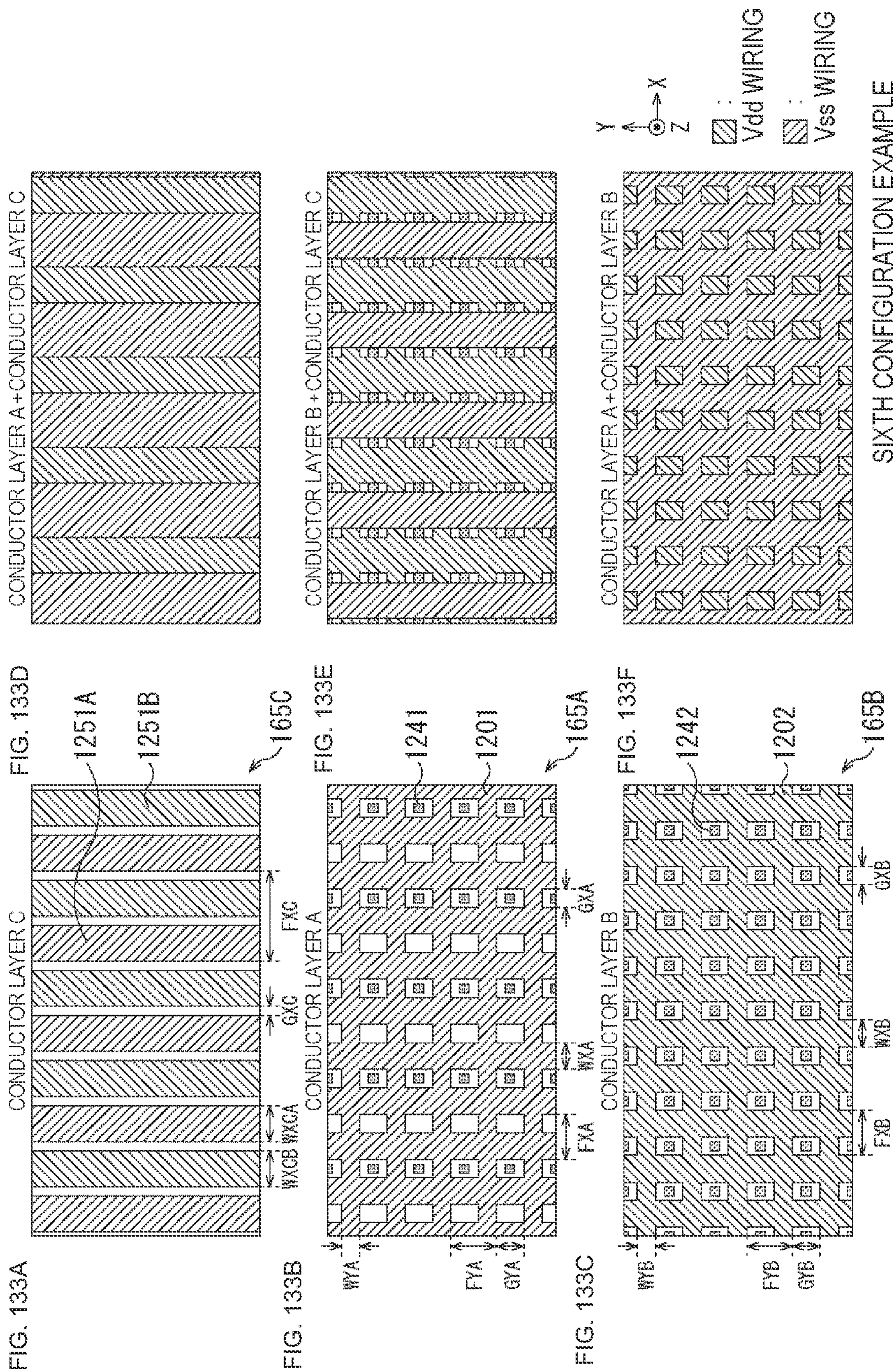

FIG. 133A illustrates the conductor layer C (wiring layer 165C), FIG. 133B illustrates the conductor layer A (wiring layer 165A), and FIG. 133D illustrates the conductor layer B (wiring layer 165B).

Furthermore, FIG. 133D is a plan view of a stacked state of the conductor layer A and the conductor layer C, FIG. 133E is a plan view of a stacked state of the conductor layer B and the conductor layer C, and FIG. 133F is a plan view of a stacked state of the conductor layer A and the conductor layer B.

In FIGS. 133A, 133B, 133C, 133D, 133E, and 133F, a portion corresponding to that in the sixth configuration example illustrated in FIGS. 132A, 132B. 132C, 132D, 132E, and 132F are given the same reference numeral and description of the portion is omitted as appropriate, and description will be given focusing on different portions.

In the modification of the sixth configuration example, the configurations of the conductor layer A and the conductor layer C are different from those of the sixth configuration example in FIGS. 132A, 132B, 132C, 132D, 132E, and 132F.

In the conductor layer FIG. 132A, the linear conductor 1221A long in the X direction and the linear conductor 1221B long in the X direction have been alternately and periodically arranged in the Y direction. Thereby, the direction in which the current of the conductor layer C is likely to flow and the direction in which the current of the conductor layers A and B is likely to flow are substantially orthogonal and differ by approximately 90 degrees.

In contrast, in the conductor layer C in FIG. 133A, a linear conductor A long in the Y direction and a linear conductor 1251B long in the Y direction are alternately and periodically arranged in the X direction. Thereby, the direction in which the current of the conductor layer C is likely to flow and the direction in which the current of the conductor layers A and B is likely to flow are the same or substantially the same. In this case, the voltage drop can be further improved depending on the wiring layout.

Next, in the conductor layer A in FIG. 132B, a row in which the relay conductor 1241 is formed and a row in which the relay conductor 1241 is not formed are alternately arranged in the Y direction in units of rows in the gaps in a matrix of the reticulated conductor 1201.

In contrast, in the conductor layer A in FIG. 133B a column in which the relay conductor 1241 is formed and a column in which the relay conductor 1241 is not formed are alternately arranged in the X direction in units of columns in the gaps in a matrix of the reticulated conductor 1201. The relay conductor 1241 of the conductor layer A is located in the XY plane region of the linear conductor 1251B of the conductor layer C.

The modification of the sixth configuration example in FIGS. 133A, 133B, 133C, 133D, 133E, and 133F are similar to the sixth configuration example illustrated in FIGS. 132A, 132B, 132C, 132D, 132E, and 132F except for the above-described points.

The conductor layer C in FIG. 133A is the same as the conductor layer C of the first modification of the fourth configuration example illustrated in FIGS. 129A 129B, 129C, 129D, 129E, and 129F. Therefore, the current distribution of the linear conductor 1251A and the current distribution of the linear conductor 1251B become the same or substantially the same, so that generation of inductive noise can be suppressed.

Since the linear conductor 1251A and the linear conductor 1251B repeat the same wiring pattern in the X direction, the capacitive noise can be completely canceled in the X direction. The capacitive noise can be significantly improved as the conductor layer C is closer to the wiring layer 170.

As illustrated in FIG. 133E, the stacked layer of the conductor layers A and B has a light-shielding structure, and the hot carrier light emission from the active element group 167 can be shielded. In addition, as illustrated in FIG. 133D, the stacked layer of the conductor layers A and C has also a light-shielding structure, and the light-shielding property is maintained. Thereby, since the light-shielding restrictions of the conductor layers A and B can be significantly alleviated, the conductive area of the conductor layers A and B can be used to the maximum, the wiring resistance can be lowered, and the voltage drop can be further improved. Furthermore, the degree of freedom in layout of the conductor layers A and B can be improved.

Moreover, in the case where the reticulated conductor 1201 of the conductor layer A and the linear conductor 1251A of the conductor layer C are electrically connected, and the reticulated conductor 1202 of the conductor layer B and the linear conductor 1251B of the conductor layer C are electrically connected, the current amount of the conductor layers A and B can be made small. Therefore, the inductive noise and the voltage drop from the conductor layer A or B can be further improved.

Note that, in the modification of the sixth configuration example in FIGS. 133A, 133B, 133C, 133D, 133E, and 133F, the relay conductors 1241 of the conductor layer A are thinned out, and the relay conductors 1242 of the conductor layer B are not thinned out. However, a configuration in which the relay conductors 1242 of the conductor layer B are thinned out and the relay conductors 1241 of the conductor layer A are not thinned out can also be adopted.

Seventh Configuration Example of Three-layer Conductor Layer

FIGS. 134A, 134B, 134C, 134D, 134E, and 134F illustrate a seventh configuration example of the three-layer conductor layer.

Figures 134A, 134B, 134C, 134D, 134E, 134F:
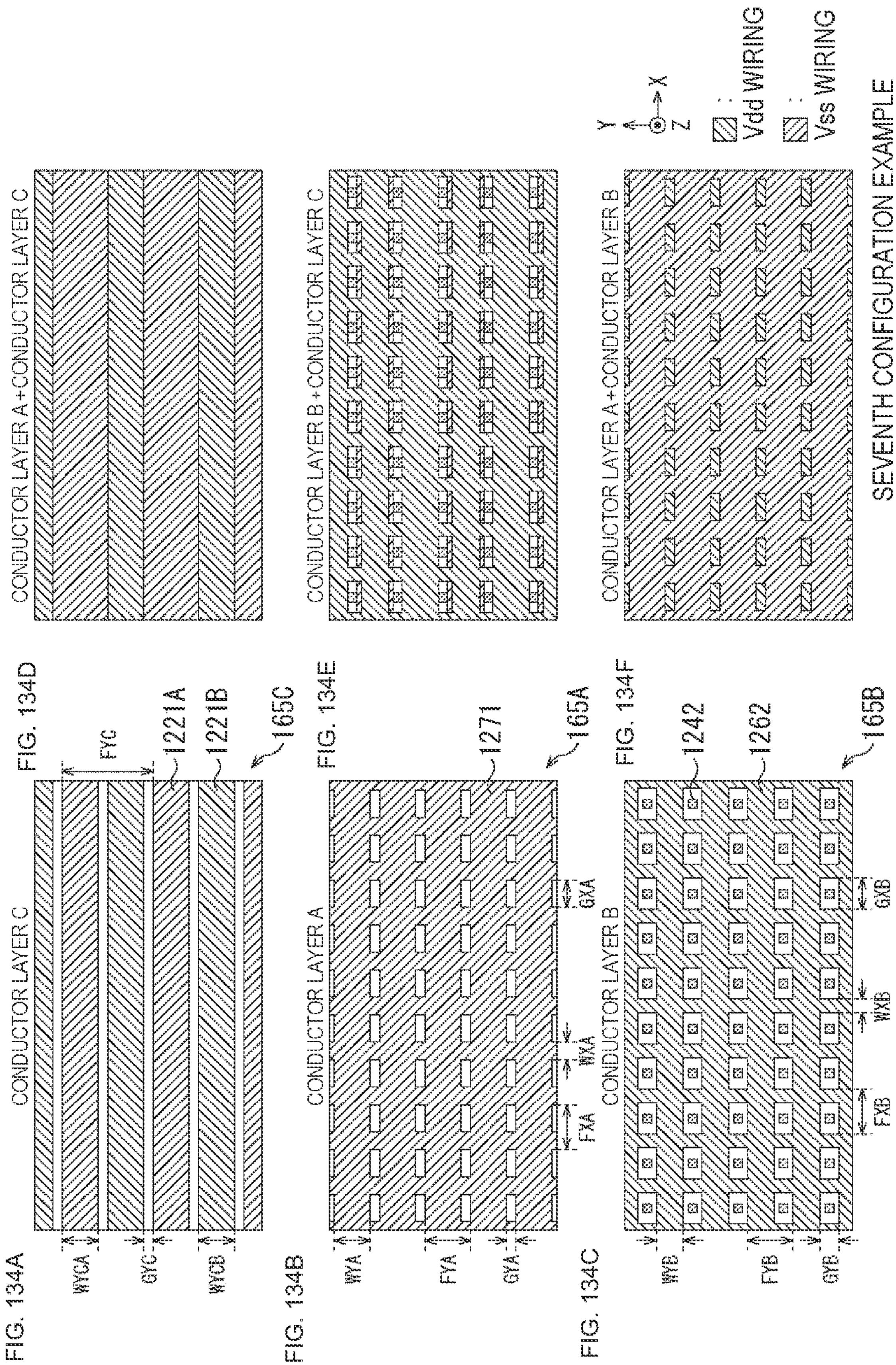

FIG. 134A illustrates the conductor layer C (wiring layer 165C), FIG. 134B illustrates the conductor layer A (wiring layer 165A), and FIG. 134D illustrates the conductor layer B (wiring layer 165B).

Furthermore, FIG. 134D is a plan view of a stacked state of the conductor layer A and the conductor layer C, FIG. 134E is a plan view of a stacked state of the conductor layer B and the conductor layer C, and FIG. 134F is a plan view of a stacked state of the conductor layer A and the conductor layer B.

In the seventh configuration example in FIGS. 134A, 134B, 134C, 134D, 134E, and 134F, a portion corresponding to that in the fifth configuration example illustrated in FIGS. 131A, 131B, 131C, 131D, 131E, and 131F are given the same reference numeral and description of the portion is omitted as appropriate, and description will be given focusing on different portions.

In the seventh configuration example, only the configuration of the conductor layer A in FIG. 134B is different from that of the fifth configuration example in FIGS. 131A, 131B, 131C, 131D, 131E, and 131F. The conductor layers B and C of the seventh configuration example are similar to the conductor layers B and C of the fifth configuration example in FIGS. 131A, 131B, 131C, 131D, 131E, and 131F.

The conductor layer A in FIG. 134B in the seventh configuration example has a reticulated conductor 1271. Furthermore, in the conductor layer A, the relay conductor 1241 is not formed inside the gap having the gap width GXA in the X direction and the gap width GYA in the Y direction of the reticulated conductor 1271.

In other words, the gap width GXA and the gap width GYA of the reticulated conductor 1271 in FIG. 134B are smaller than the gap width GXA and the gap width GYA of the reticulated conductor 1261 in FIG. 131B and the gap is not sufficient to form the relay conductor 1241.

The seventh configuration example in FIGS. 134A, 134B, 134C, 134D, 134E, and 134F are similar to the fifth configuration example illustrated in FIGS. 131A, 131B, 131C, 131D, 131E, and 131F except for the above-described points.

The conductor layer C in FIG. 134A is the same as the conductor layer C of the fifth configuration example illustrated in FIGS. 131A, 131B, 131C, 131D, 131E, and 131F. Therefore, when the conductor layer C is viewed in a predetermined plane range (plane region), the current distribution of the linear conductor 1221A and the current distribution of the linear conductor 1221B become the same or substantially the same, so that generation of inductive noise can be suppressed.

Since the linear conductor 1221A and the linear conductor 1221B have the same wiring pattern repeated in the Y direction, the capacitive noise can be completely canceled in the Y direction. The capacitive noise can be significantly improved as the conductor layer C is closer to the wiring layer 170.

As illustrated in FIG. 134E, the stacked layer of the conductor layers A and B has a light-shielding structure, and the hot carrier light emission from the active element group 167 can be shielded. In addition, as illustrated in FIG. 134D, the stacked layer of the conductor layers A and C has also a light-shielding structure, and the light-shielding property is maintained. Thereby, since the light-shielding restrictions of the conductor layers A and B can be significantly alleviated, the conductive area of the conductor layers A and B can be used to the maximum, the wiring resistance can be lowered, and the voltage drop can be further improved. Furthermore, the degree of freedom in layout of the conductor layers A and B can be improved.

The seventh configuration example in FIGS. 134A, 134B, 134C, 134D, 134E, and 134F are particularly suitable for the stacking order in which the three conductor layers A to C can be electrically connected, specifically for the stacking order illustrated in FIG. 120B. In the case of the stacking order of the conductor layers A, B, and C illustrated in FIG. 120B, the reticulated conductor 1271 of the conductor layer A and the linear conductor 1221A of the conductor layer C can be connected via the conductor via in the Z direction in a part of a region where plane regions overlap, and the reticulated conductor 1262 and the relay conductor 1242 of the conductor layer B can be respectively connected with the linear conductors 1221B and 1221A of the conductor layer C via the conductor via in the Z direction between the conductors having common current characteristics and in a part of a region where plane regions overlap.

Eighth Configuration Example of Three-layer Conductor Layer

FIGS. 135A, 135B, 135C, 135D, 135E, and 135F illustrate an eighth configuration example of the three-layer conductor layer.

Figures 135A, 135B, 135C, 135D, 135E, 135F:
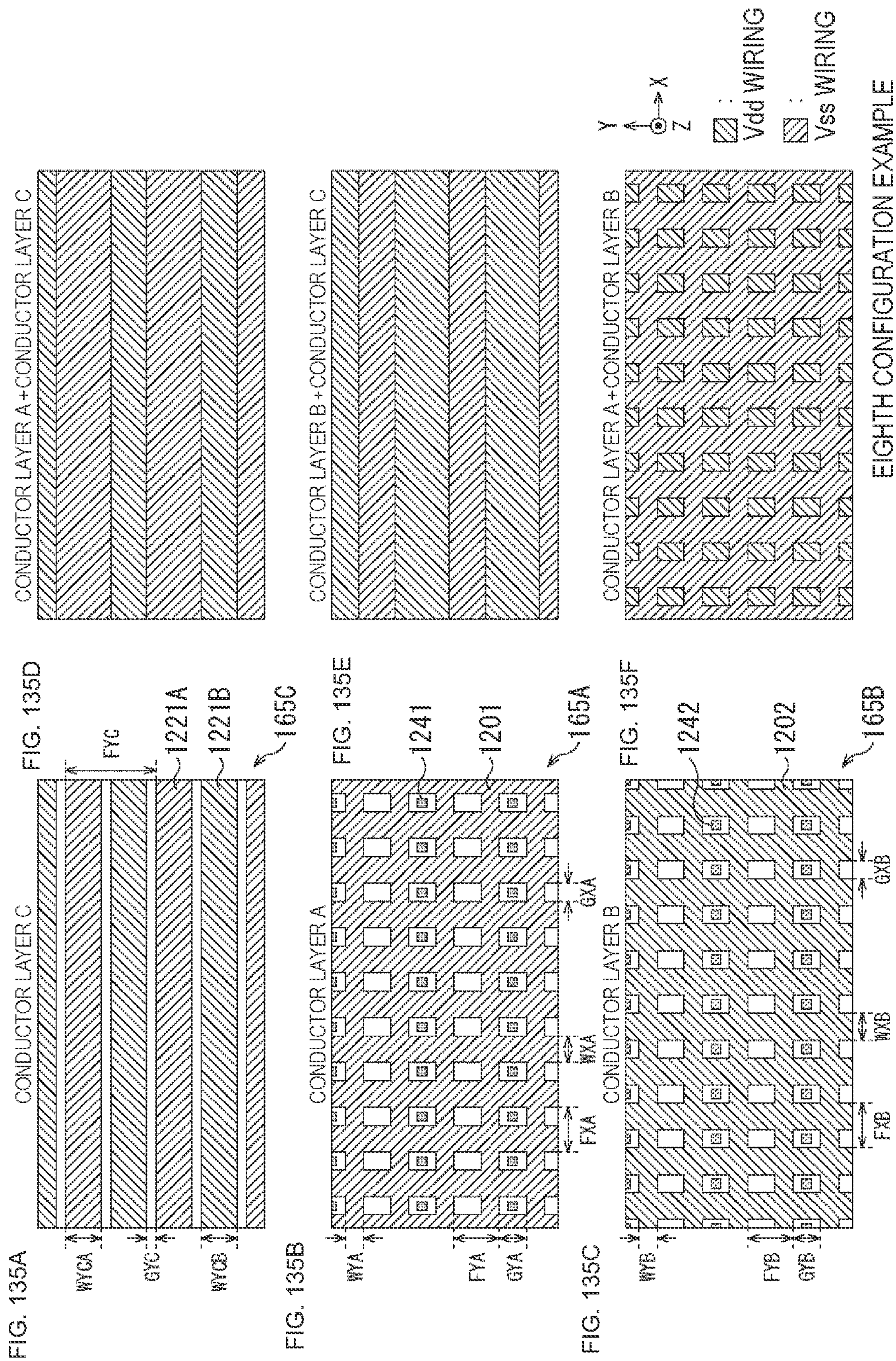

FIG. 135A illustrates the conductor layer C (wiring layer 165C), FIG. 135B illustrates the conductor layer A (wiring layer 165A), and FIG. 135D illustrates the conductor layer B (wiring layer 165B).

Furthermore, FIG. 135D is a plan view of a stacked state of the conductor layer A and the conductor layer C, FIG. 135E is a plan view of a stacked state of the conductor layer B and the conductor layer C, and FIG. 135F is a plan view of a stacked state of the conductor layer A and the conductor layer B.

The eighth configuration example in FIGS. 135A, 135B, 135C, 135D, 135E, and 135F has a configuration in which a part of the fourth configuration example illustrated in FIGS. 128A, 128B, 128C, 128D, 128E, and 128F are changed. The eighth configuration example in FIGS. 135A, 135B, 135C, 135D, 135E, and 135F will be described while being compared with the fourth configuration example. Note that, in FIGS. 135A, 135B, 135C, 135D, 135E, and 135F, the same reference numerals are given to the portions corresponding to those in FIGS. 128A, 128B, 128C, 128D, 128E, and 128F.

The conductor layer FIG. 135A is similar to the conductor layer C of the fourth configuration example illustrated in FIG. 128A. That is, the conductor layer C is configured such that a linear conductor 1221A long in the X direction and a linear conductor 1221B long in the X direction are alternately and periodically arranged in the Y direction.

The conductor layer A in FIG. 128B has a configuration in which a part of the relay conductor 1241 of the conductor layer A is omitted in the fourth configuration example illustrated in FIGS. 128A, 128B, 128C, 128D, 128E, and 128F. Specifically, in the fourth configuration example in FIGS. 128A, 128B, 128C, 128D, 128E, and 128F, the relay conductor 1241 is formed in all the gaps in a matrix of the reticulated conductor 1201, whereas in the eighth configuration example in FIGS. 135A 135B, 135C, 135D, 135E, and 135F, a row in which the relay conductor 1241 is formed and a row in which the relay conductor 1241 is not formed are alternately arranged in the Y direction in units of rows.

Similarly, the conductor layer B in FIG. 128C has a configuration in which a part of the relay conductor 1242 of the conductor layer B is omitted in the fourth configuration example illustrated in FIGS. 128A, 128B, 128C, 128D, 128E, and 128F. Specifically, in the fourth configuration example in FIGS. 128A, 128B, 128C, 128D, 128E, and 128F, the relay conductor 1242 is formed in all the gaps in a matrix of the reticulated conductor 1201, whereas in the eighth configuration example in FIGS. 135A 135B, 135C, 135D, 135E, and 135F, a row in which the relay conductor 1242 is formed and a row in which the relay conductor 1242 is not formed are alternately arranged in the Y direction in units of rows.

Therefore, the eighth configuration example in FIGS. 135A, 135B, 135C, 135D, 135E, and 135F has a configuration in which the relay conductors 1241 arranged in the gaps in the matrix of the reticulated conductor 1201 are thinned out every other row in units of rows in the conductor layer A, and the relay conductor 1242 arranged in the gaps in the matrix of the reticulated conductor 1202 are thinned out every other row in units of rows in the conductor layer B, from the fourth configuration example in FIGS. 128A, 128B, 128C, 128D, 128E, and 128F.

The eighth configuration example in FIGS. 135A, 135B, 135C, 135D, 135E, and 135F are similar to the fourth configuration example illustrated in FIGS. 128A 128B, 128C, 128D, 128E, and 128F except for the above-described points.

When the conductor layer C in FIG. 135A is viewed in a predetermined plane range (plane region), the current distribution of the linear conductor 1221A and the current distribution of the linear conductor 1221B become the same or substantially the same, so that generation of inductive noise can be suppressed.

Since the linear conductor 1221A and the linear conductor 1221B have the same wiring pattern repeated in the Y direction, the capacitive noise can be completely canceled in the Y direction. The capacitive noise can be significantly improved as the conductor layer C is closer to the wiring layer 170.

As illustrated in FIG. 135F, the stacked layer of the conductor layers A and B has a light-shielding structure, and the hot carrier light emission from the active element group 167 can be shielded. In addition, as illustrated in FIGS. 135D and 135E, the stacked layer of the conductor layers A and C and the stacked layer of the conductor layers B and C have also a light-shielding structure, and the light-shielding property is maintained. Thereby, since the light-shielding restrictions of the conductor layers A and B can be significantly alleviated, the conductive area of the conductor layers A and B can be used to the maximum, the wiring resistance can be lowered, and the voltage drop can be further improved. Furthermore, the degree of freedom in layout of the conductor layers A and B can be improved.

By providing the relay conductor 1241 in the conductor layer A, it becomes possible to connect the reticulated conductor 1202 and the linear conductor 1221B in the substantially shortest distance or a short distance to draw the power supply, thereby reducing the voltage drop, energy loss, or inductive noise.

By providing the relay conductor 1242 in the conductor layer B, it becomes possible to connect the reticulated conductor 1201 and the linear conductor 1221A in the substantially shortest distance or a short distance, thereby reducing the voltage drop, energy loss, or inductive noise.

In the eighth configuration example in FIGS. 135A, 135B, 135C, 135D, 135E, and 135F, the direction in which the current of the conductor layer C is likely to flow and the direction in which the current of the conductor layers A and B is likely to flow are substantially orthogonal and differ by approximately 90 degrees. As a result, the current becomes easily diffused (the current is less likely to be concentrated), so that the inductive noise can be further improved.

First Modification of Eighth Configuration Example of Three-layer Conductor Layer FIGS. 136A, 136B, 136C, 136D, 136E, and 136F illustrate a first modification of the eighth configuration example of the three-layer conductor layer.

Figures 136A, 136B, 136C, 136D, 136E, 136F:
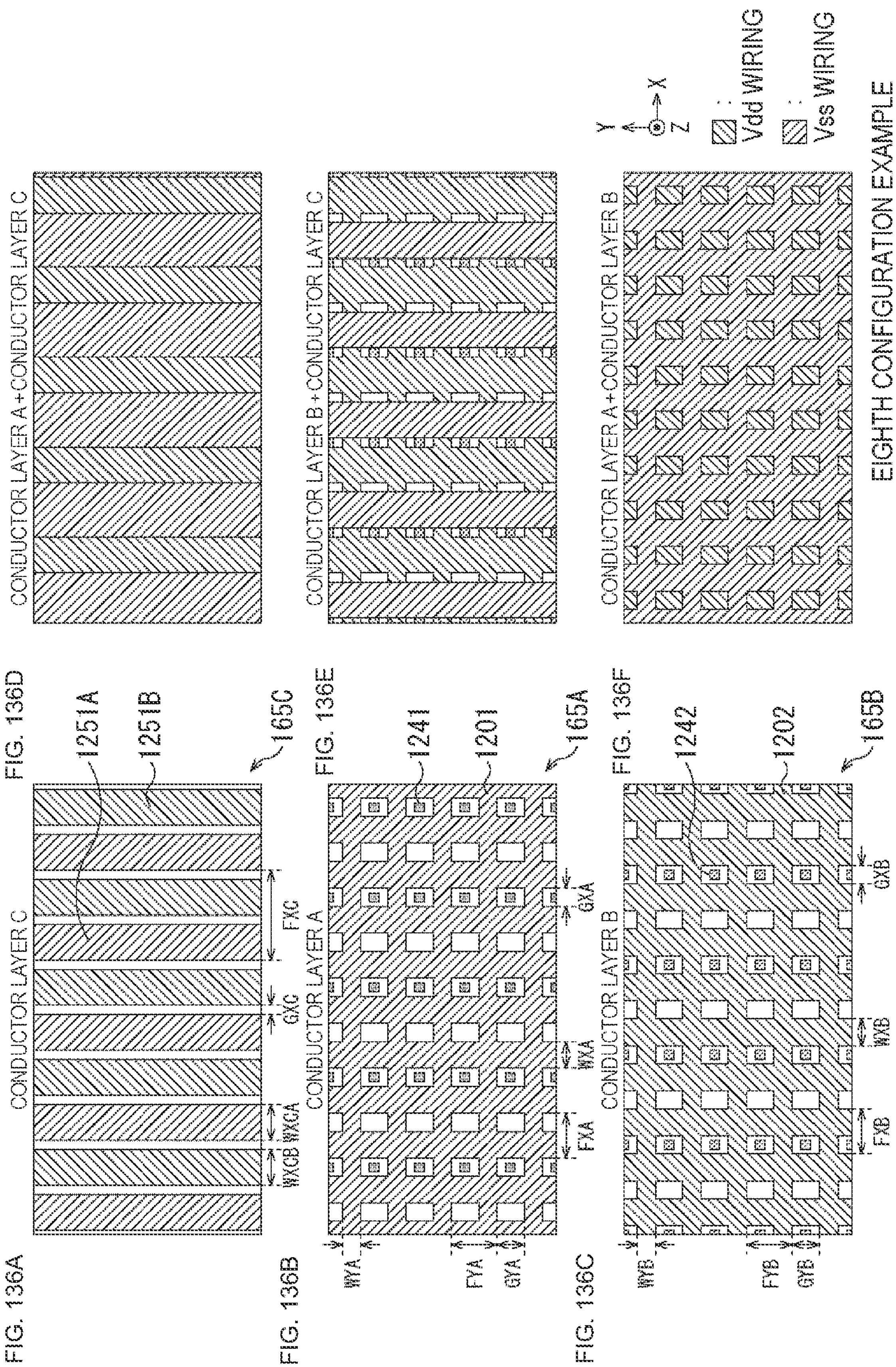

FIG. 136A illustrates the conductor layer C (wiring layer 165C), FIG. 136B illustrates the conductor layer A (wiring layer 165A), and FIG. 136D illustrates the conductor layer B (wiring layer 165B).

Furthermore, FIG. 136D is a plan view of a stacked state of the conductor layer A and the conductor layer C, FIG. 136E is a plan view of a stacked state of the conductor layer B and the conductor layer C, and FIG. 136F is a plan view of a stacked state of the conductor layer A and the conductor layer B.

In FIGS. 136A, 136B, 136C, 136D, 136E, and 136F, a portion corresponding to that in the eighth configuration example illustrated in FIGS. 135A 135B, 135C, 135D, 135E, and 135F are given the same reference numeral and description of the portion is omitted as appropriate, and description will be given focusing on different portions.

In the first modification of the eighth configuration example, the configurations of the conductor layers A to C are different from those of the eighth configuration example in FIGS. 135A, 135B, 135C, 135D, 135E, and 135F.

In the conductor layer FIG. 135A, the linear conductor 1221A long in the X direction and the linear conductor 1221B long in the X direction have been alternately and periodically arranged in the Y direction. Thereby, the direction in which the current of the conductor layer C is likely to flow and the direction in which the current of the conductor layers A and B is likely to flow are substantially orthogonal and differ by approximately 90 degrees.

In contrast, in the conductor layer C in FIG. 136A, a linear conductor A long in the Y direction and a linear conductor 1251B long in the Y direction are alternately and periodically arranged in the X direction. Thereby, the direction in which the current of the conductor layer C is likely to flow and the direction in which the current of the conductor layers A and B is likely to flow are the same or substantially the same. In this case, the voltage drop can be further improved depending on the wiring layout.

Next, in the conductor layer A in FIG. 135B, a row in which the relay conductor 1241 is formed and a row in which the relay conductor 1241 is not formed are alternately arranged in the Y direction in units of rows in the gaps in a matrix of the reticulated conductor 1201.

In contrast, in the conductor layer A in FIG. 136B a column in which the relay conductor 1241 is formed and a column in which the relay conductor 1241 is not formed are alternately arranged in the X direction in units of columns in the gaps in a matrix of the reticulated conductor 1201. The relay conductor 1241 of the conductor layer A is located in the XY plane region of the linear conductor 1251B of the conductor layer C.

Furthermore, in the conductor layer B in FIG. 135C, a row in which the relay conductor 1242 is formed and a row in which the relay conductor 1242 is not formed are alternately arranged in the Y direction in units of rows in the gaps in a matrix of the reticulated conductor 1202.

In contrast, in the conductor layer B in FIG. 136C, a column in which the relay conductor 1242 is formed and a column in which the relay conductor 1242 is not formed are alternately arranged in the X direction in units of columns in the gaps in a matrix of the reticulated conductor 1202.

The first modification of the eighth configuration example in FIG. 136A 136B, 136C, 136D, 136E, and 136F are similar to the eighth configuration example illustrated in FIGS. 135A, 135B, 135C, 135D, 135E, and 135F except for the above-described points.

When the conductor layer C in FIG. 136A is viewed in a predetermined plane range (plane region), the current distribution of the linear conductor 1251A and the current distribution of the linear conductor 1251B become the same or substantially the same, so that generation of inductive noise can be suppressed.

Since the linear conductor 1251A and the linear conductor 1251B repeat the same wiring pattern in the X direction, the capacitive noise can be completely canceled in the X direction. The capacitive noise can be significantly improved as the conductor layer C is closer to the wiring layer 170.

As illustrated in FIG. 136E, the stacked layer of the conductor layers A and B has a light-shielding structure, and the hot carrier light emission from the active element group 167 can be shielded. In addition, as illustrated in FIG. 136D, the stacked layer of the conductor layers A and C has also a light-shielding structure, and the light-shielding property is maintained. Thereby, since the light-shielding restrictions of the conductor layers A and B can be significantly alleviated, the conductive area of the conductor layers A and B can be used to the maximum, the wiring resistance can be lowered, and the voltage drop can be further improved. Furthermore, the degree of freedom in layout of the conductor layers A and B can be improved.

Moreover, in the case where the reticulated conductor 1201 of the conductor layer A and the linear conductor 1251A of the conductor layer C are electrically connected, and the reticulated conductor 1202 of the conductor layer B and the linear conductor 1251B of the conductor layer C are electrically connected, the current amount of the conductor layers A and B can be made small. Therefore, the inductive noise and the voltage drop from the conductor layer A or B can be further improved.

By providing the relay conductor 1241 in the conductor layer A, it becomes possible to connect the reticulated conductor 1202 and the linear conductor 1251B in the substantially shortest distance or a short distance to draw the power supply, thereby reducing the voltage drop, energy loss, or inductive noise.

By providing the relay conductor 1242 in the conductor layer B, it becomes possible to connect the reticulated conductor 1201 and the linear conductor 1251A in the substantially shortest distance or a short distance, thereby reducing the voltage drop, energy loss, or inductive noise.

Second Modification of Eighth Configuration Example of Three-layer Conductor Layer FIGS. 137A, 137B, 137C, 137D, 137E, and 137F illustrate a second modification of the eighth configuration example of the three-layer conductor layer.

Figures 137A, 137B, 137C, 137F, 138D, 138E:
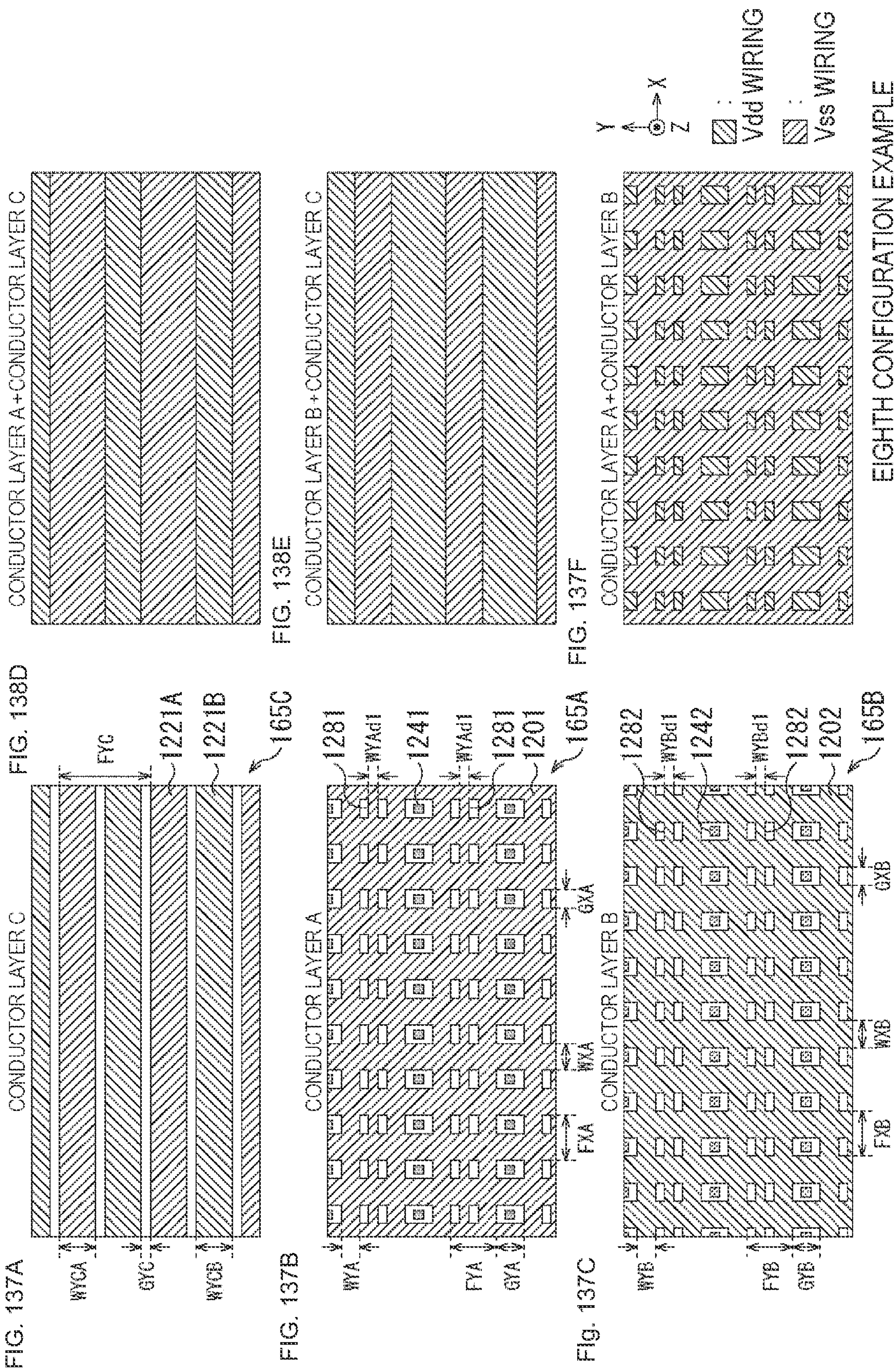

FIG. 137A illustrates the conductor layer C (wiring layer 165C), FIG. 137B illustrates the conductor layer A (wiring layer 165A), and FIG. 137D illustrates the conductor layer B (wiring layer 165B).

Furthermore, FIG. 137D is a plan view of a stacked state of the conductor layer A and the conductor layer C, FIG. 137E is a plan view of a stacked state of the conductor layer B and the conductor layer C, and FIG. 137F is a plan view of a stacked state of the conductor layer A and the conductor layer B.

In FIGS. 137A, 137B, 137C, 137D, 137E, and 137F, a portion corresponding to that in the eighth configuration example illustrated in FIG. 135A 135B, 135C, 135D, 135E, and 135F are given the same reference numeral and description of the portion is omitted as appropriate, and description will be given focusing on different portions.

In the second modification of the eighth configuration example, the configurations of the conductor layer A and the conductor layer B are different from those of the eighth configuration example in FIGS. 135A, 135B, 135C, 135D, 135E, and When comparing the conductor layer A in FIG. 137B with the eighth configuration example illustrated in FIGS. 135A, 135B, 135C, 135D, 135E, and 135F, a reinforced conductor 1281 having a conductor width WYAd1 in the Y direction is newly added in the gap where the relay conductor 1241 of the reticulated conductor 1201 is not formed. The reinforced conductor 1281 is a linear conductor having the conductor width of the gap width GXA in the X direction and long in the X direction.

When comparing the conductor layer B in FIG. 137C with the eighth configuration example illustrated in FIGS. 135A, 135B, 135C, 135D, 135E, and 135F, a reinforced conductor 1282 having a conductor width WYBd1 in the Y direction is newly added in the gap where the relay conductor 1242 of the reticulated conductor 1202 is not formed. The reinforced conductor 1282 is a linear conductor having the conductor width of the gap width GXB in the X direction and long in the X direction.

The second modification of the eighth configuration example in FIGS. 137A, 137B, 137C, 137D, 137E, and 137F are similar to the eighth configuration example illustrated in FIGS. 135A, 135B, 135C, 135D, 135E, and 135F except for the above-described points.

When the conductor layer C in FIG. 137A is viewed in a predetermined plane range (plane region), the current distribution of the linear conductor 1221A and the current distribution of the linear conductor 1221B become the same or substantially the same, so that generation of inductive noise can be suppressed.

Since the linear conductor 1221A and the linear conductor 1221B have the same wiring pattern repeated in the Y direction, the capacitive noise can be completely canceled in the Y direction. The capacitive noise can be significantly improved as the conductor layer C is closer to the wiring layer 170.

As illustrated in FIG. 137F, the stacked layer of the conductor layers A and B has a light-shielding structure, and the hot carrier light emission from the active element group 167 can be shielded. In addition, as illustrated in FIGS. 137D and 137E, the stacked layer of the conductor layers A and C and the stacked layer of the conductor layers B and C have also a light-shielding structure, and the light-shielding property is maintained. Thereby, since the light-shielding restrictions of the conductor layers A and B can be significantly alleviated, the conductive area of the conductor layers A and B can be used to the maximum, the wiring resistance can be lowered, and the voltage drop can be further improved. Furthermore, the degree of freedom in layout of the conductor layers A and B can be improved.

By providing the relay conductor 1241 in the conductor layer A, it becomes possible to connect the reticulated conductor 1202 and the linear conductor 1221B in the substantially shortest distance or a short distance to draw the power supply, thereby reducing the voltage drop, energy loss, or inductive noise.

By providing the relay conductor 1242 in the conductor layer B, it becomes possible to connect the reticulated conductor 1201 and the linear conductor 1221A in the substantially shortest distance or a short distance, thereby reducing the voltage drop, energy loss, or inductive noise.

In the second modification of the eighth configuration example in FIGS. 137A, 137B, 137C, 137D, 137E, and 137F, the direction in which the current of the conductor layer C is likely to flow and the direction in which the current of the conductor layers A and B is likely to flow are substantially orthogonal and differ by approximately degrees. As a result, the current becomes easily diffused (the current is less likely to be concentrated), so that the inductive noise can be further improved.

In the conductor layer A, the reinforced conductor 1281 long in the X direction is arranged at the position where the relay conductor 1241 has been thinned out, so that the wiring resistance can be made small, and the voltage drop can be further improved. The inductive noise can also be improved as the voltage drop is improved.

In the conductor layer B, the reinforced conductor 1282 long in the X direction is arranged at the position where the relay conductor 1242 has been thinned out, so that the wiring resistance can be made small, and the voltage drop can be further improved. The inductive noise can also be improved as the voltage drop is improved.

Third Modification of Eighth Configuration Example of Three-Layer Conductor Layer FIGS. 138A, 138B, 138C, 138D, 138E, and 138F illustrate a third modification of the eighth configuration example of the three-layer conductor layer.

Figures 138A, 138B, 138C, 138D, 138E, 138F:
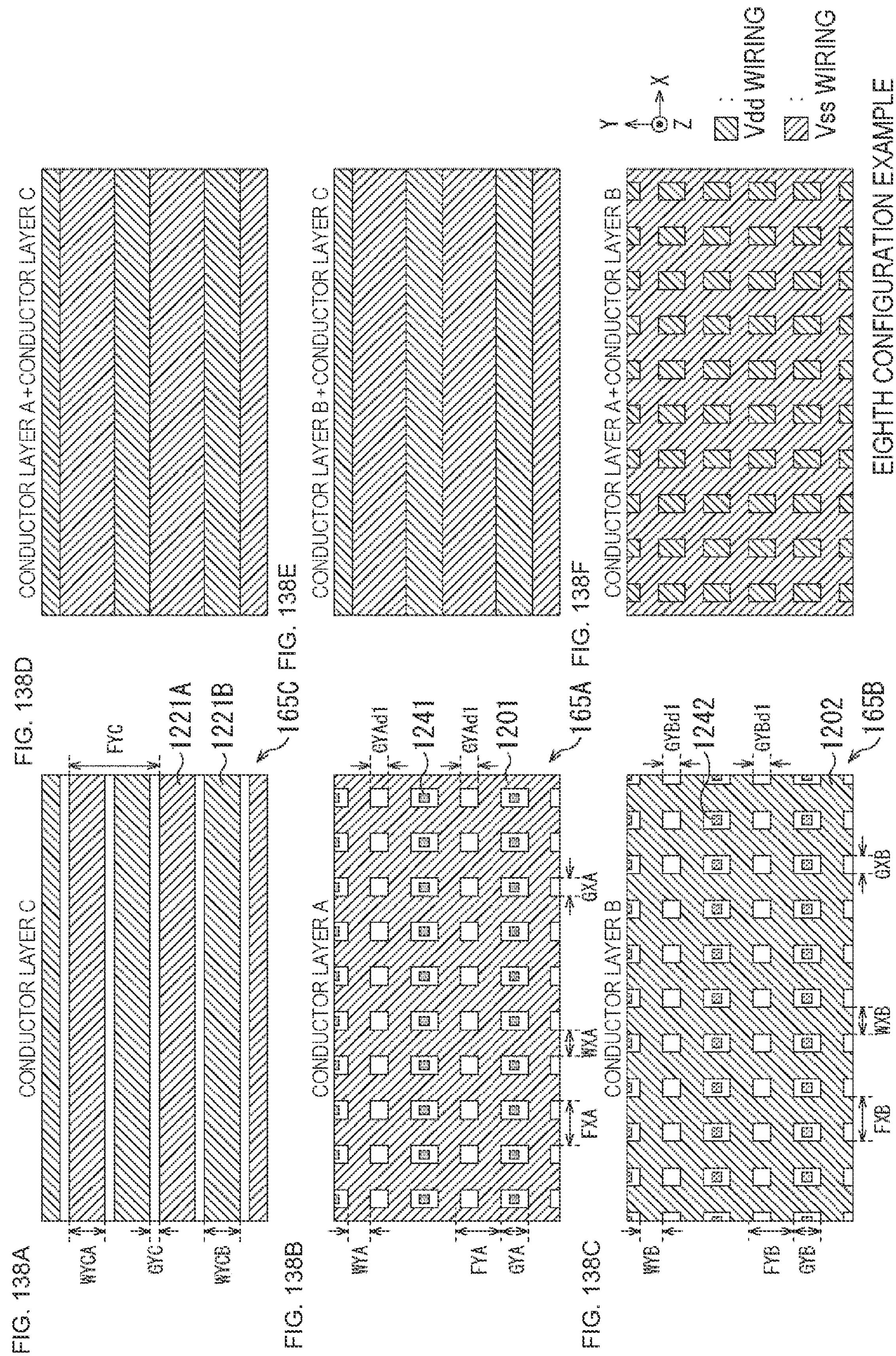

FIG. 138A illustrates the conductor layer C (wiring layer 165C), FIG. 138B illustrates the conductor layer A (wiring layer 165A), and FIG. 138D illustrates the conductor layer B (wiring layer 165B).

Furthermore, FIG. 138D is a plan view of a stacked state of the conductor layer A and the conductor layer C, FIG. 138E is a plan view of a stacked state of the conductor layer B and the conductor layer C, and FIG. 138F is a plan view of a stacked state of the conductor layer A and the conductor layer B.

In FIGS. 138A, 138B, 138C, 138D, 138E, and 138F, a portion corresponding to that in the eighth configuration example illustrated in FIGS. 135A 135B, 135C, 135D, 135E, and 135F are given the same reference numeral and description of the portion is omitted as appropriate, and description will be given focusing on different portions.

In the third modification of the eighth configuration example, the configurations of the conductor layer A and the conductor layer B are different from the eighth configuration example in FIGS. 135A, 135B, 135C, 135D, 135E, and 135F.

First, looking at the conductor layer A, in the eighth configuration example illustrated in FIGS. 135A, 135B, 135C, 135D, 135E, and 135F, the gaps in the matrix of the reticulated conductor 1201 commonly have the gap width GYA in the Y direction. In other words, the gap width GYA in the Y direction is the same for all the gaps in the matrix of the reticulated conductor 1201.

In contrast, in the conductor layer A in FIG. 138B, the gap in which the relay conductor 1241 is formed has the gap width GYA in the Y direction, and the gap in which the relay conductor 1241 is not formed has a gap width GYAd1 in the Y direction, which is smaller than the gap width GYA (gap width GYA>gap width GYAd1).

Next, looking at the conductor layer B, in the eighth configuration example illustrated in FIGS. 135A, 135B, 135C, 135D, 135E, and 135F, the gaps in the matrix of the reticulated conductor 1202 commonly have the gap width GYB in the Y direction. In other words, the gap width GYB in the Y direction is the same for all the gaps in the matrix of the reticulated conductor 1202.

In contrast, in the conductor layer A in FIG. 138B, the gap in which the relay conductor 1242 is formed has the gap width GYB in the Y direction, and the gap in which the relay conductor 1242 is not formed has a gap width GYBd1 in the Y direction, which is smaller than the gap width GYB (gap width GYB>gap width GYBd1).

The third modification of the eighth configuration example in FIGS. 138A 138B, 138C, 138D, 138E, and 138F are similar to the eighth configuration example illustrated in FIGS. 135A, 135B, 135C, 135D, 135E, and 135F except for the above-described points.

When the conductor layer C in FIG. 138A is viewed in a predetermined plane range (plane region), the current distribution of the linear conductor 1221A and the current distribution of the linear conductor 1221B become the same or substantially the same, so that generation of inductive noise can be suppressed.

Since the linear conductor 1221A and the linear conductor 1221B have the same wiring pattern repeated in the Y direction, the capacitive noise can be completely canceled in the Y direction. The capacitive noise can be significantly improved as the conductor layer C is closer to the wiring layer 170.

As illustrated in FIG. 138E, the stacked layer of the conductor layers A and B has a light-shielding structure, and the hot carrier light emission from the active element group 167 can be shielded. In addition, as illustrated in FIGS. 138D and 138E, the stacked layer of the conductor layers A and C and the stacked layer of the conductor layers B and C have also a light-shielding structure, and the light-shielding property is maintained. Thereby, since the light-shielding restrictions of the conductor layers A and B can be significantly alleviated, the conductive area of the conductor layers A and B can be used to the maximum, the wiring resistance can be lowered, and the voltage drop can be further improved. Furthermore, the degree of freedom in layout of the conductor layers A and B can be improved.

By providing the relay conductor 1241 in the conductor layer A, it becomes possible to connect the reticulated conductor 1202 and the linear conductor 1221B in the substantially shortest distance or a short distance to draw the power supply, thereby reducing the voltage drop, energy loss, or inductive noise.

By providing the relay conductor 1242 in the conductor layer B, it becomes possible to connect the reticulated conductor 1201 and the linear conductor 1221A in the substantially shortest distance or a short distance, thereby reducing the voltage drop, energy loss, or inductive noise.

In the third modification of the eighth configuration example in FIGS. 138A 138B, 138C, 138D, 138E, and 138F, the direction in which the current of the conductor layer C is likely to flow and the direction in which the current of the conductor layers A and B is likely to flow are substantially orthogonal and differ by approximately 90 degrees. As a result, the current becomes easily diffused (the current is less likely to be concentrated), so that the inductive noise can be further improved.

In the conductor layer A, the gap width GYAd1 at the position where the relay conductor 1241 has been thinned out is made smaller than the gap width GYA at the position where the relay conductor 1241 is formed, so that the wiring resistance can be made small, and the voltage drop can be further improved. The inductive noise can also be improved as the voltage drop is improved.

In the conductor layer B, the gap width GYBd1 at the position where the relay conductor 1242 has been thinned out is made smaller than the gap width GYB at the position where the relay conductor 1242 is formed, so that the wiring resistance can be made small, and the voltage drop can be further improved. The inductive noise can also be improved as the voltage drop is improved.

Note that, in the third modification of the eighth configuration example in FIGS. 138A, 138B, 138C, 138D, 138E, and 138F, the gap width GYAd1 at the position where the relay conductor 1241 has been thinned out may be made smaller than the gap width GYA at the position where the relay conductor 1241 is formed by making the conductor width WYA in the Y direction of the reticulated conductor 1201 of the conductor layer A thicker, or the conductor width WYA in the Y direction may be the same as that of the eighth configuration example in FIGS. 135A, 135B, 135C, 135D, 135E, and 135F. The same applies to the reticulated conductor 1202 of the conductor layer B.

Fourth Modification of Eighth Configuration Example of Three-Layer Conductor Layer FIGS. 139A, 139B, 139C, 139D, 139E, and 139F illustrate a fourth modification of the eighth configuration example of the three-layer conductor layer.

Figures 139A, 139B, 139C, 139D, 139E, 139F:
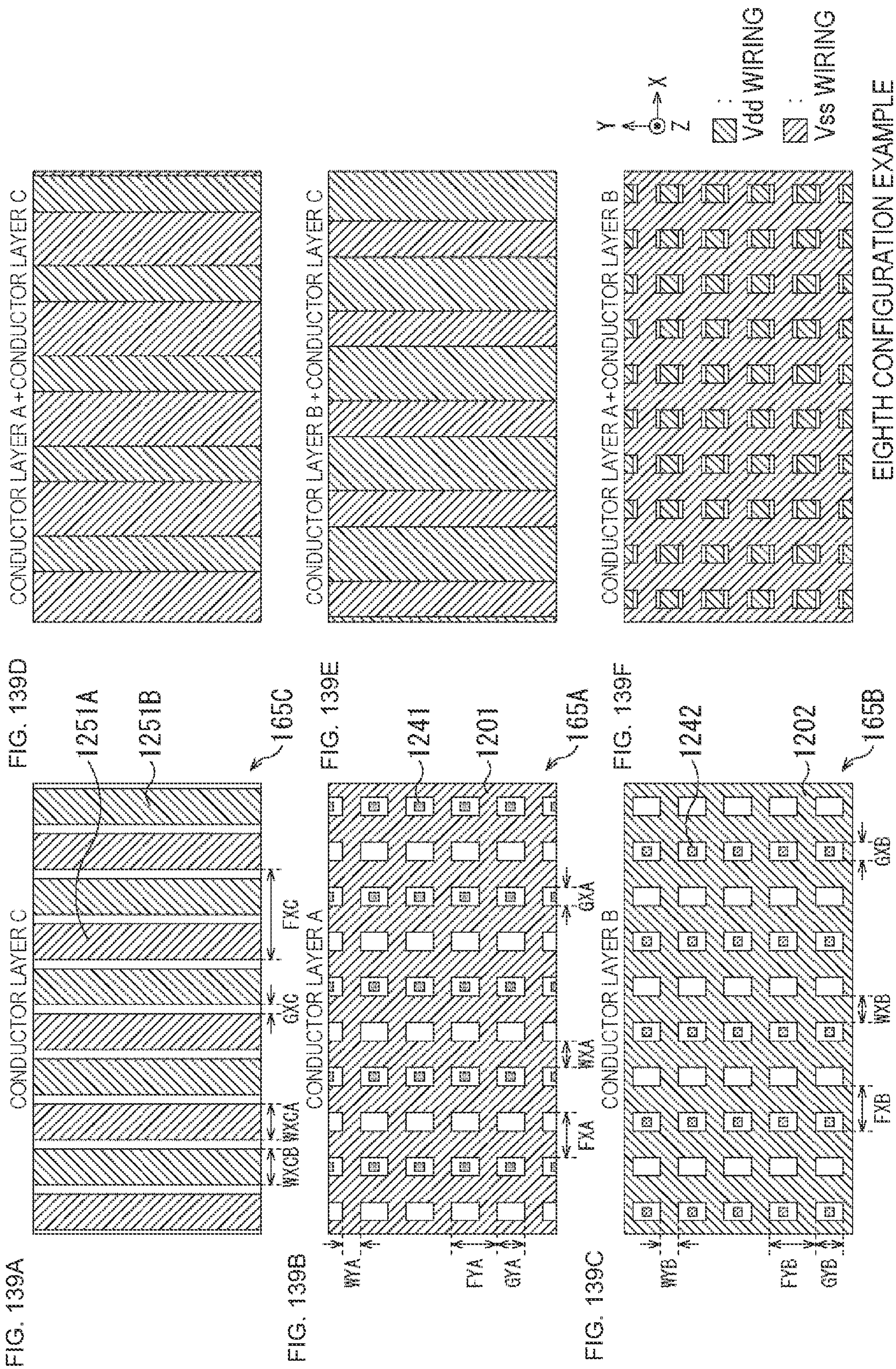

FIG. 139A illustrates the conductor layer C (wiring layer 165C), FIG. 139B illustrates the conductor layer A (wiring layer 165A), and FIG. 139D illustrates the conductor layer B (wiring layer 165B).

Furthermore, FIG. 139D is a plan view of a stacked state of the conductor layer A and the conductor layer C, FIG. 139E is a plan view of a stacked state of the conductor layer B and the conductor layer C, and FIG. 139F is a plan view of a stacked state of the conductor layer A and the conductor layer B.

The fourth modification of the eighth configuration example in FIGS. 139A 139B, 139C, 139D, 139E, and 139F has a configuration in which a part of the first modification of the eighth configuration example in FIGS. 136A, 136B, 136C, 136D, 136E, and 136F are changed. In FIGS. 139A, 139B, 139C, 139D, 139E, and 139F, parts corresponding to those in FIGS. 136A, 136B, 136C, 136D, 136E, and 136F are given the same reference numerals and description of the parts will be omitted as appropriate, and different parts will be described.

In the first modification in FIGS. 136A, 136B, 136C, 136D, 136E, and 136F, when comparing the positions of the gaps between the reticulated conductor 1201 of the conductor layer A and the reticulated conductor 1202 of the conductor layer B, the positions in the X direction are different and the positions in the Y direction match.

Meanwhile, in the fourth modification in FIGS. 139A, 139B, 139C, 139D, 139E, and 139F, when comparing the positions of the gaps between the reticulated conductor 1201 of the conductor layer A and the reticulated conductor 1202 of the conductor layer B, the positions in the X direction match and the positions in the Y direction are different.

The fourth modification of the eighth configuration example in FIGS. 139A 139B, 139C, 139D, 139E, and 139F are similar to the first modification in FIGS. 136A, 136B, 136C, 136D, 136E, and 136F except for the above-described points. For example, the point that the column in which the relay conductor 1241 is formed and the column in which the relay conductor 1241 is not formed in the gaps in the matrix of the reticulated conductor 1201 are alternately arranged in the X direction in units of columns in the conductor layer A, and the point that the column in which the relay conductor is formed and the column in which the relay conductor 1242 is not formed in the gaps in the matrix of the reticulated conductor 1202 are alternately arranged in the X direction in units of columns in the conductor layer B are also similar.

Furthermore, the fourth modification of the eighth configuration example in FIGS. 139A, 139B, 139C, 139D, 139E, and 139F correspond to a configuration in which the relay conductors 1241 are thinned out every other column in units of columns in the conductor layer A, and the relay conductors 1242 are thinned out every other column in units of columns in the conductor layer B from the second modification of the fourth configuration example illustrated in FIGS. 130A, 130B, 130C, 130D, 130E, and 130F.

When the conductor layer C in FIG. 139A is viewed in a predetermined plane range (plane region), the current distribution of the linear conductor 1251A and the current distribution of the linear conductor 1251B become the same or substantially the same, so that generation of inductive noise can be suppressed.

Since the linear conductor 1251A and the linear conductor 1251B repeat the same wiring pattern in the X direction, the capacitive noise can be completely canceled in the X direction. The capacitive noise can be significantly improved as the conductor layer C is closer to the wiring layer 170.

As illustrated in FIGS. 139D and 139E, the stacked layer of the conductor layers A and C and the stacked layer of the conductor layers B and C have a light-shielding structure, and the light-shielding property is maintained. Thereby, since the light-shielding restrictions of the conductor layers A and B can be significantly alleviated, the conductive area of the conductor layers A and B can be used to the maximum, the wiring resistance can be lowered, and the voltage drop can be further improved. Furthermore, the degree of freedom in layout of the conductor layers A and B can be improved.

Moreover, in the case where the reticulated conductor 1201 of the conductor layer A and the linear conductor 1251A of the conductor layer C are electrically connected, and the reticulated conductor 1202 of the conductor layer B and the linear conductor 1251B of the conductor layer C are electrically connected, the current amount of the conductor layers A and B can be made small. Therefore, the inductive noise and the voltage drop from the conductor layer A or B can be further improved.

In the conductor layer C in FIG. 139A, the direction in which the current of the conductor layer C is likely to flow and the direction in which the current of the conductor layers A and B is likely to flow are the same or substantially the same. In this case, the voltage drop can be further improved depending on the wiring layout.

By providing the relay conductor 1241 in the conductor layer A, it becomes possible to connect the reticulated conductor 1202 and the linear conductor 1251B in the substantially shortest distance or a short distance to draw the power supply, thereby reducing the voltage drop, energy loss, or inductive noise.

By providing the relay conductor 1242 in the conductor layer B, it becomes possible to connect the reticulated conductor 1201 and the linear conductor 1251A in the substantially shortest distance or a short distance, thereby reducing the voltage drop, energy loss, or inductive noise.

Fifth Modification of Eighth Configuration Example of Three-Layer Conductor Layer FIGS. 140A, 140B, 140C, 140D, 140E, and 140F illustrate a fifth modification of the eighth configuration example of the three-layer conductor layer.

Figures 140A, 140B, 140C, 140D, 140E, 140F:
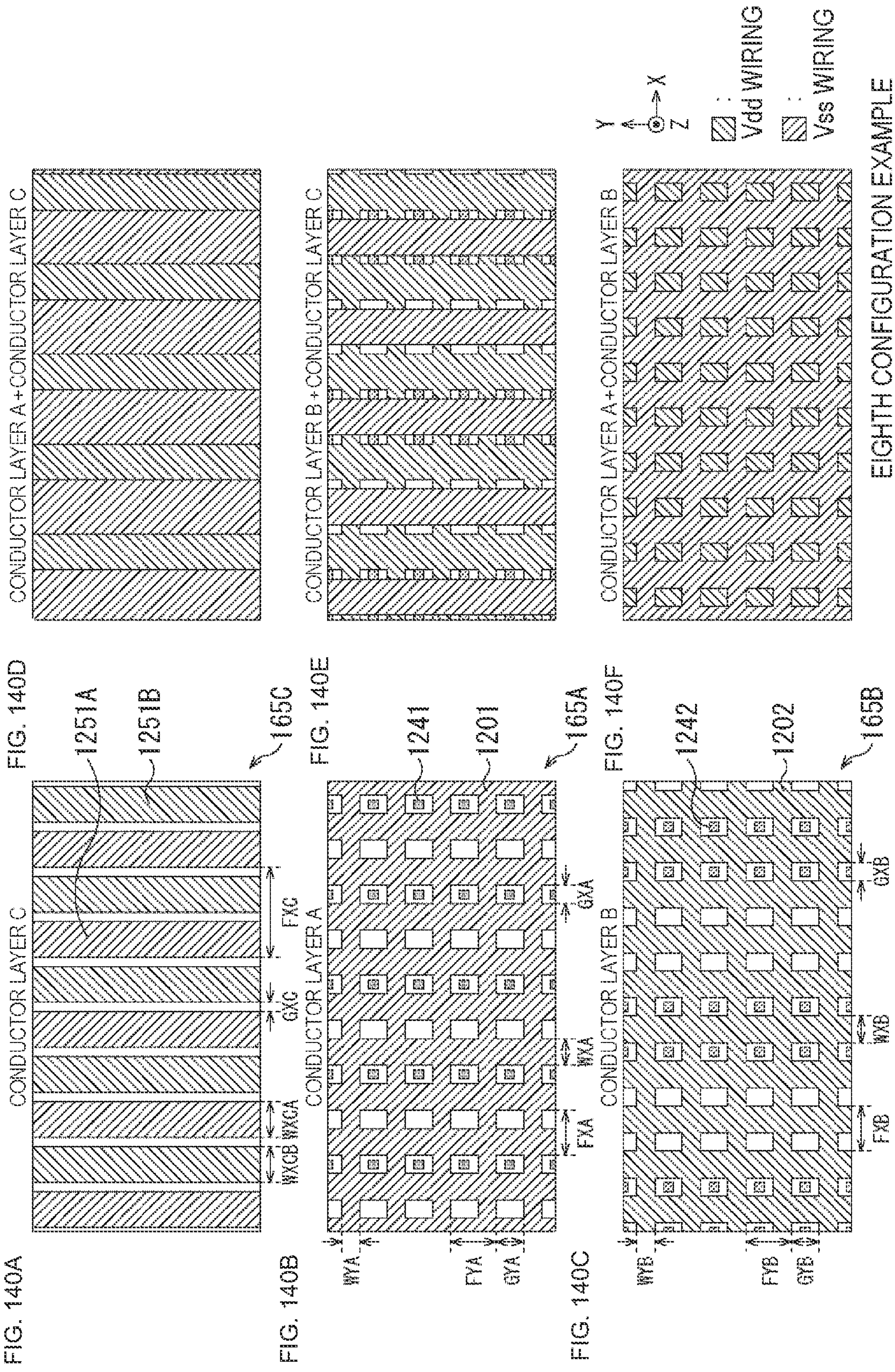

FIG. 140A illustrates the conductor layer C (wiring layer 165C), FIG. 140B illustrates the conductor layer A (wiring layer 165A), and FIG. 140D illustrates the conductor layer B (wiring layer 165B).

Furthermore, FIG. 140D is a plan view of a stacked state of the conductor layer A and the conductor layer C, FIG. 140E is a plan view of a stacked state of the conductor layer B and the conductor layer C, and FIG. 140F is a plan view of a stacked state of the conductor layer A and the conductor layer B.

The fifth modification of the eighth configuration example in FIGS. 140A 140B, 140C, 140D, 140E, and 140F has a configuration in which a part of the first modification of the eighth configuration example illustrated in FIGS. 136A, 136B, 136C, 136D, 136E, and 136F are changed. In FIGS. 140A, 140B, 140C, 140D, 140E, and 140F, parts corresponding to those in FIGS. 136A, 136B, 136C, 136D, 136E, and 136F are given the same reference numerals and description of the parts will be omitted as appropriate, and different parts will be described.

In the fifth modification of the eighth configuration example, only the configuration of the conductor layer B is different from that of the first modification of the eighth configuration example in FIGS. 136A, 136B, 136C, 136D, 136E, and 136F.

In the first modification in FIGS. 136A, 136B, 136C, 136D, 136E, and 136F, a column in which the relay conductor 1242 is formed and a column in which the relay conductor 1242 is not formed are alternately arranged in the X direction in units of columns in the gaps in a matrix of the reticulated conductor 1202 in the conductor layer B. In other words, the relay conductors 1241 are thinned out every other column in units of columns.

In contrast, in the conductor layers FIG. 140B a column in which the relay conductor 1242 is formed and a column in which the relay conductor 1242 is not formed are alternately arranged in the X direction in units of two columns in the gaps in a matrix of the reticulated conductor 1202. In other words, the relay conductors 1241 are thinned out every two other columns in units of two columns.

The fifth modification of the eighth configuration example in FIGS. 140& 140B, 140C, 140D, 140E, and 140F are similar to the first modification of the eighth configuration example in FIGS. 136A, 136B, 136C, 136D, 136E, and 136F except for the above-described points.

When the conductor layer C in FIG. 140A is viewed in a predetermined plane range (plane region), the current distribution of the linear conductor 1251A and the current distribution of the linear conductor 1251B become the same or substantially the same, so that generation of inductive noise can be suppressed.

Since the linear conductor 1251A and the linear conductor 1251B repeat the same wiring pattern in the X direction, the capacitive noise can be completely canceled in the X direction. The capacitive noise can be significantly improved as the conductor layer C is closer to the wiring layer 170.

As illustrated in FIG. 140F, the stacked layer of the conductor layers A and B has a light-shielding structure, and the hot carrier light emission from the active element group 167 can be shielded. In addition, as illustrated in FIG. 140D, the stacked layer of the conductor layers A and C has also a light-shielding structure, and the light-shielding property is maintained. Thereby, since the light-shielding restrictions of the conductor layers A and B can be significantly alleviated, the conductive area of the conductor layers A and B can be used to the maximum, the wiring resistance can be lowered, and the voltage drop can be further improved. Furthermore, the degree of freedom in layout of the conductor layers A and B can be improved.

Moreover, in the case where the reticulated conductor 1201 of the conductor layer A and the linear conductor 1251A of the conductor layer C are electrically connected, and the reticulated conductor 1202 of the conductor layer B and the linear conductor 1251B of the conductor layer C are electrically connected, the current amount of the conductor layers A and B can be made small. Therefore, the inductive noise and the voltage drop from the conductor layer A or B can be further improved.

In the conductor layer C in FIG. 140A, the direction in which the current of the conductor layer C is likely to flow and the direction in which the current of the conductor layers A and B is likely to flow are the same or substantially the same. In this case, the voltage drop can be further improved depending on the wiring layout.

By providing the relay conductor 1241 in the conductor layer A, it becomes possible to connect the reticulated conductor 1202 and the linear conductor 1251B in the substantially shortest distance or a short distance to draw the power supply, thereby reducing the voltage drop, energy loss, or inductive noise.

By providing the relay conductor 1242 in the conductor layer B, it becomes possible to connect the reticulated conductor 1201 and the linear conductor 1251A in the substantially shortest distance or a short distance, thereby reducing the voltage drop, energy loss, or inductive noise.

Ninth Configuration Example of Three-Layer Conductor Layer

FIGS. 141A, 141B, 141C, 141D, 141E, and 141F illustrate a ninth configuration example of the three-layer conductor layer.

Figures 141A, 141B, 141C, 141D, 141E, 141F:
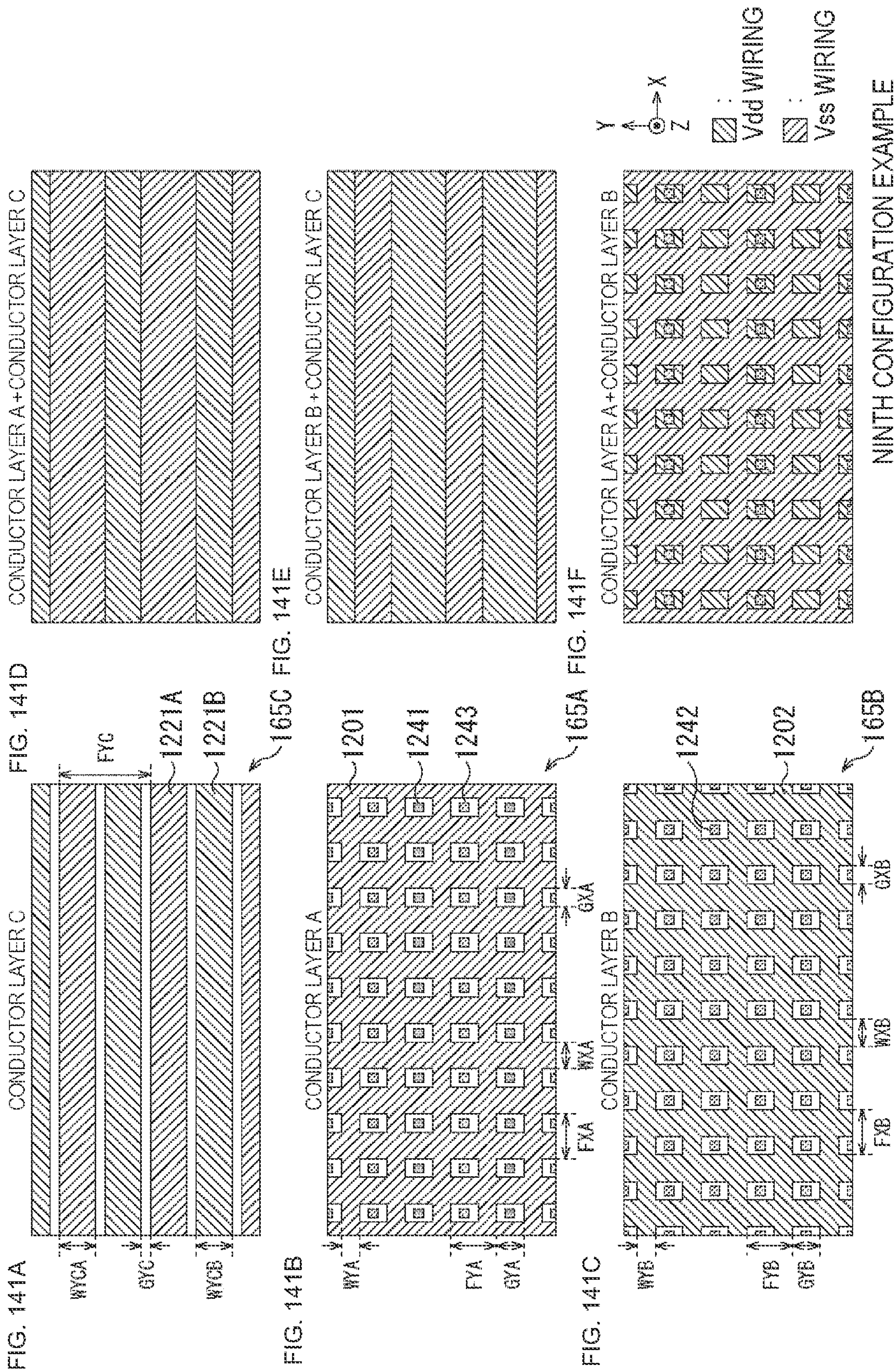

FIG. 141A illustrates the conductor layer C (wiring layer 165C), FIG. 141B illustrates the conductor layer A (wiring layer 165A), and FIG. 141C illustrates the conductor layer B (wiring layer 165B).

Furthermore, FIG. 141D is a plan view of a stacked state of the conductor layer A and the conductor layer C, FIG. 141E is a plan view of a stacked state of the conductor layer B and the conductor layer C, and FIG. 141E is a plan view of a stacked state of the conductor layer A and the conductor layer B.

The ninth configuration example in FIGS. 141A, 141B, 141C, 141D, 141E, and 141F has a configuration in which a part of the sixth configuration example in FIGS. 132A, 132B, 132C, 132D, 132E, and 132F are changed. In FIGS. 141A, 141B. C, 141D, 141E, and 141F, parts corresponding to those in FIGS. 132A, 132B, 132C, 132D, 132E, and 132F are given the same reference numerals and description of the parts will be omitted as appropriate, and different parts will be described.

In the ninth configuration example, only the configuration of the conductor layer A is different from that of the sixth configuration example in FIGS. 132A, 132B, 132C, 132D, 132E, and 132F.

In the conductor layer A of the sixth configuration example in FIGS. 132A 132B, 132C, 132D, 132E, and 132F, a row in which the relay conductor 1241 is formed and a row in which the relay conductor 1241 is not formed are alternately arranged in the Y direction in units of rows in the gaps in a matrix of the reticulated conductor 1201.

The conductor layer A of the ninth configuration example in FIGS. 141A, 141B, 141C, 141D, 141E, and 141F has a configuration in which a relay conductor 1243 (third relay conductor) is newly provided in the gaps of the row where the relay conductors 1241 of the conductor layer A of the sixth configuration example of FIGS. 132A, 132B, 132C, 132D, 132E, and 132F are not formed. The relay conductor is, for example, wiring (Vss wiring) connected to the GND or the negative power supply.

That is, the conductor layer A of the ninth configuration example in FIGS. 141A, 141B, 141C, 141D, 141E, and 141F include the reticulated conductor 1201, and has a configuration in which a row in which the relay conductor 1241 is formed and a column in which a relay conductor 1243 is formed are alternately arranged in the Y direction in units of rows in the gaps in a matrix of the reticulated conductor 1201.

For example, in a case of a stacking order in which the conductor layers A to C of the ninth configuration example in FIGS. 141A, 141B, 141C, 141D, 141E, and F are in the order of the conductor layer B, the conductor layer C, and the conductor layer A, and the conductor layer C is arranged in the center, the relay conductor 1242 of the conductor layer B can be connected to the linear conductor 1221A of the conductor layer C via a conductor via in the Z direction, and the reticulated conductor 1202 of the conductor layer B can be connected to the linear conductor 1221B of the conductor layer C via a conductor via in the Z direction. Furthermore, the relay conductor 1241 of the conductor layer A is connected to the linear conductor 1221B of the conductor layer C by a conductor via in the Z direction, and the relay conductor 1243 is connected to the linear conductor 1221A of the conductor layer C by a conductor via in the Z direction. Moreover, the reticulated conductor 1201 of the conductor layer A can be connected to the linear conductor 1221A of the conductor layer C by a conductor via in the Z direction. Furthermore, the relay conductor 1243 may be connected to a conductor of a conductor layer different from the conductor layers A to C via a conductor via in the Z direction. Furthermore, not all the relay conductors 1243 may be used for electrical connection, all the relay conductors 1243 may be used for electrical connection, or some of the relay conductors 1243 may be used for electrical connection.

By providing the relay conductor 1241 in the conductor layer A, it becomes possible to connect the linear conductor 1221B at substantially the shortest distance or a short distance, thereby reducing the voltage drop, energy loss, or inductive noise.

By providing the relay conductor 1243 in the conductor layer A, it becomes possible to connect the linear conductor 1221A at substantially the shortest distance or a short distance, thereby reducing the voltage drop, energy loss, or inductive noise.

By providing the relay conductor 1242 in the conductor layer B, it becomes possible to connect the linear conductor 1221A at substantially the shortest distance or a short distance, thereby reducing the voltage drop, energy loss, or inductive noise.

The ninth configuration example in FIGS. 141A, 141B, 141C, 141D, 141E, and 141F are similar to the sixth configuration example in FIGS. 132A, 132B, 132C, 132D, 132E, and 132F except for the above-described points.

The conductor layer C in FIG. 141A is the same as the conductor layer C of the sixth configuration example in FIGS. 132A, 132B, 132C, 132D, 132E, and 132F. Therefore, when the conductor layer C is viewed in a predetermined plane range (plane region), the current distribution of the linear conductor 1221A and the current distribution of the linear conductor 1221B become the same or substantially the same, so that generation of inductive noise can be suppressed.

Since the linear conductor 1221A and the linear conductor 1221B have the same wiring pattern repeated in the Y direction, the capacitive noise can be completely canceled in the Y direction. The capacitive noise can be significantly improved as the conductor layer C is closer to the wiring layer 170.

As illustrated in FIG. 141F, the stacked layer of the conductor layers A and B has a light-shielding structure, and the hot carrier light emission from the active element group 167 can be shielded. In addition, as illustrated in FIGS. 141C and 141E, the stacked layer of the conductor layers A and C and the stacked layer of the conductor layers B and C have also a light-shielding structure, and the light-shielding property is maintained. Thereby, since the light-shielding restrictions of the conductor layers A and B can be significantly alleviated, the conductive area of the conductor layers A and B can be used to the maximum, the wiring resistance can be lowered, and the voltage drop can be further improved. Furthermore, the degree of freedom in layout of the conductor layers A and B can be improved.

In the ninth configuration example in FIGS. 141A, 141B, 141C, 141D, 141E, and 141F, the direction in which the current of the conductor layer C is likely to flow and the direction in which the current of the conductor layers A and B is likely to flow are substantially orthogonal and differ by approximately 90 degrees. As a result, the current becomes easily diffused (the current is less likely to be concentrated), so that the inductive noise can be further improved.

First Modification of Ninth Configuration Example of Three-Layer Conductor Layer FIGS. 142A, 142B, 142C, 142D, 142E, and 142F illustrate a first modification of the ninth configuration example of the three-layer conductor layer.

Figures 142A, 142B, 142C, 142D, 142E, 142F:
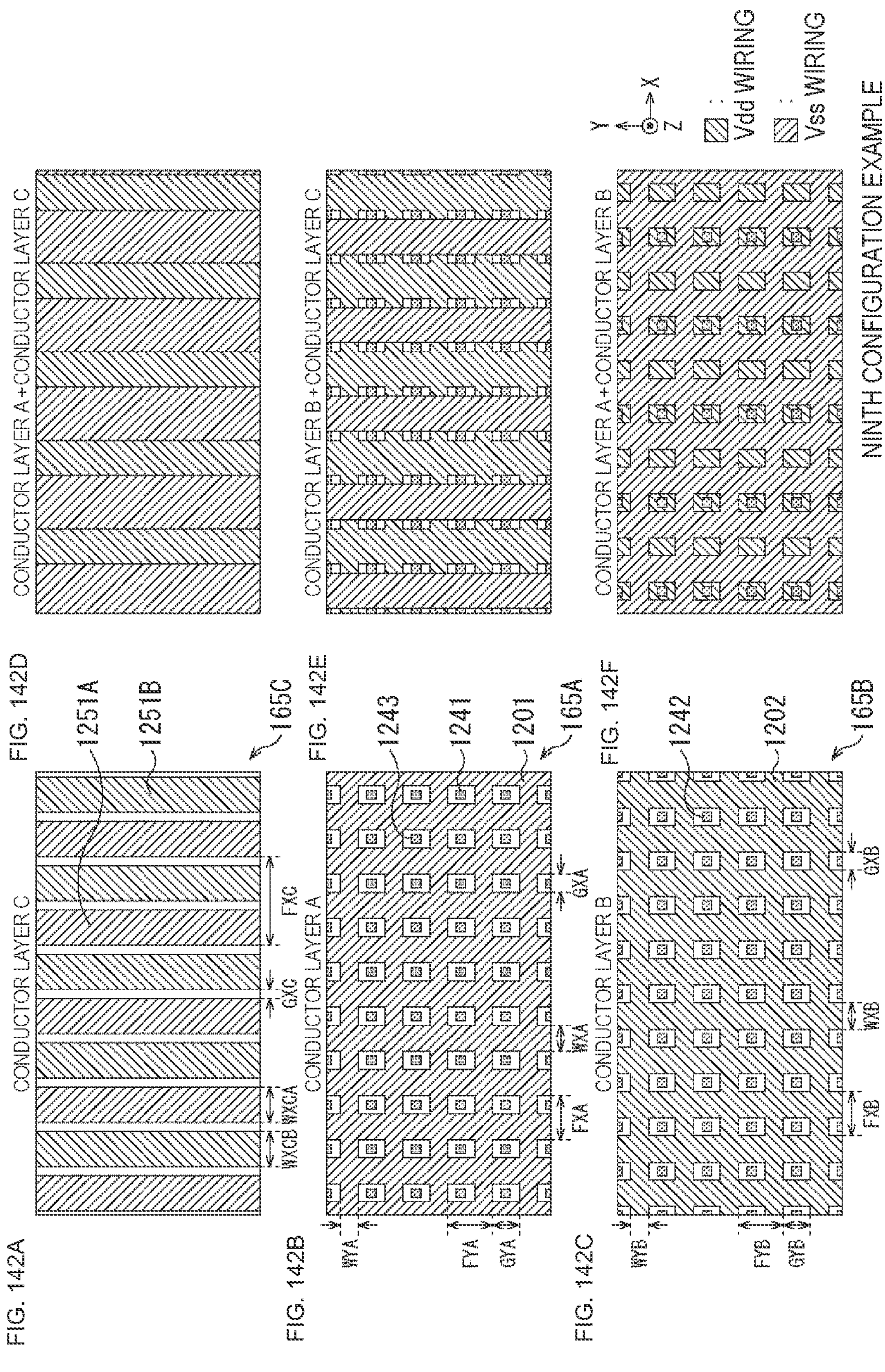

FIG. 142A illustrates the conductor layer C (wiring layer 165C), FIG. 142B illustrates the conductor layer A (wiring layer 165A), and FIG. 142D illustrates the conductor layer B (wiring layer 165B).

Furthermore, FIG. 142D is a plan view of a stacked state of the conductor layer A and the conductor layer C, FIG. 142E is a plan view of a stacked state of the conductor layer B and the conductor layer C, and FIG. 142F is a plan view of a stacked state of the conductor layer A and the conductor layer B.

The first modification of the ninth configuration example has a configuration in which a part of the first modification of the sixth configuration example in FIGS. 133A, 133B, 133C, 133D, 133E, and 133F are changed. In FIGS. 142A, 142B. 142C, 142D, 142E, and 142F, parts corresponding to those in FIGS. 133A, 133B, 133C. 133D, 133E, and 133F are given the same reference numerals and description of the parts will be omitted as appropriate, and different parts will be described.

In the first modification of the ninth configuration example, only the configuration of the conductor layer A is different from that of the first modification of the sixth configuration example in FIGS. 133A, 133B, 133C, 133D, 133E, and 133F.

In the conductor layer A of the first modification of the sixth configuration example in FIGS. 133A, 133B, 133C, 133D, 133E, and 133F, a column in which the relay conductor 1241 is formed and a column in which the relay conductor 1241 is not formed are alternately arranged in the Y direction in units of columns in the gaps in a matrix of the reticulated conductor 1201.

The conductor layer A of the first modification of the ninth configuration example in FIGS. 142A, 142B, 142C, 142D, 142E, and 142F has a configuration in which the relay conductor 1243 is newly provided in the gaps of the column where the relay conductors 1241 of the conductor layer A of the first modification of the sixth configuration example in FIGS. 133A, 133B, 133C, 133D, 133E, and 133F are not formed.

That is, the conductor layer A of the first modification of the ninth configuration example in FIGS. 142A, 142B, 142C, 142D, 142E, and 142F include the reticulated conductor 1201, and has a configuration in which a column in which the relay conductor 1241 is formed and a column in which a relay conductor 1243 is formed are alternately arranged in the X direction in units of columns in the gaps in a matrix of the reticulated conductor 1201.

For example, in the case of the stacking order in which the conductor layers A to C of the ninth configuration example in FIGS. 142A, 142B, 142C, 142D, 142E, and 142F are in the order of the conductor layer B, the conductor layer C, and the conductor layer A, and the conductor layer C is arranged in the center, the relay conductor 1242 of the conductor layer B can be connected to the linear conductor A of the conductor layer C, and the reticulated conductor 1202 of the conductor layer B can be connected to the linear conductor 1251B of the conductor layer C via a conductor via in the Z direction. Furthermore, the relay conductor 1241 of the conductor layer A can be connected to the linear conductor 1251B of the conductor layer C, and the relay conductor 1243 can be connected to the linear conductor 1251A of the conductor layer C. Moreover, the reticulated conductor 1201 of the conductor layer A can be connected to the linear conductor 1251A of the conductor layer C by a conductor via in the Z direction.

By providing the relay conductor 1241 in the conductor layer A, it becomes possible to connect the linear conductor 1251B at substantially the shortest distance or a short distance, thereby reducing the voltage drop, energy loss, or inductive noise.

By providing the relay conductor 1243 in the conductor layer A, it becomes possible to connect the linear conductor 1251A at substantially the shortest distance or a short distance, thereby reducing the voltage drop, energy loss, or inductive noise.

By providing the relay conductor 1242 in the conductor layer B, it becomes possible to connect the linear conductor 1251A at substantially the shortest distance or a short distance, thereby reducing the voltage drop, energy loss, or inductive noise.

The first modification of the ninth configuration example in FIG. 142A 142B, 142C, 142D, 142E, and 142F are similar to the first modification of the sixth configuration example in FIGS. 133A, 133B, 133C, 133D, 133E, and 133F except for the above-described points.

The conductor layer C in FIG. 142A is the same as the conductor layer C of the sixth configuration example in FIGS. 132A, 132B, 132C, 132D, 132E, and 132F. Therefore, when the conductor layer C is viewed in a predetermined plane range (plane region), the current distribution of the linear conductor 1251A and the current distribution of the linear conductor 1251B become the same or substantially the same, so that generation of inductive noise can be suppressed.

Since the linear conductor 1251A and the linear conductor 1251B repeat the same wiring pattern in the X direction, the capacitive noise can be completely canceled in the X direction. The capacitive noise can be significantly improved as the conductor layer C is closer to the wiring layer 170.

As illustrated in FIG. 142F, the stacked layer of the conductor layers A and B has a light-shielding structure, and the hot carrier light emission from the active element group 167 can be shielded. In addition, as illustrated in FIG. 142D, the stacked layer of the conductor layers A and C has also a light-shielding structure, and the light-shielding property is maintained. Thereby, since the light-shielding restrictions of the conductor layers A and B can be significantly alleviated, the conductive area of the conductor layers A and B can be used to the maximum, the wiring resistance can be lowered, and the voltage drop can be further improved. Furthermore, the degree of freedom in layout of the conductor layers A and B can be improved.

In the first modification of the ninth configuration example in FIGS. 142A, 142B, 142C, 142D, 142E, and 142F, the direction in which the current of the conductor layer C is likely to flow and the direction in which the current of the conductor layers A and B is likely to flow are the same or substantially the same. In this case, the voltage drop can be further improved depending on the wiring layout.

Second Modification of Ninth Configuration Example of Three-Layer Conductor Layer FIGS. 143A, 143B, 143C, 143D, 143E, and 143F illustrate a second modification of the ninth configuration example of the three-layer conductor layer.

Figures 143A, 143B, 143C, 143D, 143E, 143F:
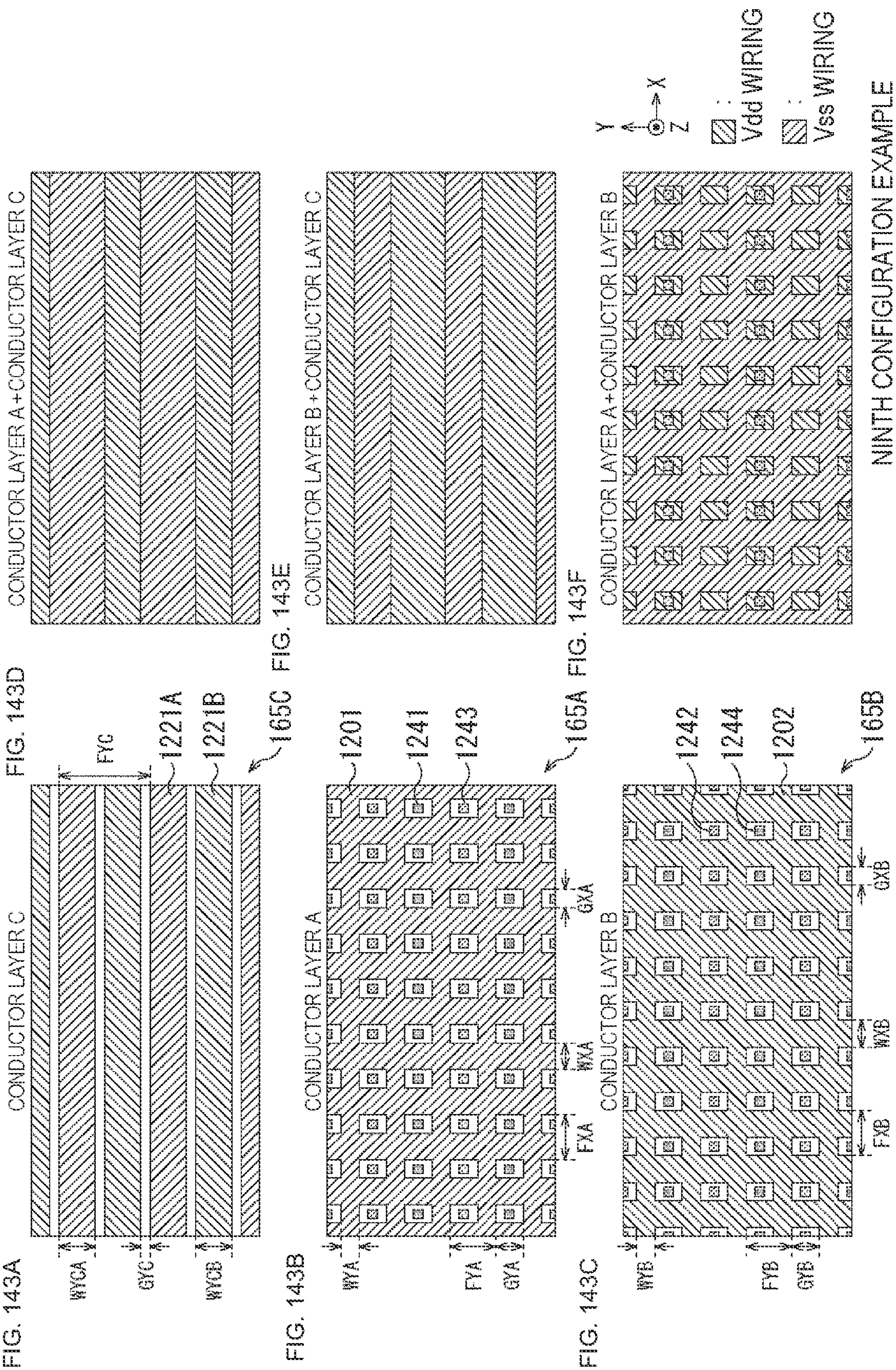

FIG. 143A illustrates the conductor layer C (wiring layer 165C), FIG. 143B illustrates the conductor layer A (wiring layer 165A), and FIG. 143C illustrates the conductor layer B (wiring layer 165B).

Furthermore, FIG. 143D is a plan view of a stacked state of the conductor layer A and the conductor layer C FIG. 143E is a plan view of a stacked state of the conductor layer B and the conductor layer C, and FIG. 143F is a plan view of a stacked state of the conductor layer A and the conductor layer B.

The second modification of the ninth configuration example has a configuration in which a part of the ninth configuration example in FIGS. 141A, 141B, 141C, 141D, 141E, and 141F are changed. In FIGS. 143A, 143B, 143C, 143D, 143E, and 143F, parts corresponding to those in FIGS. 141A, 141B, 141C, 141D, 141E, and 141F are given the same reference numerals and description of the parts will be omitted as appropriate, and different parts will be described.

In the second modification of the ninth configuration example, only the configuration of the conductor layer B is different from that of the ninth configuration example in FIGS. 141A, 141B, 141C, 141D, 141E, and 141F.

The conductor layer B of the ninth configuration example in FIGS. 141A, 141B, 141C, 141D, 141E, and 141F has the reticulated conductor 1202, and the relay conductor 1242 is formed in all the gaps in the matrix of the reticulated conductor 1202.

In contrast, in the second modification of the ninth configuration example in FIGS. 143A, 143B, 143C, 143D, 143E, and 143F, a row in which the relay conductor is formed and a row in which the relay conductor 1244 (fourth relay conductor) is formed are alternately arranged in the Y direction in units of rows in the gaps of the reticulated conductor 1201. The relay conductor 1244 is, for example, wiring (Vdd wiring) connected to the positive power supply.

For example, in the case of the stacking order in which the conductor layers A to C of the second modification of the ninth configuration example in FIGS. 143A, 143B, 143C, 143D, 143E, and 143F are arranged in the order of the conductor layer B, the conductor layer A, and the conductor layer C, and the conductor layer A is arranged in the center, the relay conductor 1242 of the conductor layer B is connected to the reticulated conductor 1201 of the conductor layer A via a conductor via in the Z direction, and the relay conductor 1244 of the conductor layer B is connected to the reticulated conductor 1202 of the conductor layer B via a conductor of a conductor layer different from the conductor layers A to C. Furthermore, the reticulated conductor of the conductor layer B can be connected to the relay conductor 1241 of the conductor layer A by a conductor via in the Z direction. The relay conductor 1241 of the conductor layer A is connected to the linear conductor 1221B of the conductor layer C by a conductor via in the Z direction, and the relay conductor 1243 is connected to the linear conductor 1221A of the conductor layer C by a conductor via in the Z direction. Moreover, the reticulated conductor 1201 of the conductor layer A can be connected to the linear conductor 1221A of the conductor layer C by a conductor via in the Z direction. Note that not all the relay conductors 1244 may be used for electrical connection, all the relay conductors 1244 may be used for electrical connection, or some of the relay conductors 1244 may be used for electrical connection. In the second modification of the ninth configuration example in FIGS. 143A, 143B, 143C, 143D, 143E, and 143F, the shape of the Vdd wiring and the shape of the Vss wiring in the conductor layers A and B are the same or substantially the same although there is a positional shift. Therefore, the layout of the conductor layers A to C may be easily designed, and the Vdd wiring and the Vss wiring may be easily made into a suitable current relationship or voltage relationship.

By providing the relay conductor 1241 in the conductor layer A, it becomes possible to connect the linear conductor 1221B at substantially the shortest distance or a short distance, thereby reducing the voltage drop, energy loss, or inductive noise.

By providing the relay conductor 1243 in the conductor layer A, it becomes possible to connect the linear conductor 1221A at substantially the shortest distance or a short distance, thereby reducing the voltage drop, energy loss, or inductive noise.

By providing the relay conductor 1242 in the conductor layer B, it becomes possible to connect the linear conductor 1221A at substantially the shortest distance or a short distance, thereby reducing the voltage drop, energy loss, or inductive noise.

By providing the relay conductor 1244 in the conductor layer B, it becomes possible to connect the linear conductor 1221B at substantially the shortest distance or a short distance, thereby reducing the voltage drop, energy loss, or inductive noise.

The second modification of the ninth configuration example in FIGS. 143A 143B, 143C, 143D, 143E, and 143F are similar to the ninth configuration example in FIGS. 141A, 141B, 141C, 141D, 141E, and 141F except for the above-described points.

The conductor layer C in FIG. 143A is the same as the conductor layer C of the ninth configuration example in FIGS. 141A, 141B, 141C, 141D, 141E, and 141F. Therefore, when the conductor layer C is viewed in a predetermined plane range (plane region), the current distribution of the linear conductor 1221A and the current distribution of the linear conductor 1221B become the same or substantially the same, so that generation of inductive noise can be suppressed.

Since the linear conductor 1221A and the linear conductor 1221B have the same wiring pattern repeated in the Y direction, the capacitive noise can be completely canceled in the Y direction. The capacitive noise can be significantly improved as the conductor layer C is closer to the wiring layer 170.

As illustrated in FIG. 143F, the stacked layer of the conductor layers A and B has a light-shielding structure, and the hot carrier light emission from the active element group 167 can be shielded. In addition, as illustrated in FIGS. 143D and 143E, the stacked layer of the conductor layers A and C and the stacked layer of the conductor layers B and C have also a light-shielding structure, and the light-shielding property is maintained. Thereby, since the light-shielding restrictions of the conductor layers A and B can be significantly alleviated, the conductive area of the conductor layers A and B can be used to the maximum, the wiring resistance can be lowered, and the voltage drop can be further improved. Furthermore, the degree of freedom in layout of the conductor layers A and B can be improved.

In the ninth configuration example in FIGS. 143A, 143B, 143C, 143D, 143E, and 143F, the direction in which the current of the conductor layer C is likely to flow and the direction in which the current of the conductor layers A and B is likely to flow are substantially orthogonal and differ by approximately 90 degrees. As a result, the current becomes easily diffused (the current is less likely to be concentrated), so that the inductive noise can be further improved.

Third Modification of Ninth Configuration Example of Three-Layer Conductor Layer FIGS. 144A, 144B, 144C, 144D, 144E, and 144F illustrate a third modification of the ninth configuration example of the three-layer conductor layer.

Figure 144A:
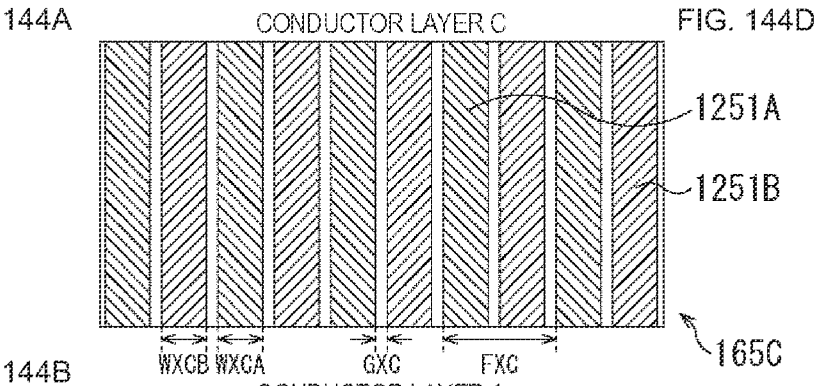
Figure 144D:
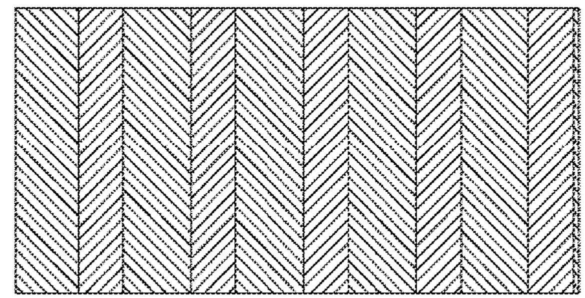
Figure 144B:
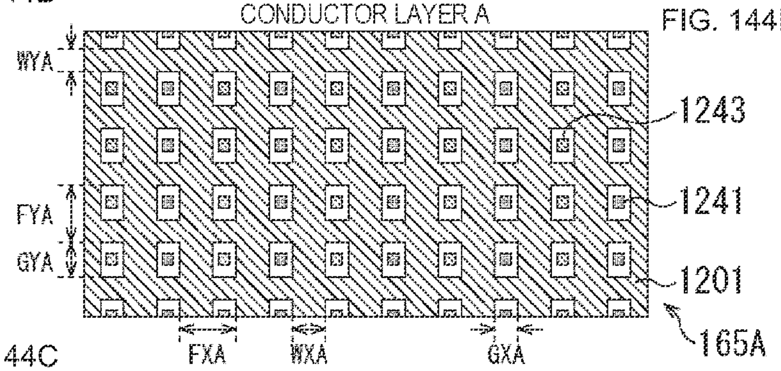

FIG. 144A illustrates the conductor layer C (wiring layer 165C), FIG. 144B illustrates the conductor layer A (wiring layer 165A), and FIG. 144D illustrates the conductor layer B (wiring layer 165B).

Figure 144E:
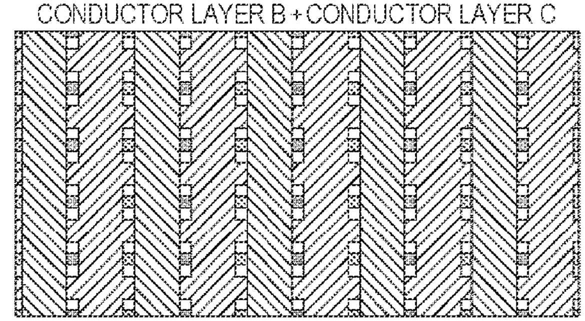
Figure 144C:
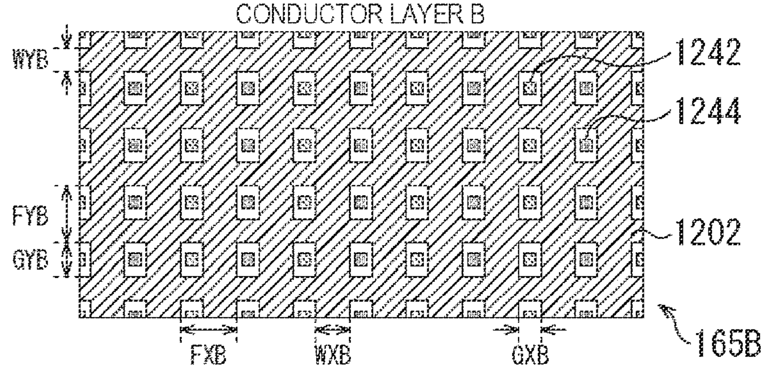
Figure 144F:
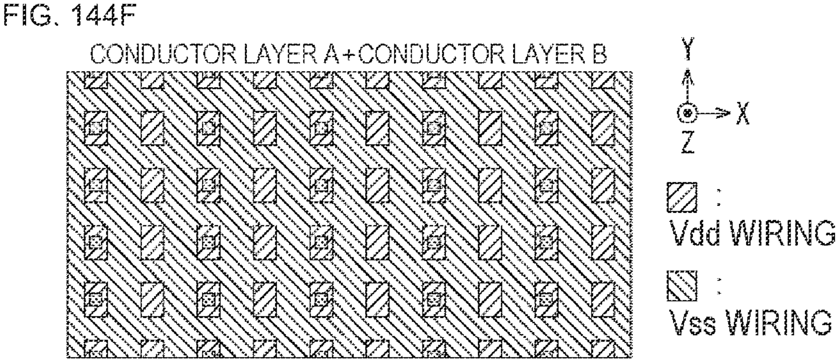

Furthermore, FIG. 144D is a plan view of a stacked state of the conductor layer A and the conductor layer C, FIG. 144E is a plan view of a stacked state of the conductor layer B and the conductor layer C, and FIG. 144F is a plan view of a stacked state of the conductor layer A and the conductor layer B.

The third modification of the ninth configuration example has a configuration in which a part of the first modification of the ninth configuration example in FIGS. 142A, 142B, 142C, 142D, 142E, and 142F are changed. In FIGS. 144A 144B, 144C, 144D, 144E, and 144F, parts corresponding to those in FIGS. 142A, 142B, 142C, 142D, 142E, and 142F are given the same reference numerals and description of the parts will be omitted as appropriate, and different parts will be described.

In the third modification of the ninth configuration example, only the configuration of the conductor layer B is different from the first modification of the ninth configuration example in FIGS. 142A, 142B, 142C, 142D, 142E, and 142F.

The conductor layer B of the first modification of the ninth configuration example in FIGS. 142A, 142B, 142C, 142D, 142E, and 142F has the reticulated conductor 1202, and the relay conductor 1242 is formed in all the gaps in the matrix of the reticulated conductor 1202.

In contrast, the conductor layer B of the third modification of the ninth configuration example in FIGS. 144A, 144B, 144C, 144D, 144E, and 144F include the reticulated conductor 1202, and has a configuration in which a column in which the relay conductor 1242 is formed and a column in which a relay conductor 1244 is formed are alternately arranged in the X direction in units of columns in the gaps in a matrix of the reticulated conductor 1202.

For example, in the case of the stacking order in which the conductor layers A to C of the third modification of the ninth configuration example in FIGS. 144A 144B, 144C, 144D, 144E, and 144F are arranged in the order of the conductor layer B, the conductor layer A, and the conductor layer C, and the conductor layer A is arranged in the center, the relay conductor 1242 of the conductor layer B is connected to the reticulated conductor 1201 of the conductor layer A via a conductor via in the Z direction, and the relay conductor 1244 of the conductor layer B is connected to the reticulated conductor 1202 of the conductor layer B via a conductor of a conductor layer different from the conductor layers A to C. Furthermore, the reticulated conductor 1202 of the conductor layer B can be connected to the relay conductor 1241 of the conductor layer A by a conductor via in the Z direction. The relay conductor 1241 of the conductor layer A is connected to the linear conductor 1251B of the conductor layer C by a conductor via in the Z direction, and the relay conductor 1243 is connected to the linear conductor 1251A of the conductor layer C by a conductor via in the Z direction. Moreover, the reticulated conductor 1201 of the conductor layer A can be connected to the linear conductor 1251A of the conductor layer C by a conductor via in the Z direction. In the third modification of the ninth configuration example in FIGS. 144& 144B, 144C, 144D, 144E, and 144F, the shape of the Vdd wiring and the shape of the Vss wiring in the conductor layers A and B are the same or substantially the same although there is a positional shift. Therefore, the layout of the conductor layers A to C may be easily designed, and the Vdd wiring and the Vss wiring may be easily made into a suitable current relationship or voltage relationship.

By providing the relay conductor 1241 in the conductor layer A, it becomes possible to connect the linear conductor 1251B at substantially the shortest distance or a short distance, thereby reducing the voltage drop, energy loss, or inductive noise.

By providing the relay conductor 1243 in the conductor layer A, it becomes possible to connect the linear conductor 1251A at substantially the shortest distance or a short distance, thereby reducing the voltage drop, energy loss, or inductive noise.

By providing the relay conductor 1242 in the conductor layer B, it becomes possible to connect the linear conductor 1251A at substantially the shortest distance or a short distance, thereby reducing the voltage drop, energy loss, or inductive noise.

By providing the relay conductor 1244 in the conductor layer B, it becomes possible to connect the linear conductor 1251B at substantially the shortest distance or a short distance, thereby reducing the voltage drop, energy loss, or inductive noise.

The third modification of the ninth configuration example in FIGS. 144& 144B, 144C, 144D, 144E, and 144F are similar to the first modification of the ninth configuration example in FIGS. 142A, 142B, 142C, 142D, 142E, and 142F except for the above-described points.

The conductor layer C in FIG. 144A is the same as the conductor layer C of the first modification of the ninth configuration example of FIGS. 142A, 142B, 142C, 142D, 142E, and 142F. Therefore, when the conductor layer C is viewed in a predetermined plane range (plane region), the current distribution of the linear conductor 1251A and the current distribution of the linear conductor 1251B become the same or substantially the same, so that generation of inductive noise can be suppressed.

Since the linear conductor 1251A and the linear conductor 1251B repeat the same wiring pattern in the X direction, the capacitive noise can be completely canceled in the X direction. The capacitive noise can be significantly improved as the conductor layer C is closer to the wiring layer 170.

As illustrated in FIG. 144F, the stacked layer of the conductor layers A and B has a light-shielding structure, and the hot carrier light emission from the active element group 167 can be shielded. In addition, as illustrated in FIG. 144D, the stacked layer of the conductor layers A and C has also a light-shielding structure, and the light-shielding property is maintained. Thereby, since the light-shielding restrictions of the conductor layers A and B can be significantly alleviated, the conductive area of the conductor layers A and B can be used to the maximum, the wiring resistance can be lowered, and the voltage drop can be further improved. Furthermore, the degree of freedom in layout of the conductor layers A and B can be improved.

In the third modification of the ninth configuration example in FIGS. 144A 144B, 144C, 144D, 144E, and 144F, the direction in which the current of the conductor layer C is likely to flow and the direction in which the current of the conductor layers A and B is likely to flow are the same or substantially the same. In this case, the voltage drop can be further improved depending on the wiring layout.

Fourth Modification of Ninth Configuration Example of Three-Layer Conductor Layer FIGS. 145A, 145B, 145C, 145D, 145E, and 145F illustrate a fourth modification of the ninth configuration example of the three-layer conductor layer.

Figures 145A, 145B, 145C, 145D, 145E, 145F:
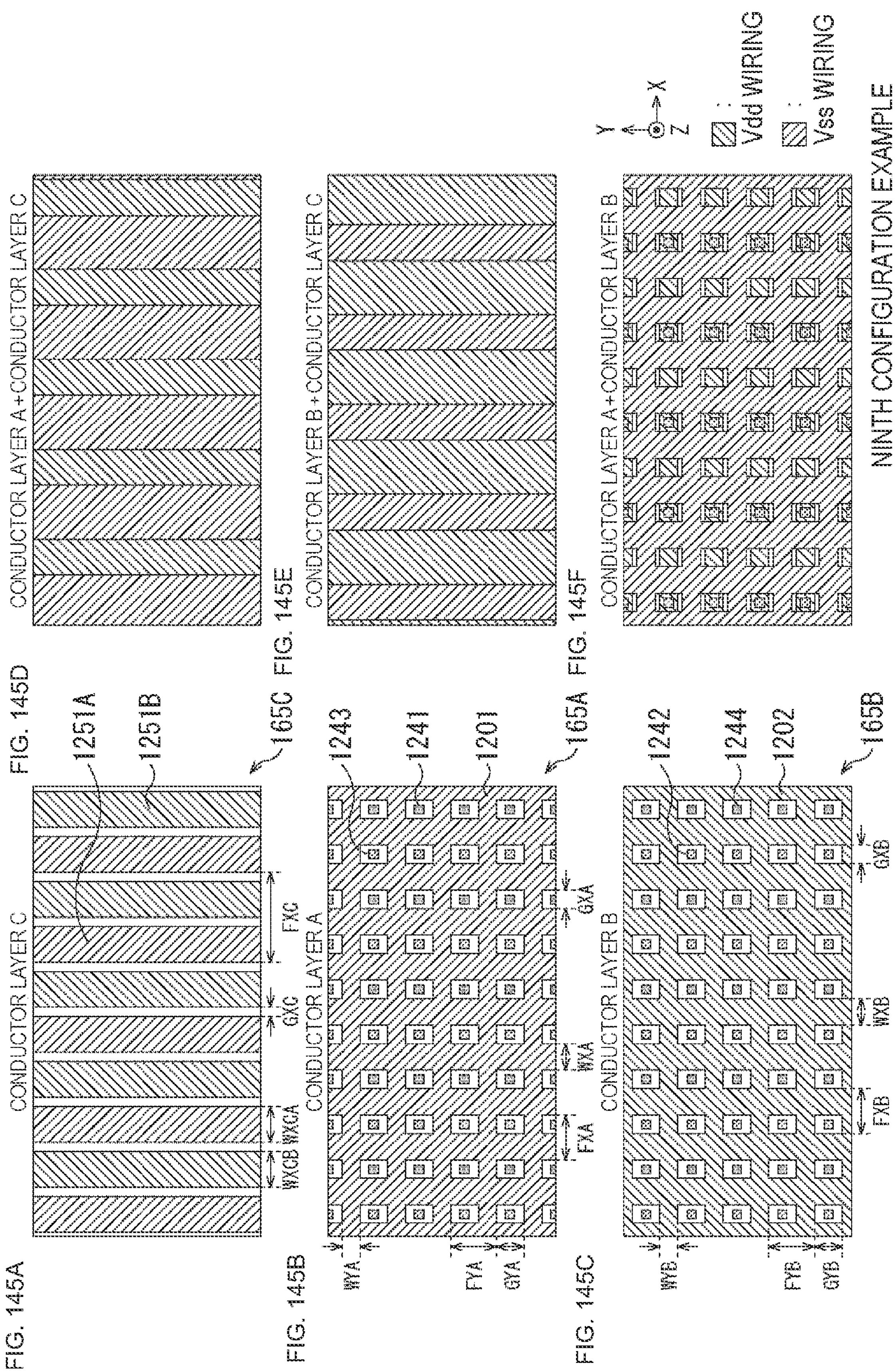

FIG. 145A illustrates the conductor layer C (wiring layer 165C), FIG. 145B illustrates the conductor layer A (wiring layer 165A), and FIG. 145C illustrates the conductor layer B (wiring layer 165B).

Furthermore, FIG. 145D is a plan view of a stacked state of the conductor layer A and the conductor layer C, FIG. 145E is a plan view of a stacked state of the conductor layer B and the conductor layer C, and FIG. 145F is a plan view of a stacked state of the conductor layer A and the conductor layer B.

The fourth modification of the ninth configuration example has a configuration in which a part of the third modification of the ninth configuration example in FIGS. 144A, 144B, 144C, 144D, 144E, and 144F are changed. In FIGS. 14A 145B, 145C, 145D, 145E, and 145F, parts corresponding to those in FIGS. 144A, 144B. 144C, 144D, 144E, and 144F are given the same reference numerals and description of the parts will be omitted as appropriate, and different parts will be described.

In the third modification in FIGS. 144A, 144B, 144C, 144D, 144E, 144E, and 144F, when comparing the positions of the gaps between the reticulated conductor of the conductor layer A and the reticulated conductor 1202 of the conductor layer B, the positions in the X direction are different and the positions in the Y direction match.

Meanwhile, in the fourth modification in FIGS. 145A, 145B, 145C, 145D, 145E, and 145F, when comparing the positions of the gaps between the reticulated conductor 1201 of the conductor layer A and the reticulated conductor 1202 of the conductor layer B, the positions in the X direction match and the positions in the Y direction are different.

Furthermore, for example, in the third modification in FIGS. 144A, 144B. 144C, 144D, 144E, and 144F, when comparing the positions between the relay conductor 1241 of the conductor layer A and the relay conductor 1244 of the conductor layer B, the positions in the X direction are different and the positions in the Y direction match. Meanwhile, in the fourth modification in FIGS. 145A, 145B, 145C, 145D, 145E, and 145F, the positions in the X direction match and the positions in the Y direction are different.

Furthermore, for example, in the third modification in FIGS. 144A, 144B. 144C, 144D, 144E, and 144F, when comparing the positions between the relay conductor 1243 of the conductor layer A and the relay conductor 1242 of the conductor layer B, the positions in the X direction are different and the positions in the Y direction match. Meanwhile, in the fourth modification in FIGS. 145A, 145B, 145C, 145D, 145E, and 145F the positions in the X direction match and the positions in the Y direction are different.

In the third modification in FIGS. 144A, 144B, 144C, 144D, 144E, and 144F, the stacked layer of the conductor layers A and B and the stacked layer of the conductor layers A and C have a light-shielding structure, and the light-shielding property is maintained. Meanwhile, in the fourth modification in FIGS. 145A, 145B. 145C, 145D, 145E, and 145F, the stacked layer of the conductor layers A and C and the stacked layer of the conductor layers B and C have a light-shielding structure, and the light-shielding property is maintained. Thereby, since the light-shielding restrictions of the conductor layers A and B can be significantly alleviated, the conductive area of the conductor layers A and B can be used to the maximum, the wiring resistance can be lowered, and the voltage drop can be further improved. Furthermore, the degree of freedom in layout of the conductor layers A and B can be improved.

Furthermore, for example, in the case of the stacking order in which the conductor layers A to C of the fourth modification of the ninth configuration example in FIGS. 145A, 145B, 145C, 145D, 145E, and 145F are in the order of the conductor layer B, the conductor layer C, and the conductor layer A, and the conductor layer C is arranged in the center, the relay conductor 1242 of the conductor layer B is connected to the linear conductor 1251A of the conductor layer C via a conductor via in the Z direction, and the relay conductor 1244 of the conductor layer B is connected to the linear conductor 1251B of the conductor layer C via a conductor via in the Z direction. Furthermore, the reticulated conductor 1202 of the conductor layer B can be connected to the linear conductor 1251B of the conductor layer C by a conductor via in the Z direction. The relay conductor 1241 of the conductor layer A is connected to the linear conductor 1251B of the conductor layer C by a conductor via in the Z direction, and the relay conductor 1243 is connected to the linear conductor 1251A of the conductor layer C by a conductor via in the Z direction. Moreover, the reticulated conductor 1201 of the conductor layer A can be connected to the linear conductor 1251A of the conductor layer C by a conductor via in the Z direction. Furthermore, the relay conductor 1244 may be connected to a conductor of a conductor layer different from the conductor layers A to C via a conductor via in the Z direction.

The fourth modification in FIGS. 145A, 145B, 145C, 145D, 145E, and 145F are similar to the third modification in FIGS. 144A, 144B, 144C, 144D, 144E, and 144F except for the above-described points.

When the conductor layer C in FIG. 145A is viewed in a predetermined plane range (plane region), the current distribution of the linear conductor 1251A and the current distribution of the linear conductor 1251B become the same or substantially the same, so that generation of inductive noise can be suppressed.

Since the linear conductor 1251A and the linear conductor 1251B repeat the same wiring pattern in the X direction, the capacitive noise can be completely canceled in the X direction. The capacitive noise can be significantly improved as the conductor layer C is closer to the wiring layer 170.

In the fourth modification of the ninth configuration example in FIGS. 145A 145B, 145C, 145D, 145E, and 145F, the direction in which the current of the conductor layer C is likely to flow and the direction in which the current of the conductor layers A and B is likely to flow are the same or substantially the same. In this case, the voltage drop can be further improved depending on the wiring layout.

By providing the relay conductor 1241 in the conductor layer A, it becomes possible to connect the linear conductor 1251B at substantially the shortest distance or a short distance, thereby reducing the voltage drop, energy loss, or inductive noise.

By providing the relay conductor 1243 in the conductor layer A, it becomes possible to connect the linear conductor 1251A at substantially the shortest distance or a short distance, thereby reducing the voltage drop, energy loss, or inductive noise.

By providing the relay conductor 1242 in the conductor layer B, it becomes possible to connect the linear conductor 1251A at substantially the shortest distance or a short distance, thereby reducing the voltage drop, energy loss, or inductive noise.

By providing the relay conductor 1244 in the conductor layer B, it becomes possible to connect the linear conductor 1251B at substantially the shortest distance or a short distance, thereby reducing the voltage drop, energy loss, or inductive noise.

Tenth Configuration Example of Three-Layer Conductor Layer

FIGS. 146A, 146B, 146C, 146D, 146E, and 146F illustrate a tenth configuration example of the three-layer conductor layer.

Figures 146A, 146B, 146C, 146D, 146E, 146F:
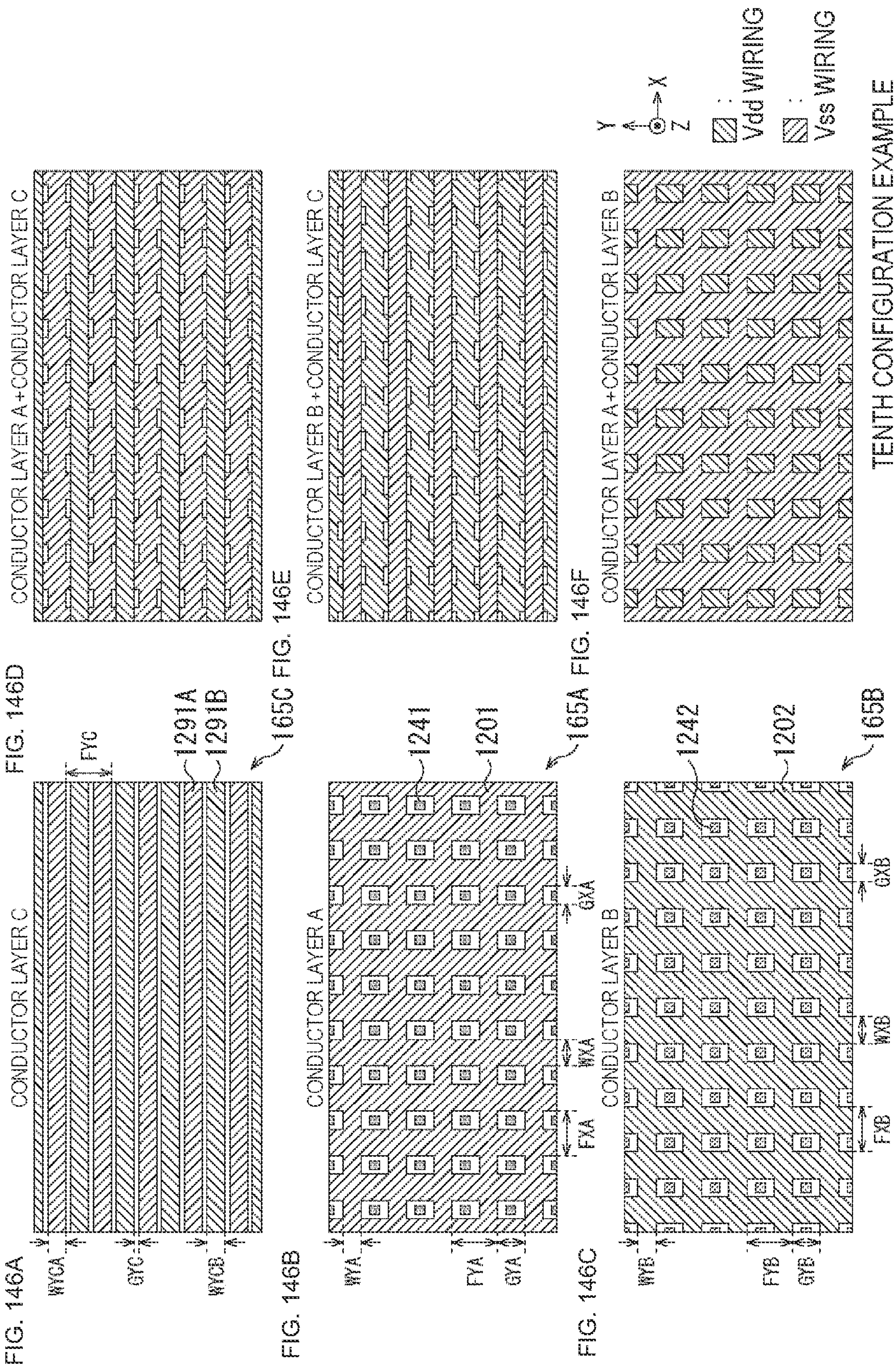

FIG. 146A illustrates the conductor layer C (wiring layer 165C), FIG. 146B illustrates the conductor layer A (wiring layer 165A), and FIG. 146D illustrates the conductor layer B (wiring layer 165B).

Furthermore, FIG. 146D is a plan view of a stacked state of the conductor layer A and the conductor layer C, FIG. 146E is a plan view of a stacked state of the conductor layer B and the conductor layer C, and FIG. 146F is a plan view of a stacked state of the conductor layer A and the conductor layer B.

The tenth configuration example has a configuration in which a part of the fourth configuration example in FIGS. 128A, 128B, 128C, 128D, 128E, and 128F are changed. In FIGS. 146A, 146B, 146C, 146D, 146E, and 146F, parts corresponding to those in FIGS. 128A, 128B, 128C, 128D, 128E, and 128F are given the same reference numerals and description of the parts will be omitted as appropriate, and different parts be described.

In the tenth configuration example, only the configuration of the conductor layer C is different from that of the fourth configuration example in FIGS. 128A, 128B, 128C, 128D, 128E, and 128F.

The conductor layer C in FIG. 146A is configured such that a linear conductor 1291A long in the X direction and a linear conductor 1291B long in the X direction are alternately and periodically arranged in the Y direction. The linear conductor 1219A is, for example, wiring (Vss wiring) connected to the GND or the negative power supply. The linear conductor 1291B is, for example, wiring (Vdd wiring) connected to the positive power supply.

In the fourth configuration example in FIGS. 128A, 128B, 128C, 128D, 128E, and 128F, the conductor period FYC that is a repetition period of the linear conductor 1221A of the conductor layer C in FIG. 128A is twice the conductor period FYA that is a repetition period in the Y direction of the reticulated conductor 1201 of the conductor layer A in FIG. 128B.

In contrast, the conductor period FYC that is a repetition period of the linear conductor 1291A of the conductor layer C in FIG. 146A is one time the conductor period FYA that is a repetition period in the Y direction of the reticulated conductor 1201 of the conductor layer A in FIG. 146B.

Similarly, in the fourth configuration example in FIGS. 128A, 128B, 128C, 128D, 128E, and 128F, the conductor period FYC of the linear conductor 1221B of the conductor layer FIG. 128A is twice the conductor period FYB of the reticulated conductor 1202 of the conductor layer B in FIG. 128C, whereas the conductor period FYC of the linear conductor 1291B of the conductor layer FIG. 146A is one time the conductor period FYB of the reticulated conductor 1202 of the conductor layer B in FIG. 146C.

The tenth configuration example in FIGS. 146A, 146B, 146C, 146D, 146E, and 146F are similar to the fourth configuration example in FIGS. 128A, 128B, 128C, 128D, 128E, and 128F except for the above-described points.

When the conductor layer C in FIG. 146A is viewed in a predetermined plane range (plane region), the current distribution of the linear conductor 1291A and the current distribution of the linear conductor 1291B become the same or substantially the same, so that generation of inductive noise can be suppressed.

Since the linear conductor 1291A and the linear conductor 1291B repeat the same wiring pattern in the Y direction, the capacitive noise can be completely canceled in the Y direction. The capacitive noise can be significantly improved as the conductor layer C is closer to the wiring layer 170.

As illustrated in FIG. 146F, the stacked layer of the conductor layers A and B has a light-shielding structure, and the hot carrier light emission from the active element group 167 can be shielded. In addition, as illustrated in FIGS. 132D and 132E, the light-shielding property is maintained in a fixed range in the stacked layer of the conductor layers A and C and the stacked layer of the conductor layers B and C. Thereby, since the light-shielding restrictions of the conductor layers A and B can be alleviated, the conductive area of the conductor layers A and B can be used to the maximum, the wiring resistance can be lowered, and the voltage drop can be further improved. Furthermore, the degree of freedom in layout of the conductor layers A and B can be improved.

By providing the relay conductor 1241 in the conductor layer A, it becomes possible to connect the linear conductor 1291B at substantially the shortest distance or a short distance, thereby reducing the voltage drop, energy loss, or inductive noise.

By providing the relay conductor 1242 in the conductor layer B, it becomes possible to connect the linear conductor 1291A at substantially the shortest distance or a short distance, thereby reducing the voltage drop, energy loss, or inductive noise.

In the tenth configuration example in FIGS. 146A, 146B, 146C, 146D, 146E, and 146F, the direction in which the current of the conductor layer C is likely to flow and the direction in which the current of the conductor layers A and B is likely to flow are substantially orthogonal and differ by approximately 90 degrees. As a result, the current becomes easily diffused (the current is less likely to be concentrated), so that the inductive noise can be further improved.

Modification of Tenth Configuration Example of Three-Layer Conductor Layer

FIGS. 147A, 147B, 147C, 147D, 147E, and 147F illustrate a modification of the tenth configuration example of the three-layer conductor layer.

Figures 147A, 147B, 147C, 147D, 147E, 147F:
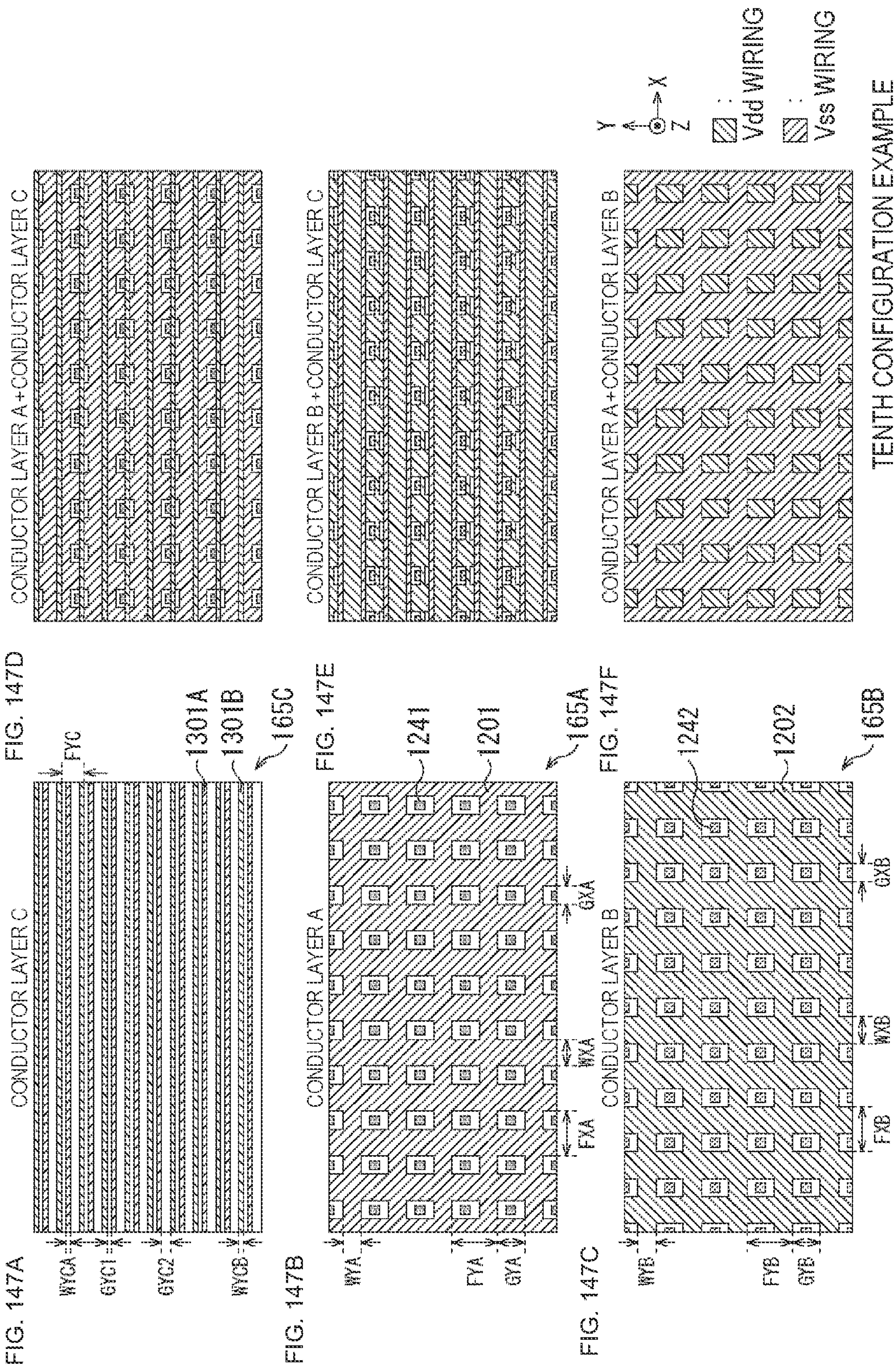

FIG. 147A illustrates the conductor layer C (wiring layer 165C), FIG. 147B illustrates the conductor layer A (wiring layer 165A), and FIG. 147D illustrates the conductor layer B (wiring layer 165B).

Furthermore, FIG. 147D is a plan view of a stacked state of the conductor layer A and the conductor layer C, FIG. 147E is a plan view of a stacked state of the conductor layer B and the conductor layer C, and FIG. 147F is a plan view of a stacked state of the conductor layer A and the conductor layer B.

The modification of the tenth configuration example has a configuration in which a part of the fourth configuration example in FIGS. 128A, 128B, 128C, 128D, 128E, and 128F are changed. In FIGS. 147A, 147B, 147C, 147D, 147E, and 147F, parts corresponding to those in FIGS. 128A, 128B, 128C, 128D, 128E, and 128F are given the same reference numerals and description of the parts will be omitted as appropriate, and different parts will be described.

In the modification of the tenth configuration example, only the configuration of the conductor layer C is different from that of the fourth configuration example in FIGS. 128A, 128B, 128C, 128D, 128E, and 128F.

The conductor layer C in FIG. 147A is configured such that a linear conductor 1301A long in the X direction and a linear conductor 1301B long in the X direction are alternately and periodically arranged in the Y direction. The linear conductor 1301A is, for example, wiring (Vss wiring) connected to the GND or the negative power supply. The linear conductor 1301B is, for example, wiring (Vdd wiring) connected to the positive power supply. The distance between the linear conductor A and the linear conductor 1301B is alternately changed between a gap width GYC1 and a gap width GYC2.

In the fourth configuration example in FIGS. 128A, 128B, 128C, 128D, 128E, and 128F, the conductor period FYC that is a repetition period of the Ii conductor 1221A of the conductor layer C in FIG. 128A is twice the conductor period FYA that is a repetition period in the Y direction of the reticulated conductor 1 of the conductor layer A in FIG. 128B.

In contrast, the conductor period FYC that is a repetition period of the linear conductor 1301A of the conductor layer FIG. 147A is (1/integer) times the conductor period FYA that is a repetition period in the Y direction of the reticulated conductor 1201 of the conductor layer A in FIG. 147B. FIGS. 147A, 147B, 147C, 147D, 147E, and 147F illustrate an example in which the conductor period FYC is ½ times the conductor period FYA.

Similarly, in the fourth configuration example in FIGS. 128A, 128B, 128C, 128D, 128E, and 128F, the conductor period FYC of the linear conductor 1221B of the conductor layer FIG. 128A is twice the conductor period FYB of the reticulated conductor 1202 of the conductor layer A in FIG. 128C, whereas the conductor period FYC of the linear conductor 1301B of the conductor layer FIG. 147A is (1/integer) times the conductor period FYB of the reticulated conductor 1202 of the conductor layer B in FIG. 147C. FIGS. 147A, 147B, 147C, 147D, 147E, and 147F illustrate an example in which the conductor period FYC is ½ times the conductor period FYB.

The modification of the tenth configuration example in FIGS. 147A, 147B. 147C, 147D, 147E, and 147F are similar to the fourth configuration example in FIGS. 128A, 128B, 128C, 128D, 128E, and 128F except for the above-described points.

When the conductor layer C in FIG. 147A is viewed in a predetermined plane range (plane region), the current distribution of the linear conductor 1301A and the current distribution of the linear conductor 1301B become the same or substantially the same, so that generation of inductive noise can be suppressed.

Since the linear conductor 1301A and the linear conductor 1301B repeat the same wiring pattern in the Y direction, the capacitive noise can be completely canceled in the Y direction. The capacitive noise can be significantly improved as the conductor layer C is closer to the wiring layer 170.

As illustrated in FIG. 147F, the hot carrier light emission from the active element group 167 can be shielded by the stacked layer of the conductor layers A and B. In addition, as illustrated in FIGS. 132D and 132E, the light-shielding property is maintained in a fixed range in the stacked layer of the conductor layers A and C and the stacked layer of the conductor layers B and C. Thereby, since the light-shielding restrictions of the conductor layers A and B can be alleviated, the conductive area of the conductor layers A and B can be used to the maximum, the wiring resistance can be lowered, and the voltage drop can be further improved. Furthermore, the degree of freedom in layout of the conductor layers A and B can be improved.

In the modification of the tenth configuration example in FIGS. 147A, 147B. 147C, 147D, 147E, and 147F, the direction in which the current of the conductor layer C is likely to flow and the direction in which the current of the conductor layers A and B is likely to flow are substantially orthogonal and differ by approximately 90 degrees. As a result, the current becomes easily diffused (the current is less likely to be concentrated), so that the inductive noise can be further improved.

By providing the relay conductor 1241 in the conductor layer A, it becomes possible to connect the linear conductor 1301B at substantially the shortest distance or a short distance, thereby reducing the voltage drop, energy loss, or inductive noise.

By providing the relay conductor 1242 in the conductor layer B, it becomes possible to connect the linear conductor 1301A at substantially the shortest distance or a short distance, thereby reducing the voltage drop, energy loss, or inductive noise.

Eleventh Configuration Example of Three-Layer Conductor Layer

In the first to tenth configuration examples of the three-layer conductor layer, the description has been made adopting the eleventh configuration example using the reticulated conductor having the resistance value in the X direction and the resistance value in the Y direction, which are different, as the configuration of the conductor layer A and the conductor layer B. In other words, the description has been made adopting the configuration in which the gap width GXA in the X direction and the gap width GYA in the Y direction are different, and the gap width GXB in the X direction and the gap width GYB in the Y direction are different, as in the reticulated conductors and 1202 of the fourth configuration example in FIGS. 128A, 128B, 128C, 128D, 128E, and 128F and the reticulated conductors 1261 and 1602 of the fifth configuration example in FIGS. 131A, 131B, 131C, 131D, 131E, and 131F, as the conductor layer A and the conductor layer B.

However, as the conductor layer A and the conductor layer B, any of the first to thirteenth configuration examples of the conductor layers A and B described with reference to FIGS. 12A, 12B, 12C, 13, 14A, 14B, 14C, 15A, 15B, 15C, 16, 17A, 17B, 17C, 18A, 18B, 19, 20A, 20B, 21, 22A, 22B, 22C, 23, 24A, 24B, 24C, 25A, 25B, 25C, 26A, 26B, 26C, 27A, 27B, 27C, 28A, 28B, 28C, 29A, 29B, 29C, 30, 31A, 31B, 31C, 32A, 32B, 32C, 33A, 33B, 33C, 34A, 34B, 34C, 35A, 35B, 35C, 36A, 36B, 36C, 37, 38A, 38B, 38C, 39A, 39B, 39C, 40A, 40B, 40C, 41A, and 41B can be adopted.

In next FIGS. 148A, 148B, 148C, 148D, 148E, 148F, 149A, 149B, 149C, 149D, 149E, 149F, 150A, 150B, 150C, 150D, 150E, 150F, 151A, 151B, 151C, 151D, 151E, 151F, 152A, 152B, 152C, 152D, 152E, and 152F, a configuration of uniformly adopting the configuration adopted in FIGS. 122A, 122B, 122C, 122D, 122E, and 122F or the like for the conductor layer C (wiring layer 165C), and adopting a reticulated conductor having the same resistance value in the X direction and Y directions for the conductor layer A and the conductor layer B will be described.

FIGS. 148A, 148B, 148C, 148D, 148E, and 148F illustrate an eleventh configuration example of the three-layer conductor layer.

Figures 148A, 148B, 148C, 148D, 148E, 148F:
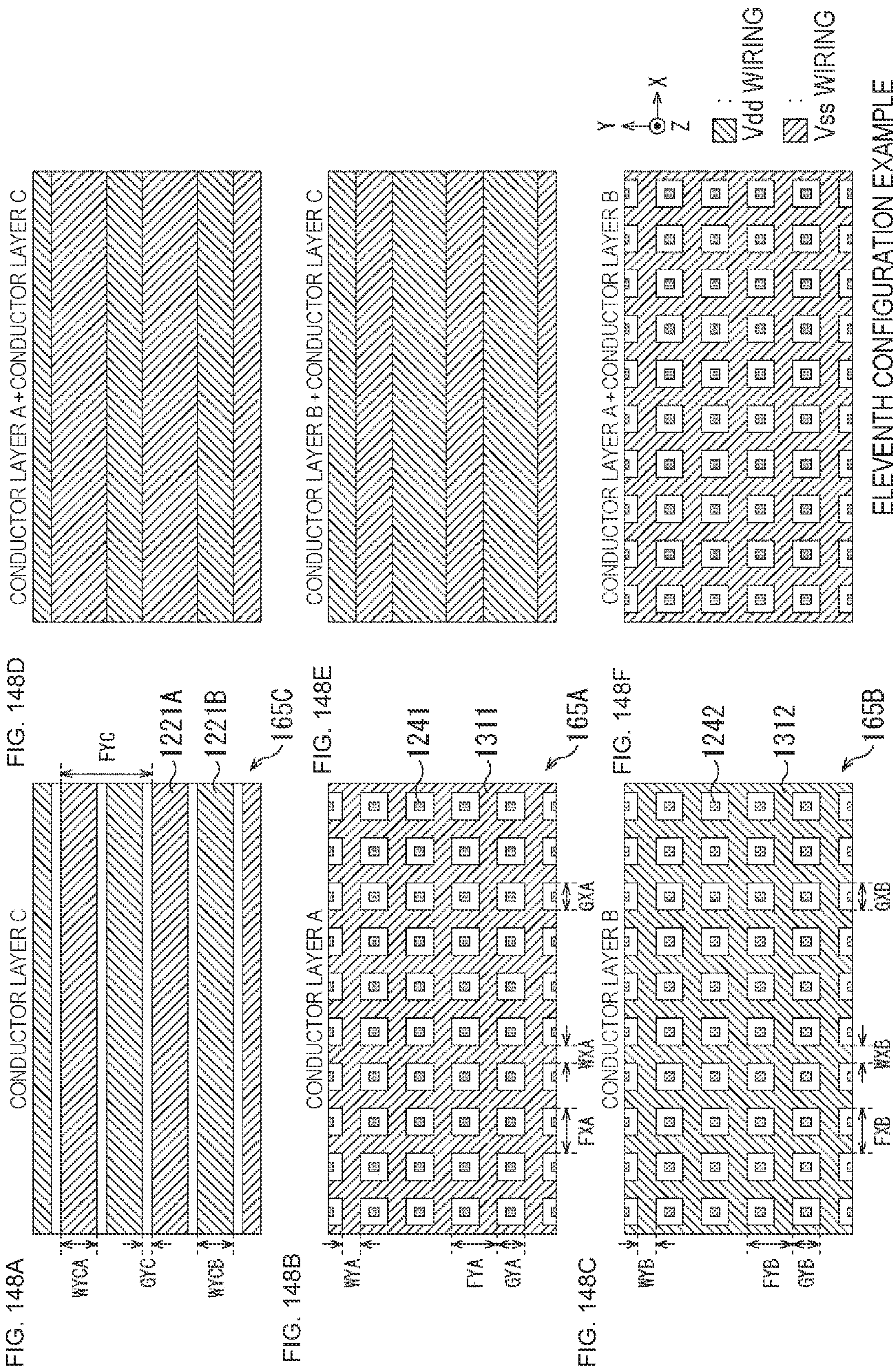

FIG. 148A illustrates the conductor layer C (wiring layer 165C), FIG. 148B illustrates the conductor layer A (wiring layer 165A), and FIG. 148D illustrates the conductor layer B (wiring layer 165B).

Furthermore, FIG. 148D is a plan view of a stacked state of the conductor layer A and the conductor layer C, FIG. 148E is a plan view of a stacked state of the conductor layer B and the conductor layer C, and FIG. 148F is a plan view of a stacked state of the conductor layer A and the conductor layer B.

In the eleventh configuration example in FIGS. 148A, 148B, 148C, 148D, 148E, and 148F, a portion corresponding to that in the fourth configuration example illustrated in FIGS. 128A, 128B, 128C, 128D, 128E, and 128F are given the same reference numeral and description of the portion is omitted as appropriate, and description will be given focusing on different portions.

The conductor layer FIG. 148A is configured such that the linear conductor 1221A long in the X direction and the linear conductor 1221B long in the X direction are alternately and periodically arranged in the Y direction with the conductor period FYC.

The conductor layer A in FIG. 148B is configured by a reticulated conductor 1311. The reticulated conductor 1311 has the conductor width WXA, the gap width GXA, and the conductor period FXA in the X direction, and the conductor width WYA, the gap width GYA, and the conductor period FYA in the Y direction. Here, the conductor width WXA=the conductor width WYA, the gap width GXA=the gap width GYA, and the conductor period FXA=the conductor period FYA. Furthermore, the relay conductor 1241 is arranged in each gap of the reticulated conductor 1201. The distance between the relay conductors 1241, in other words, the period of the relay conductor 1241 is also the conductor periods FXA and FYA. The reticulated conductor is, for example, wiring (Vss wiring) connected to the GND or the negative power supply.

The conductor layer B in FIG. 128C is configured by a reticulated conductor 1312. The reticulated conductor 1312 has the conductor width WXB, the gap width GXB, and the conductor period FXB in the X direction, and the conductor width WYB, the gap width GYB, and the conductor period FYB in the Y direction. Here, the conductor width WXB=the conductor width WYB, the gap width GXB=the gap width GYB, and the conductor period FXB=the conductor period FYB. Furthermore, the relay conductor 1242 is arranged in each gap of the reticulated conductor 1312. The distance between the relay conductors 1242, in other words, the period of the relay conductors 1242 is also the conductor periods FXB and FYB. The reticulated conductor is, for example, wiring (Vdd wiring) connected to the positive power supply.

As illustrated in in FIGS. 148B and 148C, the plane position of the relay conductor 1241 formed in the conductor layer A and the plane position of the relay conductor 1242 formed in the conductor layer B are the same. In other words, the reticulated conductor 1311 of the conductor layer A and the reticulated conductor 1312 of the conductor layer B entirely overlap when viewed from the stacking direction. The conductor layer A and the conductor layer B having such a configuration correspond to the second configuration example of the conductor layers A and B illustrated in FIGS. 15A, 15B, and 15C, and can significantly improve the inductive noise, as illustrated in the simulation result in FIGS. 17A, 17B, and 17C.

Therefore, the configuration is suitable for the stacking order in which the conductor layer C (wiring layer 165C) is arranged between the conductor layer A (wiring layer 165A) and the conductor layer B (wiring layer 165B) as illustrated in FIG. 120B the reticulated conductor 1311 of the conductor layer A and the linear conductor 1221A of the conductor layer C are connected via the conductor via in the Z direction, and the reticulated conductor 1312 of the conductor layer B and the linear conductor 1221B of the conductor layer C are connected via the conductor via in the Z direction.

When the conductor layer C is viewed in a predetermined plane range (plane region), the current distribution of the linear conductor 1221A and the current distribution of the linear conductor 1221B become the same or substantially the same, so that generation of inductive noise can be suppressed.

Since the linear conductor 1221A and the linear conductor 1221B of the conductor layer C repeat the same wiring pattern in the Y direction, the capacitive noise can be completely canceled in the Y direction. The capacitive noise can be significantly improved as the conductor layer C is closer to the wiring layer 170.

As illustrated in FIG. 148F, the stacked layer of the conductor layer A and the conductor layer B does not have a light-shielding structure, but as illustrated in FIGS. 148D and 148E, the stacked layer of the conductor layers A and C and the stacked layer of the conductor layers B and C have a light-shielding structure, and the light-shielding property is maintained. As a result, the hot carrier light emission from the active element group 167 can be shielded. Furthermore, since the light-shielding restrictions of the conductor layers A and B can be significantly alleviated, the conductive area of the conductor layers A and B can be used to the maximum, the wiring resistance can be lowered, and the voltage drop can be further improved. The degree of freedom in layout of the conductor layers A and B can be improved.

Twelfth Configuration Example of Three-Layer Conductor Layer

FIGS. 149A, 149B, 149C, 149D, 149E, and 149F illustrate a twelfth configuration example of the three-layer conductor layer.

Figures 149A, 149B, 149C, 149D, 149E, 149F:
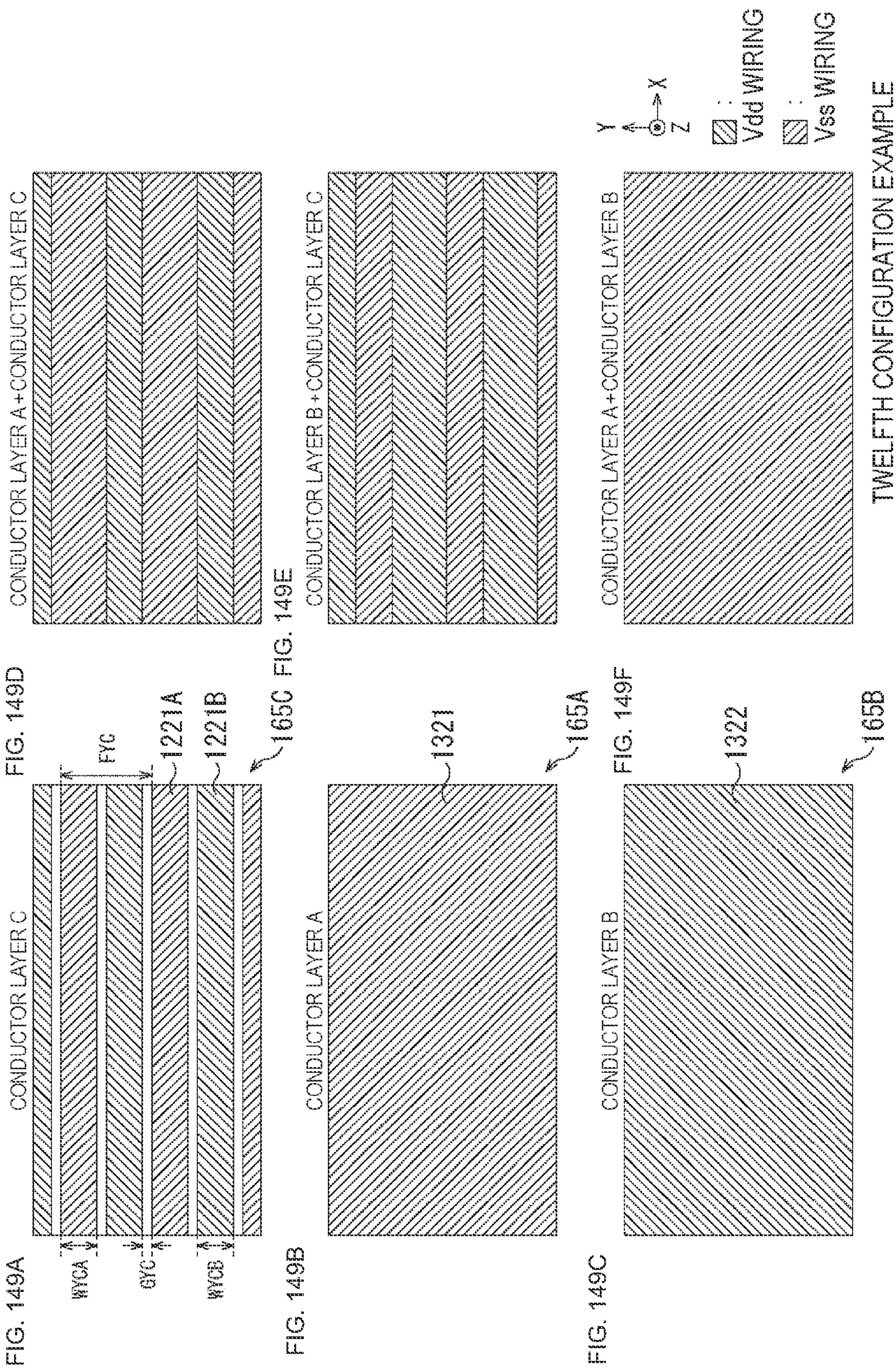

FIG. 149A illustrates the conductor layer C (wiring layer 165C), FIG. 149B illustrates the conductor layer A (wiring layer 165A), and FIG. 149D illustrates the conductor layer B (wiring layer 165B).

Furthermore, FIG. 149D is a plan view of a stacked state of the conductor layer A and the conductor layer C, FIG. 149E is a plan view of a stacked state of the conductor layer B and the conductor layer C, and FIG. 149F is a plan view of a stacked state of the conductor layer A and the conductor layer B.

In the twelfth configuration example in FIGS. 149A, 149B, 149C, 149D, 149E, and 149F, a portion corresponding to that in the fourth configuration example illustrated in FIGS. 128A, 128B, 128C, 128D, 128E, and 128F are given the same reference numeral and description of the portion is omitted as appropriate, and description will be given focusing on different portions.

The conductor layer FIG. 149A is configured such that the linear conductor 1221A long in the X direction and the linear conductor 1221B long in the X direction are alternately and periodically arranged in the Y direction with the conductor period FYC.

The conductor layer A in FIG. 149B is configured by a planar conductor 1321. The planar conductor 1321 is, for example, wiring (Vss wiring) connected to the GND or the negative power supply.

The conductor layer B in FIG. 149D is configured by a planar conductor 1322. The planar conductor 1322 is, for example, wiring (Vdd wiring) connected to the positive power supply.

When the conductor layer C is viewed in a predetermined plane range (plane region), the current distribution of the linear conductor 1221A and the current distribution of the linear conductor 1221B become the same or substantially the same, so that generation of inductive noise can be suppressed.

Since the linear conductor 1222A and the linear conductor 1222B repeat the same wiring pattern in the Y direction, the capacitive noise can be completely canceled in the Y direction. The capacitive noise can be significantly improved as the conductor layer C is closer to the wiring layer 170.

As illustrated in FIG. 149F, the stacked layer of the conductor layers A and B has a light-shielding structure, and the hot carrier light emission from the active element group 167 can be shielded. In addition, as illustrated in FIGS. 149D and 149E, the stacked layer of the conductor layers A and C and the stacked layer of the conductor layers B and C have also a light-shielding structure, and the light-shielding property is maintained. Thereby, since the light-shielding restrictions of the conductor layers A and B can be significantly alleviated, the conductive area of the conductor layers A and B can be used to the maximum, the wiring resistance can be lowered, and the voltage drop can be further improved. Furthermore, the degree of freedom in layout of the conductor layers A and B can be improved.

Therefore, the twelfth configuration example of the three-layer conductor layer is suitable for the stacking order in which the conductor layer C (wiring layer 165C) is arranged between the conductor layer A (wiring layer 165A) and the conductor layer B (wiring layer 165B), the planar conductor 1321 of the conductor layer A and the linear conductor 1221A of the conductor layer C are connected via the conductor via in the Z direction, and the planar conductor 1322 of the conductor layer B and the linear conductor 1221B of the conductor layer C are connected via the conductor via in the Z direction, as illustrated in FIG. 120B.

Modification of Twelfth Configuration Example of Three-Layer Conductor Layer

FIGS. 150A, 150B, 150C, 150D, 150E, and 150F illustrate a first modification of the twelfth configuration example of the three-layer conductor layer.

Figures 150A, 150B, 150C, 150D, 150E, 150F:
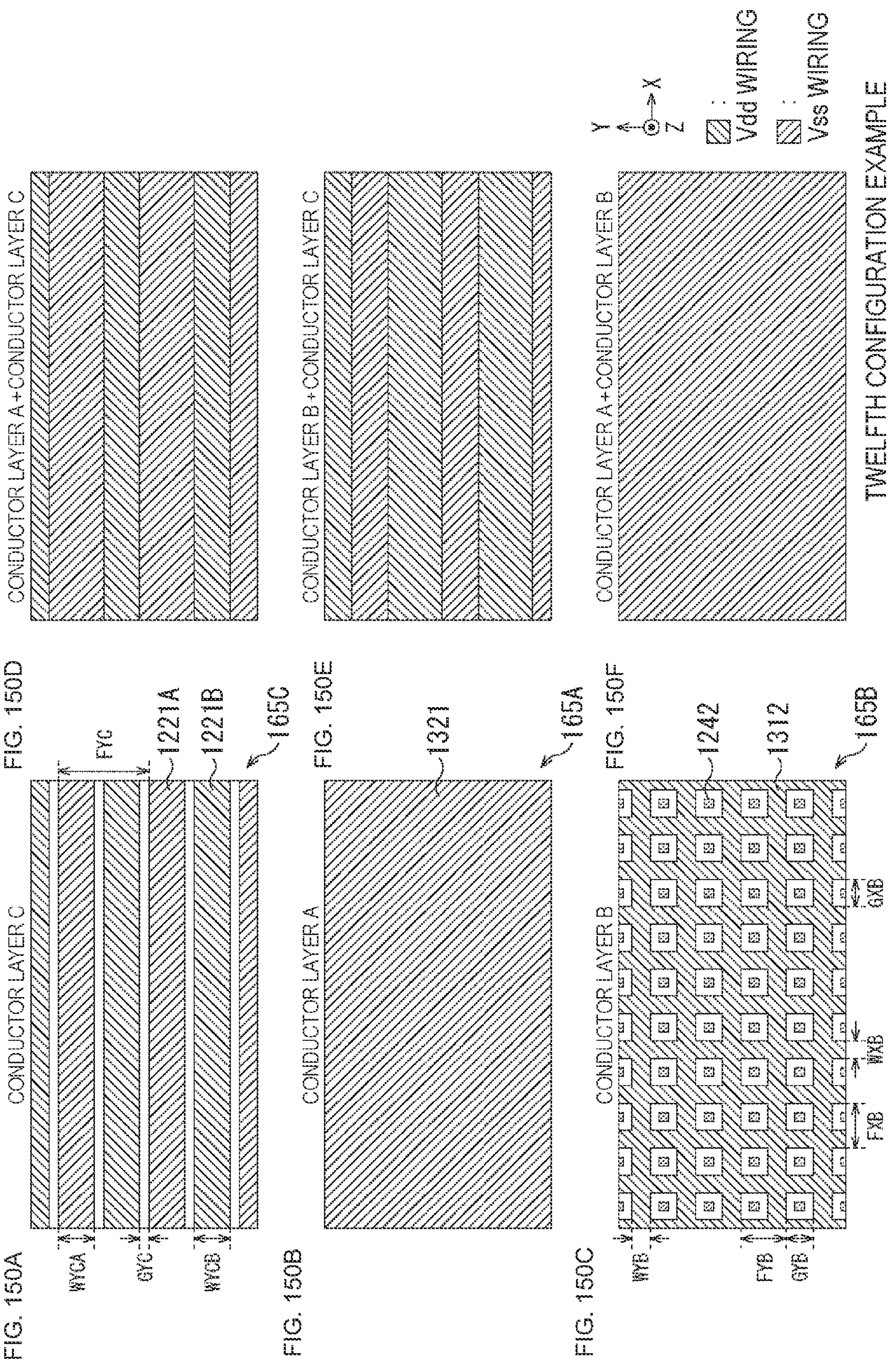

FIG. 150A illustrates the conductor layer C (wiring layer 165C), FIG. 150B illustrates the conductor layer A (wiring layer 165A), and FIG. 150D illustrates the conductor layer B (wiring layer 165B).

Furthermore, FIG. 150D is a plan view of a stacked state of the conductor layer A and the conductor layer C, FIG. 150E is a plan view of a stacked state of the conductor layer B and the conductor layer C, and FIG. 150F is a plan view of a stacked state of the conductor layer A and the conductor layer B.

In FIGS. 150A, 150B, 150C, 150D, 150E, and 150F, a portion corresponding to those in the eleventh and twelfth configuration examples illustrated in FIGS. 148A, 148B, 148C, 148D, 148E, 148F, 149A, 149B, 149C, 149D, 149E and 149F are given the same reference numeral and description of the portion is omitted as appropriate, and description will be given focusing on different In the first modification of the twelfth configuration example, only the configuration of the conductor layer B in FIG. 150D is different from that in FIGS. 149A, 149B, 149C, 149D, 149E, and 149F.

The conductor layer B in FIG. 150C is configured by a reticulated conductor 1312 and a relay conductor 1242 formed in a gap of the reticulated conductor 1312.

The twelfth configuration example illustrated in FIGS. 149A, 149B, 149C, 149D, 149E, and 149F are a configuration in which the reticulated conductor 1311 and the relay conductor 1241 of the eleventh configuration example of the three-layer conductor layer illustrated in FIGS. 148A, 148B, 148C, 148D, 148E, and 148F are changed to the planar conductor 1321 in the conductor layer A, and the reticulated conductor 1312 and the relay conductor 1242 of the eleventh configuration example of the three-layer conductor layer illustrated in FIGS. 148A, 148B, 148C, 148D, 148E, and 148E are changed to the planar conductor 1322 in the conductor layer B.

In contrast, the first modification of the twelfth configuration example in FIGS. 150A, 150B, 150C, 150D, 150E, and 150F are configuration in which the reticulated conductor 1311 and the relay conductor 1241 of the eleventh configuration example of the three-layer conductor layer illustrated in FIGS. 148A, 148B, 148C, 148D, 148E, and 148F are changed to the planar conductor 1321 in the conductor layer A, and the reticulated conductor 1312 and the relay conductor 1242, as in the eleventh configuration example of the three-layer conductor layer illustrated in FIGS. 148A, 148B, 148C, 148D, 148E, and 148F, are used in the conductor layer B.

FIGS. 151A, 151B, 151C, 151D, 151E, and 151F illustrate a second modification of the twelfth configuration example of the three-layer conductor layer.

Figure 151A:
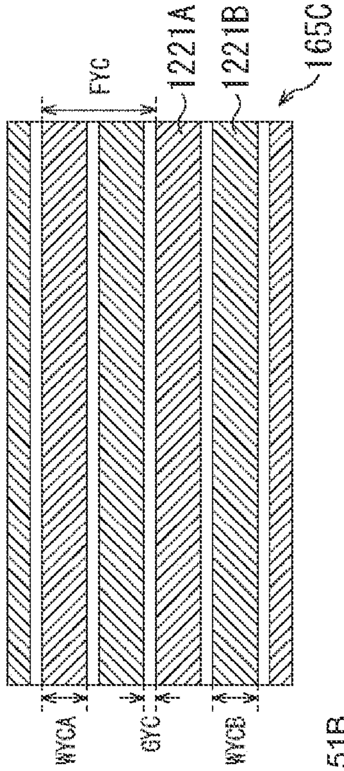
Figure 151D:
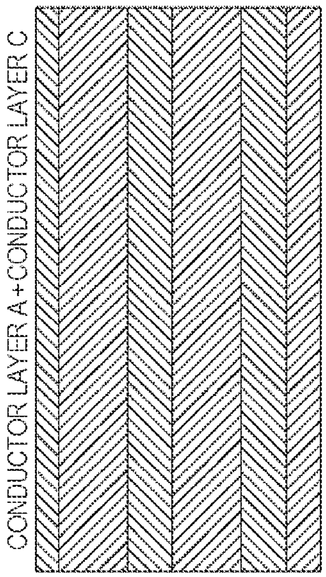
Figure 151B:
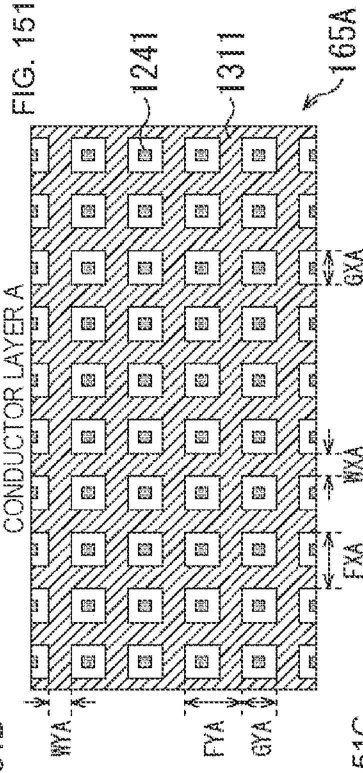
Figure 151E:
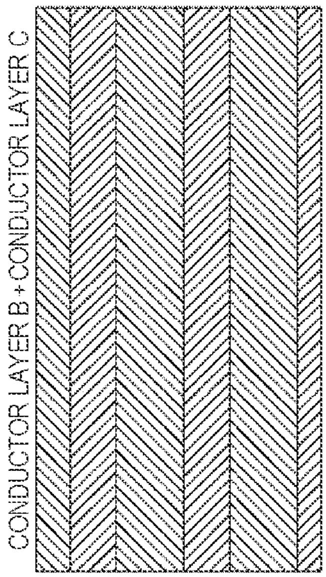
Figure 151C:
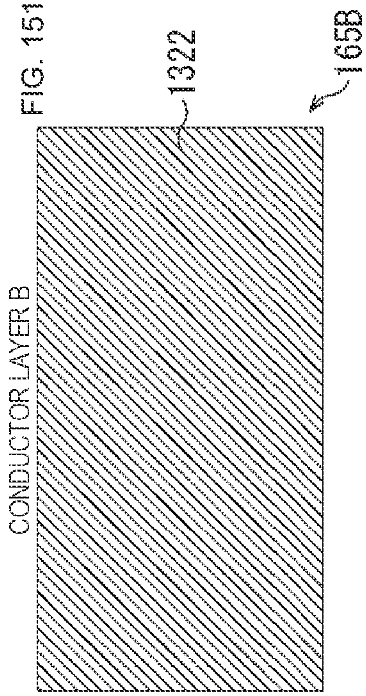

FIG. 151A illustrates the conductor layer C (wiring layer 165C), FIG. 151B illustrates the conductor layer A (wiring layer 165A), and FIG. 151C illustrates the conductor layer B (wiring layer 165B).

Figure 151F:
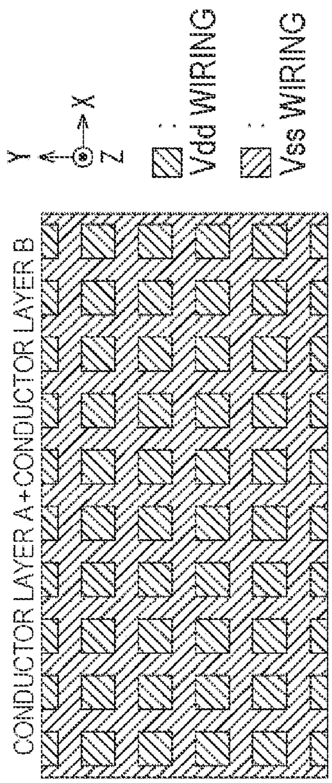

Furthermore, FIG. 151C is a plan view of a stacked state of the conductor layer A and the conductor layer C, FIG. 151E is a plan view of a stacked state of the conductor layer B and the conductor layer C, and FIG. 151F is a plan view of a stacked state of the conductor layer A and the conductor layer B.

In FIGS. 151A, 151B, 151C, 151D, 151E, and 151F, a portion corresponding to those in the eleventh and twelfth configuration examples illustrated in FIGS. 148A, 148B, 148C, 148D, 148E, 148F, 149A, 149B, 149C, 149D, 149E, and 149F are given the same reference numeral and description of the portion is omitted as appropriate, and description will be given focusing on different portions.

In the second modification of the twelfth configuration example, only the configuration of the conductor layer A in FIG. 151B is different from that in FIGS. 149A, 149B, 149C, 149D, 149E, and 149F.

The twelfth configuration example illustrated in FIGS. 149A, 149B, 149C, 149D, 149E, and 149F are a configuration in which the reticulated conductor 1311 and the relay conductor 1241 of the eleventh configuration example of the three-layer conductor layer illustrated in FIGS. 148A, 148B, 148C, 148D, 148E, and 148F are changed to the planar conductor 1321 in the conductor layer A, and the reticulated conductor 1312 and the relay conductor 1242 of the eleventh configuration example of the three-layer conductor layer illustrated in FIGS. 148A, 148B, 148C, 148D, 148E, and 148E are changed to the planar conductor 1322 in the conductor layer B.

In contrast, the second modification of the twelfth configuration example in FIGS. 151A, 151B, 151C, 151D, 151E, and 151F are configuration in which the reticulated conductor 1311 and the relay conductor 1241, as in the eleventh configuration example of the three-layer conductor layer illustrated in FIGS. 148A, 148B, 148C, 148D, 148E, and 148F, are used in the conductor layer A, and the reticulated conductor 1312 and the relay conductor 1242 of the eleventh configuration example of the three-layer conductor layer illustrated in FIGS. 148A, 148B, 148C, 148D, 148E, and 148E are changed to the planar conductor 1322 in the conductor layer B.

The first modification and the second modification have effects similar to those of the twelfth configuration example illustrated in FIGS. 149A, 149B, 149C, 149D, 149E, and 149F.

That is, when the conductor layer C is viewed in a predetermined plane range (plane region), the current distribution of the linear conductor 1221A and the current distribution of the linear conductor 1221B become the same or substantially the same, so that generation of inductive noise can be suppressed.

Since the linear conductor 1222A and the linear conductor 1222B repeat the same wiring pattern in the Y direction, the capacitive noise can be completely canceled in the Y direction. The capacitive noise can be significantly improved as the conductor layer C is closer to the wiring layer 170.

The stacked layer of the conductor layers A and B has a light-shielding structure, and the hot carrier light emission from the active element group 167 can be shielded. In addition, the stacked layer of the conductor layers A and C and the stacked layer of the conductor layers B and C have also a light-shielding structure, and the light-shielding property is maintained. Thereby, since the light-shielding restrictions of the conductor layers A and B can be significantly alleviated, the conductive area of the conductor layers A and B can be used to the maximum, the wiring resistance can be lowered, and the voltage drop can be further improved. Furthermore, the degree of freedom in layout of the conductor layers A and B can be improved.

The first modification in FIGS. 150A, 150B, 150C, 150D, 150E, and 150F are particularly suitable for the stacking order in which the three conductor layers A to C can be electrically connected, specifically for the stacking orders illustrated in A and FIG. 120B. For example, in the case of the stacking order of the conductor layers A, B, and C illustrated in FIG. 120A the planar conductor 1321 of the conductor layer A and the relay conductor 1242 of the conductor layer B can be connected, and the reticulated conductor 1312 and the relay conductor 1242 of the conductor layer B can be respectively connected with the linear conductors 1221B and A of the conductor layer C via the conductor via in the Z direction between the conductors having common current characteristics and in a part of a region where plane regions overlap.

The second modification in FIGs. 151A, 151B, 151C, 151D, 151E, and 151F particularly suitable for the stacking order in which the three conductor layers A to C can be electrically connected, specifically for the stacking orders illustrated in FIGS. 120B and 120C. For example, in the case of the stacking order of the conductor layers A, B, and C illustrated in FIG. 120B, the reticulated conductor and the relay conductor 1241 of the conductor layer A can be respectively connected with the linear conductors 1221A and 1221B of the conductor layer C via the conductor via in the Z direction between the conductors having common current characteristics and in a part of a region where plane regions overlap, and the planar conductor 1322 of the conductor layer B and the linear conductor 1221B of the conductor layer C can be connected.

Thirteenth Configuration Example of Three-Layer Conductor Layer

FIGS. 152A, 152B, 152C, 152D, 152E, and 152F illustrate a thirteenth configuration example of the three-layer conductor layer.

Figures 152A, 152B, 152C, 152D, 152E, 152F:
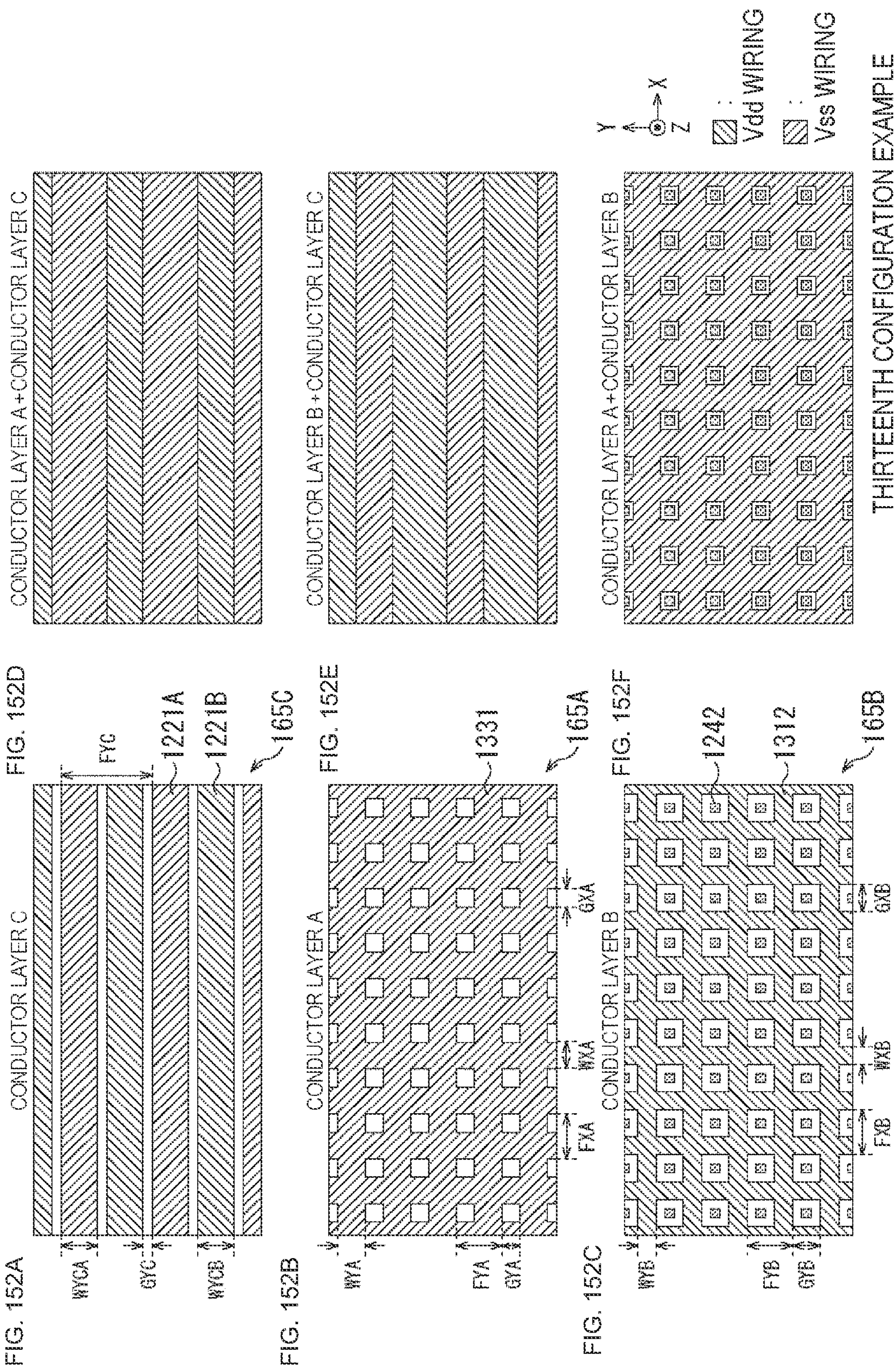

FIG. 152A illustrates the conductor layer C (wiring layer 165C), FIG. 152B illustrates the conductor layer A (wiring layer 165A), and FIG. 152C illustrates the conductor layer B (wiring layer 165B).

Furthermore, FIG. 152D is a plan view of a stacked state of the conductor layer A and the conductor layer C, FIG. 152E is a plan view of a stacked state of the conductor layer B and the conductor layer C, and FIG. 152F is a plan view of a stacked state of the conductor layer A and the conductor layer B.

In the twelfth configuration example in FIGS. 152A, 152B, 152C, 152D, 152E, and 152F, a portion corresponding to that in the eleventh configuration example illustrated in FIGS. 148A, 148B, 148C, 148D, 148E, and 148F are given the same reference numeral and description of the portion is omitted as appropriate, and description will be given focusing on different portions.

In the thirteenth configuration example, only the configuration of the conductor layer A in FIG. 152B is different from that in FIGS. 148A, 148B, 148C, 148D, 148E, and 148F.

The conductor layer A in FIG. 152B is configured by a reticulated conductor 1331. The reticulated conductor 1331 is, for example, wiring (Vss wiring) connected to the GND or the negative power supply. The reticulated conductor 1331 has the conductor width WXA, the gap width GXA, and the conductor period FXA in the X direction, and the conductor width WYA, the gap width GYA, and the conductor period FYA in the Y direction. Here, the conductor width WXA=the conductor width WYA, the gap width GXA=the gap width GYA, and the conductor period FXA=the conductor period FYA. Note that the gap width GXA and the gap width GYA of the gap of the reticulated conductor 1331 are smaller than the gap width GXB and the gap width GYB of the gap of the reticulated conductor 1312 of the conductor layer B (the gap width GXA=the gap width GYA<the gap width GXB=the gap width GYB). Furthermore, no relay conductor is formed in the gap of the reticulated conductor 1331.

The thirteenth configuration example in FIGS. 152A, 152B, 152C, 152D, 152E, and 152F are similar to the eleventh configuration example in FIG. 148A 148B, 148C, 148D, 148E, and 148F except for the above-described points.

When the conductor layer C in FIG. 152A is viewed in a predetermined plane range (plane region), the current distribution of the linear conductor 1221A and the current distribution of the linear conductor 1221B become the same or substantially the same, so that generation of inductive noise can be suppressed.

Since the linear conductor 1221A and the linear conductor 1221B have the same wiring pattern repeated in the Y direction, the capacitive noise can be completely canceled in the Y direction. The capacitive noise can be significantly improved as the conductor layer C is closer to the wiring layer 170.

As illustrated in FIGS. 152D and 152E, the stacked layer of the conductor layers A and C and the stacked layer of the conductor layers B and C have a light-shielding structure, and the light-shielding property is maintained. Thereby, since the light-shielding restrictions of the conductor layers A and B can be significantly alleviated, the conductive area of the conductor layers A and B can be used to the maximum, the wiring resistance can be lowered, and the voltage drop can be further improved. Furthermore, the degree of freedom in layout of the conductor layers A and B can be improved.

By providing the relay conductor 1242 in the conductor layer B, it becomes possible to connect the linear conductor 1221A at substantially the shortest distance or a short distance, thereby reducing the voltage drop, energy loss, or inductive noise.

The thirteenth configuration example in FIGS. 152A, 152B, 152C, 152D, 152E, and 152F are particularly suitable for the stacking order in which the three layers of the conductor layers A to C can be electrically connected, specifically for the stacking order illustrated in FIG. 120B. For example, in the case of the stacking order of the conductor layers A, B, and C illustrated in FIG. 120B the reticulated conductor 1331 of the conductor layer A and the linear conductor 1221A of the conductor layer C can be connected via the conductor via in the Z direction, and the reticulated conductor 1312 and the relay conductor 1242 of the conductor layer B can be respectively connected with the linear conductors 1221B and 1221A of the conductor layer C via the conductor via in the Z direction between the conductors having common current characteristics and in a part of a region where plane regions overlap.

Fourteenth Configuration Example of Three-Layer Conductor Layer

The first to thirteenth configuration examples of the three-layer conductor layer have been described adopting the configuration using the linear conductor long in the X direction or the linear conductor long in the Y direction, which is a vertical stripe or horizontal stripe wiring pattern, as the configuration of the conductor layer C.

However, the conductor layer C is not limited to the vertical stripe or horizontal stripe wiring pattern.

In next FIGS. 153A, 153B, 153C, 153D, 153E, 153F, 154A, 154B. 154C, 154D, 154E, 154F, 155A, 155B, 155C, 155D, 155E, 155F, 156A, 156B, 156C, 157A, 157B, 157C, 158A, 158B, 158C, 159A, 159B, 159C, 160A, 160B, 160C, 161A, 161B, 161C, 162A, 162B, 162C, 163A, 163B, and 163D, a case where the conductor layer C has a configuration other than the vertical stripe or horizontal stripe wiring pattern will be described.

FIGS. 153A, 153B, 153C, 153D, 153E, and 153F illustrate a fourteenth configuration example of the three-layer conductor layer.

Figures 153A, 153B, 153C, 153D, 153E, 153F:
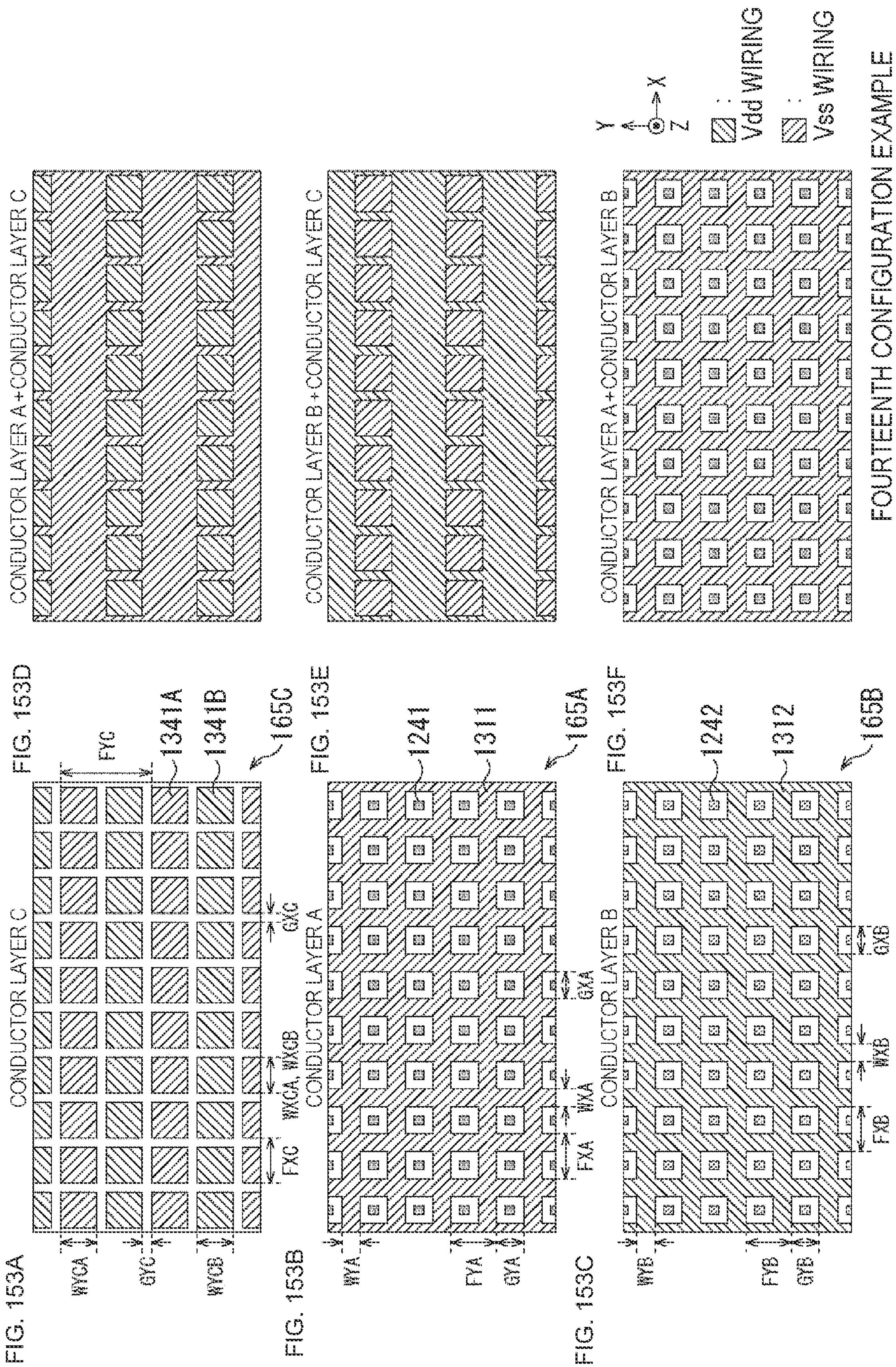

FIG. 153A illustrates the conductor layer C (wiring layer 165C), FIG. 153B illustrates the conductor layer A (wiring layer 165A), and FIG. 153D illustrates the conductor layer B (wiring layer 165B).

Furthermore, FIG. 153D is a plan view of a stacked state of the conductor layer A and the conductor layer C, FIG. 153E is a plan view of a stacked state of the conductor layer B and the conductor layer C, and FIG. 153F is a plan view of a stacked state of the conductor layer A and the conductor layer B.

In the fourteenth configuration example in FIGS. 153A, 153B, 153C, 153D, 153E, and 153F, a portion corresponding to that in the eleventh configuration example illustrated in FIGS. 148A, 148B, 148C, 148D, 148E, and 148F are given the same reference numeral and description of the portion is omitted as appropriate, and description will be given focusing on different portions.

In the fourteenth configuration example, only the configuration of the conductor layer C in FIG. 153A is different from that in FIGS. 148A, 148B, 148C, 148D, 148E, and 148F.

The conductor layer C in FIG. 153A is configured by repeatedly arranging pluralities of rectangular conductors 1341A and 1341B on the same plane with a predetermined repetition period. The rectangular conductor 1341A is, for example, wiring (Vss wiring) connected to the GND or the negative power supply. The rectangular conductor 1341B is, for example, wiring (Vdd wiring) connected to the positive power supply.

Specifically, a row in which the rectangular conductor 1341A is repeatedly arranged with the gap width GXC in the X direction, and a row in which the rectangular conductor 1341B is repeatedly arranged with the gap width GXC in the X direction are alternately and periodically arranged in the Y direction. The rectangular conductors 1341A and 1341B are repeatedly arranged in the X direction with the conductor period FXC, and are repeatedly arranged in the Y direction with the conductor period FYC. There is a gap with the gap width GYC between the rectangular conductor 1341A and the rectangular conductor 1341B in the Y direction. The rectangular conductor 1341A has the conductor width WXCA in the X direction and the conductor width WYCA in the Y direction, and the rectangular conductor 1341B has the conductor width WXCB in the X direction and the conductor width WYCB in the Y direction. Here, the conductor widths WXCA, WYCA, WXCB, and WYCB are the same (the conductor width WXCA=the conductor width WYCA=the conductor width WXCB=the conductor width WYCB).

The fourteenth configuration example in FIGS. 153A, 153B, 153C, 153D, 153E, and 153F are similar to the eleventh configuration example in FIG. 148A 148B, 148C, 148D, 148E, and 148F except for the above-described points.

When the conductor layer C in FIG. 153A is viewed in a predetermined plane range (plane region), the current distribution of the rectangular conductor 1341A and the current distribution of the rectangular conductor 1341B become the same or substantially the same, so that generation of inductive noise can be suppressed.

Since the rectangular conductor 1341A and the rectangular conductor 1341B repeat the same wiring pattern in the Y direction, the capacitive noise can be completely canceled in the Y direction. The capacitive noise can be significantly improved as the conductor layer C is closer to the wiring layer 170.

As illustrated in FIGS. 153D and 153E, the stacked layer of the conductor layers A and C and the stacked layer of the conductor layers B and C have a light-shielding structure, and the light-shielding property is maintained. Thereby, since the light-shielding restrictions of the conductor layers A and B can be significantly alleviated, the conductive area of the conductor layers A and B can be used to the maximum, the wiring resistance can be lowered, and the voltage drop can be further improved. Furthermore, the degree of freedom in layout of the conductor layers A and B can be improved.

By providing the relay conductor 1241 in the conductor layer A, it becomes possible to connect the rectangular conductor 1341B at substantially the shortest distance or a short distance, thereby reducing the voltage drop, energy loss, or inductive noise.

By providing the relay conductor 1242 in the conductor layer B, it becomes possible to connect the rectangular conductor 1341A at substantially the shortest distance or a short distance, thereby reducing the voltage drop, energy loss, or inductive noise.

Modification of Fourteenth Configuration Example of Three-Layer Conductor Layer FIGS. 154A, 154B, 154C, 154D, 154E, and 154F illustrate a first modification of the fourteenth configuration example of the three-layer conductor layer.

Figures 154A, 154B, 154C, 154D, 154E, 154F:
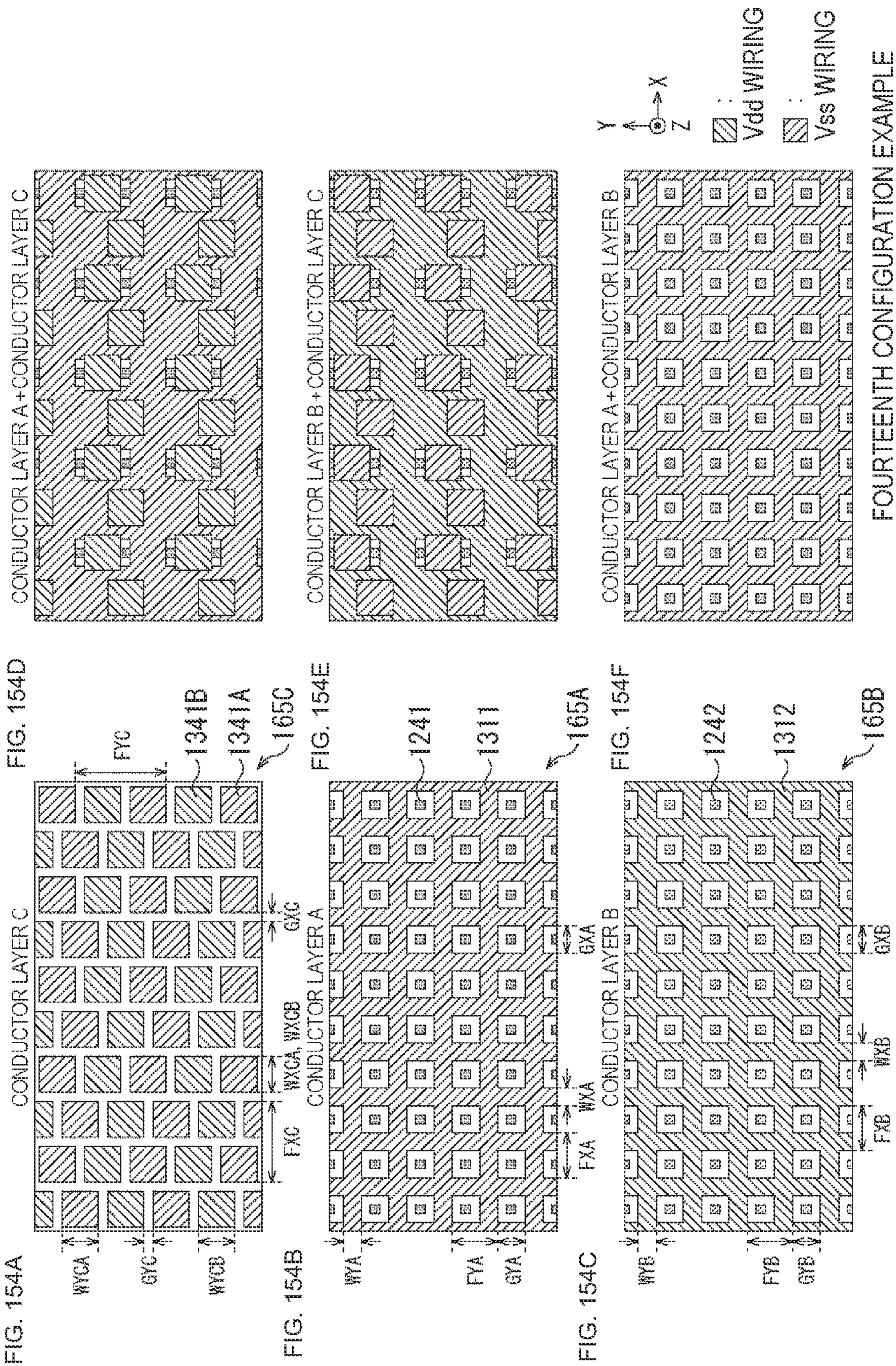

FIG. 154A illustrates the conductor layer C (wiring layer 165C), FIG. 154B illustrates the conductor layer A (wiring layer 165A), and FIG. 154D illustrates the conductor layer B (wiring layer 165B).

Furthermore, FIG. 154D is a plan view of a stacked state of the conductor layer A and the conductor layer C, FIG. 154E is a plan view of a stacked state of the conductor layer B and the conductor layer C, and FIG. 154F is a plan view of a stacked state of the conductor layer A and the conductor layer B.

In FIGS. 154A, 154B, 154C, 154D, 154E, and 154F, a portion corresponding to that in the fourteenth configuration example illustrated in FIGS. 153A 153B, 153C, 153D, 153E, and 153F given the same reference numeral and description of the portion is omitted as appropriate, and description will be given focusing on different portions.

In the first modification of the fourteenth configuration example, only the configuration of the conductor layer C in FIG. 154A is different from that in FIGS. 153A, 153B, 153C, 153D, 153E, and 153F, and the configurations of the conductor layers A and B are similar to those in FIGS. 153A, 153B, 153C, 153D, 153E, and 153F.

The conductor layer FIG. 154A is common to that in FIGS. 153A, 153B, 153C, 153D, 153E, and 153F in that the pluralities of rectangular conductors A and 1341B are repeatedly arranged on the same plane with a predetermined repetition period, and is different from that in FIGS. 153A, 153B, 153C, 153D, 153E, and 153F in that the arrangement is shifted in adjacent columns by ¼ of the conductor period FYC in the Y direction. The conductor period FXC, which is the repetition period in the X direction, is in units of two columns.

FIGS. 155A, 155B, 155C, 155D, 155E, and 155F illustrate a second modification of the fourteenth configuration example of the three-layer conductor layer.

Figures 155A, 155B, 155C, 155D, 155E, 155F:
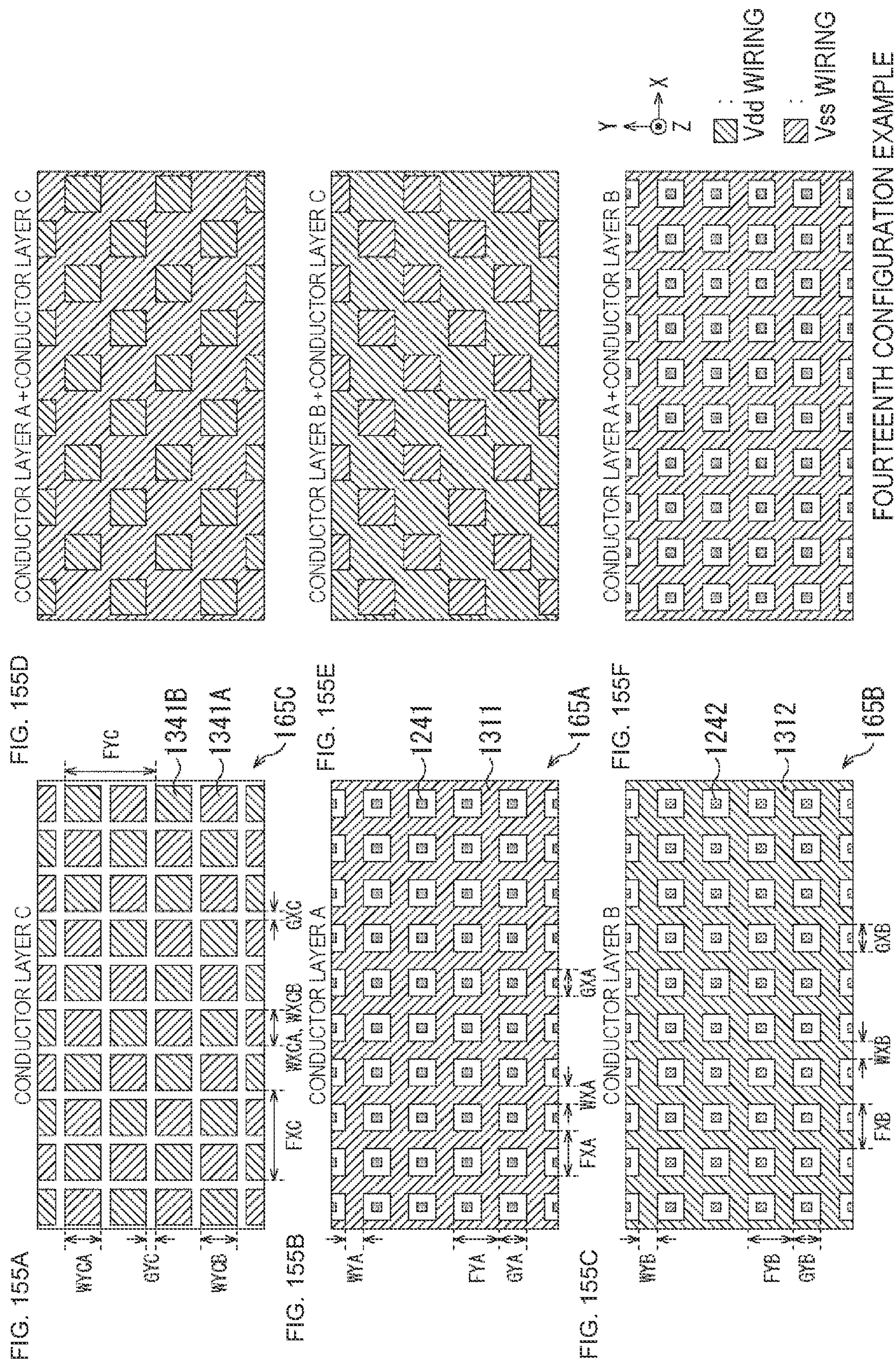

FIG. 155A illustrates the conductor layer C (wiring layer 165C), FIG. 155B illustrates the conductor layer A (wiring layer 165A), and FIG. 155D illustrates the conductor layer B (wiring layer 165B).

Furthermore, FIG. 155D is a plan view of a stacked state of the conductor layer A and the conductor layer C, FIG. 155E is a plan view of a stacked state of the conductor layer B and the conductor layer C, and FIG. 155F is a plan view of a stacked state of the conductor layer A and the conductor layer B.

In FIGS. 155A, 155B, 155C, 155D, 155E, and 155F, a portion corresponding to that in the fourteenth configuration example illustrated in FIGS. 153A 153B, 153C, 153D, 153E, and 153F given the same reference numeral and description of the portion is omitted as appropriate, and description will be given focusing on different portions.

In the second modification of the fourteenth configuration example, only the configuration of the conductor layer C in FIG. 155A is different from that in FIGS. 149A, 149B, 149C, 149D, 149E, and 149F, and the configurations of the conductor layers A and B are similar to those in FIGS. 149A, 149B, 149C, 149D, 149E, and 149F.

The conductor layer FIG. 155A is common to that in FIGS. 149A 149B, 149C, 149D, 149E, and 149F in that the pluralities of rectangular conductors A and 1341B are repeatedly arranged on the same plane with a predetermined repetition period, and is different from that in FIGS. 149A, 149B, 149C, 149D, 149E, and 149E in that the arrangement is shifted in adjacent columns by ½ of the conductor period FYC in the Y direction. The conductor period FXC, which is the repetition period in the X direction, is in units of two columns. Note that an amount of shift in the Y direction in adjacent columns of the rectangular conductors 1341A and 1341B can be designed to an arbitrary value.

In the first modification and the second modification of the fourteenth configuration example in FIGS. 154A, 154B, 154C, 154D, 154E, 154F, 155A, 155B. 155C, 155D, 155E, and 155E when the conductor layer C is viewed in a predetermined plane range (plane region), the current distribution of the rectangular conductor 1341A and the current distribution of the rectangular conductor 1341B become the same or substantially the same, so that generation of inductive noise can be suppressed.

Furthermore, in the first modification and the second modification of the fourteenth configuration example, the rectangular conductor 1341A and the rectangular conductor 1341B repeat the same wiring pattern in the Y direction, and therefore the capacitive noise can be completely canceled in the Y direction. The capacitive noise can be significantly improved as the conductor layer C is closer to the wiring layer 170.

Moreover, in the second modification of the fourteenth configuration example in FIGS. 155A, 155B, 155C, 155D, 155E, and 155F, the rectangular conductor A and the rectangular conductor 1341B repeat the same wiring pattern in the X direction, and therefore the capacitive noise can be completely canceled in the X direction. The capacitive noise can be significantly improved as the conductor layer C is closer to the wiring layer 170.

In the first modification of the fourteenth configuration example in FIGS. 154A, 154B, 154C, 154D, 154E, and 154F, the light-shielding property is maintained in a fixed range in the stacked layer of the conductor layers A and B, the stacked layer of the conductor layers A and C, and the stacked layer of the conductor layers B and C. Thereby, since the light-shielding restrictions of the conductor layers A and B can be slightly alleviated, the conductive area of the conductor layers A and B can be used to the maximum, the wiring resistance can be lowered, and the voltage drop can be further improved. Furthermore, the degree of freedom in layout of the conductor layers A and B can be improved.

In the second modification of the fourteenth configuration example in FIGS. 155A, 155B, 155C, 155D, 155E, and 155F, the stacked layer of the conductor layers A and C and the stacked layer of the conductor layers B and C have a light-shielding structure, and the light-shielding property is maintained. Thereby, since the light-shielding restrictions of the conductor layers A and B can be significantly alleviated, the conductive area of the conductor layers A and B can be used to the maximum, the wiring resistance can be lowered, and the voltage drop can be further improved. Furthermore, the degree of freedom in layout of the conductor layers A and B can be improved.

By providing the relay conductor 1241 in the conductor layer A, it becomes possible to connect the rectangular conductor 1341B at substantially the shortest distance or a short distance, thereby reducing the voltage drop, energy loss, or inductive noise.

By providing the relay conductor 1242 in the conductor layer B, it becomes possible to connect the rectangular conductor 1341A at substantially the shortest distance or a short distance, thereby reducing the voltage drop, energy loss, or inductive noise.

Other Modifications in Fourteenth Configuration Example of Three-Layer Conductor Layer Hereinafter, other modifications of the fourteenth configuration example of the three-layer conductor layer illustrated in FIGS. 153A, 153B, 153C, 153D, 153E, and 153F will be described with reference to FIGS. 156A, 156B, 156C, 157A, 157B, 157C, 158A, 158B, 158C, 159A, 159B, 159C, 160A, 160B, 160C, 161A, 161B, 161C, 162A, 162B, 162C, 163A, 163B, and 163C.

Note that, in the modifications of the fourteenth configuration example, only the configuration of the conductor layer C will be illustrated in FIGS. 156A, 156B, 156C, 163A, 163B, and 163C because only the configuration of the conductor layer C is changed similarly to the first and second modifications in FIGS. 154A, 154B, 154C, 154D, 154E, 154F, 155A, 155B, 155C, 155D, 155E, and 155F. Furthermore, in FIGS. 156A, 156B, 156C, 157A, 157B, 157C, 158A, 158B, 158C, 159A, 159B. 159C, 160A, 160B, 160C, 161A, 161B, 161C, 162A, 162B, 162C, 163A, 163B, and 163C, the configuration of the conductor layer C will be described by being compared with the conductor layer C of the fourteenth configuration example illustrated in FIG. 153A.

FIG. 156A illustrates the conductor layer C of a third modification of the fourteenth configuration example of the three-layer conductor layer.

The conductor layer C in FIG. 156A is configured by repeatedly arranging pluralities of rectangular conductors 1342A and 1342B on the same plane with a predetermined repetition period. The rectangular conductor 1342A is, for example, wiring (Vss wiring) connected to the GND or the negative power supply. The rectangular conductor 1342B is, for example, a wiring (Vdd wiring) connected to the positive power supply.

The difference of the conductor layer C in FIG. 156A from the conductor layer FIG. 153A is the conductor sizes of the rectangular conductors 1342A and 1342B, that is, the conductor widths WXCA, WYCA, WXCB, and WYCB. Note that the conductor widths WXCA, WYCA, WXCB, and WYCB are the same (the conductor width WXCA=the conductor width WYCA=the conductor width WXCB=the conductor width WYCB).

The capacitive noise can be completely canceled in the Y direction in the conductor layer C in FIG. 156A. The capacitive noise can be significantly improved as the conductor layer C is closer to the wiring layer 170.

Furthermore, the wiring resistance can be further reduced by making the conductor sizes of the rectangular conductors 1342A and 1342B larger than those of the fourteenth configuration example illustrated in FIG. 153A.

FIG. 156B illustrates the conductor layer C of a fourth modification of the fourteenth configuration example of the three-layer conductor layer.

The conductor layer C in FIG. 156B is common to that in FIG. 156A in that the pluralities of rectangular conductors 1342A and 1342B are repeatedly arranged on the same plane with a predetermined repetition period, and is different from that in FIG. 156A in that the arrangement is shifted in adjacent columns by ¼ of the conductor period FYC in the Y direction. The conductor period FXC, which is the repetition period in the X direction, is in units of two columns.

The capacitive noise can be completely canceled in the Y direction in the conductor layer FIG. 156B. The capacitive noise can be significantly improved as the conductor layer C is closer to the wiring layer 170.

FIG. 156C illustrates the conductor layer C of a fifth modification of the fourteenth configuration example of the three-layer conductor layer.

The conductor layer FIG. 156C is common to that in FIG. 156A in that the pluralities of rectangular conductors 1342A and 1342B are repeatedly arranged on the same plane with a predetermined repetition period, and is different from that in FIG. 156A in that the arrangement is shifted in adjacent columns by ½ of the conductor period FYC in the Y direction. It can be said that the adjacent rows are shifted in arrangement by ½ of the conductor period FXC in the X direction. The conductor period FXC in the X direction is in units of two columns, and the conductor period FYC in the Y direction is in units of two rows. Note that the amount of shift in the Y direction in adjacent columns of the rectangular conductors 1342A and 1342B can be designed to an arbitrary value.

The capacitive noise can be completely canceled in the Y direction in the conductor layer FIG. 156C. The capacitive noise can be significantly improved as the conductor layer C is closer to the wiring layer 170.

Moreover, the capacitive noise can be completely canceled in the X direction in the conductor layer FIG. 156C. The capacitive noise can be significantly improved as the conductor layer C is closer to the wiring layer 170.

FIG. 157A illustrates the conductor layer C of a sixth modification of the fourteenth configuration example of the three-layer conductor layer.

The conductor layer C in FIG. 157A is configured by repeatedly arranging pluralities of rectangular conductors 1343A and 1343B on the same plane with a predetermined repetition period. The rectangular conductor 1343A is, for example, wiring (Vss wiring) connected to the GND or the negative power supply. The rectangular conductor 1343B is, for example, wiring (Vdd wiring) connected to the positive power supply.

The difference of the conductor layer C in FIG. 157A from the conductor layer FIG. 153A is the conductor sizes of the rectangular conductors 1343A and 1343B, specifically, the conductor widths WXCA and WXCB. Note that the rectangular conductors 1343A and 1343B are rectangular, and the conductor width WXCA>the conductor width WYCA and the conductor width WXCB>the conductor width WYCB. Furthermore, the conductor width WXCA and the conductor width WXCB are the same, and the conductor width WYCA and the conductor width WYCB are the same (the conductor width WXCA=the conductor width WXCB, and the conductor width WYCA=the conductor width WYCB).

The capacitive noise can be completely canceled in the Y direction in the conductor layer FIG. 157A. The capacitive noise can be significantly improved as the conductor layer C is closer to the wiring layer 170.

FIG. 157B illustrates the conductor layer C of a seventh modification of the fourteenth configuration example of the three-layer conductor layer.

The conductor layer C in FIG. 157B is common to that in FIG. 157A in that the pluralities of rectangular conductors 1343A and 1343B are repeatedly arranged on the same plane with a predetermined repetition period, and is different from that in FIG. 157A in that the arrangement is shifted in adjacent rows by ½ of the conductor period FXC in the X direction. The conductor period FYC, which is the repetition period in the Y direction, is in units of two rows. Note that an amount of shift in the X direction in adjacent rows of the rectangular conductors 1343A and 1343B can be designed to an arbitrary value.

In the conductor layer C in FIG. 157B the rectangular conductor 1343A and the rectangular conductor 1343B do not have repetition of the same wiring pattern in the Y direction. Therefore, there is an X position in which the capacitive noise cannot be completely canceled in the Y direction.

Therefore, in the case of shifting the rows by ½ of the conductor period FXC in the X direction, the conductor layer C can be configured as in the conductor layer C in FIG. 157C.

FIG. 157C illustrates the conductor layer C of an eighth modification of the fourteenth configuration example of the three-layer conductor layer.

The conductor layer FIG. 157C is configured by shifting the rectangular conductors 1343A and 1343B adjacent in the Y direction by ½ of the conductor period FXC in the X direction in units of two rows, and repeatedly arranging the rectangular conductors 1343A and 1343B on the same plane with a predetermined repetition period.

The capacitive noise can be completely canceled in the Y direction in the conductor layer FIG. 157C. The capacitive noise can be significantly improved as the conductor layer C is closer to the wiring layer 170.

Note that the amount of shift in the X direction in units of adjacent two rows of the rectangular conductors 1343A and 1343B can be designed to an arbitrary value. Furthermore, shift of the rectangular conductors 1343A and 1343B in the X direction in units of two rows may be performed by shifting two non adjacent rows of rectangular conductors instead of two adjacent rows of rectangular conductors. Furthermore, the shift of the rectangular conductors 1343A and 1343B in the X direction in units of two rows need not be performed in units of two rows because the capacitive noise can be completely canceled in the Y direction if the sum of the conductor widths in the Y direction of the rectangular conductors 1343A and the sum of the conductor widths in the Y direction of the rectangular conductors 1343B in a predetermined plane range (plane region) are the same. In other words, the rectangular conductors 1343A and 1343B may be shifted in the X direction with an amount of shift designed to an arbitrary value in units of two or more rows regardless of whether the rectangular conductors are adjacent or not, and the shift is suitable but not limited to the case where the sum of the conductor widths in the Y direction of the rectangular conductors 1343A and the sum of the conductor widths in the Y direction of the rectangular conductors 1343B in a predetermined plane range (plane region) are the same or substantially the same.

FIG. 158A illustrates the conductor layer C of a ninth modification of the fourteenth configuration example of the three-layer conductor layer.

The conductor layer C in FIG. 158A is configured by repeatedly arranging pluralities of rectangular conductors 1344A and 1344B on the same plane with a predetermined repetition period. The rectangular conductor 1344A is, for example, wiring (Vss wiring) connected to the GND or the negative power supply. The rectangular conductor 1344B is, for example, a wiring (Vdd wiring) connected to the positive power supply.

The difference of the conductor layer C in FIG. 158A from the conductor layer FIG. 157A is the conductor sizes of the rectangular conductors 1344A and 1344B, specifically, the conductor widths WXCA and WXCB. The conductor widths WXCA and WXCB of the rectangular conductors 1344A and 1344B in FIG. 158A are larger than the conductor widths WXCA and WXCB of the rectangular conductors 1343A and 1343B in FIG. 157A.

Note that the rectangular conductors 1344A and 1344B are rectangular, and the conductor width WXCA>the conductor width WYCA and the conductor width WXCB>the conductor width WYCB. Furthermore, the conductor width WXCA and the conductor width WXCB are the same, and the conductor width WYCA and the conductor width WYCB are the same (the conductor width WXCA=the conductor width WXCB, and the conductor width WYCA=the conductor width WYCB).

The capacitive noise can be completely canceled in the Y direction in the conductor layer FIG. 158A. The capacitive noise can be significantly improved as the conductor layer C is closer to the wiring layer 170.

FIG. 158B illustrates the conductor layer C of a tenth modification of the fourteenth configuration example of the three-layer conductor layer.

The conductor layer C in FIG. 158B is common to that in FIG. 158A in that the pluralities of rectangular conductors 1344A and 1344B are repeatedly arranged on the same plane with a predetermined repetition period, and is different from that in FIG. 158A in that the arrangement is shifted in adjacent rows by ⅓ of the conductor period FXC in the X direction. The conductor period FYC, which is the repetition period in the Y direction, is in units of six rows.

The capacitive noise can be completely canceled in the Y direction in the conductor layer FIG. 158B. The capacitive noise can be significantly improved as the conductor layer C is closer to the wiring layer 170.

FIG. 158C illustrates the conductor layer C of an eleventh modification of the fourteenth configuration example of the three-layer conductor layer.

The conductor layer FIG. 158C is configured by shifting the rectangular conductors 1344A and 1344B adjacent in the Y direction by ⅓ of the conductor period FXC in the X direction in units of two rows, and repeatedly arranging the rectangular conductors 1344A and 1344B on the same plane with a predetermined repetition period.

The capacitive noise can be completely canceled in the Y direction in the conductor layer FIG. 158C. The capacitive noise can be significantly improved as the conductor layer C is closer to the wiring layer 170.

FIG. 159A illustrates the conductor layer C of a twelfth modification of the fourteenth configuration example of the three-layer conductor layer.

The conductor layer C in FIG. 159A is configured by repeatedly arranging pluralities of rectangular conductors 1341A and 1341B on the same plane with a predetermined repetition period.

The difference of the conductor layer C in FIG. 159A from the conductor layer C in FIG. 153A is the arrangement direction of the rectangular conductors 1341A and 1341B. Specifically, in the conductor layer FIG. 153A the rectangular conductors 1341A and 1341B are repeatedly arranged in the X direction with the conductor period FXC, and the rectangular conductors 1341A and 1341B are alternately and periodically arranged in the Y direction. In contrast, in the conductor layer FIG. 159A, the rectangular conductors 1341A and 1341B are repeatedly arranged in the Y direction with the conductor period FYC, and the rectangular conductors 1341A and 1341B are alternately and periodically arranged in the X direction.

The capacitive noise can be completely canceled in the X direction in the conductor layer C in FIG. 159A. The capacitive noise can be significantly improved as the conductor layer C is closer to the wiring layer 170.

FIG. 159B illustrates the conductor layer C of a thirteenth modification of the fourteenth configuration example of the three-layer conductor layer.

The conductor layer C in FIG. 159B is configured by repeatedly arranging pluralities of rectangular conductors 1361A and 1361B on the same plane with a predetermined repetition period. The rectangular conductor 1361A is, for example, wiring (Vss wiring) connected to the GND or the negative power supply. The rectangular conductor 1361B is, for example, wiring (Vdd wiring) connected to the positive power supply.

The difference of the conductor layer C in FIG. 159B from the conductor layer FIG. 159A is the conductor sizes of the rectangular conductors A and 1361B, specifically, the conductor widths WYCA and WYCB. Note that the rectangular conductors 1361A and 1361B are rectangular, and the conductor width WXCA<the conductor width WYCA, and the conductor width WXCB<the conductor width WYCB. Furthermore, the conductor width WXCA and the conductor width WXCB are the same, and the conductor width WYCA and the conductor width WYCB are the same (the conductor width WXCA=the conductor width WXCB, and the conductor width WYCA=the conductor width WYCB).

The capacitive noise can be completely canceled in the X direction in the conductor layer FIG. 159B. The capacitive noise can be significantly improved as the conductor layer C is closer to the wiring layer 170.

Note that although not illustrated, it is also possible that the rectangular conductors 1361A and 1361B are shifted by ½ of the conductor period FYC in the Y direction in adjacent columns and repeatedly arranged on the same plane with a predetermined repetition period, or are shifted by ⅓ of the conductor period FYC in the Y direction in adjacent columns. Furthermore, the amount of shift in the Y direction in adjacent columns of the rectangular conductors 1361A and 1361B can be designed to an arbitrary value. Furthermore, the rectangular conductors 1361A and 1361B may be shifted in the Y direction with an amount of shift designed to an arbitrary value in units of two or more columns regardless of whether the rectangular conductors are adjacent or not, and the shift is suitable but not limited to the case where the sum of the conductor widths in the X direction of the rectangular conductors 1361A and the sum of the conductor widths in the X direction of the rectangular conductors 1361B in a predetermined plane range (plane region) are the same or substantially the same.

FIG. 159C illustrates the conductor layer C of a fourteenth modification of the fourteenth configuration example of the three-layer conductor layer.

The conductor layer FIG. 159C is configured by shifting the rectangular conductors 1361A and 1361B adjacent in the X direction by ½ of the conductor period FYC in the Y direction in units of two columns, and repeatedly arranging the rectangular conductors 1361A and 1361B on the same plane with a predetermined repetition period.

The capacitive noise can be completely canceled in the X direction in the conductor layer FIG. 159C. The capacitive noise can be significantly improved as the conductor layer C is closer to the wiring layer 170.

FIG. 160A illustrates the conductor layer C of a fifteenth modification of the fourteenth configuration example of the three-layer conductor layer.

The conductor layer FIG. 160A is configured by arranging the two rectangular conductors 1341A and two rectangular conductors 1341B in the X direction and the Y direction on the same plane with a predetermined repetition period. The gap between adjacent rectangular conductors 1341A, the gap between adjacent rectangular conductors 1341B, and the gap between adjacent rectangular conductors 1341A and B have the gap width of GXC in the X direction and the gap width GYC in the Y direction. The two rectangular conductors 1341A and the two rectangular conductors B are repeatedly arranged in the X direction with the conductor period FXC, and are repeatedly arranged in the Y direction with the conductor period FYC.

FIG. 160B illustrates the conductor layer C of a sixteenth modification of the fourteenth configuration example of the three-layer conductor layer.

The conductor layer FIG. 160B is common to that in FIG. 157A in that the pluralities of rectangular conductors 1343A and 1343B are repeatedly arranged on the same plane with a predetermined repetition period, and is different from that in FIG. 157A in that the arrangement is shifted in adjacent columns by ½ of the conductor period FYC in the Y direction. It can be said that the arrangement in the adjacent rows is shifted by ½ of the conductor period FXC in the X direction. The conductor period FXC in the X direction is in units of two columns, and the conductor period FYC in the Y direction is in units of two rows.

FIG. 160C illustrates the conductor layer C of a seventeenth modification of the fourteenth configuration example of the three-layer conductor layer.

The conductor layer FIG. 160C is common to that in FIG. 158A in that the pluralities of rectangular conductors 1344A and 1344B are repeatedly arranged on the same plane with a predetermined repetition period, and is different from that in FIG. 158A in that the arrangement is shifted in adjacent columns by ½ of the conductor period FYC in the Y direction. It can be said that the arrangement in the adjacent rows is shifted by ½ of the conductor period FXC in the X direction. The conductor period FXC in the X direction is in units of two columns, and the conductor period FYC in the Y direction is in units of two rows. The conductor layer C in FIG. 160B and the conductor layer FIG. 160C differ only in the conductor widths WXCA and WXCB in the X direction.

In the conductor layers C in FIGS. 160A, 160B, and 160C, the capacitive noise can be completely canceled both in the X direction and in the Y direction. The capacitive noise can be significantly improved as the conductor layer C is closer to the wiring layer 170.

FIG. 161A illustrates the conductor layer C of an eighteenth modification of the fourteenth configuration example of the three-layer conductor layer.

The conductor layer C in FIG. 161A is common to that in FIG. 156A in that the two rectangular conductors 1341A and the two rectangular conductors 1341B are repeatedly arranged on the same plane in the X direction and the Y direction with a predetermined repetition period, and is different from that in FIG. 156A in that the arrangement is shifted by ¼ of the conductor period FYC in the Y direction in units of two columns.

FIG. 161B illustrates the conductor layer C of a nineteenth modification of the fourteenth configuration example of the three-layer conductor layer.

The conductor layer C in FIG. 161B is common to that in FIG. 157A in that the pluralities of rectangular conductors 1343A and 1343B are repeatedly arranged on the same plane with a predetermined repetition period, and is different from that in FIG. 157A in that the arrangement is shifted in adjacent columns by ¼ of the conductor period FYC in the Y direction.

FIG. 161C illustrates the conductor layer C of a twentieth modification of the fourteenth configuration example of the three-layer conductor layer.

The conductor layer FIG. 161C is configured by arranging conductors 1381A and 1381B in the Y direction on the same plane with a predetermined repetition period. The conductor 1381A is, for example, wiring (Vss wiring) connected to the GND or the negative power supply. The conductor 1381B is, for example, wiring (Vdd wiring) connected to the positive power supply.

The conductor 1381A has a shape in which all the rectangular conductors 1343A arranged in the X direction in FIG. 161B are connected by the shortest path. The conductor 1381B has a shape in which all the rectangular conductors 1343B arranged in the X direction in FIG. 161B are connected by the shortest path. The gap width GXC and the gap width GYC in FIG. 161C correspond to the minimum widths in the X direction and the Y direction between adjacent conductors. Note that the conductor 1381A and the conductor 1381B do not need to have the shape connecting all the rectangular conductors arranged in the X direction in FIG. 161B by the shortest path, and may have a meander shape or a meandering shape, for example.

In the conductor layers C in FIGS. 161A, 161B, and 161C, the capacitive noise can be completely canceled in the Y direction and partially canceled in the X direction. The capacitive noise can be significantly improved as the conductor layer C is closer to the wiring layer 170.

FIG. 162A illustrates the conductor layer C of a twenty-first modification of the fourteenth configuration example of the three-layer conductor layer.

The conductor layer C in FIG. 162A is common to that in FIG. 153A in that the pluralities of rectangular conductors 1341A and 1341B are repeatedly arranged on the same plane with a predetermined repetition period, and is different from that in FIG. 153A in that the arrangement is shifted in adjacent columns by ¼ of the conductor period FYC in the Y direction.

FIG. 162B illustrates the conductor layer C of a twenty-second modification of the fourteenth configuration example of the three-layer conductor layer.

The conductor layer C in FIG. 162B is configured by periodically arranging conductors 1382A and 1382B on the same plane with the conductor period FXC in the X direction and the conductor period FYC in the Y direction. The conductor 1382A is, for example, wiring (Vss wiring) connected to the GND or the negative power supply. The conductor 1382B is, for example, wiring (Vdd wiring) connected to the positive power supply. The conductor 1382A has the conductor width WXCA in the X direction and the conductor width WYCA in the Y direction, and the conductor 1382B has the conductor width WXCB in the X direction and the conductor width WYCB in the Y direction. The gap width GXC and the gap width GYC in FIG. 162B correspond to the minimum widths in the X direction and the Y direction between adjacent conductors.

The conductor 1382A has a shape in which two rectangular conductors A arranged in the X direction in FIG. 162A are connected by the shortest path. The conductor 1382B has a shape in which two rectangular conductors 1341B arranged in the X direction in FIG. 162A are connected by the shortest path. Note that the conductor 1382A and the conductor 1382B do not need to have the shape connected by the shortest path, and may be formed by electrically connecting two or more rectangular conductors arranged in the X direction in FIG. 162A.

FIG. 162C illustrates the conductor layer C of a twenty-third modification of the fourteenth configuration example of the three-layer conductor layer. The conductor layer FIG. 162C is configured by arranging conductors 1383A and 1383B on the same plane with a predetermined repetition period in the Y direction. The conductor 1383A is, for example, wiring (Vss wiring) connected to the GND or the negative power supply. The conductor 1383B is, for example, wiring (Vdd wiring) connected to the positive power supply. The conductor 1383A has the conductor width WYCA in the Y direction, and the conductor 1382B has the conductor width WYCB in the Y direction. The gap width GXC and the gap width GYC in FIG. 162C correspond to the minimum widths in the X direction and the Y direction between adjacent conductors.

The conductor 1383A has a shape in which all the rectangular conductors A arranged in the X direction in FIG. 162A are connected by the shortest path. The conductor 1383B has a shape in which all the rectangular conductors 1341B arranged in the X direction in FIG. 162A are connected by the shortest path. Note that the conductors 1383A and 1383B do not need to have the shape connecting all the rectangular conductors arranged in the X direction in FIG. 162A by the shortest path, and may have a meander shape or a meandering shape, for example.

In the conductor layers C in FIGS. 162A, 162B, and 162C, the capacitive noise can be completely canceled in the Y direction and partially canceled in the X direction. The capacitive noise can be significantly improved as the conductor layer C is closer to the wiring layer 170.

FIG. 163A illustrates the conductor layer C of a twenty-fourth modification of the fourteenth configuration example of the three-layer conductor layer.

The conductor layer C in FIG. 163A is common to that in FIG. 153A in that the rectangular conductors 1341A and 1341B are repeatedly arranged on the same plane with a predetermined repetition period, and is different from that in FIG. 153A in that a region in which the arrangement is shifted in adjacent columns by ¼ of the conductor period FYC in the Y direction, and a region in which the arrangement is not shifted coexist. The conductor layer C in FIG. 163A has a configuration in which the two rectangular conductors 1341A and 1341B, which are not shifted in the Y direction, are folded back and repeatedly arranged in the X direction with the conductor period FXC with reference to the center in the X direction.

FIG. 163B illustrates the conductor layer C of a twenty-fifth modification of the fourteenth configuration example of the three-layer conductor layer.

The conductor layer C in FIG. 163B is configured by arranging rectangular conductors 1371A and 1371B and repeatedly arranging conductors 1382A and 1382B on the same plane with a predetermined repetition period.

The conductor layer FIG. 163B has a configuration in which the conductors 1382A and 1382B are folded back at the center in the X direction of the rectangular conductors 1371A and 1371B, and the conductors 1382A and 1382B repeatedly arranged in the X direction with the conductor period FXC.

FIG. 163C illustrates the conductor layer C of a twenty-sixth modification of the fourteenth configuration example of the three-layer conductor layer.

The conductor layer FIG. 163C is configured by arranging conductors 1391A and 1391B on the same plane in the Y direction with a predetermined repetition period. The conductor 1391A is, for example, wiring (Vss wiring) connected to the GND or the negative power supply. The conductor 1391B is, for example, wiring (Vdd wiring) connected to the positive power supply. The conductor A has the conductor width WYCA in the Y direction, and the conductor 1391B has the conductor width WYCB in the Y direction. The gap width GXC and the gap width GYC in FIG. 163C correspond to the minimum widths in the X direction and the Y direction between adjacent conductors.

The conductor 1391A has a shape in which all the rectangular conductors 1371A and the conductors 1382A arranged in the X direction in FIG. 163B are connected by the shortest path. The conductor 1391B has a shape in which all the rectangular conductors 1371B and the conductors 1382B arranged in the X direction in FIG. 163B are connected by the shortest path. Note that the conductor 1391A and the conductor 1391B do not need to have the shape connecting all the rectangular conductors arranged in the X direction in FIG. 163B by the shortest path, and may have a meander shape or a meandering shape, for example.

The conductor layer FIG. 163C has a configuration in which the conductor 1391A and the conductor 1391B are folded back and repeatedly arranged in the X direction with the conductor period FXC in the same region units as the conductor layer FIG. 163B.

The conductor layers C in FIGS. 163A, 163B, and, 163C have a mirror-symmetrical conductor arrangement in the X direction.

Other Modifications of Three-Layer Conductor Layer

In each of the above configuration examples, the conductor described as the wiring (Vss wiring) connected to the GND or the negative power supply, for example, may be the wiring (Vdd wiring) connected to the positive power supply, for example. The conductor described as the wiring (Vdd wiring) connected to the positive power supply, for example, may be the wiring (Vss wiring) connected to the GND or the negative power supply, for example. The voltage to be Vdd or Vss may be the GND and a power supply, or may be two types of power supplies having different voltages. The voltage to be Vdd or Vss should have two different polarities, but this is not the case. The number and the total area of the conductor vias (VIAs) extending in the Z direction and connecting the conductor layers A, B, and C are desirably the same between Vdd and Vss in a predetermined plane range (plane region), but this is not the case. When thinning out the relay conductors arranged in the gaps, a method other than the above-described method, for example, randomly thinning out the relay conductors may be adopted.

The conductor layer C is a conductor layer having a low sheet resistance in which the current easily flows, but may be a conductor layer having a high sheet resistance in which the current less easily flow. The conductor layer C is desirably, but is not limited to, not the conductor layer in which the current most uneasily flows among circuit boards, semiconductor substrates, and electronic devices. The conductor layer C is desirably, but is not limited to, the conductor layer in which the current most easily flows among circuit boards, semiconductor substrates, and electronic devices. The conductor layer C is desirably, but is not limited to, the conductor layer in which the current more easily flows than at least one of the conductor layer A or the conductor layer B. The conductor layer C is desirably, but is not limited to, the conductor layer in which the current easily flows next to the conductor layer A among circuit boards, semiconductor substrates, and electronic devices. The conductor layer C is desirably, but is not limited to, the conductor layer in which the current easily flows next to the conductor layer B among circuit boards, semiconductor substrates, and electronic devices. For example, the conductor layer C may be the conductor layer in which the current most uneasily flows in the first semiconductor substrate 101 or the second semiconductor substrate 102. For example, the conductor layer C may be the conductor layer in which the current most easily flows in the first semiconductor substrate 101 or the second semiconductor substrate 102. For example, the conductor layer C may be the conductor layer in which the current second-most easily flows in the first semiconductor substrate 101 or the second semiconductor substrate 102. For example, the conductor layer C may be the conductor layer in which the current third most easily flows in the first semiconductor substrate 101 or the second semiconductor substrate 102. For example, the conductor layer C may be the conductor layer in which the current easily flows next to the conductor layer A in the first semiconductor substrate 101 or the second semiconductor substrate 102. For example, the conductor layer C may be the conductor layer in which the current easily flows next to the conductor layer B in the first semiconductor substrate 101 or the second semiconductor substrate 102.

Note that the above-described conductor layer in which the current easily flows among circuit boards, semiconductor substrates, and electronic devices may be considered to be any of a conductor layer in which the current easily flows among the circuit boards, a conductor layer in which the current easily flows among the semiconductor substrates, or a conductor layer in which the current easily flows among the electronic devices. Note that the above-described conductor layer in which the current less easily flows among circuit boards, semiconductor substrates, and electronic devices may be considered to be any of a conductor layer in which the current less easily flows among the circuit boards, a conductor layer in which the current less easily flows among the semiconductor substrates, or a conductor layer in which the current less easily flows among the electronic devices. Furthermore, even if the conductor layer in which the current easily flows is a conductor layer having a low sheet resistance, and the conductor layer in which the current less easily flows is a conductor layer having a high sheet resistance, thereby can be replaced with each other.

As the conductor material used for the conductor layer C, a metal such as copper, aluminum, tungsten, chromium, nickel, tantalum, molybdenum, titanium, gold, silver, or iron, or a mixture, a compound, or an alloy containing at least one of the aforementioned metals, is mainly used. Furthermore, a semiconductor such as silicon, germanium, a compound semiconductor, or an organic semiconductor may be included. Moreover, an insulator such as cotton, paper, polyethylene, polyvinyl chloride, natural rubber, polyester, epoxy resin, melamine resin, phenol resin, polyurethane, synthetic resin, mica, asbestos, glass fiber, or porcelain may be included. Furthermore, the conductor layer C may be an uppermost layer metal or a lowest layer metal, that is, an uppermost layer or a lowest layer conductor layer, or may be a conductor layer used for similar metal bonding such as Cu—Cu bonding, Au—Au bonding, or Al—Al bonding, or dissimilar metal bonding such as Cu—Au bonding, Cu—Al bonding, or Au—Al bonding.

The plane arrangement of each of the conductor layers A to C may be reversed in the X direction or in the Y direction. Furthermore, the plane arrangement may be rotated clockwise by a predetermined angle (for example, 90 degrees) or counterclockwise by a predetermined angle (for example, −90 degrees). Furthermore, some of the above-described configuration examples have been described using the example in which all the conductor periods, conductor widths, and gap widths are uniform. However, this is not the case. For example, the conductor period, the conductor width, and the gap width may be non uniform, or the conductor period, the conductor width, and the gap width may be modulated depending on a position. Furthermore, some of the above-described configuration examples have been described using the example in which the conductor periods, conductor widths, gap widths, wiring shapes, wiring positions, the numbers of wirings, and the like are substantially the same in the Vdd wiring and the Vss wiring. However, this is not the case. For example, the Vdd wiring and the Vss wiring may have different conductor periods, different conductor widths, different gap widths, different wiring shapes, or different wiring positions. The wiring position may be shifted or misaligned, and the number of wirings may be different.

13. Application

The technology according to the present disclosure is not limited to the description of the above embodiments and its modifications or applications, and various modifications can be carried out. The above-described embodiments and the modifications or applications thereof may be omitted in part, the part or the whole may be changed, the part or the whole may be altered, the part may be replaced with another configuration element, or another configuration element may be added to the part or the whole. Furthermore, a part or the whole of the configuration elements in the above-described embodiments and the modifications or applications thereof may be divided into a plurality of elements, the part or the whole may be separated into a plurality of elements, or at least some of the plurality of divided or separated configuration elements may have different functions or characteristics. Moreover, at least some of the configuration elements in the above-described embodiments and the modifications or applications thereof may be combined to form a different embodiment. Moreover, at least some of the configuration elements in the above-described embodiments and the modifications or applications thereof may be moved to form a different embodiment. Moreover, a coupling element or a relay element may be added to at least some of the configuration elements in the above-described embodiments and the modifications or applications thereof to form a different embodiment. Moreover, a switching element or a switching function may be added to at least some of the configuration elements in the above-described embodiments and the modifications or applications thereof to form a different embodiment.

In the solid-state imaging device 100 of the present embodiment, the conductors forming the conductor layers A and B, which can be the Aggressor conductor loops, are the Vdd wiring or the Vss wiring. That is, the currents flow in the directions opposite to each other in at least some regions in the conductor layers A and B. When the current flows downward in the figure in the conductor layer A, the current flows upward in the figure in the conductor layer B. Note that the magnitudes of the currents are desirably the same as each other. Note that the description has been given using the example in which the conductors forming the conductor layers A and B are configured in the second semiconductor substrate, but this is not the case. For example, the conductors may be configured in the first semiconductor substrate, or some or all of the conductors may be configured in somewhere other than the second semiconductor substrate.

As the signal flowing through the conductor layers A and B, any signal other than Vdd and Vss may flow as long as the signal is a differential signal whose current direction changes in the time direction. That is, it is sufficient that a signal with a current I that changes according to a time t (a minute current change in a minute time dt is dI) flows through the conductor layers A and B. Note that even if a DC current is basically flowing through the conductor layers A and B, if there is a rising current, a time transition of the current, a falling current, or the like, the current I changes according to the time t.

For example, the magnitude of the current flowing through the conductor layer A and the magnitude of the current flowing through the conductor layer B do not have to be the same. On the contrary, the magnitude of the current flowing through the conductor layer A and the magnitude of the current flowing through the conductor layer B may be made the same (currents that change with time flow through the conductor layers A and B at substantially the same timing). In general, the magnitude of the induced electromotive force generated in the Victim conductor loop can be more suppressed in the case where the currents that change with time flow through the conductor layers A and B at substantially the same timing than the case where the magnitude of the current flowing through the conductor layer A and the magnitude of the current flowing through the conductor layer B are not the same. Meanwhile, the signals flowing through the conductor layers A and B do not have to be differential signals. For example, both may be Vdd wiring, both Vss wiring, both GND wiring, the same type of signal line, different types of signal lines, or the like. Furthermore, the conductors forming the conductor layers A and B may be conductors that are not connected to a power supply or a signal source. In these cases, the effect of suppressing the inductive noise is reduced, but other effects of the invention can be obtained.

Furthermore, a frequency signal having a predetermined frequency, such as a clock signal, may flow through the conductor layers A and B. Furthermore, for example, an AC power supply current may flow through the conductor layers A and B. Furthermore, for example, the same frequency signal may flow through the conductor layers A and B. Furthermore, signals including a plurality of frequency components may flow through the conductor layers A and B. Meanwhile, a DC signal with the current I that does not change at all may flow according to the time t. In this case, the effect of suppressing the inductive noise cannot be obtained, but other effects of the invention can be obtained. Meanwhile, the signal may be caused not to flow. In this case, the effects of inductive noise suppression, capacitive noise suppression, and voltage drop (IR-Drop) reduction cannot be obtained, but other effects of the invention can be obtained.

14. Shift Configuration Example of Reticulated Conductor

First Shift Configuration Example of Reticulated Conductor

By the way, in the above-described conductor layers A and B, some configuration examples adopting the reticulated conductors have been proposed.

In the conductor layers C in FIGS. 163A, 163B, and, 163C, the capacitive noise can be completely canceled in the Y direction and partially canceled in the X direction. The capacitive noise can be significantly improved as the conductor layer C is closer to the wiring layer 170. Although some specific examples have been described, the first to fourteenth configuration examples or the modifications thereof (FIGS. 122A, 122B, 122C, 122D, 122E, 122F, 123A, 123B, 123C, 123D, 123E, 123F, 124A, 124B, 124C, 124D, 124E, 124F, 125A, 125B, 125C, 125D, 125E, 125F, 126A, 126B, 126C, 126D, 126E, 126F, 127A, 127B, 127C, 127D, 127E, 127F, 128A, 12813, 128C, 128D, 128E, 128F, 129A, 129B, 129C, 129D, 129E, 129F, 130A, 130B, 130C, 130D, 130E, 130F, 131A, 131B, 131C, 131D, 131E, 131F, 132A, 132B, 132C, 132D, 132E, 132F, 133A, 133B, 133C, 133D, 133E, 133F, 134A, 134B, 134C, 134D, 134E, 134F, 135A, 135B, 135C, 135D, 135E, 135F, 136A, 136B, 136C, 136D, 136E, 136F, 137A, 137B, 137C, 137D, 137E, 137F, 138A, 138B, 138C, 138D, 138E, 138F, 139A, 139B, 139C, 139D, 139E, 139F, 140A, 140B, 140C, 140D, 140E, 140F, 141A, 141B. C, 141D, 141E, 141F, 142A, 142B, 142C, 142D, 142E, 142F, 143A, 143B, 143C, 143D, 143E, 143F, 144A, 144B, 144C, 144D, 144E, 144F, 145A, 145B, 145C, 145D, 145E, 145F, 146A, 14613, 146C, 146D, 146E, 146F, 147A, 147B, 147C, 147D, 147E, 147F, 148A, 14813, 148C, 148D, 148E, 148F, 149A, 149B, 149C, 149D, 149E, 149F, 150A, 150B, 150C, 150D, 150E, 150F, 151A, 151B, 151C, 151D, 151E, 151F, 152A, 152B, 152C, 152D, 152E, 152F, 153A, 153B, 153C, 153D, 153E, 153F, 154A, 15413, 154C, 154D, 154E, 154F, 155A, 155B, 155C, 155D, 155E, 155F, 156A, 156B, 156C, 156D, 156E, 156F, 157A, 157B, 157C, 157D, 157E, 157F, 158A, 158B, 158C, 158D, 158E, 158F, 159A, 159B, 159C, 159D, 159E, 159F, 160A, 160B, 160C, 160D, 160E, 160F, 161A, 161B, 161C, 161D, 161E, 161F, 162A, 162B, 162C, 162D, 162E, 162F, 163A, 163B, 163C, 163D, 163E and 163F) are particularly suitable for the stacking order in which the three layers of the conductor layers A to C can be electrically connected via the conductor via (VIA) or the like extending in the Z direction. Specifically, the configuration examples and the modifications thereof illustrated in FIGS. 122A, 122B, 122C, 122D, 122E, 122F, 123A, 123B, 123C, 123D, 123E, 123F, 124A, 124B, 124C, 124D, 124E, 124F, 125A, 125B, 125C, 125D, 125E, 125F, 126A, 126B, 126C, 126D, 126E, 126F, 127A, 127B, 127C, 127D, 127E, 127F, 134A 134B, 134C, 134D, 134E, 134F, 148A, 14813, 148C, 148D, 148E, 148F, 149A, 149B, 149C, 149D, 149E, 149F, and 152A, 152B, 152C, 152D, 152E, 152F, 153A, 153B. 153C, 153D, 153E, 153F, 154A, 154B, 154C, 154D, 154E, 154F, 155A, 155B, 155C, 155D, 155E, 155F, 156A, 156B, 156C, 156D, 156E, 156F, 157A, 157B, 157C, 157D, 157E, 157F, 158A, 158B, 158C, 158D, 158E, 158F, 159A, 159B, 159C, 159D, 159E, 159F, 160A, 160B, 160C, 160D, 160E, 160F, 161A, 161B, 161C, 161D, 161E, 161F, 162A, 162B, 162C, 162D, 162E, 162F, 163A, 163B, 163C, 163D, 163E and 163F are suitable for the stacking order illustrated in FIG. 120B. Furthermore, the configuration examples and the modifications thereof illustrated in FIGS. 150A, 150B, 150C, 150D, 150E, and 150F are suitable for the stacking orders illustrated in FIGS. 120A and 120B. Furthermore, the configuration examples and modifications thereof illustrated in FIGS. 129A, 129B, 129C, 129D, 129E, 129F, 131A, 131B, 131C, 131D, 131E, 131F, 133A, 133B, 133C, 133D, 133E, 133F, 135A, 135B, 135C, 135D, 135E, 135F, 136A, 136B, 136C, 136D, 136E, 136F, 137A, 137B, 137C, 137D, 137E, 137F, 138A, 138B, 138C, 138D, 138E, 138F, 140A, 140B, 140C, 140D, 140E, 140F, 142A, 142B, 142C, 142D, 142E, 142F, 143A, 143B, 143C, 143D, 143E, 143F, 144A, 144B, 144C, 144D, 144E, 144F, 146A, 14613, 146C, 146D, 146E, 146F, 147A, 147B, 147C, 147D, 147E, 147F, 151A, 151B, 151C, 151D, 151E, and F are suitable for the stacking orders illustrated in FIGS. 120B and 120C. Furthermore, the configuration examples and modifications thereof illustrated in FIGS. 128A, 128B, 128C, 128D, 128E, 128F, 130A, 130B, 130C, 130D, 130E, 130F, 132A, 132B, 132C, 132D, 132E, 132F, 139A, 139B, 139C, 139D, 139E, 139F, 141A, 141B, 141C, 141D, 141E, 141F, 145A, 145B, 145C, 145D, 145E, and 145F are suitable for the stacking orders illustrated in FIGS. 120A, 120B, and 120C.

For example, in the second configuration example illustrated in FIGS. 15A 15B, and 15C, the conductor layer A including the reticulated conductor 216 and the conductor layer B including the reticulated conductor 217 have been described. In the fourth configuration example illustrated in FIGS. 25A, 25B, and 25C, the conductor layer A including the reticulated conductor 231 and the conductor layer B including the reticulated conductor 232 have been described.

Furthermore, the configuration examples in which the relay conductor is arranged within the gap region of the reticulated conductor have been proposed.

For example, in the eighth configuration example illustrated in FIGS. 32A 32B, and 32C, the conductor layer A including the reticulated conductor 271 and the conductor layer B including the reticulated conductor 272 and the relay conductor 302 have been described. The relay conductor 302 is a non-reticulated conductor arranged in the gap region that is not the conductor of the reticulated conductor 272. The number of relay conductors arranged in the gap region of the reticulated conductor is not limited to one. For example, a plurality of relay conductors 306 of the conductor layer FIG. 40B may be arranged.

Moreover, for example, as in the fourth configuration example of the three-layer conductor layer illustrated in FIGS. 128A, 128B, 128C, 128D, 128E, and 128F, each of the conductor layer A and the conductor layer B has the relay conductor.

The wiring pattern in which the reticulated conductor is repeated to the same position in the XY direction has a disadvantage in terms of capacitive noise.

Specifically, for example, as illustrated on the left side in FIG. 164, there is a conductor layer 1511 including a reticulated conductor 1501 and a relay conductor 1502 arranged in the gap region of the reticulated conductor 1501. The reticulated conductor 1501 is, for example, wiring (Vss wiring) connected to the GND or the negative power supply. The relay conductor 1502 is, for example, wiring (Vdd wiring) connected to the positive power supply.

Wiring 1512, which constitutes a part of the Victim conductor loop, is arranged in an upper or lower layer of the conductor layer 1511 including the reticulated conductor 1501 and the relay conductor 1502. The wiring 1512 corresponds to, for example, the signal line 132 and the control line 133 of the solid-state imaging device 100.

The signal line 132 is wired longer in the Y direction than in the X direction, and a plurality of signal lines 132 is periodically arranged in the pixel array 121 with a predetermined periodic width (for example, in pixel units). When the signal line 132 is selected by the select transistor 145 of each pixel 131, a signal is transmitted. The control line 133 is wired longer in the X direction than in the Y direction, and a plurality of control lines 133 is periodically arranged in the pixel array 121 with a predetermined periodic width (for example, in pixel units). When the control line 133 is selected by the vertical scanning unit 123, a signal is transmitted.

When the Vdd wiring and the Vss wiring are integrated with a part where the reticulated conductor 1501 and the relay conductor 1502 of the conductor layer 1511 affect a linear conductor that is long in the Y direction, like the wiring 1512, that is, linearly in the Y direction to overlap with the wiring 1512, the total charge amount by Vdd and the total charge amount by Vss are significantly different as illustrated on the right side in FIG. 164. The difference between the positive capacitance due to the Vdd wiring and the negative capacitance due to the Vss wiring generates the capacitive noise.

The capacitive noise refers to, as described with reference to FIGS. 62A, 62B, and 62C and the like, generation of a voltage in wiring by capacitive coupling between a conductor that forms a conductor layer and wiring in a case where a voltage is applied to the conductor, and occurrence of voltage noise in the wiring as the applied voltage changes. This voltage noise becomes noise of the pixel signal.

To reduce the noise, a conductor layer to which a predetermined amount of shift is set in a direction orthogonal to a longitudinal direction of the wiring 1512 that constitutes a part of the Victim conductor loop, like the conductor layer 1611 on the left side in FIG. 165, has been conceived by the inventors of the present application.

The conductor layer 1611 includes a reticulated conductor 1601 and a relay conductor 1602 arranged in the gap region of the reticulated conductor 1601. The reticulated conductor 1601 is, for example, wiring (Vss wiring) connected to the GND or the negative power supply. The relay conductor 1602 is, for example, wiring (Vdd wiring) connected to the positive power supply.

In the case of providing the predetermined amount of shift in the direction orthogonal to the longitudinal direction of the wiring 1512 in this way, when the Vdd wiring and the Vss wiring are linearly integrated in the Y direction, the total charge amount by Vdd and the total charge amount by Vss can be made substantially the same, as illustrated on the right side in FIG. 165. Furthermore, the polarities of the voltages of the reticulated conductor 1601 and the relay conductor 1602 are opposite (opposite polarities) between Vdd and Vss. Therefore, according to the conductor layer 1611, the capacitive noise in the wiring 1512 as a Victim conductor can be canceled. In the case where the Vdd wiring and the Vss wiring of Y-direction integration match, the capacitive noise can be completely canceled.

Hereinafter, a configuration example of reducing the capacitive noise, favorably completely canceling the capacitive noise, by providing a predetermined amount of shift in the direction orthogonal to the longitudinal direction of a Victim conductor in a conductor layer of a reticulated conductor, will be described.

First, the conductor widths and gap widths of the reticulated conductor 1601 and the relay conductor 1602 constituting the conductor layer 1611 as a first configuration example of the reticulated conductor provided with an amount of shift (a first shift configuration example of the reticulated conductor) will be described with reference to FIG. 166.

The reticulated conductor 1601 has a conductor width WDX and a gap width GDX in the X direction, and is a repeating pattern of the conductor width WDX and the gap width GDX with a periodic width FDX (=the conductor width WDX+the gap width GDX). Furthermore, in the Y direction, the reticulated conductor 1601 has a conductor width WDY and a gap width GDY, and is a repeating pattern of the conductor width WDY and the gap width GDY with a periodic width FDY (=the conductor width WDY+the gap width GDY). Note that, in the reticulated conductor 1601, the conductor arrangement with the conductor width WDX and the gap width GDX in the X direction is shifted in the X direction by a predetermined amount of shift PDX every time the periodic width FDY in the Y direction is repeated. The amount of shift PDX in the X direction in units of the periodic width FDY is hereinafter also referred to as a periodic shift PDX.

The relay conductor 1602 is arranged in the gap region with the gap width GDX in the X direction and the gap width GDY in the Y direction of the reticulated conductor 1601. The relay conductor 1602 is a rectangle having a conductor width CDX in the X direction and a conductor width CDY in the Y direction, and is a vertically long rectangle in which the conductor width CDY in the Y direction is larger than the conductor width CDX in the X direction (CDY>CDX).

One end face of the relay conductor 1602 in the X direction is separated from the reticulated conductor 1601 by a first gap width GDX1, and the other end face in the X direction is separated from the reticulated conductor 1601 by a second gap width GDX2. The gap width GDX in the X direction of the reticulated conductor 1601 is equal to the sum of the conductor width CDX in the X direction of the relay conductor 1602, the first gap width GDX1, and the second gap width GDX2. That is, GDX=CDX+GDX1+GDX2.

One end face of the relay conductor 1602 in the Y direction is separated from the reticulated conductor 1601 by a first gap width GDY1, and the other end face in the Y direction is separated from the reticulated conductor 1601 by a second gap width GDY2. The gap width GDY in the Y direction of the reticulated conductor 1601 is equal to the sum of the conductor width CDY in the Y direction of the relay conductor 1602, the first gap width GDY1, and the second gap width GDY2. That is, GDY=CDY+GDY1+GDY2.

Here, the magnitude relationship of the conductor width and the gap width between the reticulated conductor 1601 and the relay conductor 1602 is defined as follows.

As illustrated in FIG. 166, where A is an arbitrary real number, the conductor width WDX in the X direction and the conductor width WDY in the Y direction of the reticulated conductor 1601 are widths of 2A. In other words, the real number A is ½ of the conductor width WDX in the X direction and the conductor width WDY in the Y direction of the reticulated conductor 1601. Furthermore, the first gap width GDX1 and the second gap width GDX2 in the X direction are also 2A.

The conductor width CDX in the X direction of the relay conductor 1602 is set to 6A, and the conductor width CDY in the Y direction is set to 7A. The first gap width GDY1 and the second gap width GDY2 in the Y direction are set to 1A.

Therefore, the periodic width FDX (=the conductor width WDX+the gap width GDX) corresponds to 12A and the periodic width FDY (=the conductor width WDY+the gap width GDY) corresponds to 11A when expressed using the arbitrary real number A.

FIGS. 167A, 167B, 167C, 167D, 168A, 168B, and 168C are plan views of the conductor layer 1611 in which the periodic shift PDX is set to various values.

Figures 167A, 167B, 167C, 167D:
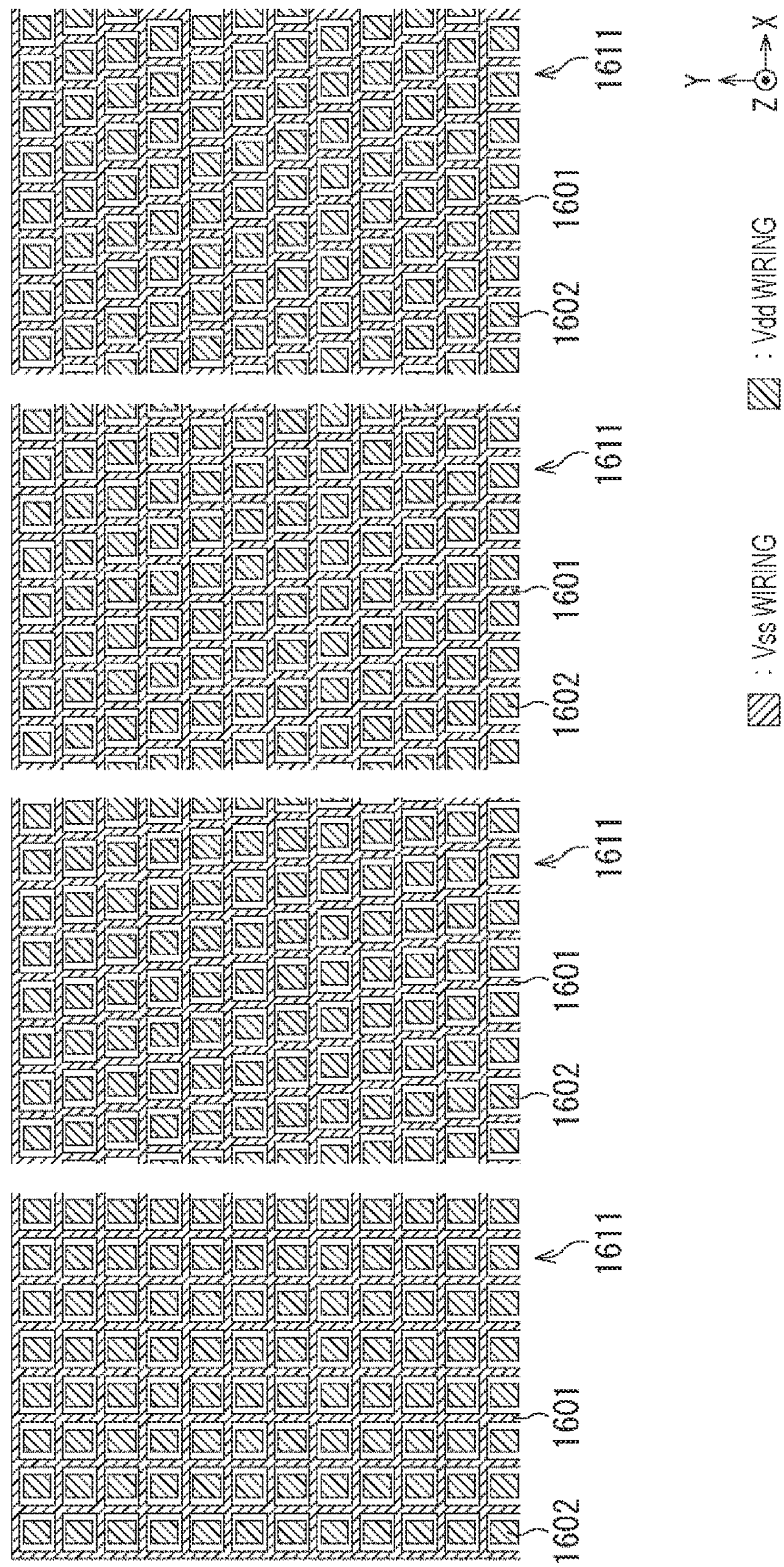

FIG. 167A is a plan view of the conductor layer 1611 in which the periodic shift PDX is set to zero. Note that the conductor layer 1611 in which the periodic shift PDX is set to zero corresponds to the reticulated conductor 1501 in FIG. 164.

FIG. 167B is a plan view of the conductor layer 1611 in which the periodic shift PDX in the X direction is set to 1A, that is, 1/12 of the repetition period (periodic width FOX) in the X direction.

FIG. 167D is a plan view of the conductor layer 1611 in which the periodic shift PDX is set to 2A, that is, 2/12 of the repetition period (periodic width FDX) in the X direction.

FIG. 167D is a plan view of the conductor layer 1611 in which the periodic shift PDX is set to 3A, that is, 3/12 of the repetition period (periodic width FDX) in the X direction.

FIG. 168A is a plan view of the conductor layer 1611 in which the periodic shift PDX is set to 4A, that is, 4/12 of the repetition period (periodic width FDX) in the X direction.

FIG. 168B is a plan view of the conductor layer 1611 in which the periodic shift PDX is set to 5A, that is, 5/12 of the repetition period (periodic width FDX) in the X direction.

FIG. 168C is a plan view of the conductor layer 1611 in which the periodic shift PDX is set to 6A, that is, 6/12 of the repetition period (periodic width FDX) in the X direction.

FIG. 169 is a graph illustrating theoretical values of the capacitive noise of the conductor layer 1611 in which the periodic shift PDX is set to various values as illustrated in FIGS. 167A, 167B, 167C, 167D, 168A, 168B, and 168C.

The horizontal axis of FIG. 169 represents coordinates indicating the position of the conductor layer 1611 in the X direction, and the vertical axis represents the capacitive noise of the Vdd wiring and the Vss wiring at each X position. Note that it is assumed that absolute values of the applied voltage of the Vdd wiring (Vdd applied voltage) and the applied voltage of the Vss wiring (Vss applied voltage) are the same. For example, a case in which the Vdd applied voltage is +1 V and the Vss applied voltage is −1 V is assumed.

As illustrated in FIG. 169, in a case where the periodic shift PDX is a predetermined value, the amount of change in the capacitive noise is zero and the absolute value of the capacitive noise is zero. More specifically, in a case where the periodic shift PDX is set to 1/12, 2/12, or 5/12 of the repetition period in the X direction, the amount of change in the capacitive noise is zero and the absolute value of the capacitive noise is zero.

In a case of another periodic shift PDX, specifically, in a case where the periodic shift PDX is 3/12, 4/12, or 6/12 of the repetition period in the X direction, the amount of change in the capacitive noise and the absolute value are not zero, but the change in the amount of change in the capacitive noise can be made smaller than a case where the periodic shift PDX is zero, that is, in a case of no periodic shift.

FIG. 170 is a graph illustrating theoretical values of the capacitive noise in a case where the periodic shift PDX is set to various values in the conductor layer 1611 from which the relay conductor 1602 is omitted. Although illustration of the conductor layer 1611 from which the relay conductor 1602 is omitted is omitted, it corresponds to each of the conductor layers 1611 in FIGS. 167A, 167B, 167C, 167D, 168A, 168B, and 168C from which the relay conductor 1602 is removed.

In the absence of the relay conductor 1602, the absolute value of the capacitive noise is not zero, as illustrated in FIG. 170, but the amount of change in the capacitive noise is zero in a case where the periodic shift PDX is a predetermined value. The amount of shift at which the amount of change in the capacitive noise becomes zero is the same as the case where the relay conductor 1602 is present. That is, in a case where the periodic shift PDX is set to 1/12, 2/12, or 5/12 of the repetition period in the X direction, the amount of change in the capacitive noise is zero. In a case of another periodic shift PDX, specifically, in a case where the periodic shift PDX is 3/12, 4/12, or 6/12 of the repetition period in the X direction, the amount of change in the capacitive noise is not zero, but the change in the amount of change in the capacitive noise can be made smaller than a case where the periodic shift PDX is zero, that is, in a case of no periodic shift.

When the following conditions are satisfied, the amount of change in the capacitive noise becomes zero according to the graphs in FIGS. 169 and 170.

First, as a premise, the periodic shift PDX is set to a value different from the periodic width FDX (=12A) in the X direction of the reticulated conductor 1601.

In a case where the periodic shift PDX is 2A, that is, the periodic shift PDX is the same as the conductor width WDX in the X direction of the reticulated conductor 1601, the amount of change in the capacitive noise becomes zero. Furthermore, the amount of change in the capacitive noise becomes zero in a case where the periodic shift PDX is 1A and in a case where the periodic shift PDX is 5A.

In a case where the periodic shift PDX is 1A or 5A, the amount of change in the capacitive noise becomes zero in units of twelve rows. Meanwhile, in a case where the periodic shift PDX is 2A, the amount of change in the capacitive noise becomes zero in units of six rows. In a case where the periodic shift PDX is equal to the conductor width WDX of the reticulated conductor 1601, the amount of change in the capacitive noise can be made zero with a small number of rows. Therefore, the degree of freedom in the wiring layout can be increased.

In a case where the periodic shift PDX is different from the repetition period of 3/12 (=3A) in the X direction of the reticulated conductor 1601, in other words, in a case where the periodic shift PDX is not the periodic width FDX (=12A)=4, the amount of change in the capacitive noise becomes zero.

In a case where the periodic shift PDX is different from the repetition period of 4/12 (=4A) in the X direction of the reticulated conductor 1601, in other words, in a case where the periodic shift PDX is not the periodic width FDX (=12A)=3, the amount of change in the capacitive noise becomes zero.

In a case where the periodic shift PDX is different from the repetition period of 6/12 (=6A) in the X direction of the reticulated conductor 1601, in other words, in a case where the periodic shift PDX is not the periodic width FDX (=12A)=2, the amount of change in the capacitive noise becomes zero.

In the presence of the relay conductor 1602, not only the amount of change in the capacitive noise becomes zero but also the absolute value of the capacitive noise can be made zero. In the absence of the relay conductor 1602, the amount of change in the capacitive noise is zero, but the absolute value of the capacitive noise is not zero.

Furthermore, the effect of improving the capacitive noise is greater in the presence of the relay conductor 1602 than the absence of the relay conductor 1602.

In FIGS. 167A, 167B, 167C, 167D, 168A, 168B, 169 and 170, the examples in which the periodic shift PDX is shifted in the positive direction of the X axis until the periodic shift PDX becomes 6A, which is half of the periodic width FDX (=12A), have been described. The same applies to a case where the periodic shift PDX is shifted in the negative direction of the X axis. More specifically, the capacitive noise in the case where the periodic shift PDX is shifted in the negative direction of the X axis by 1A, 2A, 3A, 4A, 5A, and 6A is similar to theoretical values of the capacitive noise in the case where the periodic shift PDX is shifted in the positive direction of the X axis by 1A, 2A, 3A, 4A, 5A, and 6A in FIGS. 169 and 170.

Furthermore, the capacitive noise in the case where the periodic shift PDX is shifted in the positive direction of the X axis by 7A, 8A, 9A, 10A, and 11A is similar to theoretical values of the capacitive noise in the case where the periodic shift PDX is shifted in the negative direction of the X axis by 5A, 4A, 3A, 2A, and 1A in FIGS. 169 and 170. In other words, the capacitive noise in the case where the periodic shift PDX is shifted in the positive direction of the X axis by 7A, 8A, 9A, 10A, and 11A is similar to theoretical values of the capacitive noise in the case where the periodic shift PDX is shifted in the positive direction of the X axis by 5A, 4A, 3A, 2A, and 1A.

Furthermore, the capacitive noise in the case where the periodic shift PDX is shifted in the positive direction of the X axis by 13A, 14A, 15A, 16A, 17A, and 18A is similar to theoretical values of the capacitive noise in the case where the periodic shift PDX is shifted in the positive direction of the X axis by 1A, 2A, 3A, 4A, 5A, and 6A in FIGS. 169 and 170. The same applies in the case where the periodic shift PDX is shifted in the negative direction of the X axis by 13A, 14A, 15A, 16A, 17A, and 18A.

According to the conductor layer 1611 that is the first shift configuration example of the reticulated conductor, the amount of change in the capacitive noise can be made smaller than the case where the periodic shift PDX is zero, that is, in the case of no periodic shift by providing the periodic shift PDX in the X direction. Moreover, in a case where the periodic shift PDX satisfies a predetermined condition, such as a case where the periodic shift PDX is set to be the same as the conductor width WDX in the X direction of the reticulated conductor 1601, for example, the amount of change in the capacitive noise can be made zero.

Moreover, in a case where the relay conductor 1602 is provided in the gap region of the reticulated conductor 1601, the absolute value of the capacitive noise can be made zero in the case where the amount of change in the capacitive noise is zero.

In a case where the following three conditions are satisfied, both the amount of change in the capacitive noise and the absolute value can be zero, that is, the capacitive noise can be completely canceled. The following conditions are referred to as first to third conditions of complete offset.

1. The area of the Vdd conductor within a predetermined range=the area of the Vss conductor within the predetermined range (The conductor width CDX)×(the conductor width CDY)={(the conductor width CDY)+(the first gap width GDY1)+(the second gap width GDY2)}×(the conductor width WDX)+(the conductor width CDX)+(the first gap width GDX1)+(the second gap width GDX2)×(the conductor width WDY)+(the conductor width WDX)×(the conductor width WDY)

2. (The conductor width CDY)×{the minimum number of rows−{(the conductor width WDX)+(the first gap width GDX1)+(the second gap width GDX2)}÷the conductor width WDX}=(the conductor width WDY)×the minimum number of rows+(the conductor width CDY)+(the first gap width GDY1)+(the second gap width GDY2)

3. The periodic shift PDX×the number of offset rows=an integer N×{(the conductor width WDX)+(the first gap width GDX1)+(the conductor width CDX)+(the second gap width GDX2)}

The first condition of complete offset means that the conductive area of the reticulated conductor 1601 within the predetermined range match the conductive area of the relay conductor 1602 within the predetermined range, but the match may not be the exact match and the conductive areas may be substantially the same. Substantially the same means that the conductive areas match within a predetermined range (error) that can be regarded as the same. The minimum number of rows in the second condition represents the minimum number of rows of the reticulated conductor 1601 in which the capacitive noise can be completely canceled in the case where the periodic shift PDX is the conductor width WDX. With some exceptions, there is a condition in which the capacitive noise can be completely canceled in a case where the number of rows of the reticulated conductor 1601 is an integral multiple of the minimum number of rows. Since the second condition can be transformed into "the minimum number of rows={(the first gap width GDY1)+(the second gap width GDY2)+(the conductor width CDY)+(the conductor width CDY)×{(the conductor width WDX)+(the first gap width GDX1)+(the second gap width GDX2)}÷the conductor width WDX}÷{(the conductor width CDY)−(the conductor width WDY)}", the minimum number of rows can be calculated, and since the left side of the formula (the minimum number of rows) is an integer value, the right side of the formula is also an integer value. Note that the second condition is derived from the fact that the complete offset can be performed in the case where the sum of the conductor lengths in the Y direction of the reticulated conductor 1601 in the predetermined range matches the sum of the conductor lengths in the Y direction of the relay conductor 1602 within the predetermined range. That is, it is desirable that the sum of the conductor lengths in the Y direction of the reticulated conductor 1601 in the predetermined range and the sum of the conductor lengths in the Y direction of the relay conductor 1602 within the predetermined range are the same or substantially the same regardless of the minimum number of rows. The number of offset rows in the third condition represents the number of rows of the reticulated conductor 1601 in which the capacitive noise can be completely canceled. The integer N in the third condition represents a condition in which the capacitive noise can be completely canceled. With some exceptions, the number of offset rows is an integer, and in the case where "the periodic shift PDX×the number of offset rows" becomes an integral multiple (N times) of "(the conductor width WDX)+(the first gap width GDX1)+(the conductor width CDX)+(the second gap width GDX2), that is, in the case where "the periodic shift PDX×the number of offset rows" becomes an integral multiple (N times) of the periodic width FDX, there is a condition in which the capacitive noise can be completely canceled. In other words, it is desirable that the sum of the periodic shift PDX of the number of offset rows (the periodic shift PDX×the number of offset rows) and the integral multiple (N times) of the periodic width FDX becomes the same or substantially the same. Furthermore, although there may be some exceptions, there is a condition that the capacitive noise can be completely canceled in the case where the number of offset rows becomes an integral multiple of the minimum number of rows. Furthermore, the capacitive noise can be completely offset in a case where the number of rows of the reticulated conductor 1601 is the number of rows obtained by multiplying the number of offset rows by an integer. Note that it is conceivable that it is necessary to satisfy at least the first condition in order to completely cancel the capacitive noise. However, there are some cases where at least part of the capacitive noise can be canceled in a case where at least one of the second condition or the third condition is satisfied among the first to third conditions. Therefore, at least only part of the first to third conditions may be satisfied. Furthermore, in that case, the minimum number of rows or the number of offset rows may be interpreted as the number of rows of the reticulated conductor 1601.

By providing the periodic shift PDX to some extent, the effect of improving the capacitive noise can be increased even in the case where the amount of change in the capacitive noise is not zero.

Note that, in the above-described first shift configuration example, the absolute values of the Vdd applied voltage and the Vss applied voltage are the same, but the absolute values do not necessarily have to be the same. For example, the Vdd applied voltage may be a positive power supply (+1V) and the Vss applied voltage may be the GND (0 V). Even in the case where the absolute values of the Vdd applied voltage and the Vss applied voltage are not the same, at least a part of the capacitive noise is canceled by providing the periodic shift PDX in the X direction, so that the effect of improving the capacitive noise is obtained. Furthermore, even if the Vdd applied voltage and the Vss applied voltage are not the same, the capacitive noise may be completely canceled when, for example, the current direction differs between the Vdd conductor and the Vss conductor (particularly in the opposite direction), and the capacitive noise caused by a change by the voltage drop (IR-Drop) has an opposite polarity between the Vdd conductor and the Vss conductor.

The reticulated conductor 1601 having the periodic shift PDX in the X direction will be defined with reference to FIG. 171.

The reticulated conductor 1601 can be divided into a plurality of conductors 1651 wired in the X direction, and a plurality of conductors 1652 wired in the Y direction between two adjacent conductors 1651.

The reticulated conductor 1601 includes a first conductor group 1661 including two or more conductors 1651 having the conductor width WDY (first conductor width) arranged in the Y direction (first direction) with the periodic width FDY (first periodic width) and a second conductor group 1662 including two or more conductors 1652 having the conductor width WDX (second conductor width) arranged in the periodic width FDX (second periodic width) in the X direction (second direction) orthogonal to the Y direction.

Moreover, the reticulated conductor 1601 includes a first moving body group 1663 arranged at a position obtained by moving at least a part (for example, all) of the second conductor group 1662 including the two or more conductors 1652 by a factor of 1 of the periodic width FDY in the Y direction and moving at least the part by a factor of 1 of the periodic shift PDX (third periodic width) in the X direction. Here, the periodic shift PDX and the periodic width FDX are different.

Furthermore, in a case where the reticulated conductor 1601 further includes an Mth moving body group 1663 (M=2, 3, 4, 5, . . . , L (L is an integer of 2 or larger)) arranged at a position to which at least a part (for example, all) of the second conductor group 1662 including two or more conductors 1652 is moved by a factor of M of the periodic width FDY in the Y direction, and is moved by a factor of M of the periodic shift PDX (third periodic width) in the X direction, the reticulated conductor 1601 becomes the reticulated conductor illustrated in FIG. 172.

Since the reticulated conductor 1601 has the configuration provided with the periodic shift PDX different from the periodic width FDX, as in FIGS. 171 and 172, the capacitive noise for the wiring (conductor) arranged at the position overlapping with at least a part of the reticulated conductor 1601 as viewed from the Z direction orthogonal to the X direction and the Y direction can be reduced or favorably completely canceled. Examples of the wiring include the signal lines 132 and the control lines 133 of the solid-state imaging device 100, as described with reference to FIGS. 164 and 165.

Modification of First Shift Configuration Example of Reticulated Conductor

FIGS. 173A, 173B, 174A, 174B, 175A, 175B, 176A, 176B, 177A, 177B, 178A, 178B, 179A, 179B, 180A, 180B, 181A and 181B illustrate various modifications of the first shift configuration example of the reticulated conductor.

Note that, in FIGS. 173A, 173B, 174A, 174B, 175A, 175B, 176A, 176B, 177A, 177B, 178A, 178B, 179A, 179B, 180A, 180B, 181A and 181B the periodic shift PDX is 2A, that is, the conductor width WDX of the reticulated conductor 1601. Furthermore, in the description of the various modifications in FIGS. 173A, 173B, 174A, 174B, 175A, 175B, 176A, 176B, 177A, 177B, 178A, 178B, 179A, 179B, 180A, 180B, 181A and 181B for the sake of simplicity, the first shift configuration example of the reticulated conductor illustrated in FIGS. 167A, 167B, 167C, 167D, 168A, 168B, and 168C are referred to as a basic configuration example of periodic shift, and only the parts different from the basic configuration example of periodic shift will be described.

FIG. 173A is a plan view illustrating a first modification of the first shift configuration example of the reticulated conductor.

The first modification in FIG. 173A is different from the basic configuration example of periodic shift in that arrangement of the relay conductor 1602 is changed to left shift in the gap region. In the basic configuration example of periodic shift, (the first gap width GDX1)=(the second gap width GDX2), whereas in the first modification, (the first gap width GDX1)<(the second gap width GDX2).

FIG. 173B is a plan view illustrating a second modification of the first shift configuration example of the reticulated conductor.

The second modification in FIG. 173B is different from the basic configuration example of periodic shift in that arrangement of the relay conductor 1602 is changed to right shift in the gap region. In the basic configuration example of periodic shift, (the first gap width GDX1)=(the second gap width GDX2), whereas in the second modification, (the first gap width GDX1)>(the second gap width GDX2).

FIG. 174A is a plan view illustrating a third modification of the first shift configuration example of the reticulated conductor.

The third modification in FIG. 174A is different from the basic configuration example of periodic shift in that arrangement of the relay conductor 1602 is changed to upper shift in the gap region. In the basic configuration example of periodic shift, (the first gap width GDY1)=(the second gap width GDY2), whereas in the third modification, (the first gap width GDY1)<(the second gap width GDY2).

FIG. 174B is a plan view illustrating a fourth modification of the first shift configuration example of the reticulated conductor.

The fourth modification in FIG. 174B is different from the basic configuration example of periodic shift in that arrangement of the relay conductor 1602 is changed to lower shift in the gap region. In the basic configuration example of periodic shift, (the first gap width GDY1)=(the second gap width GDY2), whereas in the fourth modification, (the first gap width GDY1)>(the second gap width GDY2).

FIG. 175A is a plan view illustrating a fifth modification of the first shift configuration example of the reticulated conductor.

The fifth modification in FIG. 175A is different from the basic configuration example of periodic shift in that arrangement of the relay conductor 1602 is changed to alternate arrangement of upper shift and lower shift for each column. The magnitude relationship between (the first gap width GDY1) and (the second gap width GDY2) in each of the upper shift and the lower shift is similar to that in the third modification and the fourth modification.

FIG. 175B is a plan view illustrating a sixth modification of the first shift configuration example of the reticulated conductor.

The sixth modification in FIG. 175B is different from the basic configuration example of periodic shift in that arrangement of the relay conductor 1602 is changed to alternate arrangement of upper shift and lower shift for each row and for each column. The magnitude relationship between (the first gap width GDY1) and (the second gap width GDY2) in each of the upper shift and the lower shift is similar to that in the third modification and the fourth modification.

Although not illustrated, alternate arrangement of right shift and left shift for each column, or alternate arrangement of right shift and left shift for each row and for each column is also similarly possible.

FIG. 176A is a plan view illustrating a seventh modification of the first shift configuration example of the reticulated conductor.

The seventh modification in FIG. 176A is different from the basic configuration example of periodic shift in that the arrangement of the relay conductor is changed to arrangement in which two rows forming a pair and in inner shift are repeated in the Y direction. The magnitude relationship between (the first gap width GDY1) and (the second gap width GDY2) in each of the upper shift and the lower shift is similar to that in the third modification and the fourth modification.

FIG. 176B is a plan view illustrating an eighth modification of the first shift configuration example of the reticulated conductor.

The eighth modification in FIG. 176B is different from the basic configuration example of periodic shift in that the arrangement of the relay conductor is changed to arrangement in which two rows forming a pair and in inner shift and outer shift for each two columns and for each two rows are repeated in the Y direction. The magnitude relationship between (the first gap width GDY1) and (the second gap width GDY2) in each of the upper shift and the lower shift is similar to that in the third modification and the fourth modification.

FIG. 177A is a plan view illustrating a ninth modification of the first shift configuration example of the reticulated conductor.

The ninth modification in FIG. 177A is different from the basic configuration example of periodic shift in that the relay conductor 1602 is evenly separated into two parts in a right-left direction. The separated two relay conductors are mirror-symmetrically arranged in the separation direction (X direction).

FIG. 177B is a plan view illustrating a tenth modification of the first shift configuration example of the reticulated conductor.

The tenth modification in FIG. 177B is different from the basic configuration example of periodic shift in that the relay conductor 1602 is separated into two parts in the right-left direction, and arrangements of the two parts in the up-down direction (Y direction) are different.

FIG. 178A is a plan view illustrating an eleventh modification of the first shift configuration example of the reticulated conductor.

The eleventh modification in FIG. 178A is different from the basic configuration example of periodic shift in that the relay conductor 1602 is unevenly separated into two parts in the right-left direction. In the eleventh modification in FIG. 178A, the left part of the separated two parts is larger than the right part, but a configuration in which the right part is larger than the left part can also be adopted. Furthermore, a configuration in which the relay conductor 1602 is unevenly separated into two parts in the up-down direction can also be adopted.

FIG. 178B is a plan view illustrating a twelfth modification of the first shift configuration example of the reticulated conductor.

The twelfth modification in FIG. 178B is different from the basic configuration example of periodic shift in that the relay conductor 1602 is divided into two parts without being separated in the right-left direction, and shifted in the up-down direction In the twelfth modification in FIG. 178B, the left part is shifted upward and the right part is shifted downward, of the right and left two parts shifted in the up-down direction. However, a configuration in which the right part is shifted upward and the left part is shifted downward can also be adopted. Furthermore, a configuration in which the two parts are shifted in the right-left direction from the center in the up-down direction can also be adopted.

FIG. 179A is a plan view illustrating a thirteenth modification of the first shift configuration example of the reticulated conductor.

The thirteenth modification in FIG. 179A is different from the basic configuration example of periodic shift in that the relay conductor 1602 is evenly separated into three parts in the right-left direction.

Although not illustrated, configurations similar to the two-separation configurations illustrated in FIGS. 177A, 177B, 178A, and 178B are also possible in addition to such a three-even separation configuration in the right-left direction. For example, a three-even separation configuration in the up-down direction, a three-uneven separation configuration in the right-left direction, a three-uneven separation configuration in the up-down direction, a configuration of three-even separation in the right-left direction and shifted in the up-down direction, a configuration of three-even separation in the up-down direction and shifted in the right-left direction, a configuration in which three divisions without separation are shifted in the up-down direction, a configuration in which three divisions without separation are shifted in the right-left direction, and the like are also possible.

FIG. 179B is a plan view illustrating a fourteenth modification of the first shift configuration example of the reticulated conductor.

The fourteenth modification in FIG. 179B is different from the basic configuration example of periodic shift in that the relay conductor 1602 is evenly separated into four parts in the up-down direction and the right-left direction.

Even in the configuration in which the relay conductor 1602 is separated into four parts, uneven separation, a configuration in which the separated four parts are shifted in at least one of the up-down direction or the right-left direction, and a configuration in which the separated four are shifted without separation can also be adopted, for example.

In FIGS. 177A, 177B, 178A, 178B, 179A and 179B, examples in which the relay conductor 1602 is configured by two-separation, three-separation, or four-separation have been described. However, an arbitrary number of separations of five-separation or more is also possible. In FIGS. 180A and 180B, examples of five-separation and nine-separation will be described.

FIG. 180A is a plan view illustrating a fifteenth modification of the first shift configuration example of the reticulated conductor.

The fifteenth modification in FIG. 180A is different from the basic configuration example of periodic shift in that the relay conductor 1602 is separated into five parts. In the example in FIG. 180A, the center region is large among the separated five parts. However, such size relationship and arrangement relationship among the five parts are example, and the configuration is not limited to the example.

FIG. 180B is a plan view illustrating a sixteenth modification of the first shift configuration example of the reticulated conductor.

The sixteenth modification in FIG. 180B is different from the basic configuration example of periodic shift in that the relay conductor 1602 is separated into nine parts. In the example in FIG. 180B the center region is large among the separated nine parts. However, such size relationship and arrangement relationship among the nine parts are example, and the configuration is not limited to the example.

FIG. 181A is a plan view illustrating a seventeenth modification of the first shift configuration example of the reticulated conductor.

The seventeenth modification in FIG. 181A is different from the basic configuration example of periodic shift in that the relay conductor 1602 has one or more gaps (holes) inside. The number, position, and shape of the gaps are not limited to this example.

FIG. 181B is a plan view illustrating an eighteenth modification of the first shift configuration example of the reticulated conductor.

The eighteenth modification in FIG. 181B is different from the basic configuration example of periodic shift in that the relay conductor 1602 has a configuration in which an outer conductor surrounds an inner conductor. The number, position, and shape of the conductors are not limited to this example.

As described with reference to FIGS. 173A, 173B, 174A, 174B, 175A, 175B, 176A, 176B, 177A, 177B, 178A, 178B, 179A, 179B, 180A, 180B, 181A, and 181B, the relay conductor 1602 need not be centrally arranged in the gap region of the reticulated conductor 1601. For example, the relay conductors 1602 may be arranged with a bias in the X direction or the Y direction, or a plurality of relay conductors 1602 may be arranged. Furthermore, the relay conductor 1602 may have an asymmetric shape in the X direction or the Y direction, a symmetrical shape in the X direction or the Y direction, or a rotationally symmetrical shape. Note that, in the theoretical value of the capacitive noise in each of the modifications in FIGS. 173A, 173B, 174A, 174B. 175A, 175B, 176A, 176B, 177A, 177B, 178A, 178B, 179A, 179B, 180A, 180B, 181A, and 181B, the amount of change in the capacitive noise is zero and the absolute value of the capacitive noise is zero, similarly to the case where the periodic shift PDX is 2A in the first shift configuration example.

Note that regardless of the shape and arrangement of the relay conductor 1602, the relay conductor 1602 is formed to satisfy at least the above-described first condition of complete offset.

In the first to eighteenth modifications illustrated in FIGS. 173A, 173B, 174A, 174B, 175A, 175B, 176A, 176B, 177A, 177B, 178A, 178B, 179A, 179B, 180A, 180B, 181A, and 181B, for example, the degree of freedom in design and the degree of freedom in arranging another conductor, some element or object in the gap region are improved.

Moreover, the relay conductor 1602 may be a non-reticulated conductor that is a conductor not electrically connecting another conductor layer and another conductor layer, rather than the conductor electrically connecting another conductor layer and another conductor layer. Note that the relay conductor 1602 is desirably the conductor electrically relaying other conductor layers, rather than the non-reticulated conductor not electrically connecting other conductor layers. In a case where the relay conductor 1602 is used, the degree of freedom in the wiring layout for drawing in the power supply is improved. Furthermore, the voltage drop can be further improved depending on arrangement of the active elements such as MOS transistors and diodes. Furthermore, the presence of the relay conductor 1602 may improve the inductive noise, and the presence of a plurality of relay conductors 1602 (separation arrangement or division arrangement) may further improve the inductive noise.

Second Shift Configuration Example of Reticulated Conductor

FIG. 182 is a plan view illustrating a second shift configuration example of the reticulated conductor.

In the second shift configuration example of the reticulated conductor, even in a case where some of the dimensions of the reticulated conductor or the relay conductor is changed, the amount of change in the capacitive noise can be made zero.

A conductor layer 1711 in FIG. 182 is configured by a reticulated conductor 1701 and a relay conductor 1702.

In the conductor layer 1711 in FIG. 182, the dimensions of the conductor width CDY, the first gap width GDY1, and the second gap width GDY2 in the Y direction of the relay conductor 1702 are changed to be different from those of the first shift configuration example.

Specifically, as illustrated in FIG. 166, in the above-described first shift configuration example, the conductor width CDY in the Y direction of the relay conductor 1702 is 7A, and the first gap width GDY1 and the second gap width GDY2 are 1A, where ½ of the conductor width WDX in the X direction and the conductor width WDY in the Y direction of the reticulated conductor 1601 is a real number A.

In contrast, in the second shift configuration example in FIG. 182, the conductor width CDY in the Y direction of the relay conductor 1702 is 8A, and the first gap width GDY1 and the second gap width GDY2 are 2A.

In other words, in the above-described first shift configuration example, the gap width GDY in the Y direction of the reticulated conductor 1601 is 9A, whereas in the second shift configuration example, the gap width GDY is expanded to 12A.

In the second shift configuration example, the dimensions of the other conductor widths and gap widths are similar to those in the first shift configuration example. The second shift configuration example also satisfies at least the above-described first condition of complete offset.

FIG. 183 is a graph illustrating theoretical values of the capacitive noise of the conductor layer 1711 in which the periodic shift PDX is set to various values in the second shift configuration example, as in the first shift configuration example.

Since the horizontal axis and the vertical axis of the graph in FIG. 183 are similar to those in FIG. 169, the description thereof will be omitted. Note that the scale of the graph in FIG. 183 is also illustrated in accordance with FIG. 169.

As illustrated in FIG. 183, even in the second shift configuration example, in a case where the periodic shift PDX is a predetermined value, the amount of change in the capacitive noise is zero and the absolute value of the capacitive noise is zero. More specifically, in a case where the periodic shift PDX is set to 1/12, 2/12, or 5/12 of the repetition period in the X direction, the amount of change in the capacitive noise is zero and the absolute value of the capacitive noise is zero.

In a case of another periodic shift PDX, specifically, in a case where the periodic shift PDX is 3/12, 4/12, or 6/12 of the repetition period in the X direction, the amount of change in the capacitive noise and the absolute value are not zero, but the change in the amount of change in the capacitive noise can be made smaller than a case where the periodic shift PDX is zero, that is, in a case of no periodic shift.

In the second shift configuration example in which the dimensions in the Y direction are expanded, the capacitive noise in the case where the periodic shift PDX is zero, that is, in the case of no periodic shift, illustrated by the broken line in FIG. 183, is worse than the capacitive noise in the case of no periodic shift in the first shift configuration example. It can be seen that an improvement effect is enhanced by setting the periodic shift PDX.

FIG. 184 is a graph illustrating theoretical values of the capacitive noise in a case where the relay conductor 1702 is not present in the second shift configuration example.

Since the horizontal axis and the vertical axis of the graph in FIG. 184 are similar to those in FIG. 169, the description thereof will be omitted. Note that the scale of the graph in FIG. 184 is also illustrated in accordance with FIG. 169.

In the absence of the relay conductor 1602, the absolute value of the capacitive noise is not zero, as illustrated in FIG. 184, but the amount of change in the capacitive noise is zero in a case where the periodic shift PDX is a predetermined value. The amount of shift at which the amount of change in the capacitive noise becomes zero is the same as the case where the relay conductor 1602 is present. That is, in a case where the periodic shift PDX is set to 1/12, 2/12, or 5/12 of the repetition period in the X direction, the amount of change in the capacitive noise is zero.

From the graphs in FIGS. 183 and 184, the condition that the amount of change in the capacitive noise becomes zero in the second shift configuration example is similar to the case in the first shift configuration example.

That is, the periodic shift PDX is set to a value different from the periodic width FDX (=12A) in the X direction of the reticulated conductor 1701.

In a case where the periodic shift PDX is 2A, that is, the periodic shift PDX is the same as the conductor width WDX in the X direction of the reticulated conductor 1701, the amount of change in the capacitive noise becomes zero. Furthermore, the amount of change in the capacitive noise becomes zero in a case where the periodic shift PDX is 1A and in a case where the periodic shift PDX is 5A.

In a case where the periodic shift PDX is 1A or 5A, the amount of change in the capacitive noise becomes zero in units of twelve rows. Meanwhile, in a case where the periodic shift PDX is 2A, the amount of change in the capacitive noise becomes zero in units of six rows. In a case where the periodic shift PDX is equal to the conductor width WDX of the reticulated conductor 1701, the amount of change in the capacitive noise can be made zero with a small number of rows. Therefore, the degree of freedom in the wiring layout can be increased.

In a case where the periodic shift PDX is different from the repetition period of 3/12 (=3A) in the X direction of the reticulated conductor 1701, in other words, in a case where the periodic shift PDX is not the periodic width FDX (=12A)÷4, the amount of change in the capacitive noise becomes zero.

In a case where the periodic shift PDX is different from the repetition period of 4/12 (=4A) in the X direction of the reticulated conductor 1701, in other words, in a case where the periodic shift PDX is not the periodic width FDX (=12A)÷3, the amount of change in the capacitive noise becomes zero.

In a case where the periodic shift PDX is different from the repetition period of 6/12 (=6A) in the X direction of the reticulated conductor 1701, in other words, in a case where the periodic shift PDX is not the periodic width FDX (=12A)÷2, the amount of change in the capacitive noise becomes zero.

In the presence of the relay conductor 1702, not only the amount of change in the capacitive noise becomes zero but also the absolute value of the capacitive noise can be made zero. In the absence of the relay conductor 1702, the amount of change in the capacitive noise is zero, but the absolute value of the capacitive noise is not zero.

Furthermore, the effect of improving the capacitive noise is greater in the presence of the relay conductor 1702 than the absence of the relay conductor 1702.

Third Shift Configuration Example of Reticulated Conductor

In the first and second shift configuration examples, the condition of the periodic shift PDX when the amount of change in the capacitive noise becomes zero is the same between the presence of the relay conductor and the absence of the relay conductor.

Next, an example in which the condition of the periodic shift PDX when the amount of change in the capacitive noise becomes zero is different between the presence of the relay conductor and the absence of the relay conductor will be described as a third shift configuration example.

FIG. 185 is a plan view for describing a conductor width and a gap width of a conductor layer as a third shift configuration example of the reticulated conductor.

A conductor layer 1731 in FIG. 185 is configured by a reticulated conductor 1721 and a relay conductor 1722.

The reticulated conductor 1721 has the conductor width WDX set to 3A and the conductor width WDY set to 1A, where the arbitrary real number is A. The gap region of the reticulated conductor 1721 is formed by the gap width GDX set to 6A and the gap width GDY set to 17A.

The relay conductor 1722 arranged in the gap region of the reticulated conductor 1721 is a rectangle having the conductor width CDX set to 4A and the conductor width CDY set to 15A, and is a vertically long rectangle in which the conductor width CDY in the Y direction is larger than the conductor width CDX in the X direction (CDY>CDX). Both the first gap width GDX1 and the second gap width GDX2 in the X direction are set to 1A between the reticulated conductor 1721 and the relay conductor 1722. Furthermore, both the first gap width GDY1 and the second gap width GDY2 in the Y direction are set to 1A.

Therefore, the periodic width FDX (=the conductor width WDX+the gap width GDX) corresponds to 9A and the periodic width FDY (=the conductor width WDY+the gap width GDY) corresponds to 18A when expressed using the arbitrary real number A. In the third shift configuration example, the real number A is equal to ⅓ of the conductor width WDX in the X direction of the reticulated conductor 1721.

The third shift configuration example also satisfies at least the above-described first condition of complete offset.

FIGS. 186A, 186B, 186C, 187A, and 187B are plan views in which the periodic shift PDX is set to various values in the conductor layer 1731 as a third shift configuration example of the reticulated conductor.

FIG. 186A is a plan view of the conductor layer 1731 in which the periodic shift PDX is set to zero.

FIG. 186B is a plan view of the conductor layer 1731 in which the periodic shift PDX in the X direction is set to 1A, that is, 1/9 of the repetition period (periodic width FDX) in the X direction.

FIG. 186C is a plan view of the conductor layer 1731 in which the periodic shift PDX is set to 2A, that is, 2/9 of the repetition period (periodic width FDX) in the X direction.

FIG. 187A is a plan view of the conductor layer 1731 in which the periodic shift PDX is set to 3A, that is, 3/9 of the repetition period (periodic width FDX) in the X direction.

FIG. 187B is a plan view of the conductor layer 1731 in which the periodic shift PDX is set to 4A, that is, 4/9 of the repetition period (periodic width FDX) in the X direction.

FIG. 188 is a graph illustrating theoretical values of the capacitive noise of the conductor layer 1731 in which the periodic shift PDX is set to various values as illustrated in FIGS. 186A, 186B, 186C, 187A, and 187B, Since the horizontal axis and the vertical axis of the graph in FIG. 188 are similar to those in FIG. 169, the description thereof will be omitted. Note that the scale of the graph in FIG. 188 is also illustrated in accordance with FIG. 169. Conditions for the Vdd applied voltage and Vss applied voltage are similar.

As illustrated in FIG. 188, in a case where the periodic shift PDX is a predetermined value, the amount of change in the capacitive noise is zero and the absolute value of the capacitive noise is zero. More specifically, in a case where the periodic shift PDX is set to 1/9, 2/9, or 4/9 of the repetition period in the X direction, the amount of change in the capacitive noise is zero and the absolute value of the capacitive noise is zero. In a case where the periodic shift PDX is set to 1/9 (=1A), 2/9 (=2A), or 4/9 (=4A) of the repetition period in the X direction, the amount of change in the capacitive noise becomes zero in units of nine rows.

In a case of another periodic shift PDX, specifically, in a case where the periodic shift PDX is 3/9 of the repetition period in the X direction, the amount of change in the capacitive noise and the absolute value are not zero, but the change in the amount of change in the capacitive noise can be made smaller than a case where the periodic shift PDX is zero, that is, in a case of no periodic shift.

From the above, in the third shift configuration example including the relay conductor 1722, the amount of change in the capacitive noise can be made zero under the following conditions.

First, as a premise, the periodic shift PDX is set to a value different from the periodic width FDX (=9A) in the X direction of the reticulated conductor 1721.

In a case where the periodic shift PDX is 1A, 2A, or 4A, the amount of change in the capacitive noise becomes zero in units of nine rows. Furthermore, in a case where the periodic shift PDX is different from the repetition period of 3/9 (=3A) in the X direction of the reticulated conductor 1721, in other words, in a case where the periodic shift PDX is not the periodic width FDX (=9A)÷3, the amount of change in the capacitive noise becomes zero.

FIG. 189 is a graph illustrating theoretical values of the capacitive noise in a case where the periodic shift PDX is set to various values in the conductor layer 1731 in which the relay conductor 1722 is omitted. Although illustration of the conductor layer from which the relay conductor 1722 is omitted is omitted, it corresponds to each of the conductor layers 1731 in FIGS. 186A, 186B, 186C, 187A, and 187B from which the relay conductor 1722 is removed.

In the absence of the relay conductor 1722, the absolute value of the capacitive noise is not zero, as illustrated in FIG. 189, but the amount of change in the capacitive noise is zero in a case where the periodic shift PDX is a predetermined value. The amount of shift at which the amount of change in the capacitive noise becomes zero is different from the case where the relay conductor 1722 is present. Specifically, in a case where the periodic shift PDX is set to 1/9, 2/9, 3/9, or 4/9 of the repetition period in the X direction, the amount of change in the capacitive noise is zero. In a case where the periodic shift PDX is set to 1/9 (=1A), 2/9 (=2A), or 4/9 (=4A) of the repetition period in the X direction, the amount of change in the capacitive noise becomes zero in units of nine rows. In a case where the periodic shift PDX is set to 3/9 (=3A) of the repetition period in the X direction, the amount of change in the capacitive noise becomes zero in units of three rows.

From the above, in the third shift configuration example not including the relay conductor 1722, the amount of change in the capacitive noise can be made zero under the following conditions.

First, as a premise, the periodic shift PDX is set to a value different from the periodic width FDX (=9A) in the X direction of the reticulated conductor 1721.

In a case where the periodic shift PDX is 1A, 2A, or 4A, the amount of change in the capacitive noise becomes zero in units of nine rows. Furthermore, in a case where the periodic shift PDX is the same as 3/9 (=3A) that is the repetition period in the X direction of the reticulated conductor 1721, the amount of change in the capacitive noise becomes zero in units of three rows.

Therefore, in the third shift configuration example, in a case where the periodic shift PDX is set to be the same as the conductor width WDX=3A of the reticulated conductor 1721, the amount of change in the capacitive noise does not become zero in the presence of the relay conductor 1722, but the amount of change in the capacitive noise becomes zero in the absence of the relay conductor 1722. That is, in the third shift configuration example, the condition of the periodic shift PDX of when the amount of change in the capacitive noise becomes zero is different between the presence of the relay conductor 1722 and the absence of the relay conductor 1722.

In the case where an integral multiple of the conductor width WDX of the reticulated conductor 1721 matches the periodic width FDX, and the periodic shift PDX matches the conductor width WDX according to the shape relationship between the conductor part and the gap region of the reticulated conductor 1721, the capacitive noise is evenly distributed. Therefore, the amount of change in the capacitive noise can be made zero in the absence of the relay conductor 1722.

Fourth Shift Configuration Example of Reticulated Conductor

In the first to third shift configuration examples, examples in which the relay conductor has the vertically long shape longer in the X direction than in the Y direction have been described.

Next, an example where the relay conductor has a horizontally long shape shorter in the Y direction than in the X direction will be described as the fourth shift configuration example.

FIG. 190 is a plan view for describing a conductor width and a gap width of a conductor layer as a fourth shift configuration example of the reticulated conductor.

The conductor layer 1771 in FIG. 190 is configured by a reticulated conductor 1761 and a relay conductor 1762.

The reticulated conductor 1761 has the conductor width WDX set to 2A and the conductor width WDY set to 2A, where the arbitrary real number is A. The gap region of the reticulated conductor 1761 is formed by the gap width GDX set to 12A and the gap width GDY set to 10A.

The relay conductor 1762 arranged in the gap region of the reticulated conductor 1761 is a rectangle having the conductor width CDX set to 8A and the conductor width CDY set to 6A, and is a horizontally long rectangle in which the conductor width CDX in the X direction is larger than the conductor width CDY in the Y direction (CDX>CDY). Both the first gap width GDX1 and the second gap width GDX2 in the X direction are set to 2A between the reticulated conductor 1761 and the relay conductor 1762. Furthermore, both the first gap width GDY1 and the second gap width GDY2 in the Y direction are set to 2A.

Therefore, the periodic width FDX (=the conductor width WDX+the gap width GDX) corresponds to 14A and the periodic width FDY (=the conductor width WDY+the gap width GDY) corresponds to 12A when expressed using the arbitrary real number A. In the fourth shift configuration example, the real number A is equal to ½ of the conductor width WDX in the X direction of the reticulated conductor 1761.

The fourth shift configuration example also satisfies at least the above-described first condition of complete offset.

FIGS. 191A, 191B, 191C, 191D, 192A, 192B, 192C, and 192D are plan views in which the periodic shift PDX is set to various values in the conductor layer as the fourth shift configuration example of the reticulated conductor.

Figures 191A, 191B, 191C, 191D:
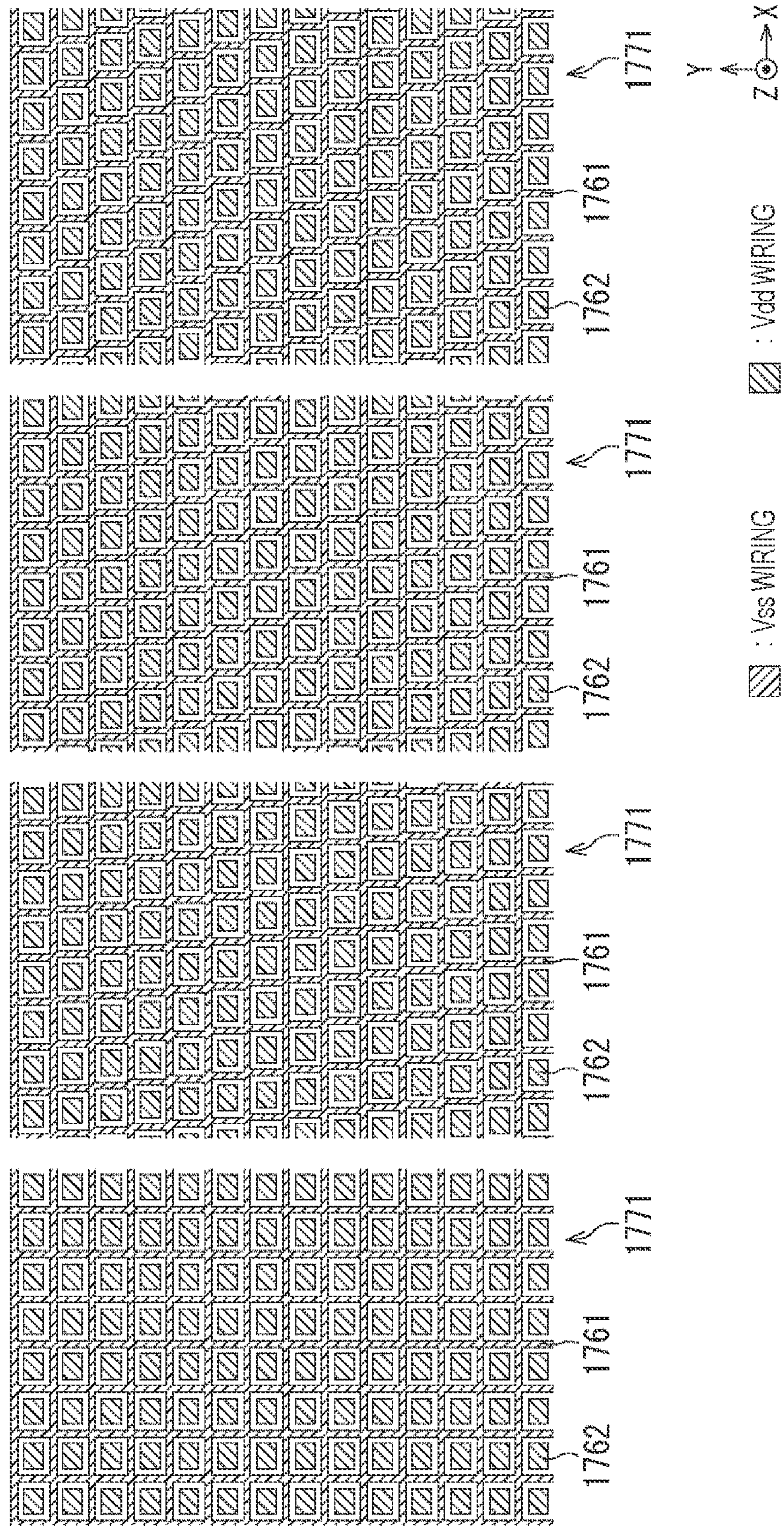

FIG. 191A is a plan view of the conductor layer 1771 in which the periodic shift PDX is set to zero.

FIG. 191B is a plan view of the conductor layer 1771 in which the periodic shift PDX in the X direction is set to 1A, that is, 1/14 of the repetition period (periodic width FDX) in the X direction.

FIG. 191C is a plan view of the conductor layer 1771 in which the periodic shift PDX is set to 2A, that is, 2/14 of the repetition period (periodic width FDX) in the X direction.

FIG. 191C is a plan view of the conductor layer 1771 in which the periodic shift PDX is set to 3A, that is, 3/14 of the repetition period (periodic width FDX) in the X direction.

Figures 192A, 192B, 192C, 192D:
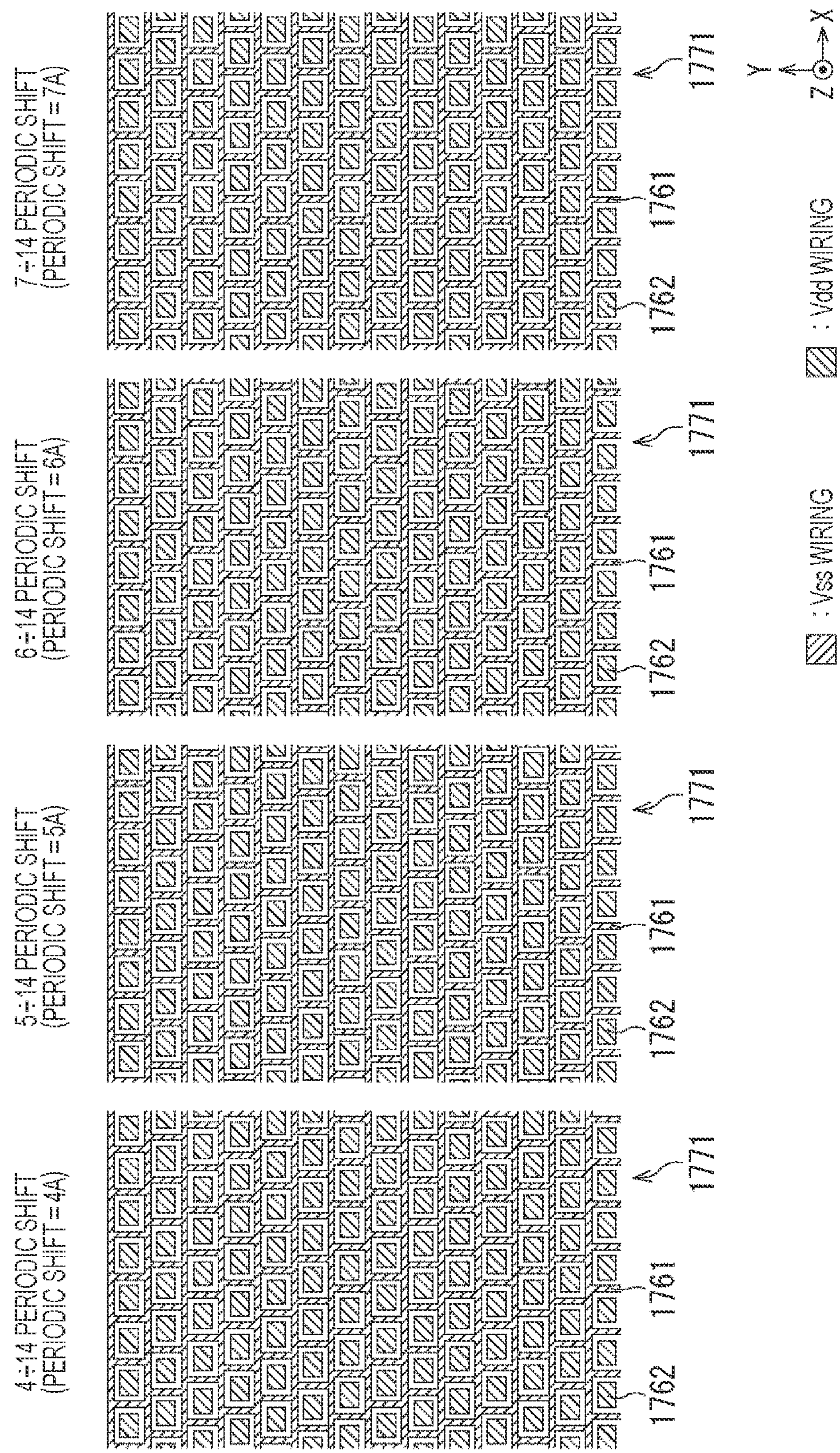

FIG. 192A is a plan view of the conductor layer 1771 in which the periodic shift PDX is set to 4A, that is, 4/14 of the repetition period (periodic width FDX) in the X direction.

FIG. 192B is a plan view of the conductor layer 1771 in which the periodic shift PDX is set to 5A, that is, 5/14 of the repetition period (periodic width FDX) in the X direction.

FIG. 192D is a plan view of the conductor layer 1771 in which the periodic shift PDX is set to 6A, that is, 6/14 of the repetition period (periodic width FDX) in the X direction.

FIG. 192D is a plan view of the conductor layer 1771 in which the periodic shift PDX is set to 7A, that is, 7/14 of the repetition period (periodic width FDX) in the X direction.

FIG. 193 is a graph illustrating theoretical values of the capacitive noise of the conductor layer 1771 in which the periodic shift PDX is set to various values as illustrated in FIGS. 191A, 191B, 191C, 191D, 192A, 192B, 192C, and 192D.

Since the horizontal axis and the vertical axis of the graph in FIG. 193 are similar to those in FIG. 169, the description thereof will be omitted. Note that the scale of the graph in FIG. 193 is also illustrated in accordance with FIG. 169. Conditions for the Vdd applied voltage and Vss applied voltage are similar.

As illustrated in FIG. 193, in a case where the periodic shift PDX is a predetermined value, the amount of change in the capacitive noise is zero and the absolute value of the capacitive noise is zero. More specifically, in a case where the periodic shift PDX is 1/14, 2/14, 3/14, 4/14, 5/14, or 6/14 of the repetition period in the X direction, the amount of change in the capacitive noise is zero, and the absolute value of the capacitive noise is zero.

In a case where the periodic shift PDX is 1/14 (=1A), 3/14 (=3A), or 5/14 (=5A) of the repetition period in the X direction, the amount of change in the capacitive noise is zero and is the absolute value of the capacitive noise in units of 14 rows.

In a case where the periodic shift PDX is set to 2/14 (=2A), 4/14 (=4A), or 6/14 (=6A) of the repetition period in the X direction, the amount of change in the capacitive noise is zero and is the absolute value of the capacitive noise in units of 7 rows. The amount of change in the capacitive noise is zero and is the absolute value of the capacitive noise with a small number of rows even in the case where the periodic shift PDX is equal to a multiple integral of the conductor width WDX in addition to the case where the periodic shift PDX is equal to the conductor width WDX of the reticulated conductor 1721. The amount of change in the capacitive noise is zero and is the absolute value of the capacitive noise with a small number of rows even in a case where the periodic shift PDX is equal to an integral multiple of the conductor width WDX, in the case where the multiple integral of the conductor width WDX does not match the periodic width FDX (=14A)÷3 and the periodic width FDX (=14A)÷4.

In a case of another periodic shift PDX, specifically, in a case where the periodic shift PDX is 7/14 of the repetition period in the X direction, the amount of change in the capacitive noise and the absolute value are not zero, but the change in the amount of change in the capacitive noise can be made smaller than a case where the periodic shift PDX is zero, that is, in a case of no periodic shift.

From the above, in the fourth shift configuration example including the relay conductor 1762, the amount of change in the capacitive noise can be made zero under the following conditions.

First, as a premise, the periodic shift PDX is set to a value different from the periodic width FDX (=14A) in the X direction of the reticulated conductor 1761.

In a case where the periodic shift PDX is 2A, that is, the periodic shift PDX is the same as the conductor width WDX in the X direction of the reticulated conductor 1761, the amount of change in the capacitive noise and the absolute value become zero. Furthermore, in a case where the periodic shift PDX is 1A, 3A, 4A, 5A, and 6A, the amount of change in the capacitive noise and the absolute value become zero.

Conversely, in a case where the periodic shift PDX is different from the repetition period of 7/14 (=7A) in the X direction of the reticulated conductor 1761, in other words, in a case where the periodic shift PDX is not the periodic width FDX (=14A)÷2, the amount of change in the capacitive noise and the absolute value become zero.

FIG. 194 is a graph illustrating theoretical values of the capacitive noise in a case where the periodic shift PDX is set to various values in the conductor layer 1771 in which the relay conductor 1762 is omitted. Although illustration of the conductor layer from which the relay conductor 1762 is omitted is omitted, it corresponds to each of the conductor layers 1771 in FIGS. 191A, 191B, 191C, 191D, 192A, 192B, 192C and 192D from which the relay conductor 1762 is removed.

As illustrated in FIG. 194, even in the absence of the relay conductor 1762, the amount of shift by which the amount of change in the capacitive noise becomes zero is the same as the presence of the relay conductor 1762. Note that the absolute value of the capacitive noise is not zero.

From the above, in the fourth shift configuration example not including the relay conductor 1762, the amount of change in the capacitive noise can be made zero under the following conditions.

First, as a premise, the periodic shift PDX is set to a value different from the periodic width FDX (=14A) in the X direction of the reticulated conductor 1761.

In a case where the periodic shift PDX is 2A, that is, the periodic shift PDX is the same as the conductor width WDX in the X direction of the reticulated conductor 1761, the amount of change in the capacitive noise becomes zero. Furthermore, in a case where the periodic shift PDX is 1A, 3A, 4A, 5A, and 6A, the amount of change in the capacitive noise becomes zero.

Conversely, in a case where the periodic shift PDX is different from the repetition period of 7/14 (=7A) in the X direction of the reticulated conductor 1761, in other words, in a case where the periodic shift PDX is not the periodic width FDX (=14A)÷2, the amount of change in the capacitive noise becomes zero.

Fifth Shift Configuration Example of Reticulated Conductor

Next, an example in which the conductor width WDX in the X direction of the reticulated conductor is wide will be illustrated as a fifth shift configuration example.

FIG. 195 is a plan view for describing a conductor width and a gap width of a conductor layer as a fifth shift configuration example of the reticulated conductor.

The conductor layer 1791 in FIG. 195 is configured by a reticulated conductor 1781 and a relay conductor 1782.

The reticulated conductor 1781 has the conductor width WDX set to 4A and the conductor width WDY set to 2A, where the arbitrary real number is A. The gap region of the reticulated conductor 1781 is formed by the gap width GDX set to 12A and the gap width GDY set to 16A.

The relay conductor 1782 arranged in the gap region of the reticulated conductor 1781 is a rectangle having the conductor width CDX set to 8A and the conductor width CDY set to 12A, and is a vertically long rectangle in which the conductor width CDY in the Y direction is larger than the conductor width CDX in the X direction (CDY>CDX). Both the first gap width GDX1 and the second gap width GDX2 in the X direction are set to 2A between the reticulated conductor 1781 and the relay conductor 1782. Furthermore, both the first gap width GDY1 and the second gap width GDY2 in the Y direction are set to 2A.

Therefore, the periodic width FDX (=the conductor width WDX+the gap width GDX) corresponds to 16A and the periodic width FDY (=the conductor width WDY+the gap width GDY) corresponds to 18A when expressed using the arbitrary real number A. In the fifth shift configuration example, the real number A is equal to ¼ of the conductor width WDX in the X direction of the reticulated conductor 1781.

The fifth shift configuration example also satisfies at least the above-described first condition of complete offset.

FIGS. 196A, 196B, 196C, 197A, 197B, 197C, 198A, 198B, and 198D are plan views in which the periodic shift PDX is set to various values in the conductor layer 1791 as the fifth shift configuration example of the reticulated conductor.

FIG. 196A is a plan view of the conductor layer 1791 in which the periodic shift PDX is set to zero.

FIG. 196B is a plan view of the conductor layer 1791 in which the periodic shift PDX in the X direction is set to 1A, that is, 1/16 of the repetition period (periodic width FDX) in the X direction.

FIG. 196D is a plan view of the conductor layer 1791 in which the periodic shift PDX is set to 2A, that is, 2/16 of the repetition period (periodic width FDX) in the X direction.

FIG. 197A is a plan view of the conductor layer 1791 in which the periodic shift PDX is set to 3A, that is, 3/16 of the repetition period (periodic width FDX) in the X direction.

FIG. 197B is a plan view of the conductor layer 1791 in which the periodic shift PDX is set to 4A, that is, 4/16 of the repetition period (periodic width FDX) in the X direction.

FIG. 197C is a plan view of the conductor layer 1791 in which the periodic shift PDX is set to 5A, that is, 5/16 of the repetition period (periodic width FDX) in the X direction.

FIG. 198A is a plan view of the conductor layer 1791 in which the periodic shift PDX is set to 6A, that is, 6/16 of the repetition period (periodic width FDX) in the X direction.

FIG. 198B is a plan view of the conductor layer 1791 in which the periodic shift PDX is set to 7A, that is, 7/16 of the repetition period (periodic width FDX) in the X direction.

FIG. 198C is a plan view of the conductor layer 1791 in which the periodic shift PDX is set to 8A, that is, 8/16 of the repetition period (periodic width FDX) in the X direction.

FIG. 199 is a graph illustrating theoretical values of the capacitive noise of the conductor layer 1771 in which the periodic shift PDX is set to various values as illustrated in FIGS. 196A, 196B, 196C, 197A, 197B, 197C, 198A, 198B, and 198C.

Since the horizontal axis and the vertical axis of the graph in FIG. 199 are similar to those in FIG. 169, the description thereof will be omitted. Note that the scale of the graph in FIG. 199 is also illustrated in accordance with FIG. 169. Conditions for the Vdd applied voltage and Vss applied voltage are similar.

As illustrated in FIG. 199, in a case where the periodic shift PDX is a predetermined value, the amount of change in the capacitive noise is zero and the absolute value of the capacitive noise is zero. More specifically, in a case where the periodic shift PDX is 1/16 (=1A), 2/16 (=2A), 3/16 (=3A), 4/16 (=4A), 5/16 (=5A), 6/16 (=6A), or 7/16 (=7A) of the repetition period in the X direction, the amount of change in the capacitive noise is zero, and the absolute value of the capacitive noise is zero.

Conversely, in a case where the periodic shift PDX is different from the repetition period of 8/16 (=8A) in the X direction of the reticulated conductor 1781, in other words, in a case where the periodic shift PDX is not the periodic width FDX (=16A)÷2, the amount of change in the capacitive noise and the absolute value become zero.

In a case where the periodic shift PDX is 1/16 (=1A), 3/16 (=3A), 5/16 (=5A), or 7/16 (=7A) of the repetition period in the X direction, the amount of change in the capacitive noise is zero and is the absolute value of the capacitive noise in units of 16 rows.

In a case where the periodic shift PDX is set to 2/16 (=2A) or 6/16 (=6A) of the repetition period in the X direction, the amount of change in the capacitive noise is zero and is the absolute value of the capacitive noise in units of 8 rows.

In a case where the periodic shift PDX is set to 4/16 (=4A) of the repetition period in the X direction, the amount of change in the capacitive noise is zero and is the absolute value of the capacitive noise in units of 4 rows.

In a case of another periodic shift PDX, specifically, in a case where the periodic shift PDX is 8/16 of the repetition period in the X direction, the amount of change in the capacitive noise and the absolute value are not zero, but the change in the amount of change in the capacitive noise can be made smaller than a case where the periodic shift PDX is zero, that is, in a case of no periodic shift.

From the above, in the fifth shift configuration example including the relay conductor 1762, the amount of change in the capacitive noise can be made zero under the following conditions.

First, as a premise, the periodic shift PDX is set to a value different from the periodic width FDX (=16A) in the X direction of the reticulated conductor 1781.

In a case where the periodic shift PDX is 4A, that is, the periodic shift PDX is the same as the conductor width WDX in the X direction of the reticulated conductor 1781, the amount of change in the capacitive noise and the absolute value become zero.

Furthermore, in a case where the periodic shift PDX is 2A and 6A, the amount of change in the capacitive noise and the absolute value become zero. In a case where the periodic shift PDX is 2A, the periodic shift PDX is equal to one time the half of the conductor width WDX. In a case where the periodic shift PDX is 6A, the periodic shift PDX is equal to three times the half of the conductor width WDX. Furthermore, in a case where the periodic shift PDX is 4A, the periodic shift PDX is equal to twice the half of the conductor width WDX.

In the case where the conductor width WDX in the X direction of the reticulated conductor is set to be narrow as in the above-described fourth shift configuration example, the amount of change in the capacitive noise has become zero and been the absolute value of the capacitive noise in the case where the periodic shift PDX is equal to the multiple integral of the conductor width WDX of the reticulated conductor 1721.

In contrast, in the case where the conductor width WDX in the X direction of the reticulated conductor is set to be wide, the amount of change in the capacitive noise has become zero and been the absolute value of the capacitive noise in the case where the periodic shift PDX is equal to the multiple integral of half of the conductor width WDX of the reticulated conductor 1721.

In this way, in the case where the periodic shift PDX is equal to not only an integral multiple of the conductor width WDX but also an integral multiple of half the conductor width WDX, the amount of change in the capacitive noise and the absolute value may become zero.

FIG. 200 is a graph illustrating theoretical values of the capacitive noise in a case where the periodic shift PDX is set to various values in the conductor layer 1791 in which the relay conductor 1782 is omitted. Although illustration of the conductor layer from which the relay conductor 1782 is omitted is omitted, it corresponds to each of the conductor layers 1791 in FIGS. 196A, 196B, 196C, 197A, 197B, 197C, 198A, 198B, and 198C from which the relay conductor 1782 is removed.

As illustrated in FIG. 200, even in the absence of the relay conductor 1782, the amount of shift by which the amount of change in the capacitive noise becomes zero is the same as the presence of the relay conductor 1782. Note that the absolute value of the capacitive noise is not zero.

Sixth Shift Configuration Example of Reticulated Conductor

In the first to fifth shift configuration examples, the examples in which the gap width GDX is larger than the conductor width WDX (the gap width GDX>the conductor width WDX) when focusing on the relationship between the conductor width WDX in the X direction of the reticulated conductor and the gap width GDX have been described.

In the next sixth shift configuration example, an example in which the gap width GDX is smaller than the conductor width WDX (the gap width GDX<the conductor width WDX) will be described.

FIG. 201 is a plan view for describing a conductor width and a gap width of a conductor layer as a sixth shift configuration example of the reticulated conductor.

The conductor layer 1811 in FIG. 201 is configured by a reticulated conductor 1801 and a relay conductor 1802.

The reticulated conductor 1801 has the conductor width WDX set to 6A and the conductor width WDY set to 6A, where the arbitrary real number is A. The gap region of the reticulated conductor 1801 is formed by the gap width GDX set to 4A and the gap width GDY set to 4A. Therefore, the conductor width WDX (=6A) is larger than the gap width GDX (=4A).

The relay conductor 1802 arranged in the gap region of the reticulated conductor 1801 is a rectangle having the conductor width CDX set to 2A and the conductor width CDY set to 2A, and is a square in which the conductor width CDX in the X direction and the conductor width CDY in the Y direction are the same (CDY=CDX). Both the first gap width GDX1 and the second gap width GDX2 in the X direction are set to 1A between the reticulated conductor 1801 and the relay conductor 1802. Furthermore, both the first gap width GDY1 and the second gap width GDY2 in the Y direction are set to 1A.

Therefore, the periodic width FDX (=the conductor width WDX+the gap width GDX) corresponds to 10A and the periodic width FDY (=the conductor width WDY+the gap width GDY) corresponds to 10A when expressed using the arbitrary real number A.

In the sixth shift configuration example, when comparing the conductive area of the reticulated conductor 1801 with the conductive area of the relay conductor 1802 within a predetermined range, the conductive area of the reticulated conductor 1801 is larger, and the above-described first condition of complete offset is not satisfied.

FIGS. 202A, 202B, 202C, 203A, 203B, and 203C are plan views in which the periodic shift PDX is set to various values in the conductor layer 1811 as the sixth shift configuration example of the reticulated conductor.

FIG. 202A is a plan view of the conductor layer 1811 in which the periodic shift PDX is set to zero.

FIG. 202B is a plan view of the conductor layer 1811 in which the periodic shift PDX in the X direction is set to 1A, that is, 1/10 of the repetition period (periodic width FDX) in the X direction.

FIG. 202C is a plan view of the conductor layer 1811 in which the periodic shift PDX is set to 2A, that is, 2/10 of the repetition period (periodic width FDX) in the X direction.

FIG. 203A is a plan view of the conductor layer 1811 in which the periodic shift PDX is set to 3A, that is, 3/10 of the repetition period (periodic width FDX) in the X direction.

FIG. 203B is a plan view of the conductor layer 1811 in which the periodic shift PDX is set to 4A, that is, 4/10 of the repetition period (periodic width FDX) in the X direction.

FIG. 203C is a plan view of the conductor layer 1811 in which the periodic shift PDX is set to 5A, that is, 5/10 of the repetition period (periodic width FDX) in the X direction.

FIG. 204 is a graph illustrating theoretical values of the capacitive noise of the conductor layer 1811 in which the periodic shift PDX is set to various values as illustrated in FIGS. 202A, 202B, 202C, 203A, 203B, and 203C.

Since the horizontal axis and the vertical axis of the graph in FIG. 204 are similar to those in FIG. 169, the description thereof will be omitted. Note that the scale of the graph in FIG. 204 is also illustrated in accordance with FIG. 169. Conditions for the Vdd applied voltage and Vss applied voltage are similar.

The amount of change in the capacitive noise becomes zero in the case where the periodic shift PDX is a predetermined value, as illustrated in FIG. 204. More specifically, in a case where the periodic shift PDX is 1/10 (=1A), 2/10 (=2A), 3/10 (=3A), or 4/10 (=4A) of the repetition period in the X direction, the amount of change in the capacitive noise is zero. Note that the absolute value of the capacitive noise is not zero.

Conversely, in a case where the periodic shift PDX is different from the repetition period of 5/10 (=5A) in the X direction of the reticulated conductor 1801, in other words, in a case where the periodic shift PDX is not the periodic width FDX (=10A)÷2, the amount of change in the capacitive noise becomes zero.

In a case where the periodic shift PDX is set to 1/10 (=1A) or 3/10 (=3A) of the repetition period in the X direction, the amount of change in the capacitive noise becomes zero in units of ten rows.

In a case where the periodic shift PDX is set to 2/10 (=2A) or 4/10 (=4A) of the repetition period in the X direction, the amount of change in the capacitive noise becomes zero in units of five rows.

In a case of another periodic shift PDX, specifically, in a case where the periodic shift PDX is 5/10 of the repetition period in the X direction, the amount of change in the capacitive noise is not zero, but the change in the amount of change in the capacitive noise can be made smaller than a case where the periodic shift PDX is zero, that is, in a case of no periodic shift.

From the above, in the sixth shift configuration example including the relay conductor 1802, the amount of change in the capacitive noise can be made zero under the following conditions.

First, as a premise, the periodic shift PDX is set to a value different from the periodic width FDX (=10A) in the X direction of the reticulated conductor 1801.

In a case where the periodic shift PDX is 4A, that is, the periodic shift PDX is the same as the gap width GDX in the X direction of the reticulated conductor 1801, the amount of change in the capacitive noise becomes zero. Furthermore, in a case where the periodic shift PDX is 1A, 2A, and 3A, the amount of change in the capacitive noise becomes zero.

Although not illustrated in the graph in FIG. 204, in a case where the periodic shift PDX is 8A, which is twice the gap width GDX (=4A), the periodic width FDX is 10A, and 8/10=(10−2)/10, and thus the case becomes equivalent to the case where the periodic shift PDX is 2A. Therefore, the amount of change in the capacitive noise becomes zero. Furthermore, in a case where the periodic shift PDX is 12A, which is three times the gap width GDX (=4A), the periodic width FDX is 10A, and 12/10=(10+2)/10, and thus the case becomes equivalent to the case where the periodic shift PDX is 2A. Therefore, the amount of change in the capacitive noise becomes zero.

Therefore, in the conductor layer 1811 having the reticulated conductor 1801 in which the gap width GDX is larger than the conductor width WDX, the amount of change in the capacitive noise can be made zero in the case of an integral multiple of the gap width GDX. Note that the amount of change in the capacitive noise becomes zero even in the case where the periodic shift PDX is 1A or 3A, so the case is not limited to an integral multiple of the gap width GDX.

FIG. 205 is a graph illustrating theoretical values of the capacitive noise in a case where the periodic shift PDX is set to various values in the conductor layer 1811 in which the relay conductor 1802 is omitted. Although illustration of the conductor layer from which the relay conductor 1802 is omitted is omitted, it corresponds to each of the conductor layers 1811 in FIGS. 202A, 202B, 202C, 203A, 203B, and 203C from which the relay conductor 1802 is removed.

As illustrated in FIG. 205, even in the absence of the relay conductor 1802, the amount of shift by which the amount of change in the capacitive noise becomes zero is the same as the presence of the relay conductor 1802. Note that the absolute value of the capacitive noise is not zero.

Seventh Shift Configuration Example of Reticulated Conductor

Next, an example in which the conductor width WDX in the X direction of the reticulated conductor and the gap width GDX are equal (the conductor width WDX=the gap width GDX) will be illustrated as a seventh shift configuration example.

FIG. 206 is a plan view for describing a conductor width and a gap width of a conductor layer as a seventh shift configuration example of the reticulated conductor.

The conductor layer 1831 in FIG. 206 is configured by a reticulated conductor 1821 and a relay conductor 1822.

The reticulated conductor 1821 has the conductor width WDX set to 6A and the conductor width WDY set to 6A, where the arbitrary real number is A. The gap region of the reticulated conductor 1821 is formed by the gap width GDX set to 6A and the gap width GDY set to 6A. Therefore, the conductor width WDX (=6A) and the gap width GDX (=6A) are equal.

The relay conductor 1822 arranged in the gap region of the reticulated conductor 1821 is a rectangle having the conductor width CDX set to 2A and the conductor width CDY set to 2A, and is a square in which the conductor width CDX in the X direction and the conductor width CDY in the Y direction are the same (CDY=CDX). Both the first gap width GDX1 and the second gap width GDX2 in the X direction are set to 2A between the reticulated conductor 1821 and the relay conductor 1822. Furthermore, both the first gap width GDY1 and the second gap width GDY2 in the Y direction are set to 2A.

Therefore, the periodic width FDX (=the conductor width WDX+the gap width GDX) corresponds to 12A and the periodic width FDY (=the conductor width WDY+the gap width GDY) corresponds to 12A when expressed using the arbitrary real number A.

In the seventh shift configuration example, when comparing the conductive area of the reticulated conductor 1801 with the conductive area of the relay conductor 1802 within a predetermined range, the conductive area of the reticulated conductor 1801 is larger, and the above-described first condition of complete offset is not satisfied.

FIGS. 207A, 207B, 207C, 208A, 208B, and 208C are plan views in which the periodic shift PDX is set to various values in the conductor layer 1831 as the seventh shift configuration example of the reticulated conductor.

Figures 207A, 207B, 207C, 207D:
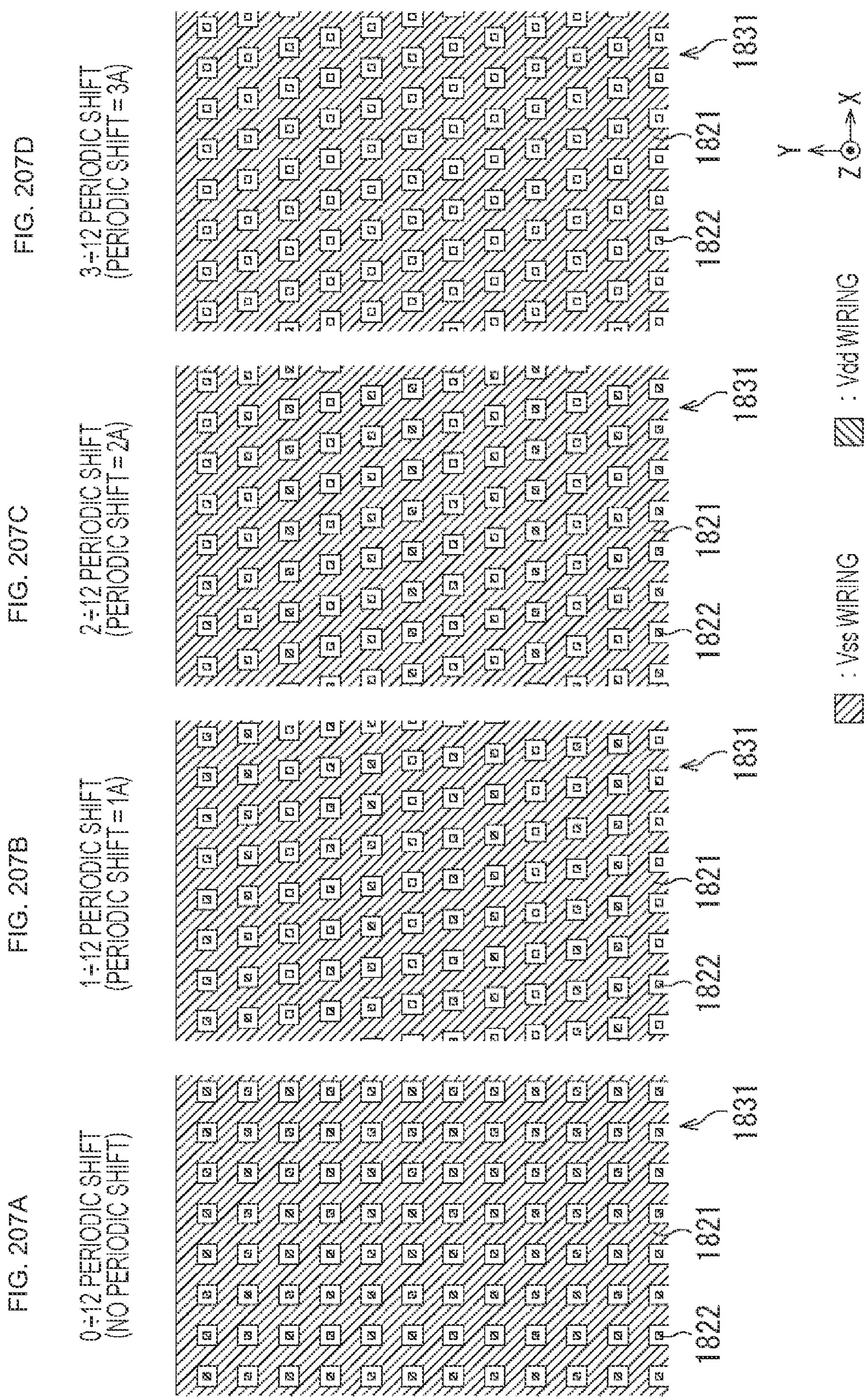

FIG. 207A is a plan view of the conductor layer 1831 in which the periodic shift PDX is set to zero.

FIG. 207A is a plan view of the conductor layer 1831 in which the periodic shift PDX in the X direction is set to 1A, that is, 1/12 of the repetition period (periodic width FDX) in the X direction.

FIG. 207C is a plan view of the conductor layer 1831 in which the periodic shift PDX is set to 2A, that is, 2/12 of the repetition period (periodic width FDX) in the X direction.

FIG. 207D is a plan view of the conductor layer 1831 in which the periodic shift PDX is set to 3A, that is, 3/12 of the repetition period (periodic width FDX) in the X direction.

FIG. 208A is a plan view of the conductor layer 1831 in which the periodic shift PDX is set to 4A, that is, 4/12 of the repetition period (periodic width FDX) in the X direction.

FIG. 208B is a plan view of the conductor layer 1831 in which the periodic shift PDX is set to 5A, that is, 5/12 of the repetition period (periodic width FDX) in the X direction.

C in FIG. 208C is a plan view of the conductor layer 1831 in which the periodic shift PDX is set to 6A, that is, 6/12 of the repetition period (periodic width FDX) in the X direction.

Figure 209:
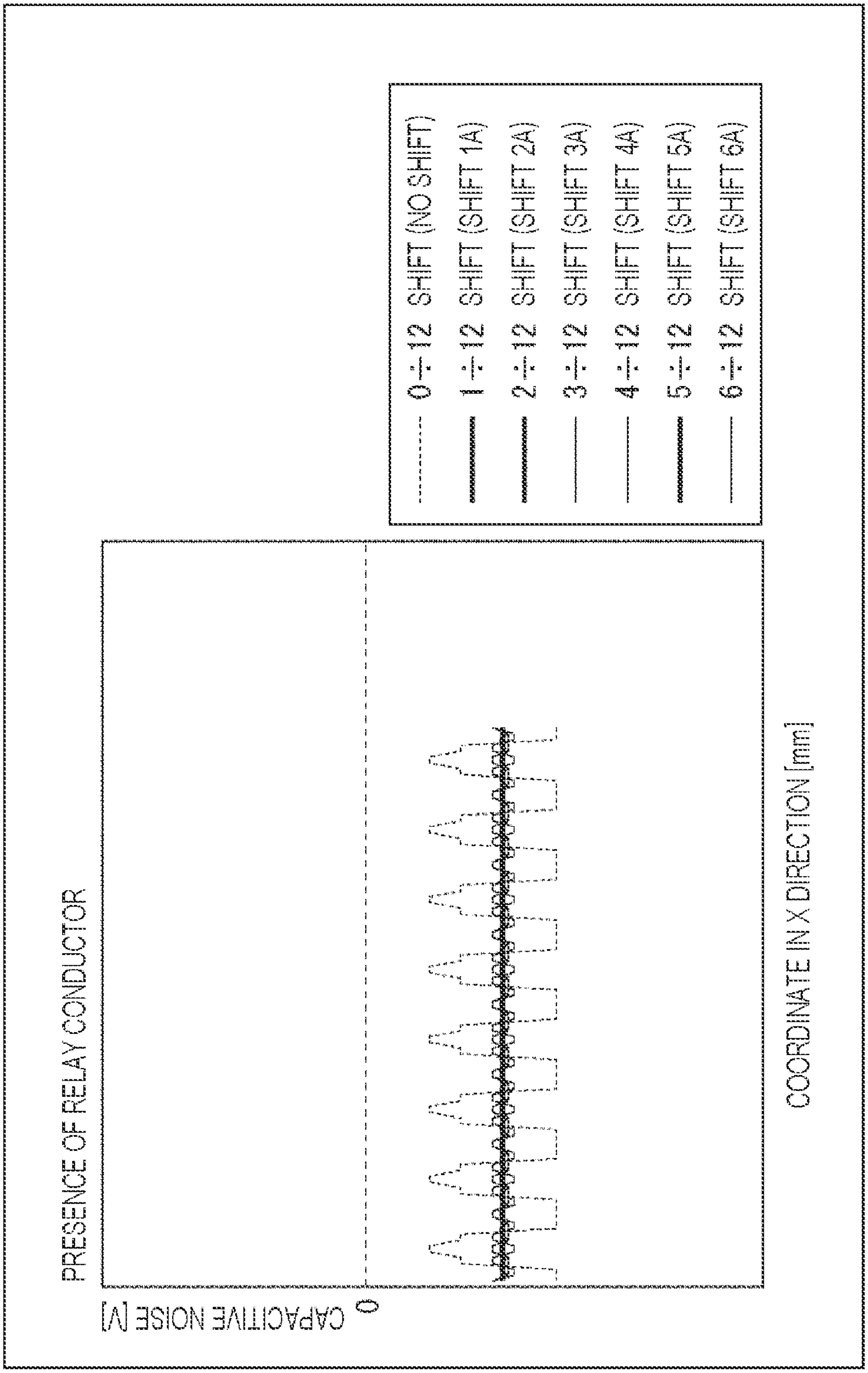

FIG. 209 is a graph illustrating theoretical values of the capacitive noise of the conductor layer 1831 in which the periodic shift PDX is set to various values as illustrated in FIGS. 207A, 207B, 207C, 208A, 208B, and 208C.

Since the horizontal axis and the vertical axis of the graph in FIG. 209 are similar to those in FIG. 169, the description thereof will be omitted. Note that the scale of the graph in FIG. 209 is also illustrated in accordance with FIG. 169. Conditions for the Vdd applied voltage and Vss applied voltage are similar.

The amount of change in the capacitive noise becomes zero in the case where the periodic shift PDX is a predetermined value, as illustrated in FIG. 209. More specifically, in a case where the periodic shift PDX is set to 1/12 (=1A), 2/12 (=2A), or 5/12 (=5A) of the repetition period in the X direction, the amount of change in the capacitive noise becomes zero. Note that the absolute value of the capacitive noise is not zero.

Conversely, in a case where the periodic shift PDX is different from the repetition period of 3/12 (=3A), 4/12 (=4A), and 6/12 (=6A) in the X direction of the reticulated conductor 1821, in other words, in a case where the periodic shift PDX is not the periodic width FDX (=12A)÷4, the periodic width FDX (=12A)÷3, and the periodic width FDX (=12A)÷2, the amount of change in the capacitive noise and the absolute value become zero.

In a case where the periodic shift PDX is set to 1/12 (=1A) or 5/12 (=5A) of the repetition period in the X direction, the amount of change in the capacitive noise becomes zero in units of twelve rows.

In a case where the periodic shift PDX is set to 2/12 (=2A) of the repetition period in the X direction, the amount of change in the capacitive noise becomes zero in units of six rows. In the reticulated conductor 1821 in which the conductor width WDX in the X direction and the gap width GDX are equal, the amount of change in the capacitive noise can be made zero with a small number of rows in the case where the periodic shift PDX is the same as the conductor width CDX (=2A) in the X direction of the relay conductor 1822. In the case where the periodic shift PDX is the same as the conductor width WDX (=6A) in the X direction of the reticulated conductor 1821, the amount of change in the capacitive noise does not become zero.

In a case where the periodic shift PDX is set to 3/12 (=3A), 4/12 (=4A), or 6/12 (=6A) of the repetition period in the X direction of the reticulated conductor 1821, the amount of change in the capacitive noise is not zero, but the change in the amount of change in the capacitive noise can be made smaller than a case where the periodic shift PDX is zero, that is, in a case of no periodic shift.

From the above, in the seventh shift configuration example including the relay conductor 1822, the amount of change in the capacitive noise can be made zero under the following conditions.

First, as a premise, the periodic shift PDX is set to a value different from the periodic width FDX (=12A) in the X direction of the reticulated conductor 1821.

In the case where the periodic shift PDX is 2A, that is, the periodic shift PDX is the same as the conductor width CDX in the X direction of the relay conductor 1822, the amount of change in the capacitive noise becomes zero. Furthermore, in a case where the periodic shift PDX is 1A and 5A, the amount of change in the capacitive noise becomes zero.

In a case where the periodic shift PDX is different from the repetition period of 3/12 (=3A) in the X direction of the reticulated conductor 1821, in other words, in a case where the periodic shift PDX is not the periodic width FDX (=12A)÷4, the amount of change in the capacitive noise becomes zero.

In a case where the periodic shift PDX is different from the repetition period of 4/12 (=4A) in the X direction of the reticulated conductor 1821, in other words, in a case where the periodic shift PDX is not the periodic width FDX (=12A)÷3, the amount of change in the capacitive noise becomes zero.

In a case where the periodic shift PDX is different from the repetition period of 6/12 (=6A) in the X direction of the reticulated conductor 1821, in other words, in a case where the periodic shift PDX is not the periodic width FDX (=12A)÷2, the amount of change in the capacitive noise becomes zero.

Figure 210:
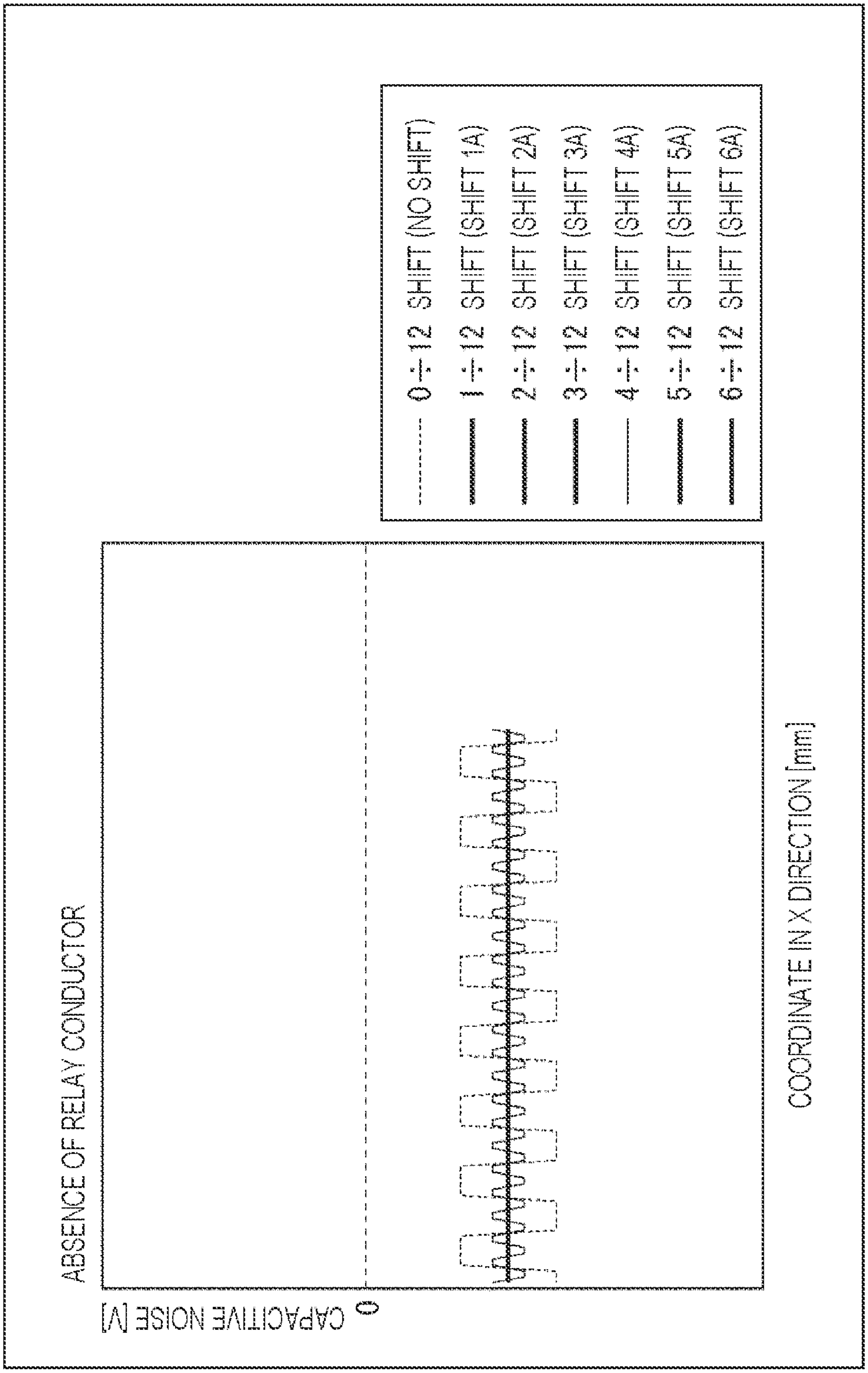

FIG. 210 is a graph illustrating theoretical values of the capacitive noise in a case where the periodic shift PDX is set to various values in the conductor layer 1831 in which the relay conductor 1822 is omitted. Although illustration of the conductor layer from which the relay conductor 1822 is omitted is omitted, it corresponds to each of the conductor layers 1831 in FIGS. 207A, 207B, 207C, 208A, 208B, and 208C from which the relay conductor 1822 is removed.

Even in the absence of the relay conductor 1822, the amount of change in the capacitive noise becomes zero in the case where the periodic shift PDX is a predetermined value, as illustrated in FIG. 210. Note that the amount of shift at which the amount of change in the capacitive noise becomes zero is different from the case where the relay conductor 1822 is present.

Specifically, in a case where the periodic shift PDX is set to 1/12, 2/12, 3/12, 5/12, or 6/12 of the repetition period in the X direction, the amount of change in the capacitive noise is zero.

In a case where the periodic shift PDX is set to 3/12 (=3A) of the repetition period in the X direction, the amount of change in the capacitive noise becomes zero in units of four rows. In a case where the periodic shift PDX is set to 2/12 (=2A) of the repetition period in the X direction, the amount of change in the capacitive noise becomes zero in units of six rows.

In a case where the periodic shift PDX is set to 6/12 (=6A) of the repetition period in the X direction, the amount of change in the capacitive noise becomes zero in units of two rows.

From the above, in the seventh shift configuration example not including the relay conductor 1822, the amount of change in the capacitive noise can be made zero under the following conditions.

First, as a premise, the periodic shift PDX is set to a value different from the periodic width FDX (=12A) in the X direction of the reticulated conductor 1821.

In a case where the periodic shift PDX is 1/12 (=1A), 2/12 (=2A), 3/12 (=3A), 5/12 (=5A), or 6/12 (=6A) of the repetition period in the X direction of the reticulated conductor 1821, the amount of change in the capacitive noise becomes zero. 1/12 (=1A), 2/12 (=2A), 3/12 (=3A), and 6/12 (=6A) of the repetition period in the X direction of the reticulated conductor 1821 can be respectively rephrased as the periodic shift PDX being the periodic width FDX (=12A)÷12, the periodic width FDX (=12A)÷6, the periodic width FDX (=12A)÷4, and the periodic width FDX (=12A)÷2. Therefore, in a case where the periodic shift PDX is the periodic width FDX an even integer, the amount of change in the capacitive noise becomes zero. In the case where the periodic shift PDX is the periodic width FDX (=12A)÷2, which is the case where the periodic shift PDX is 6/12 (=6A) of the repetition period in the X direction, the amount of change in the capacitive noise becomes zero with a smallest number of rows, which is favorable but the configuration is not limited thereto.

Furthermore, in a case where the periodic shift PDX is different from the repetition period of 4/12 (=4A) in the X direction of the reticulated conductor 1821, in other words, in a case where the periodic shift PDX is not the periodic width FDX (=12A)÷3, the amount of change in the capacitive noise becomes zero.

Therefore, in the seventh shift configuration example, the condition of the periodic shift PDX of when the amount of change in the capacitive noise becomes zero is different between the presence of the relay conductor 1822 and the absence of the relay conductor 1822.

In the case where an even integral multiple of the periodic shift PDX matches the periodic width FDX according to the shape relationship between the conductor part and the gap region of the reticulated conductor 1821, the capacitive noise is evenly distributed. Therefore, the amount of change in the capacitive noise can be made zero in the absence of the relay conductor 1822.

Modification of Shift Configuration Example of Reticulated Conductor

A configuration in which the following modification is made for at least one of the first to seventh shift configuration examples of the reticulated conductor is also possible.

For example, the conductor width WDY in the Y direction of the reticulated conductor may be made larger than the gap width GDY (the conductor width WDY>the gap width GDY), or the conductor width WDX in the X direction may be made larger than the gap width GDX (the conductor width WDX>the gap width GDX). In this case, it is advantageous in terms of light-shielding property and conductor occupancy.

On the contrary, for example, the conductor width WDY in the Y direction of the reticulated conductor may be made the same as or smaller than the gap width GDY (the conductor width WDY 5 the gap width GDY), or the conductor width WDX in the X direction may be made the same or smaller than the gap width GDX (the conductor width WDX 5 the gap width GDX). In this case, it is advantageous in terms of offset property the capacitive noise.

In the above-described shift configuration examples of the reticulated conductor, the examples of shifting the reticulated conductor in the positive direction of the X-axis have been described, but the reticulated conductor may be shifted in the negative direction of the X axis. Furthermore, the shift in the positive direction and the shift in the negative direction of the X axis may be combined, such as alternately arranging the shift of one or a plurality of rows in the positive direction of the X axis and the shift of one or a plurality of rows in the negative direction of the X axis.

The conductor layer having the above-described shift configuration of the reticulated conductor is particularly suitable, but not limited, in a case of a conductor layer close to a Victim conductor. The conductor layer having the shift configuration of the reticulated conductor has been described as an example applicable to the reticulated conductor of the conductor layer A (wiring layer 165A) or the conductor layer B (wiring layer 165B), but is also applicable to a conductor layer other than the conductor layer A or B. For example, the conductor layer may be applied to the conductor layer C (wiring layer 165C) or may be applied to any conductor layer in a circuit board, a semiconductor substrate, or an electronic device. Furthermore, two or more conductor layers having the shift configuration of the reticulated conductor may be provided, and in that case, it is desirable that the periodic shift amounts in the respective conductor layers of the two layers are the same or substantially the same from the viewpoint of the inductive noise. However, the periodic shift amounts may be made different from each other. Furthermore, two or more conductor layers having the reticulated conductor are provided, and the periodic shift may be provided in the reticulated conductor of some conductor layers and the periodic shift may not be provided in the reticulated conductor of the other conductor layers. Furthermore, a plurality of reticulated conductors having different periodic shift amounts may be provided in one conductor layer, and both a reticulated conductor having the periodic shift and a reticulated conductor having no periodic shift may be provided.

The wiring period, wiring width, wiring gap width, and wiring periodic shift of the wiring as the reticulated conductor or the relay conductor may have a structure modulated depending on the position. For example, the wiring period, wiring width, gap width, and periodic shift may have a structure that becomes gradually larger according to the distance in the X direction or the Y direction, or may have a structure that becomes gradually smaller according to the distance in the X direction or the Y direction. Furthermore, a structure in which the structure that becomes gradually larger according to the distance in the X direction or the Y direction and the structure that becomes gradually smaller according to the distance in the X direction or the Y direction are combined or alternately arranged.

At least a part of the reticulated conductor or the relay conductor may be separated into a plurality of conductors, or may be a shape in which a plurality of divided but unseparated shapes is coupled, as in FIG. 178B. Furthermore, at least a part of the reticulated conductor may be cut and separated.

In the above-described shift configuration example of the reticulated conductor, the reticulated conductor is the wiring (Vss wiring) connected to the GND or the negative power supply, and the relay conductor is the wiring (Vdd wiring) connected to the positive power supply. Furthermore, an example in which the absolute values of the Vdd applied voltage and the Vss applied voltage are the same has been described.

However, the Vdd applied voltage and the Vss applied voltage may be opposite. That is, the reticulated conductor may be the wiring (Vdd wiring) connected to the positive power supply, and the relay conductor may be the wiring (Vss wiring) connected to the GND or the negative power supply. Furthermore, the absolute values of the Vdd applied voltage and the Vss applied voltage may not be the same. For example, the Vdd applied voltage may be a positive power supply (for example, +1 V) and the Vss applied voltage may be the GND (0 V).

The voltage applied to the reticulated conductor and the voltage applied to the relay conductor are not limited to the above examples, and may be different power sources, and may be any two types of power supplies. In this case, it is desirable, but not limited to, that the polarities of the two types of power supplies are different from each other.

The plane arrangement of the conductor layer having the shift configuration of the reticulated conductor may be reversed in the X direction or in the Y direction. Furthermore, the plane arrangement may be rotated clockwise by a predetermined angle (for example, 90 degrees) or counterclockwise by a predetermined angle (for example, −90 degrees)

In the present disclosure, the effect of improving the capacitive noise by the periodic shift of the reticulated conductor has been illustrated, but the reticulated conductor and the relay conductor not having the periodic shift are not excluded. As described above, the conductor layer having no periodic shift and both the presence and absence of the relay conductor can be applied as a reticulated conductor of the conductor layer A (wiring layer 165A) or the conductor layer B (wiring layer 165B).

The relay conductor may have any shape such as a circular shape, a polygonal shape, a symmetrical shape, an asymmetrical shape, a star shape, a radial shape, or a complicated shape. Furthermore, in the above-described shift configuration of the reticulated conductor, the conductor used as the relay conductor may be a conductor that does not electrically relay between other conductor layers, and may be non-reticulated conductor arranged in the gap region of the reticulated conductor. The non-reticulated conductor including the relay conductor may be arranged in all of the gap regions of the reticulated conductor, or may be arranged only in a predetermined part of the gap region.

15. Configuration Example of Imaging Device

For example, the above-described solid-state imaging device 100 can be applied to a camera system such as a digital camera or a video camera, a mobile phone having an imaging function, another device having an imaging function, or an electronic device including a semiconductor device including a high-sensitivity analog element such as a flash memory.

Figure 211:
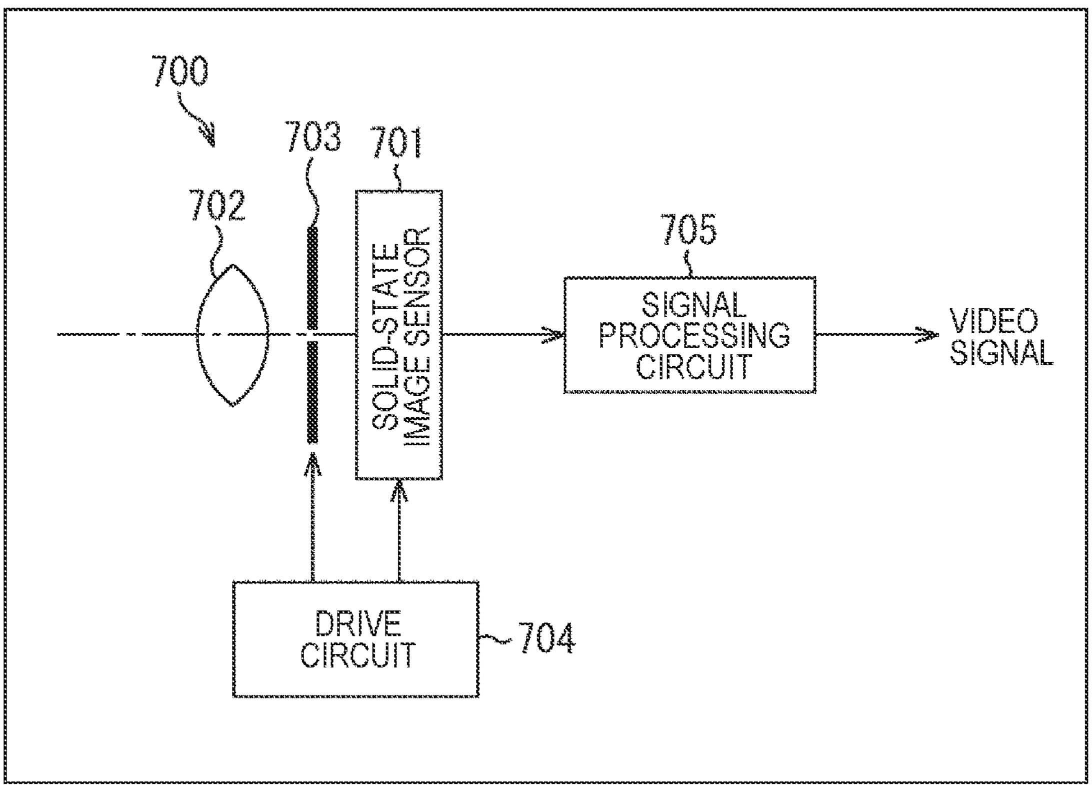

FIG. 211 is a block diagram illustrating a configuration example of an imaging device 700 as an example of the electronic device.

The imaging device 700 includes a solid-state image sensor 701, an optical system 702 that guides incident light to the solid-state image sensor 701, a shutter mechanism 703 provided between the solid-state image sensor 701 and the optical system 702, and a drive circuit 704 that drives the solid-state image sensor 701. Moreover, the imaging device 700 includes a signal processing circuit 705 that processes an output signal of the solid-state image sensor 701.

The solid-state image sensor 701 corresponds to the above-described solid-state imaging device 100. The optical system 702 includes an optical lens group or the like, and causes image light (incident light) from an object to be incident on the solid-state image sensor 701. Thereby, a signal charge is accumulated in the solid-state image sensor 701 for a fixed period. The shutter mechanism 703 controls a light irradiation period and a light blocking period of the incident light on the solid-state image sensor 701.

The drive circuit 704 supplies a drive signal to the solid-state image sensor 701 and the shutter mechanism 703. Then, the drive circuit 704 controls a signal output operation of the solid-state image sensor 701 to the signal processing circuit 705 and a shutter operation of the shutter mechanism 703 by the supplied drive signal. That is, in this example, a signal transfer operation from the solid-state image sensor 701 to the signal processing circuit 705 is performed by the drive signal (timing signal) supplied from the drive circuit 704.

The signal processing circuit 705 applies various types of signal processing to the signal transferred from the solid-state image sensor 701. Then, the signal (video signal) to which the various types of signal processing have been applied is stored in a storage medium (not illustrated) such as a memory, or output to a monitor (not illustrated).

According to the electronic device such as the above-described imaging device 700, noise generation due to leakage of light such as hot carrier light emission from an active element such as a MOS transistor or a diode into a light-receiving element during operation in a peripheral circuit can be suppressed in the solid-state image sensor 701. Therefore, a high-quality electronic device with improved image quality can be provided.

16. Application to In-vivo Information Acquisition System

The technology according to the present disclosure (present technology) can be applied to various products. For example, the technology according to the present disclosure may be applied to an in-vivo information acquisition system for patients using a capsule endoscope.

Figure 212:
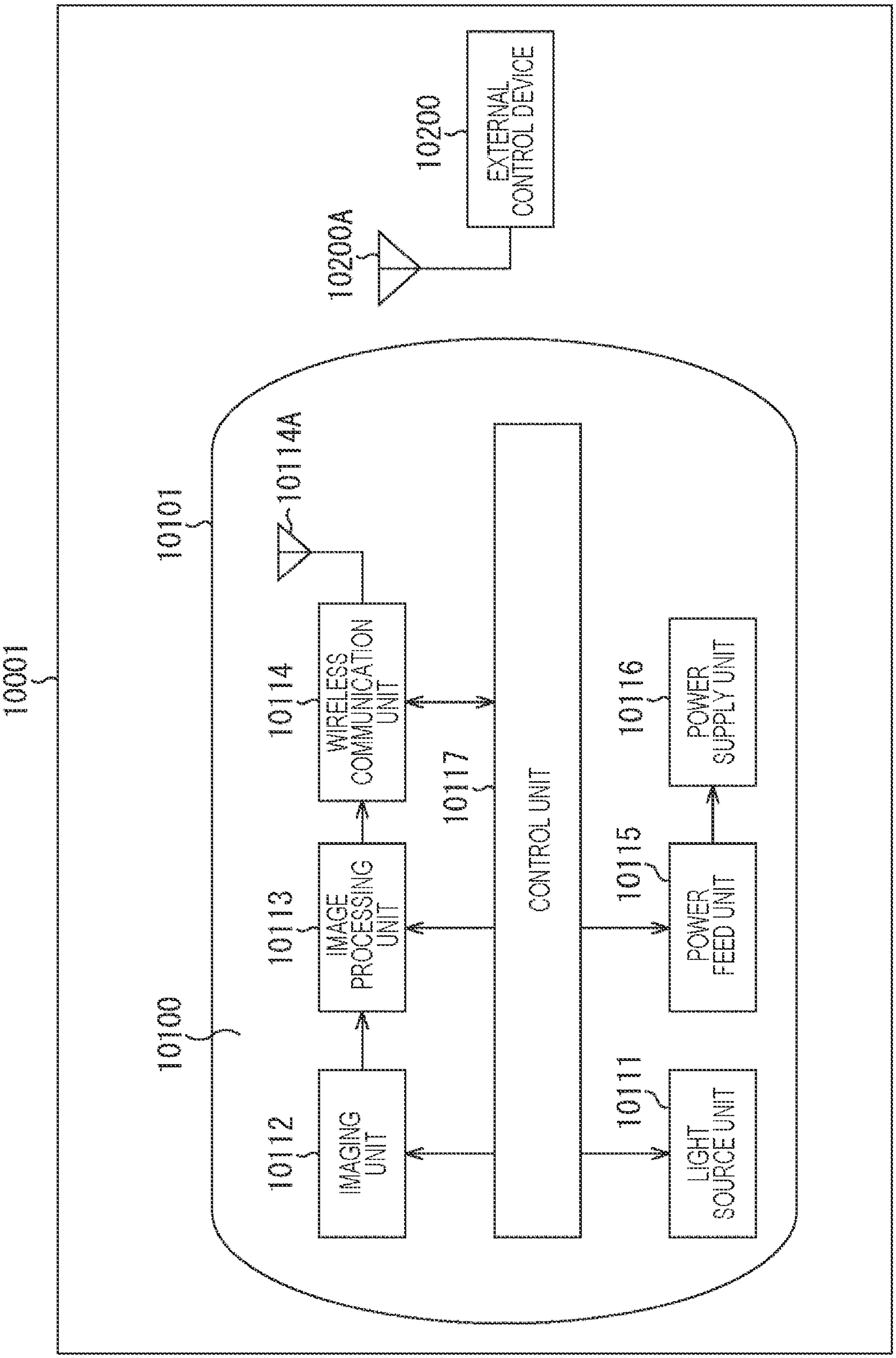

FIG. 212 is a block diagram illustrating an example of a schematic configuration of an in-vivo information acquisition system for patients using a capsule endoscope, to which the technology according to the present disclosure is applicable.

An in-vivo information acquisition system 10001 includes a capsule endoscope 10100 and an external control device 10200.

The capsule endoscope 10100 is swallowed by a patient at the time of examination. The capsule endoscope 10100 has an imaging function and a wireless communication function, and sequentially captures images of inside of organs (hereinafter also referred to as in-vivo images) at predetermined intervals while moving inside the organs such as stomach and intestine by peristaltic movement or the like until the patient naturally discharges the capsule endoscope 10100, and sequentially wirelessly transmits information of the in-vivo images to the external control device 10200 outside the body.

The external control device 10200 comprehensively controls the operation of the in-vivo information acquisition system 10001. Furthermore, the external control device 10200 receives information regarding the in-vivo image transmitted from the capsule endoscope 10100, and transmits image data for displaying the in-vivo image to the display device (not illustrated) on the basis of the information regarding the received in-vivo image.

As described above, the in-vivo information acquisition system 10001 can acquire the in-vivo images obtained by imaging the inside of the patient's body from time to time during a period from when the capsule endoscope 10100 is swallowed to when the capsule endoscope 10100 is discharged.

The configurations and functions of the capsule endoscope 10100 and the external control device 10200 will be described in more detail.

The capsule endoscope 10100 has a capsule-shaped housing 10101, and a light source unit 10111, an imaging unit 10112, an image processing unit 10113, a wireless communication unit 10114, a power feed unit 10115, a power supply unit 10116, and a control unit 10117 are housed inside the housing 10101.

The light source unit 10111 includes, for example, a light source such as a light emitting diode (LED), and irradiates an imaging field of view of the imaging unit 10112 with light.

The imaging unit 10112 includes an optical system including an imaging element and a plurality of lenses provided in front of the imaging element. Reflected light (hereinafter referred to as observation light) of the light radiated on a body tissue that is an observation target is collected by the optical system and enters the imaging element. The imaging unit 10112 photoelectrically converts the observation light having entered the imaging element to generate an image signal corresponding to the observation light. The image signal generated by the imaging unit 10112 is provided to the image processing unit 10113.

The image processing unit 10113 includes processors such as a central processing unit (CPU) and a graphics processing unit (GPU), and performs various types of signal processing for the image signal generated by the imaging unit 10112. The image processing unit 10113 provides the image signal to which the signal processing has been applied to the wireless communication unit 10114 as raw data.

The wireless communication unit 10114 performs predetermined processing such as modulation processing for the image signal to which the signal processing has been applied by the image processing unit 10113 and transmits the image signal to the external control device 10200 via an antenna 10114A. Furthermore, the wireless communication unit 10114 receives a control signal related to drive control of the capsule endoscope 10100 from the external control device 10200 via the antenna 10114A. The wireless communication unit 10114 provides the control signal received from the external control device 10200 to the control unit 10117.

The power feed unit 10115 includes an antenna coil for power reception, a power regeneration circuit for regenerating power from a current generated in the antenna coil, a booster circuit, and the like. The power feed unit 10115 generates power using a principle of so-called non-contact charging.

The power supply unit 10116 includes a secondary battery, and stores the power generated by the power feed unit 10115. In FIG. 212, illustration of arrows or the like indicating a supply destination of the power from the power supply unit 10116 is omitted to avoid complication of the drawing. However, the power stored in the power supply unit 10116 is supplied to the light source unit 10111, the imaging unit 10112, the image processing unit 10113, the wireless communication unit 10114, and the control unit 10117, and can be used to drive these units.

The control unit 10117 includes a processor such as a CPU and appropriately controls drive of the light source unit 10111, the imaging unit 10112, the image processing unit 10113, the wireless communication unit 10114, and the power feed unit 10115 with control signals transmitted from the external control device 10200.

The external control device 10200 includes a processor such as a CPU and a GPU, a microcomputer in which a processor and a memory element such as a memory are mixed, a control board, or the like. The external control device 10200 controls the operation of the capsule endoscope 10100 by transmitting a control signal to the control unit 10117 of the capsule endoscope 10100 via an antenna 10200A. In the capsule endoscope 10100, for example, irradiation conditions of light with respect to the observation target in the light source unit 10111 can be changed according to the control signal from the external control device 10200. Furthermore, imaging conditions (for example, a frame rate in the imaging unit 10112, an exposure value, and the like) can be changed according to the control signal from the external control device 10200. Furthermore, the content of the processing in the image processing unit 10113, and conditions for transmitting the image signal by the wireless communication unit 10114 (for example, a transmission interval, the number of transmitted images, and the like) may be changed according to the control signal from the external control device 10200.

Furthermore, the external control device 10200 applies various types of image processing to the image signal transmitted from the capsule endoscope 10100 to generate image data for displaying the captured in-vivo image on the display device. As the image processing, various types of signal processing can be performed, such as development processing (demosaicing processing), high image quality processing (band enhancement processing, super resolution processing, noise reduction (NR) processing, and/or camera shake correction processing, for example), and/or enlargement processing (electronic zoom processing), for example. The external control device 10200 controls drive of the display device and displays in-vivo images captured on the basis of the generated image data. Alternatively, the external control device 10200 may cause a recording device (not illustrated) to record the generated image data or cause a printing device (not illustrated) to print out the generated image data.

An example of the in-vivo information acquisition system to which the technology according to the present disclosure is applicable has been described. The technology according to the present disclosure is applicable to the imaging unit 10112 among the above-described configurations. Specifically, the above-described solid-state imaging device 100 can be applied as the imaging unit 10112. By applying the technology according to the present disclosure to the imaging unit 10112, by applying the technology according to the present disclosure to the imaging unit 10112, generation of noise is suppressed and a clearer operation portion image can be obtained. Therefore, the accuracy of an examination is improved.

17. Application to Endoscopic Surgical System

The technology according to the present disclosure (present technology) can be applied to various products. For example, the technology according to the present disclosure may be applied to an endoscopic surgical system.

Figure 213:
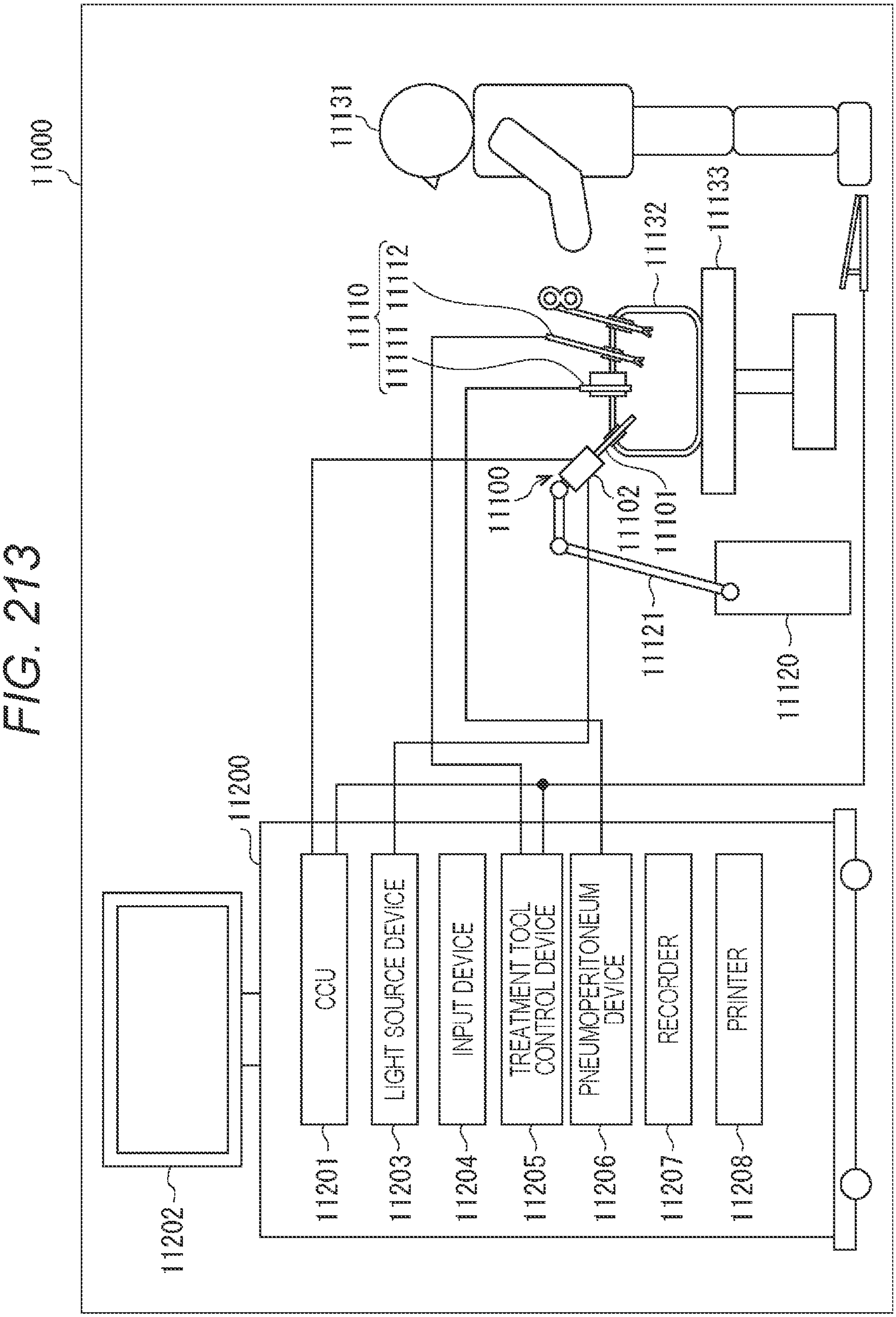

FIG. 213 is a diagram illustrating an example of a schematic configuration of an endoscopic surgical system to which the technology according to the present disclosure (present technology) is applicable.

FIG. 213 illustrates a state in which an operator (surgeon) 11131 is performing surgery for a patient 11132 on a patient bed 11133, using an endoscopic surgical system 11000. As illustrated in FIG. 213, the endoscopic surgical system 11000 includes an endoscope 11100, other surgical instruments 11110 such as a pneumoperitoneum tube 11111 and an energy treatment tool 11112, a support arm device 11120 that supports the endoscope 11100, and a cart 11200 on which various devices for endoscope surgery are mounted.

The endoscope 11100 includes a lens-barrel 11101 and a camera head 11102. A region having a predetermined length from a distal end of the lens-barrel 11101 is inserted into a body cavity of the patient 11132. The camera head 11102 is connected to a proximal end of the lens-barrel 11101. FIG. 213 illustrates the endoscope 11100 configured as so-called a hard endoscope including the hard lens-barrel 11101. However, the endoscope 11100 may be configured as so-called a soft endoscope including a soft lens-barrel.

An opening portion in which an object lens is fit is provided in the distal end of the lens-barrel 11101. A light source device 11203 is connected to the endoscope 11100, and light generated by the light source device 11203 is guided to the distal end of the lens-barrel 11101 by a light guide extending inside the lens-barrel 11101 and an observation target in the body cavity of the patient 11132 is irradiated with the light through the object lens. Note that the endoscope 11100 may be a forward-viewing endoscope, may be an oblique-viewing endoscope, or may be a side-viewing endoscope.

An optical system and an imaging element are provided inside the camera head 11102, and reflected light (observation light) from the observation target is condensed to the imaging element by the optical system. The observation light is photoelectrically converted by the imaging element, and an electrical signal corresponding to the observation light, in other words, an image signal corresponding to an observed image is generated. The image signal is transmitted to a camera control unit (CCU) 11201 as raw data.

The CCU 11201 includes a central processing unit (CPU), a graphics processing unit (GPU), and the like, and comprehensively controls an operation of the endoscope 11100 and a display device 11202. Moreover, the CCU 11201 receives the image signal from the camera head 11102, and applies various types of image processing for displaying an image based on the image signal, such as developing processing (demosaicing processing) or the like, to the image signal.

The display device 11202 displays the image based on the image signal to which the image processing has been applied by the CCU 11201, by control of the CCU 11201.

The light source device 11203 includes a light source such as a light emitting diode (LED) for example, and supplies irradiation light to the endoscope 11100 in capturing an operation portion or the like.

An input device 11204 is an input interface for the endoscopic surgical system 11000. A user can input various types of information and instructions to the endoscopic surgical system 11000 through the input device 11204. For example, the user inputs an instruction to change imaging conditions (a type of irradiation light, a magnification, a focal length, and the like) by the endoscope 11100, and the like.

A treatment tool control device 11205 controls driving of the energy treatment tool 11112 for cauterization and incision of tissue, sealing of a blood vessel, and the like. A pneumoperitoneum device 11206 sends a gas into the body cavity of the patient 11132 through the pneumoperitoneum tube 11111 to expand the body cavity for the purpose of securing a field of view by the endoscope 11100 and a work space for the operator. A recorder 11207 is a device that can record various types of information regarding the surgery. A printer 11208 is a device that can print the various types of information regarding the surgery in various formats such as a text, an image, and a graph.

Note that the light source device 11203 that supplies the irradiation light in capturing the operation portion to the endoscope 11100 can be configured from a white light source configured from an LED, a laser light source, or a combination of the LED and the laser light source, for example. In a case where the white light source is configured from a combination of RGB laser light sources, output intensity and output timing of the respective colors (wavelengths) can be controlled with high accuracy. Therefore, adjustment of white balance of the captured image can be performed in the light source device 11203. Furthermore, in this case, the observation target is irradiated with the laser light from each of the RGB laser light sources in a time division manner, and the drive of the imaging element of the camera head 11102 is controlled in synchronization with the irradiation timing, so that images respectively corresponding to RGB can be captured in a time division manner. According to the method, a color image can be obtained without providing a color filter to the imaging element.

Furthermore, drive of the light source device 11203 may be controlled to change intensity of light to be output every predetermined time. The drive of the imaging element of the camera head 11102 is controlled in synchronization with change timing of the intensity of light and images are acquired in a time division manner, and the images are synthesized, so that a high-dynamic range image without so-called clipped blacks and flared highlights can be generated.

Furthermore, the light source device 11203 may be configured to be able to supply light in a predetermined wavelength band corresponding to special light observation. In the special light observation, for example, so-called narrow band imaging is performed by radiating light in a narrower band than the irradiation light (in other words, white light) at the time of normal observation, using wavelength dependence of absorption of light in a body tissue, to capture a predetermined tissue such as a blood vessel in a mucosal surface layer at high contrast. Alternatively, in the special light observation, fluorescence imaging may be performed to obtain an image by fluorescence generated by radiation of exciting light. In the fluorescence imaging, irradiating the body tissue with exciting light to observe fluorescence from the body tissue (self-fluorescence observation), or injecting a reagent such as indocyanine green (ICG) into the body tissue and irradiating the body tissue with exciting light corresponding to a fluorescence wavelength of the reagent to obtain a fluorescence image, for example, can be performed. The light source device 11203 can be configured to be able to supply narrow band light and/or exciting light corresponding to such special light observation.

Figure 214:
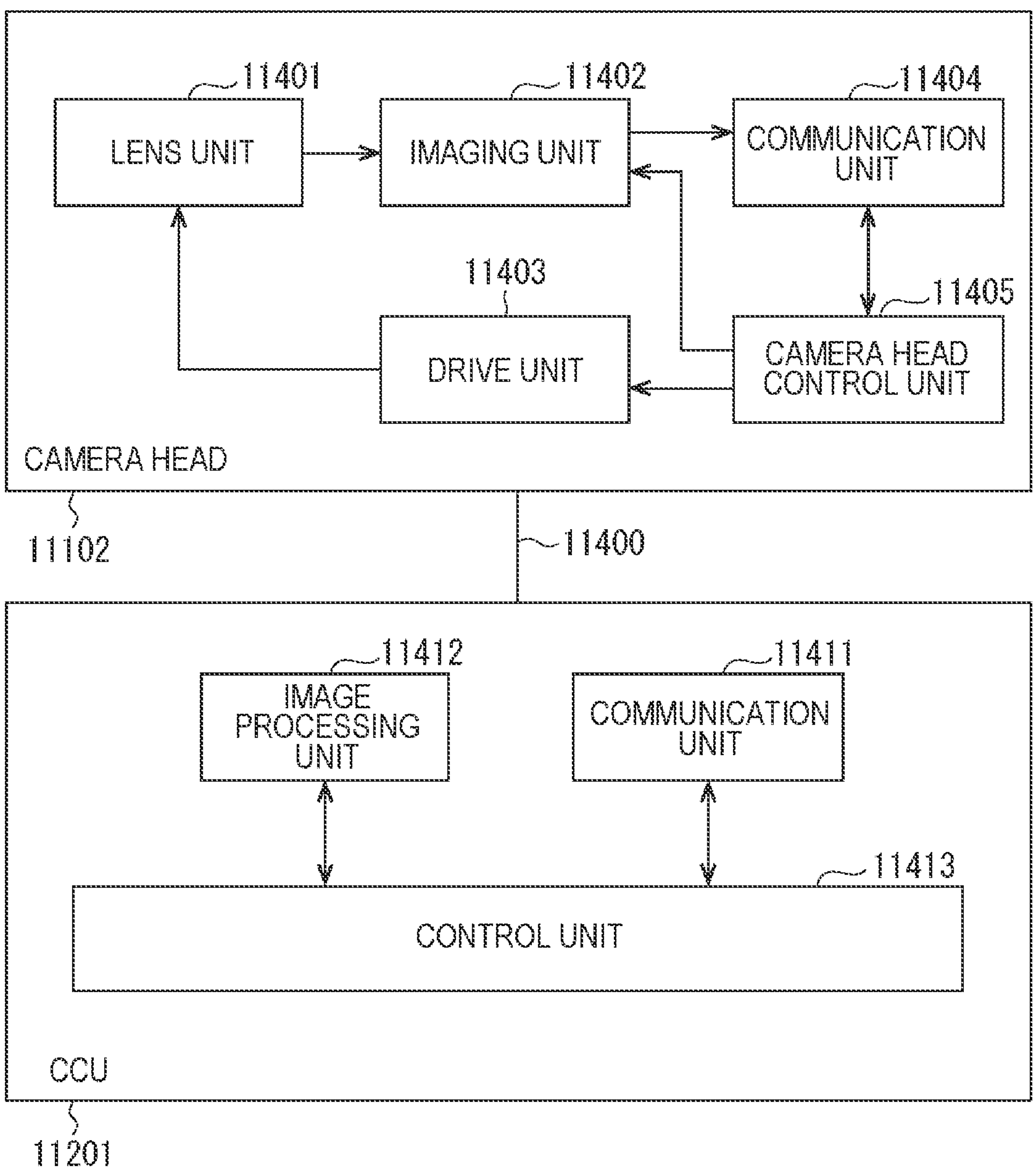

FIG. 214 is a block diagram illustrating an example of functional configurations of the camera head 11102 and the CCU 11201 illustrated in FIG. 213.

The camera head 11102 includes a lens unit 11401, an imaging unit 11402, a drive unit 11403, a communication unit 11404, and a camera head control unit 11405. The CCU 11201 includes a communication unit 11411, an image processing unit 11412, and a control unit 11413. The camera head 11102 and the CCU 11201 are communicatively connected with each other by a transmission cable 11400.

The lens unit 11401 is an optical system provided in a connection portion between the camera head 11102 and the lens-barrel 11101. Observation light taken through the distal end of the lens-barrel 11101 is guided to the camera head 11102 and enters the lens unit 11401. The lens unit 11401 is configured by a combination of a plurality of lenses including a zoom lens and a focus lens.

The imaging unit 11402 is configured by an imaging element. The imaging element that configures the imaging unit 11402 may be one imaging element (so-called single imaging element) or may be a plurality of imaging elements (so-called multiple imaging elements). In a case where the imaging unit 11402 is configured by multiple imaging elements, for example, a color image may be obtained by generating image signals respectively corresponding to RGB by the imaging elements and synthesizing the image signals. Alternatively, the imaging unit 11402 may be configured by a pair of imaging elements for respectively obtaining image signals for right eye and for left eye corresponding to three-dimensional (3D) display. With the 3D display, the operator 11131 can more accurately grasp the depth of a biological tissue in the operation portion. Note that, in a case where the imaging unit 11402 is configured by the multiple imaging elements, a plurality of systems of the lens units 11401 may be provided corresponding to the imaging elements.

Furthermore, the imaging unit 11402 may not be necessarily provided in the camera head 11102. For example, the imaging unit 11402 may be provided immediately after the object lens inside the lens-barrel 11101.

The drive unit 11403 is configured by an actuator, and moves the zoom lens and the focus lens of the lens unit 11401 by a predetermined distance along an optical axis by control of the camera head control unit 11405. With the movement, a magnification and a focal point of a captured image by the imaging unit 11402 can be appropriately adjusted.

The communication unit 11404 is configured by a communication device for transmitting or receiving various types of information to or from the CCU 11201. The communication unit 11404 transmits the image signal obtained from the imaging unit 11402 to the CCU 11201 through the transmission cable 11400 as raw data.

Furthermore, the communication unit 11404 receives a control signal for controlling drive of the camera head 11102 from the CCU 11201 and supplies the control signal to the camera head control unit 11405. The control signal includes information regarding the imaging conditions such as information for specifying a frame rate of the captured image, information for specifying an exposure value at the time of imaging, and/or information for specifying the magnification and the focal point of the captured image, for example.

Note that the imaging conditions such as the frame rate, the exposure value, the magnification, and the focal point may be appropriately specified by the user or may be automatically set by the control unit 11413 of the CCU 11201 on the basis of the acquired image signal. In the latter case, so-called an auto exposure (AE) function, an auto focus (AF) function, and an auto white balance (AWB) function are incorporated in the endoscope 11100.

The camera head control unit 11405 controls drive of the camera head 11102 on the basis of the control signal received through the communication unit 11404 from the CCU 11201.

The communication unit 11411 is configured from a communication device for transmitting or receiving various types of information to or from the camera head 11102. The communication unit 11411 receives the image signal transmitted from the camera head 11102 through the transmission cable 11400.

Furthermore, the communication unit 11411 transmits a control signal for controlling drive of the camera head 11102 to the camera head 11102. The image signal and the control signal can be transmitted through telecommunication, optical communication, or the like.

The image processing unit 11412 applies various types of image processing to the image signal as raw data transmitted from the camera head 11102.

The control unit 11413 performs various types of control regarding imaging of the operation portion and the like by the endoscope 11100 and display of the captured image obtained through imaging of the operation portion and the like. For example, the control unit 11413 generates a control signal for controlling drive of the camera head 11102.

Furthermore, the control unit 11413 displays the captured image of the operation portion or the like in the display device 11202 on the basis of the image signal to which the image processing has been applied by the image processing unit 11412. At this time, the control unit 11413 may recognize various objects in the captured image, using various image recognition technologies. For example, the control unit 11413 can recognize a surgical instrument such as forceps, a specific living body portion, blood, mist at the time of use of the energy treatment tool 11112, or the like, by detecting a shape of an edge, a color, or the like of an object included in the captured image. The control unit 11413 may superimpose and display various types of surgery support information on the image of the operation portion using a result of the recognition, in displaying the captured image in the display device 11202. The superimposition and display, and presentation of the surgery support information to the operator 11131 can reduce a burden on the operator 11131 and enables the operator 11131 to reliably proceed with the operation.

The transmission cable 11400 that connects the camera head 11102 and the CCU 11201 is an electrical signal cable corresponding to communication of electrical signals, an optical fiber corresponding to optical communication, or a composite cable thereof.

Here, in the illustrated example, the communication has been performed in a wired manner using the transmission cable 11400. However, the communication between the camera head 11102 and the CCU 11201 may be wirelessly performed.

An example of an endoscopic surgical system to which the technology according to the present disclosure is applicable has been described. The technology according to the present disclosure is applicable to, for example, the imaging unit 11402 of the camera head 11102 in the above-described configurations. Specifically, the above-described solid-state imaging device 100 can be applied as the imaging unit 11402. By applying the technology according to the present disclosure to the imaging unit 11402, generation of noise is suppressed and a clearer operation portion image can be obtained. Therefore, the operator can reliably confirm the operation portion.

Note that, here, the endoscopic surgical system has been described as an example. However, the technology according to the present disclosure may be applied to microsurgery system or the like, for example.

18. Application to Moving Bodies

Moreover, the technology according to the present disclosure may be implemented as, for example, a device mounted on any type of moving bodies including an automobile, an electric automobile, a hybrid electric automobile, a motorcycle, a bicycle, a personal mobility, an airplane, a drone, a ship, a robot, and the like.

Figure 215:
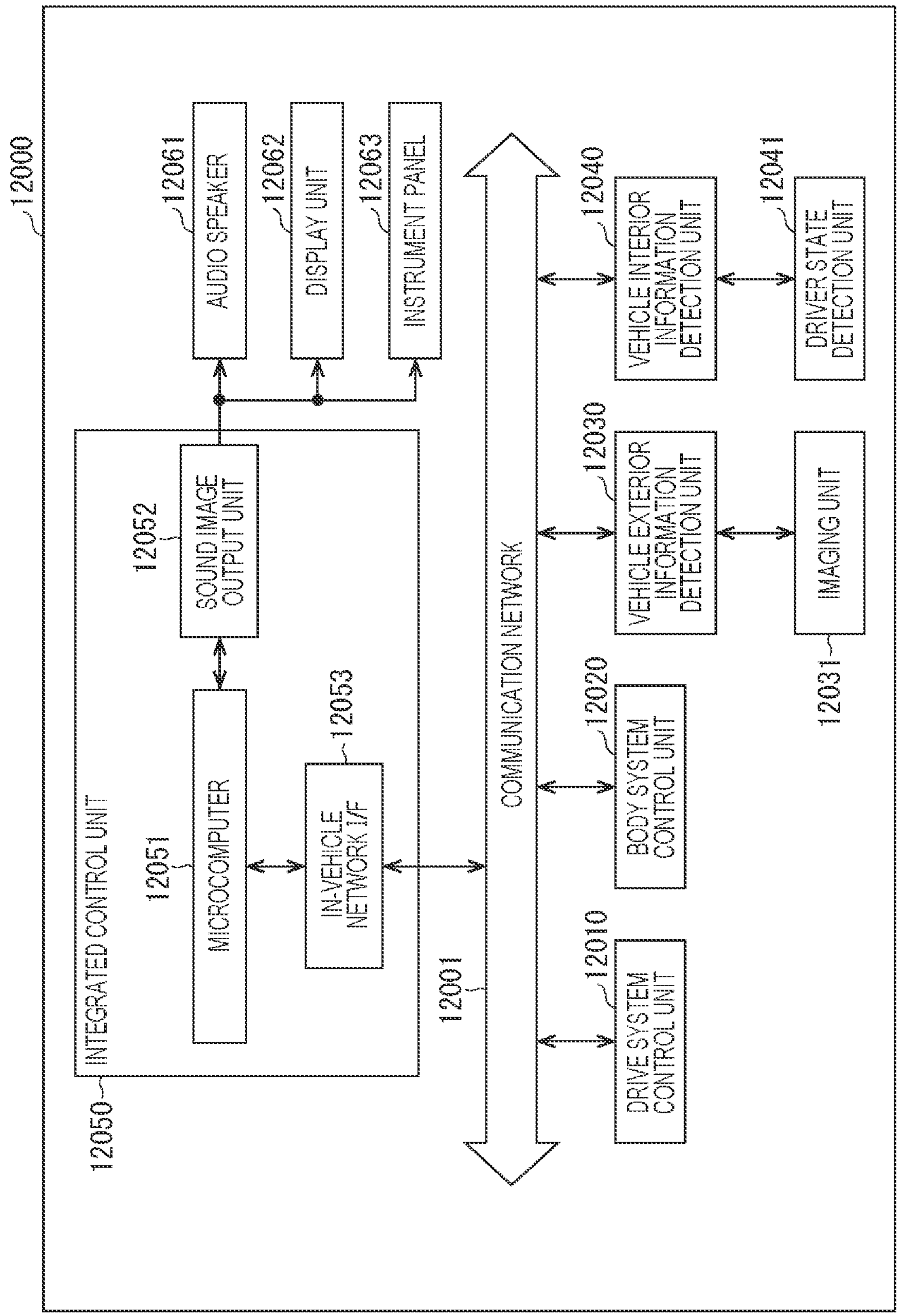

FIG. 215 is a block diagram illustrating a schematic configuration example of a vehicle control system as an example of a moving body control system to which the technology according to the present disclosure is applicable.

A vehicle control system 12000 includes a plurality of electronic control units connected through a communication network 12001. In the example illustrated in FIG. 215, the vehicle control system 12000 includes a drive system control unit 12010, a body system control unit 12020, a vehicle exterior information detection unit 12030, a vehicle interior information detection unit 12040, and an integrated control unit 12050. Furthermore, as functional configurations of the integrated control unit 12050, a microcomputer 12051, a sound image output unit 12052, and an in-vehicle network interface (I/F) 12053 are illustrated.

The drive system control unit 12010 controls operations of devices regarding a drive system of a vehicle according to various programs. For example, the drive system control unit 12010 functions as a control device of a drive force generation device for generating drive force of a vehicle, such as an internal combustion engine or a drive motor, a drive force transmission mechanism for transmitting drive force to wheels, a steering mechanism that adjusts a steering angle of a vehicle, a braking device that generates braking force of a vehicle, and the like.

The body system control unit 12020 controls operations of various devices equipped in a vehicle body according to various programs. For example, the body system control unit 12020 functions as a control device of a keyless entry system, a smart key system, an automatic window device, and various lamps such as head lamps, back lamps, brake lamps, turn signals, and fog lamps. In this case, radio waves transmitted from a mobile device substituted for a key or signals of various switches can be input to the body system control unit 12020. The body system control unit 12020 receives an input of the radio waves or the signals, and controls a door lock device, the automatic window device, the lamps, and the like of the vehicle.

The vehicle exterior information detection unit 12030 detects information outside the vehicle that mounts the vehicle control system 12000. For example, an imaging unit 12031 is connected to the vehicle exterior information detection unit 12030. The vehicle exterior information detection unit 12030 causes the imaging unit 12031 to capture an image outside the vehicle, and receives the captured image. The vehicle exterior information detection unit 12030 may perform object detection processing or distance detection processing of persons, vehicles, obstacles, signs, letters on a road surface, or the like on the basis of the received image.

The imaging unit 12031 is an optical sensor that receives light and outputs an electrical signal according to a reception amount of the light. The imaging unit 12031 can output the electrical signal as an image and can output the electrical signal as information of distance measurement. Furthermore, the light received by the imaging unit 12031 may be visible light or may be non-visible light such as infrared light.

The vehicle interior information detection unit 12040 detects information inside the vehicle. A driver state detection unit 12041 that detects a state of a driver is connected to the vehicle interior information detection unit 12040, for example. The driver state detection unit 12041 includes a camera that captures the driver, for example, and the vehicle interior information detection unit 12040 may calculate the degree of fatigue or the degree of concentration of the driver, or may determine whether or not the driver falls asleep on the basis of the detection information input from the driver state detection unit 12041.

The microcomputer 12051 calculates a control target value of the drive force generation device, the steering mechanism, or the braking device on the basis of the information outside and inside the vehicle acquired in the vehicle exterior information detection unit 12030 or the vehicle interior information detection unit 12040, and can output a control command to the drive system control unit 12010. For example, the microcomputer 12051 can perform cooperative control for the purpose of realization of an advanced driver assistance system (ADAS) function including collision avoidance or shock mitigation of the vehicle, following travel based on a vehicular gap, vehicle speed maintaining travel, collision warning of the vehicle, lane out warning of the vehicle, and the like.

Furthermore, the microcomputer 12051 controls the drive force generation device, the steering mechanism, the braking device, or the like on the basis of the information of a vicinity of the vehicle acquired in the vehicle exterior information detection unit 12030 or the vehicle interior information detection unit 12040 to perform cooperative control for the purpose of automatic drive of autonomous travel without depending on an operation of the driver or the like.

Furthermore, the microcomputer 12051 can output a control command to the body system control unit 12020 on the basis of the information outside the vehicle acquired in the vehicle exterior information detection unit 12030. For example, the microcomputer 12051 can perform cooperative control for the purpose of achievement of non-glare such as by controlling the head lamps according to the position of a leading vehicle or an oncoming vehicle detected in the vehicle exterior information detection unit 12030, and switching high beam light to low beam light.

The sound image output unit 12052 transmits an output signal of at least one of a sound or an image to an output device that can visually and aurally notify a passenger of the vehicle or an outside of the vehicle of information. In the example in FIG. 215, as the output device, an audio speaker 12061, a display unit 12062, and an instrument panel 12063 are exemplarily illustrated. The display unit 12062 may include, for example, at least one of an on-board display or a head-up display.

Figure 216:
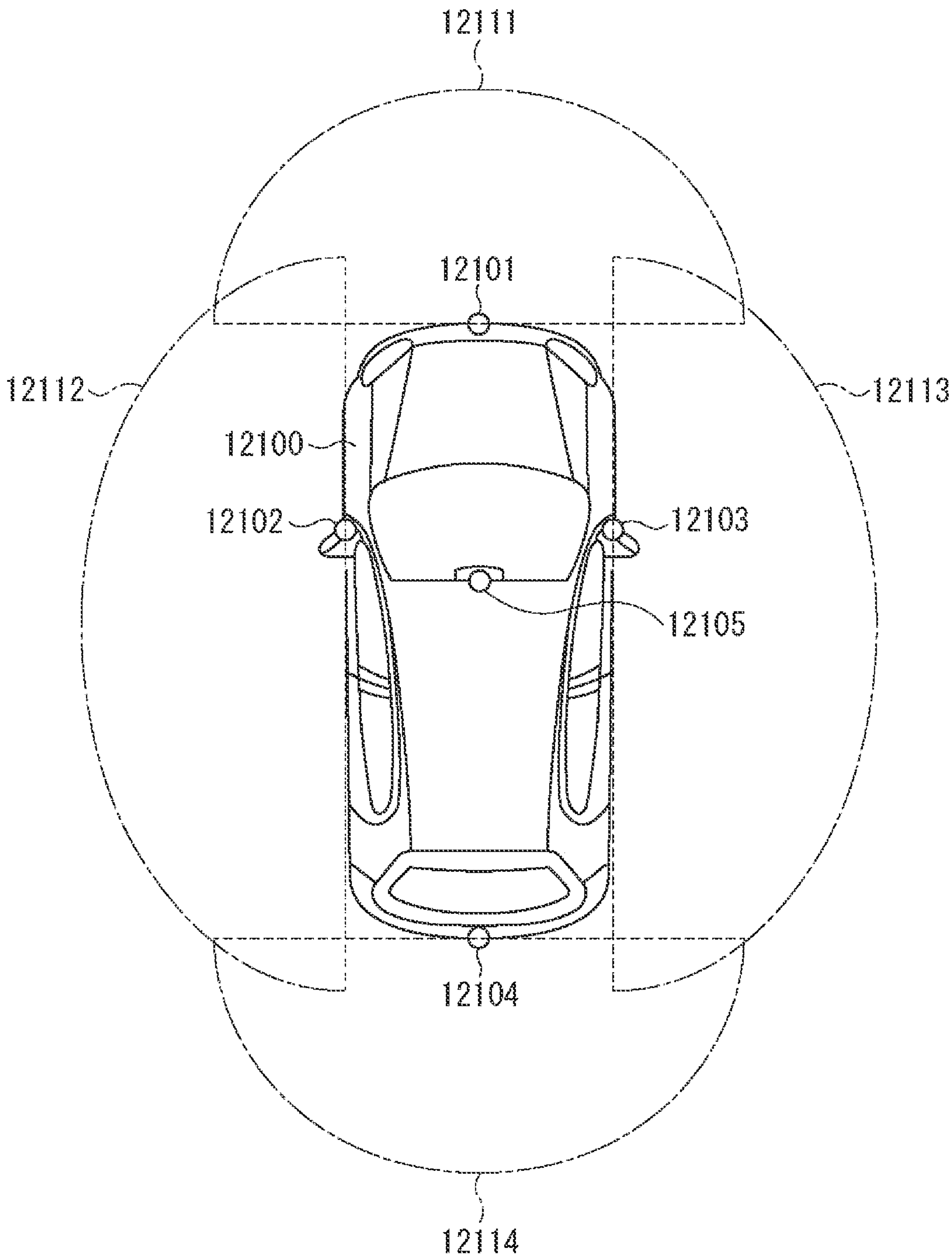

FIG. 216 is a diagram illustrating an example of an installation position of the imaging unit 12031.

In FIG. 216, a vehicle 12100 includes, as the imaging unit 12031, imaging units 12101, 12102, 12103, 12104, and 12105.

The imaging units 12101, 12102, 12103, 12104, and 12105 are provided at positions of a front nose, side mirrors, a rear bumper or a back door, an upper portion of a windshield, and the like in an interior of the vehicle 12100, for example. The imaging unit 12101 provided at the front nose and the imaging unit 12105 provided at an upper portion of the windshield in an interior of the vehicle mainly acquire images in front of the vehicle 12100. The imaging units 12102 and 12103 provided at the side mirrors mainly acquire images on sides of the vehicle 12100. The imaging unit 12104 provided at the rear bumper or the back door mainly acquires a rear image of the vehicle 12100. The front images acquired in the imaging units 12101 and 12105 are mainly used for detection of a leading vehicle, a pedestrian, an obstacle, a traffic light, a traffic sign, a lane, or the like.

Note that FIG. 216 illustrates an example of capture ranges of the imaging units 12101 to 12104. An imaging range 12111 indicates the imaging range of the imaging unit 12101 provided at the front nose, imaging ranges 12112 and 12113 respectively indicate the imaging ranges of the imaging units 12102 and 12103 provided at the side mirrors, and an imaging range 12114 indicates the imaging range of the imaging unit 12104 provided at the rear bumper or the back door. For example, a bird's-eye view image of the vehicle 12100 as viewed from above can be obtained by superimposing image data captured by the imaging units 12101 to 12104.

At least one of the imaging units 12101 to 12104 may have a function to acquire distance information. For example, at least one of the imaging units 12101 to 12104 may be a stereo camera including a plurality of imaging elements or may be an image element having pixels for phase difference detection.

For example, the microcomputer 12051 obtains distances to three-dimensional objects in the imaging ranges 12111 to 12114 and temporal change of the distances (relative speeds to the vehicle 12100) on the basis of the distance information obtained from the imaging units 12101 to 12104, thereby to particularly extract a three-dimensional object closest to the vehicle 12100 on a traveling road and traveling at a predetermined speed (for example, 0 km/h or more) in substantially the same direction as the vehicle 12100 as a leading vehicle. Moreover, the microcomputer 12051 can set an inter-vehicle distance to be secured from the leading vehicle in advance and perform automatic braking control (including following stop control) and automatic acceleration control (including following start control), and the like. In this way, the cooperative control for the purpose of automatic driving of autonomous travel without depending on an operation of the driver, and the like can be performed.

For example, the microcomputer 12051 classifies three-dimensional object data regarding three-dimensional objects into two-wheeled vehicles, ordinary cars, large vehicles, pedestrians, and other three-dimensional objects such as electric poles to be extracted, on the basis of the distance information obtained from the imaging units 12101 to 12104, and can use the data for automatic avoidance of obstacles. For example, the microcomputer 12051 discriminates obstacles around the vehicle 12100 into obstacles visually recognizable by the driver of the vehicle 12100 and obstacles visually unrecognizable by the driver. The microcomputer 12051 then determines a collision risk indicating a risk of collision with each of the obstacles, and can perform drive assist for collision avoidance by outputting warning to the driver through the audio speaker 12061 or the display unit 12062, and performing forced deceleration or avoidance steering through the drive system control unit 12010, in a case where the collision risk is a set value or more and there is a collision possibility.

At least one of the imaging units 12101 to 12104 may be an infrared camera that detects infrared light. For example, the microcomputer 12051 determines whether or not a pedestrian exists in the captured images of the imaging units 12101 to 12104, thereby to recognize the pedestrian. Such recognition of a pedestrian is performed by a process of extracting characteristic points in the captured images of the imaging units 12101 to 12104, as the infrared camera, for example, and by a process of performing pattern matching processing for the series of characteristic points indicating a contour of an object and determining whether or not the object is a pedestrian. When the microcomputer 12051 determines that a pedestrian exists in the captured images of the imaging units 12101 to 12104 and recognizes the pedestrian, the sound image output unit 12052 causes the display unit 12062 to superimpose and display a square contour line for emphasis on the recognized pedestrian. Furthermore, the sound image output unit 12052 may cause the display unit 12062 to display an icon or the like representing the pedestrian at a desired position.

An example of a vehicle control system to which the technology according to the present disclosure is applicable has been described. The technology according to the present disclosure is applicable to, for example, the imaging unit 12031 among the above-described configurations. Specifically, the above-described solid-state imaging device 100 can be applied as the imaging unit 12031. By applying the technology according to the present disclosure to the imaging unit 12031, generation of noise can be suppressed, and an easier-to-see captured image can be obtained. Therefore, the driving by the driver can be appropriately assisted.

Embodiments of the present technology are not limited to the above-described embodiments, and various modifications can be made without departing from the gist of the present technology.

Note that the effects described in the present specification are merely illustrative and are not restrictive, and effects other than the effects described in the present specification may be exhibited.

Note that the present technology can also have the following configurations.

(1)

A circuit board including a reticulated conductor including:

a first conductor group configured by two or more conductors having a first conductor width and arranged with a first periodic width in a first direction;

a second conductor group configured by two or more conductors having a second conductor width and arranged with a second periodic width in a second direction orthogonal to the first direction; and a first moving conductor group arranged at a position to which at least a part of the second conductor group is moved by a factor of 1 of the first periodic width in the first direction and is moved by a factor of 1 of a third periodic width in the second direction, in which the third periodic width and the second periodic width are different.

(2)

The circuit board according to (1), in which the reticulated conductor includes an Mth moving conductor group arranged at a position to which at least a part of the second conductor group is moved by a factor of M of the first periodic width in the first direction and is moved by a factor of M of the third periodic width in the second direction (M=2, 3, 4, 5, . . . , L (L is an integer of 2 or larger)).

(3)

The circuit board according to (1) or (2), further including:

a fourth conductor arranged at a position overlapping with at least a part of the reticulated conductor, as viewed from a third direction orthogonal to the first direction and the second direction.

(4)

The circuit board according to (3), in which the fourth conductor is a control line or a signal line.

(5)

The circuit board according to (3) or (4), in which the fourth conductor is a fourth conductor group in which two or more conductors longer in the first direction than in the second direction are periodically arranged with a fourth periodic width in the second direction.

(6)

The circuit board according to (5), further including:

a circuit configured to selectively switch one or more conductors from among the two or more conductors constituting the fourth conductor group.

(7)

The circuit board according to any one of (1) to (6), further including:

a non-reticulated conductor in at least a part in a gap region of the reticulated conductor.

(8)

The circuit board according to (7), in which a power supply connected to the reticulated conductor and a power supply connected to the non-reticulated conductor have different voltage values.

(9)

The circuit board according to (7) or (8), in which a conductive area of the reticulated conductor within a predetermined range is the same as or larger than a conductive area of the non-reticulated conductor within the predetermined range.

(10)

The circuit board according to any one of (7) to (9), in which a conductive area of the reticulated conductor within a predetermined range and a conductive area of the non-reticulated conductor within the predetermined range are substantially same.

(11)

The circuit board according to any one of (7) to (10), in which a conductor width in the first direction of the non-reticulated conductor×{the number of rows of the reticulated conductor−(a conductor width in the second direction of the reticulated conductor+a first gap width in the second direction of the reticulated conductor+a second gap width in the second direction of the reticulated conductor)=the second conductor width of the reticulated conductor}=(the first conductor width of the reticulated conductor×the number of rows+a conductor width in the first direction of the non-reticulated conductor+a first gap width in the first direction of the reticulated conductor+a second gap width in the first direction of the reticulated conductor).

(12)

The circuit board according to any one of (7) to (11), in which the third periodic width×the number of rows of the reticulated conductor=an integer N×(the second conductor width of the reticulated conductor+a first gap width in the second direction of the reticulated conductor+a conductor width in the second direction of the non-reticulated conductor+a second gap width in the second direction of the reticulated conductor).

(13)

The circuit board according to any one of (1) to (12), in which the third periodic width and the second periodic width=2 are different.

(14)

The circuit board according to any one of (1) to (13), in which the third periodic width and the second periodic width=3 are different.

(15)

The circuit board according to any one of (1) to (14), in which the third periodic width and the second periodic width=4 are different.

(16)

The circuit board according to any one of (1) to (15), in which a gap width in the second direction of the reticulated conductor, the gap width being a difference between the second periodic width and the second conductor width, is larger than the second conductor width, and the third periodic width and an integral multiple of the second conductor width are substantially same.

(17)

The circuit board according to any one of (1) to (15), in which a gap width in the second direction of the reticulated conductor, the gap width being a difference between the second periodic width and the second conductor width, is smaller than the second conductor width, and the third periodic width and an integral multiple of a gap width in the second direction are substantially same.

(18)

The circuit board according to any one of (1) to (15), in which a gap width in the second direction of the reticulated conductor, the gap width being a difference between the second periodic width and the second conductor width, is equal to the second conductor width, and the third periodic width and the second periodic width=an even integer are substantially same.

(19)

A semiconductor device including a circuit board including a reticulated conductor including:

a first conductor group configured by two or more conductors having a first conductor width and arranged with a first periodic width in a first direction;

a second conductor group configured by two or more conductors having a second conductor width and arranged with a second periodic width in a second direction orthogonal to the first direction; and a first moving conductor group arranged at a position to which at least a part of the second conductor group is moved by a factor of 1 of the first periodic width in the first direction and is moved by a factor of 1 of a third periodic width in the second direction, the third periodic width and the second periodic width being different.

(20)

An electronic device including a semiconductor device including a circuit board including a reticulated conductor including:

a first conductor group configured by two or more conductors having a first conductor width and arranged with a first periodic width in a first direction;

a second conductor group configured by two or more conductors having a second conductor width and arranged with a second periodic width in a second direction orthogonal to the first direction; and a first moving conductor group arranged at a position to which at least a part of the second conductor group is moved by a factor of 1 of the first periodic width in the first direction and is moved by a factor of 1 of a third periodic width in the second direction, the third periodic width and the second periodic width being different.

REFERENCE SIGNS LIST

10 Pixel board
11 Victim conductor loop
20 Logic board
21 Power wiring
100 Solid-state imaging device
101 First semiconductor substrate
102 Second semiconductor substrate
111 Pixel/analog processing unit
112 Digital processing unit
121 Pixel array
122 A/D conversion unit
123 Vertical scanning unit
131 Pixel
132 Signal line
133 Control line
141 Photodiode
216, 217 Reticulated conductor
221 Planar conductor
222 Reticulated conductor
231, 232 Reticulated conductor
241, 242 Reticulated conductor
251, 252 Reticulated conductor
261 Planar conductor
262 Reticulated conductor
271, 272 Reticulated conductor
281, 282 Reticulated conductor
291, 292 Reticulated conductor
301 to 306 Relay conductor
311, 312 Reticulated conductor
321, 322 Reticulated conductor
331, 332 Reticulated conductor
700 Imaging device
701 Solid-state image sensor
702 Optical system
703 Shutter mechanism
704 Drive circuit
705 Signal processing circuit
1601 Reticulated conductor
1602 Relay conductor
1611 Conductor layer
1651 Conductor
1652 Conductor
1661 First conductor group
1662 Second conductor group
1663 First moving body group
1701 Reticulated conductor
1702 Relay conductor
1711 Conductor layer
1721 Reticulated conductor
1722 Relay conductor
1731 Conductor layer
1761 Reticulated conductor
1762 Relay conductor
1771 Conductor layer
1801 Reticulated conductor
1802 Relay conductor
1811 Conductor layer

The invention claimed is:

1. A circuit board, comprising:

a reticulated conductor including:

a first conductor group that includes a first plurality of conductors having a first periodic width in a first direction, wherein each conductor of the first plurality of conductors has a first conductor width;

a second conductor group that includes a second plurality of conductors having a second periodic width in a second direction orthogonal to the first direction, wherein each conductor of the second plurality of conductors has a second conductor width;

a moving conductor group at a position to which at least a part of the second conductor group is moved by a factor of 1 of the first periodic width in the first direction and is moved by a factor of 1 of a third periodic width in the second direction, wherein the third periodic width is different from the second periodic width; and a gap region; and a non-reticulated conductor in the gap region, wherein the non-reticulated conductor includes:

a first face separated from the first conductor group by a first gap width in the first direction;

a second face separated from the first conductor group by a second gap width in the first direction;

a third face separated from the second conductor group by a third gap width in the second direction; and a fourth face separated from the second conductor group by a fourth gap width in the second direction.

2. The circuit board according to claim 1, wherein the reticulated conductor further includes an Mth moving conductor group at a position to which at least the part of the second conductor group is moved by a factor of M of the first periodic width in the first direction and is moved by a factor of M of the third periodic width in the second direction, where M is an integer of 2 or larger.

3. The circuit board according to claim 1, further comprising a third conductor at a position overlapping with at least a part of the reticulated conductor, as viewed from a third direction orthogonal to the first direction and the second direction.

4. The circuit board according to claim 3, wherein the third conductor is one of a control line or a signal line.

5. The circuit board according to claim 3, wherein the third conductor is a third conductor group that includes a third plurality of conductors, the third plurality of conductors is longer in the first direction than in the second direction, and the third plurality of conductors has a fourth periodic width in the second direction.

6. The circuit board according to claim 5, further comprising a circuit configured to selectively switch at least one conductor from the third plurality of conductors of the third conductor group.

7. The circuit board according to claim 1, wherein a power supply connected to the reticulated conductor and a power supply connected to the non-reticulated conductor have different voltage values.

8. The circuit board according to claim 1, wherein a conductive area of the reticulated conductor within a specific range is similar to or larger than a conductive area of the non-reticulated conductor within the specific range.

9. The circuit board according to claim 1, wherein a conductive area of the reticulated conductor within a specific range and a conductive area of the non-reticulated conductor within the specific range are substantially similar.

10. The circuit board according to claim 1, wherein a conductor width of the non-reticulated conductor in the first direction×{a number of rows of the reticulated conductor−(the second conductor width of the reticulated conductor in the second direction+the third gap width in the second direction+the fourth gap width in the second direction)÷the second conductor width of the reticulated conductor}=(the first conductor width of the reticulated conductor×the number of rows÷the conductor width of the non-reticulated conductor in the first direction÷the first gap width in the first direction+the second gap width in the first direction).

11. The circuit board according to claim 1, wherein the third periodic width×a number of rows of the reticulated conductor=an integer N×(the second conductor width of the reticulated conductor+the third gap width in the second direction+a conductor width of the non-reticulated conductor in the second direction+the fourth gap width in the second direction).

12. The circuit board according to claim 1, wherein the third periodic width is different from one half of the second periodic width.

13. The circuit board according to claim 1, wherein the third periodic width is different from one third of the second periodic width 3.

14. The circuit board according to claim 1, wherein the third periodic width is different from one fourth of the second periodic width.

15. The circuit board according to claim 1, wherein the third gap width in the second direction is larger than the second conductor width, the third gap width is a difference between the second periodic width and the second conductor width, and the third periodic width and an integral multiple of the second conductor width are substantially similar.

16. The circuit board according to claim 1, wherein the third gap width in the second direction is smaller than the second conductor width, the third gap width is a difference between the second periodic width and the second conductor width, and the third periodic width and an integral multiple of the third gap width in the second direction are substantially similar.

17. The circuit board according to claim 1, wherein the third gap width in the second direction is equal to the second conductor width, the third gap width is a difference between the second periodic width and the second conductor width, and the second periodic width divided by an even integer is substantially similar to the third periodic width.

18. A semiconductor device, comprising:

a circuit board including:

a reticulated conductor including:

a first conductor group that includes a first plurality of conductors having a first periodic width in a first direction, wherein each conductor of the first plurality of conductors has a first conductor width;

a second conductor group that includes a second plurality of conductors having a second periodic width in a second direction orthogonal to the first direction, wherein each conductor of the second plurality of conductors has a second conductor width;

a moving conductor group at a position to which at least a part of the second conductor group is moved by a factor of 1 of the first periodic width in the first direction and is moved by a factor of 1 of a third periodic width in the second direction, wherein the third periodic width is different from the second periodic width; and a gap region; and a non-reticulated conductor in the gap region, wherein the non-reticulated conductor includes:

a first face separated from the first conductor group by a first gap width in the first direction;

a second face separated from the first conductor group by a second gap width in the first direction;

a third face separated from the second conductor group by a third gap width in the second direction; and a fourth face separated from the second conductor group by a fourth gap width in the second direction.

19. An electronic device, comprising:

a semiconductor device including a circuit board that includes:

a reticulated conductor including:

a first conductor group that includes a first plurality of conductors having a first periodic width in a first direction, wherein each conductor of the first plurality of conductors has a first conductor width;

a second conductor group that includes a second plurality of conductors having a second periodic width in a second direction orthogonal to the first direction, wherein each conductor of the second plurality of conductors has a second conductor width;

a moving conductor group at a position to which at least a part of the second conductor group is moved by a factor of 1 of the first periodic width in the first direction and is moved by a factor of 1 of a third periodic width in the second direction, wherein the third periodic width is different from the second periodic width; and a gap region; and a non-reticulated conductor in the gap region, wherein the non-reticulated conductor includes:

a first face separated from the first conductor group by a first gap width in the first direction;

a second face separated from the first conductor group by a second gap width in the first direction:

a third face separated from the second conductor group by a third gap width in the second direction; and a fourth face separated from the second conductor group by a fourth gap width in the second direction.

20. A circuit board, comprising:

a reticulated conductor including:

a first conductor group that includes a first plurality of conductors having a first periodic width in a first direction, wherein each conductor of the first plurality of conductors has a first conductor width;

a second conductor group that includes a second plurality of conductors having a second periodic width in a second direction orthogonal to the first direction, wherein each conductor of the second plurality of conductors has a second conductor width;

a moving conductor group at a position to which at least a part of the second conductor group is moved by a factor of 1 of the first periodic width in the first direction and is moved by a factor of 1 of a third periodic width in the second direction, wherein the third periodic width is different from the second periodic width; and a gap region; and a non-reticulated conductor in the gap region, wherein the third periodic width×a number of rows of the reticulated conductor=an integer N×(the second conductor width of the reticulated conductor+a first gap width of the reticulated conductor in the second direction+a conductor width of the non-reticulated conductor in the second direction+a second gap width of the reticulated conductor in the second direction).

* * * * *